US011991927B2

(12) United States Patent
Kim et al.

(10) Patent No.: US 11,991,927 B2
(45) Date of Patent: May 21, 2024

(54) ORGANIC LIGHT-EMITTING DEVICE

(71) Applicant: Samsung Electronics Co., Ltd., Suwon-si (KR)

(72) Inventors: Joonghyuk Kim, Seoul (KR); Hosuk Kang, Suwon-si (KR); Sangmo Kim, Hwaseong-si (KR); Sungho Nam, Daegu (KR); Youngmok Son, Hwaseong-si (KR); Hasup Lee, Seoul (KR); Yeonsook Chung, Seoul (KR); Yongsik Jung, Seoul (KR); Hyeonho Choi, Seoul (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 651 days.

(21) Appl. No.: 17/159,208

(22) Filed: Jan. 27, 2021

(65) Prior Publication Data

US 2021/0249610 A1 Aug. 12, 2021

(30) Foreign Application Priority Data

Jan. 28, 2020 (KR) ........................ 10-2020-0010029

(51) Int. Cl.
*H10K 85/60* (2023.01)
*H10K 50/11* (2023.01)
(Continued)

(52) U.S. Cl.
CPC ....... *H10K 85/6572* (2023.02); *H10K 85/324* (2023.02); *H10K 85/624* (2023.02);
(Continued)

(58) Field of Classification Search
None
See application file for complete search history.

(56) References Cited

U.S. PATENT DOCUMENTS 6,310,360 B1 10/2001 Forrest et al.
6,515,298 B2 2/2003 Forrest et al.
(Continued)

FOREIGN PATENT DOCUMENTS

JP 2002193952 A 7/2002
JP 2006199679 A 8/2006
(Continued)

OTHER PUBLICATIONS

English Abstract of JP 2002-193952.
(Continued)

*Primary Examiner* — Bo B Jang
(74) *Attorney, Agent, or Firm* — CANTOR COLBURN LLP

(57) ABSTRACT

An organic light-emitting device may include: a first electrode; a second electrode facing the first electrode; and an organic layer between the first electrode and the second electrode,
wherein the organic layer may include an emission layer,
the emission layer may include a first compound, a second compound, and a fluorescent dopant,
the first compound, the second compound, and the fluorescent dopant may be different from one another,
the total weight of the first compound and the second compound may be greater than a weight of the fluorescent dopant, and
(Continued)

the first compound may be a compound represented by Formula 1:

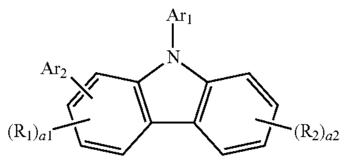

1

Formula 1 may be understood by referring to the description of Formula 1 provided herein.

20 Claims, 3 Drawing Sheets

(51) Int. Cl.
*H10K 85/30* (2023.01)
*H10K 101/10* (2023.01)
*H10K 101/30* (2023.01)
*H10K 101/40* (2023.01)

(52) U.S. Cl.
CPC ......... *H10K 85/633* (2023.02); *H10K 85/653* (2023.02); *H10K 85/654* (2023.02); *H10K 85/6574* (2023.02); *H10K 85/6576* (2023.02); *H10K 50/11* (2023.02); *H10K 2101/10* (2023.02); *H10K 2101/30* (2023.02); *H10K 2101/40* (2023.02)

(56) References Cited

U.S. PATENT DOCUMENTS

| | | | |
|---|---|---|---|
| 6,894,307 | B2 | 5/2005 | Forrest et al. |
| 8,324,403 | B2 | 12/2012 | Yabe et al. |
| 8,476,823 | B2 | 7/2013 | Kuma et al. |
| 8,643,268 | B2 | 2/2014 | Ogiwara et al. |
| 8,945,722 | B2 | 2/2015 | Thompson et al. |
| 9,153,790 | B2 | 10/2015 | Kuma et al. |
| 9,385,329 | B2 | 7/2016 | Li et al. |
| 9,493,698 | B2 | 11/2016 | Beers et al. |
| 9,818,950 | B2 | 11/2017 | Ito et al. |
| 9,905,779 | B2 | 2/2018 | Ogiwara et al. |
| 10,069,077 | B2 | 9/2018 | Park et al. |
| 10,090,483 | B2 | 10/2018 | Kim et al. |
| 10,290,816 | B2 | 5/2019 | Forrest et al. |
| 10,547,009 | B2 | 1/2020 | Yoshida et al. |
| 10,580,997 | B2 | 3/2020 | Son et al. |
| 10,923,664 | B2 | 2/2021 | Ihn et al. |
| 2008/0102310 | A1 | 5/2008 | Thompson et al. |
| 2010/0301319 | A1 | 12/2010 | Kuma et al. |
| 2016/0308138 | A1 | 10/2016 | Kim et al. |
| 2017/0062718 | A1 | 3/2017 | Numata et al. |
| 2017/0077418 | A1 | 3/2017 | Stoessel et al. |
| 2017/0155061 | A1 | 6/2017 | Forrest et al. |
| 2017/0163010 | A1 | 6/2017 | Nakanotani et al. |
| 2017/0352819 | A1 | 12/2017 | Son et al. |
| 2018/0130959 | A1 | 5/2018 | Ogiwara et al. |
| 2018/0248127 | A1 | 8/2018 | Lee et al. |
| 2019/0157603 | A1 | 5/2019 | Kim et al. |
| 2019/0225636 | A1 | 7/2019 | Bae et al. |
| 2020/0083458 | A1 | 3/2020 | Jeon et al. |
| 2020/0321537 | A1 | 10/2020 | Jeon et al. |
| 2021/0167299 | A1 | 6/2021 | Chung et al. |

FOREIGN PATENT DOCUMENTS

| | | | |
|---|---|---|---|
| JP | 2011140475 | A | 7/2011 |
| KR | 1020090082200 | A | 7/2009 |
| KR | 1020120082938 | A | 7/2012 |
| KR | 1020160036159 | A | 4/2016 |
| KR | 1020160124405 | A | 10/2016 |
| KR | 1020170025990 | A | 3/2017 |
| KR | 1020170032148 | A | 3/2017 |
| KR | 1020170057163 | A | 5/2017 |
| KR | 1020170136823 | A | 12/2017 |
| KR | 1020180098809 | A | 9/2018 |
| KR | 1020190089626 | A | 7/2019 |
| KR | 1020210068994 | A | 6/2021 |
| WO | 2016158540 | A1 | 10/2016 |

OTHER PUBLICATIONS

English Abstract of JP 2011-140475.
Extended European Search Report issued in EP Patent Application No. 21153792.3, dated Jun. 11, 2021.
XP-002734092, Shaolong Gong, et al., Journal of Materials Chemistry, 2012, 22, 2894-2899, 6 pp.
XP055545050, Hyocheol Jung, et al., Applied Materials and Interfaces, 2018, 10, 30022-30028, 7 pp.
XP055809982, Xing Feng, et al., Journal of Materials Chemistry C., 2019, 7, 2283-2290, 8 pp.

ORGANIC LIGHT-EMITTING DEVICE

CROSS-REFERENCE TO RELATED APPLICATION

This application claims priority to and the benefit of Korean Patent Application No. 10-2020-0010029, filed on Jan. 28, 2020, in the Korean Intellectual Property Office, the content of which is incorporated herein in its entirety by reference.

BACKGROUND

1. Field

The present disclosure relates to an organic light-emitting device.

2. Description of Related Art

Organic light-emitting devices (OLEDs) are self-emission devices which have wide viewing angles, high contrast ratios, short response times, and excellent brightness, driving voltage, and response speed characteristics, and produce full-color images.

Typical OLEDs include an anode, a cathode, and an organic layer that is between the anode and the cathode and includes an emission layer. A hole transport region may be between the anode and the emission layer, and an electron transport region may be between the emission layer and the cathode. Holes provided from the anode may move toward the emission layer through the hole transport region, and electrons provided from the cathode may move toward the emission layer through the electron transport region. Carriers, such as holes and electrons, recombine in the emission layer to produce excitons. These excitons transit from an excited state to a ground state to thereby generate light.

SUMMARY

Provided is an organic light-emitting device having a high efficiency, and a long lifespan.

Additional aspects will be set forth in part in the description which follows and, in part, will be apparent from the description, or may be learned by practice of the presented embodiments of the disclosure.

According to an aspect of an embodiment, an organic light-emitting device includes: a first electrode; a second electrode facing the first electrode; and an organic layer between the first electrode and the second electrode, wherein the organic layer includes an emission layer, the emission layer includes a first compound, a second compound, and a fluorescent dopant, the first compound, the second compound, and the fluorescent dopant are different from one another, a total weight of the first compound and the second compound is greater than a weight of the fluorescent dopant, and the first compound is a compound represented by Formula 1:

1

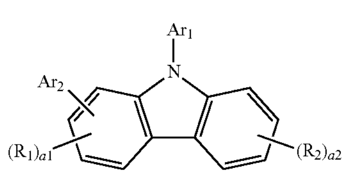

-continued

2A

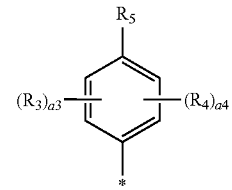

2B

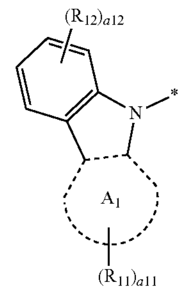

wherein, in Formula 1, $Ar_1$ is a group represented by Formula 2A, in Formula 1, $Ar_2$ is a group represented by Formula 2B, in Formula 2B, ring $A_1$ is a dibenzofuran group or a dibenzothiophene group, in Formulae 1, 2A, and 2B, $R_1$ to $R_3$, $R_{11}$, and $R_{12}$ are each independently:

hydrogen, deuterium, a $C_1$-$C_{20}$ alkyl group, a $C_1$-$C_{20}$ alkoxy group, a phenyl group, a biphenyl group, a terphenyl group, a carbazolyl group, a pyridinyl group, a dibenzofuranyl group, a dibenzothiophenyl group, or a dibenzosilolyl group;

a $C_1$-$C_{20}$ alkyl group or a $C_1$-$C_{20}$ alkoxy group, each substituted with at least one deuterium; or a phenyl group, a biphenyl group, a terphenyl group, a carbazolyl group, a pyridinyl group, a dibenzofuranyl group, a dibenzothiophenyl group, or a dibenzosilolyl group, each substituted with at least one deuterium, a $C_1$-$C_{20}$ alkyl group, a $C_1$-$C_{20}$ alkoxy group, a phenyl group, a biphenyl group, a terphenyl group, a carbazolyl group, a pyridinyl group, a dibenzofuranyl group, a dibenzothiophenyl group, a dibenzosilolyl group, or any combination thereof.

in Formulae 1 and 2A, a1 and a3 are each independently an integer from 0 to 3, when a1 is 2 or greater, at least two $R_1$(s) are identical to or different from each other, and when a3 is 2 or greater, at least two $R_3$(s) are identical to or different from each other, in Formulae 1 and 2B, a2 and a12 are each independently an integer from 0 to 4, when a2 is 2 or greater, at least two $R_2$(s) are identical to or different from each other, and when a12 is 2 or greater, at least two $R_{12}$(s) are identical to or different from each other, in Formula 2B, a11 is an integer from 0 to 6, and when a11 is 2 or greater, at least two $R_{11}$(s) are identical to or different from each other, in Formula 2A, $R_4$ is:

a phenyl group, a biphenyl group, or a terphenyl group;

a phenyl group, a biphenyl group, or a terphenyl group, each substituted with at least one deuterium, a $C_1$-$C_{20}$ alkyl group, a $C_1$-$C_{20}$ alkoxy group, or any combination thereof, in Formula 2A, a4 is an integer from 1 to 4, and when a4 is 2 or greater, at least two $R_4$(s) are identical to or different from each other, and in Formula 2A, $R_5$ is:

hydrogen, deuterium, a $C_1$-$C_{20}$ alkyl group, or a $C_1$-$C_{20}$ alkoxy group; or a $C_1$-$C_{20}$ alkyl group or a $C_1$-$C_{20}$ alkoxy group, each substituted with at least one deuterium, wherein, in Formulae 2A and 2B, * indicates a binding site to an adjacent atom.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
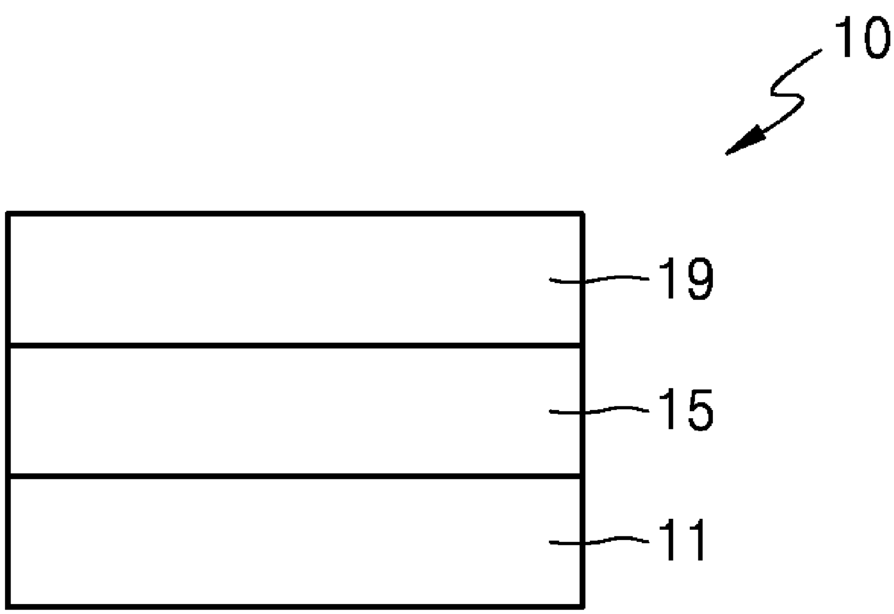
FIG. 1 is a schematic cross-sectional view of an organic light-emitting device according to an exemplary embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween. In contrast, when an element is referred to as being "directly on" another element, there are no intervening elements present It will be understood that, although the terms "first," "second," "third" etc. may be used herein to describe various elements, components, regions, layers and/or sections, these elements, components, regions, layers and/or sections should not be limited by these terms These terms are only used to distinguish one element, component, region, layer or section from another element, component, region, layer or section Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures It will be understood that relative terms are intended to encompass different orientations of the device in addition to the orientation depicted in the Figures For example, if the device in one of the figures is turned over, elements described as being on the "lower" side of other elements would then be oriented on "upper" sides of the other elements The exemplary term "lower," can therefore, encompasses both an orientation of "lower" and "upper," depending on the particular orientation of the figure Similarly, if the device in one of the figures is turned over, elements described as "below" or "beneath" other elements would then be oriented "above" the other elements The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments As such, variations from the shapes of the illustrations as a result, for example, of manufacturing techniques and/or tolerances, are to be expected Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features Moreover, sharp angles that are illustrated may be rounded Thus, the regions illustrated in the figures are schematic in nature and their shapes are not intended to illustrate the precise shape of a region and are not intended to limit the scope of the present claims.

An organic light-emitting device may include a first electrode, a second electrode facing the first electrode, and an organic layer between the first electrode and the second electrode, wherein the organic layer may include an emission layer.

The emission layer may include a first compound, a second compound, and a fluorescent dopant. The first compound, the second compound, and the fluorescent dopant may be different from one another. That is, the emission layer may include at least three different types of compounds.

The total weight of the first compound and the second compound may be greater than a weight of the fluorescent dopant.

The first compound may be represented by Formula 1:

1

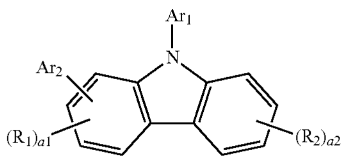

2A

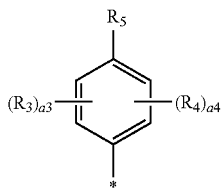

2B

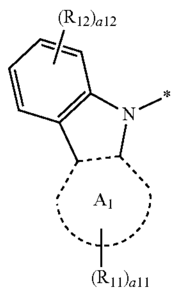

wherein, in Formula 1, $Ar_1$ may be represented by Formula 2A, and $Ar_2$ may be represented by Formula 2B. Formulae 2A and 2B may respectively be understood by referring to the descriptions of Formulae 2A and 2B provided herein.

In Formula 2B, ring $A_1$ may be a dibenzofuran group or a dibenzothiophene group.

In an embodiment, in Formula 1, $Ar_1$ may be represented by one of Formulae 2A-1 to 2A-5:

2A-1

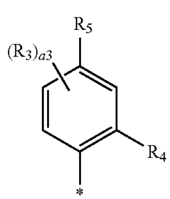

2A-2

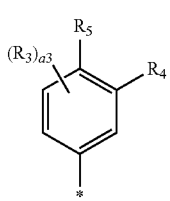

-continued 2A-3

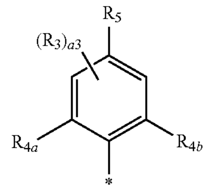

2A-4

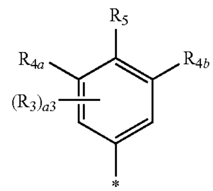

2A-5

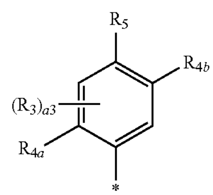

wherein, in Formulae 2A-1 to 2A-5, $R_3$ to $R_5$ may respectively be understood by referring to the descriptions of $R_3$ to $R_5$ provided herein, a3 may be an integer from 0 to 2, $R_{4a}$ and $R_{4b}$ may each be understood by referring to the description of $R_4$ provided herein, and

* indicates a binding site to an adjacent atom.

In one or more embodiments, in Formula 1, $Ar_2$ may represented by one of Formulae 2B-1 to 2B-6:

2B-1

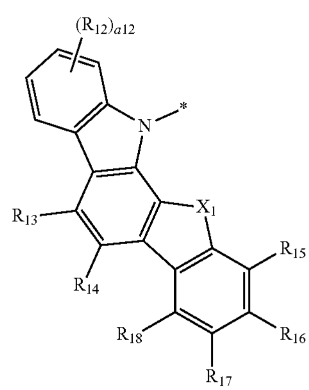

-continued 2B-2

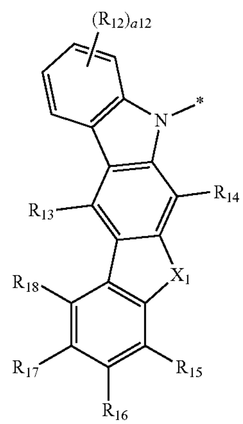

2B-3

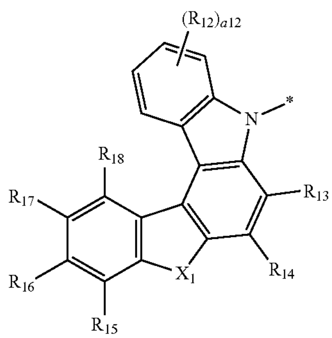

2B-4

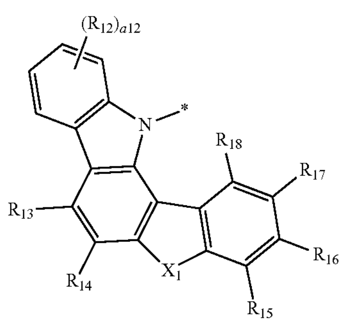

2B-5

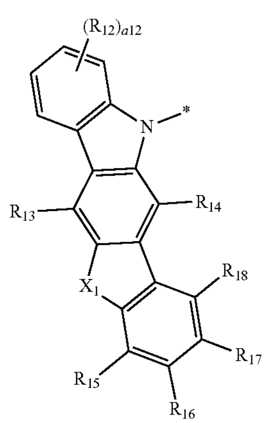

-continued 2B-6

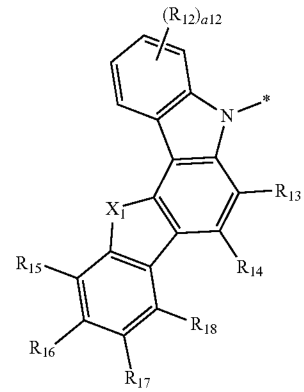

wherein, in Formulae 2B-1 to 2B-6, $X_1$ may be O or S, $R_{12}$ and a12 may respectively be understood by referring to the descriptions of $R_{12}$ and a12 provided herein, $R_{13}$ to $R_{18}$ may each be understood by referring to the description of $R_{11}$ provided herein, and

* indicates a binding site to an adjacent atom.

In Formulae 1, 2A, and 2B, $R_1$ to $R_3$, $R_{11}$, and $R_{12}$ may each independently be:

hydrogen, deuterium, a $C_1$-$C_{20}$ alkyl group, a $C_1$-$C_{20}$ alkoxy group, a phenyl group, a biphenyl group, a terphenyl group, a carbazolyl group, a pyridinyl group, a dibenzofuranyl group, a dibenzothiophenyl group, or a dibenzosilolyl group;

a $C_1$-$C_{20}$ alkyl group or a $C_1$-$C_{20}$ alkoxy group, each substituted with at least one deuterium; or a phenyl group, a biphenyl group, a terphenyl group, a carbazolyl group, a pyridinyl group, a dibenzofuranyl group, a dibenzothiophenyl group, or a dibenzosilolyl group, each substituted with at least one deuterium, a $C_1$-$C_{20}$ alkyl group, a $C_1$-$C_{20}$ alkoxy group, a phenyl group, a biphenyl group, a terphenyl group, a carbazolyl group, a pyridinyl group, a dibenzofuranyl group, a dibenzothiophenyl group, a dibenzosilolyl group, or any combination thereof.

In some embodiments, $R_1$ to $R_3$, $R_{11}$, and $R_{12}$ may each independently be:

hydrogen, deuterium, a $C_1$-$C_{10}$ alkyl group, a $C_1$-$C_{10}$ alkoxy group, a phenyl group, a biphenyl group, or a terphenyl group;

a $C_1$-$C_{10}$ alkyl group or a $C_1$-$C_{10}$ alkoxy group, each substituted with at least one deuterium; or a phenyl group, a biphenyl group, or a terphenyl group, each substituted with at least one deuterium, a $C_1$-$C_{20}$ alkyl group, a $C_1$-$C_{20}$ alkoxy group, a phenyl group, a biphenyl group, a terphenyl group, or any combination thereof.

In Formulae 1 and 2A, a1 and a3 may respectively indicate the number of R1(s) and R3(s), and a1 and a3 may each independently be an integer from 0 to 3. When a1 is 2 or greater, at least two R1(s) may be identical to or different from each other. When a3 is 2 or greater, at least two R3(s) may be identical to or different from each other.

In Formulae 1 and 2B, a2 and a12 may respectively indicate the number of $R_2$(s) and $R_{12}$(s), and a2 and a12 may each independently be an integer from 0 to 4. When a2 is 2 or greater, at least two $R_2$(s) may be identical to or different from each other. When a12 is 2 or greater, at least two $R_{12}$(s) may be identical to or different from each other.

In Formula 2B, a11 indicates the number of $R_{11}$(s), and a11 may be an integer from 0 to 6. When a11 is an integer of 2 or greater, at least two $R_{11}$(s) may be identical to or different from each other.

In Formula 2A, $R_4$ may be:

a phenyl group, a biphenyl group, or a terphenyl group;

a phenyl group, a biphenyl group, or a terphenyl group, each substituted with at least one deuterium, a $C_1$-$C_{20}$ alkyl group, a $C_1$-$C_{20}$ alkoxy group, or any combination thereof.

In an embodiment, in Formula 2A, $R_4$ may be represented by one of Formulae 3-1 to 3-7:

3-1

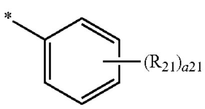

3-2

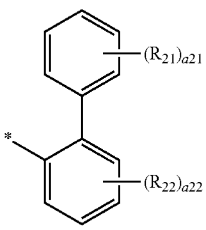

3-3

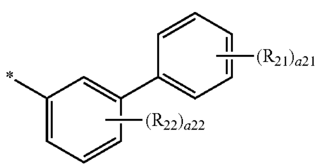

3-4

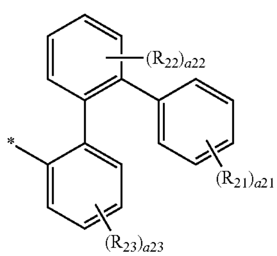

3-5

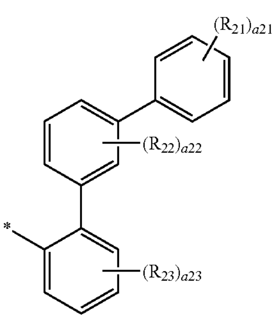

3-6

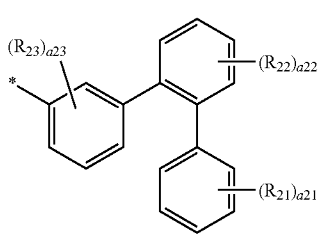

-continued 3-7

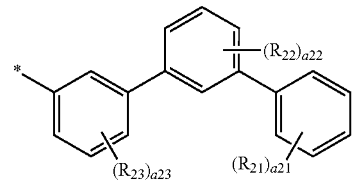

wherein, in Formulae 3-1 to 3-7, $R_{21}$ to $R_{23}$ may each independently be hydrogen, deuterium, a $C_1$-$C_{10}$ alkyl group, or a $C_1$-$C_{10}$ alkoxy group, a21 may be an integer from 0 to 5, a22 and a23 may each independently be an integer from 0 to 4, and

* indicates a binding site to an adjacent atom.

In Formula 2A, a4 indicates the number of $R_4$(s), and a4 may be an integer from 1 to 4. When a4 is 2 or greater, at least two $R_4$(s) may be identical to different from each other.

In Formula 2A, $R_5$ may be:

hydrogen, deuterium, a $C_1$-$C_{20}$ alkyl group, or a $C_1$-$C_{20}$ alkoxy group; or a $C_1$-$C_{20}$ alkyl group or a $C_1$-$C_{20}$ alkoxy group, each substituted with at least one deuterium.

In an embodiment, in Formula 2A, $R_5$ may be hydrogen, deuterium, a $C_1$-$C_{10}$ alkyl group, or a $C_1$-$C_{10}$ alkoxy group.

In Formulae 2A and 2B, * indicates a binding site to an adjacent atom.

In one or more embodiments, the first compound may be a compound represented by one of Formulae 1-1 to 1-4:

1-1

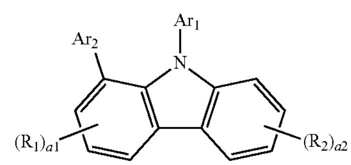

1-2

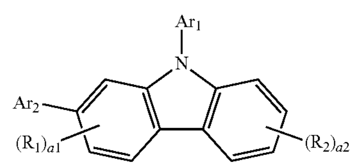

1-3

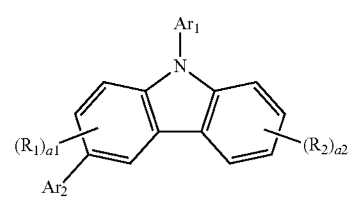

1-4

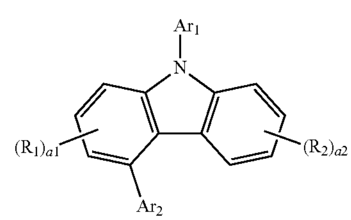

wherein, in Formulae 1-1 to 1-4, $Ar_1$, $Ar_2$, $R_1$, $R_2$, a1, and a2 may respectively be understood by referring to the descriptions of $Ar_1$, $Ar_2$, $R_1$, $R_2$, a1, and a2 provided herein.

In some embodiments, the first compound may be one of Compounds H1-1 to H1-11:
H1-1
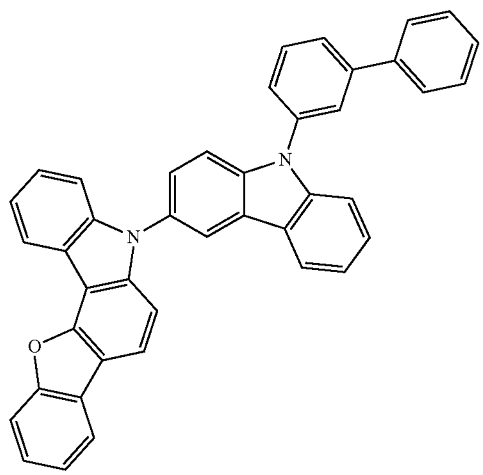
H1-2
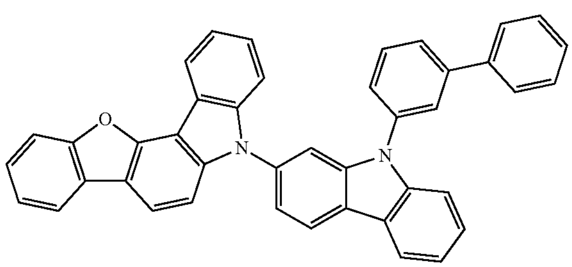
H1-3
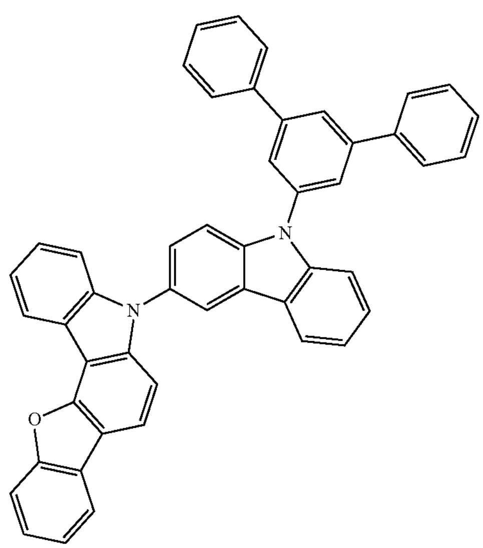
-continued
H1-4
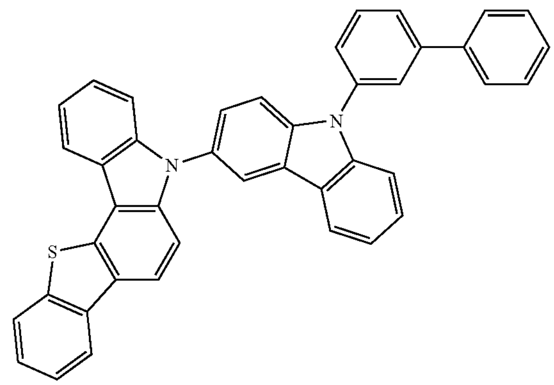
H1-5
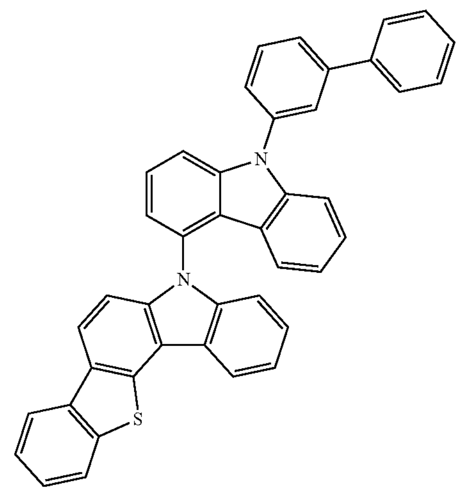
H1-6
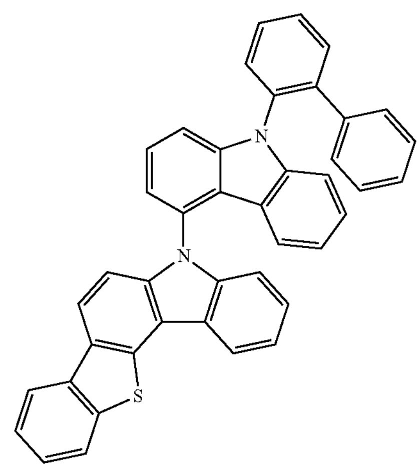

-continued

H1-7

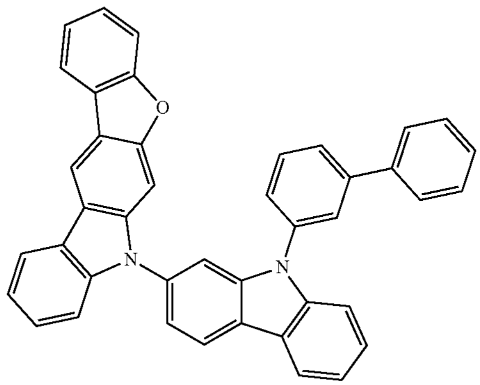

H1-8

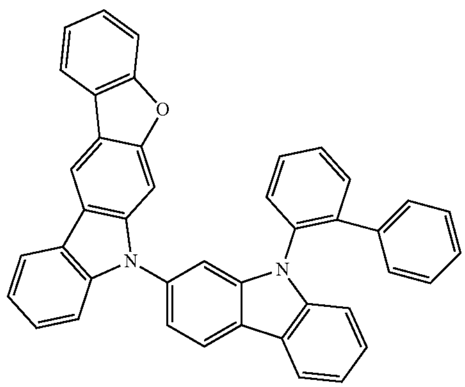

H1-9

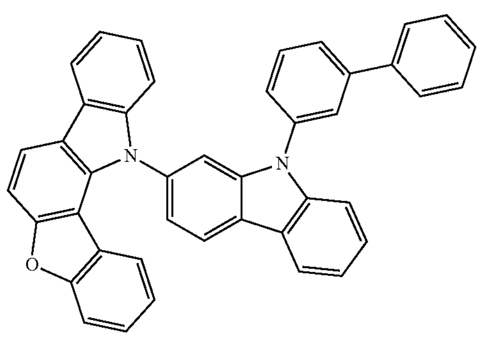

H1-10

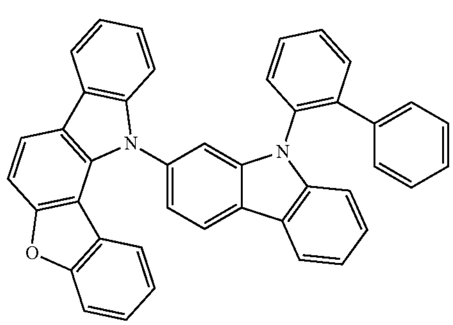

-continued

H1-11

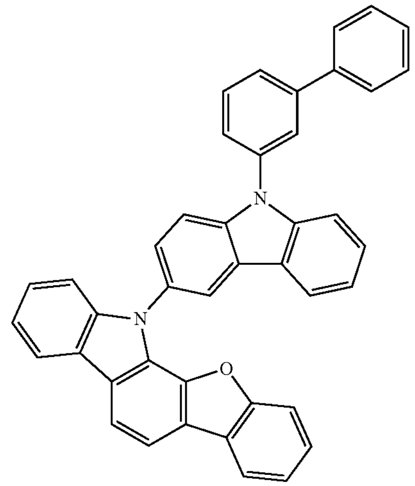

While not wishing to be bound by theory, it is understood that, a fluorescent dopant (e.g., a blue fluorescent dopant) in an emission layer may be a hole trapping material, and due to the fluorescent dopant, hole transport in the emission layer may not be facilitated. As a result, i) a driving voltage of an organic light-emitting device may increase, ii) excess holes and/or electrons that are not recombined in the emission layer may combine with triplet excitons in the emission layer to occur triplet-polaron-quenching (TPQ) to thereby reduce a luminescence efficiency of the organic light-emitting device, and iii) bonds in molecules of emission layer materials may be broken due to energy generated by the TPQ to thereby reduce lifespan of the organic light-emitting device.

However, as the first compound in the emission layer is represented by Formula 1, excellent hole transportability may be obtained. As a result, hole injection characteristics to the emission layer (e.g., hole injection characteristics to the emission layer at a low grayscale (luminance) of 100 nit or lower, or 50 nit or lower, or a low current density of 1 mA/cm$^2$ or lower) may be improved to thereby substantially prevent charge unbalance between holes and electrons in the emission layer. Accordingly, an efficiency of triplet-triplet fusion (TTF) generation in the emission layer may be increased to thereby improve the luminescence efficiency of an organic light-emitting device including the emission layer, and a driving voltage and dark expression (e.g., dark expression in a low grayscale (luminance) of 100 nit or lower, or 50 nit or lower, or a low current density of 1 mA/cm$^2$ or lower) may be improved.

In an embodiment, the first compound and the second compound in the emission layer may satisfy Equation 1:

$$|S1(H1)-2\times T1(H2)|\leq 0.15\ \text{eV} \quad \text{Equation 1}$$

wherein, in Equation 1,

S1(H1) represents an S1 singlet energy level (electron volts, eV) of the first compound, T1(H2) represents a T1 triplet energy level (eV) of the second compound, and S1(H1) and T1(H2) may each be obtained (calculated) using a density functional theory (DFT).

The term "S1 singlet energy level" as used herein refers to the lowest singlet energy level.

The term "T1 triplet energy level" as used herein refers to the lowest triplet energy level.

The term "using a density functional theory (DFT)" as used herein refers to use of the quantum chemistry computational method based on the 6-311+G(d,p) basis set according to a DFT. The quantum chemistry computational method may be performed, for example, by using the Gaussian 09 program.

As the first compound and the second compound in the emission layer satisfy Equation 1, the high multiple excited state triplet energy of the second compound (e.g., T1, T2, and/or T3 triplet energy of the second compound) may be easily shifted to the S1 singlet excited state of the first compound and sequentially to the S1 singlet excited state of the second compound, the S1 singlet excited state of the fluorescent dopant, and the ground state of the fluorescent dopant to thereby emit fluorescence. That is, as the first compound and the second compound in the emission layer satisfy Equation 1, the high multiple excited state triplet energy of the second compound may effectively contribute to fluorescence emission from the emission layer without loss in the form of heat or the like. Accordingly, as the first compound and the second compound in the emission layer satisfy Equation 1, TTF fluorescence emission from the emission layer may be increased, and thus, an organic light-emitting device including the emission layer may have an excellent luminescence efficiency and an excellent driving voltage.

For example, S1(H1) may be in a range of about 3.0 eV to about 4.0 eV or about 3.2 eV to about 3.8 eV.

For example, T1(H2) may be in a range of about 1.3 eV to about 2.1 eV or about 1.5 eV to about 1.9 eV.

In one or more embodiments, the first compound and the second compound may satisfy Equation 2:

$$T1(H1)>T1(H2) \quad \text{Equation 2}$$

wherein, in Formula 2,

T1(H1) represents a T1 triplet energy level (eV) of the first compound,

T1(H2) represents a T1 triplet energy level (eV) of the second compound, and

T1(H1) and T1(H2) may each be obtained using DFT.

For example, T1(H1) may be in a range of about 2.5 eV to about 3.5 eV or about 2.8 eV to about 3.2 eV.

As the first compound and the second compound in the emission layer satisfy Equation 2, triplet excitons of the first compound may be easily shifted to the T1 triplet excited state of the second compound such that triplet collision in the second compound may occur. Accordingly, as the first compound and the second compound in the emission layer satisfy Equation 2, an organic light-emitting device including the emission layer may have an excellent luminescence efficiency.

In one or more embodiments, the first compound and the second compound may satisfy Equation 3:

$$T1(H1)>T2(H2) \quad \text{Equation 3}$$

wherein, in Equation 3,

T1(H1) represents a T1 triplet energy level (eV) of the first compound,

T2(H2) represents a T2 triplet energy level (eV) of the second compound, and

T1(H1) and T2(H2) may each be obtained using DFT.

For example, T2(H2) may be in a range of about 2.0 eV to about 2.6 eV or about 2.1 eV to about 2.5 eV.

In one or more embodiments, the first compound and the second compound may satisfy Equation 4:

$$|HOMO(H1)|<|HOMO(H2)| \quad \text{Equation 4}$$

wherein, in Equation 4,

|HOMO(H1)| represents an absolute value of the highest occupied molecular orbital (HOMO) energy level (eV) of the first compound,

|HOMO(H2)| represents an absolute value of the HOMO energy level (eV) of the second compound, and HOMO(H1) and HOMO(H2) may each be obtained using DFT.

For example, HOMO(H1) may be in a range of about −5.4 eV to about −4.8 eV or about −5.2 eV to about −5.0 eV.

For example, HOMO(H2) may be in a range of about −5.6 eV to about −5.0 eV or about −5.3 eV to about −5.1 eV.

In one or more embodiments, the first compound and the second compound may satisfy Equation 5:

$$|LUMO(H1)|<|LUMO(H2)| \quad \text{Equation 5}$$

wherein, in Equation 5,

|LUMO(H1)| represents an absolute value of the lowest unoccupied molecular orbital (LUMO) energy level (eV) of the first compound,

|LUMO(H2)| represents an absolute value of the LUMO energy level (eV) of the second compound, and LUMO(H1) and LUMO(H2) may each be obtained using DFT.

For example, LUMO(H1) may be in a range of about −1.3 eV to about −0.9 eV or about −1.2 eV to about −1.0 eV.

For example, LUMO(H2) may be in a range of about −2.0 eV to about −1.3 eV or about −1.8 eV to about −1.5 eV.

As the first compound and the second compound in the emission layer satisfy at least one of Equations 3 to 5, an organic light-emitting device including the emission layer may have an excellent luminescence efficiency and improved driving voltage.

The first compound and the second compound may not form an exciplex with each other. For example, a difference between a maximum emission wavelength of an emission peak in a photoluminescence (PL) spectrum of a film prepared by co-depositing the first compound and the second compound and a maximum emission wavelength of an emission peak in a photoluminescence (PL) spectrum of a film prepared by depositing the first compound or the second compound only may be about 5 nm or less, for example, about 3 nm or less.

The second compound may be any suitable host.

For example, the second compound may be any suitable fluorescent host.

In some embodiments, the second compound may be a single compound or a mixture of at least two different types of compounds.

In some embodiments, the second compound may be any suitable host that may satisfy at least one of Equations 1 to 5.

In an embodiment, the second compound may not include nitrogen.

In one or more embodiments, the second compound may include at least two $C_5$-$C_{60}$ cyclic groups, and the at least two $C_5$-$C_{60}$ cyclic groups may be bound to each other via a carbon-carbon single bond.

In one or more embodiments, the second compound may include at least one condensed cyclic group, and the condensed cyclic group may be i) a condensed cyclic group in which at least two first rings are condensed, ii) a condensed cyclic group in which at least two second rings are condensed, or iii) a condensed cyclic group in which at least one first ring is condensed with at least one second ring, wherein the first ring may be a benzene group, and the second ring may be a cyclopentadiene group, a furan group, a thiophene group, or a selenophene group. The at least one condensed cyclic group may be identical to or different from each other.

In one or more embodiments, the second compound may include a first condensed cyclic group and a second condensed cyclic group, wherein the first condensed cyclic group may be a benzene group condensed with at least two third rings, the second condensed cyclic group may be a benzene group condensed with at least one third ring, and each occurrence of the third ring may each independently be a benzene group, a cyclopentadiene group, a furan group, a thiophene group, or a selenophene group. The third rings may be identical to or different from each other, and the first and second condensed cyclic groups may be identical to or different from each other.

In one or more embodiments, the second compound may include a first condensed cyclic group and a second condensed cyclic group, wherein the first condensed cyclic group and the second condensed cyclic group may each independently be a benzene group condensed with at least two third rings, and each occurrence of the third ring may each independently be a benzene group, a cyclopentadiene group, a furan group, a thiophene group, or a selenophene group. The third rings may be identical to or different from each other, and the first and second condensed cyclic groups may be identical to or different from each other.

In one or more embodiments, the second compound may include a first cyclic group and a second cyclic group and the first cyclic group and the second cyclic group may each independently be a benzene group, a naphthalene group, a phenanthrene group, an anthracene group, a fluoranthene group, a triphenylene group, a pyrene group, a chrysene group, a naphthacene group (a tetracene group), a picene group, a perylene group, a pentaphene group, an indenoanthracene group, a furan group, a benzofuran group, a dibenzofuran group, a naphthobenzofuran group, a dinaphthofuran group, a thiophene group, a benzothiophene group, a dibenzothiophene group, a naphthobenzothiophene group, a dinaphthothiophene group, a cyclopentadiene group, an indene group, a fluorene group, a benzofluorene group, a dibenzofluorene group, a naphthofluorene group, a dinaphthofluorene group, a spiro-bifluorene group, a pyrrole group, an indene group, a carbazole group, a benzocarbazole group, a dibenzocarbazole group, a naphthocarbazole group, a dinaphthocarbazole group, a selenophene group, a benzoselenophene group, a dibenzoselenophene group, a naphthobenzoselenophene group, a dinaphthoselenophene group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an adamantane group, a norbornane group, or a norbornene group.

In one or more embodiments, the second compound may include a first condensed cyclic group having at least one third ring and a second condensed cyclic group having at least two third rings, and the third ring may be a benzene group, a naphthalene group, a phenanthrene group, an anthracene group, a fluoranthene group, a triphenylene group, a pyrene group, a chrysene group, a naphthacene group (a tetracene group), a picene group, a perylene group, a pentaphene group, an indenoanthracene group, a furan group, a benzofuran group, a dibenzofuran group, a naphthobenzofuran group, a dinaphthofuran group, a thiophene group, a benzothiophene group, a dibenzothiophene group, a naphthobenzothiophene group, a dinaphthothiophene group, a cyclopentadiene group, an indene group, a fluorene group, a benzofluorene group, a dibenzofluorene group, a naphthofluorene group, a dinaphthofluorene group, a spiro-bifluorene group, a pyrrole group, an indene group, a carbazole group, a benzocarbazole group, a dibenzocarbazole group, a naphthocarbazole group, a dinaphthocarbazole group, a selenophene group, a benzoselenophene group, a dibenzoselenophene group, a naphthobenzoselenophene group, a dinaphthoselenophene group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an adamantane group, a norbornane group, or a norbornene group. The third rings may be identical to or different from each other.

In one or more embodiments, i) the second compound may consist of carbon and hydrogen;

ii) the second compound may consist of carbon, hydrogen, and oxygen;

iii) the second compound may consist of carbon, hydrogen, and sulfur;

iv) the second compound may consist of carbon, hydrogen, and selenium (Se); or v) the second compound may consist of carbon, hydrogen, oxygen, and selenium (Se).

In one or more embodiments, the second compound may include at least one anthracene group.

In one or more embodiments, the second compound may include at least two anthracene groups.

In one or more embodiments, the second compound may include at least one of a dibenzofuran group and a dibenzoselenophene group.

In one or more embodiments, the second compound may include at least two anthracene groups and at least one dibenzofuran group.

In one or more embodiments, the second compound may include at least two anthracene groups and at least one dibenzoselenophene group.

In one or more embodiments, the second compound may be represented by Formula 40:

$$Ar_{41}\text{-}(L_{403})_{a403}\text{-}Ar_{42} \qquad \text{Formula 40}$$

wherein, in Formula 40, $Ar_{41}$ may be represented by Formula 41, and $Ar_{42}$ may be represented by Formula 42:

Formula 41

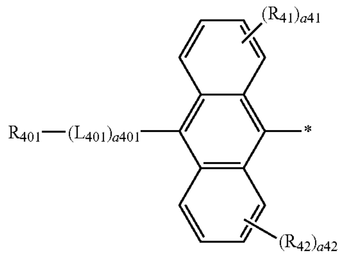

Formula 42

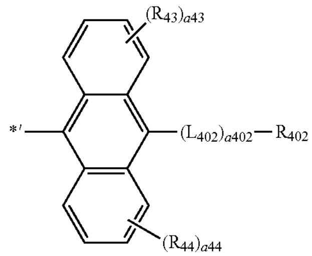

wherein, in Formulae 41 and 42, * and *' each indicate a binding site to $L_{403}$ in Formula 40, wherein, in Formulae 40 to 42, $L_{401}$ to $L_{403}$ may each independently be a single bond, a $C_5$-$C_{30}$ carbocyclic group unsubstituted or substituted with at least one $R_{40}$ or a $C_1$-$C_{30}$ heterocyclic group unsubstituted or substituted with at least one $R_{40}$, a401 to a403 may each independently be an integer from 1 to 10, when a401 is 2 or greater, at least two $L_{401}$(s) may be identical to or different from each other, when a402 is 2 or greater, at least two $L_{402}$(s) may be identical to or different from each other, and when a403 is 2 or greater, at least two $L_{403}$(s) may be identical to or different from each other, $R_{40}$ to $R_{44}$, $R_{401}$, and $R_{402}$ may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, a41 to a44 may each independently be an integer from 0 to 4, when a41 is 2 or greater, at least two $R_{41}$(s) may be identical to or different from each other, when a42 is 2 or greater, at least two $R_{42}$(s) may be identical to or different from each other, when a43 is 2 or greater, at least two $R_{43}$(s) may be identical to or different from each other, and when a44 is 2 or greater, at least two $R_{44}$(s) may be identical to or different from each other, a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})$ $(Q_{25})$, —$B(Q_{26})(Q_{27})$, —$P(=O)(Q_{28})(Q_{29})$, $P(Q_{28})(Q_{29})$, or any combination thereof;

—$N(Q_{31})(Q_{32})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$, or any combination thereof, wherein $Q_1$ to $Q_9$, $Q_{11}$ to $Q_{19}$, $Q_{21}$ to $Q_{29}$, and $Q_{31}$ to $Q_{39}$ may each independently be: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

In an embodiment, $R_{40}$ may not be a hydrogen.

In an embodiment, in Formulae 40 to 42, $L_{401}$ to $L_{403}$ may each independently be:

a single bond; or a benzene group, a naphthalene group, a phenanthrene group, an anthracene group, a fluoranthene group, a triphenylene group, a pyrene group, a chrysene group, a naphthacene group (a tetracene group), a picene group, a perylene group, a pentaphene group, an indenoanthracene group, a furan group, a benzofuran group, a dibenzofuran group, a naphthobenzofuran group, a dinaphthofuran group, a thiophene group, a benzothiophene group, a dibenzothiophene group, a naphthobenzothiophene group, a dinaphthothiophene group, a cyclopentadiene group, an indene group, a fluorene group, a benzofluorene group, a dibenzofluorene group, a naphthofluorene group, a dinaphthofluorene group, a spiro-bifluorene group, a pyrrole group, an indene group, a carbazole group, a benzocarbazole group, a dibenzocarbazole group, a naphthocarbazole group, a dinaphthocarbazole group, a selenophene group, a benzoselenophene group, a dibenzoselenophene group, a naphthobenzoselenophene group, a dinaphthoselenophene group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an adamantane group, a norbornane group, or a norbornene group, each unsubstituted or substituted with at least one $R_{40}$.

In an embodiment, in Formula 40, $L_{403}$ may be a single bond. That is, in Formula 40, $Ar_{41}$ and $Ar_{42}$ may be bound via a single bond.

In one or more embodiments, in Formula 40, $L_{403}$ may be a dibenzofuran group or a dibenzoselenophene group, each unsubstituted or substituted at least one $R_{40}$.

In one or more embodiments, in Formulae 40 to 42, a401 to a403 may respectively indicate the number of $L_{401}$(s) to $L_{403}$(s), and a401 to a403 may each independently be an integer from 1 to 10 (e.g., an integer from 1 to 3). When a401 is 2 or greater, at least two $L_{401}$(s) may be identical to or different from each other, when a402 is 2 or greater, at least two $L_{402}$(s) may be identical to or different from each other, and when a403 is 2 or greater, at least two $L_{403}$(s) may be identical to or different from each other.

For example, in Formulae 41 and 42, a401 and a402 may each independently be 1, 2, or 3.

In some embodiments, in Formula 40, a403 may be 1.

In one or more embodiments, in Formulae 40 to 42, $R_{40}$ to $R_{44}$, $R_{401}$, and $R_{402}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterium-containing $C_1$-$C_{20}$ alkyl group, a cyclopentyl group, a cyclohexyl group, a cycloheptyl group, a cyclooctyl group, an adamantanyl group, a norbornanyl group (a bicyclo[2.2.1]heptyl group), a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a 1,2,3,4-tetrahydronaphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a 1,2,3,4-tetrahydronaphthyl group, a phenanthrenyl group, an anthracenyl group, a fluoranthenyl group, a triphenylenyl group, a pyrenyl group, a chrysenyl group, a furanyl group, a benzofuranyl group, a dibenzofuranyl group, a naphthobenzofuranyl group, a dinaphthofuranyl group, a thiophenyl group, a benzothiophenyl group, a dibenzothiophenyl group, a naphthobenzothiophenyl group, a dinaphthothiophenyl group, an indenyl group, a fluorenyl group, a benzofluorenyl group, a dibenzofluorenyl group, a naphthofluorenyl group, a dinaphthofluorenyl group, a spiro-bifluorenyl group, a pyrrolyl group, an indenyl group, a carbazolyl group, a benzocarbazolyl group, a dibenzocarbazolyl group, a naphthocarbazolyl group, a dinaphthocarbazolyl group, a selenophenyl group, a benzoselenophenyl group, a dibenzoselenophenyl group, a naphthobenzoselenophenyl group, a dinaphthoselenophenyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzimidazolyl group, an isobenzothiazolyl group, a benzoxazolyl group, an isobenzoxazolyl group, a triazolyl group, a tetrazolyl group, an oxadiazolyl group, a triazinyl group, an imidazopyridinyl group, or an imidazopyrimidinyl group, each unsubstituted or substituted with at least one deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterium-containing $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a 1,2,3,4-tetrahydronaphthyl group, a phenanthrenyl group, an anthracenyl group, a fluoranthenyl group, a triphenylenyl group, a pyrenyl group, a chrysenyl group, a furanyl group, a benzofuranyl group, a dibenzofuranyl group, a naphthobenzofuranyl group, a dinaphthofuranyl group, a thiophenyl group, a benzothiophenyl group, a dibenzothiophenyl group, a naphthobenzothiophenyl group, a dinaphthothiophenyl group, an indenyl group, a fluorenyl group, a benzofluorenyl group, a dibenzofluorenyl group, a naphthofluorenyl group, a dinaphthofluorenyl group, a spiro-bifluorenyl group, a pyrrolyl group, an indenyl group, a carbazolyl group, a benzocarbazolyl group, a dibenzocarbazolyl group, a naphthocarbazolyl group, a dinaphthocarbazolyl group, a selenophenyl group, a benzoselenophenyl group, a dibenzoselenophenyl group, a naphthobenzoselenophenyl group, a dinaphthoselenophenyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzimidazolyl group, an isobenzothiazolyl group, a benzoxazolyl group, an isobenzoxazolyl group, a triazolyl group, a tetrazolyl group, an oxadiazolyl group, a triazinyl group, an imidazopyridinyl group, an imidazopyrimidinyl group, or any combination thereof; or $—N(Q_1)(Q_2)$, $—Si(Q_3)(Q_4)(Q_5)$, $—Ge(Q_3)(Q_4)(Q_5)$, $—B(Q_6)(Q_7)$, $—P(=O)(Q_8)(Q_9)$, or $—P(Q_8)(Q_9)$, wherein $Q_1$ to $Q_9$ may each independently be:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{20}$ alkyl group, a phenyl group, or any combination thereof.

In some embodiments, in Formulae 40 to 42, $R_{40}$ to $R_{44}$, $R_{401}$, and $R_{402}$ may each independently be:

hydrogen, deuterium, —F, a cyano group, a nitro group, $—SF_5$, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with at least one deuterium, —F, $—CD_3$, $—CD_2H$, $—CDH_2$, $—CF_3$, $—CF_2H$, $—CFH_2$, a cyano group, a nitro group, a $C_1$-$C_{20}$ alkyl group, a deuterium-containing $C_1$-$C_{20}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a 1,2,3,4-tetrahydronaphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a 1,2,3,4-tetrahydronaphthyl group, a phenanthrenyl group, an anthracenyl group, a fluoranthenyl group, a triphenylenyl group, a pyrenyl group, a chrysenyl group, a furanyl group, a benzofuranyl group, a dibenzofuranyl group, a naphthobenzofuranyl group, a dinaphthofuranyl group, a thiophenyl group, a benzothiophenyl group, a dibenzothiophenyl group, a naphthobenzothiophenyl group, a dinaphthothiophenyl group, an indenyl group, a fluorenyl group, a benzofluorenyl group, a dibenzofluorenyl group, a naphthofluorenyl group, a dinaphthofluorenyl group, a spiro-bifluorenyl group, a pyrrolyl group, an indenyl group, a carbazolyl group, a benzocarbazolyl group, a dibenzocarbazolyl group, a naphthocarbazolyl group, a dinaphthocarbazolyl group, a selenophenyl group, a benzoselenophenyl group, a dibenzoselenophenyl group, a naphthobenzoselenophenyl group, a dinaphthoselenophenyl group, a pyridinyl group, a pyrazinyl group, a pyrimidinyl group, a pyridazinyl group, a quinolinyl group, an isoquinolinyl group, a benzoquinolinyl group, a quinoxalinyl group, or a triazinyl group, each unsubstituted or substituted with at least one deuterium, —F, —$CD_3$, —$CD_2H$, —$CDH_2$, —$CF_3$, —$CF_2H$, —$CFH_2$, a cyano group, a nitro group, a $C_1$-$C_{20}$ alkyl group, a deuterium-containing $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a 1,2,3,4-tetrahydronaphthyl group, a phenanthrenyl group, an anthracenyl group, a fluoranthenyl group, a triphenylenyl group, a pyrenyl group, a chrysenyl group, a furanyl group, a benzofuranyl group, a dibenzofuranyl group, a naphthobenzofuranyl group, a dinaphthofuranyl group, a thiophenyl group, a benzothiophenyl group, a dibenzothiophenyl group, a naphthobenzothiophenyl group, a dinaphthothiophenyl group, an indenyl group, a fluorenyl group, a benzofluorenyl group, a dibenzofluorenyl group, a naphthofluorenyl group, a dinaphthofluorenyl group, a spiro-bifluorenyl group, a pyrrolyl group, an indenyl group, a carbazolyl group, a benzocarbazolyl group, a dibenzocarbazolyl group, a naphthocarbazolyl group, a dinaphthocarbazolyl group, a selenophenyl group, a benzoselenophenyl group, a dibenzoselenophenyl group, a naphthobenzoselenophenyl group, a dinaphthoselenophenyl group, a pyridinyl group, a pyrazinyl group, a pyrimidinyl group, a pyridazinyl group, a quinolinyl group, an isoquinolinyl group, a benzoquinolinyl group, a quinoxalinyl group, a triazinyl group, or any combination thereof; or —$Si(Q_3)(Q_4)(Q_5)$, $Q_3$ to $Q_5$ may respectively be understood by referring to the descriptions of $Q_3$ to $Q_5$ provided herein.

In some embodiments, in Formula 40, $R_{40}$ may be deuterium, or a $C_1$-$C_{20}$ alkyl group.

In one or more embodiments, in Formulae 41 and 42, a41 to a44 may respectively indicate the number of $R_{41}$(s) to $R_{44}$(s), and a41 to a44 may each independently be an integer from 0 to 4 (e.g., 0, 1, or 2). When a41 is 2 or greater, at least two $R_{41}$ groups may be identical to or different from each other, when a42 is 2 or greater, at least two $R_{42}$ groups may be identical to or different from each other, when a43 is 2 or greater, at least two $R_{43}$ groups may be identical to or different from each other, and when a44 is 2 or greater, at least two $R_{44}$ groups may be identical to or different from each other.

In some embodiments, in Formulae 41 and 42, a41 to a44 may each be 0.

In one or more embodiments, in Formula 40, $Ar_{41}$ may be identical to $Ar_{42}$.

In one or more embodiments, in Formula 40, $Ar_{41}$ may be different from $Ar_{42}$.

In one or more embodiments, the second compound may be a compound represented by one of Formulae 40-1 to 40-17:

40-1

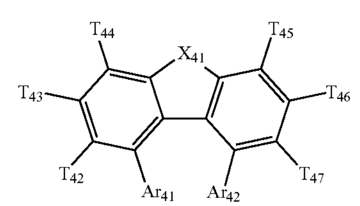

40-2

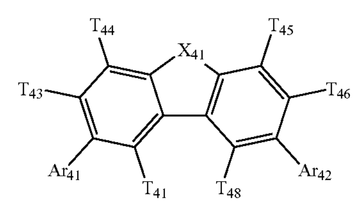

40-3

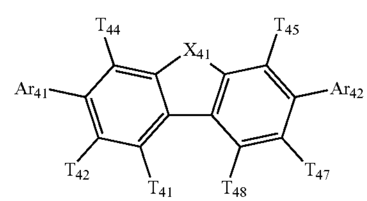

-continued
40-4
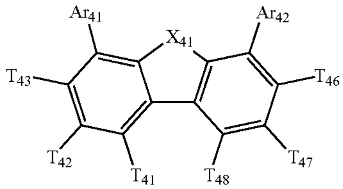
40-5
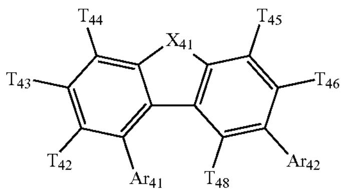
40-6
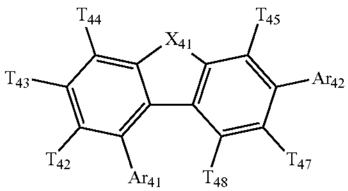
40-7
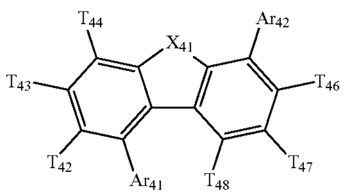
40-8
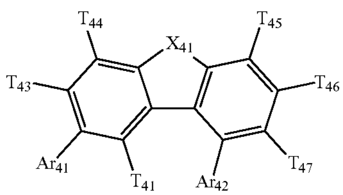
40-9
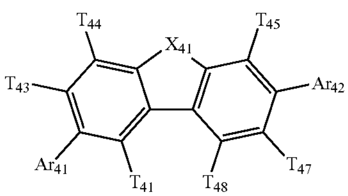
40-10
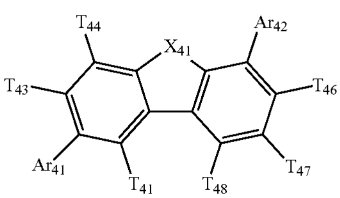
40-11
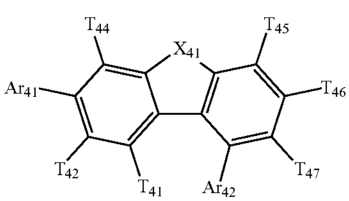
-continued
40-12
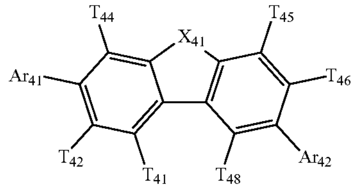
40-13
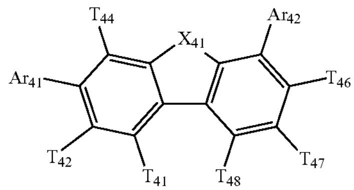
40-14
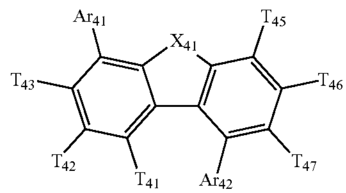
40-15
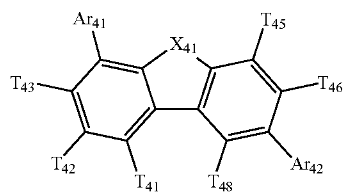
40-16
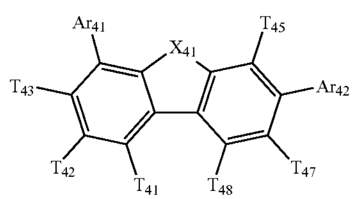
40-17
$Ar_{41}$—$Ar_{42}$
wherein, in Formulae 40-1 to 40-17,
$X_{41}$ may be O, S, or Se,
$Ar_{41}$ and $Ar_{42}$ may respectively be understood by referring to the descriptions of $Ar_{41}$ and $Ar_{42}$ provided herein, and
$T_{41}$ to $T_{48}$ may each be understood by referring to the description of $R_{40}$ provided herein.

In an embodiment, the second compound may be one of Compounds H2-1 to H2-3 or one of Compounds 1 to 2120:
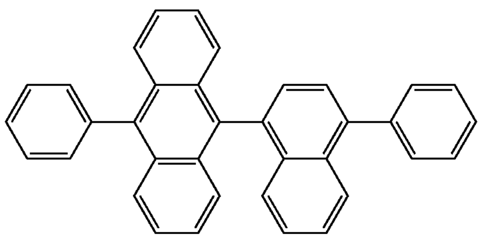
H2-1
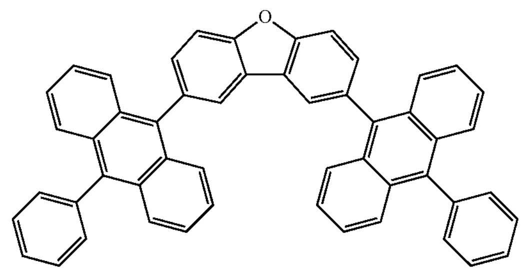
H2-2
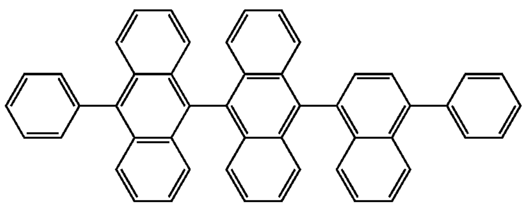
H2-3
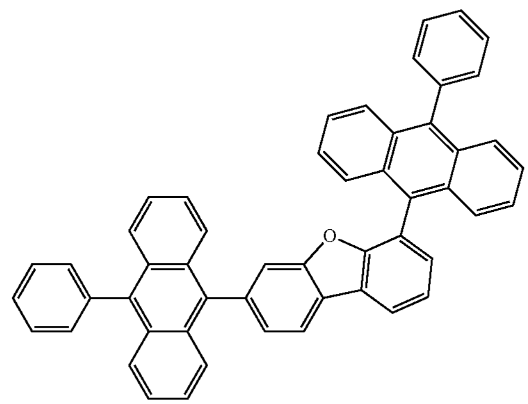
1
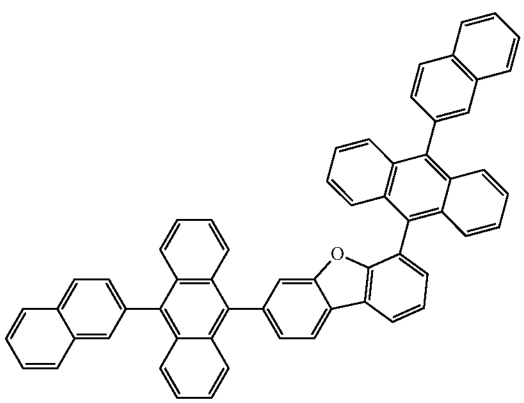
2
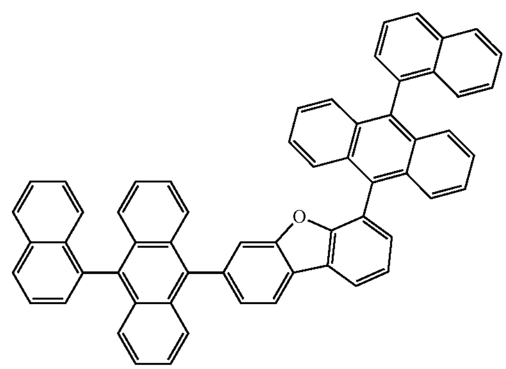
3
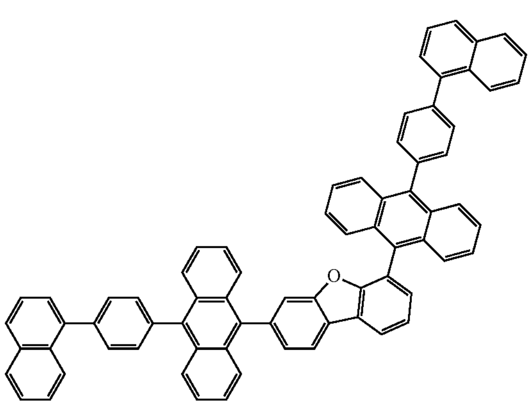
4
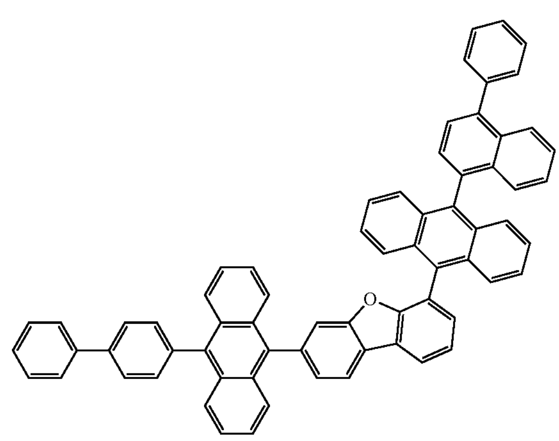
5

-continued
6
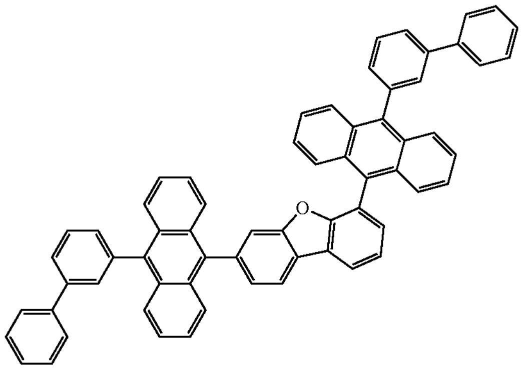
7
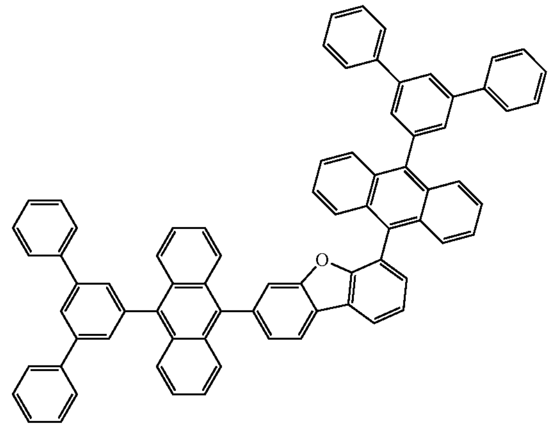
8
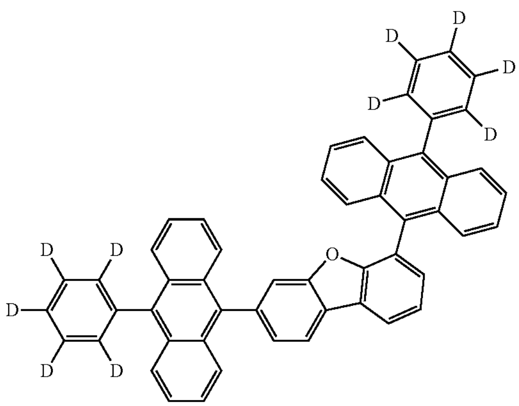
9
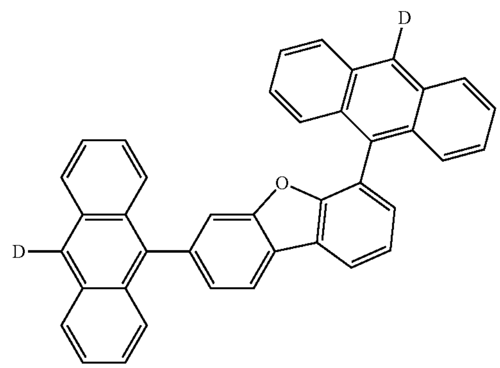
10
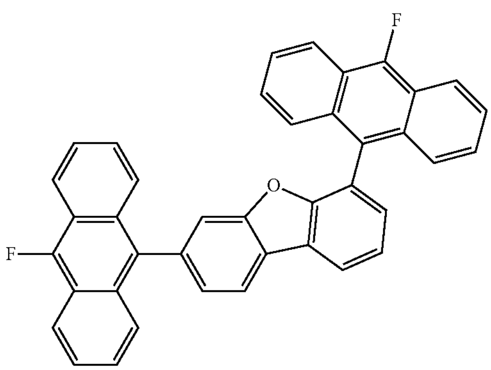
11
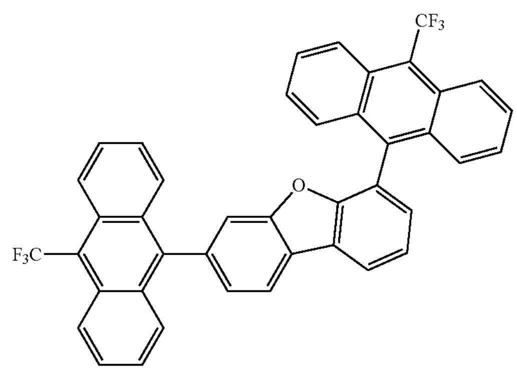
12
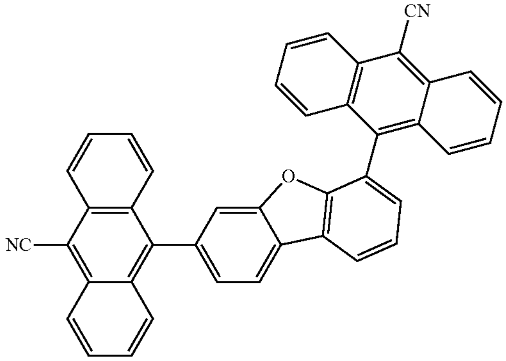
13
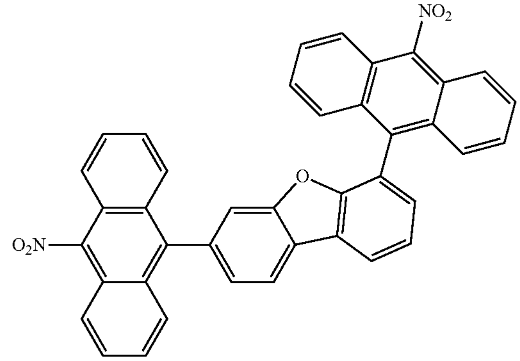

-continued
14
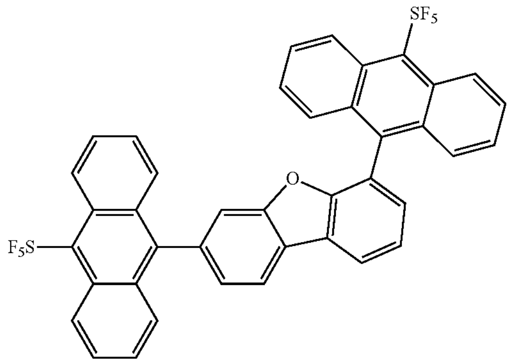
15
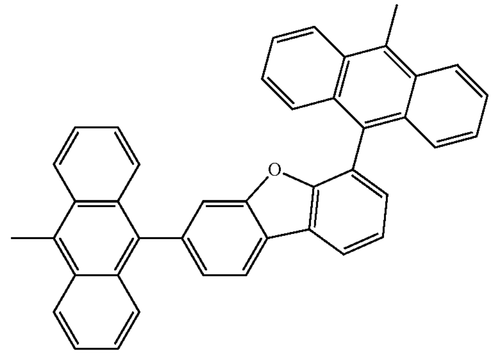
16
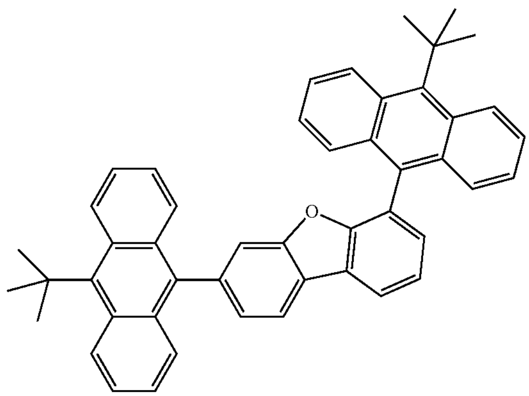
17
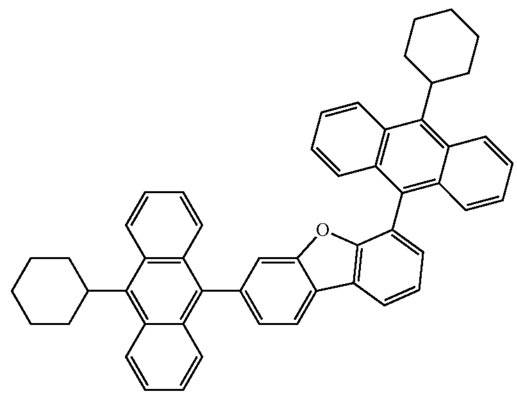
18
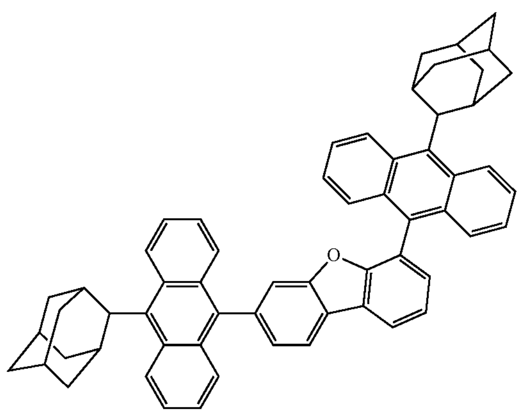
19
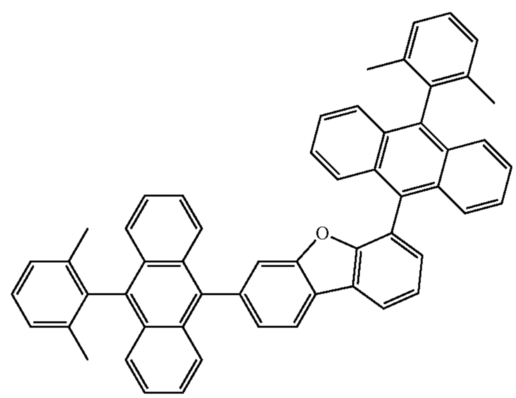
20
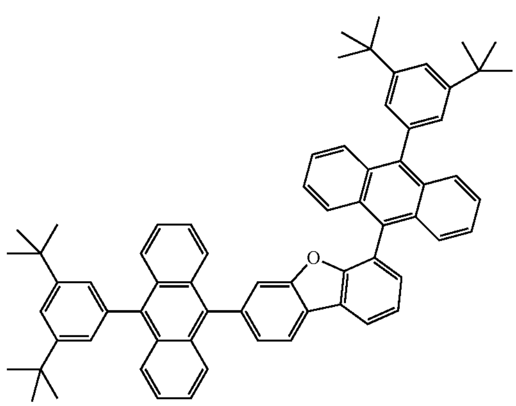
21
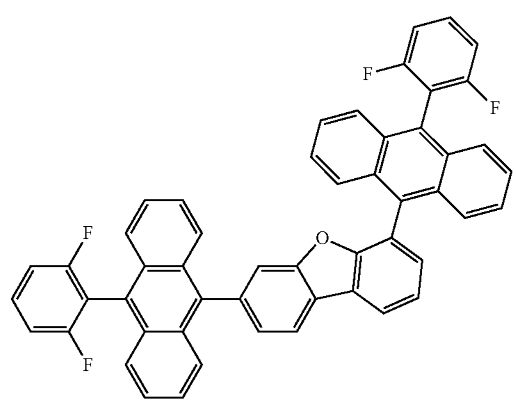

-continued
22
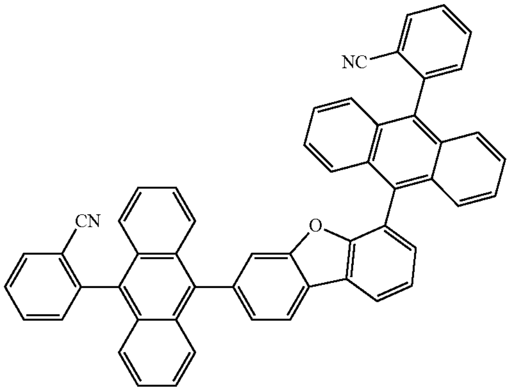
23
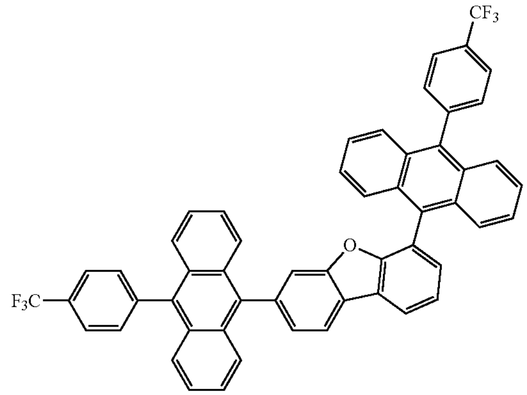
24
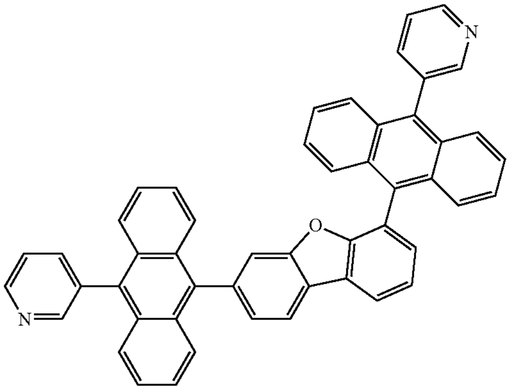
25
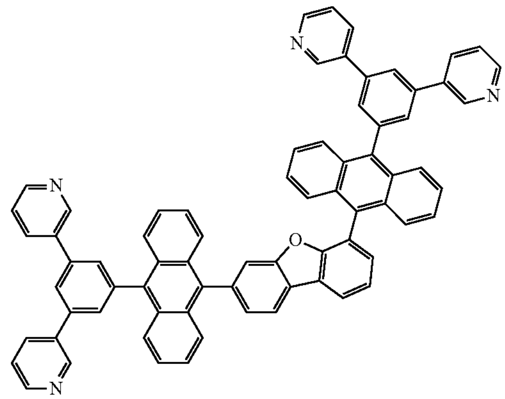
26
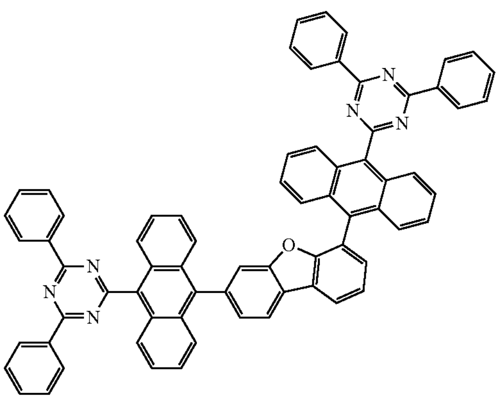
27
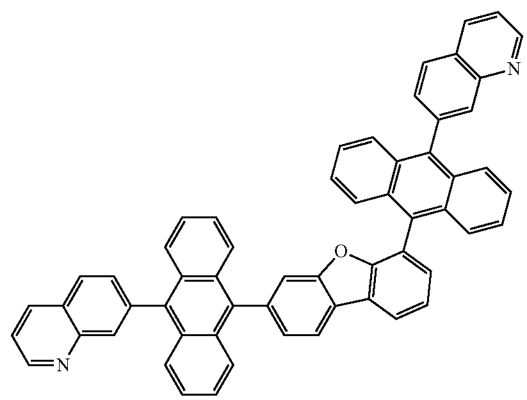
28
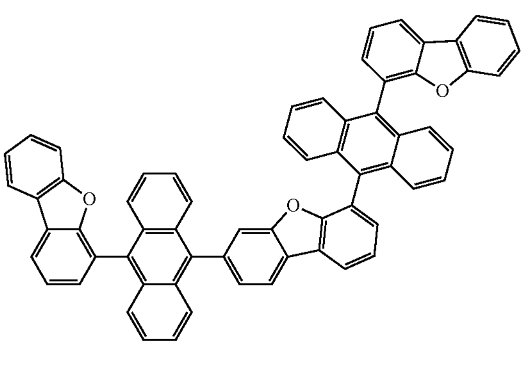
29
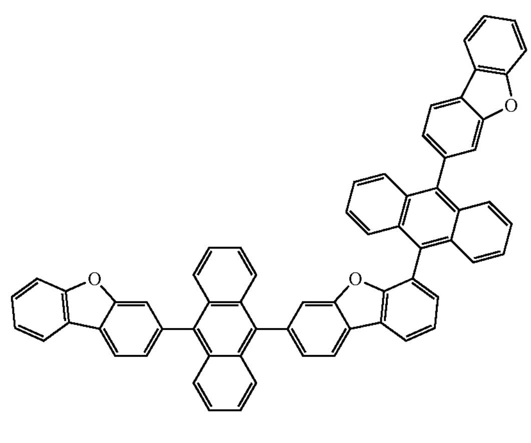

-continued
30
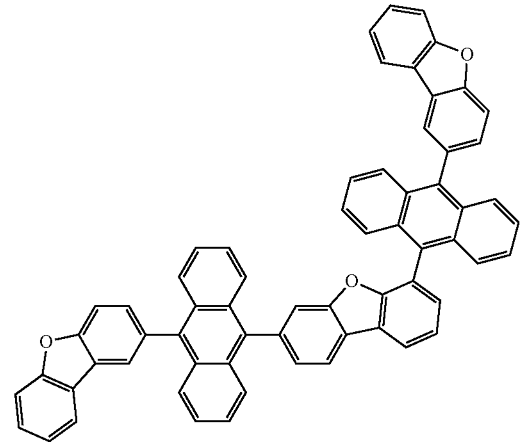
31
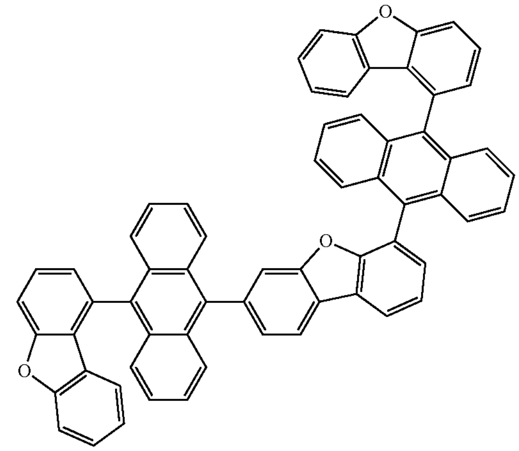
32
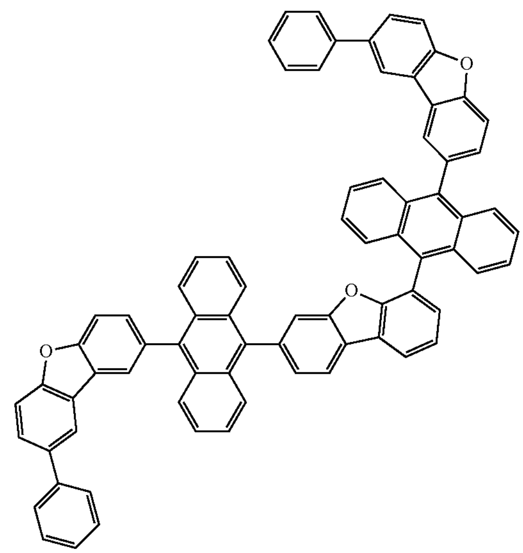
33
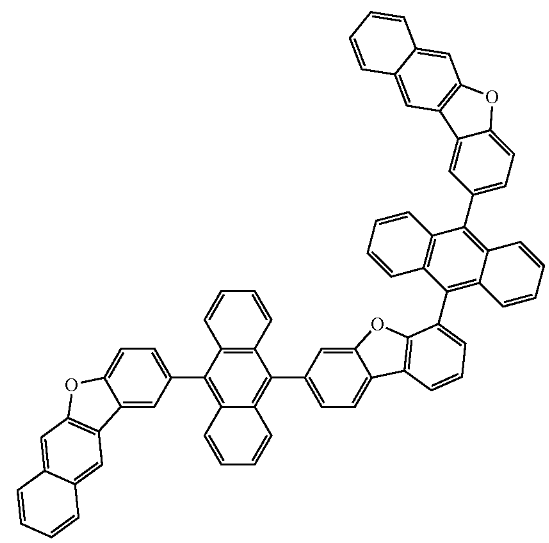
34
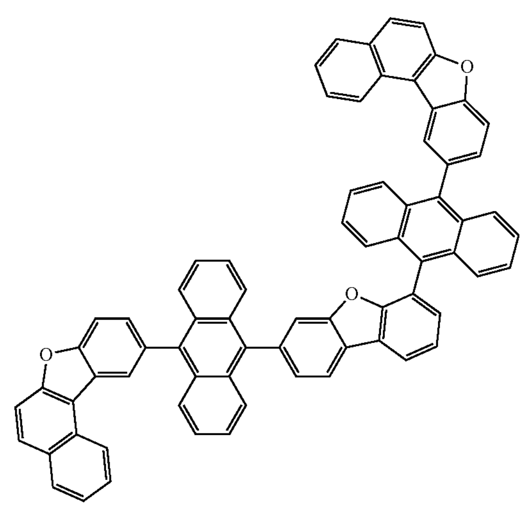
35
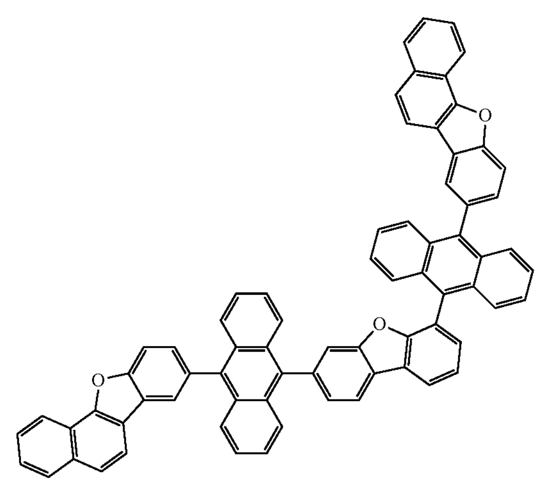

-continued
36
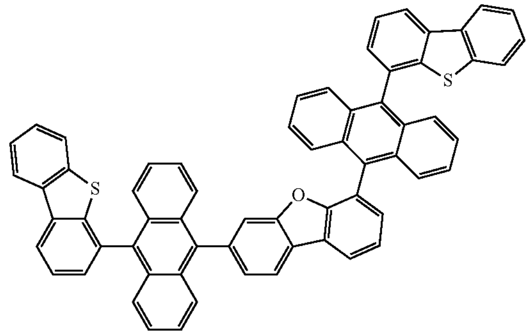
37
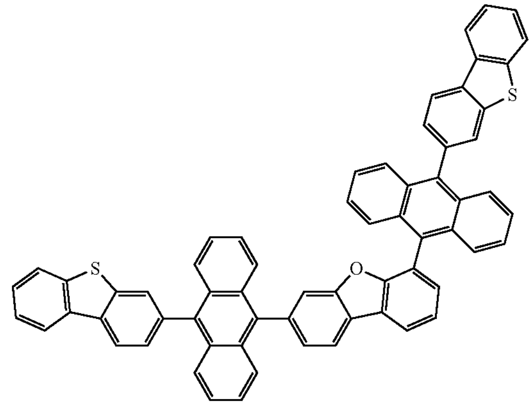
38
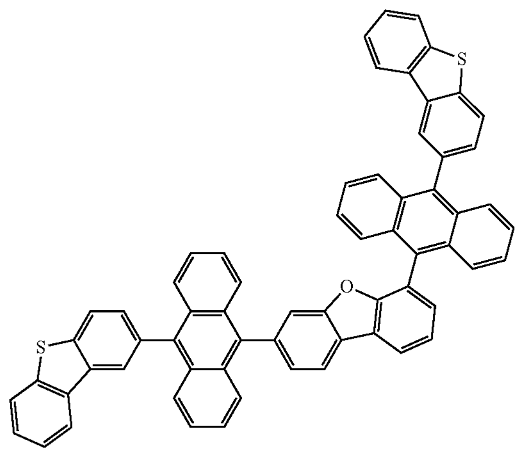
39
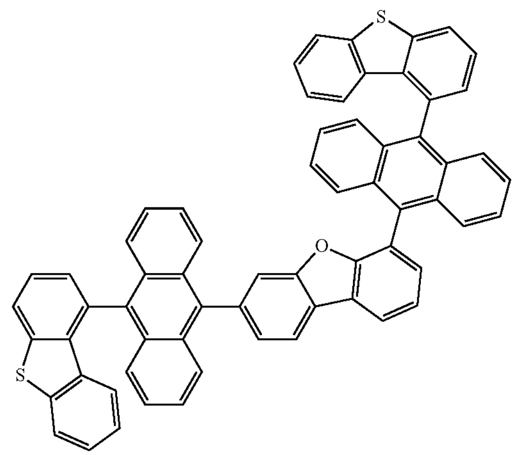
40
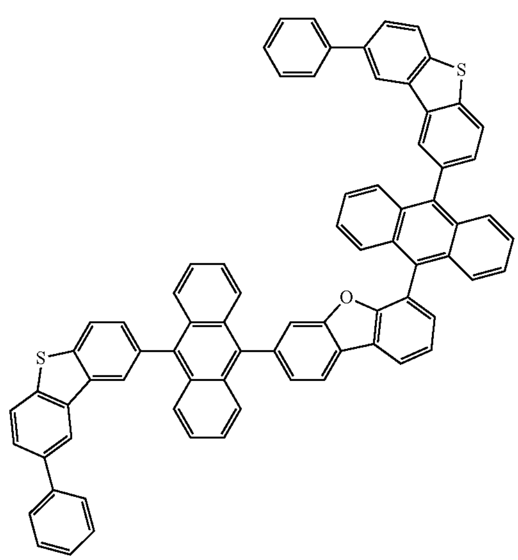
41
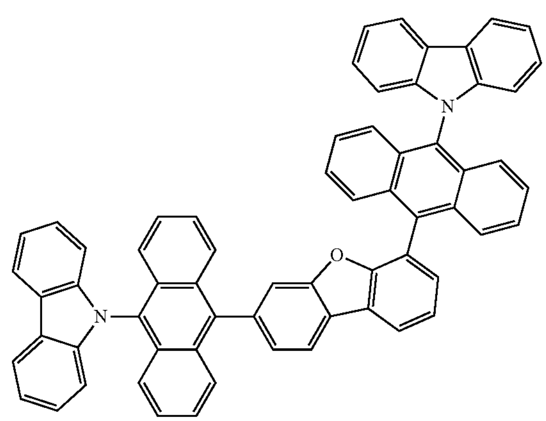

-continued
42
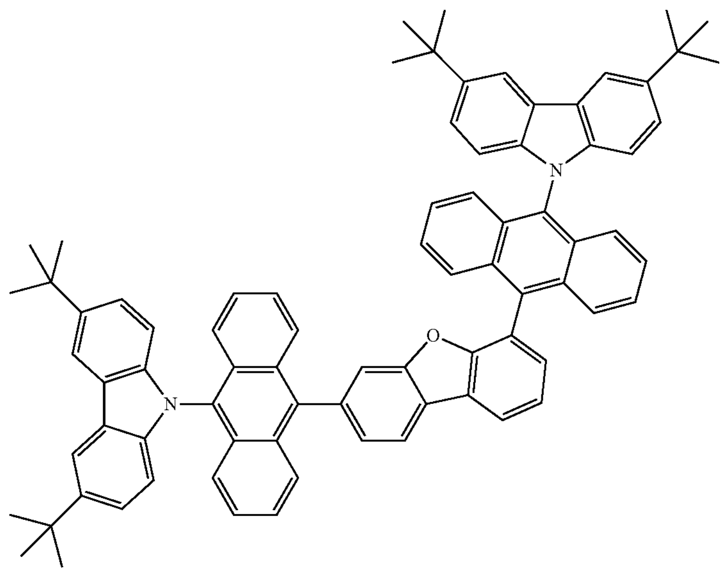
43
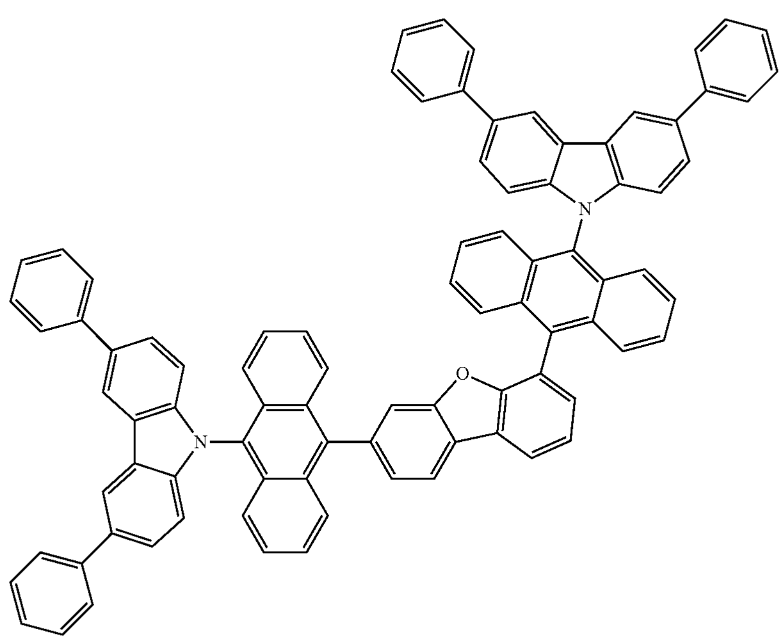

-continued
44
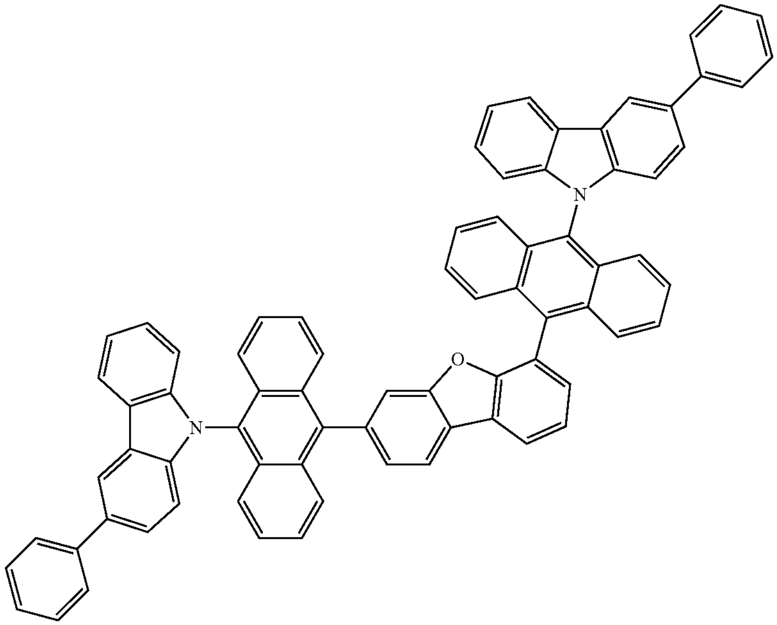
45
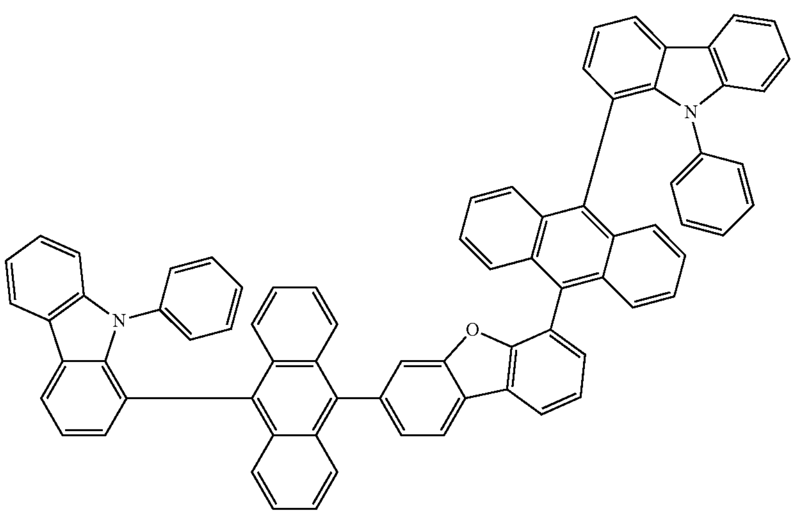

-continued
46
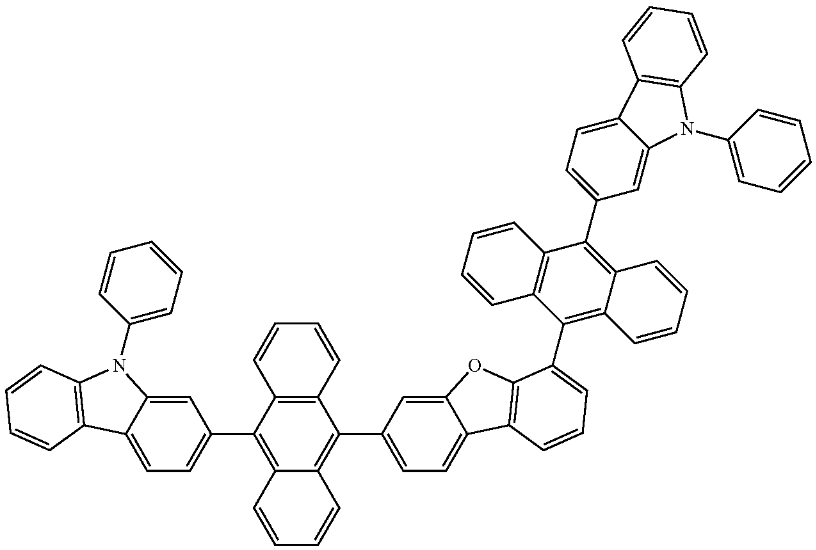
47
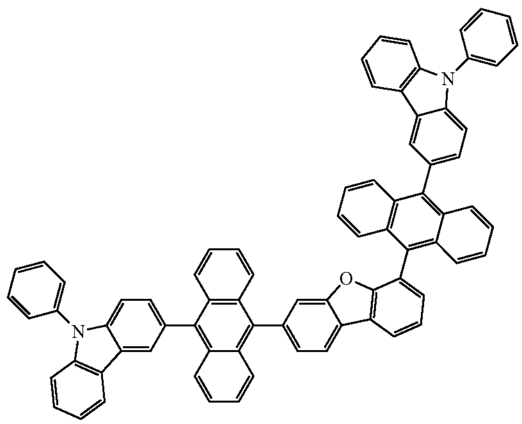
48
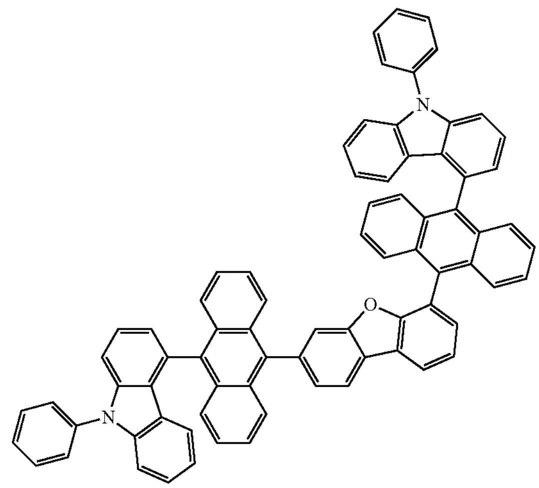
49
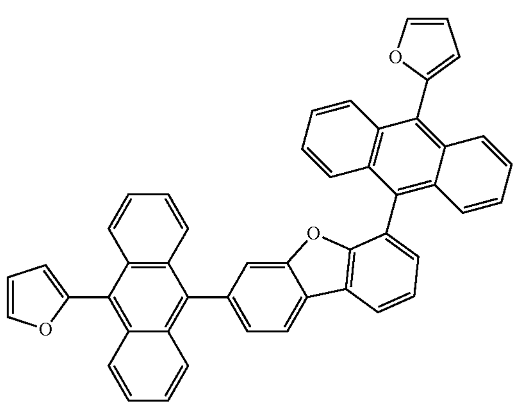
50
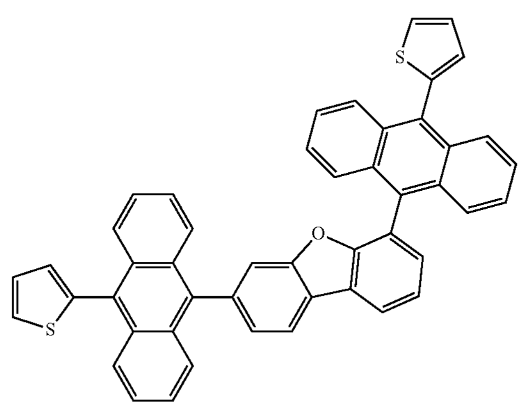

-continued
51
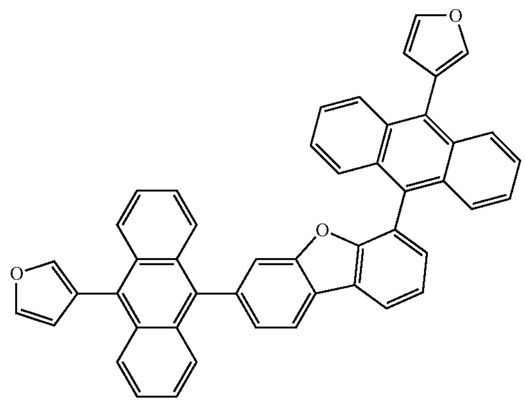
52
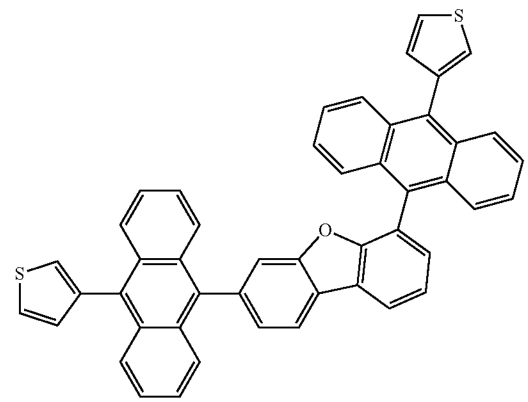
53
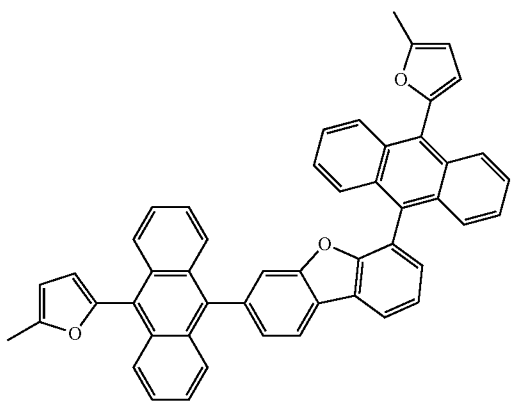
54
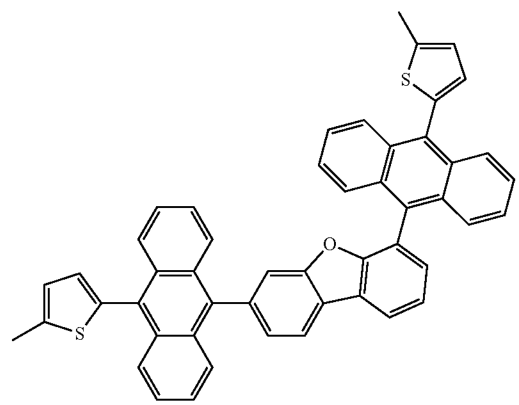
55
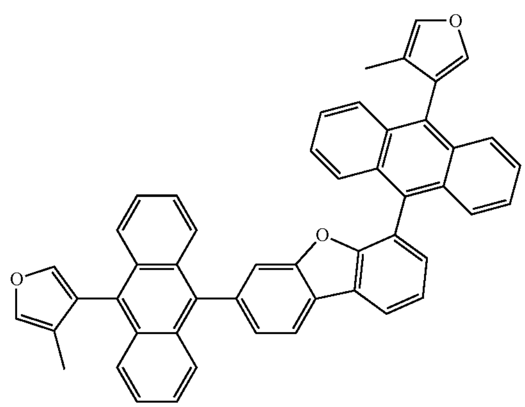
56
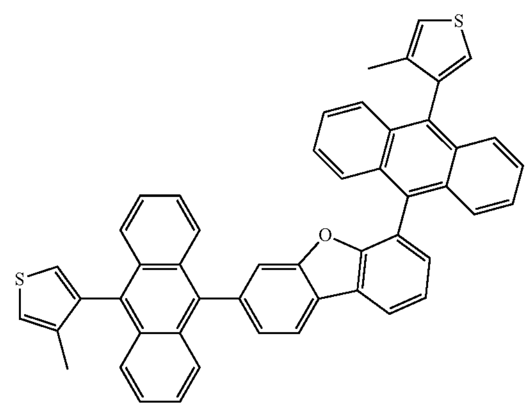
57
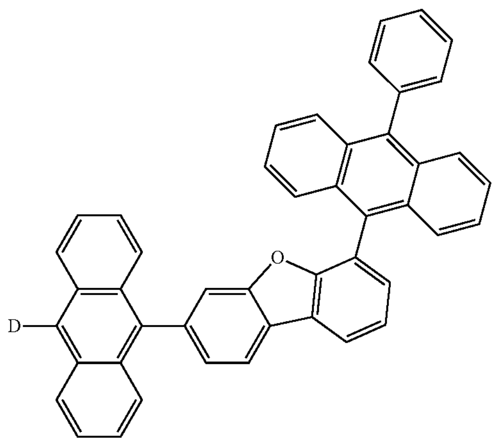
58
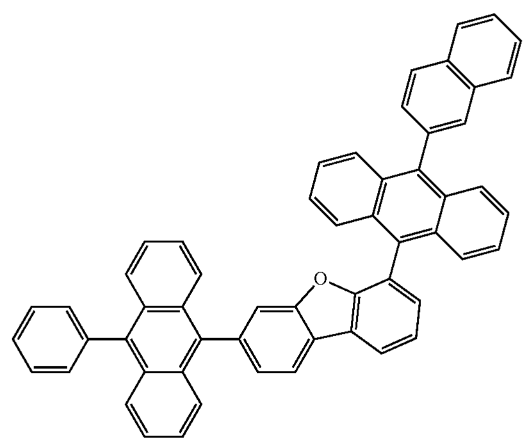

-continued
59
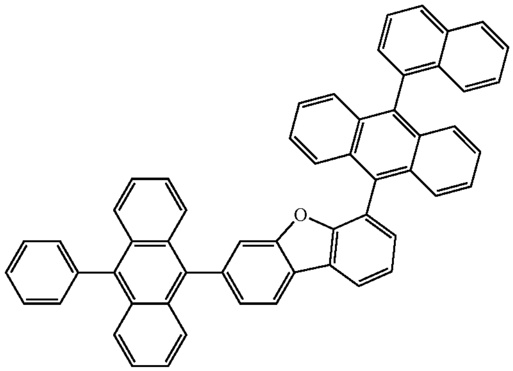
60
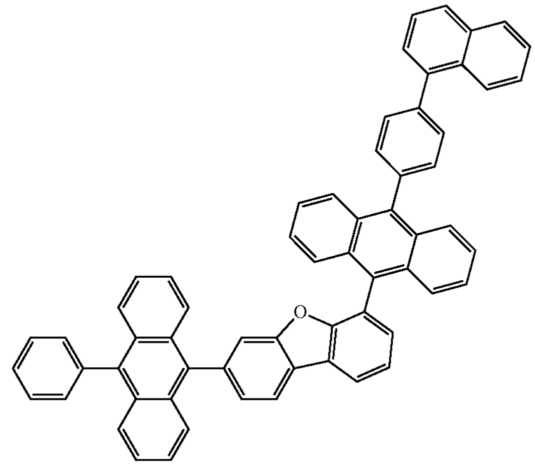
61
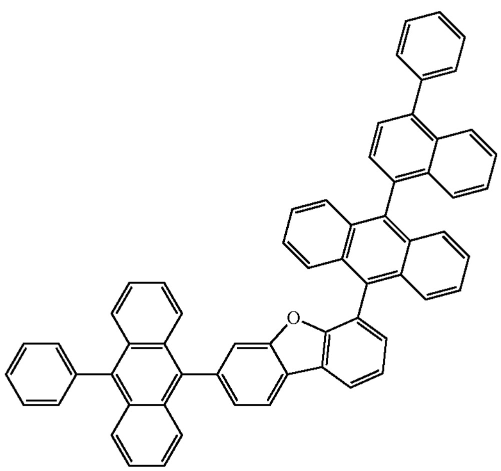
62
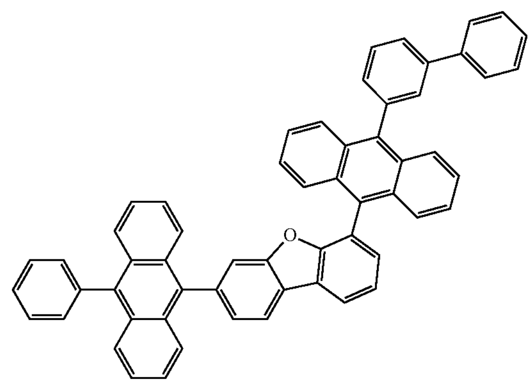
63
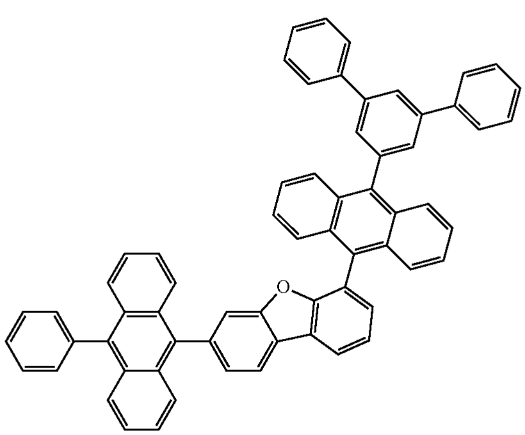
64
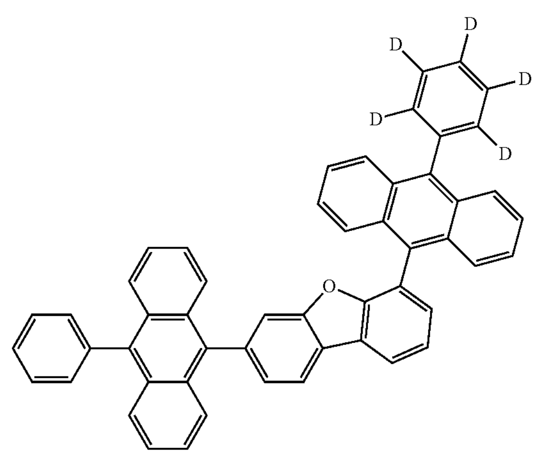

-continued
65
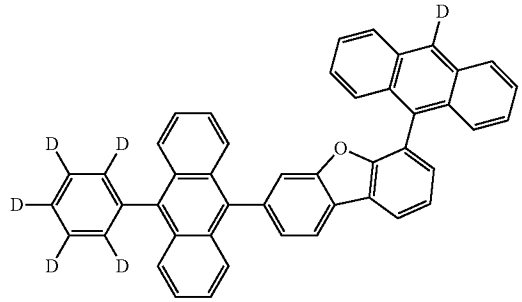
66
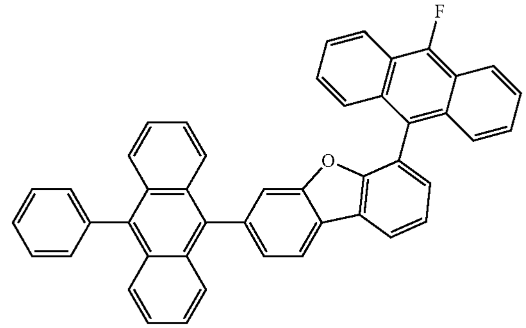
67
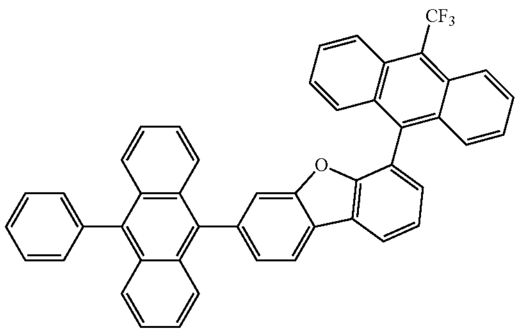
68
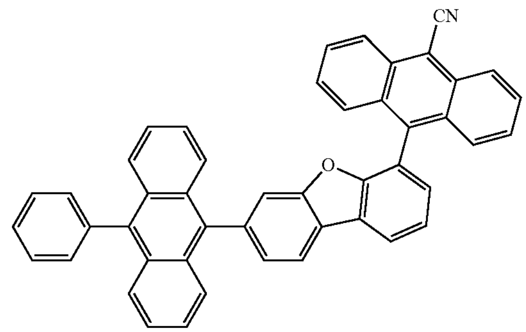
69
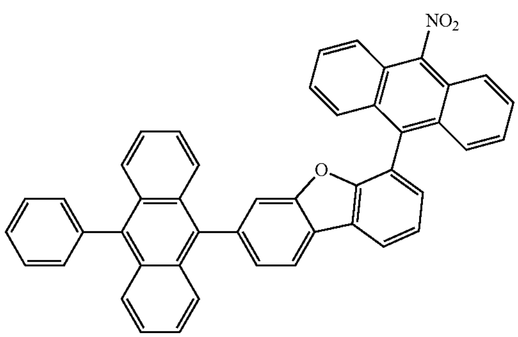
70
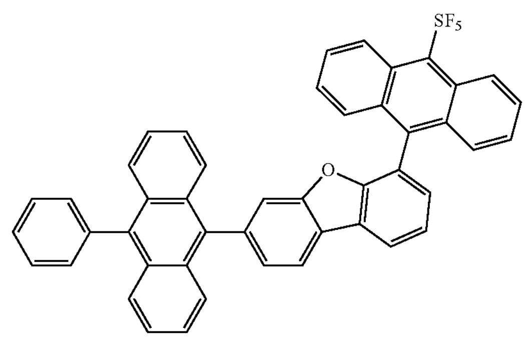
71
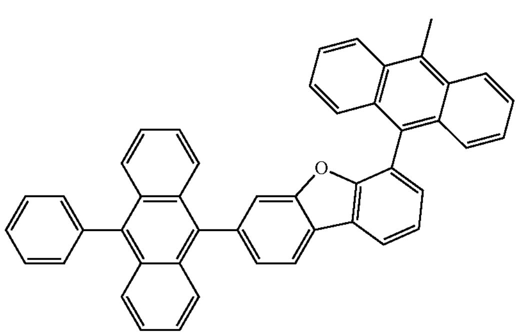
72
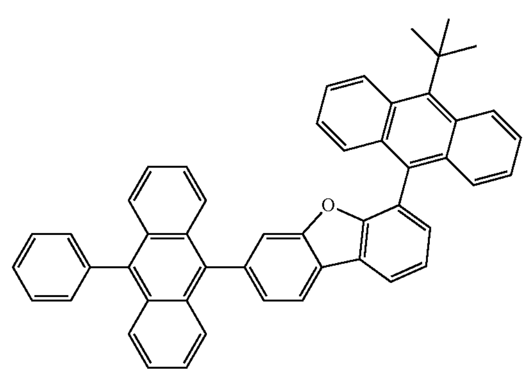

-continued
73
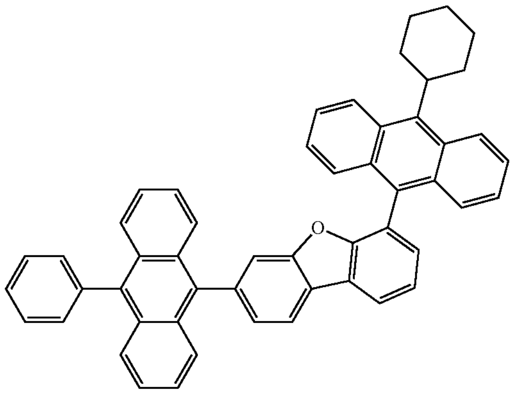
74
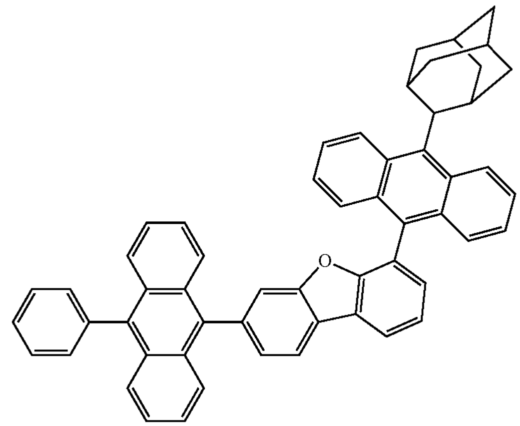
75
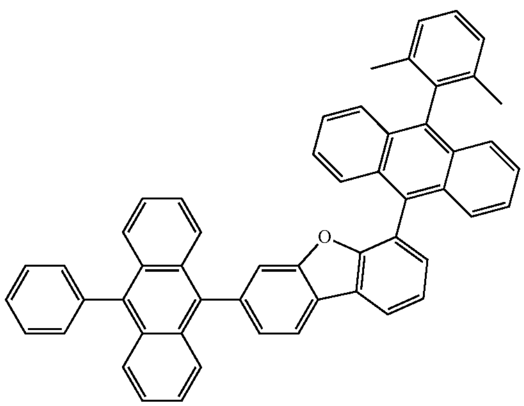
76
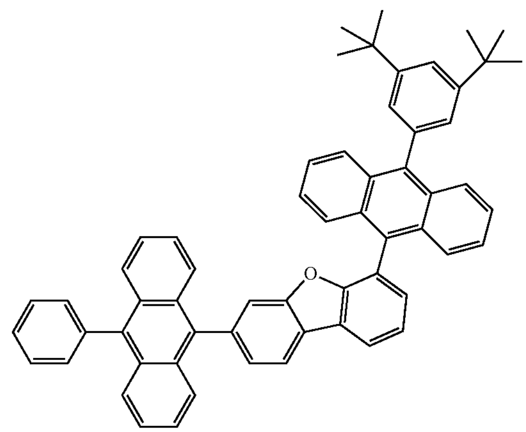
77
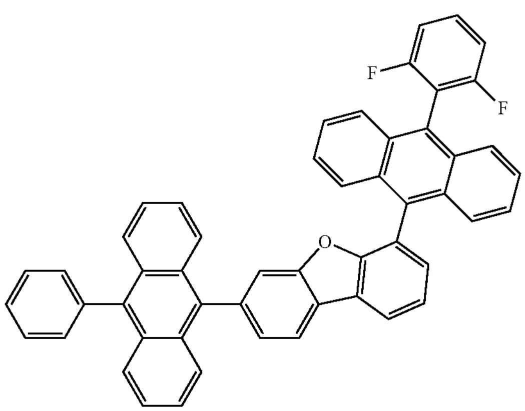
78
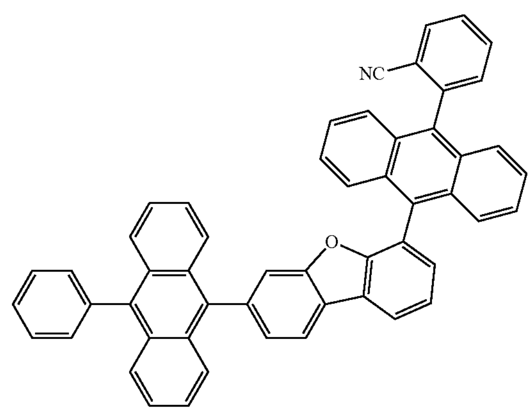

-continued
79
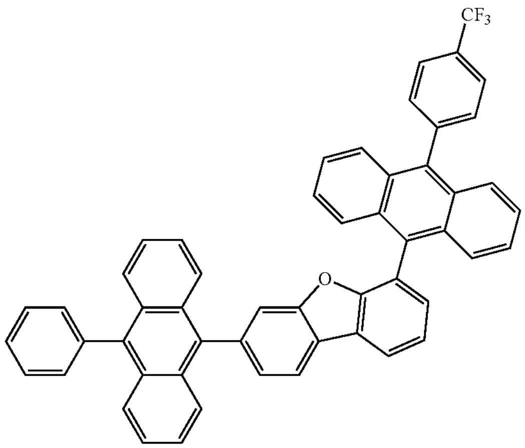
80
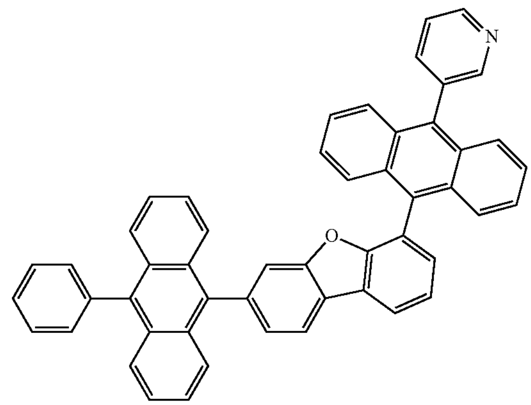
81
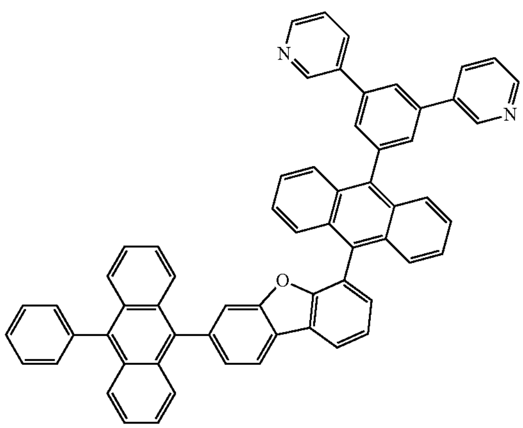
82
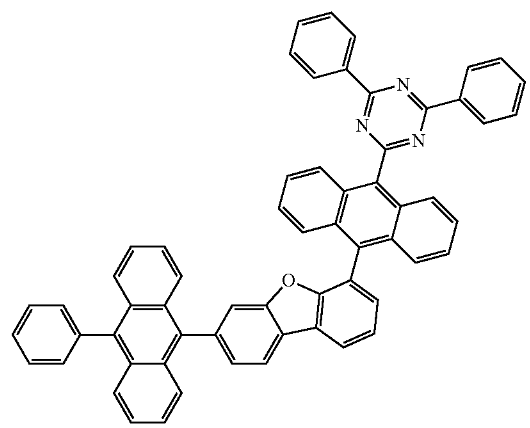
83
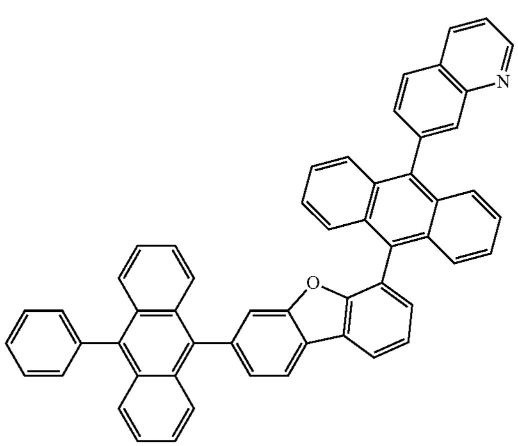
84
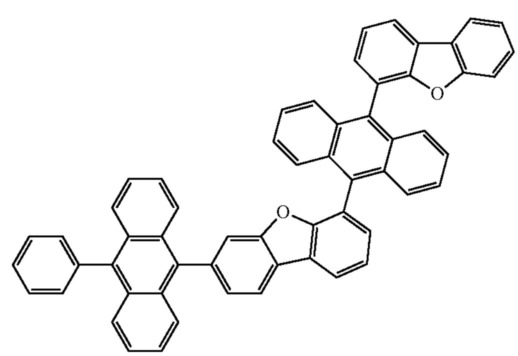

-continued
85
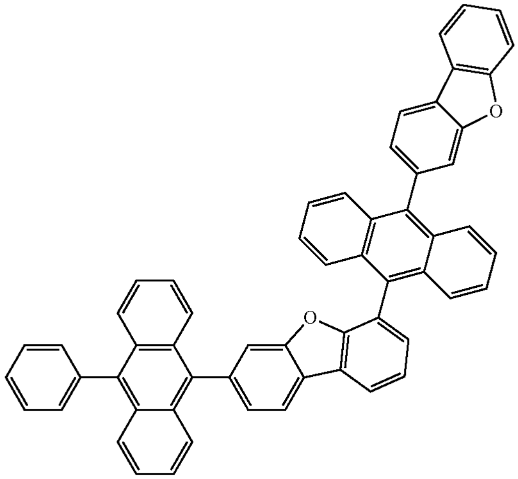
86
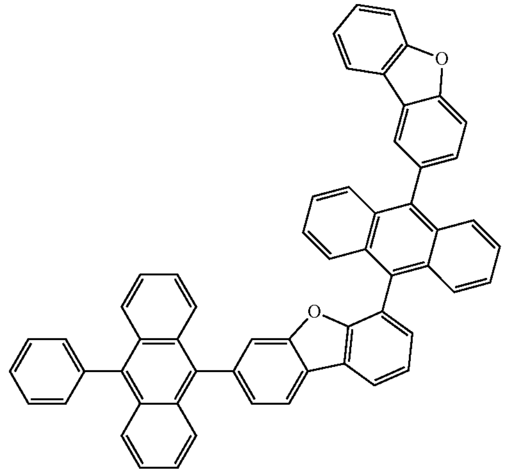
87
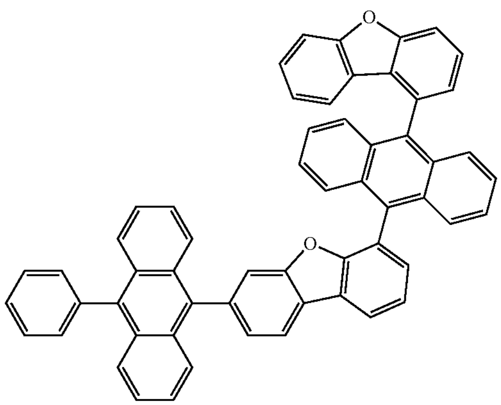
88
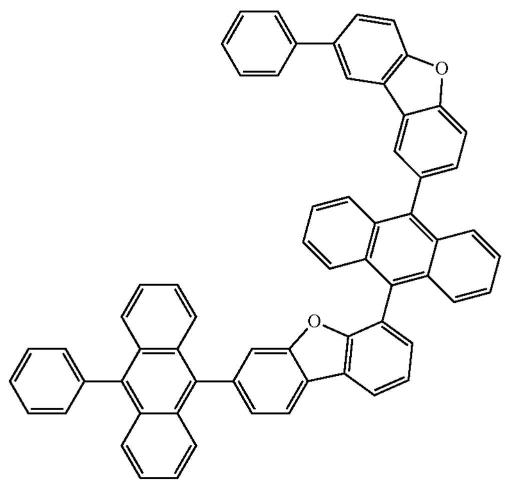
89
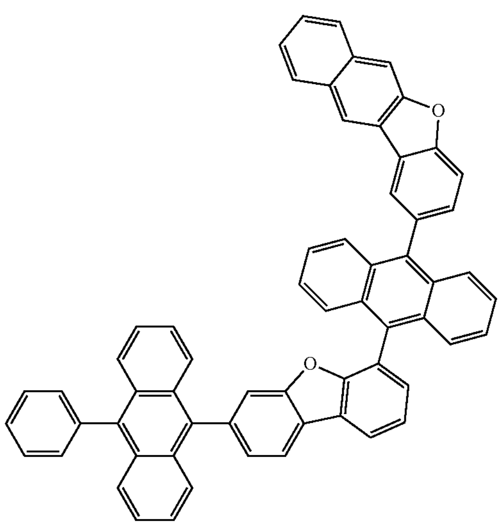
90
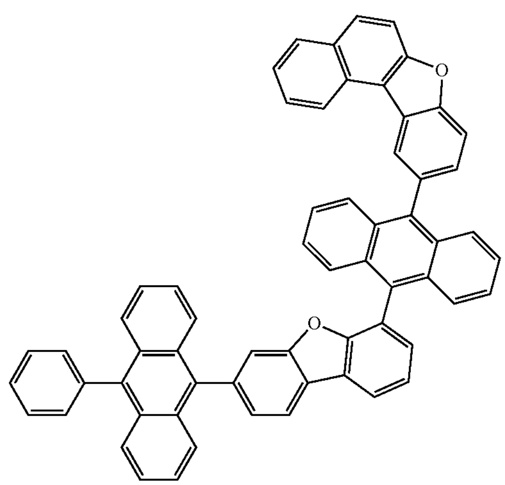

-continued
91
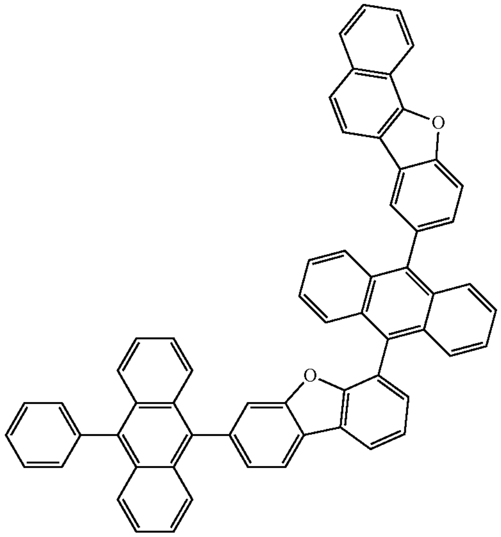
92
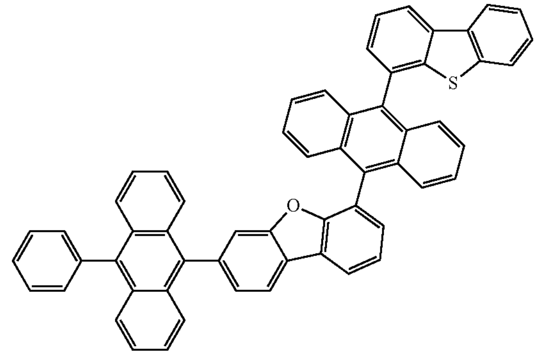
93
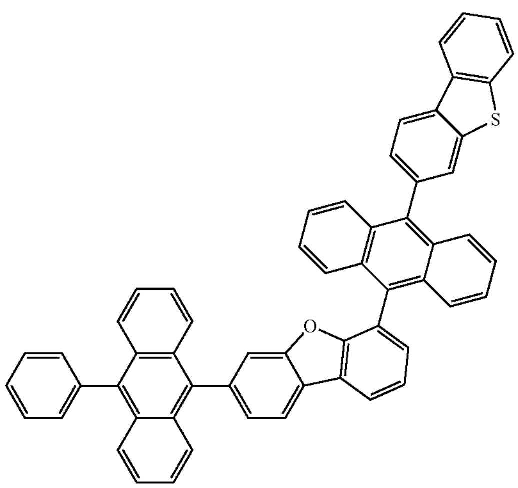
94
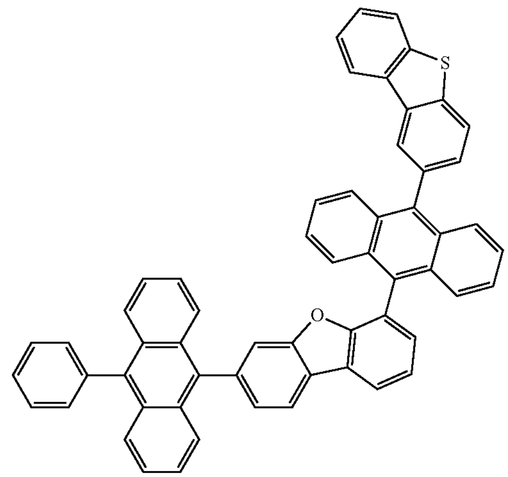
95
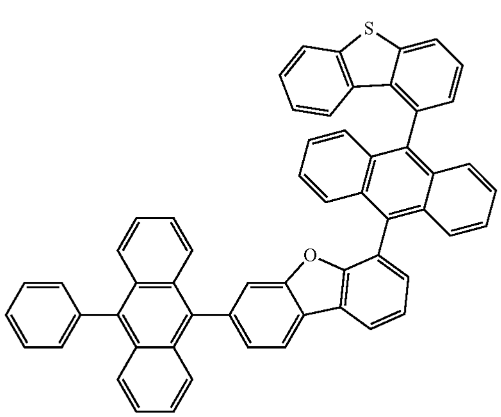
96
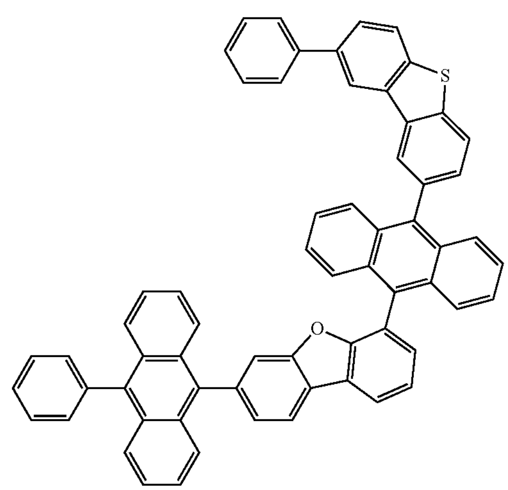

-continued
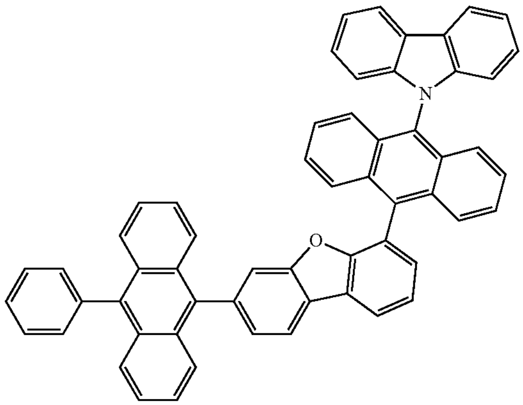
97
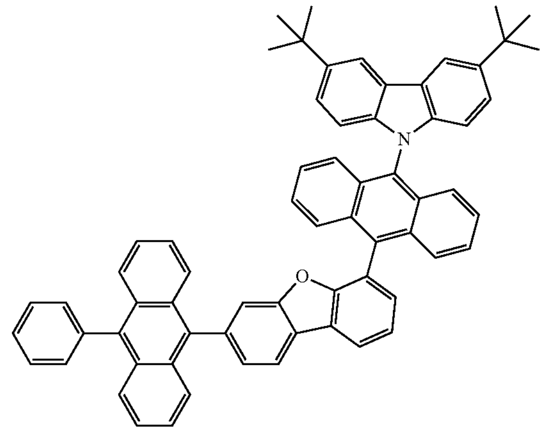
98
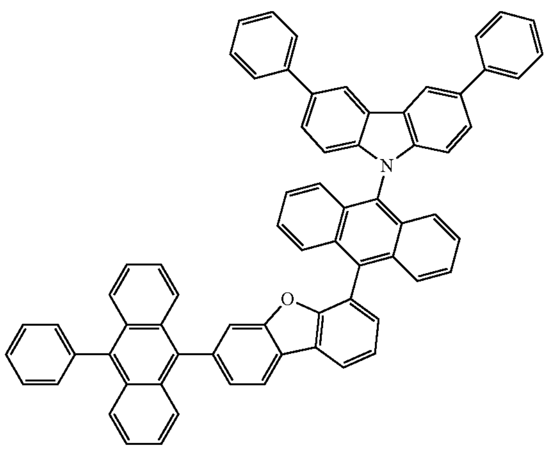
99
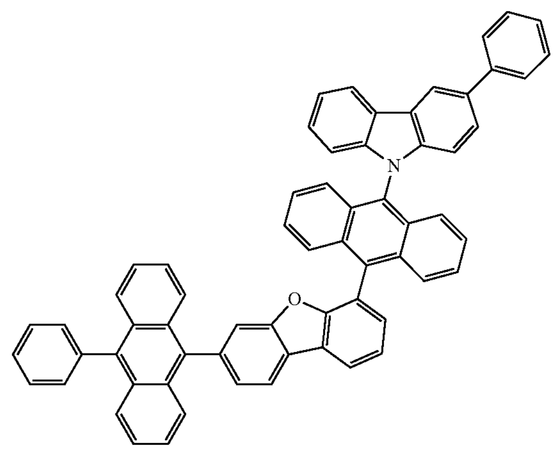
100
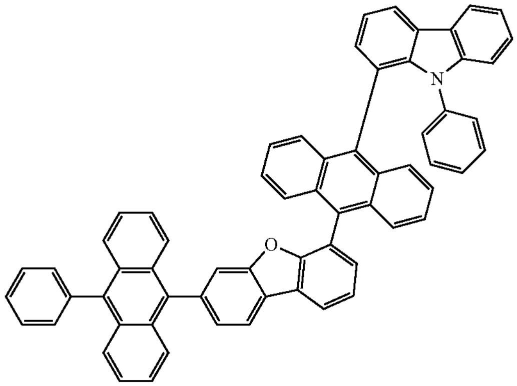
101
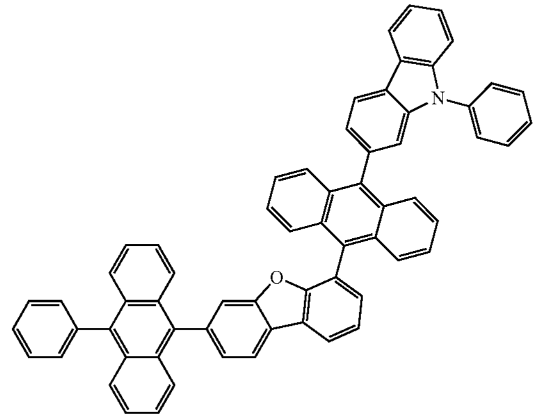
102

-continued
103
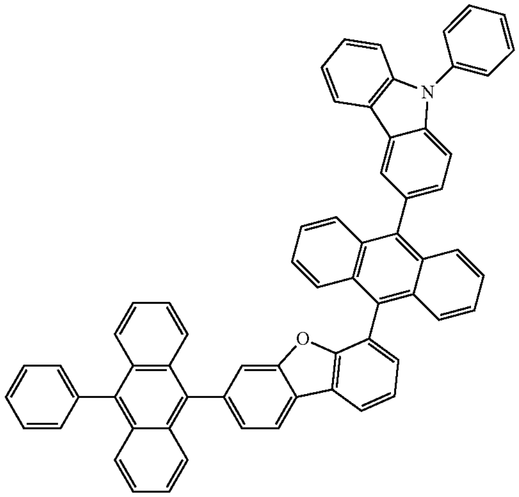
104
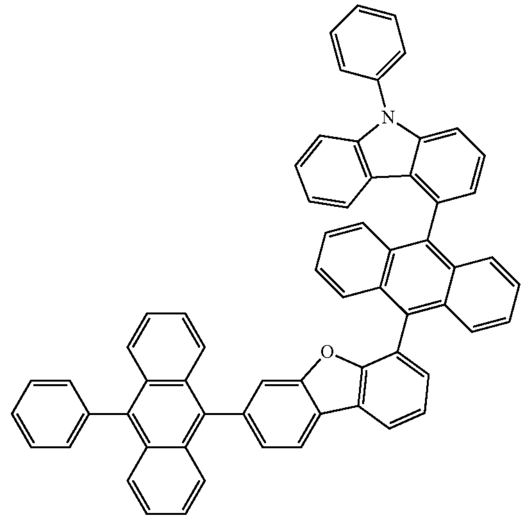
105
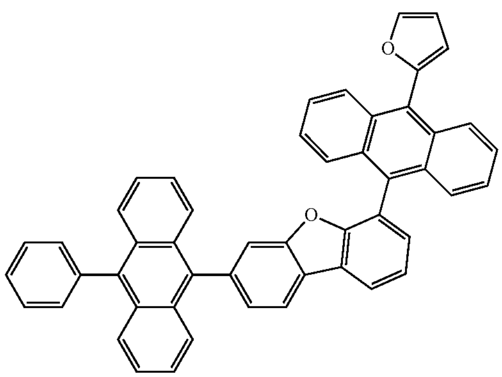
106
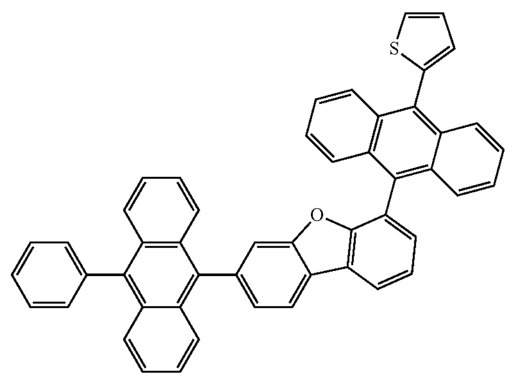
107
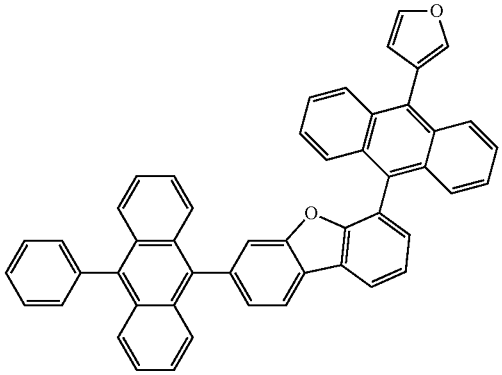
108
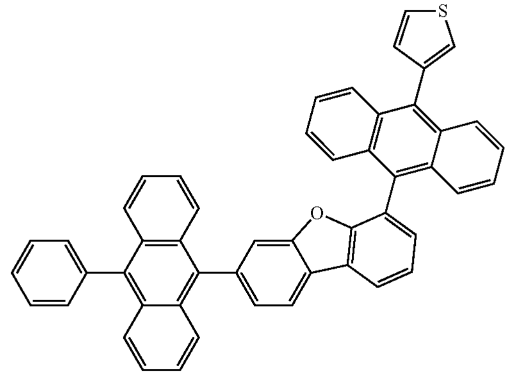

-continued
109
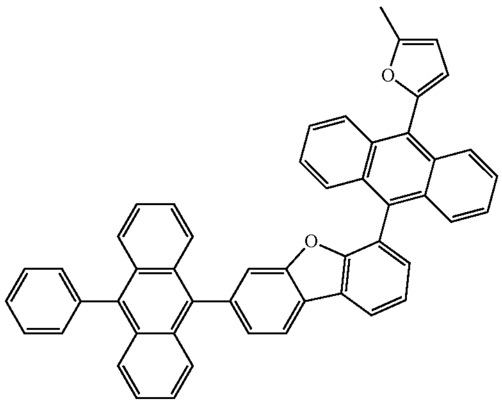
110
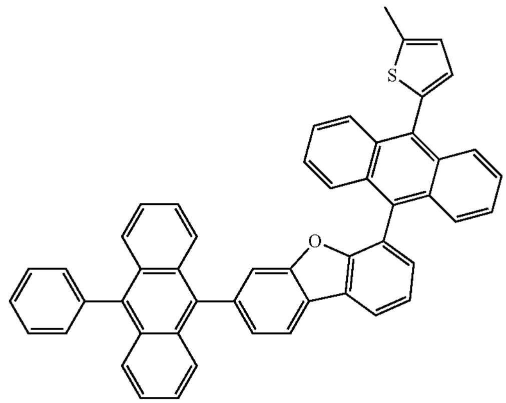
111
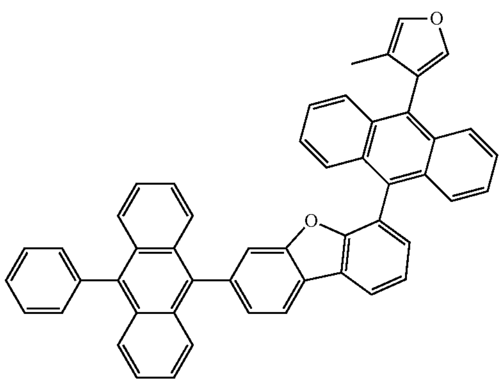
112
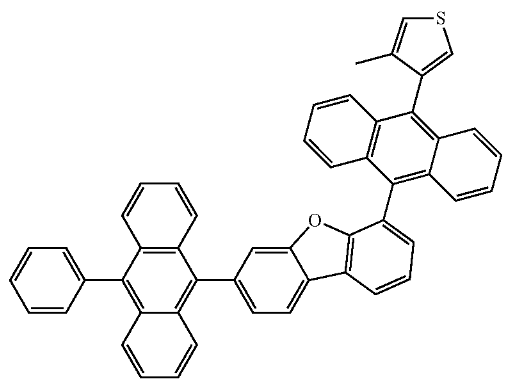
113
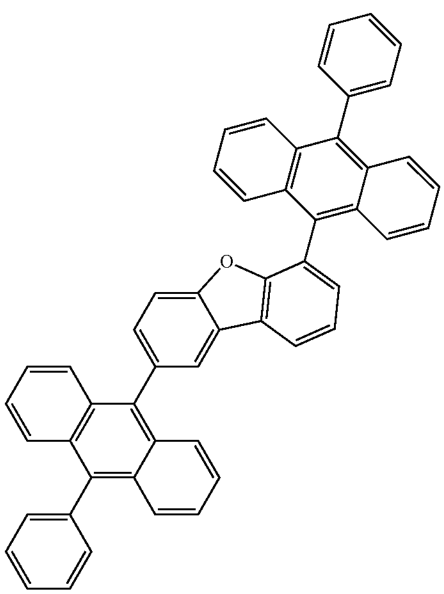
114
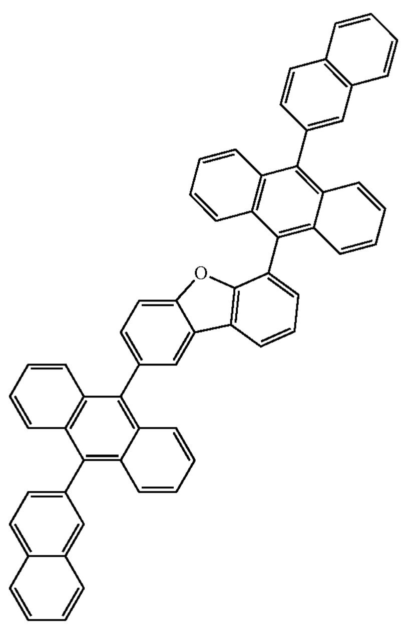

-continued
115
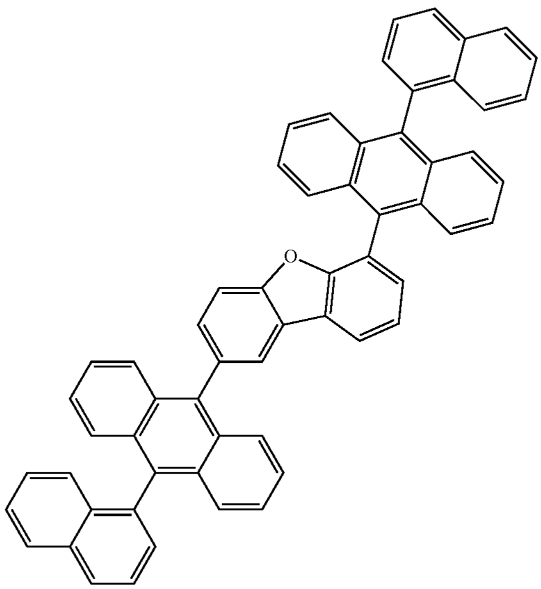
116
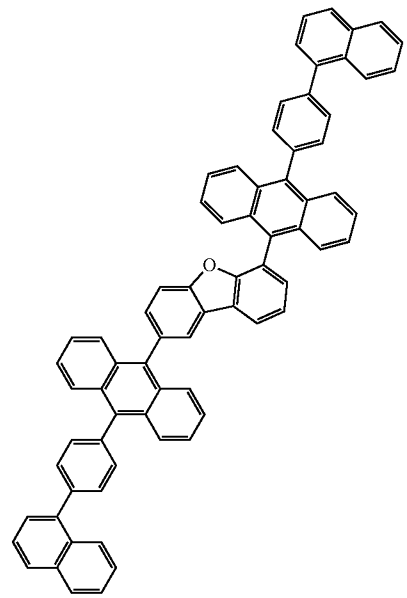
117
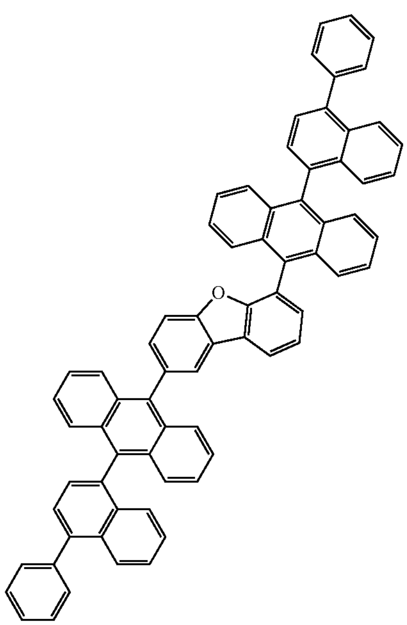
118
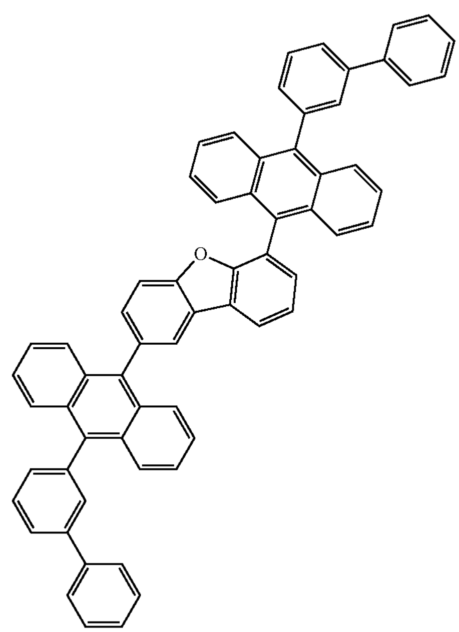

-continued
119
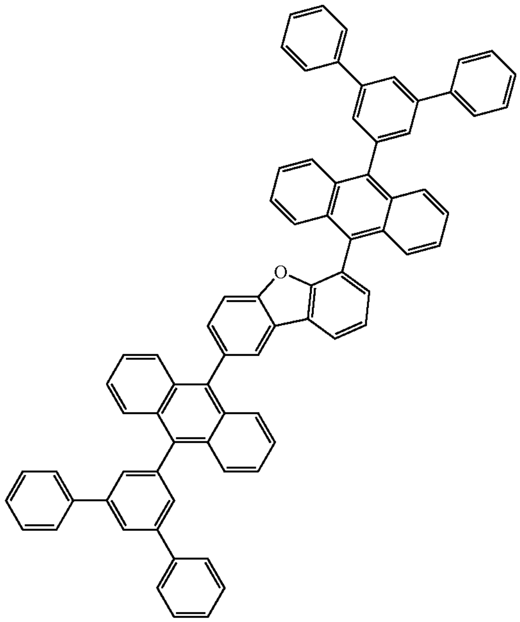
120
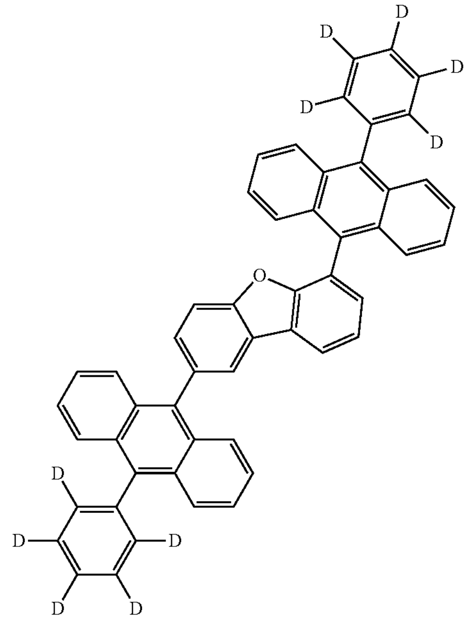
121
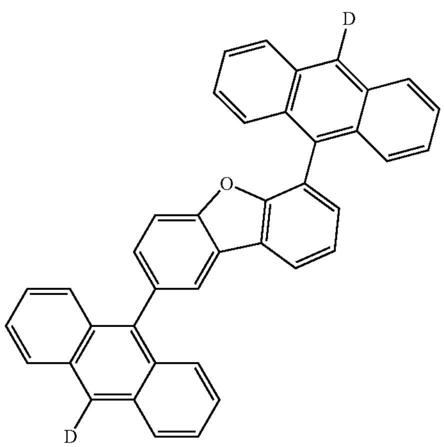
122
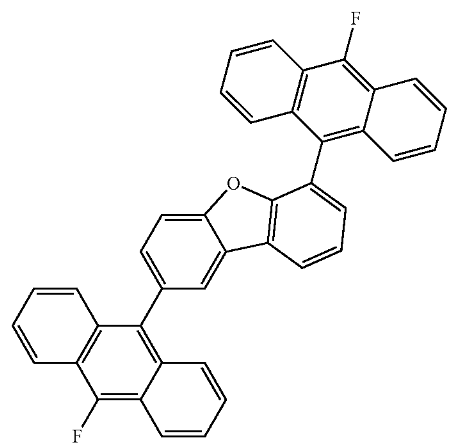
123
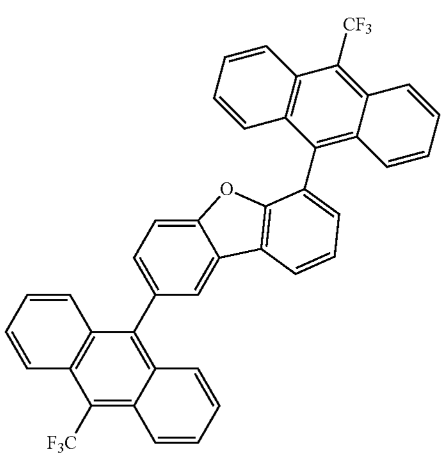
124
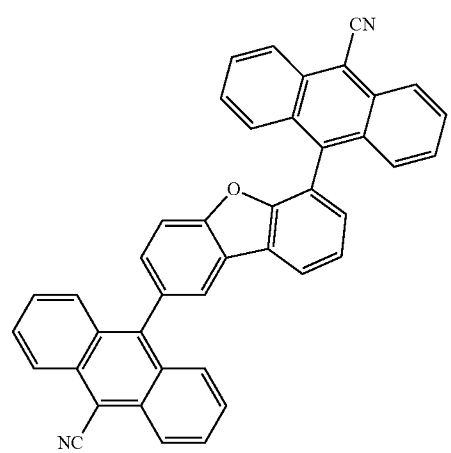

-continued
125
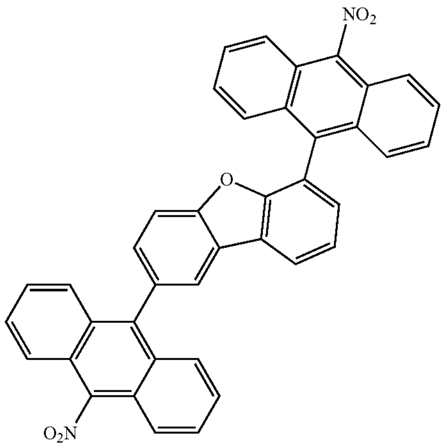
126
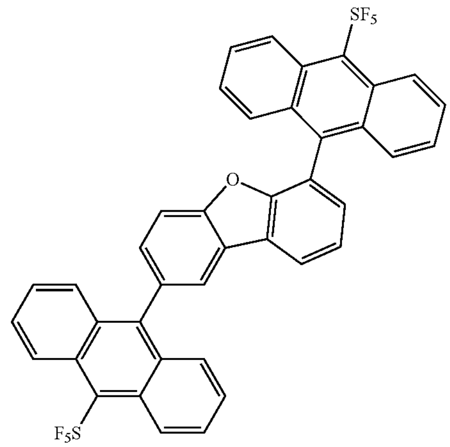
127
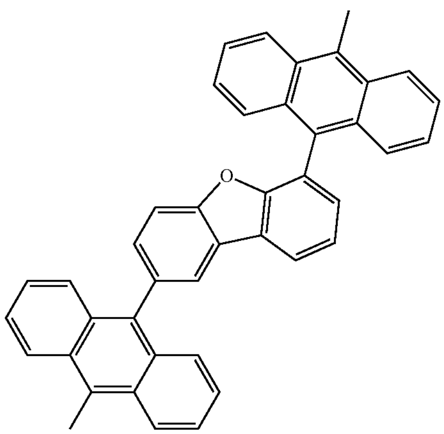
128
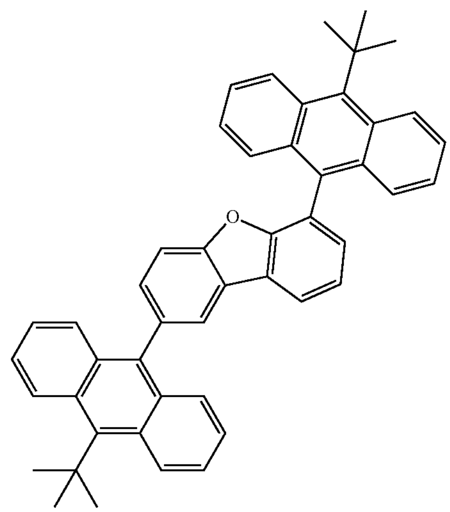
129
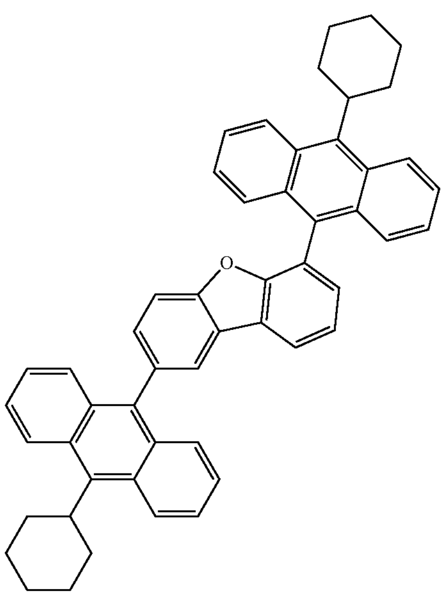
130
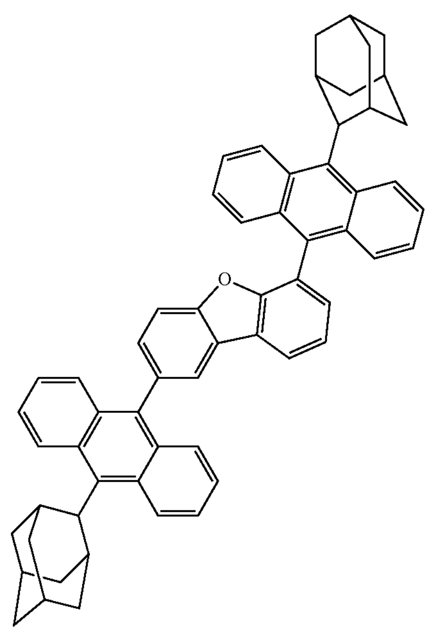

-continued
131
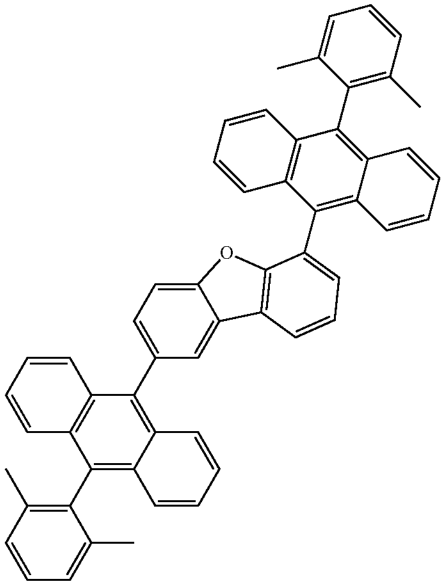
132
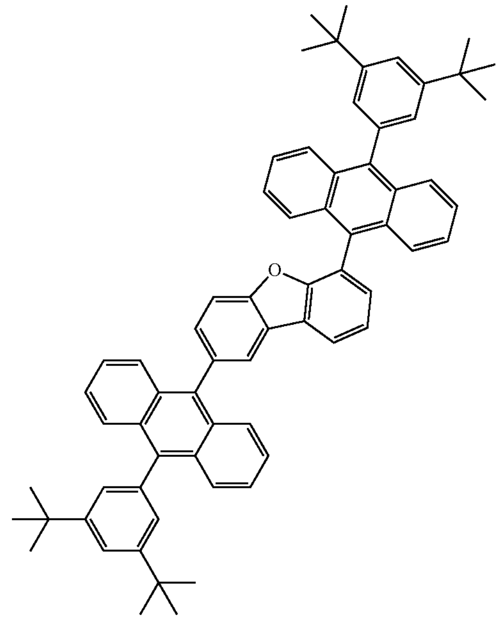
133
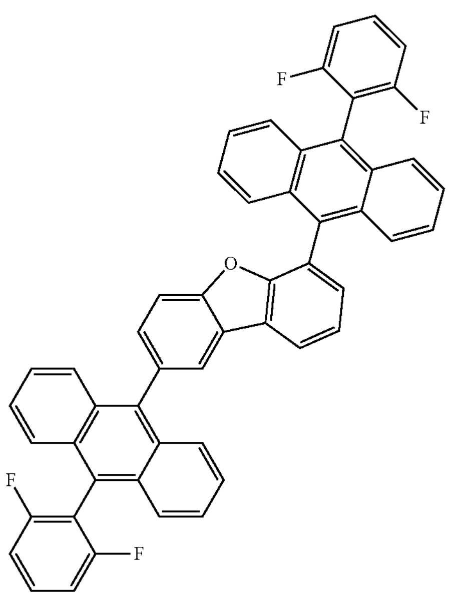
134
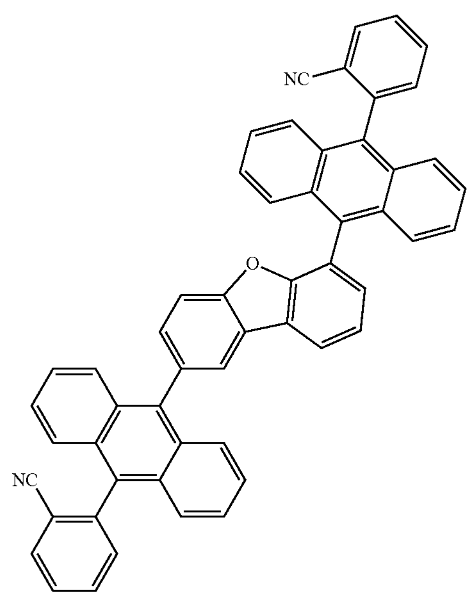

-continued
135
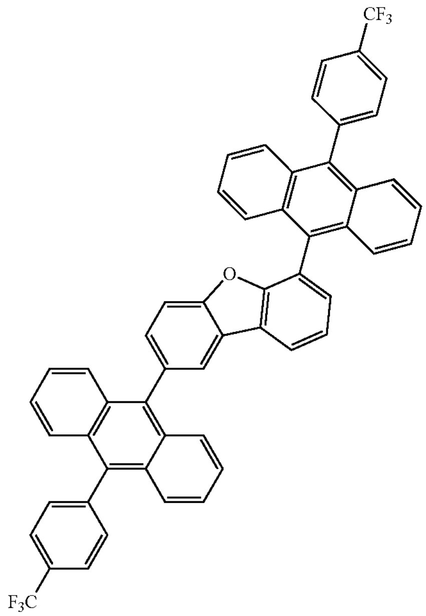
136
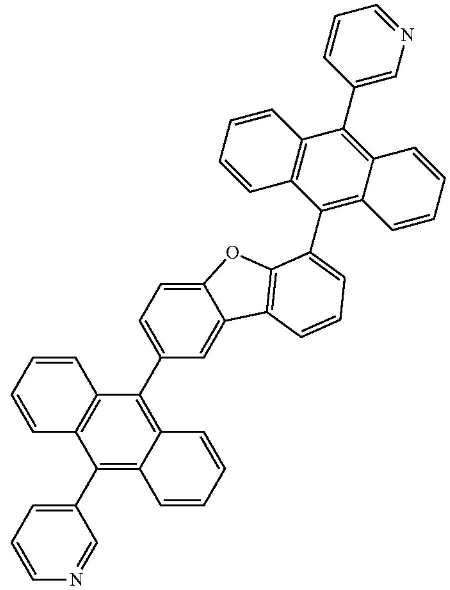
137
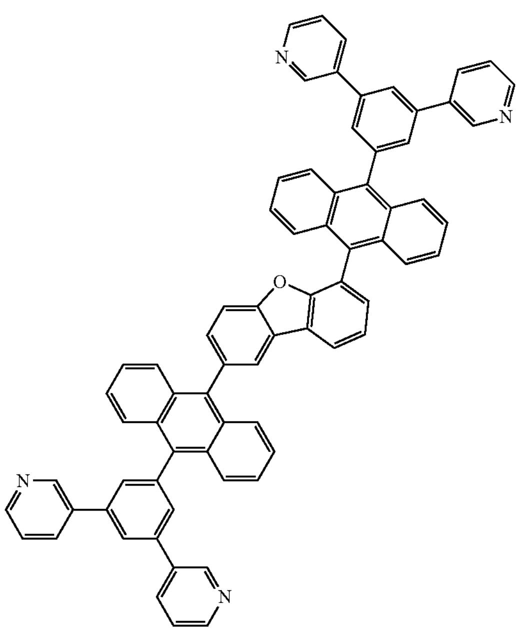
138
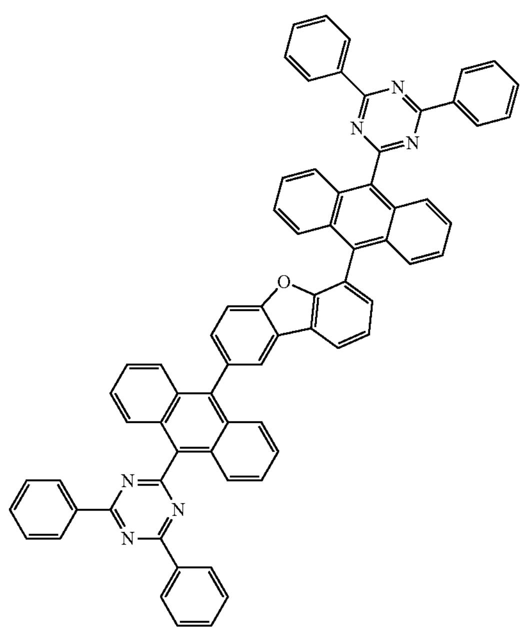

-continued
139
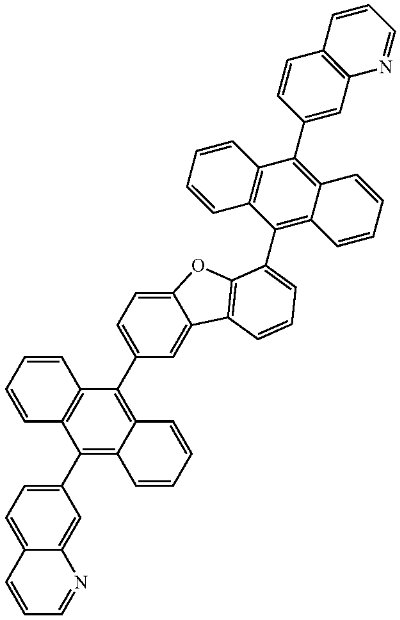
140
141
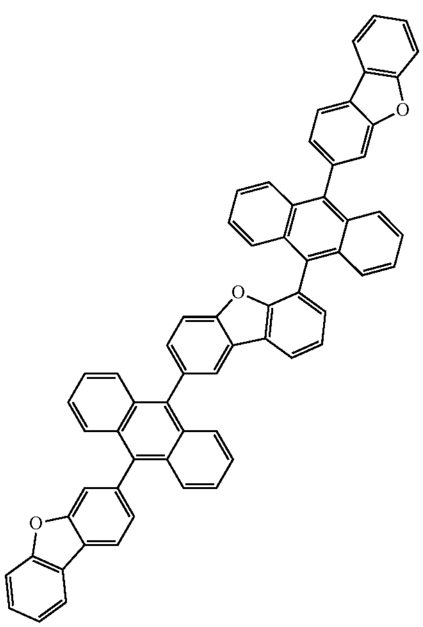
142
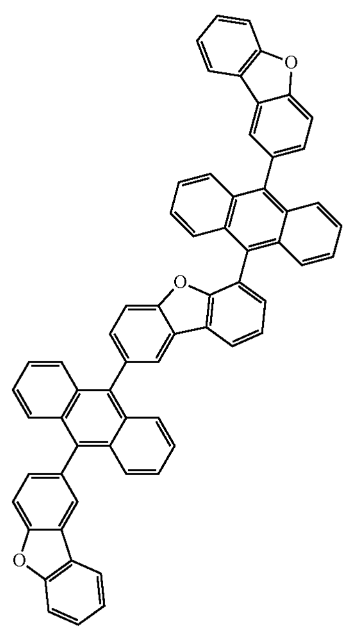

-continued
143
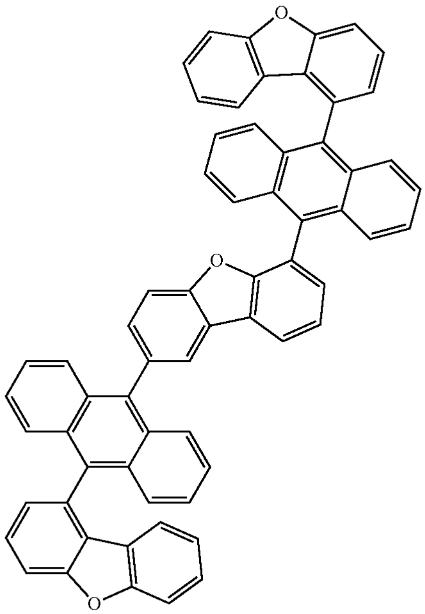
144
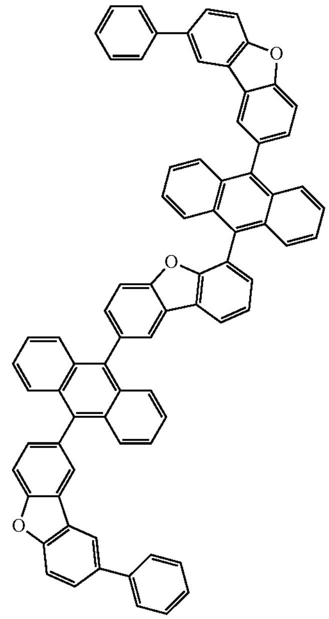
145
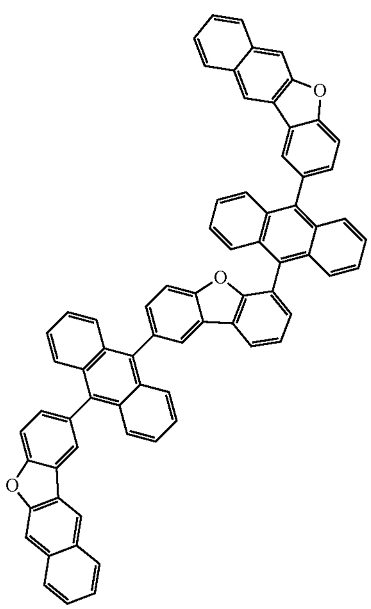
146
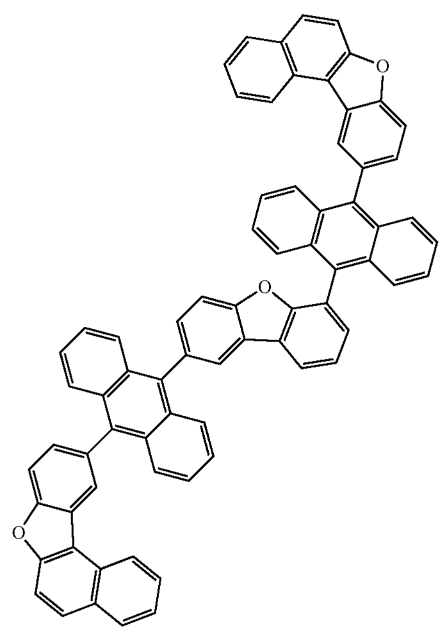

-continued
147
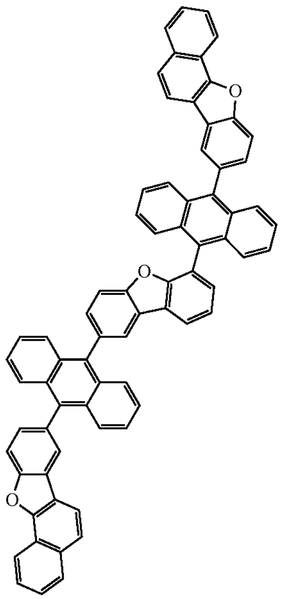
148
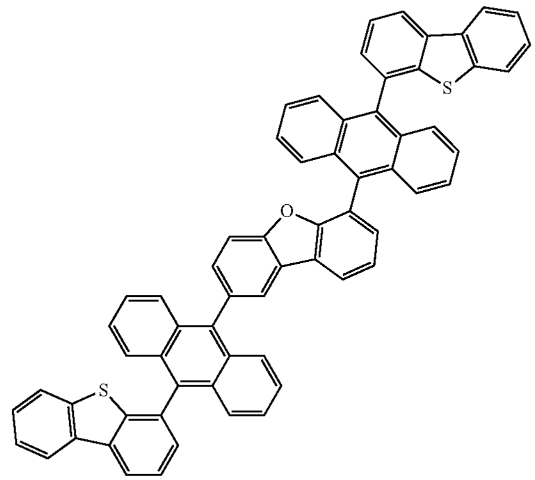
149
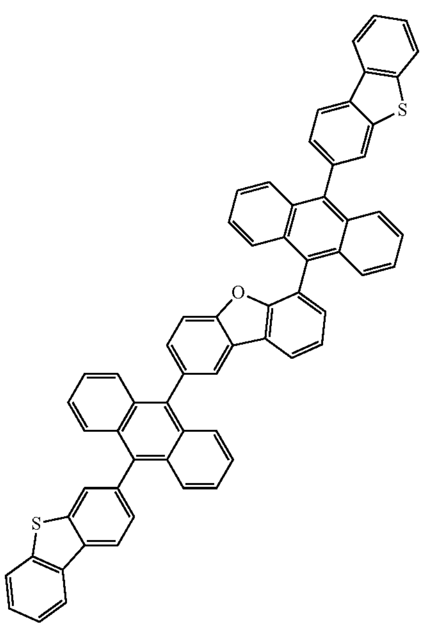
150
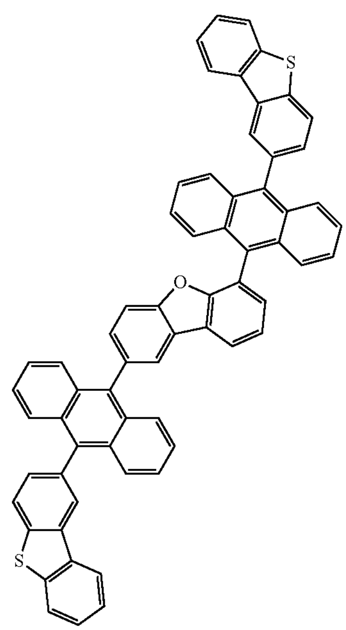

-continued
151
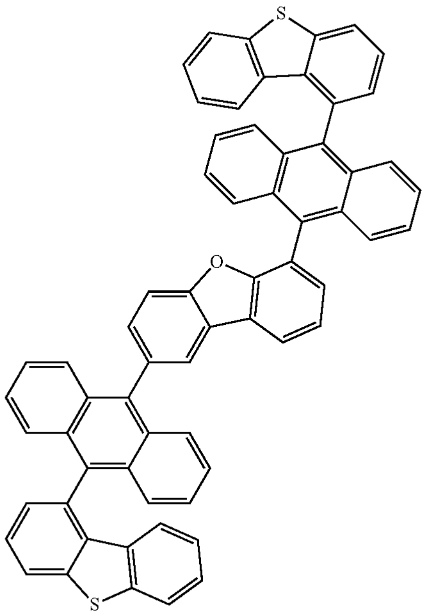
152
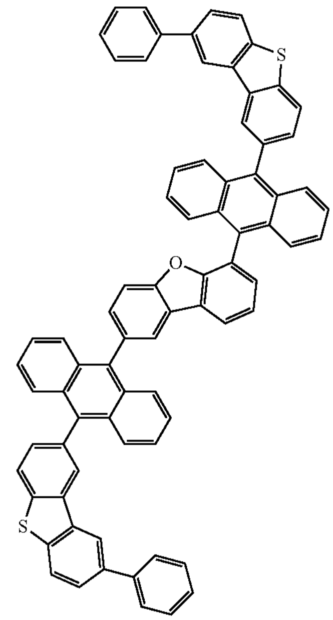
153
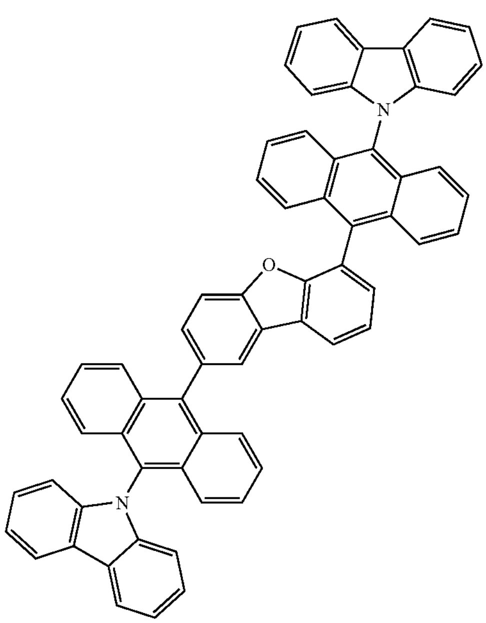
154
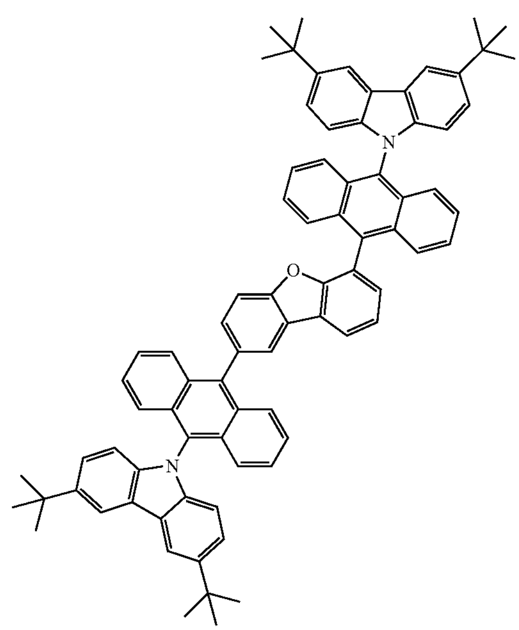

-continued
155
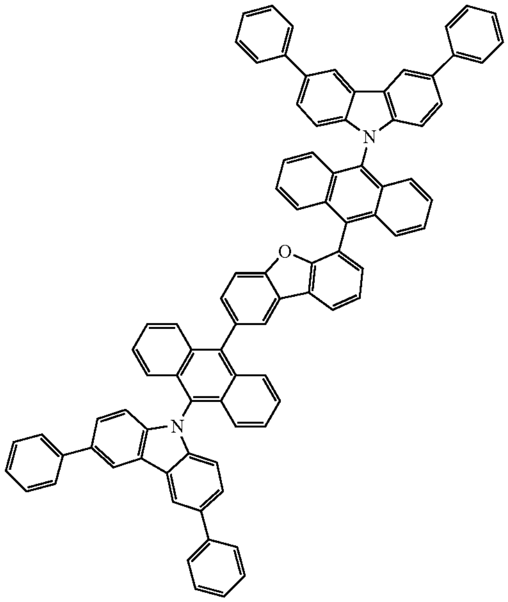
156
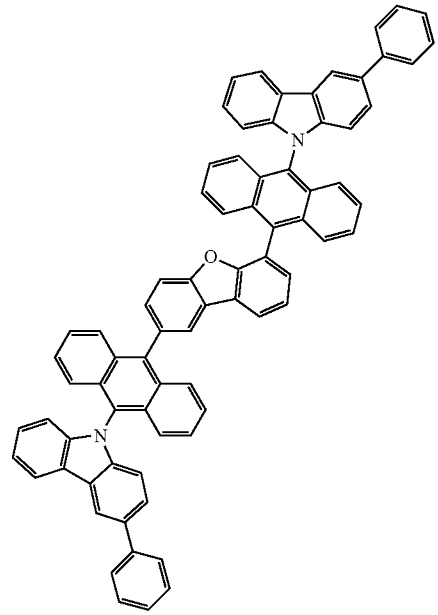
157
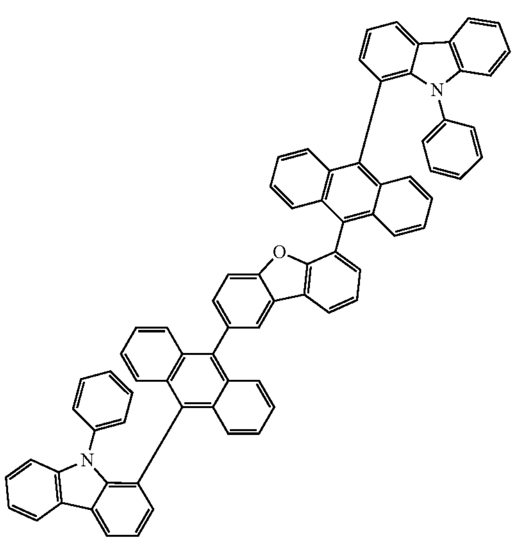
158
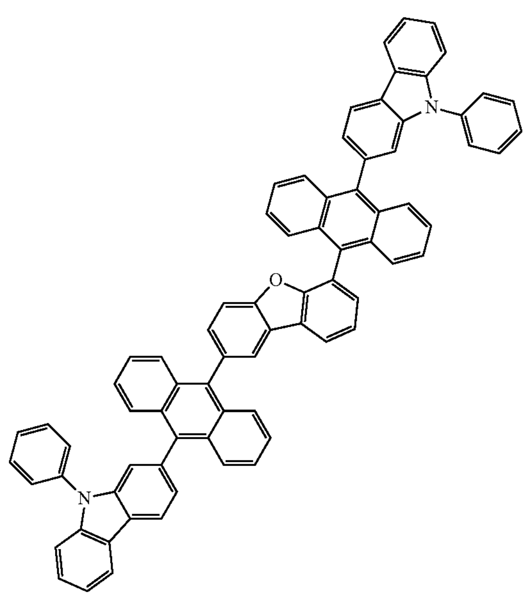

-continued
159
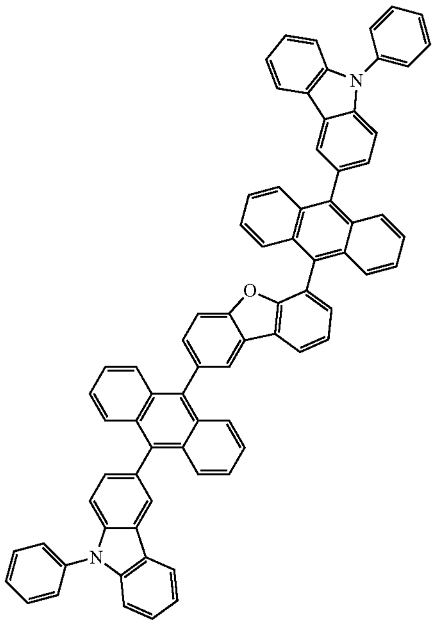
160
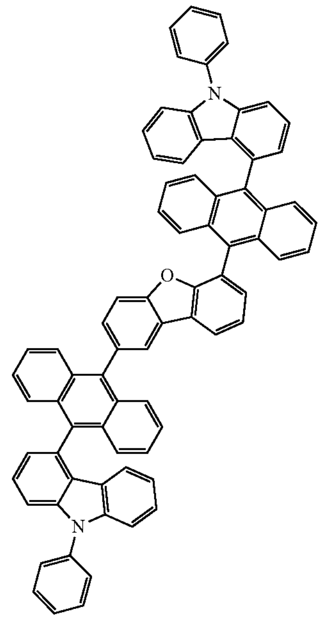
161
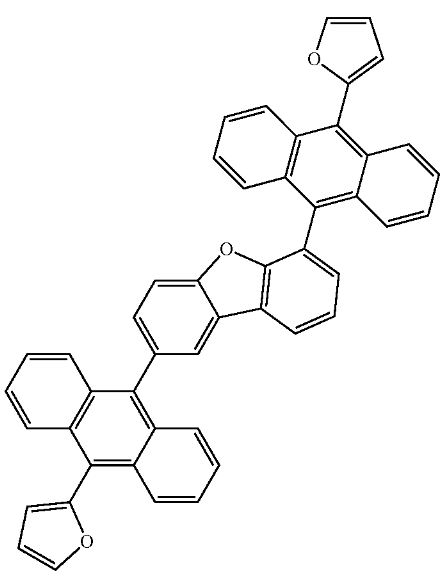
162
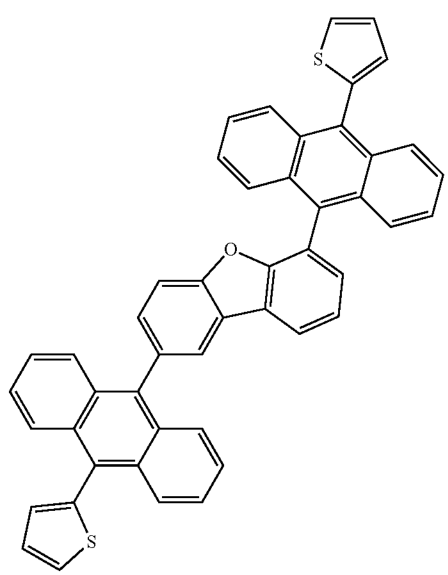

-continued
163
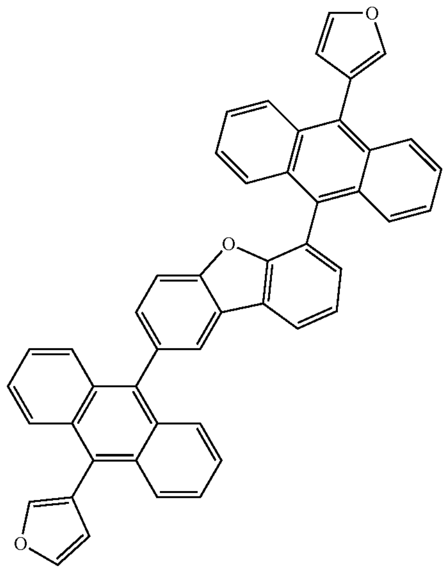
164
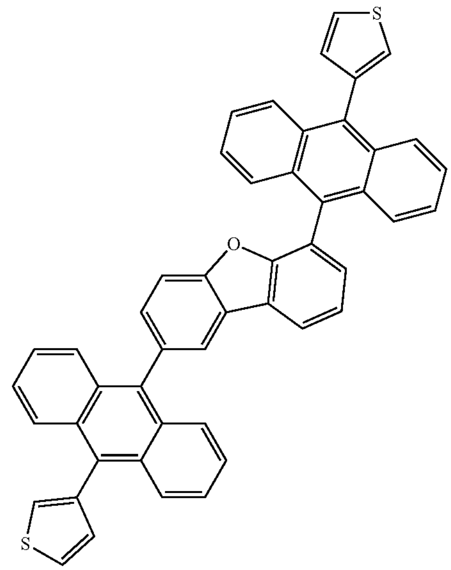
165
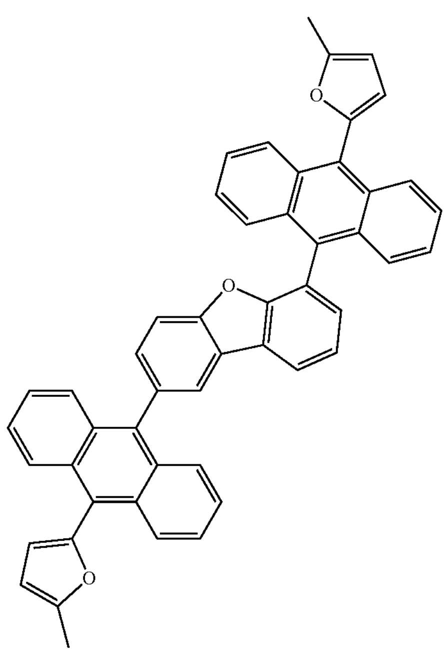
166
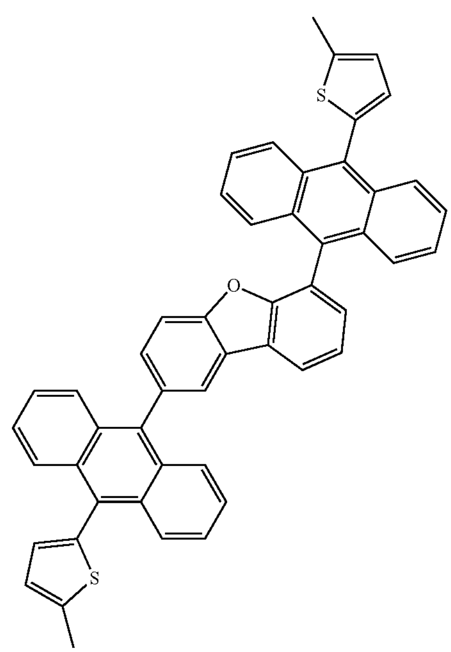

-continued
167
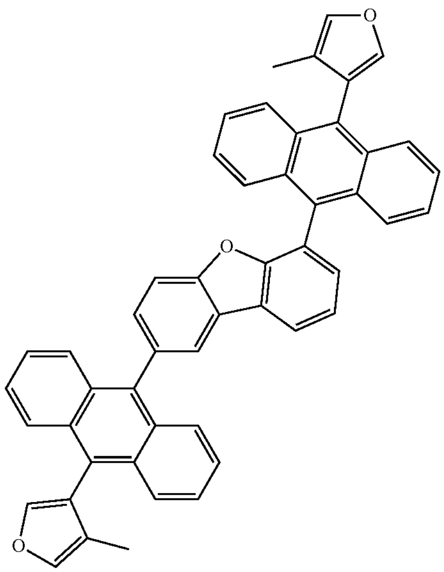
168
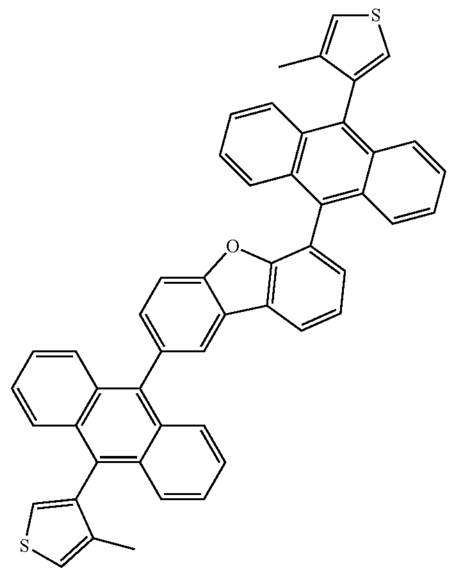
169
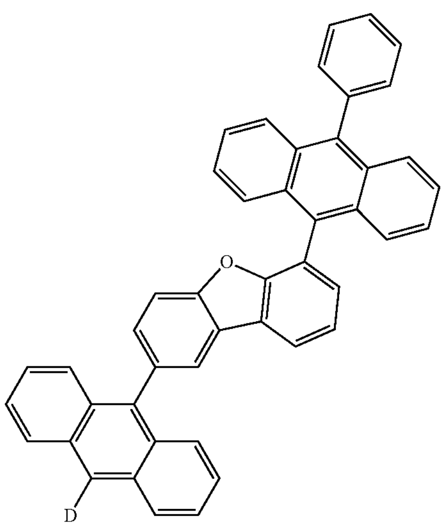
170
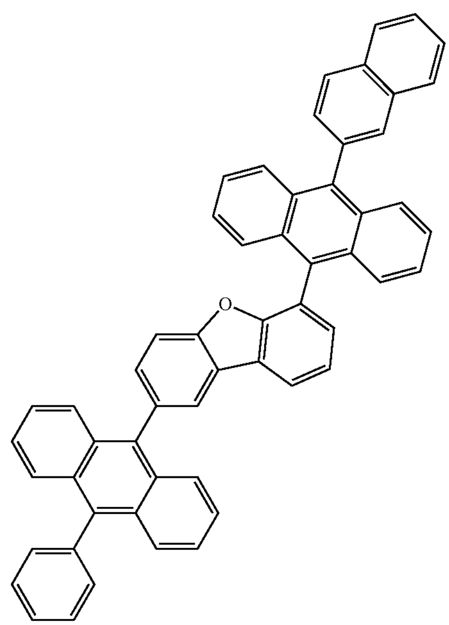

-continued
171
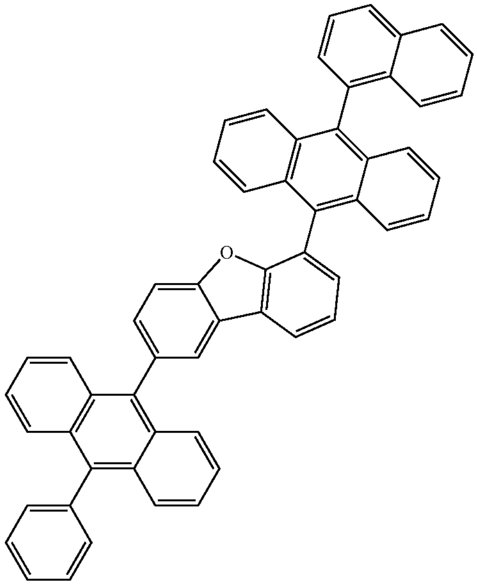
172
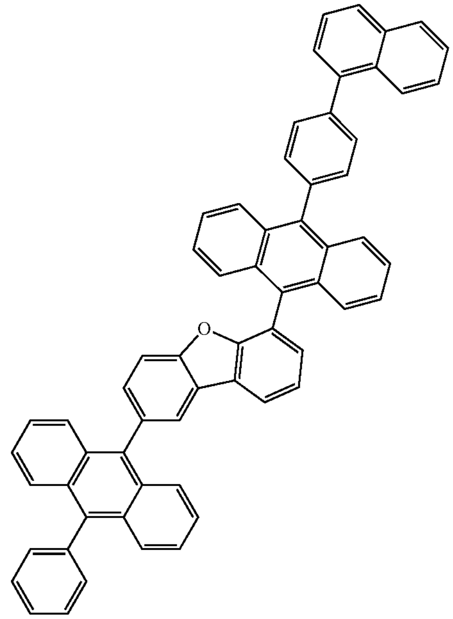
173
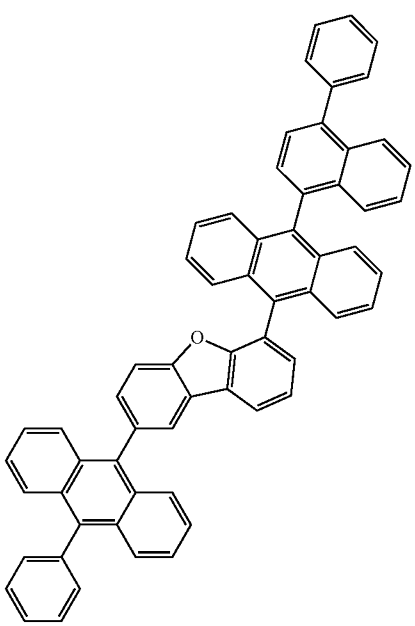
174
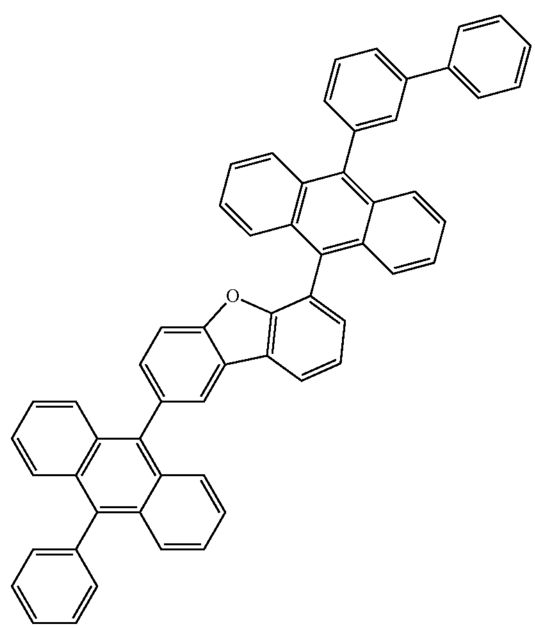

-continued
175
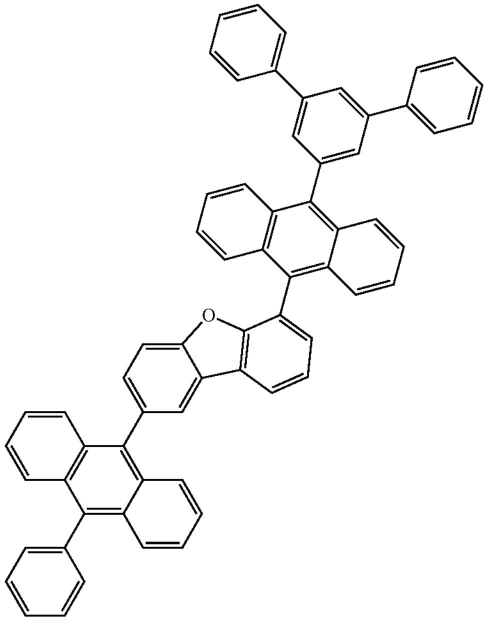
176
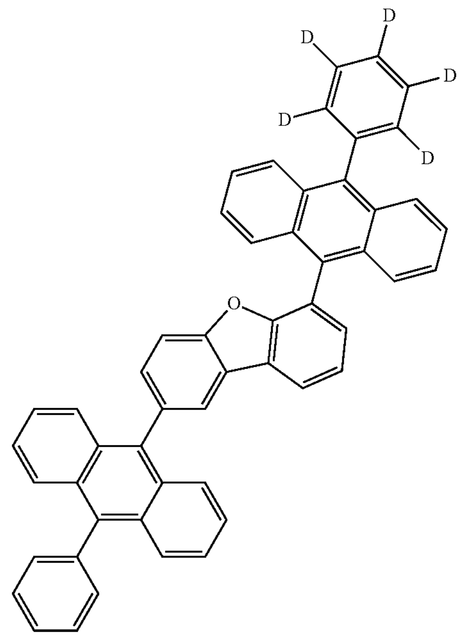
177
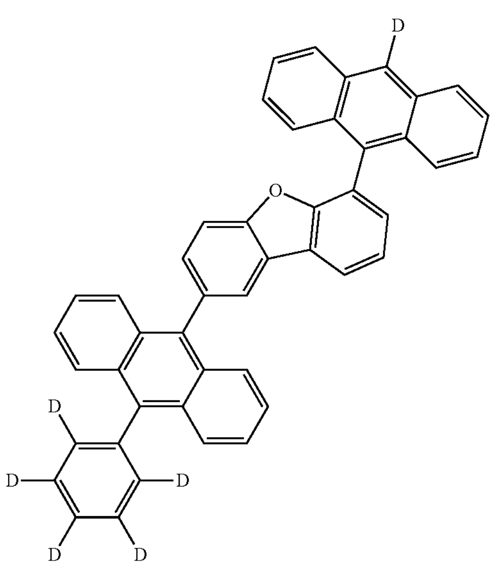
178
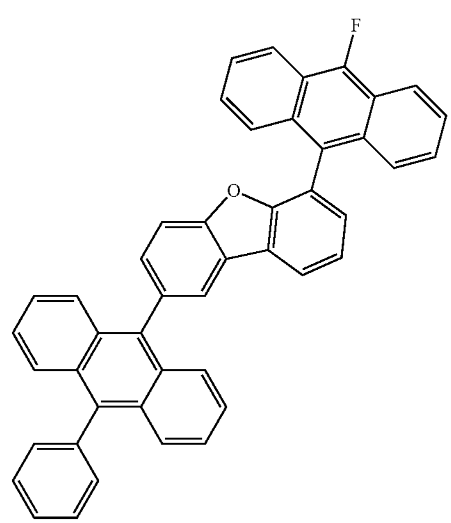

-continued
179
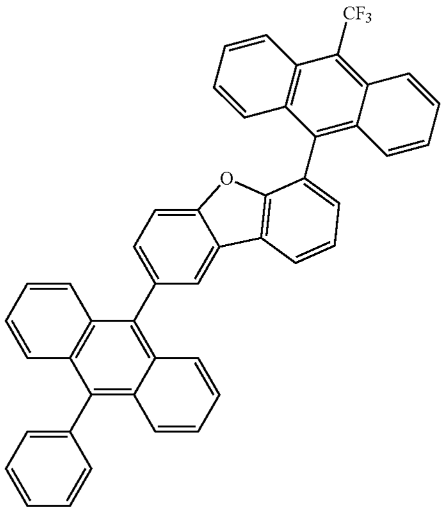
180
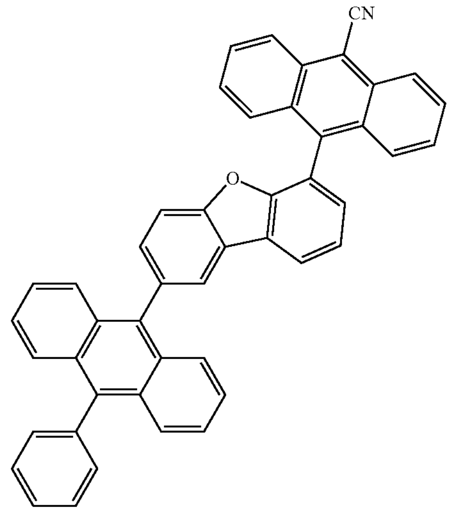
181
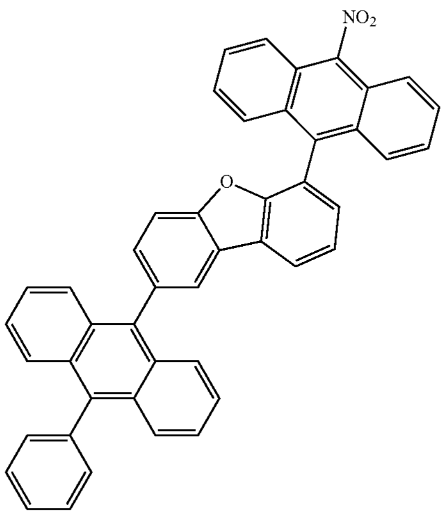
182
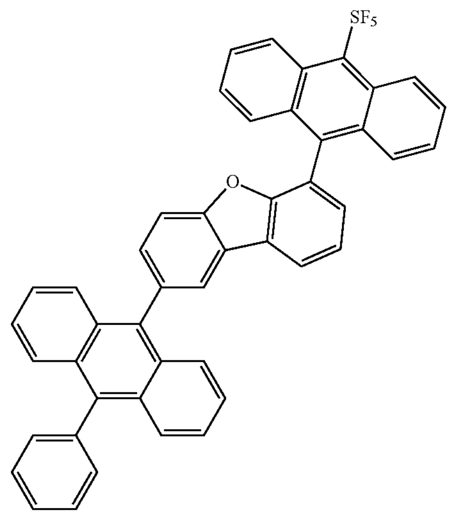
183
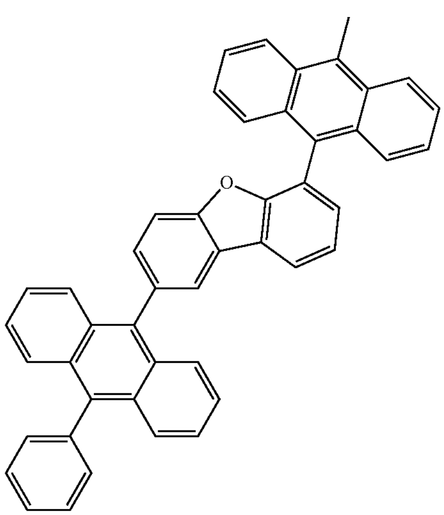
184
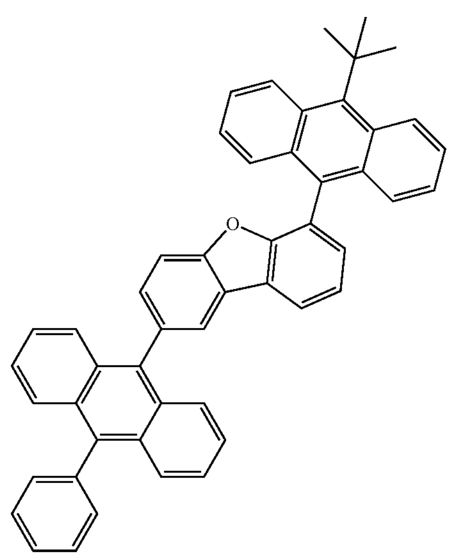

-continued
185
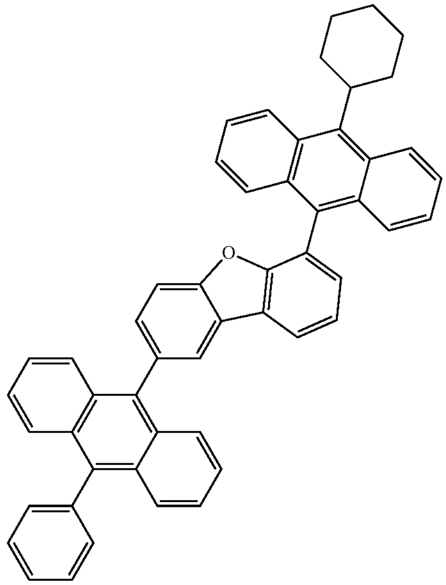
186
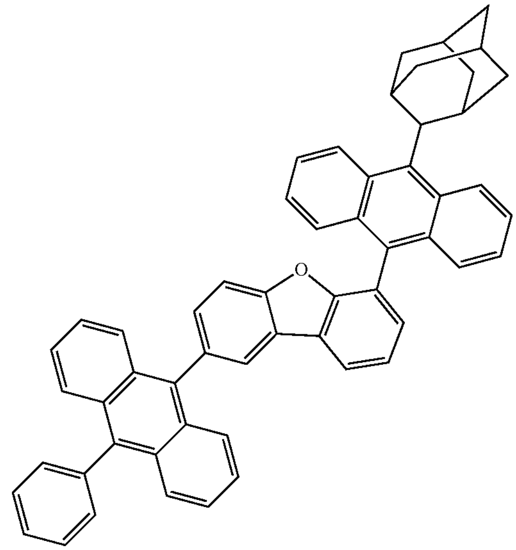
187
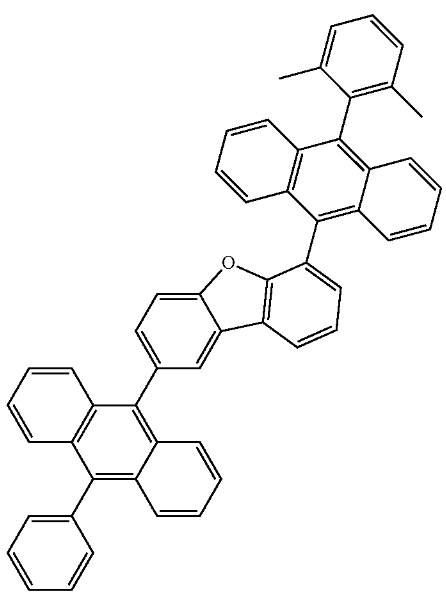
188
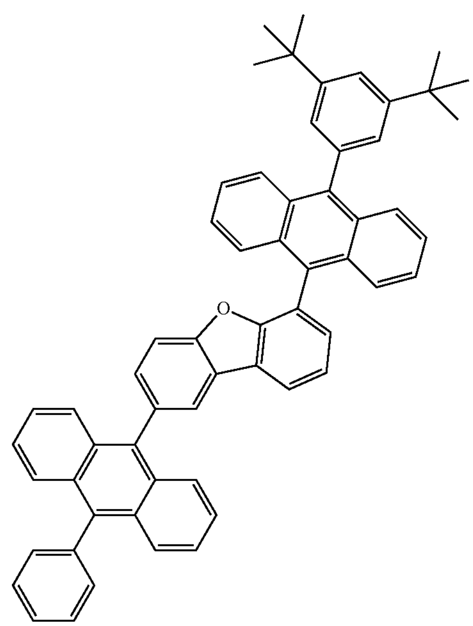

-continued
189
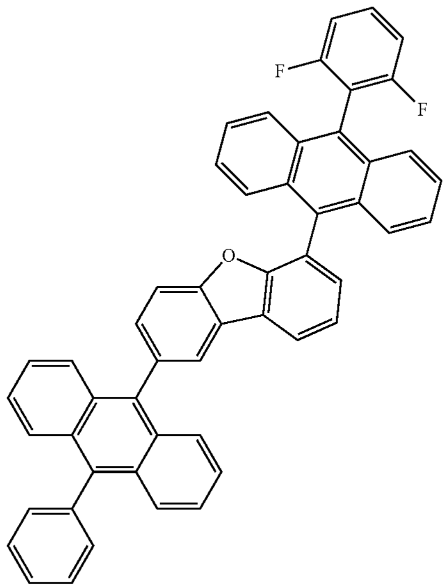
190
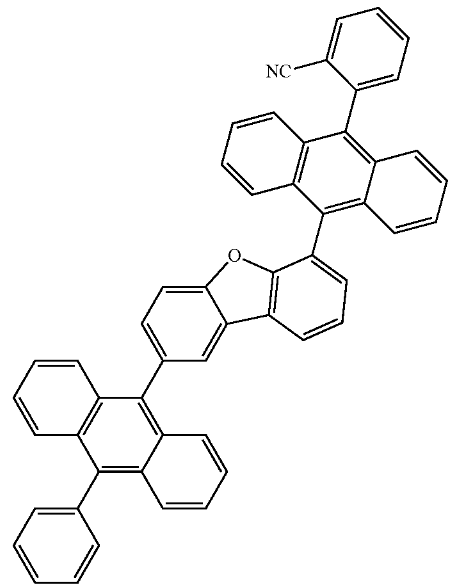
191
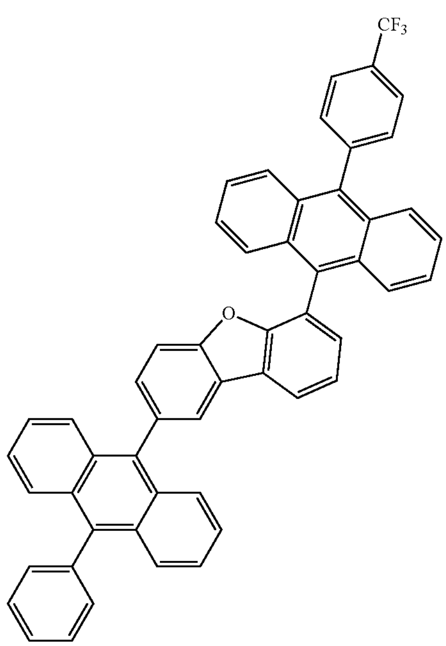
192
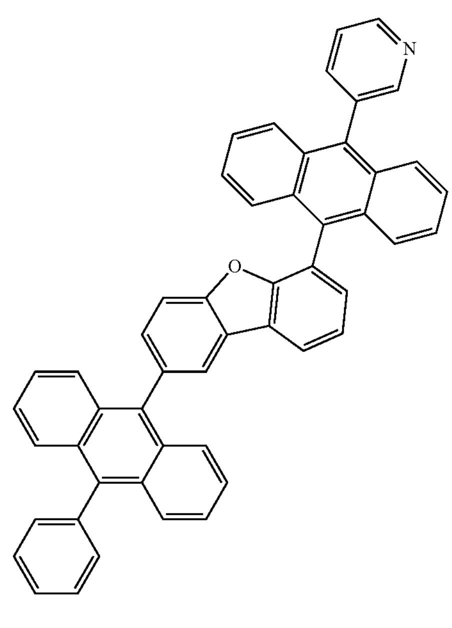

-continued
193
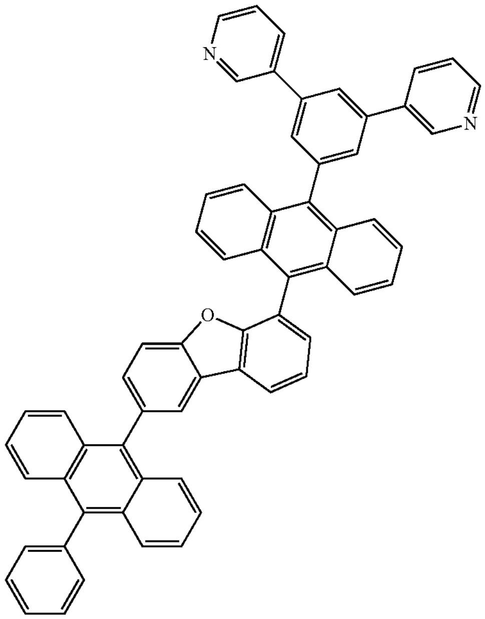
194
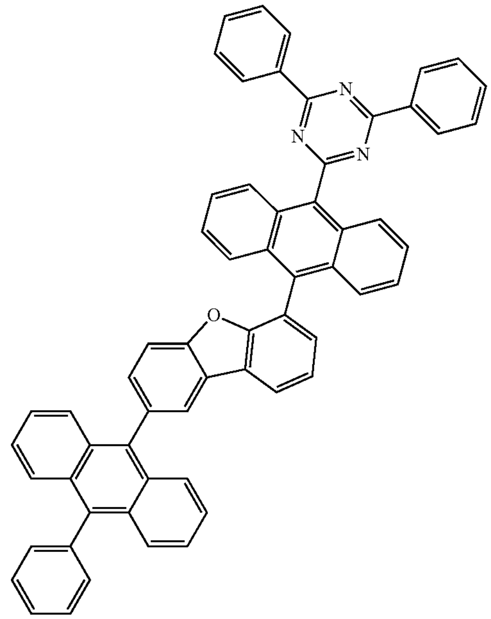
195
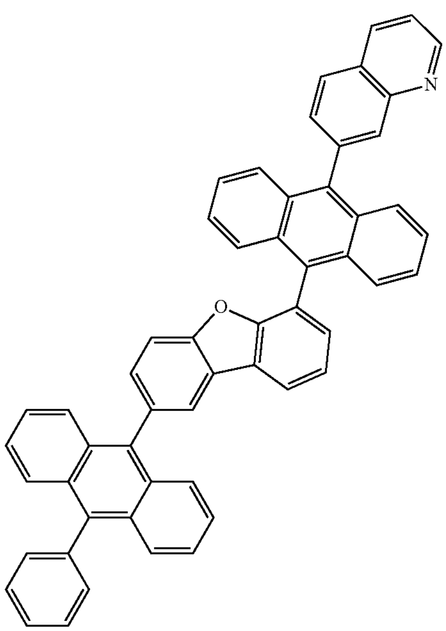
196
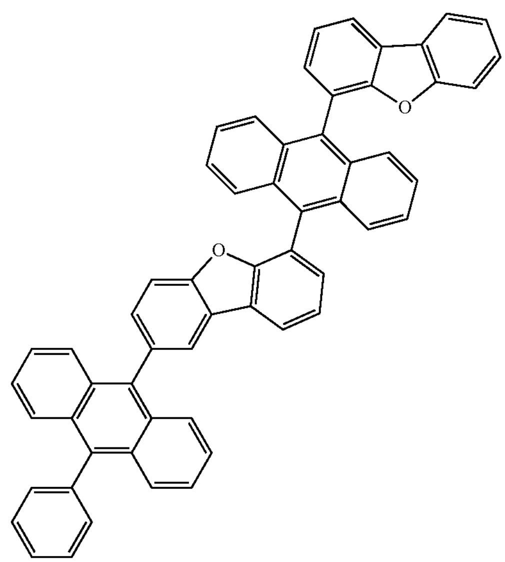

-continued
197
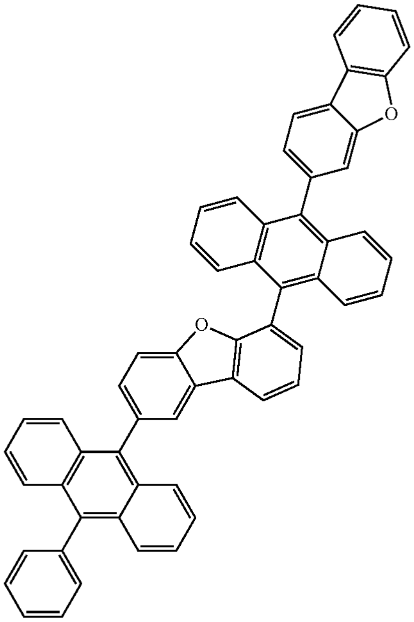
198
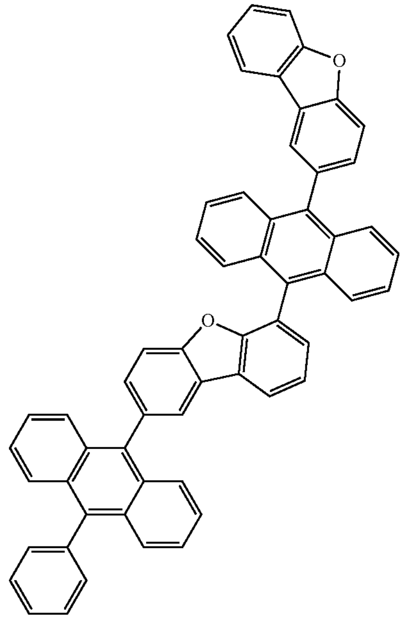
199
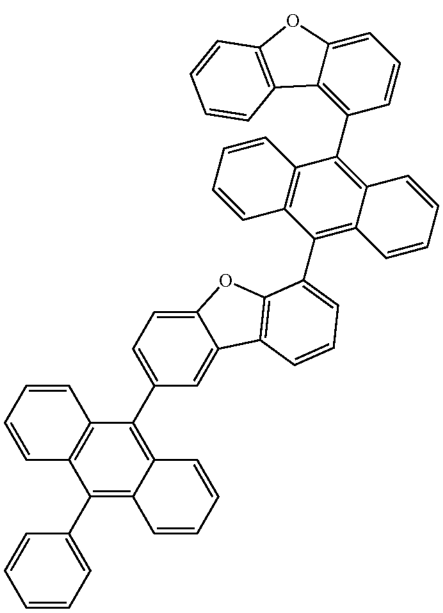
200
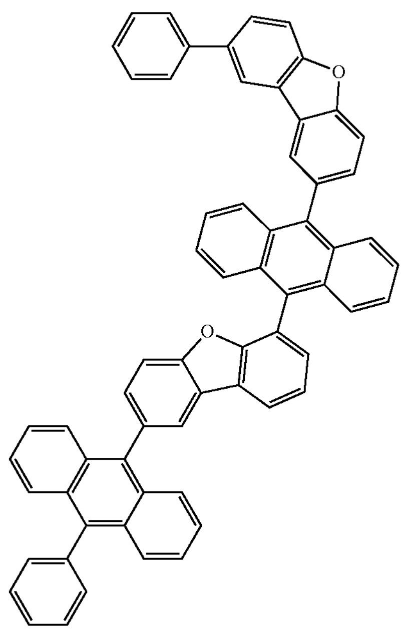

-continued
201
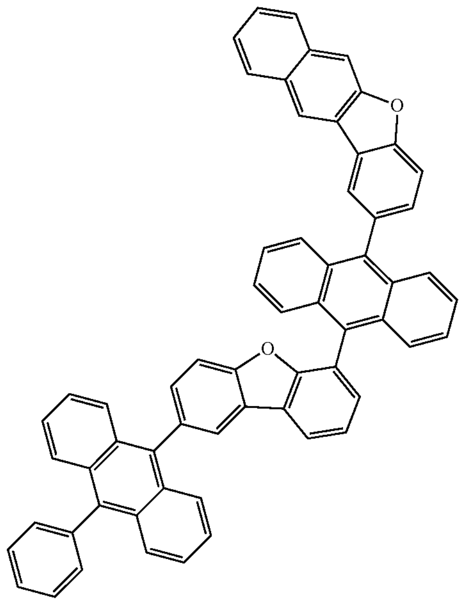
202
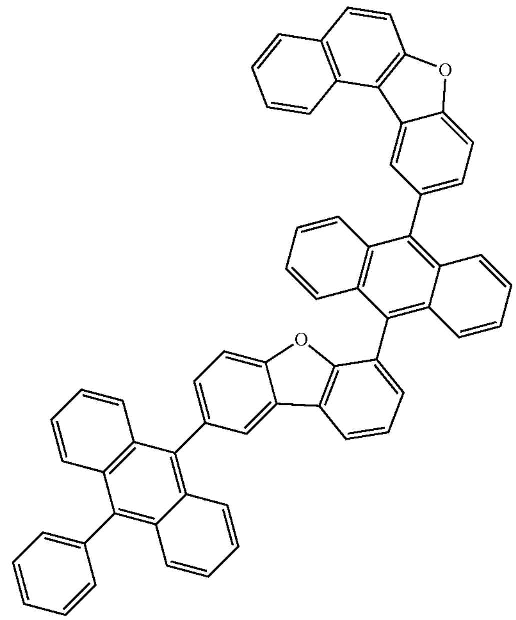
203
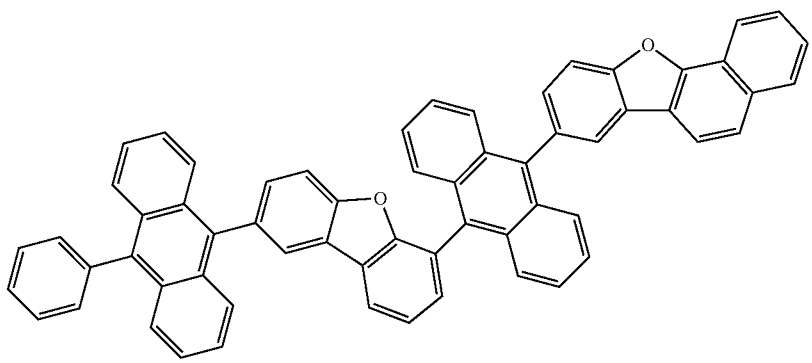
204
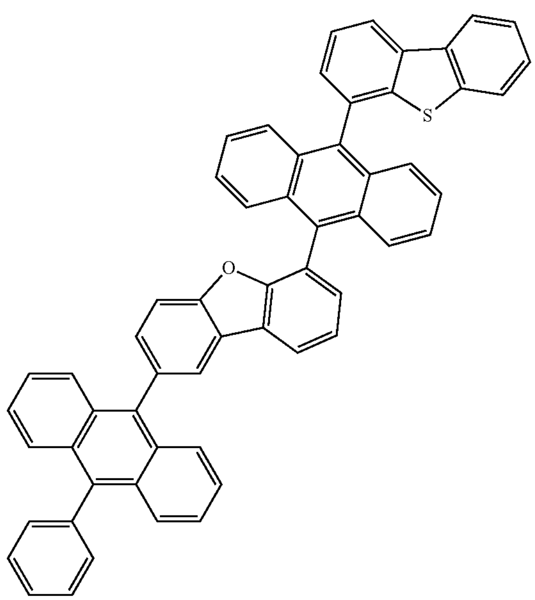
205
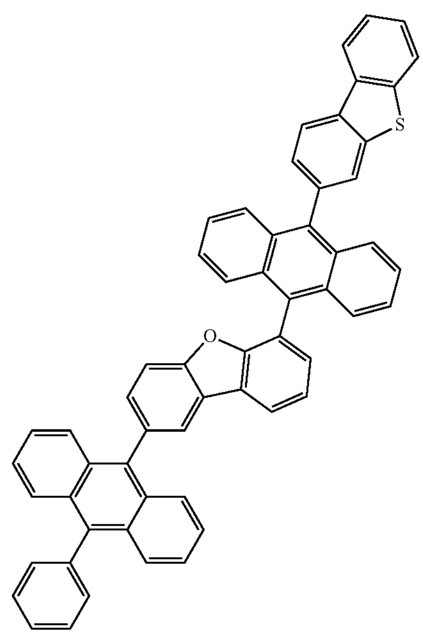

-continued
206
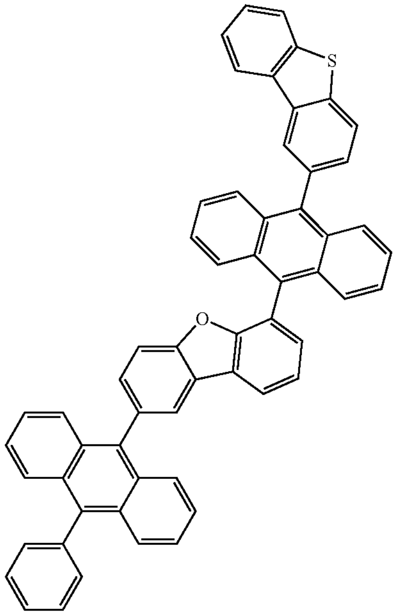
207
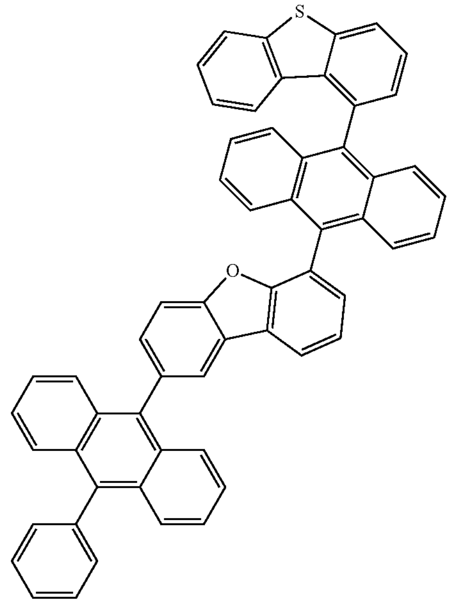
208
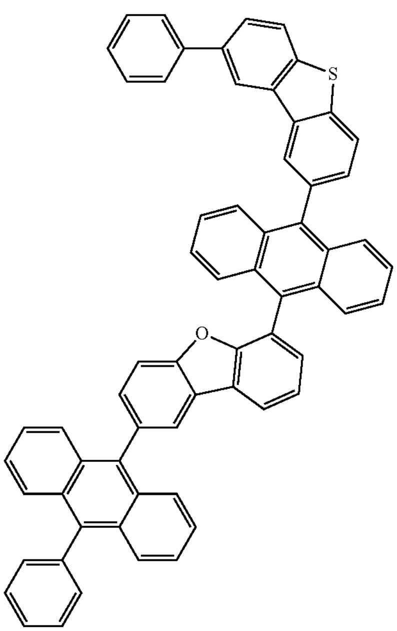
209
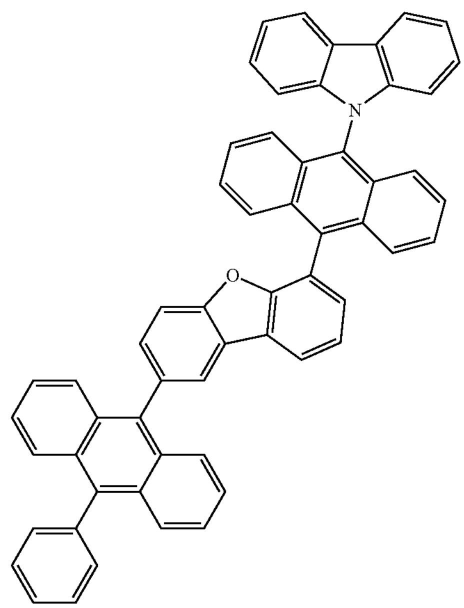

-continued
210
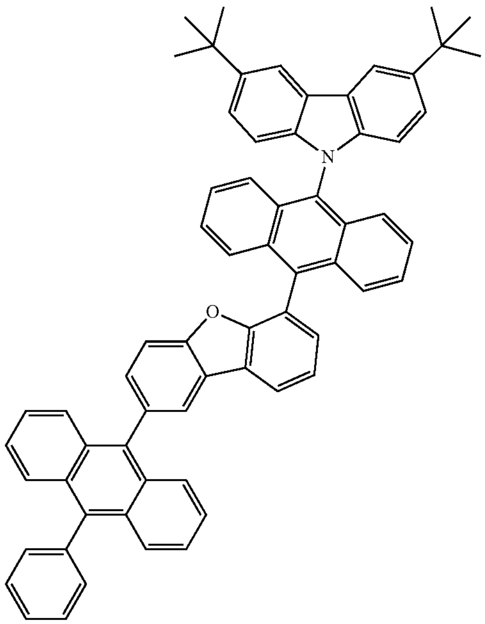
211
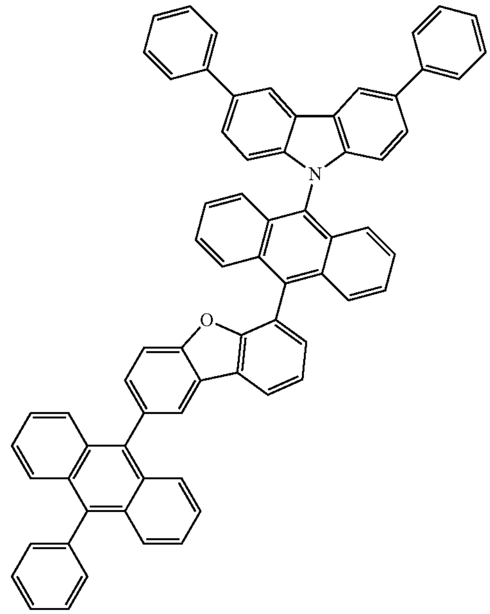
212
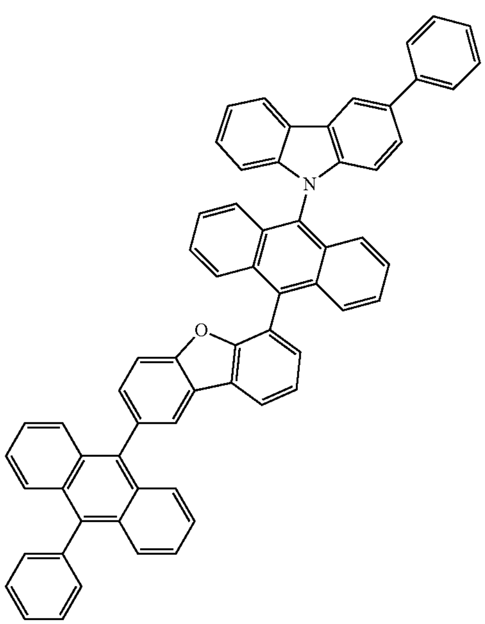
213
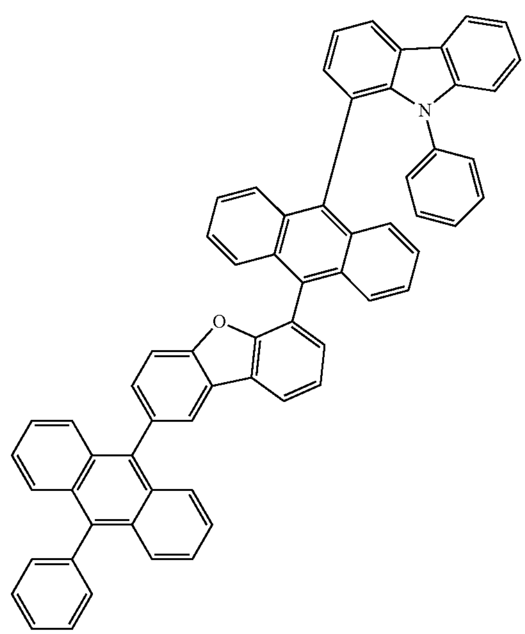

-continued
214
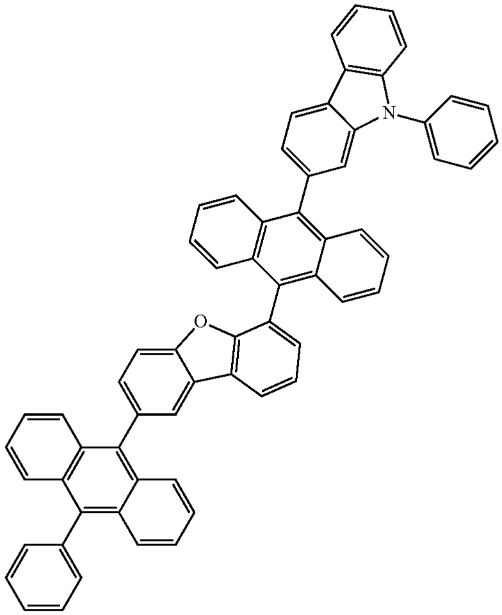
215
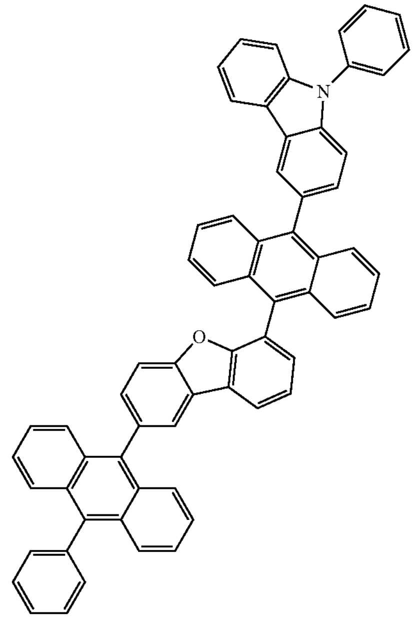
216
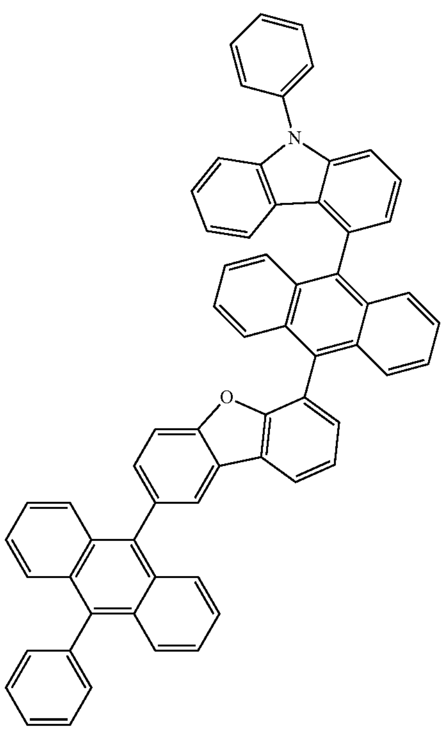
217
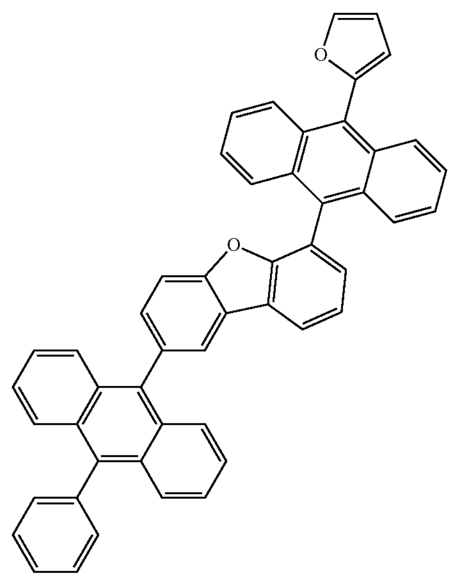

-continued
218
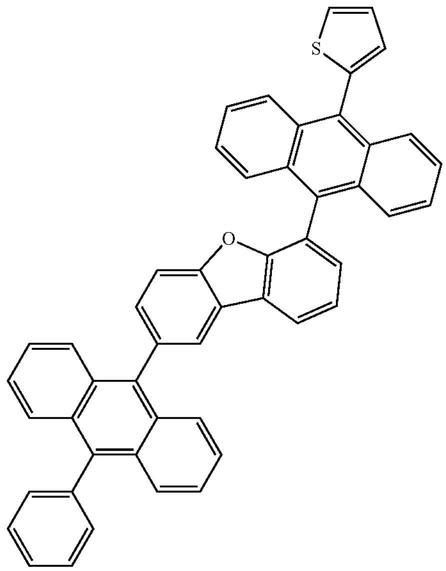
219
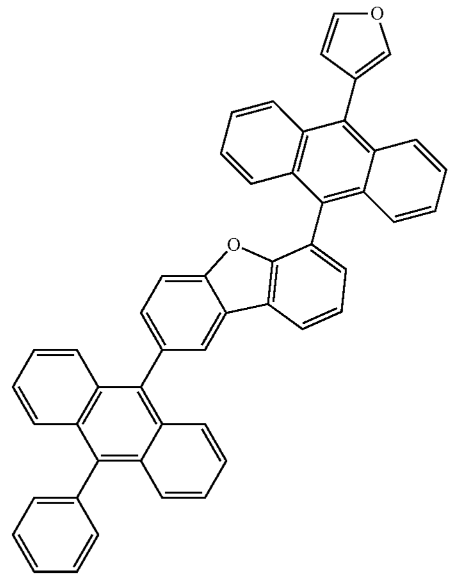
220
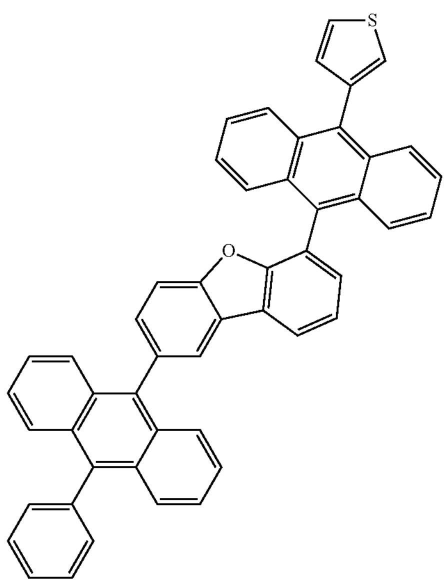
221
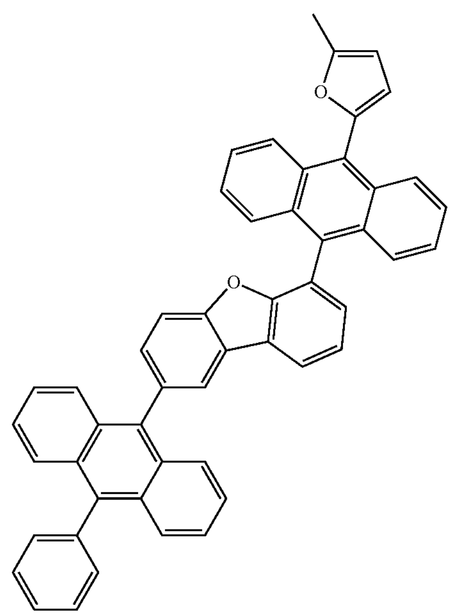

-continued
222
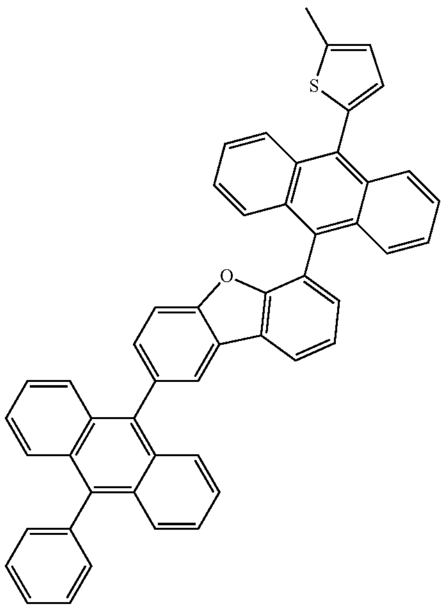
223
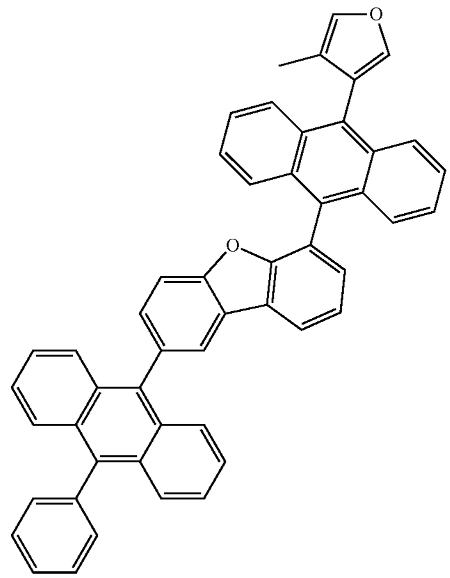
224
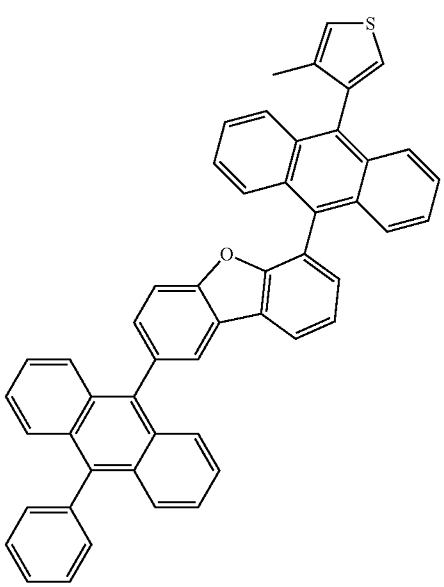
225
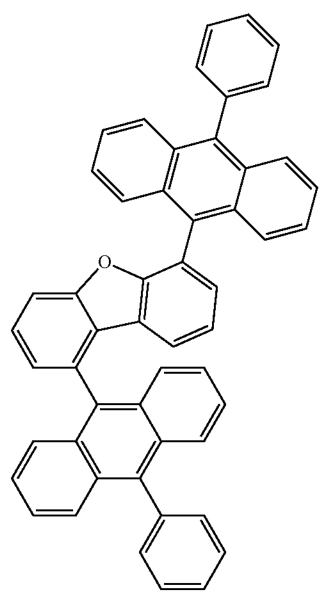

-continued
226
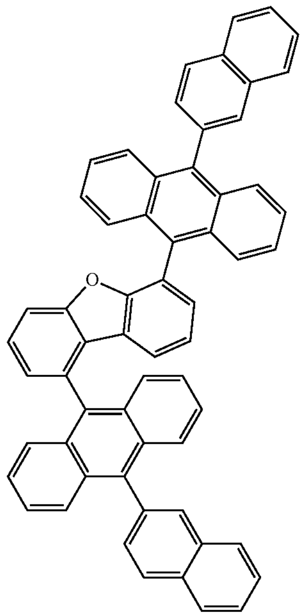
227
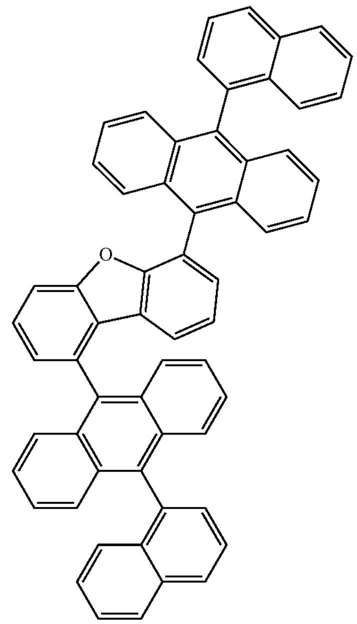
228
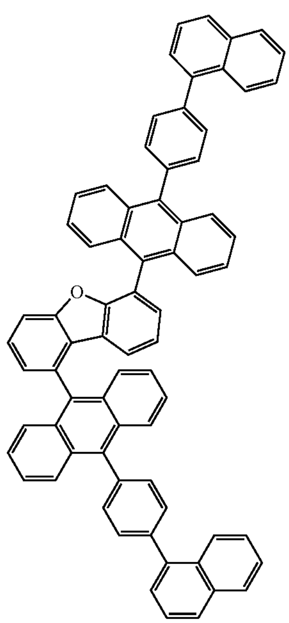
229
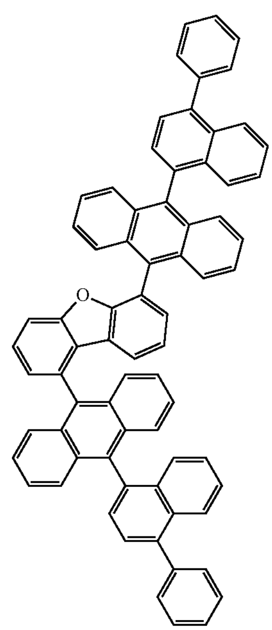

-continued
230
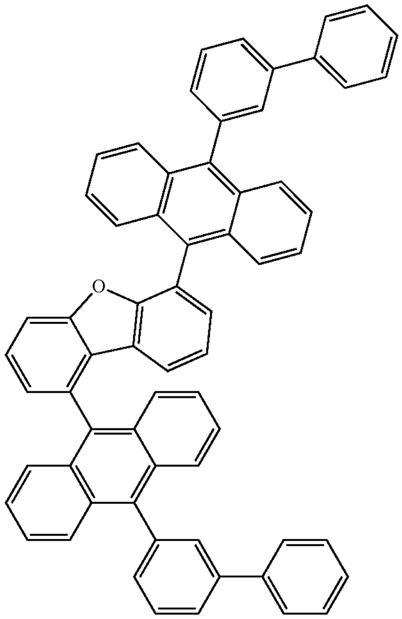
231
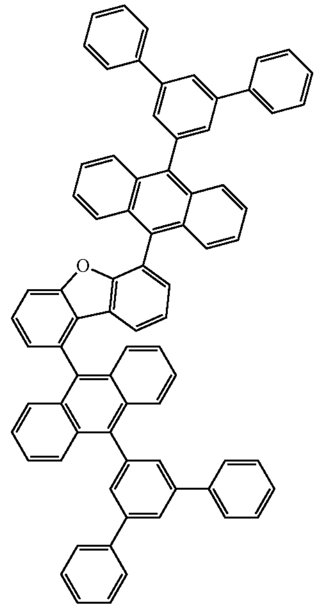
232
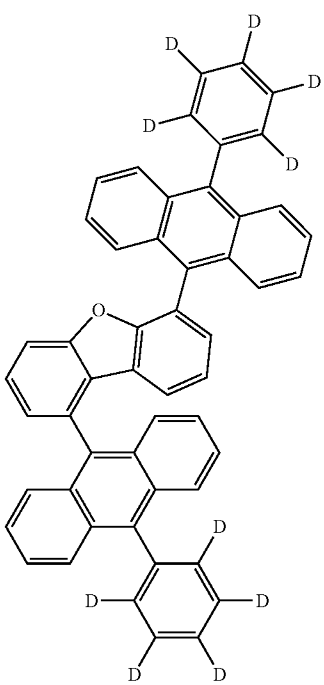
233
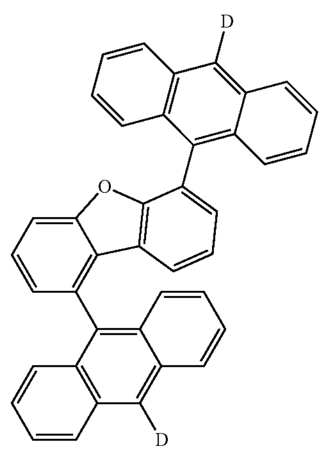

-continued
234
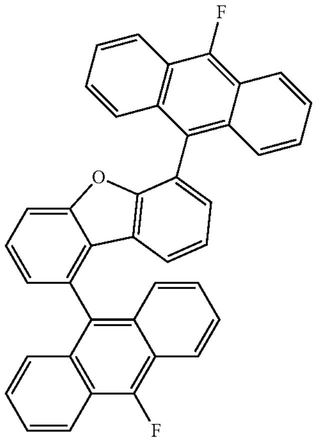
235
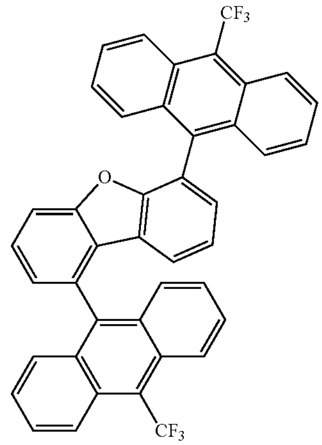
236
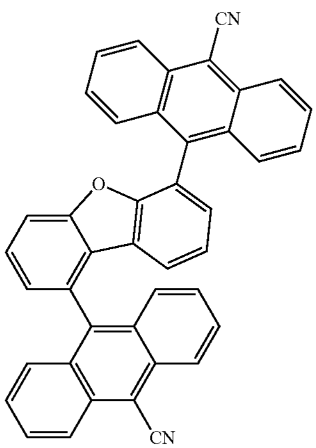
237
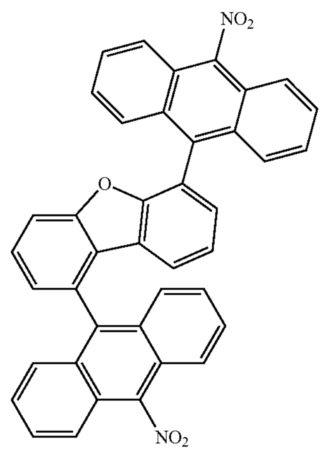
238
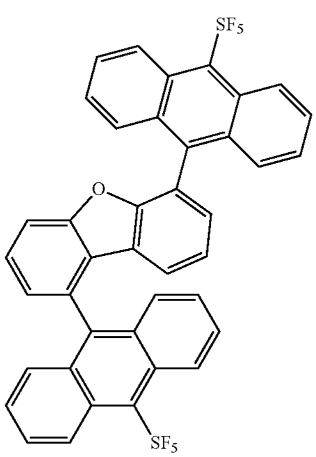
239
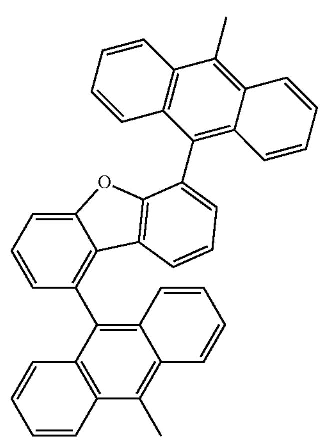

-continued
240
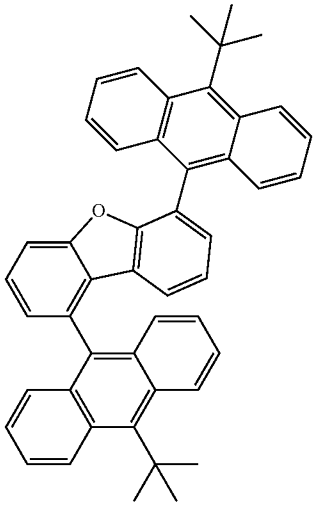
241
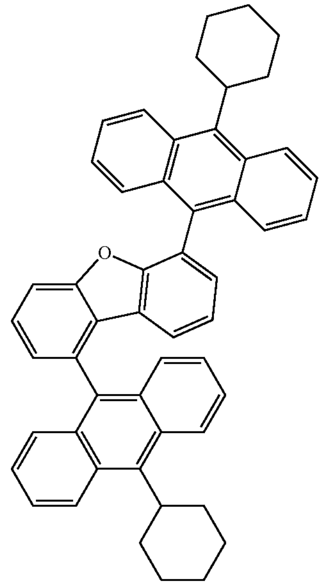
242
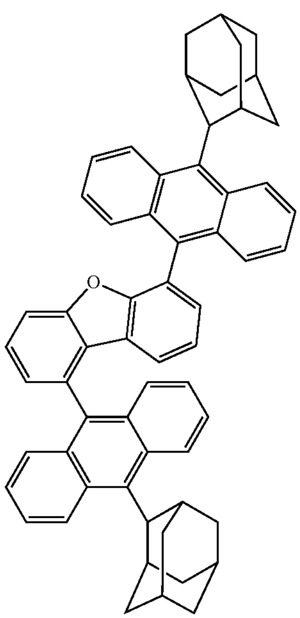
243
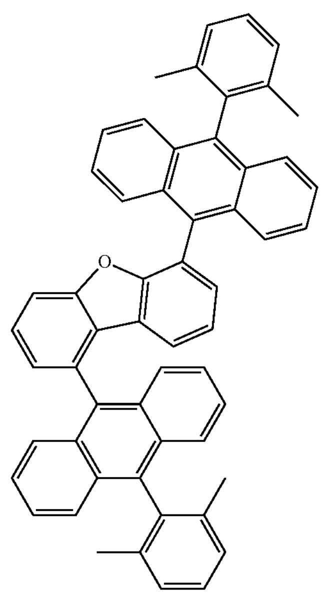

-continued
244
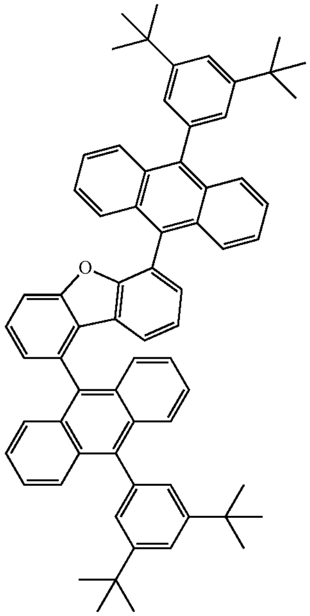
245
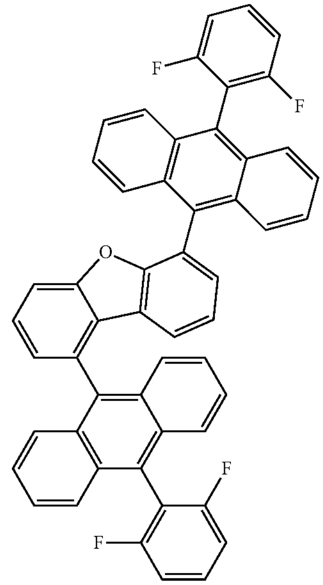
246
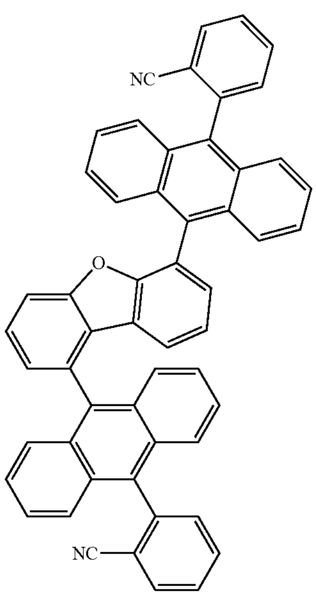
247
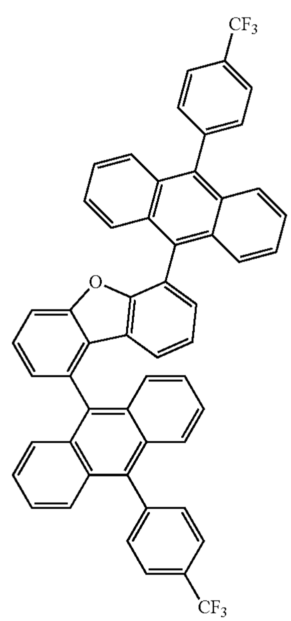

-continued
248
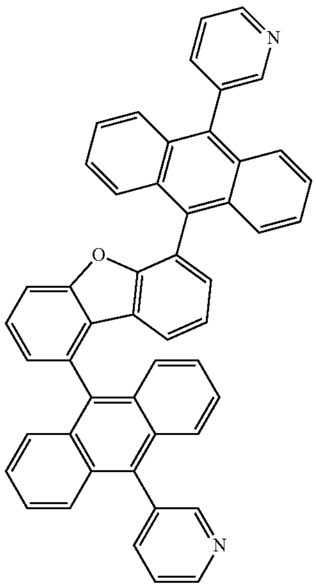
249
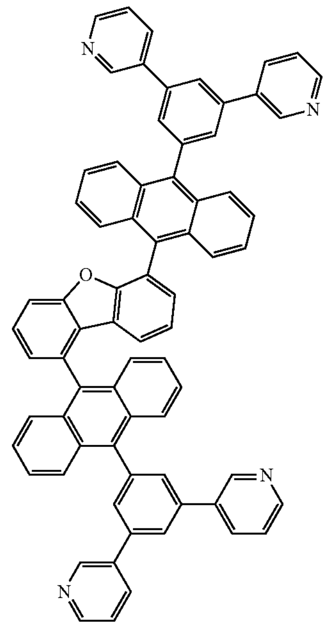
250
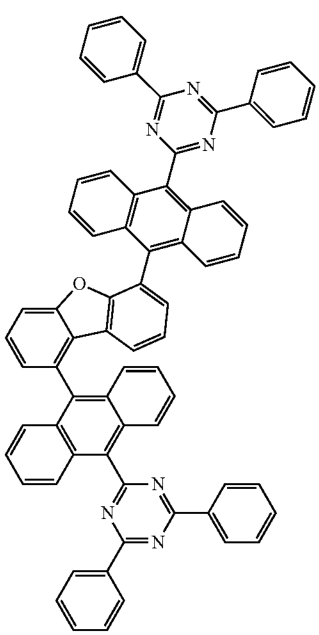
251
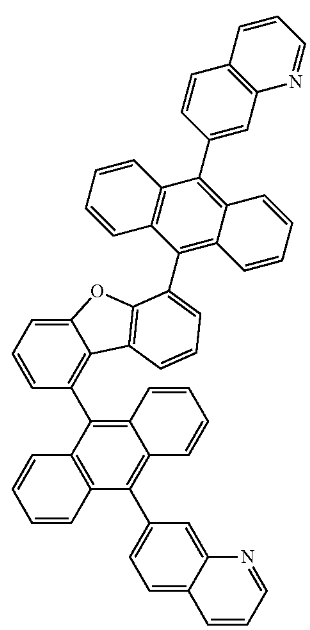

-continued
252
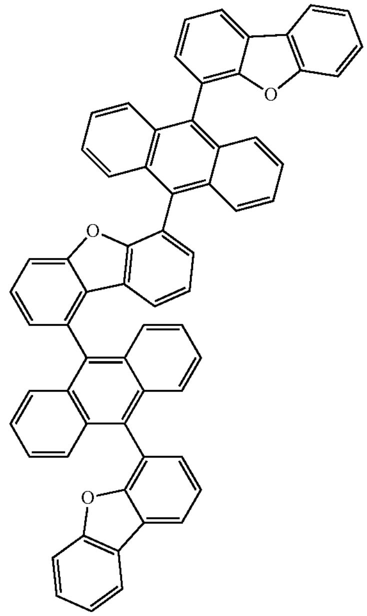
253
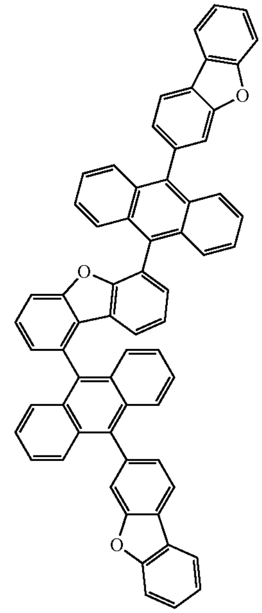
254
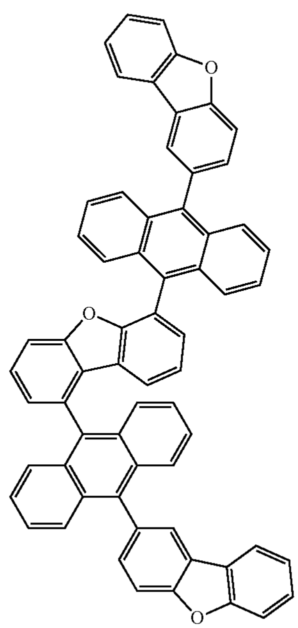
255
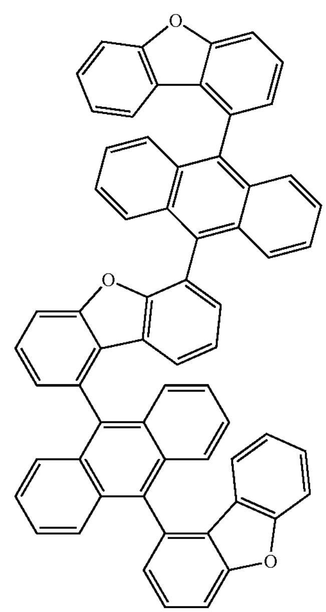

-continued
256
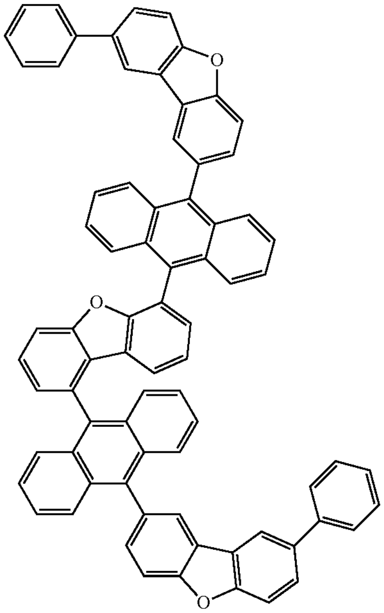
257
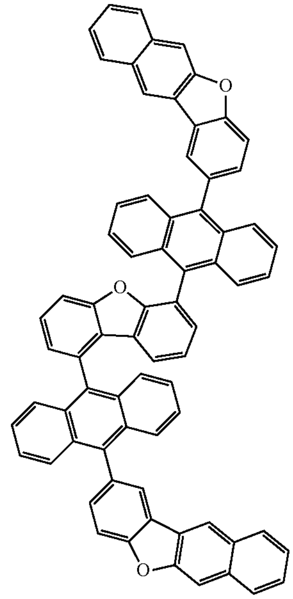
258
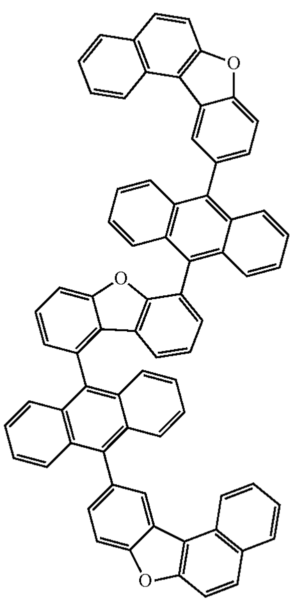
259
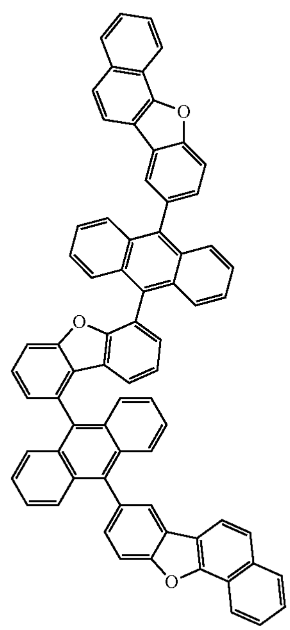

-continued
260
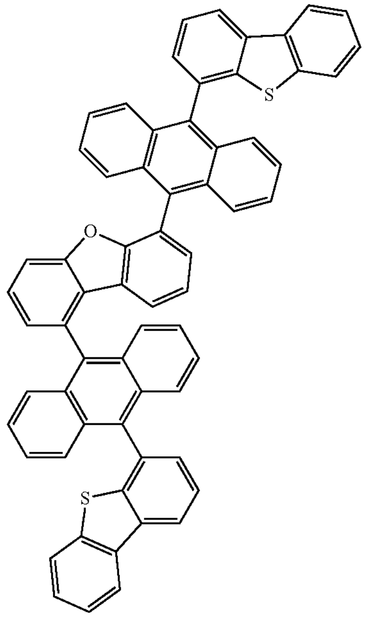
261
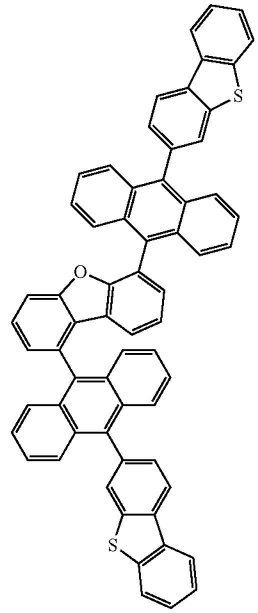
262
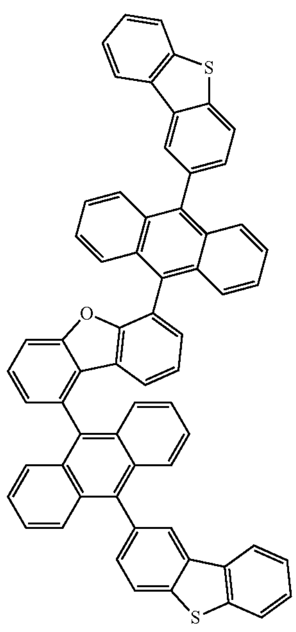
263
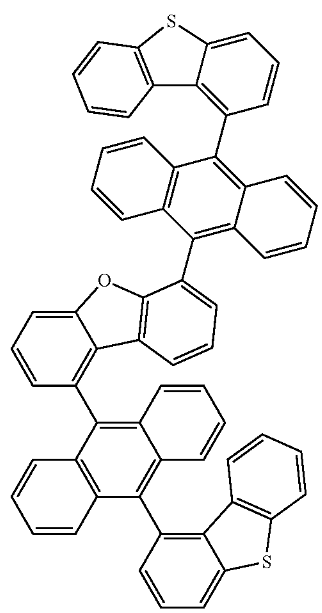

-continued
264
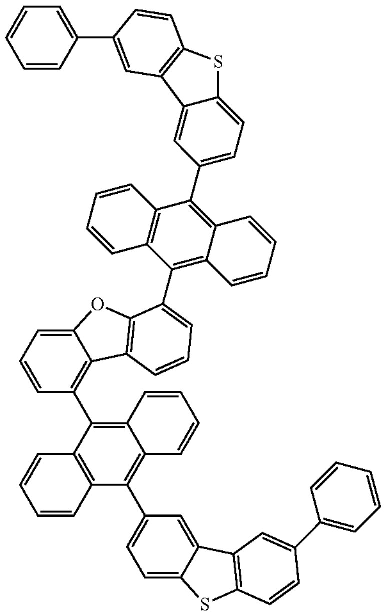
265
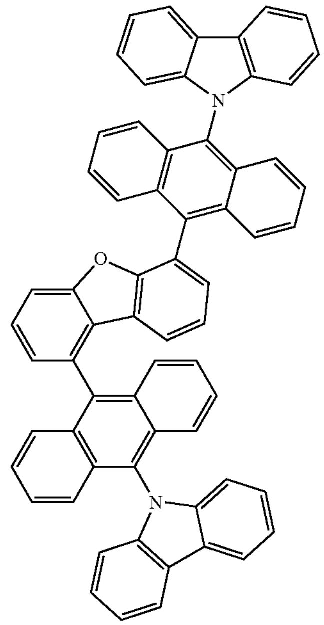
266
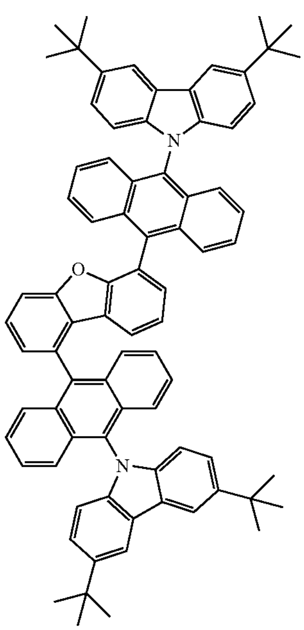
267
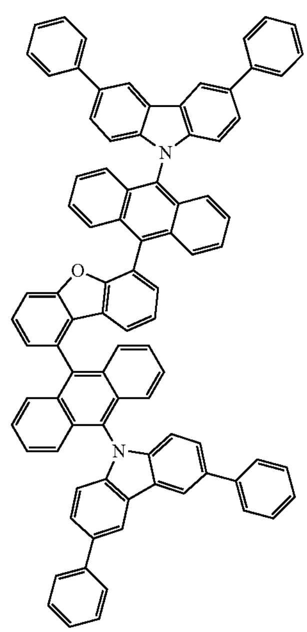

-continued
268
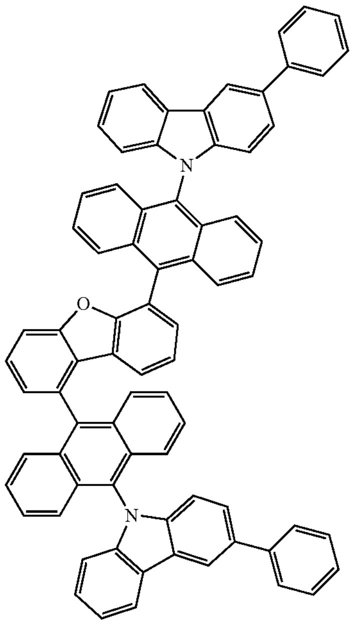
269
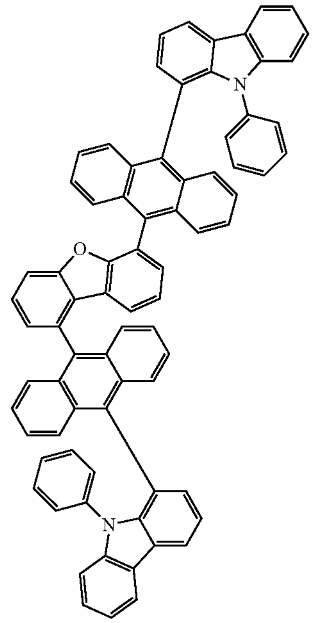
270
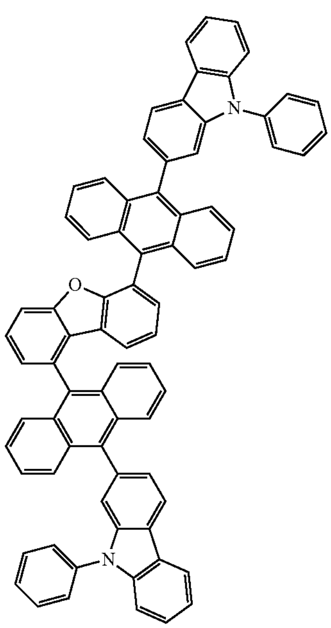
271
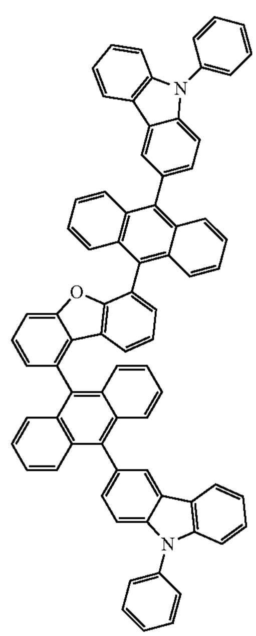

-continued
272
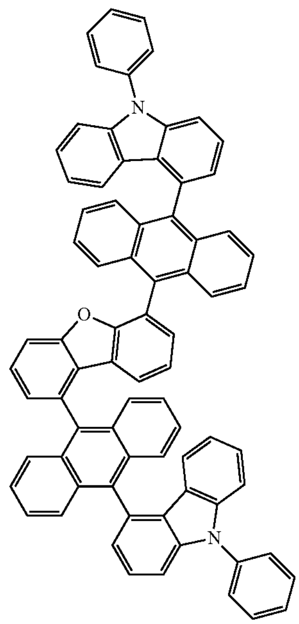
273
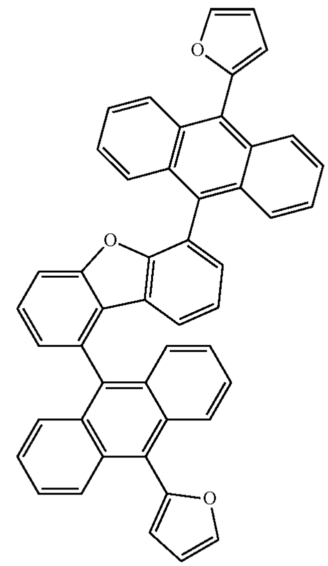
274
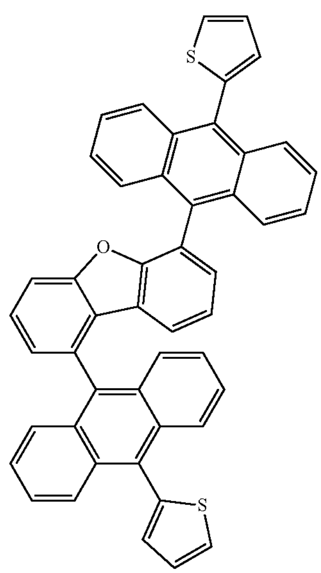
275
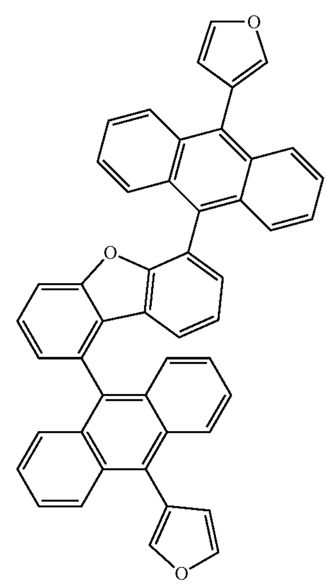

-continued
276
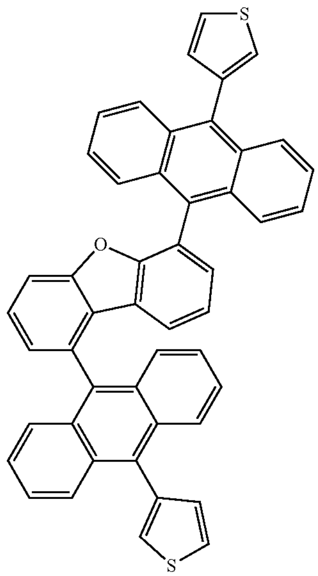
277
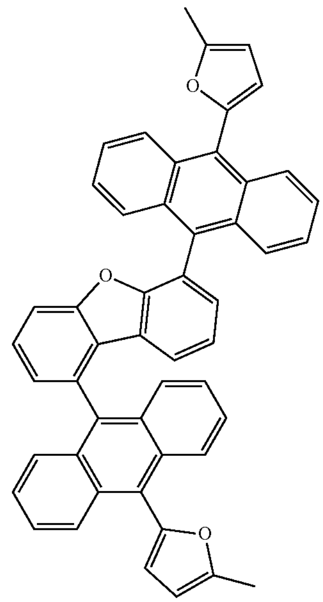
278
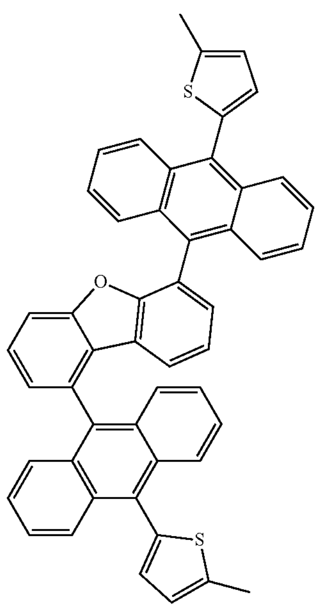
279
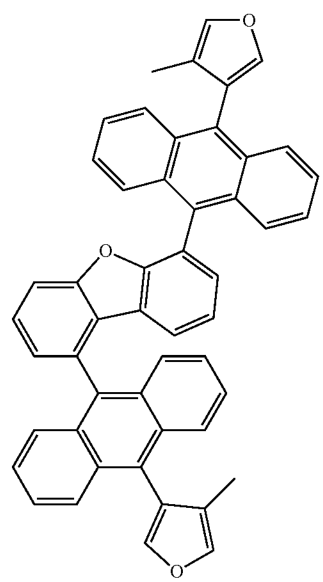

-continued
280
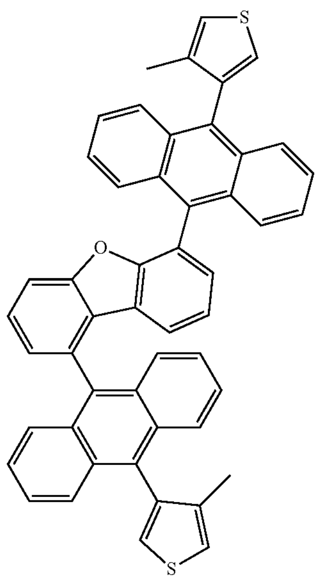
281
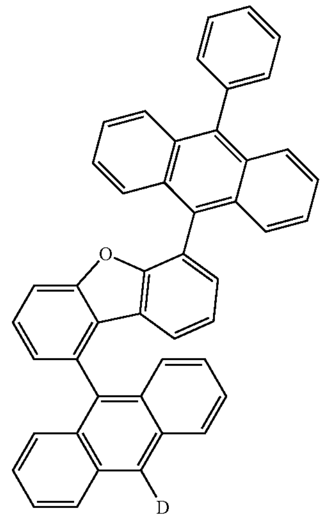
282
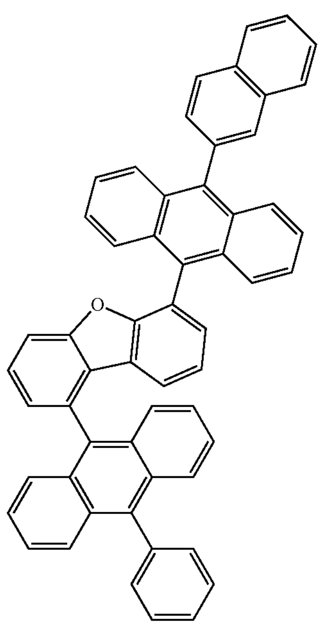
283
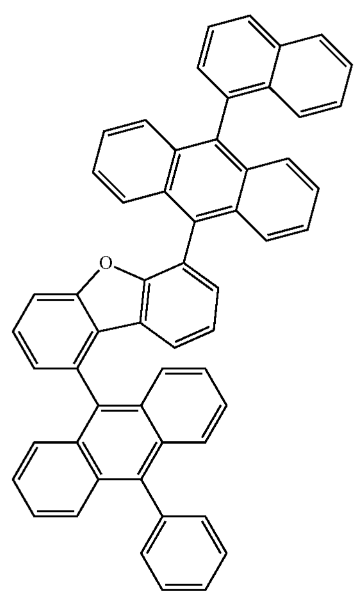

-continued
284
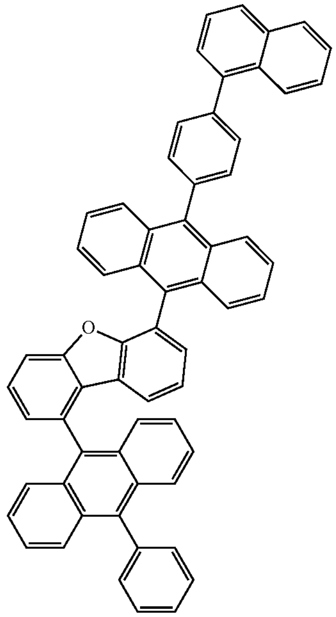
285
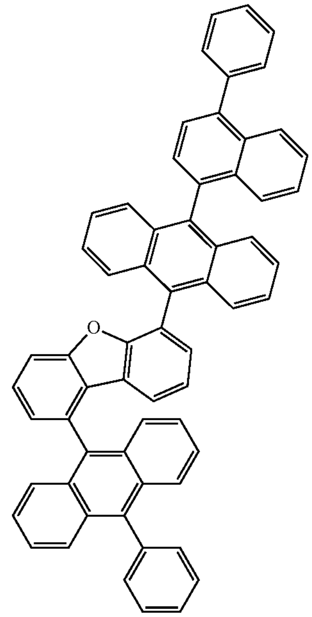
286
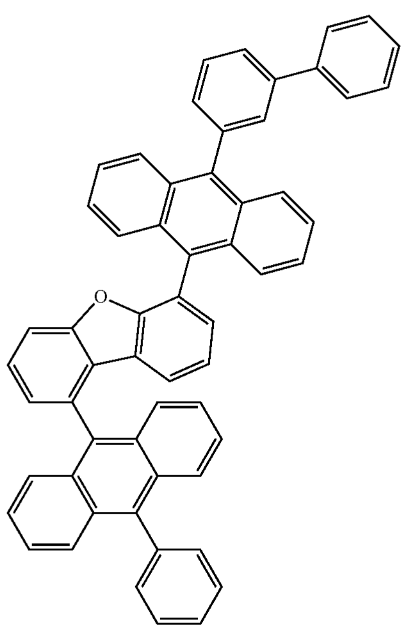
287
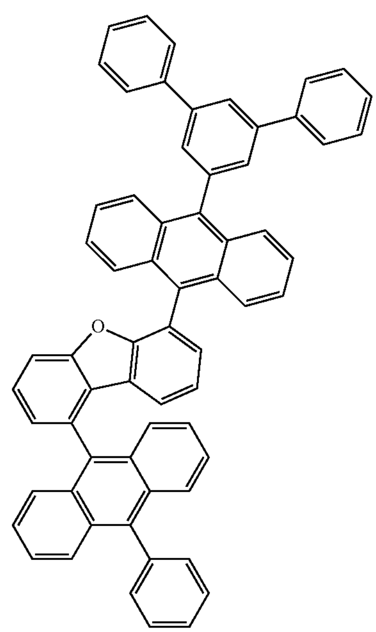

-continued
288
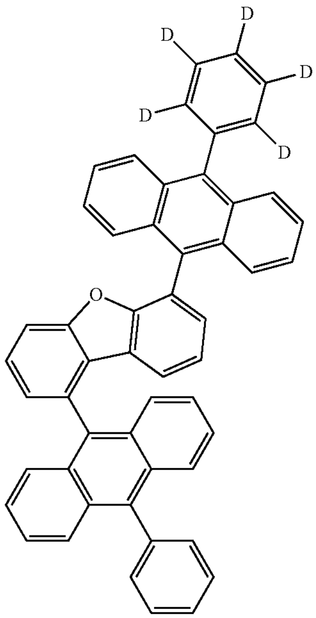
289
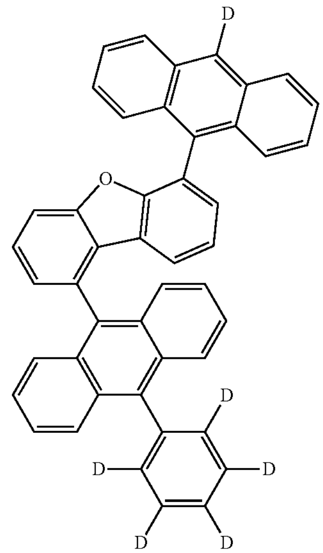
290
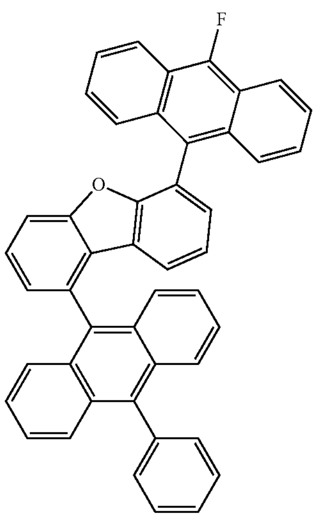
291
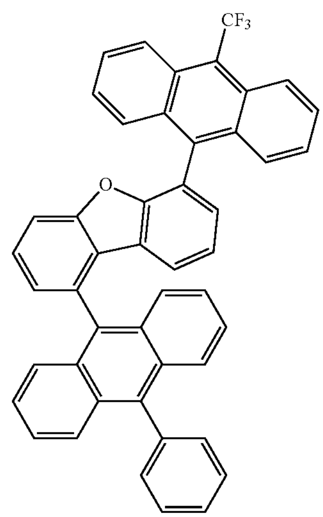
292
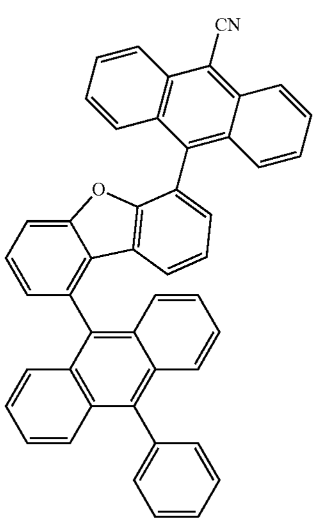
293
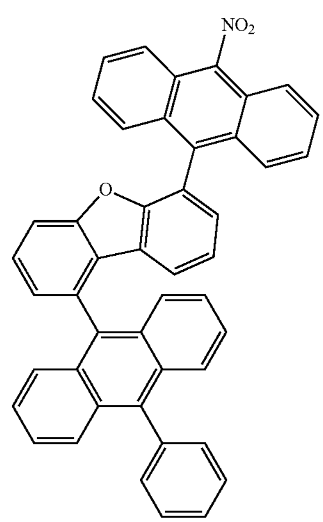

-continued
294
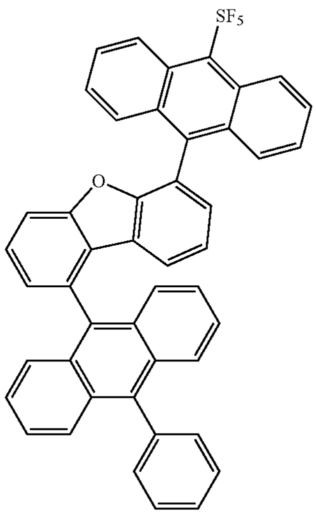
295
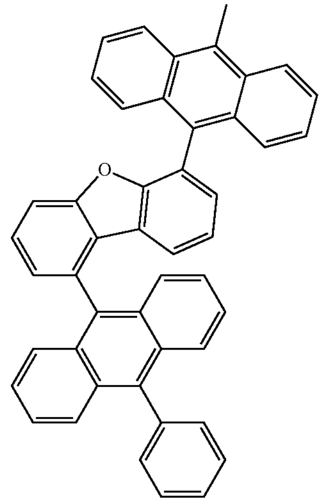
296
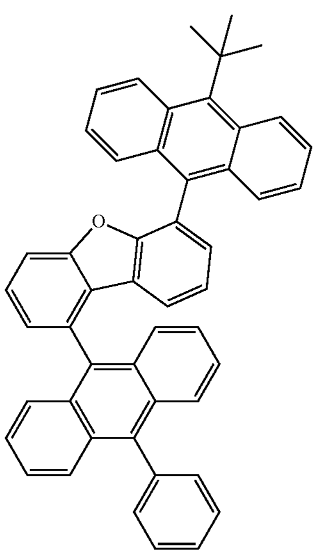
297
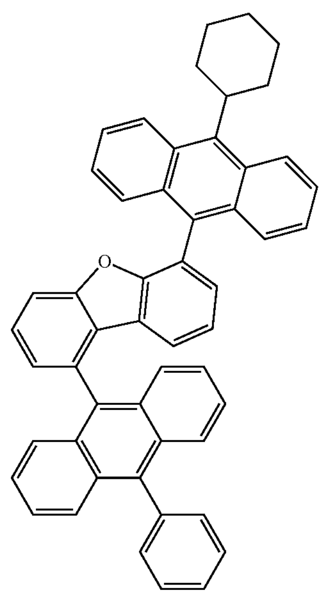

-continued
298
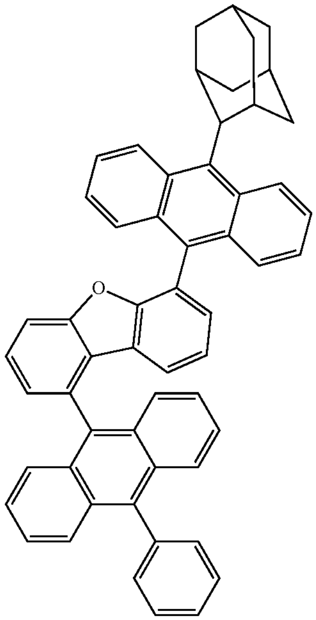
299
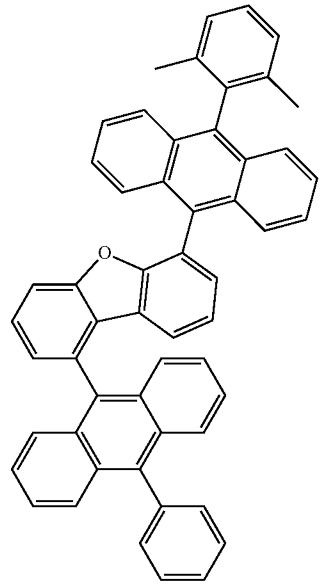
300
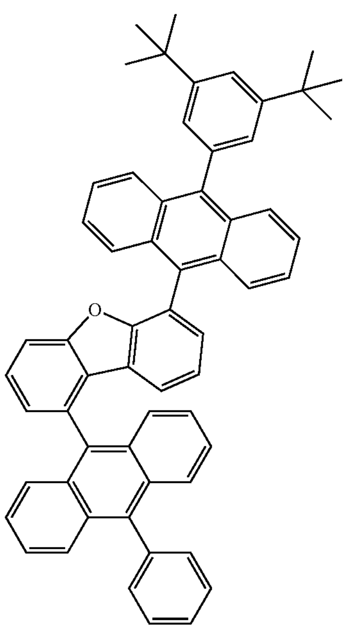

301
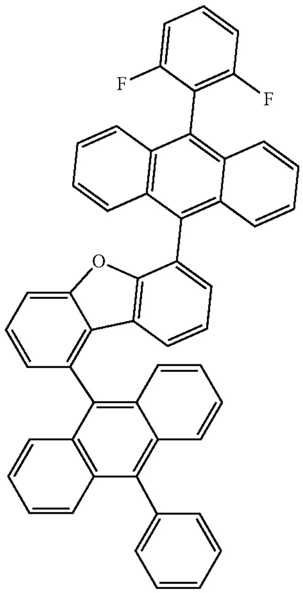
302
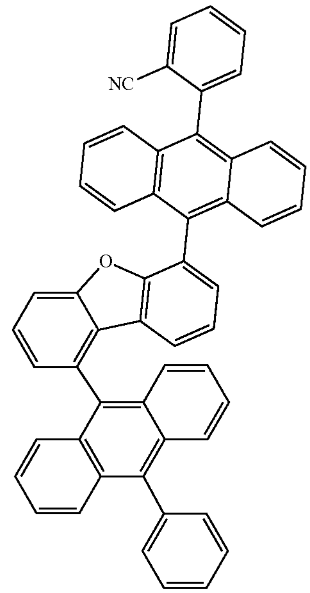
303
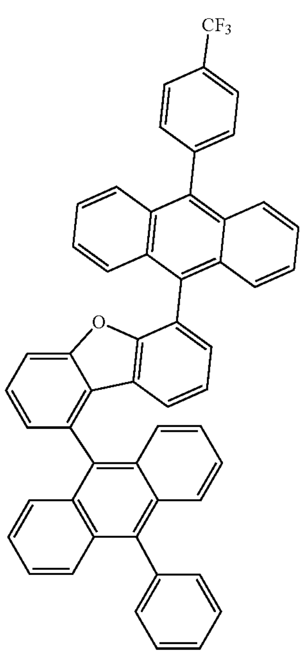
304
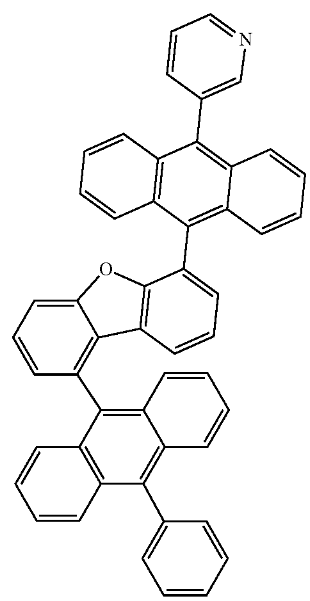

-continued
305
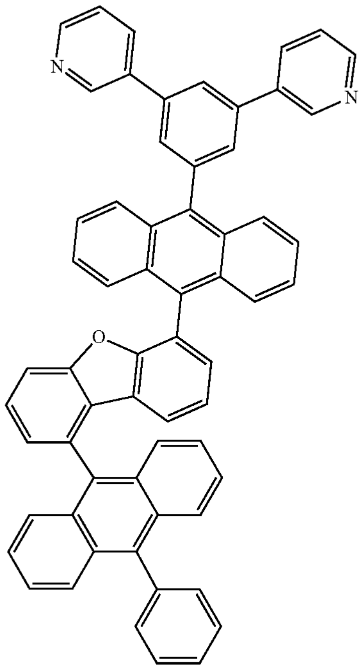
306
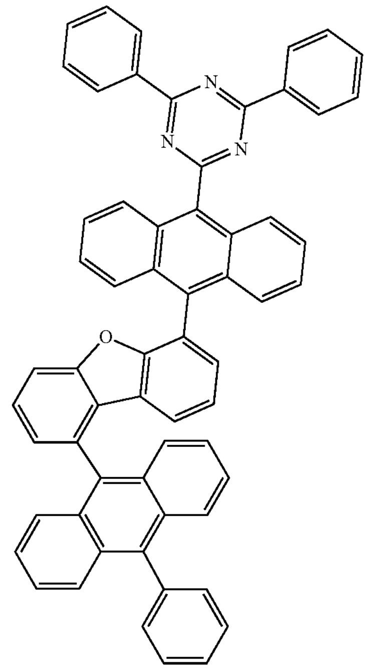
307
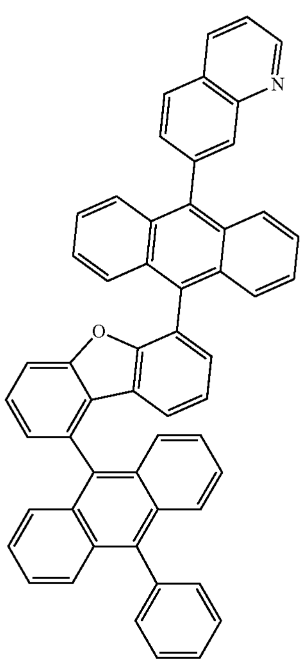
308
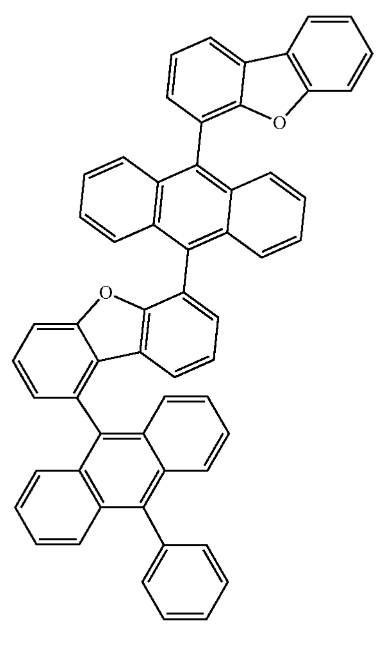

-continued
309
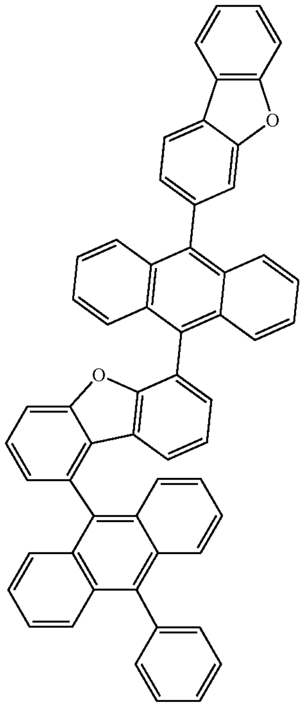
310
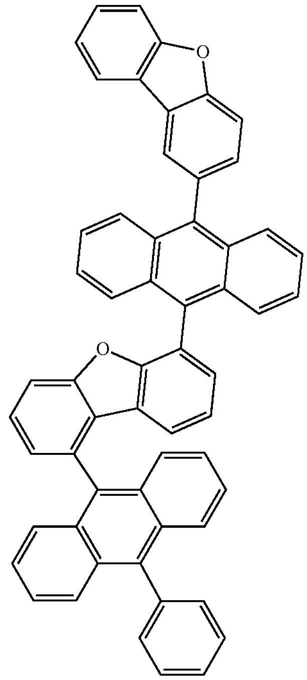
311
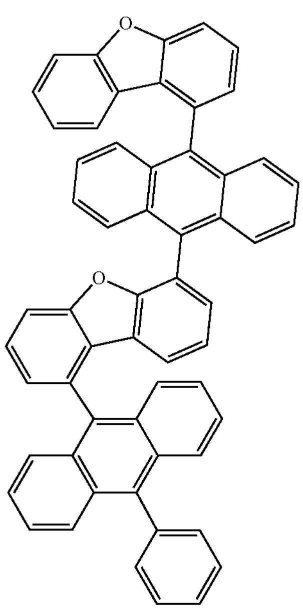
312
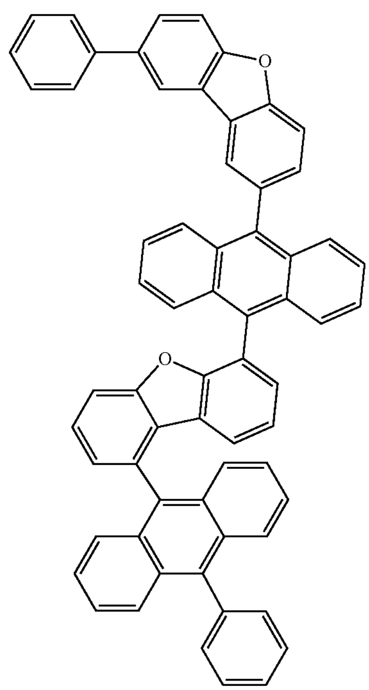

-continued
313
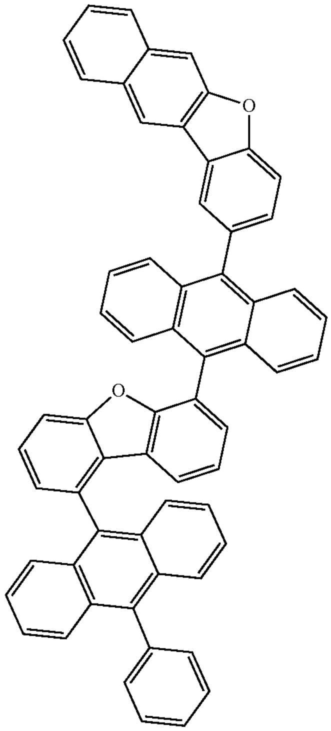
314
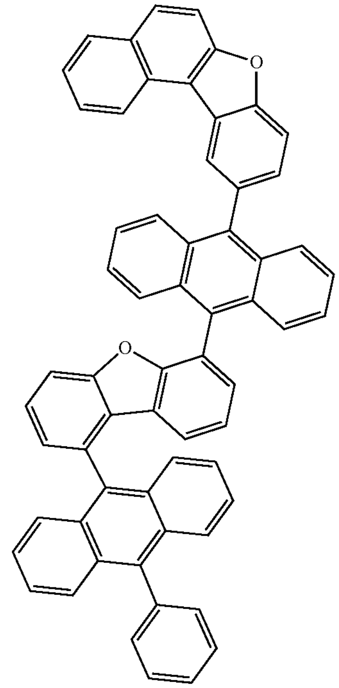
315
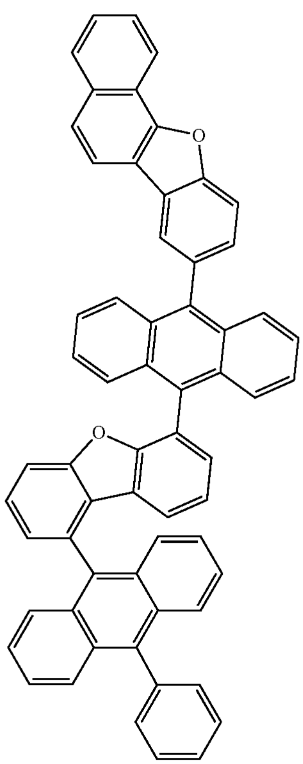
316
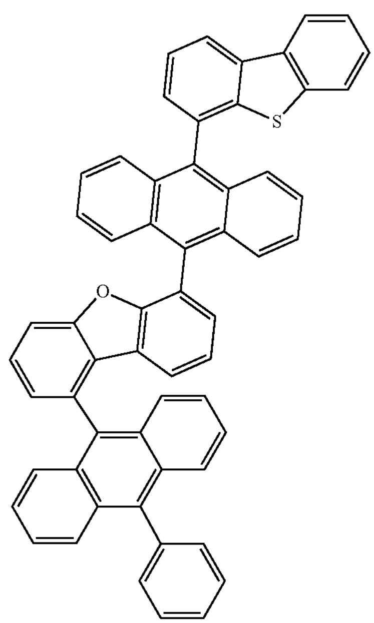

-continued
317
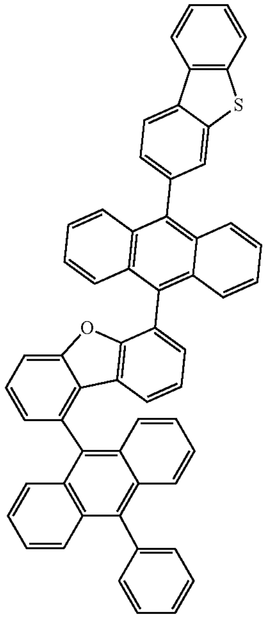
318
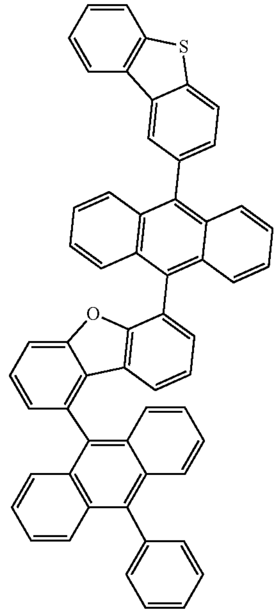
319
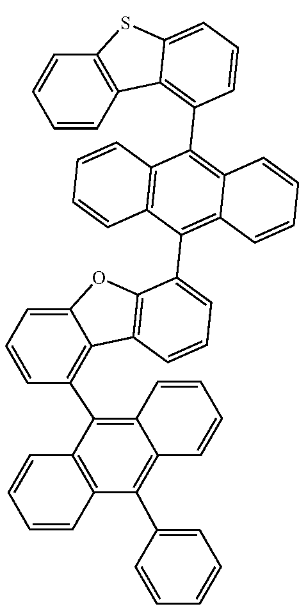
320
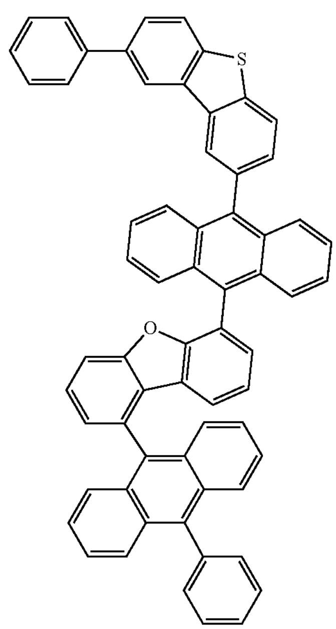

-continued
321
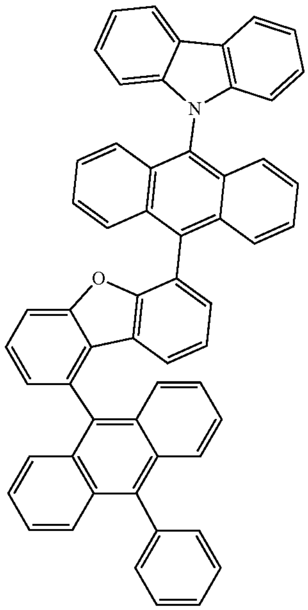
322
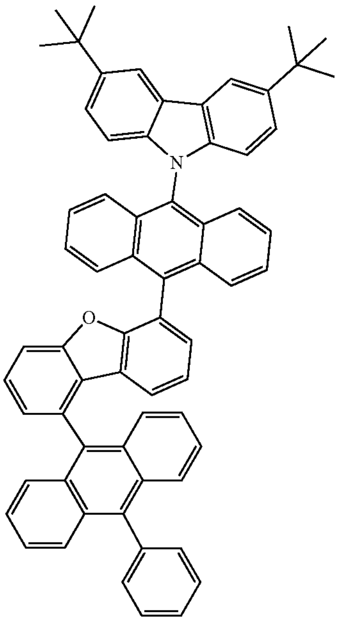
323
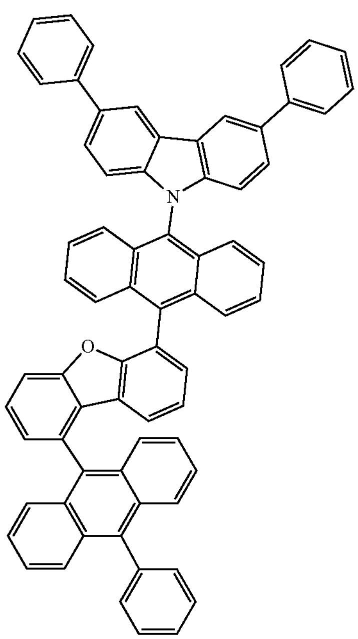
324
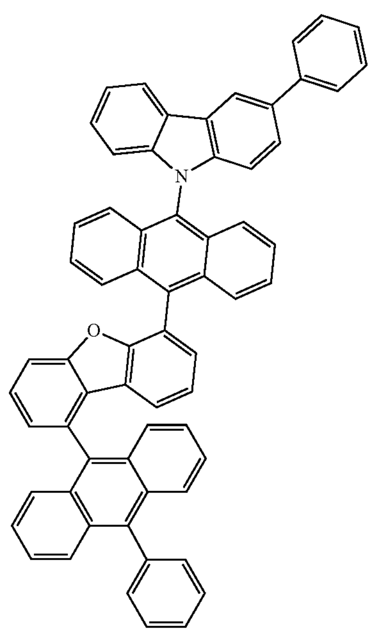

-continued
325
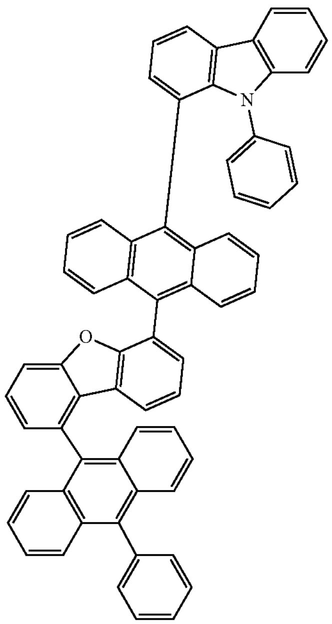
326
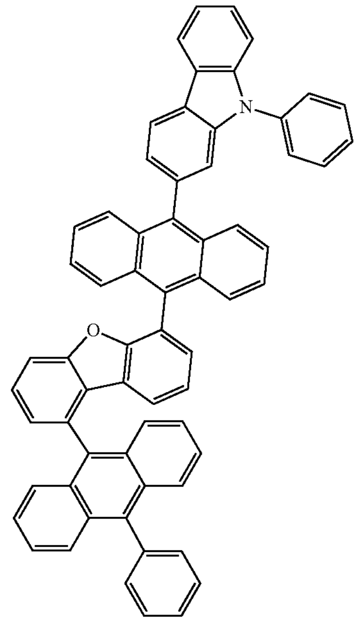
327
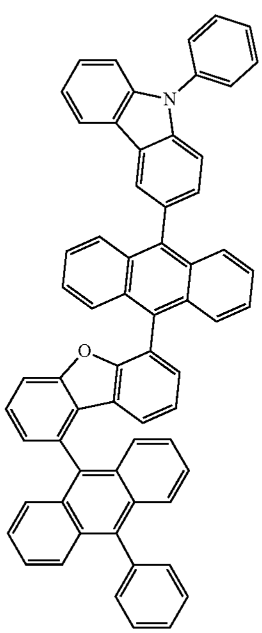
328
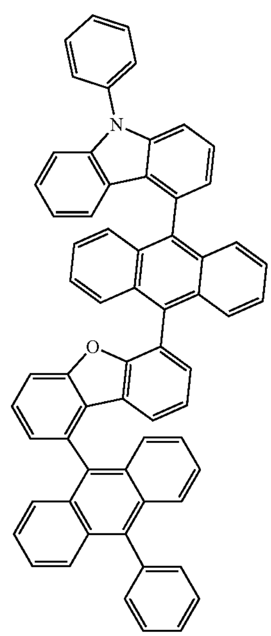

-continued
329
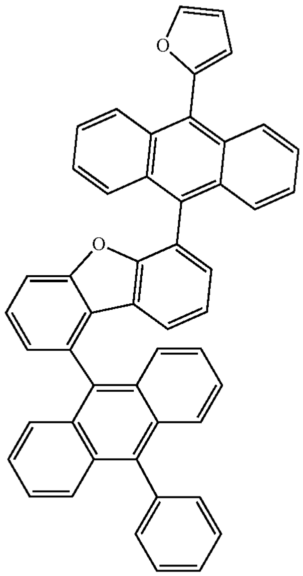
330
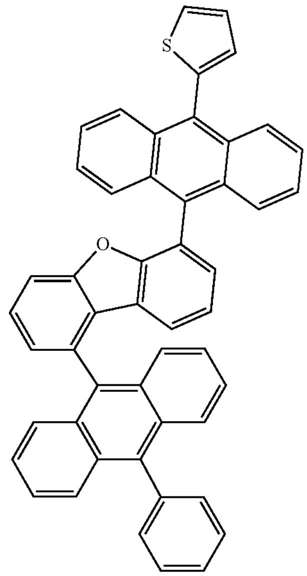
331
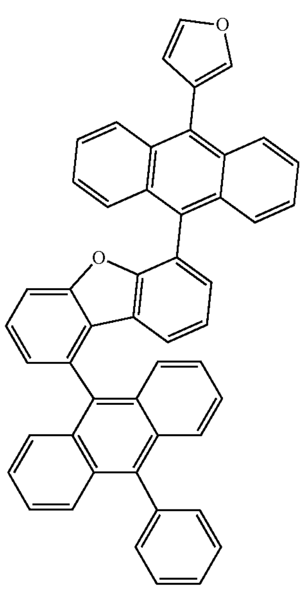
332
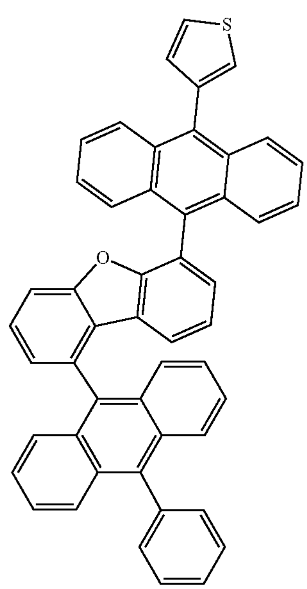

-continued
333
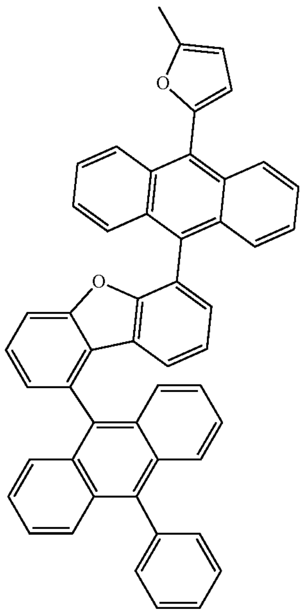
334
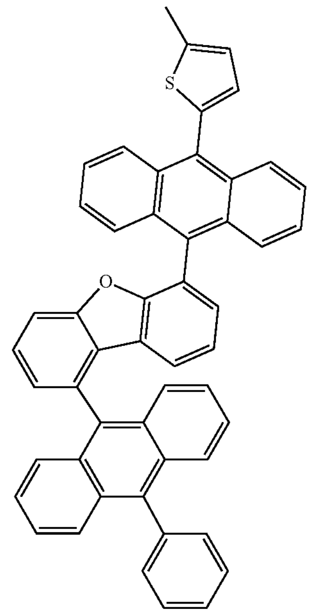
335
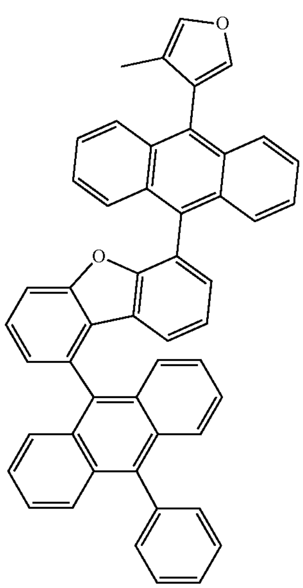
336
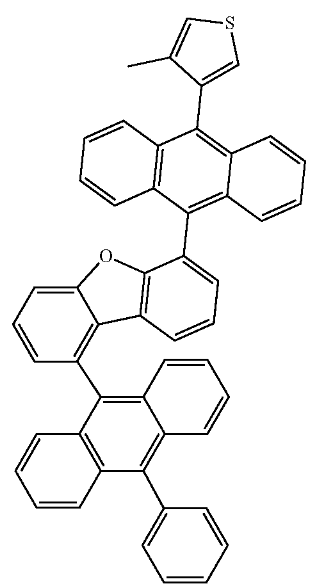
337
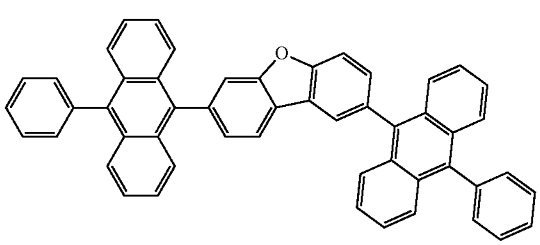
338
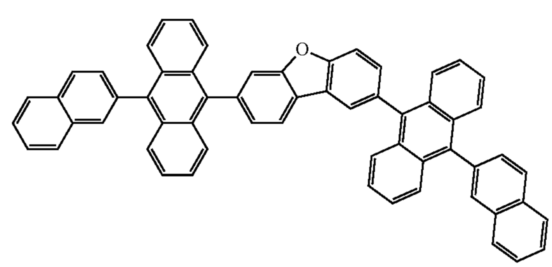

-continued
339
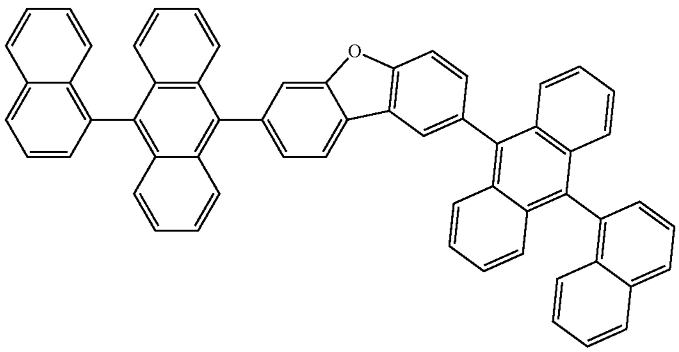
340
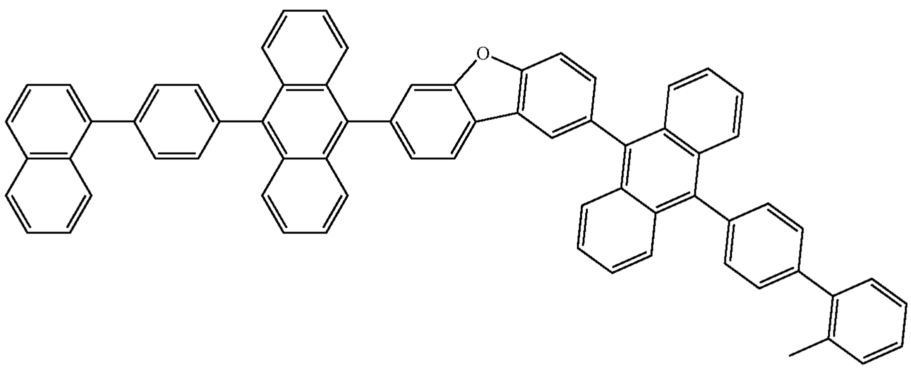
341
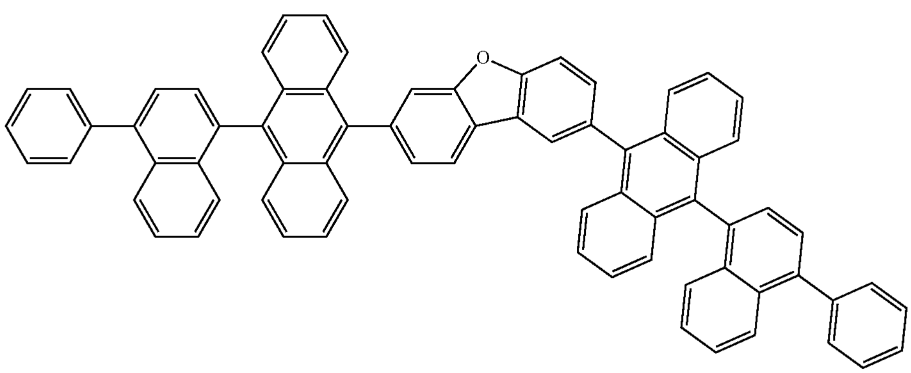
342
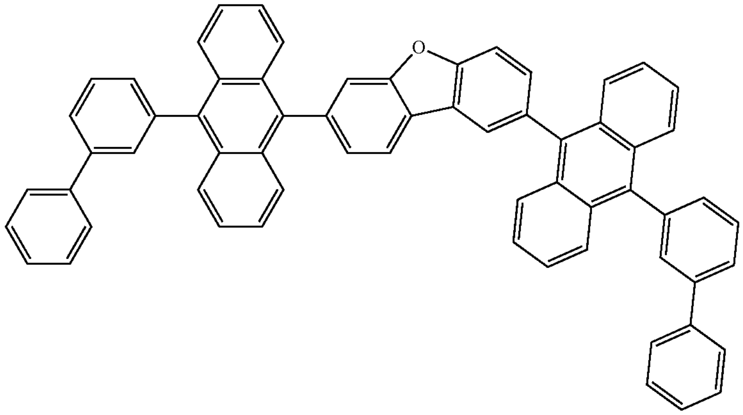

-continued
343
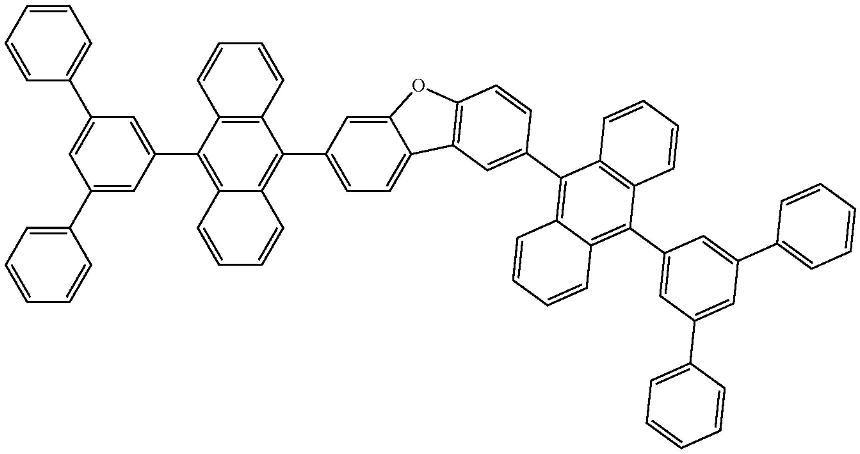
344
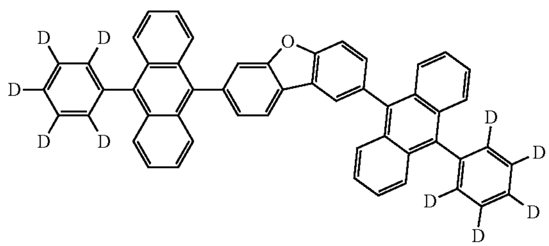
345
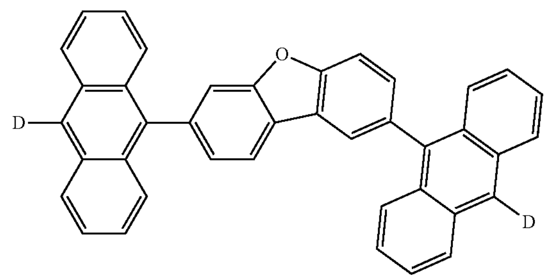
346
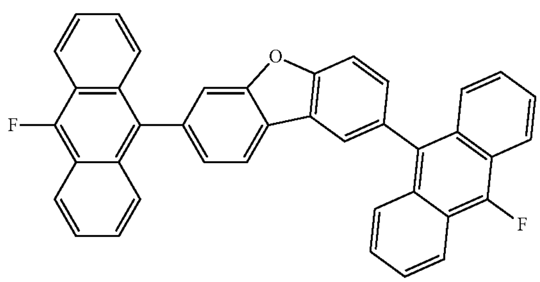
347
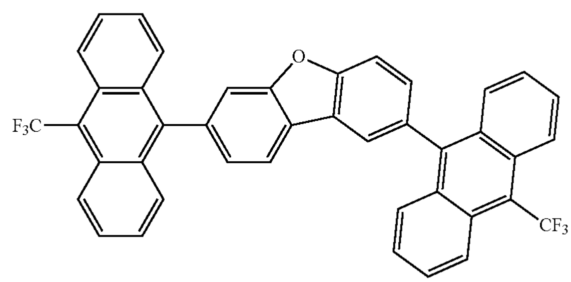
348
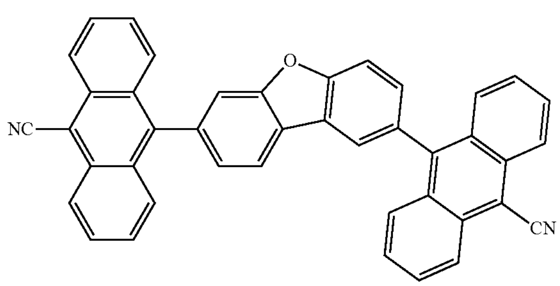
349
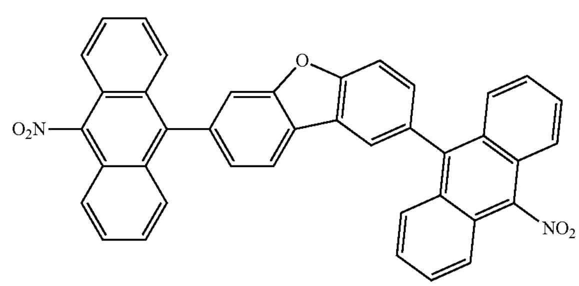
350
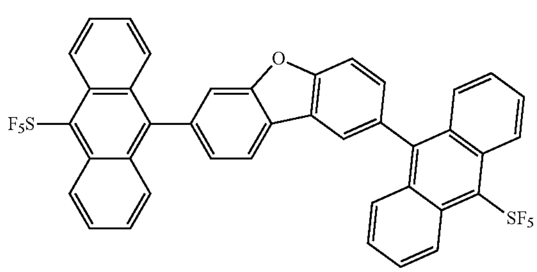
351
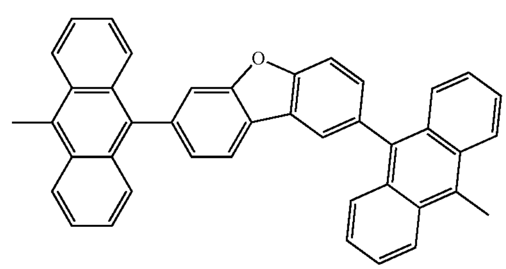

-continued
352
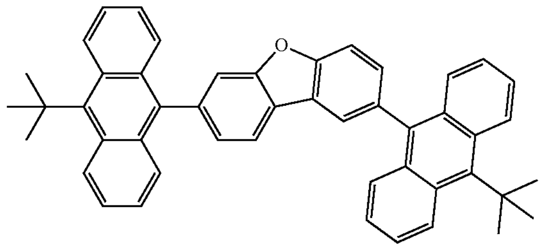
353
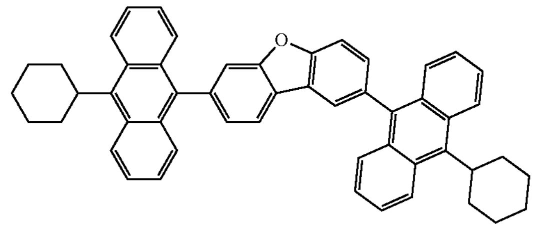
354
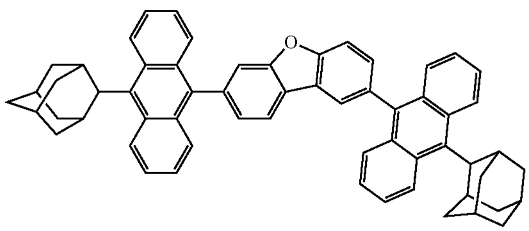
355
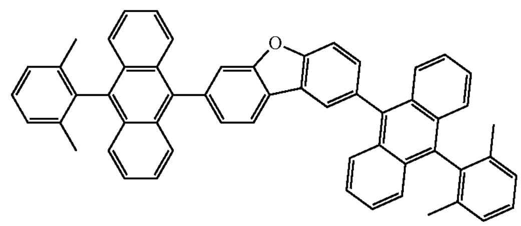
356
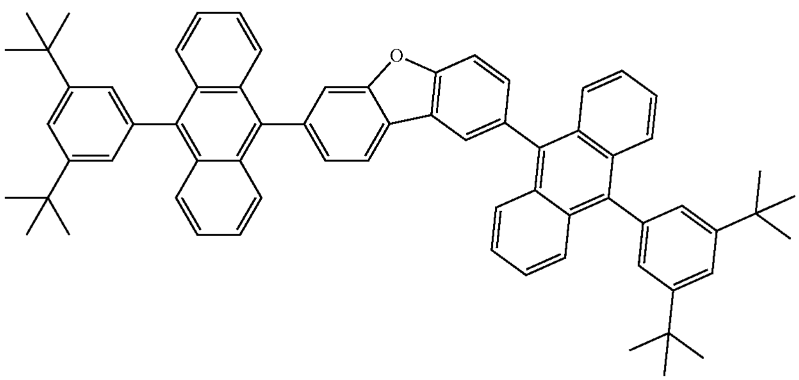
357
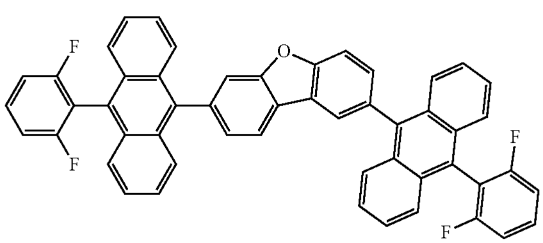
358
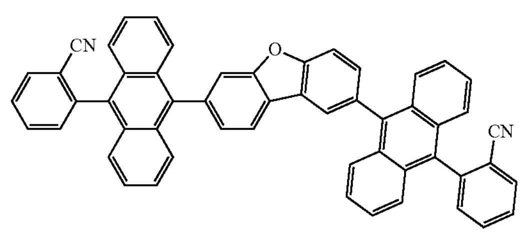
359
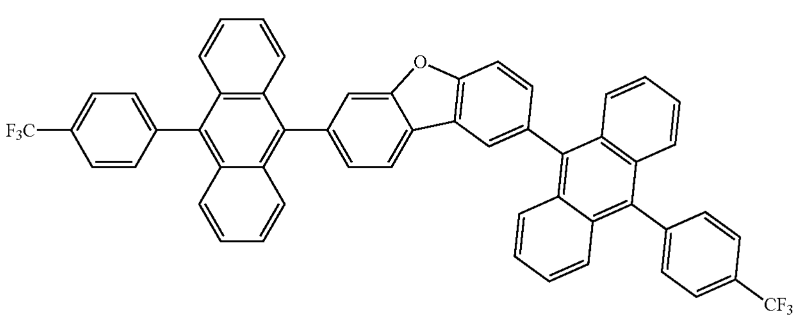

-continued
360
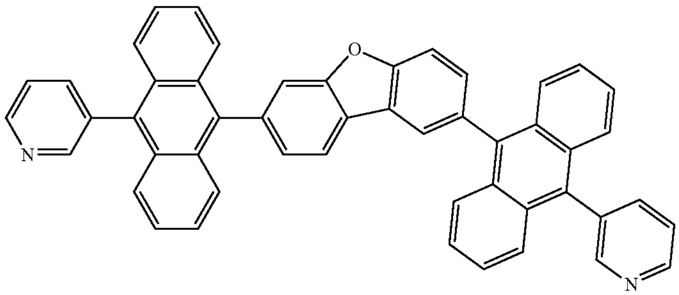
361
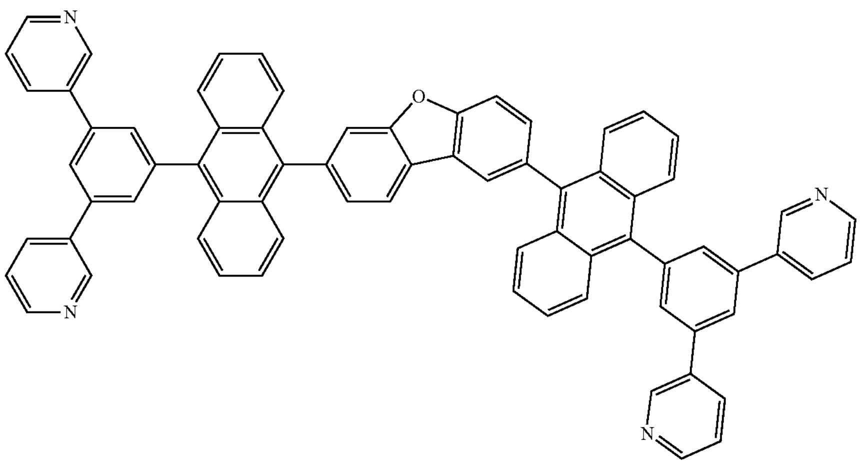
362
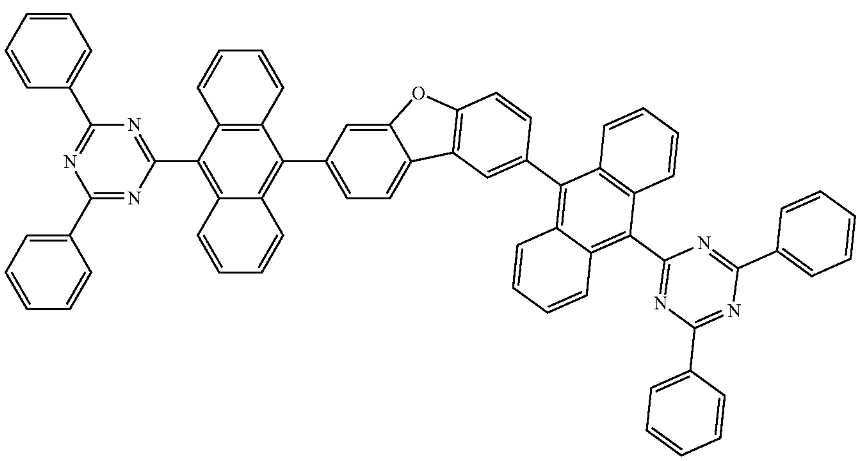
363
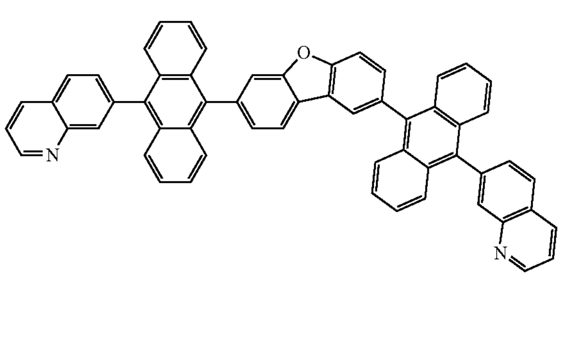
364
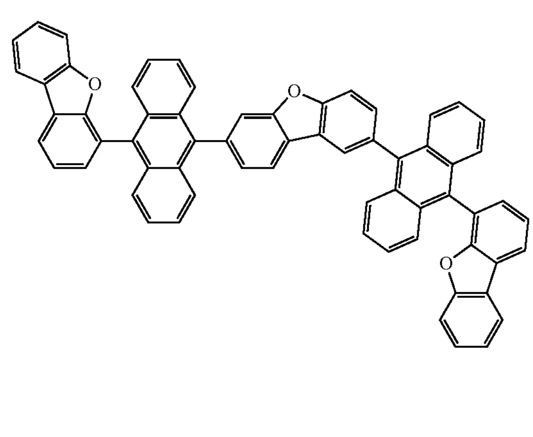

-continued
365
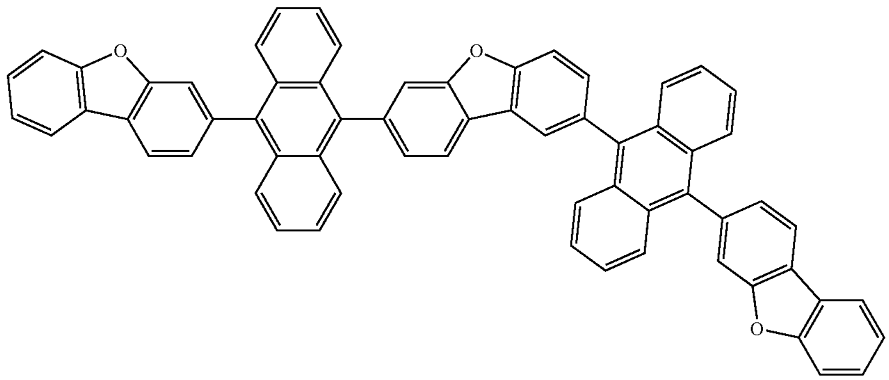
366
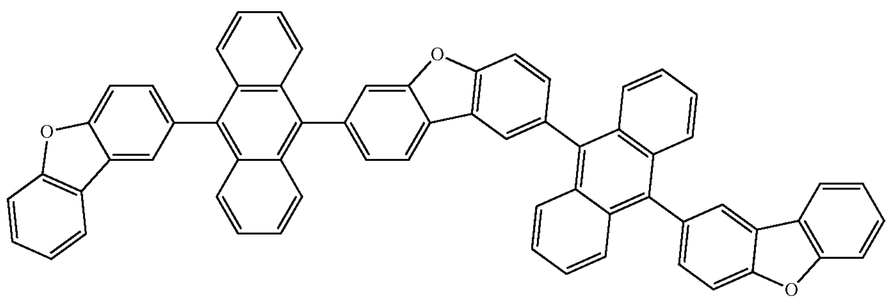
367
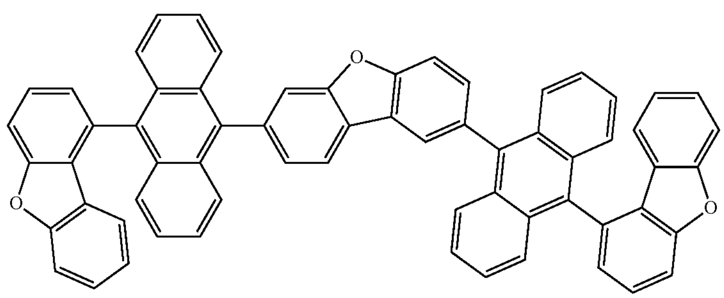
368
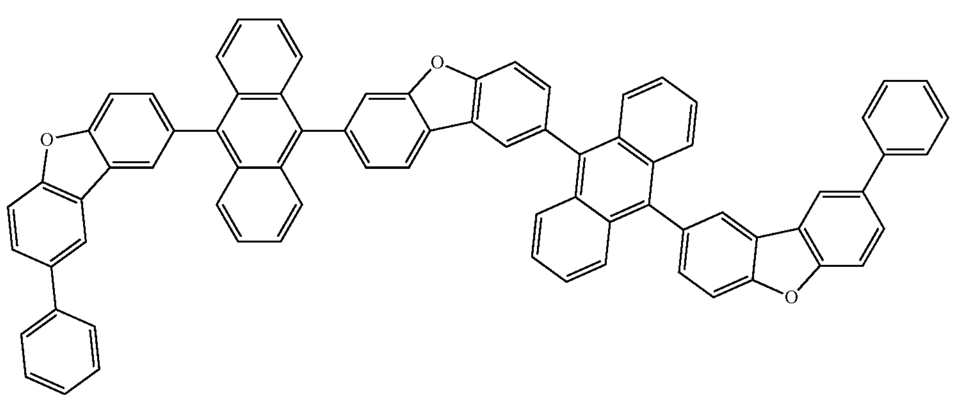

-continued
369
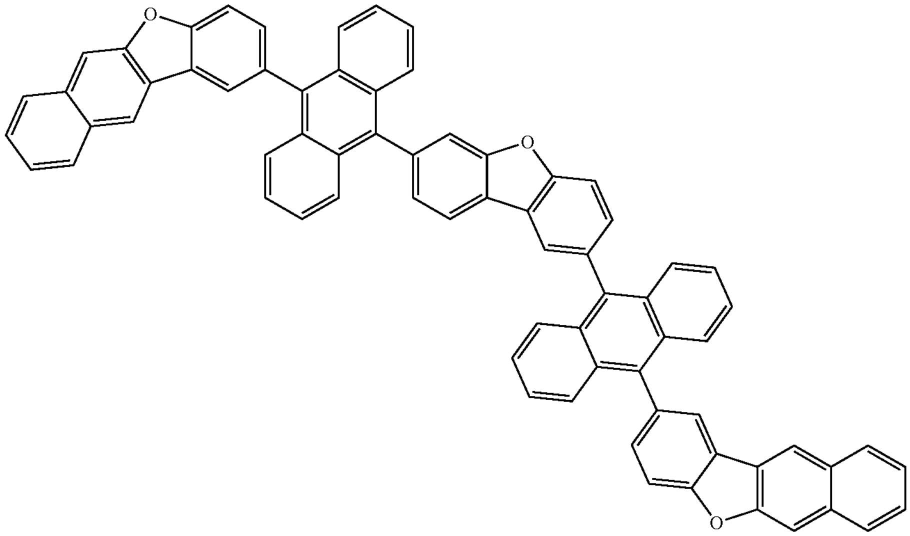
370
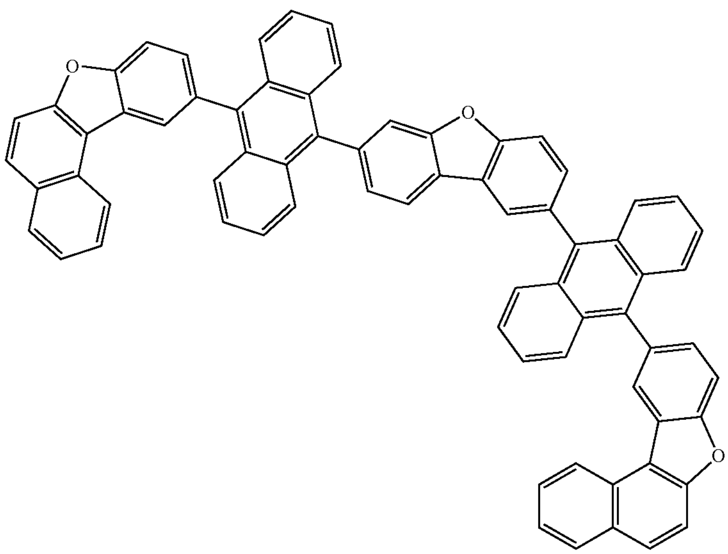
371
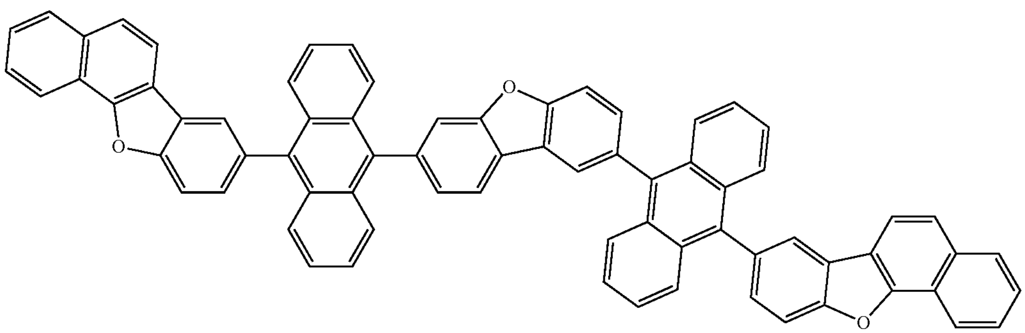

-continued
372
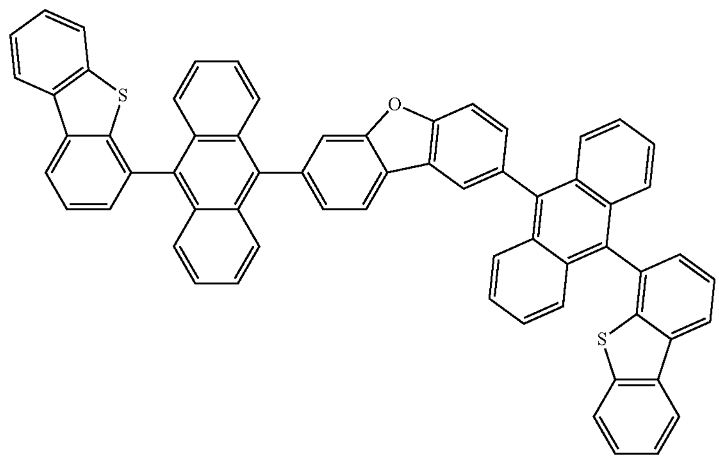
373
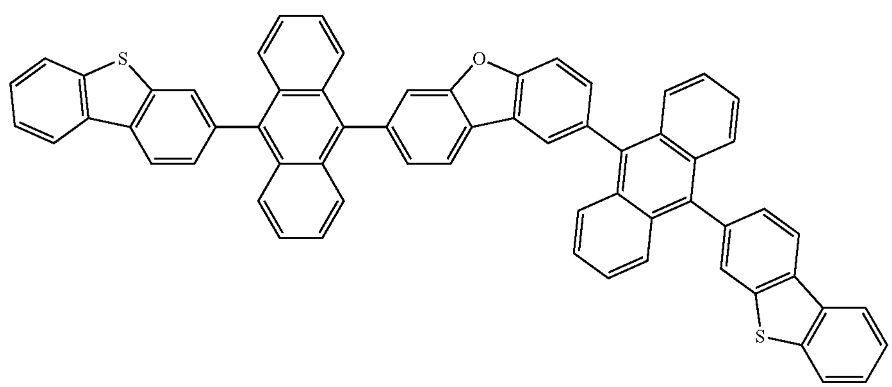
374
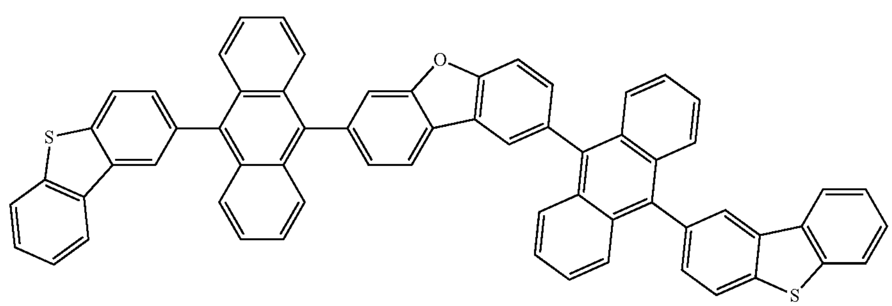
375
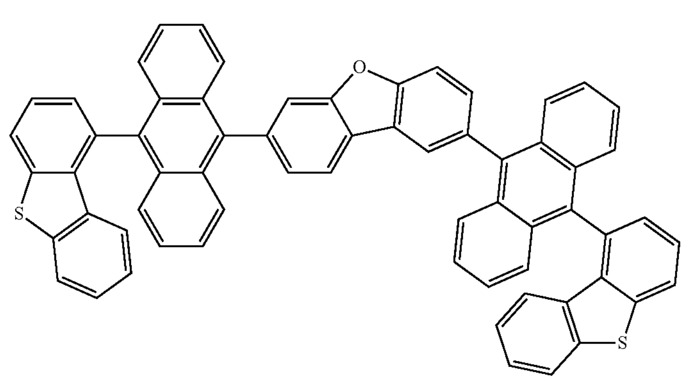

-continued
376
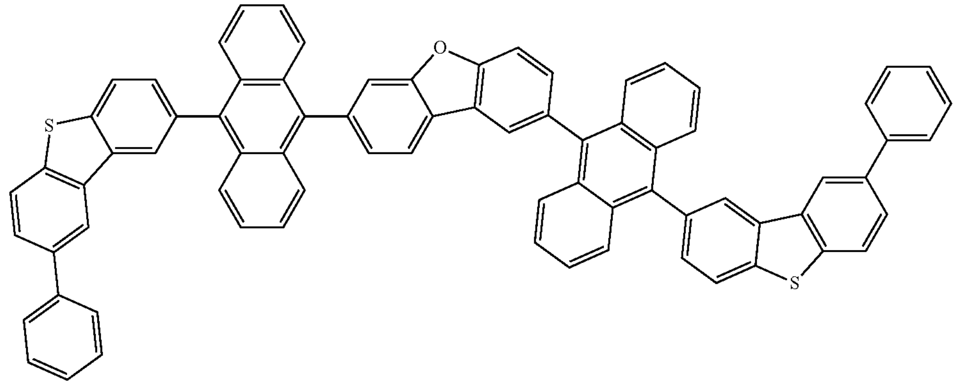
377
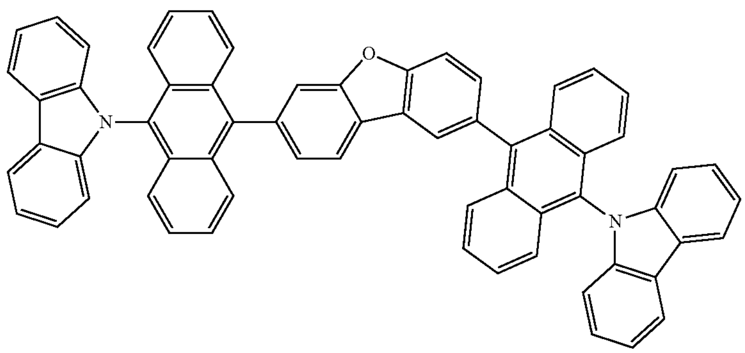
378
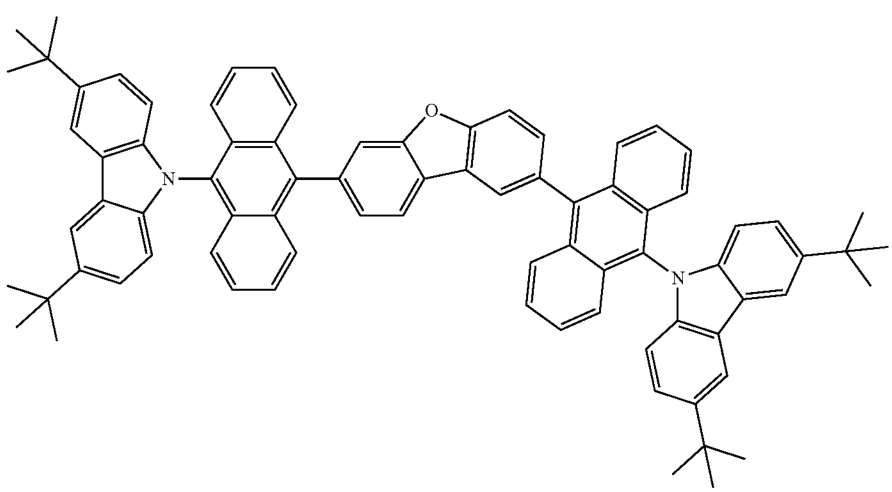

-continued
379
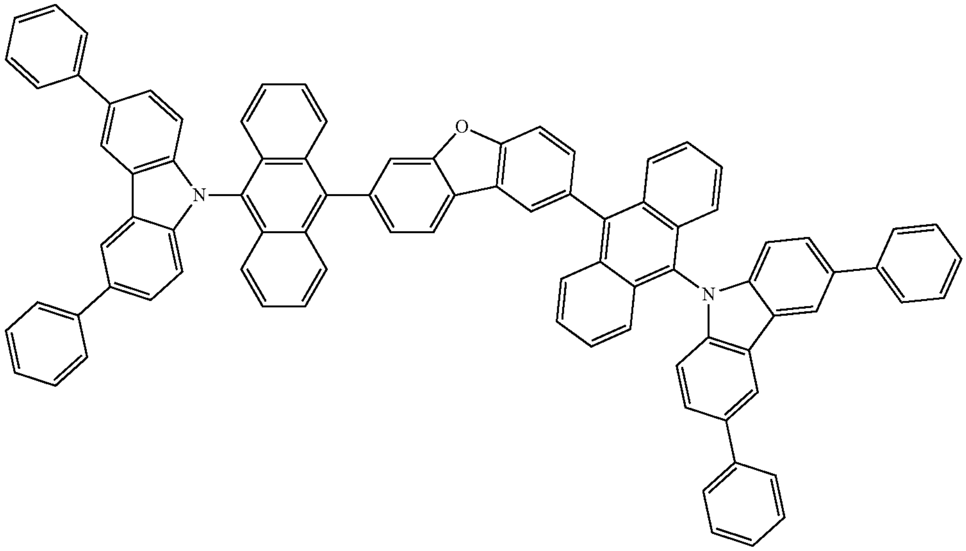
380
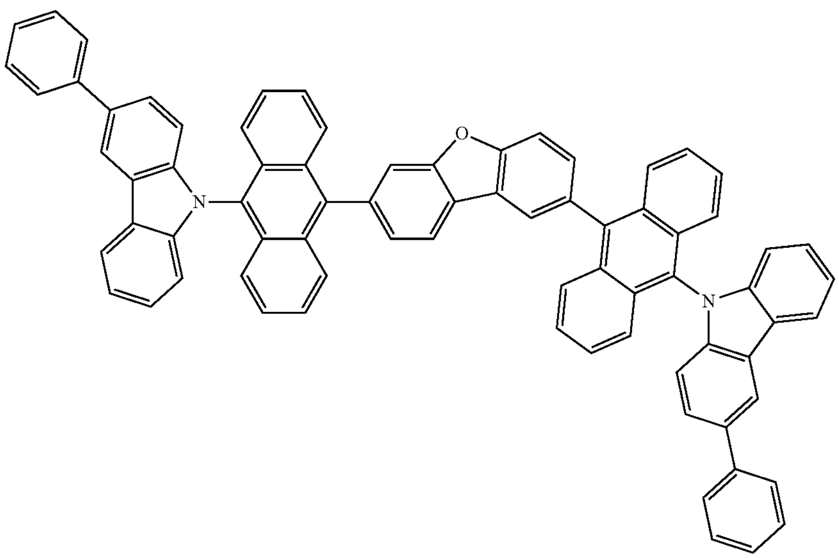
381
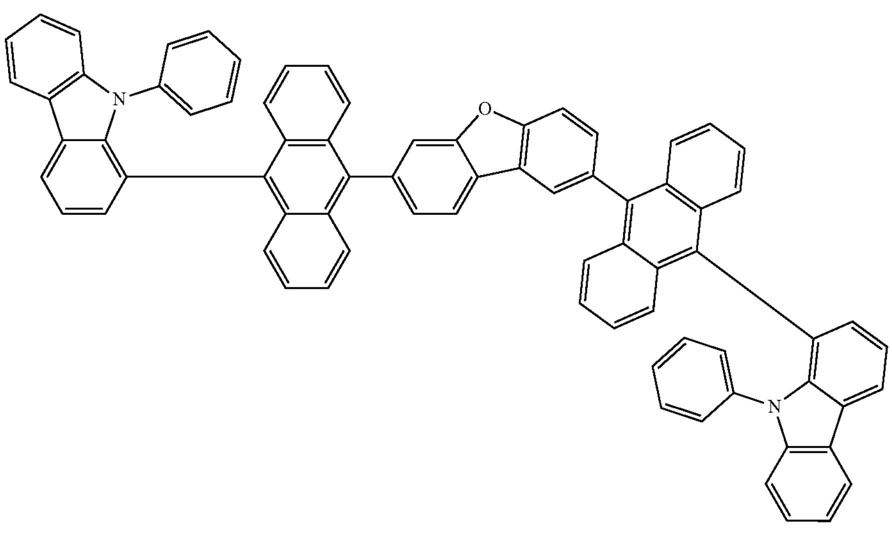

-continued
382
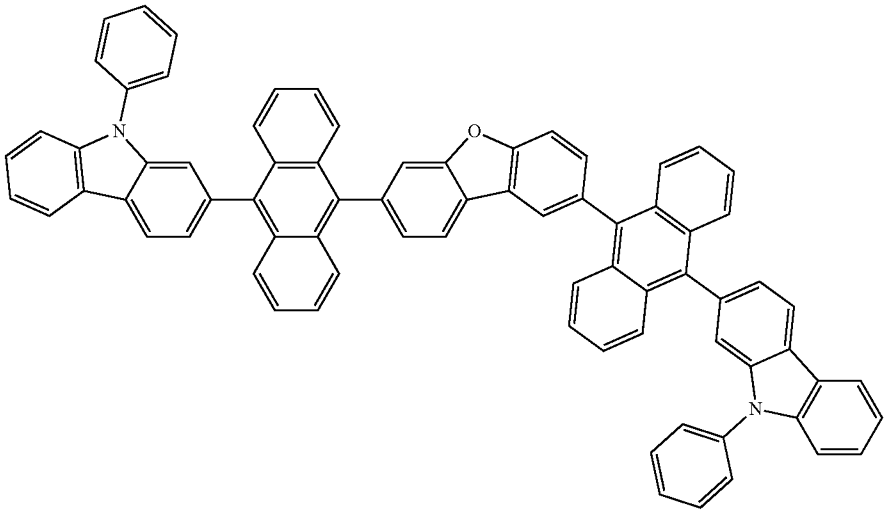
383
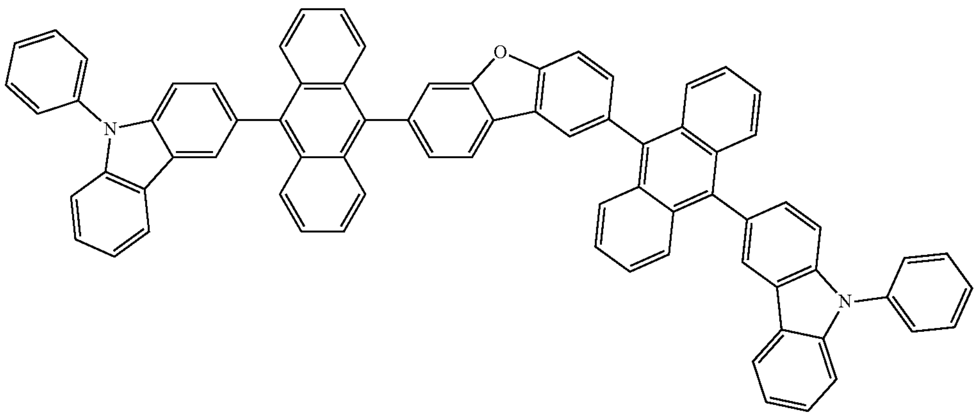
384
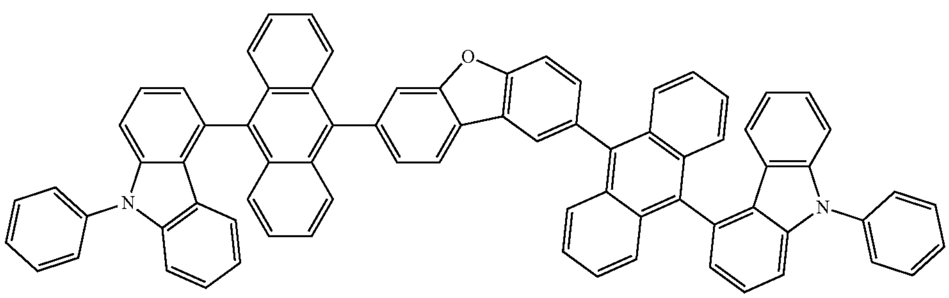
385
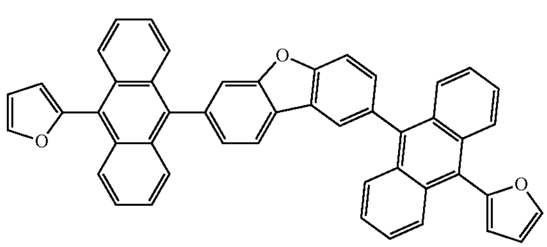
386
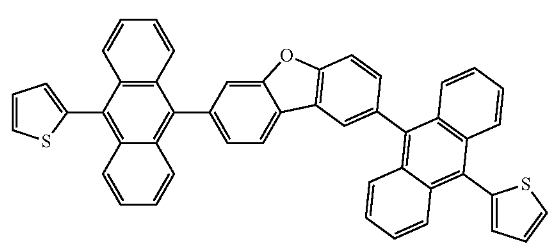

-continued
387
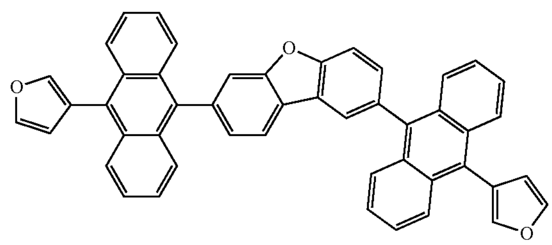
388
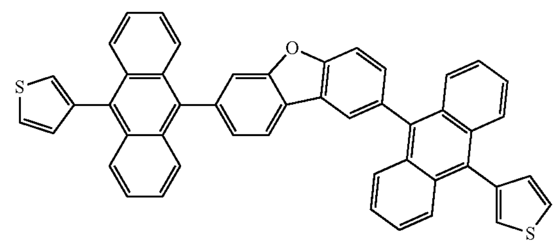
389
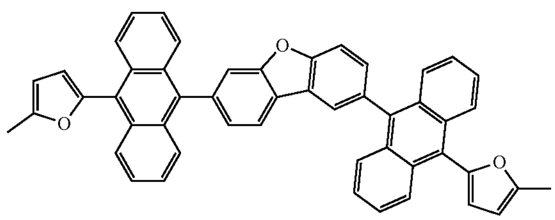
390
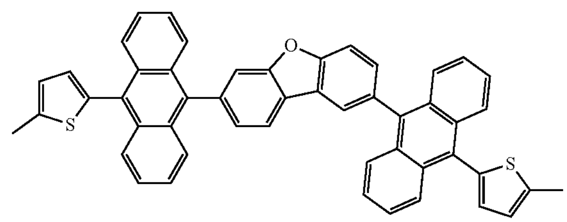
391
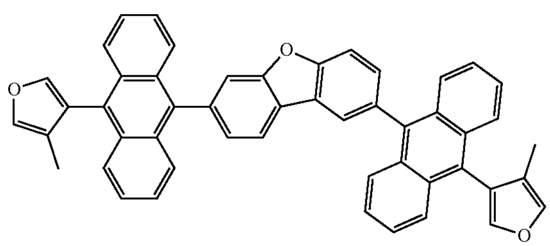
392
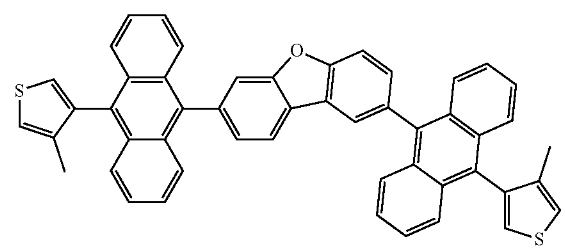
393
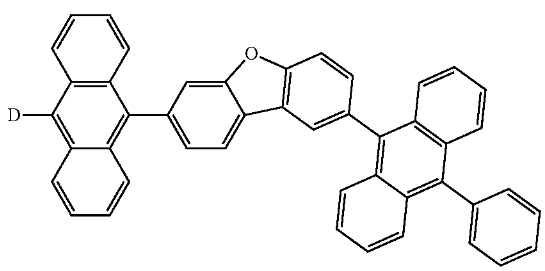
394
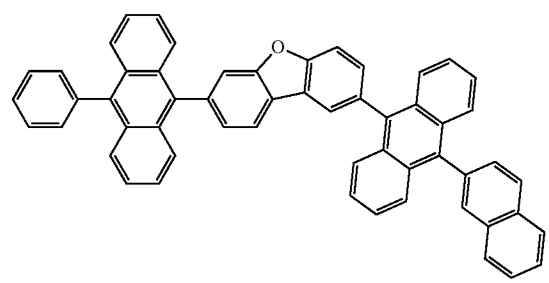
395
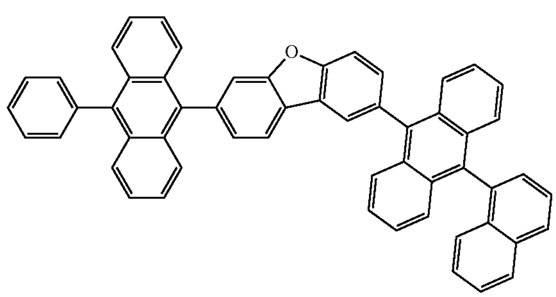
396
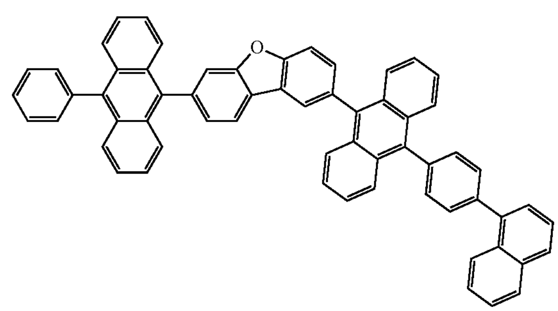

-continued
397
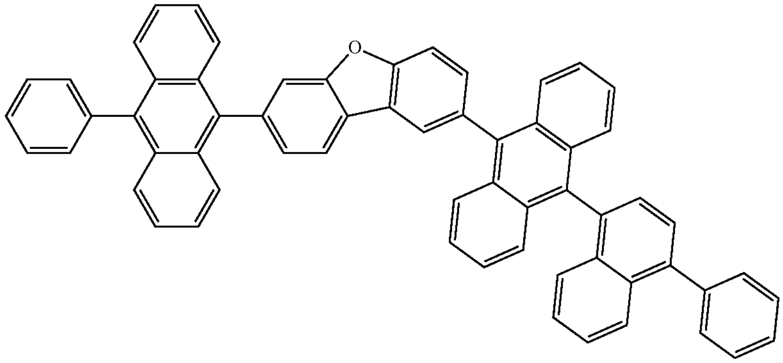
398
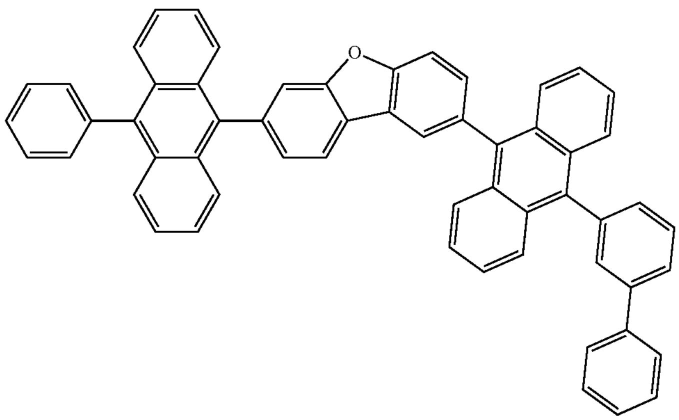
399
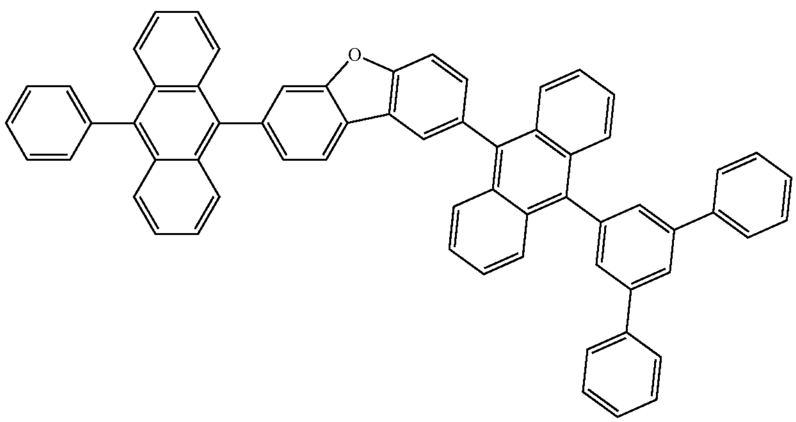
400
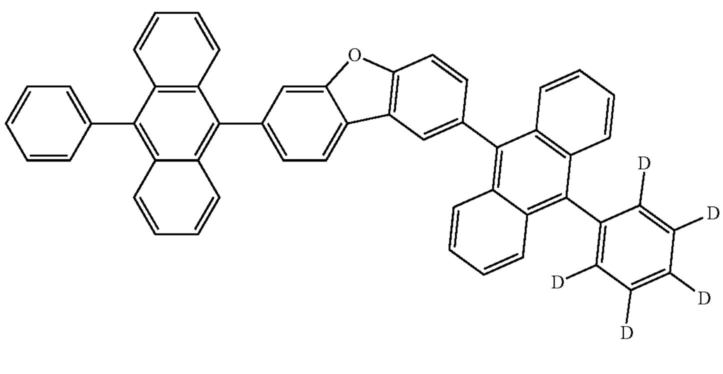

401
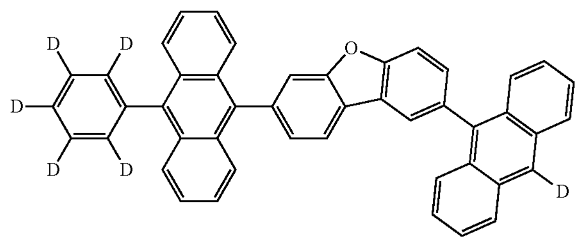
402
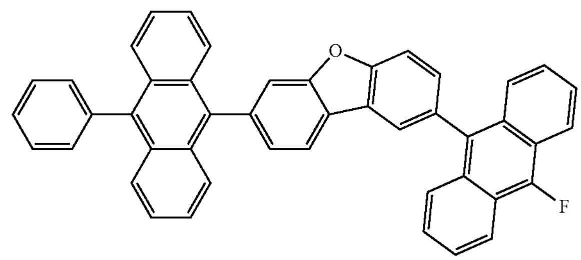
403
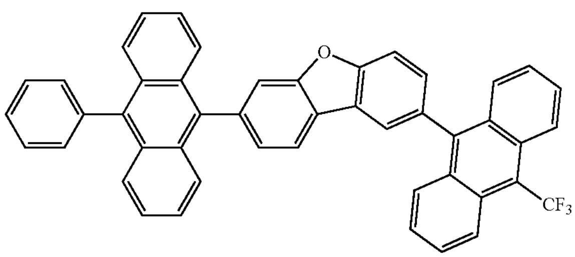
404
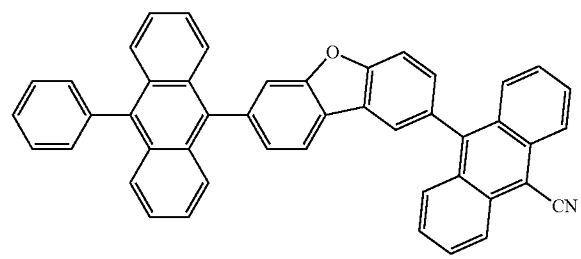
405
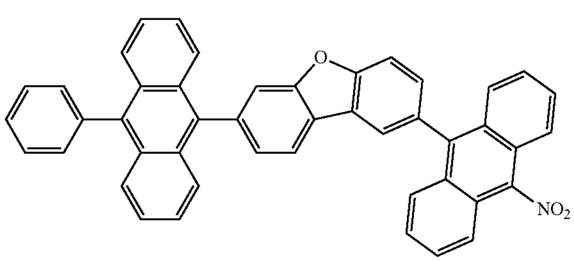
406
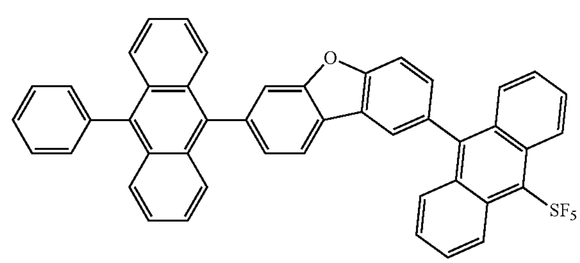
407
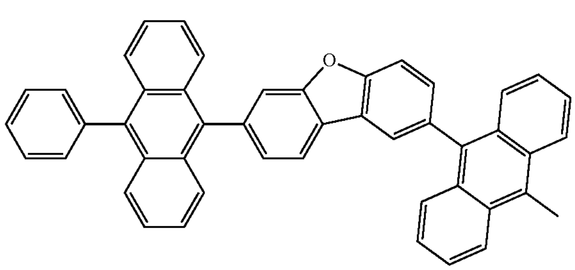
408
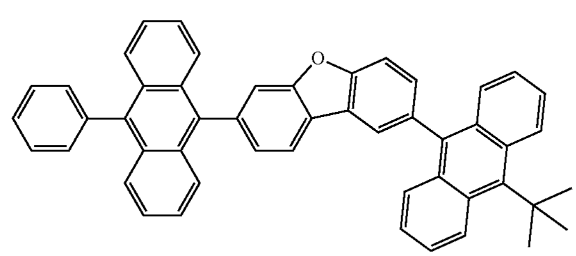
409
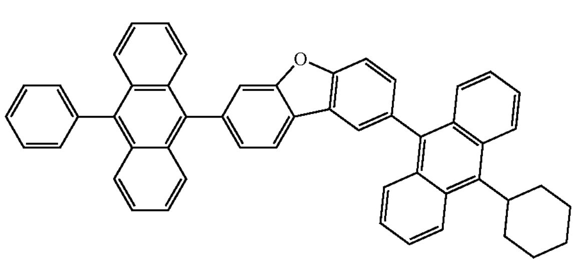
410
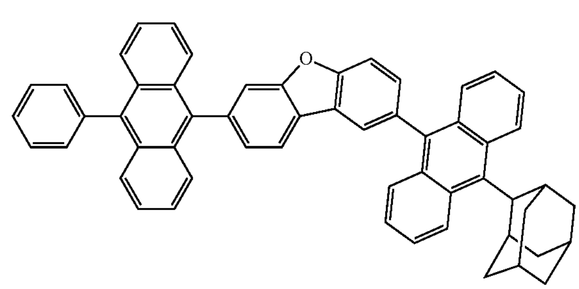

-continued
411
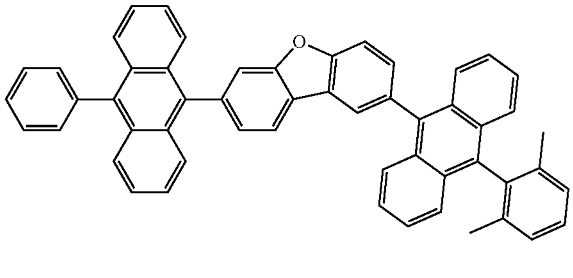
412
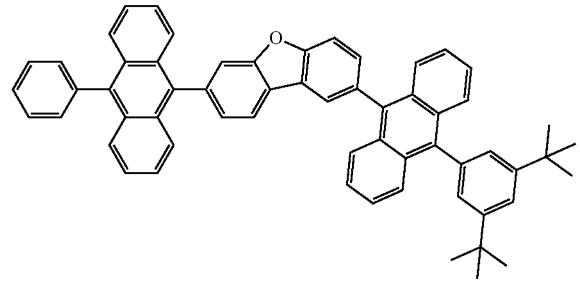
413
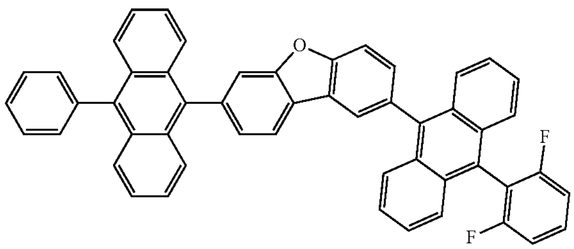
414
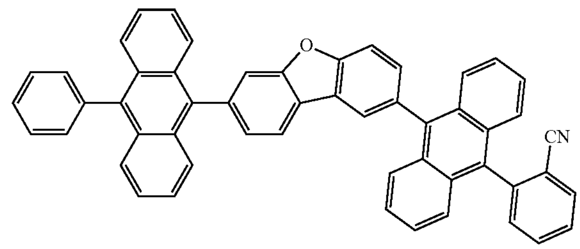
415
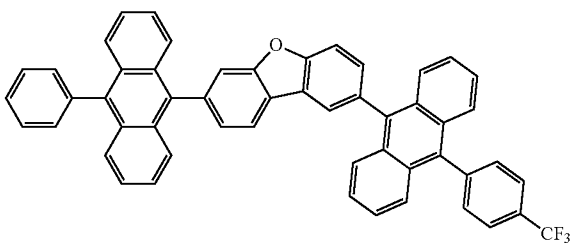
416
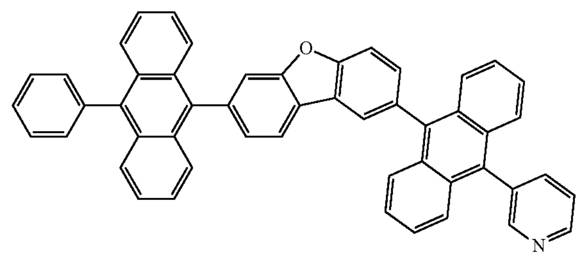
417
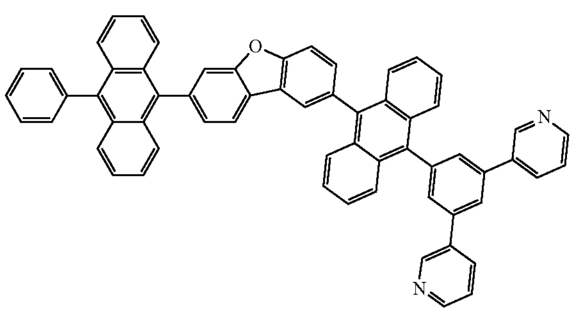
418
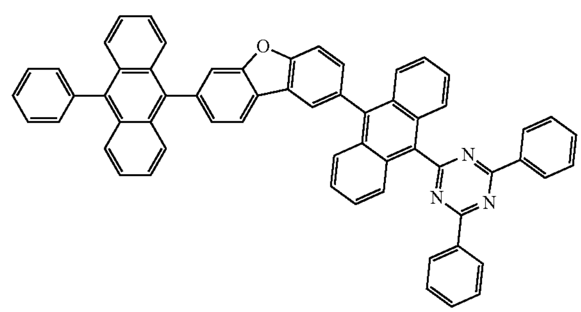
419
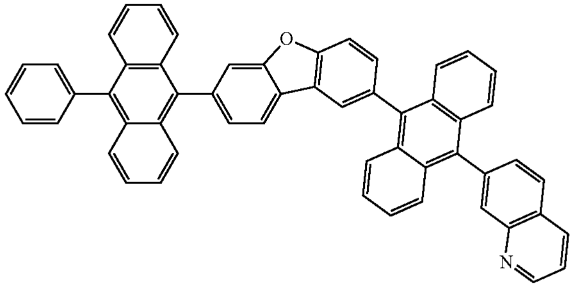
420
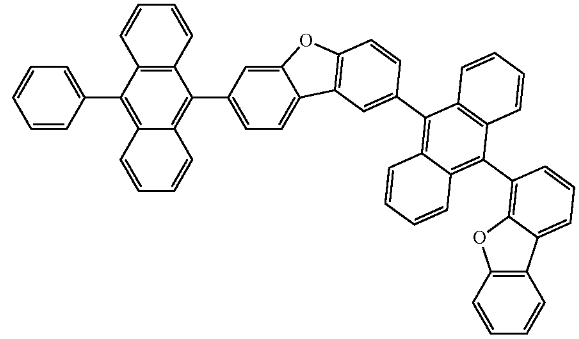

-continued
421
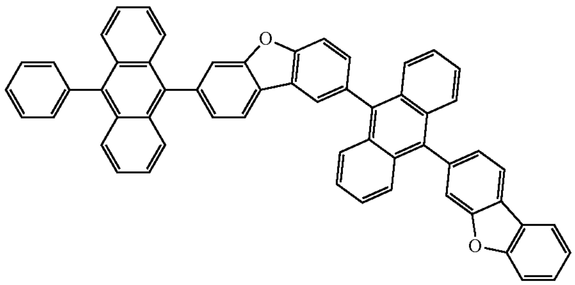
422
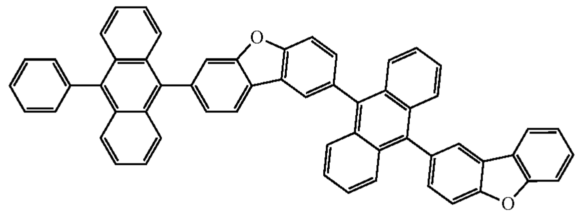
423
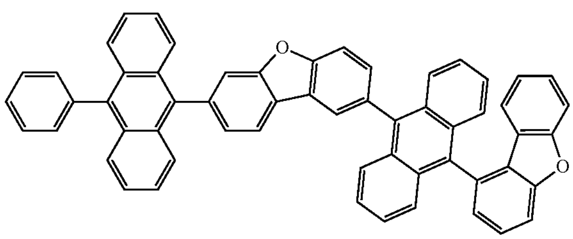
424
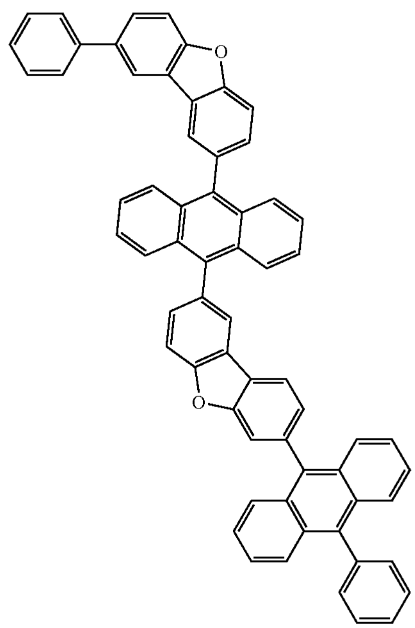
425
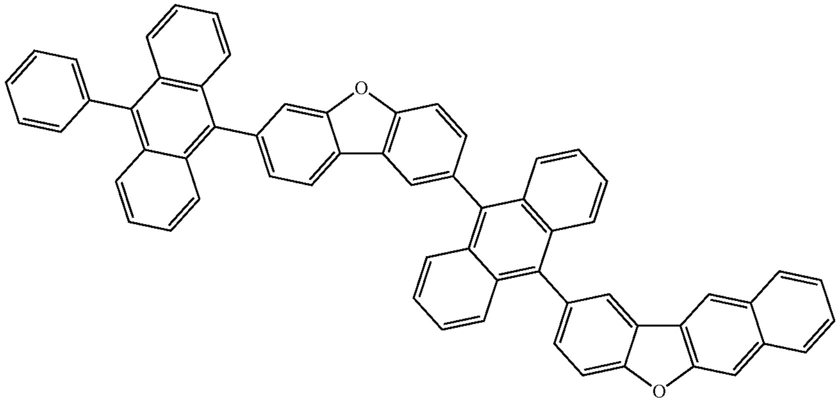

-continued
426
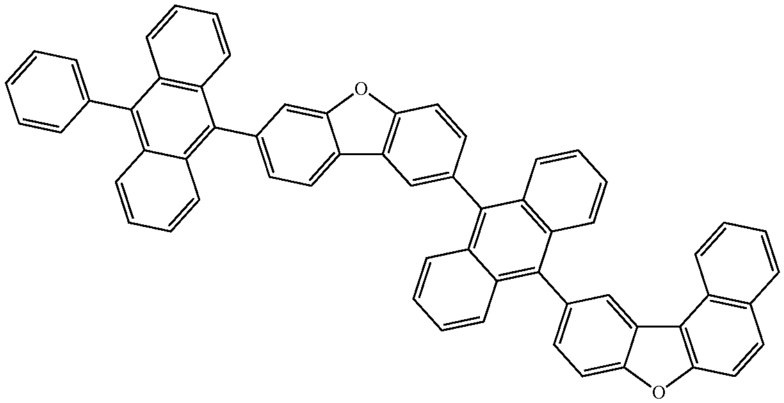
427
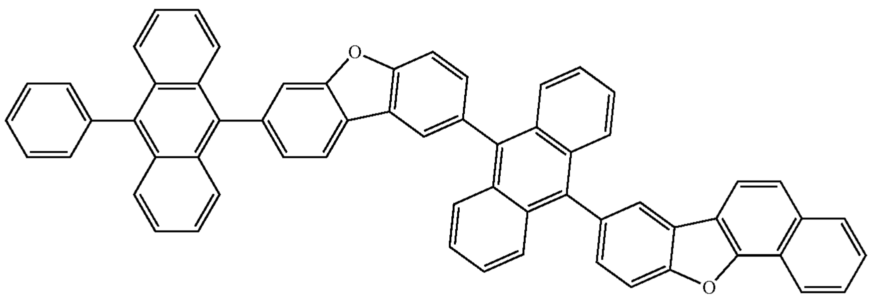
428
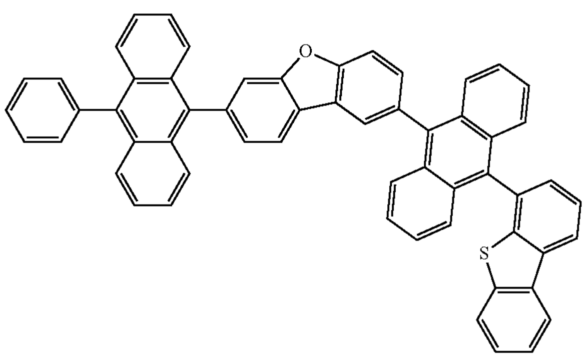
429
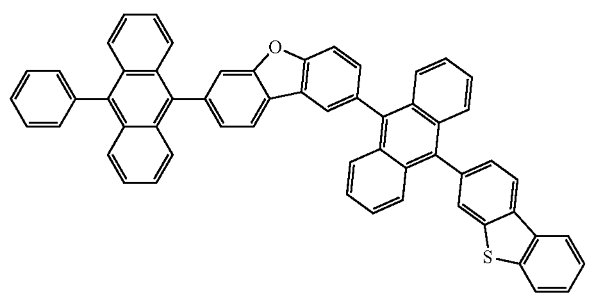
430
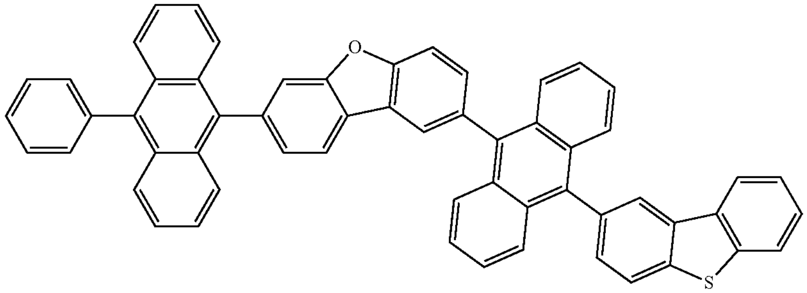

-continued
431
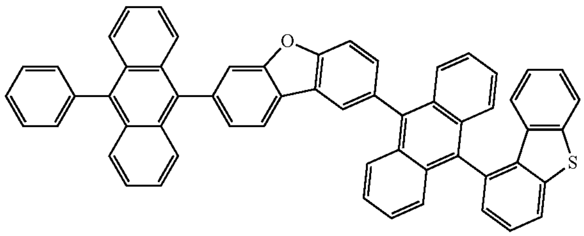
432
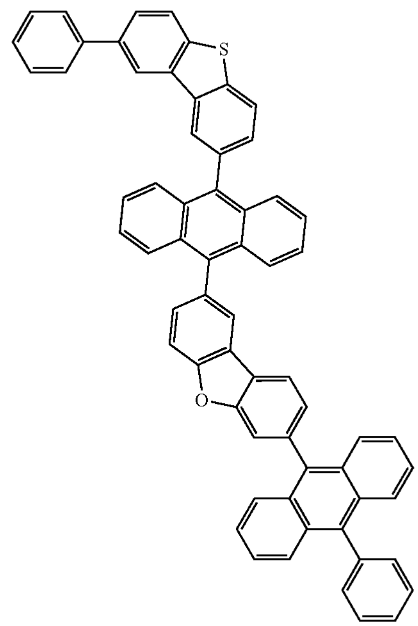
433
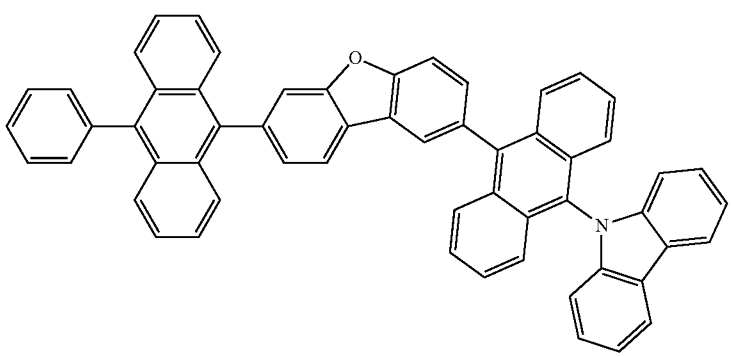
434
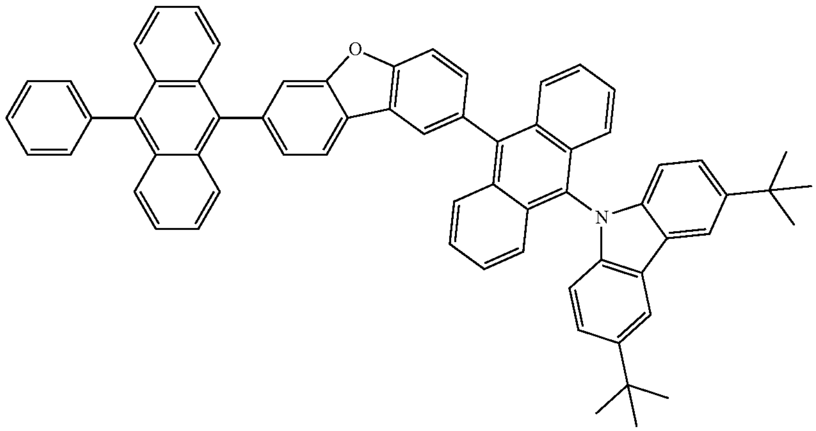

-continued
435
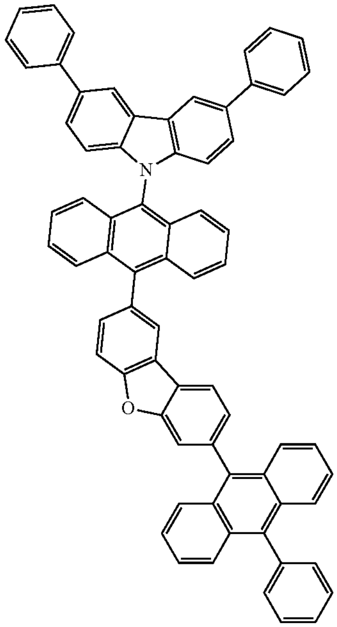
436
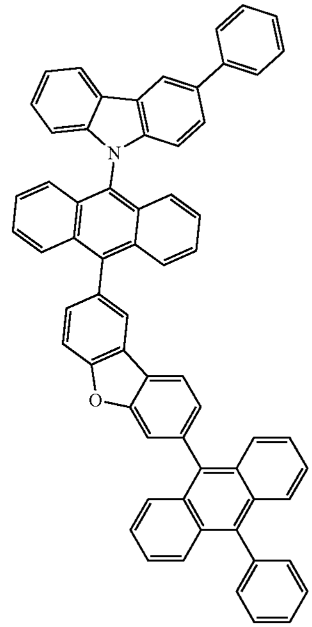
437
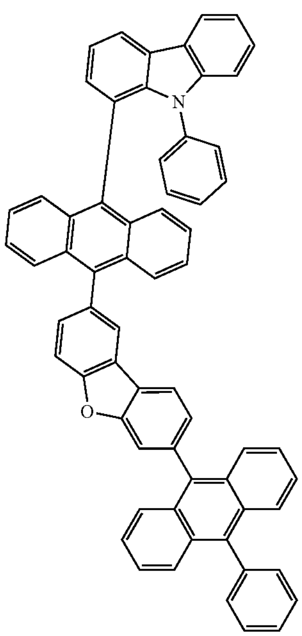
438
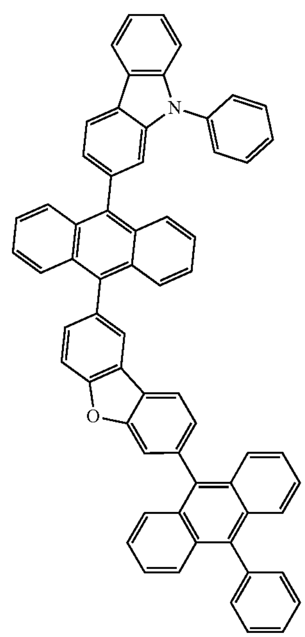

-continued
439
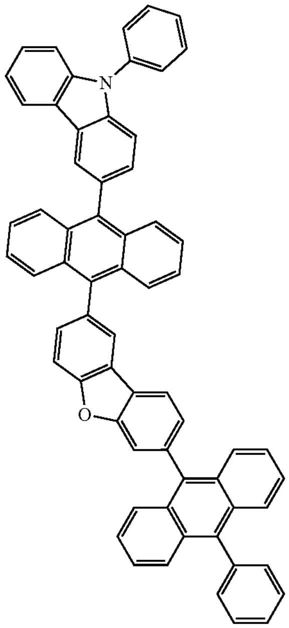
440
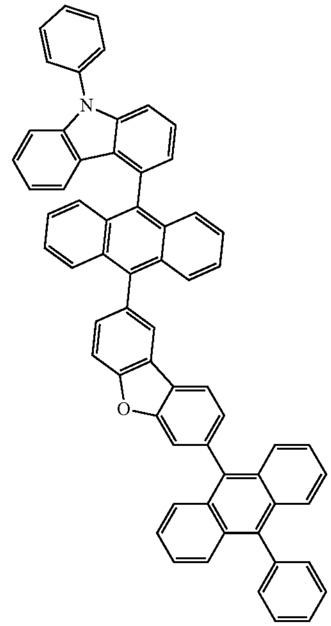
441
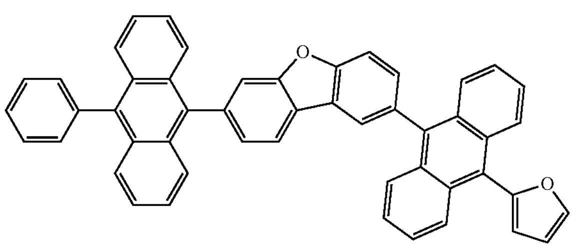
442
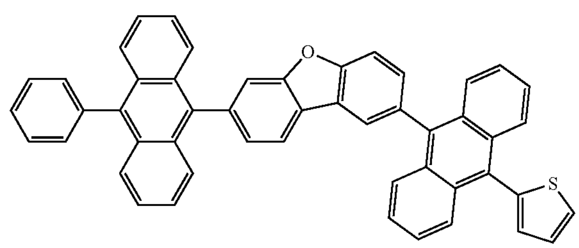
443
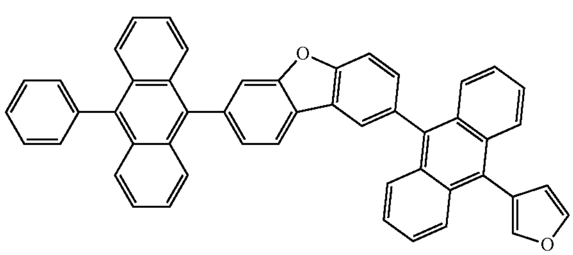
444
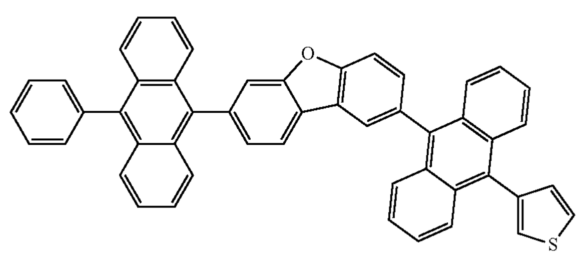
445
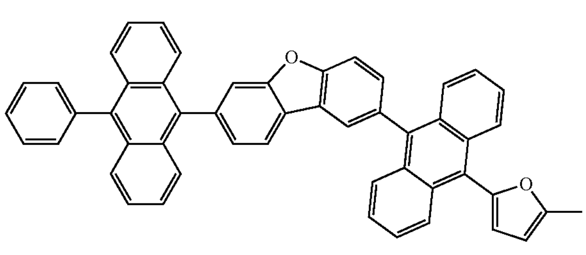
446
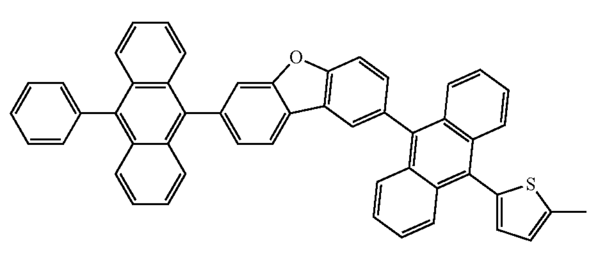

-continued
447
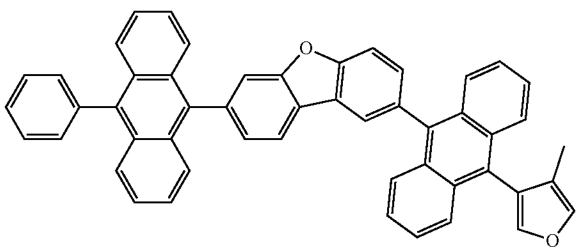
448
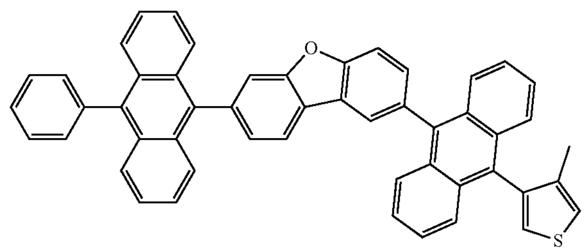
449
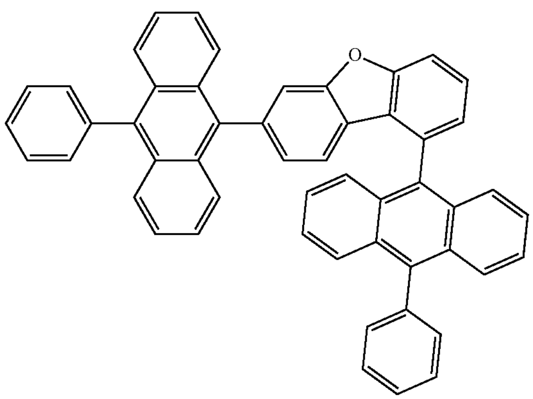
450
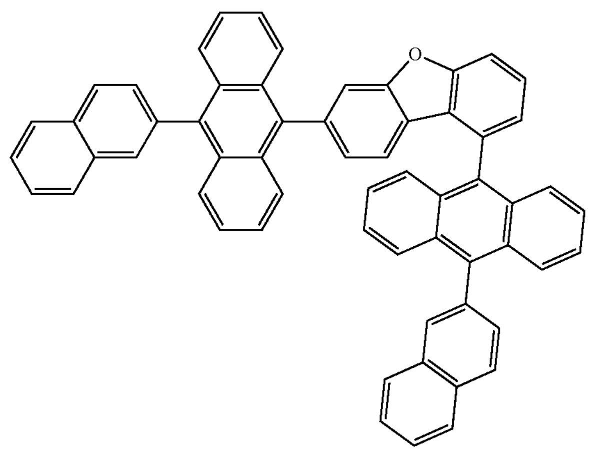
451
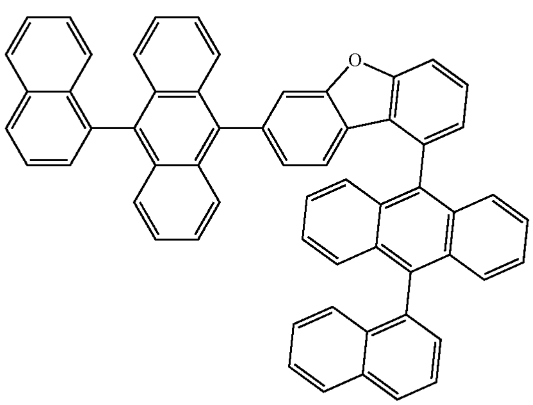
452
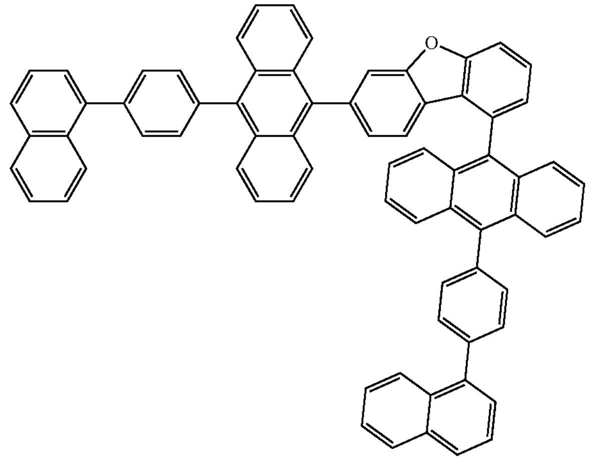

-continued
453
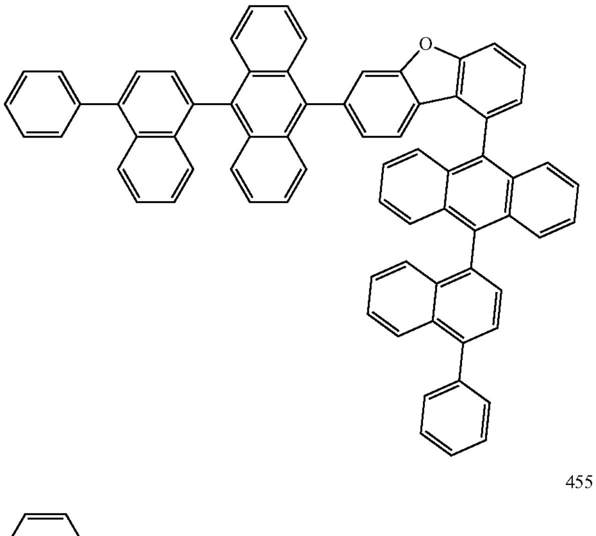
454
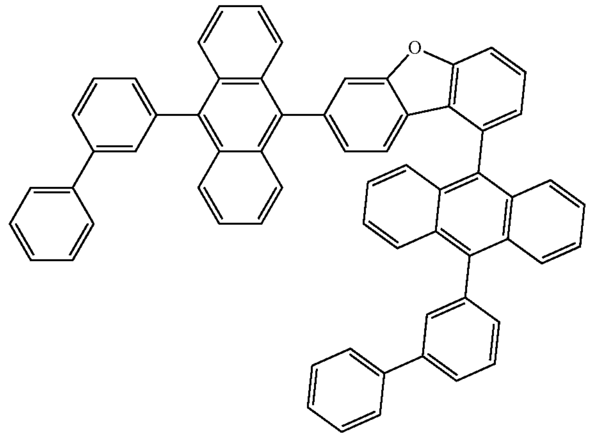
455
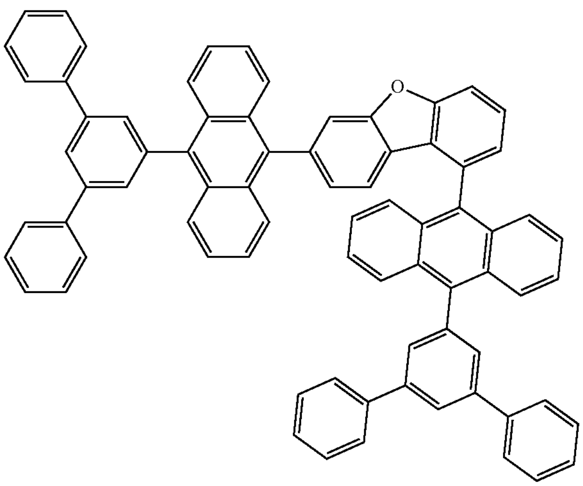
456
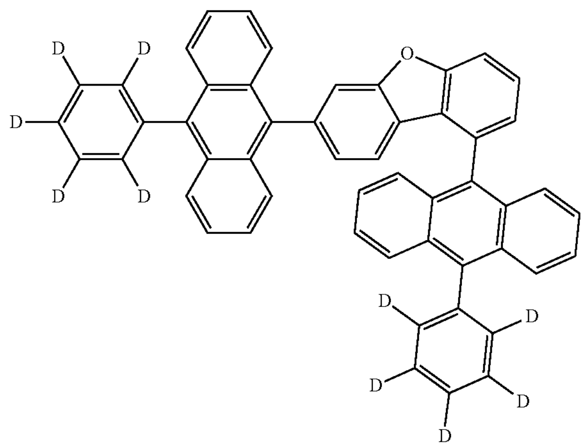
457
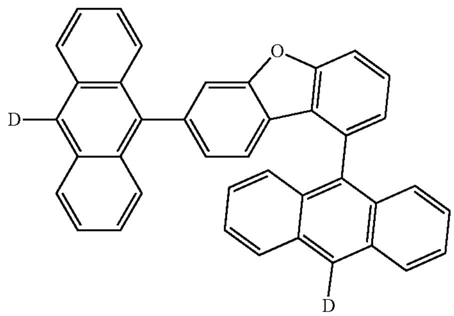
458
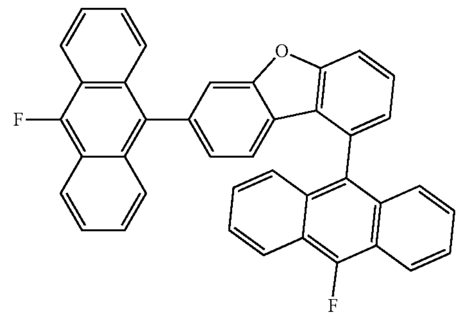
459
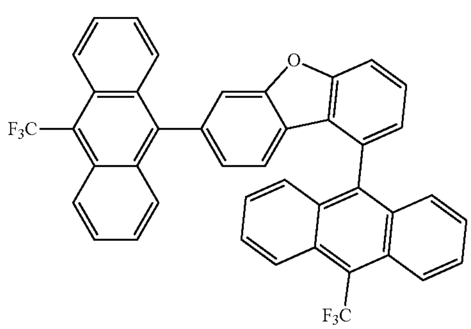
460
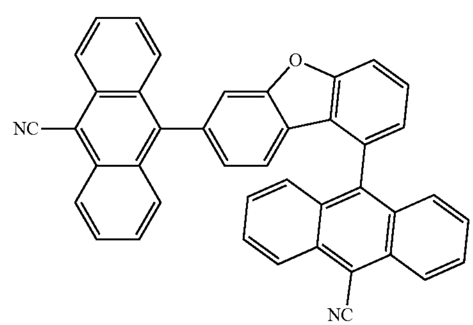

-continued
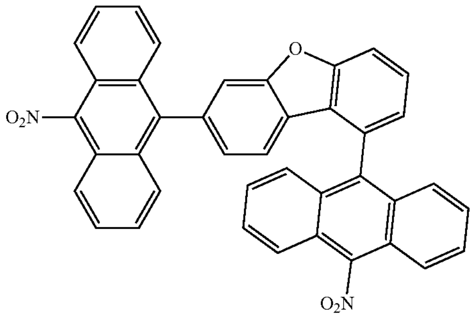
461
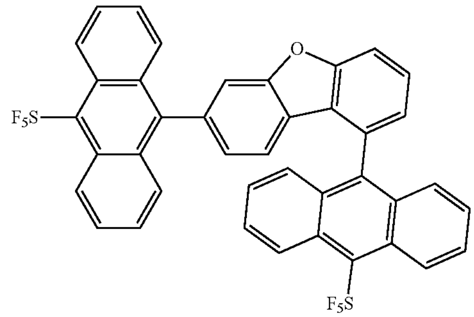
462
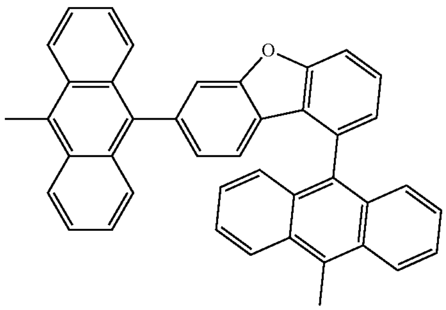
463
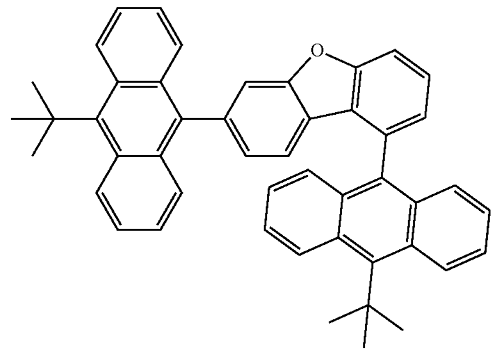
464
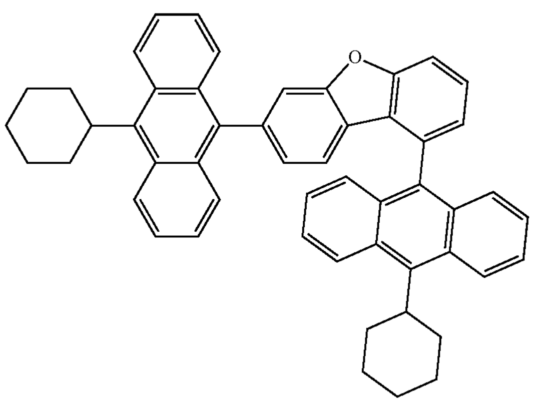
465
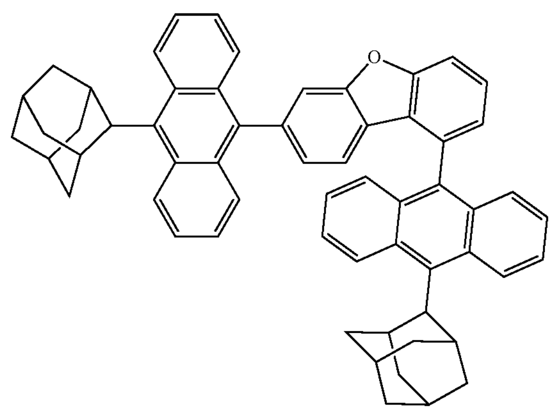
466
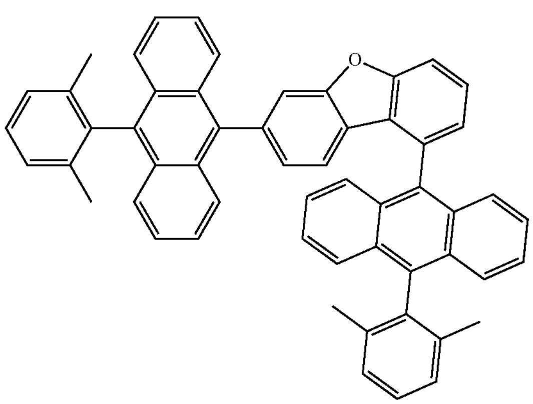
467
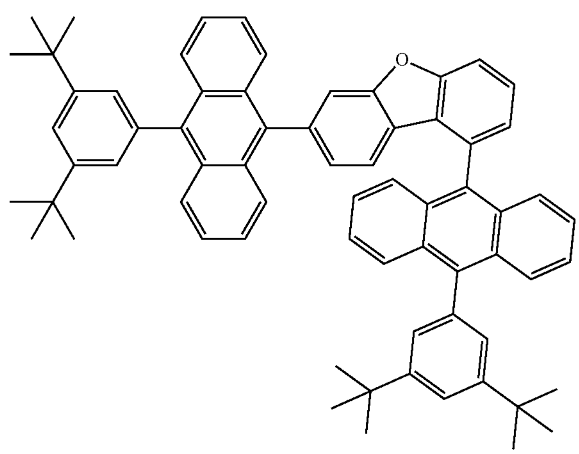
468

-continued
469
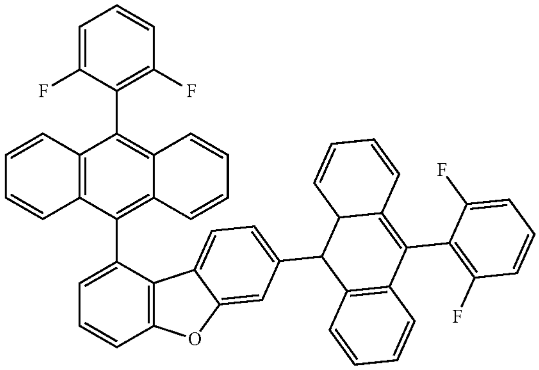
470
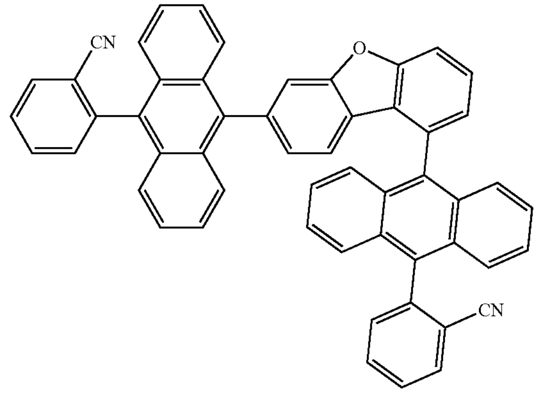
471
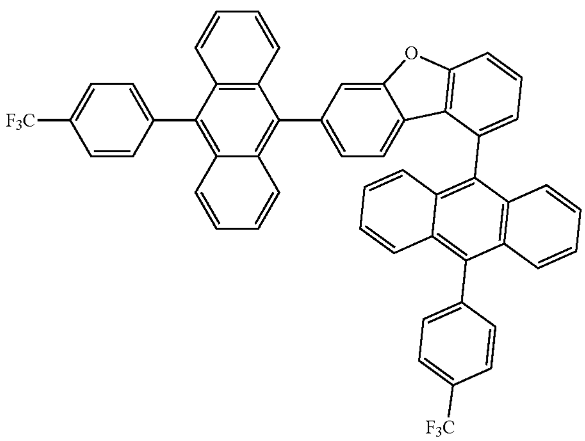
472
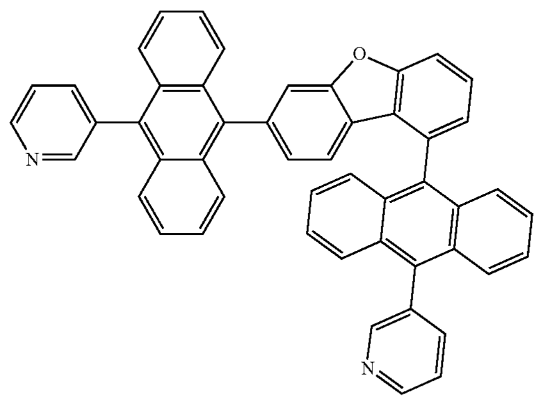
473
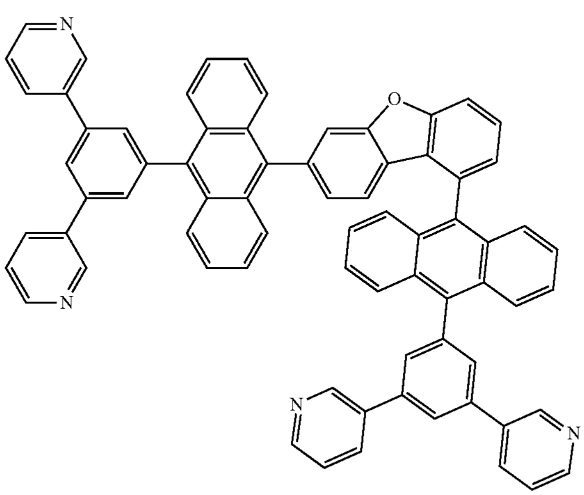
474
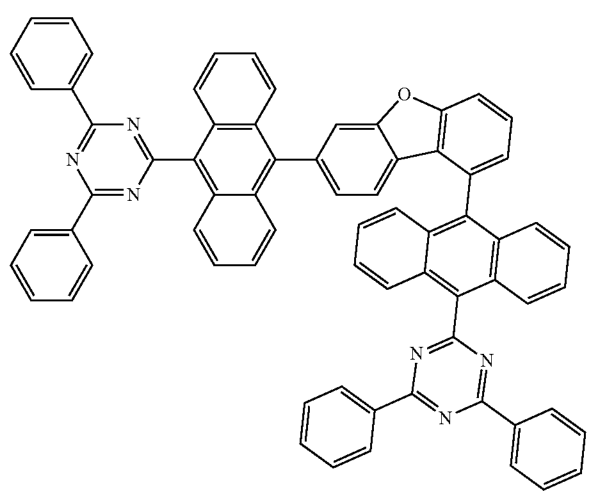

-continued
475
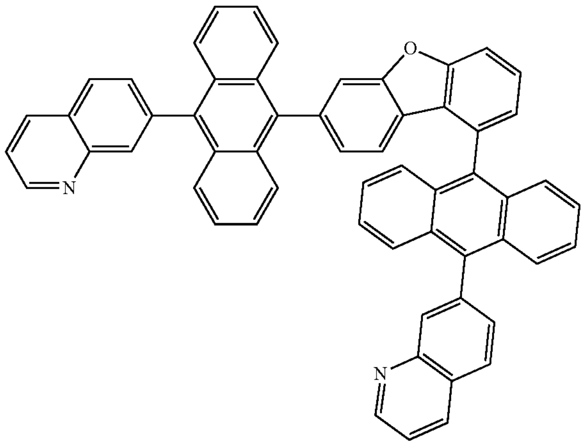
476
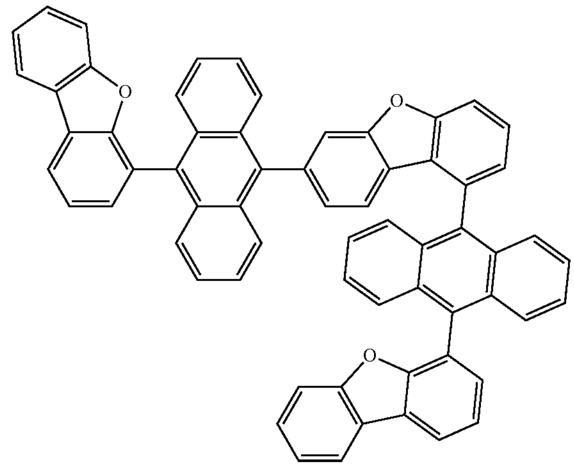
477
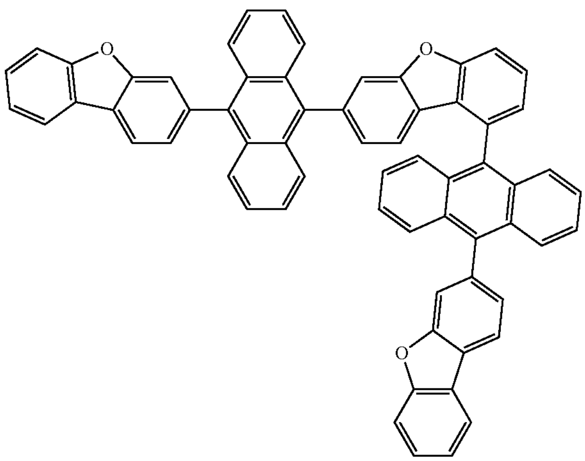
478
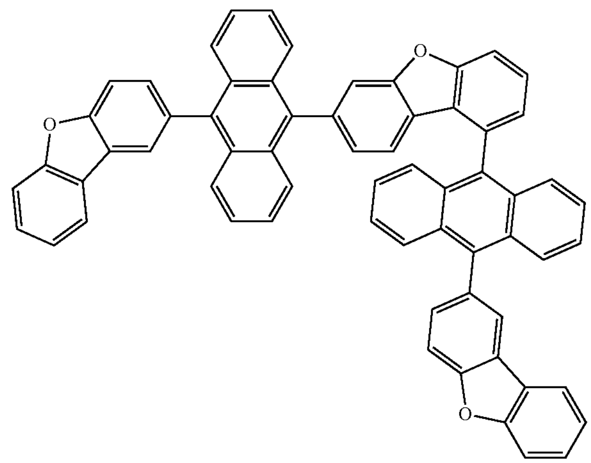
479
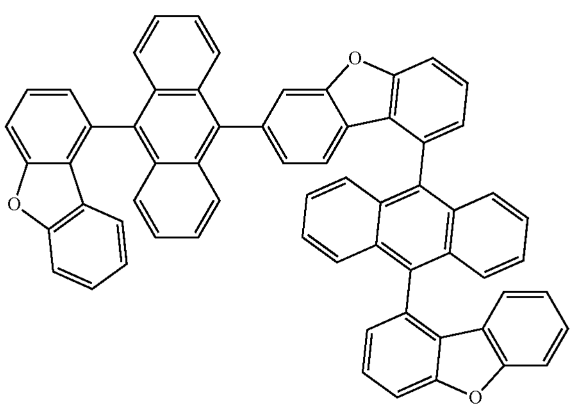
480
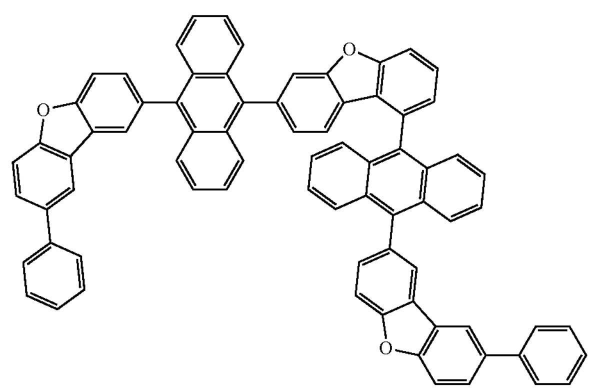

-continued
481
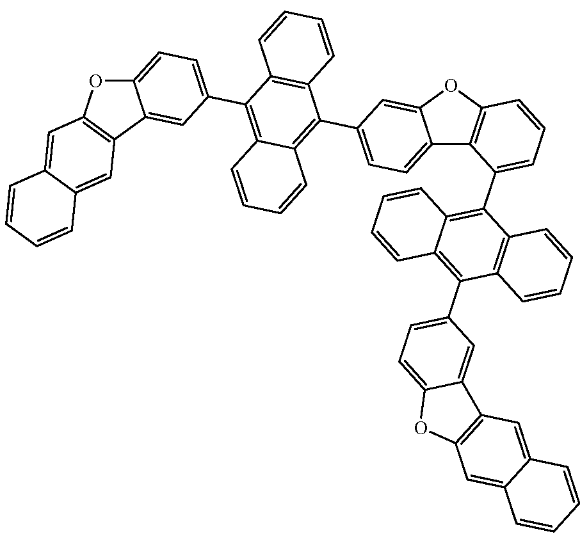
482
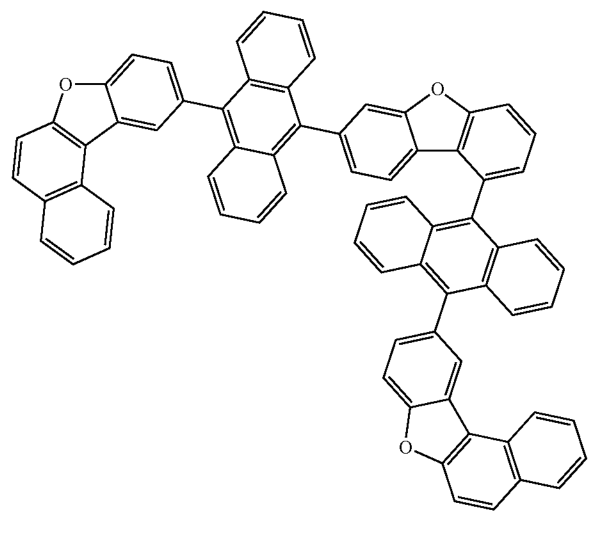
483
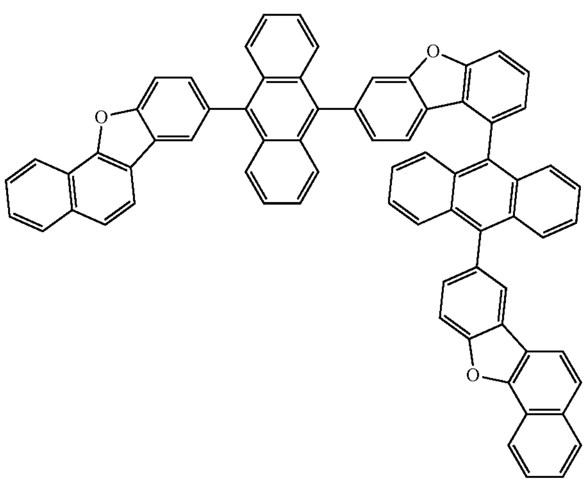
484
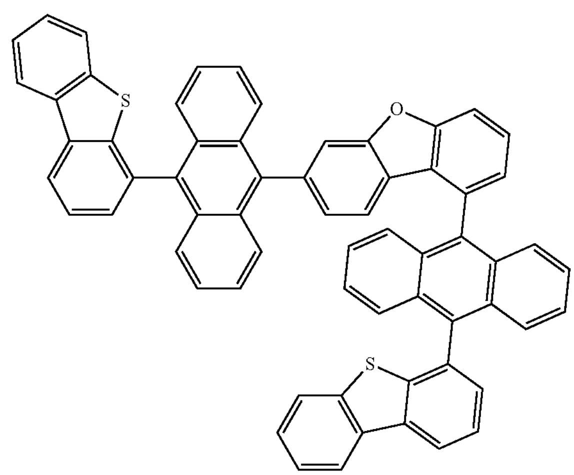
485
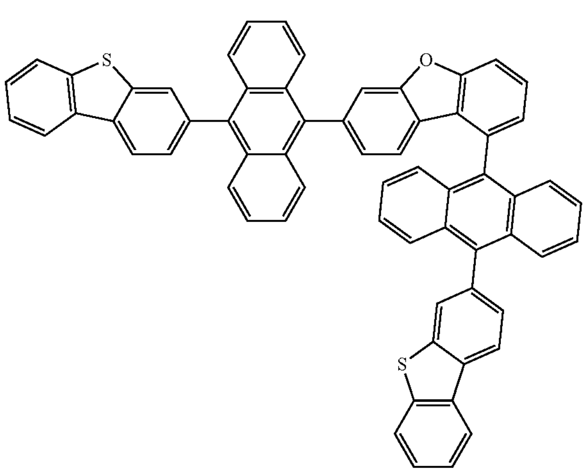
486
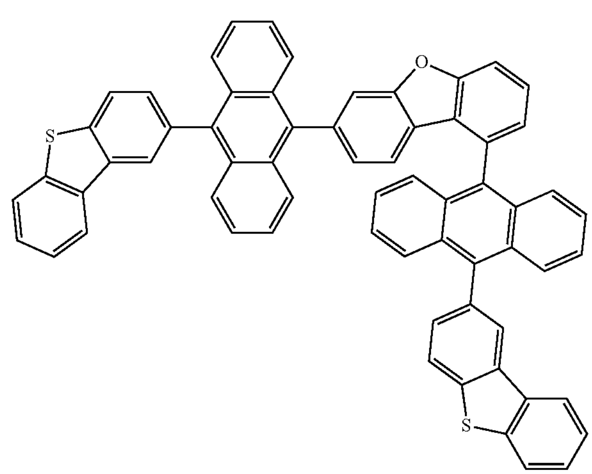

-continued
487
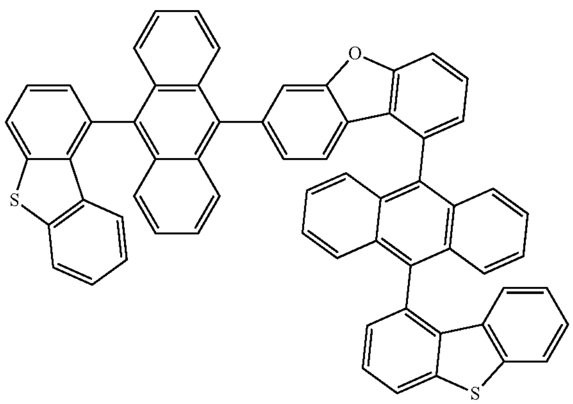
488
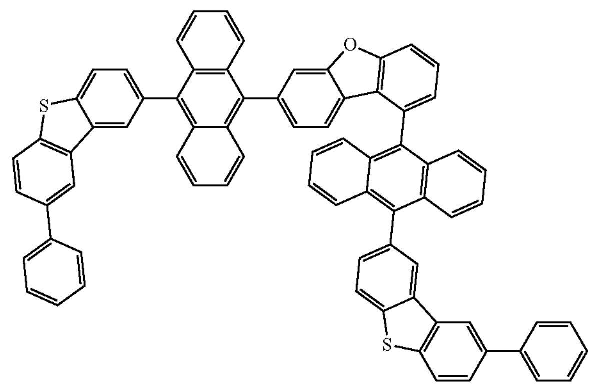
489
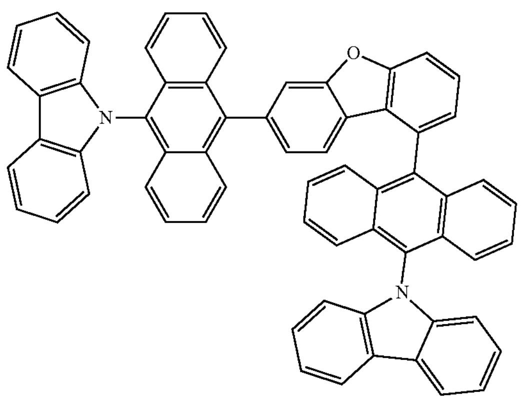
490
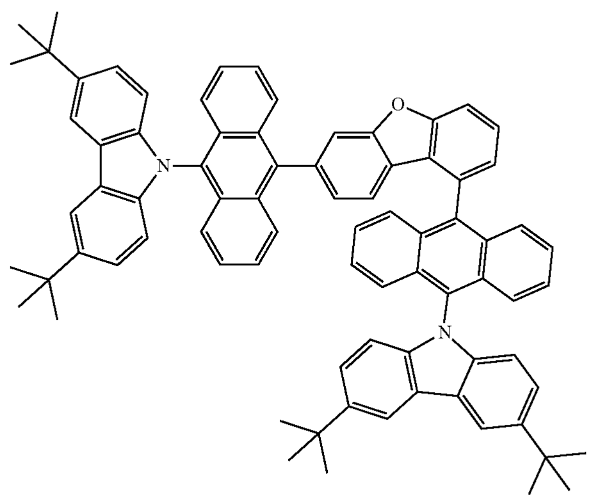
491
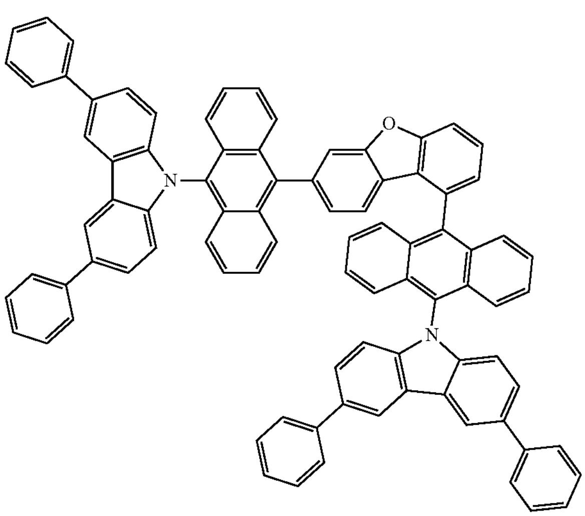
492
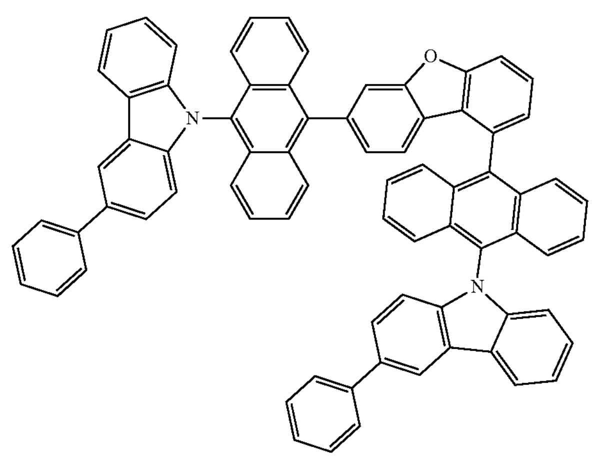

-continued
493
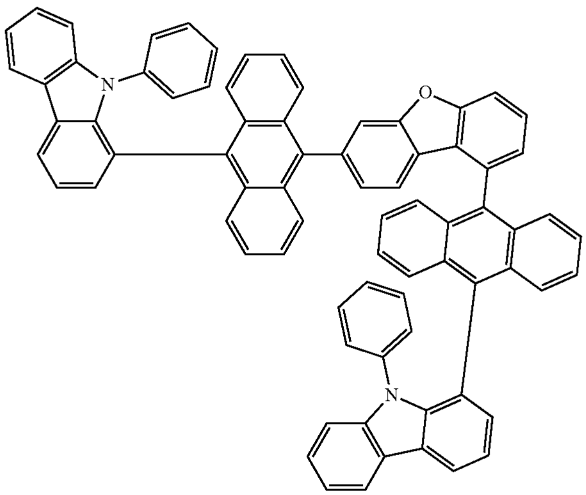
494
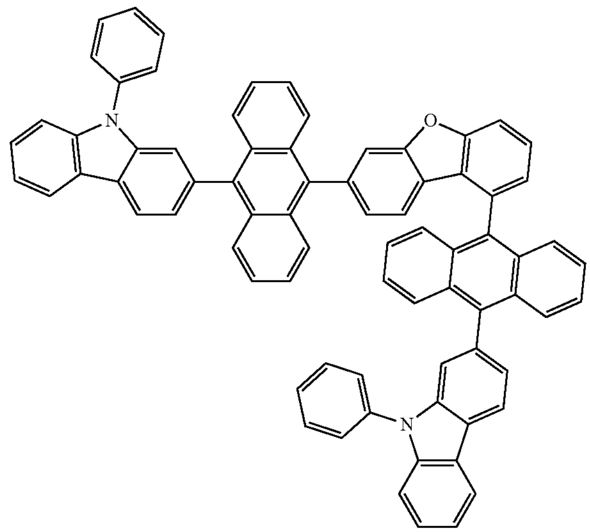
495
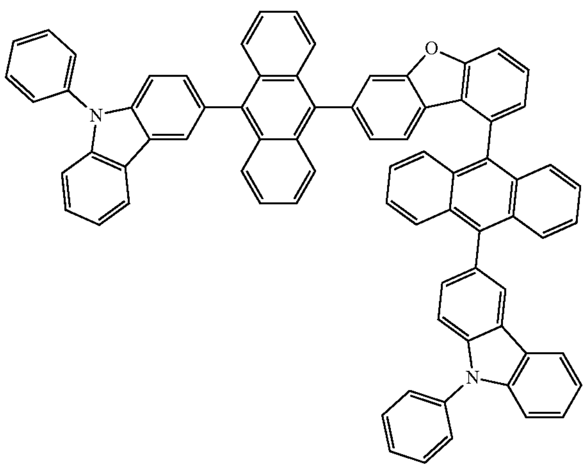
496
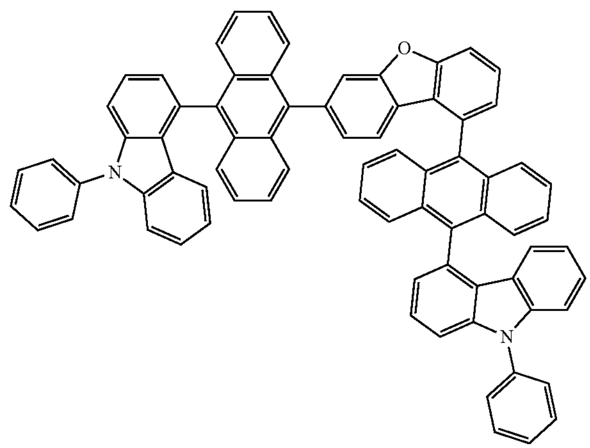
497
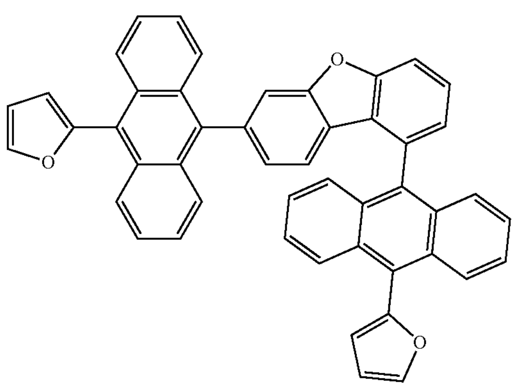
498
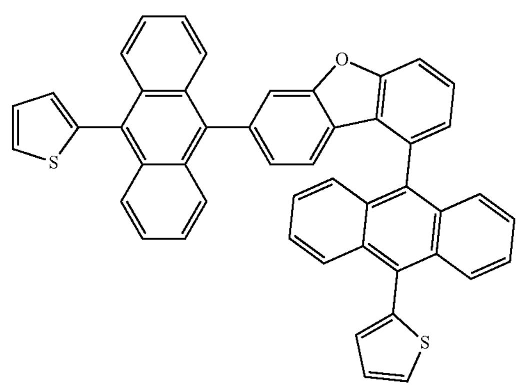

-continued
499
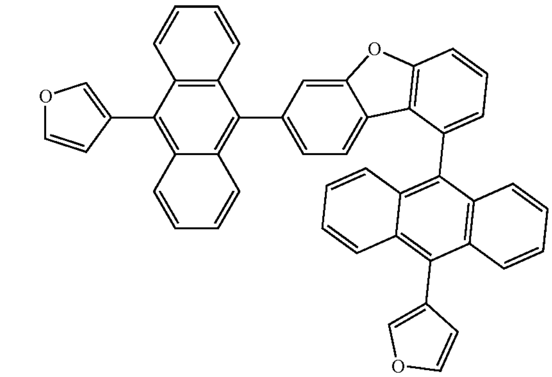
501
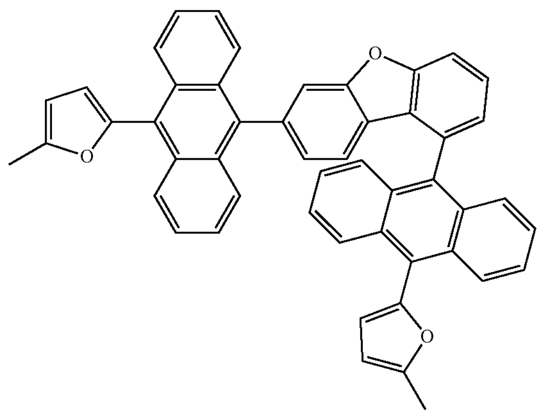
502
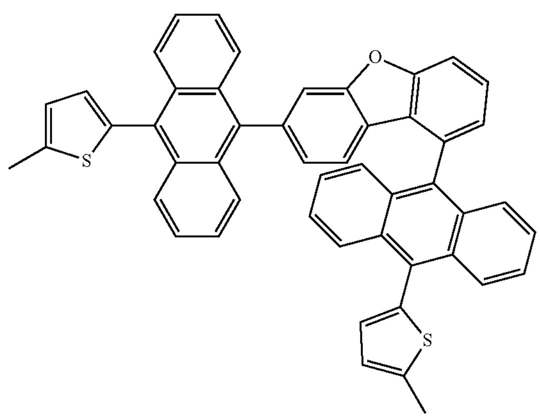
500
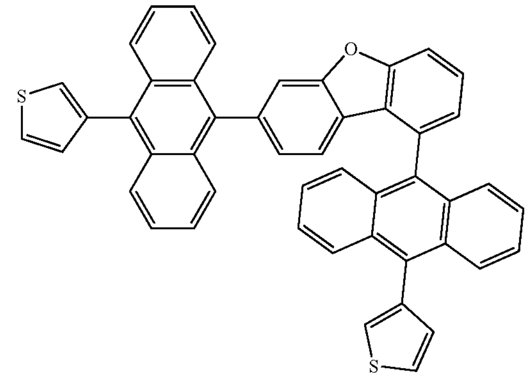
-continued
503
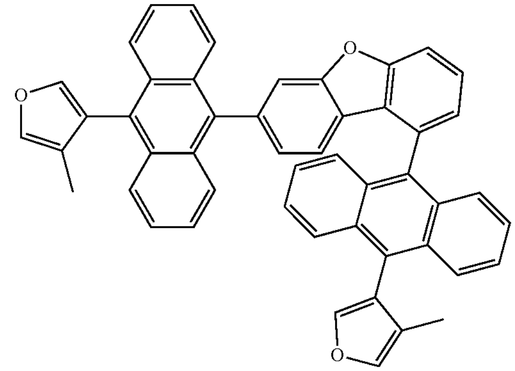
504
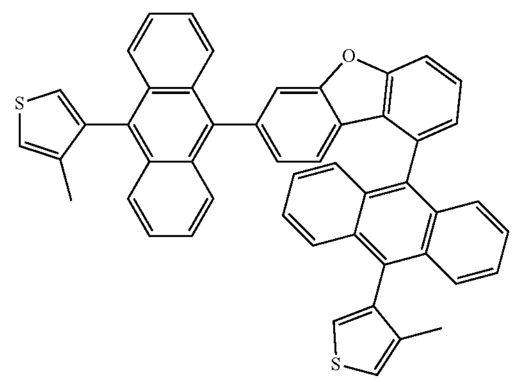
505
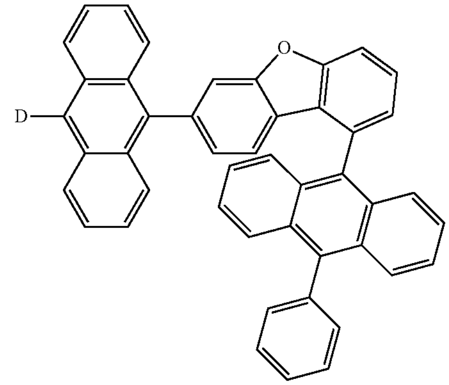

-continued
506
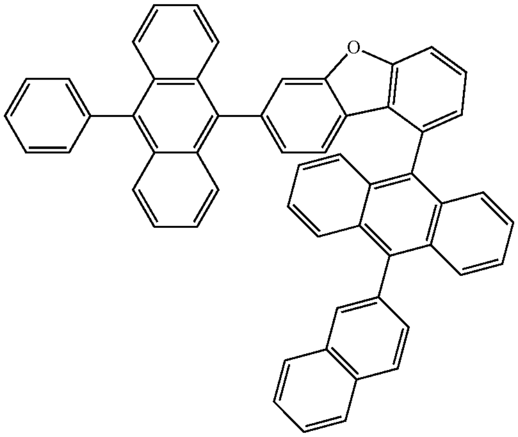
507
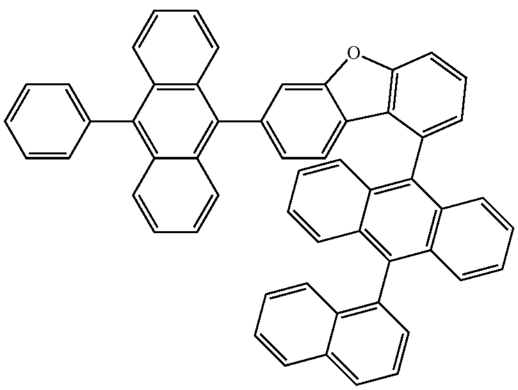
508
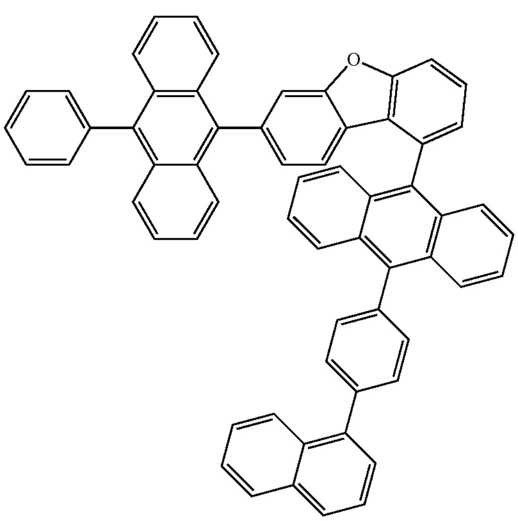
-continued
509
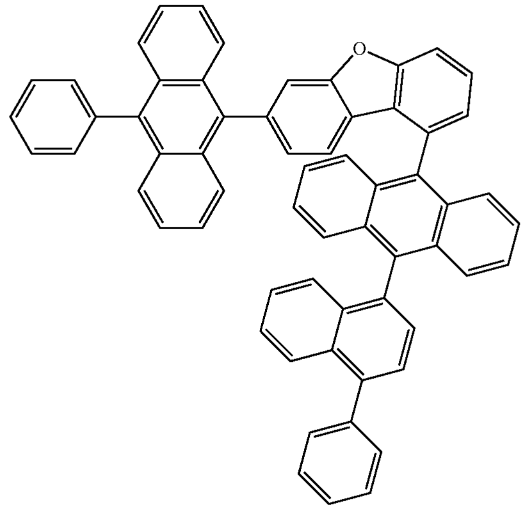
510
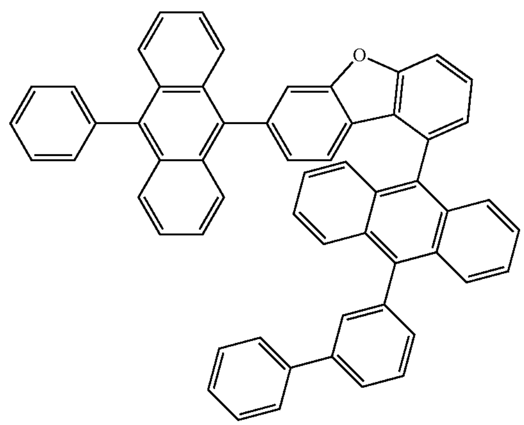
511
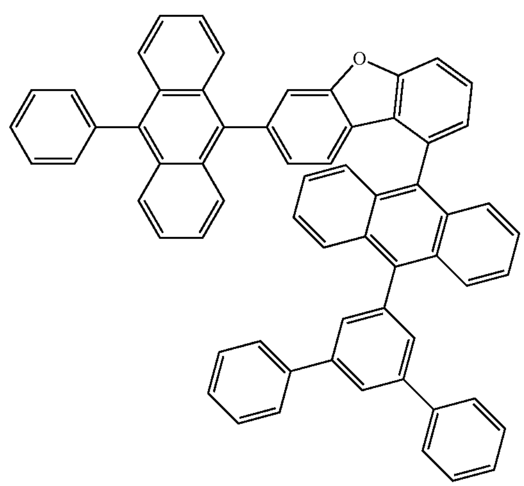

-continued
512
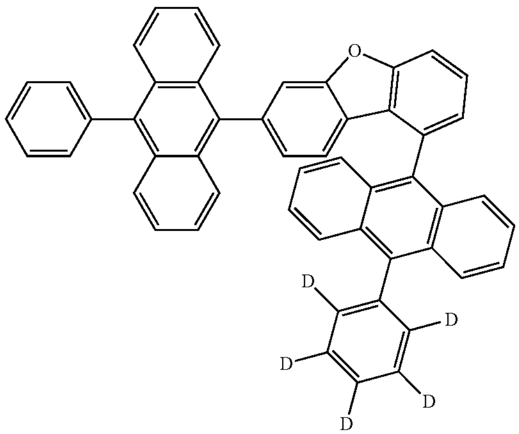
513
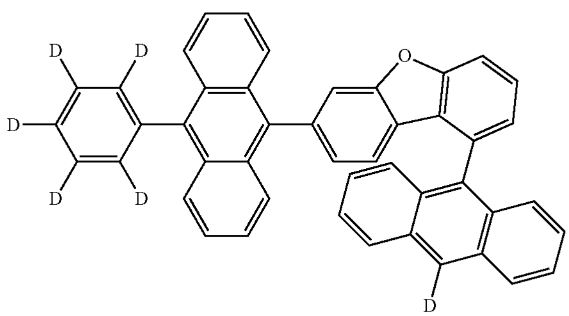
514
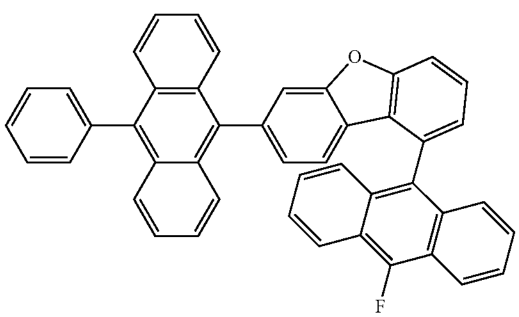
515
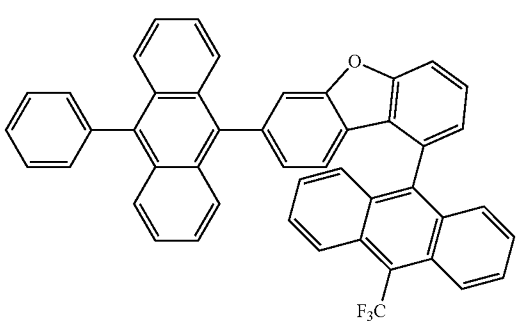
-continued
516
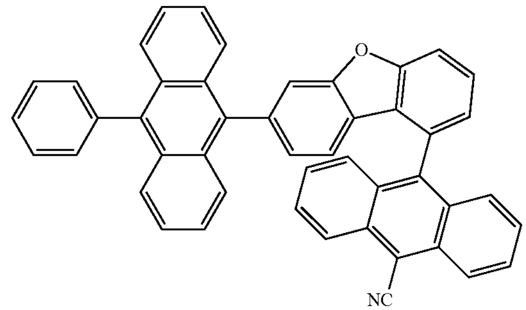
517
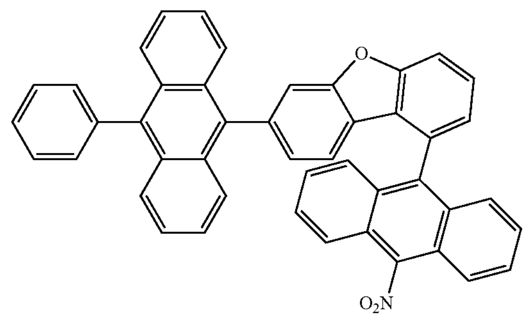
518
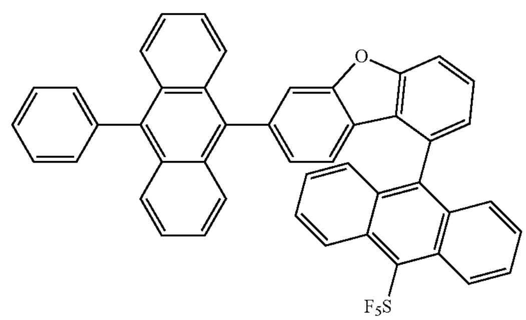
519
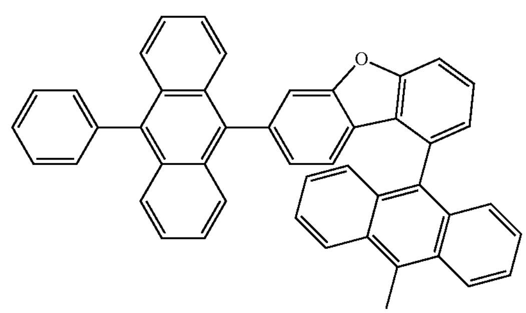

-continued
520
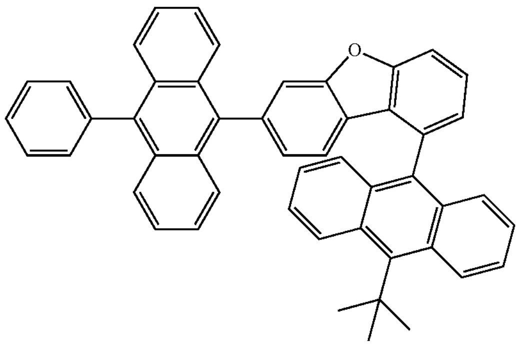
521
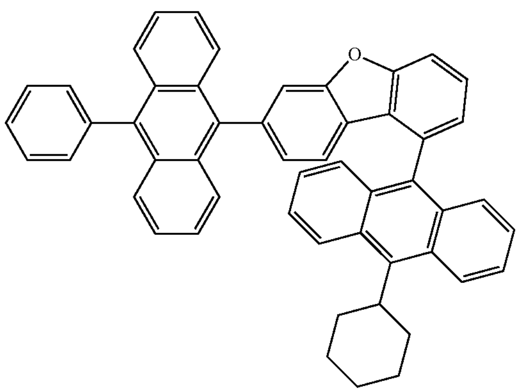
522
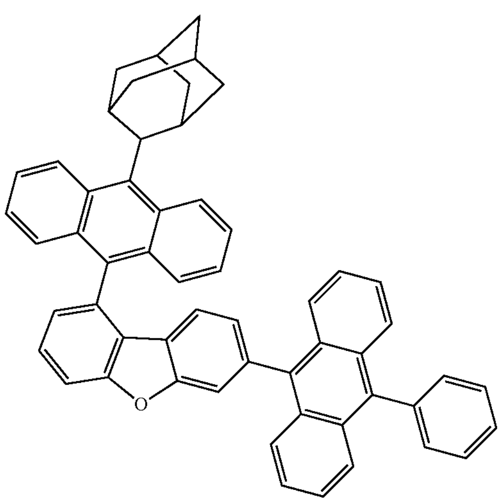
-continued
523
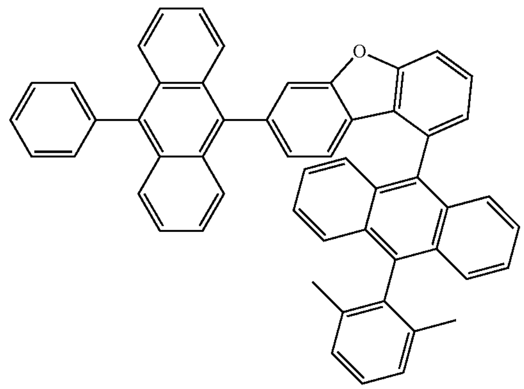
524
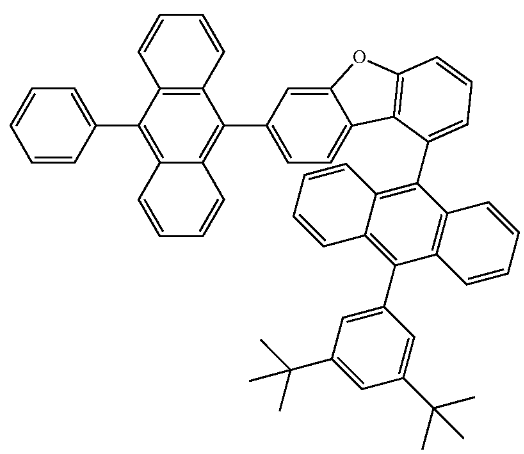
525
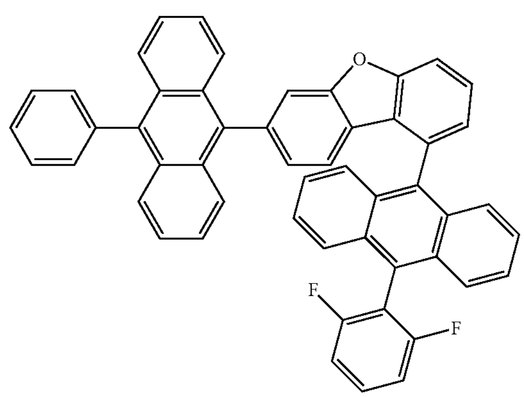

-continued
526
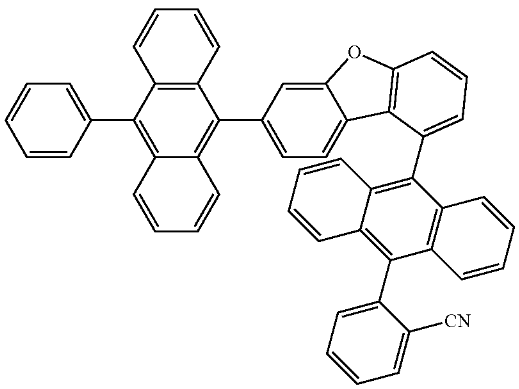
527
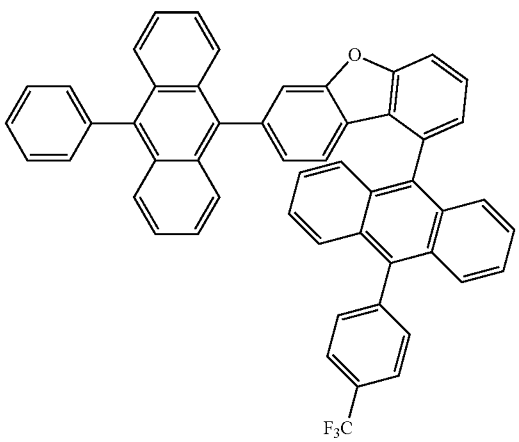
528
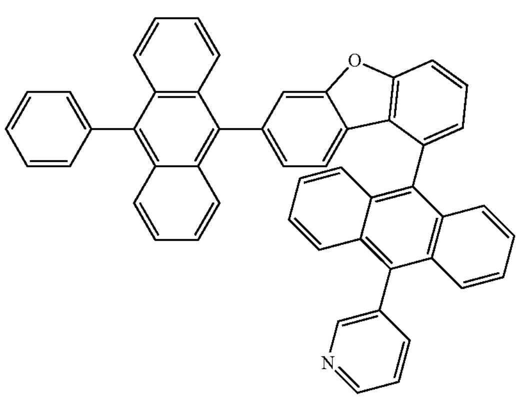
-continued
529
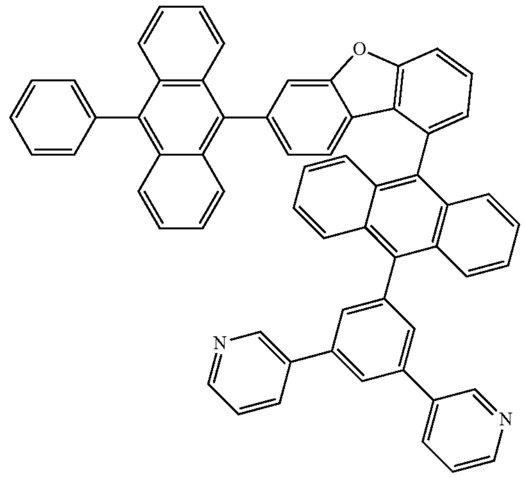
530
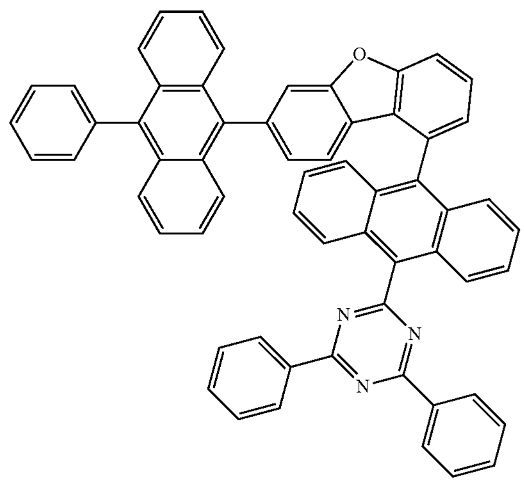
531
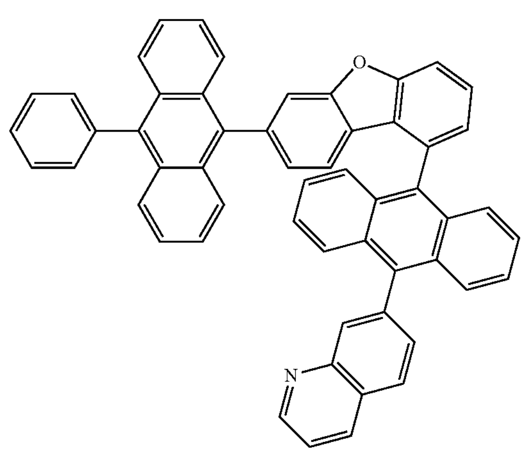

-continued
532
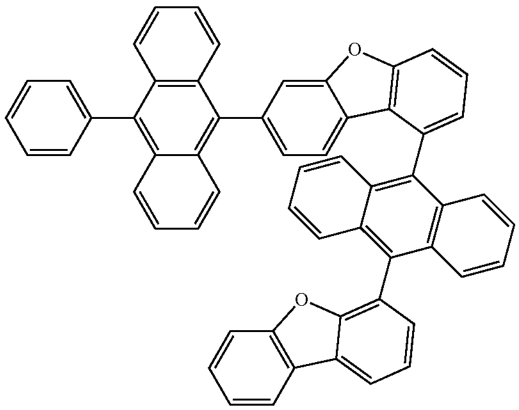
533
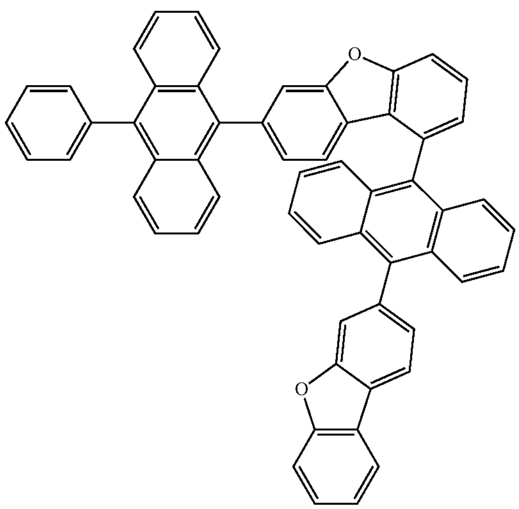
534
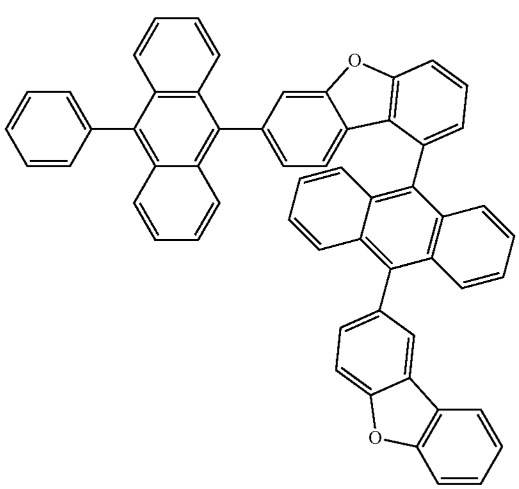
-continued
535
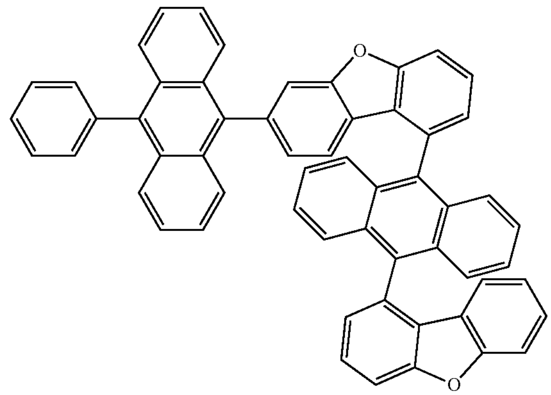
536
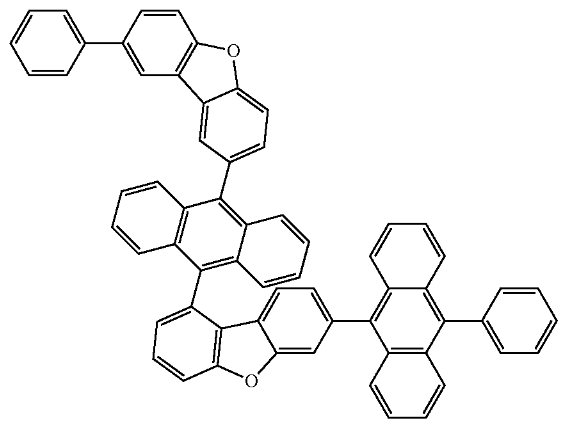
537
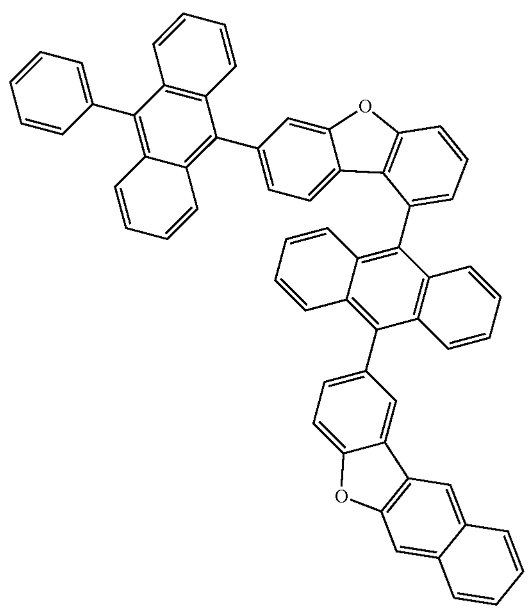

-continued
538
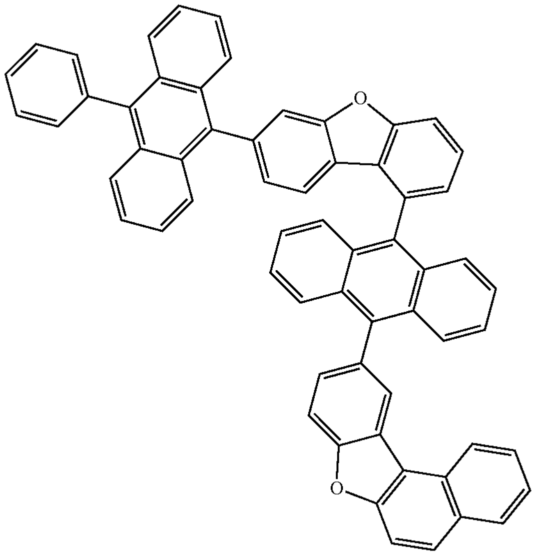
539
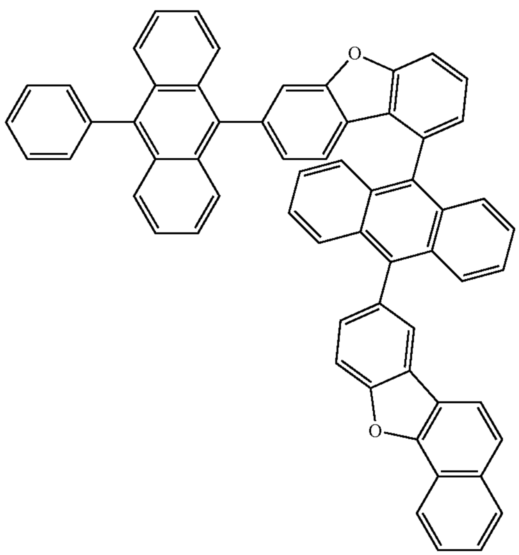
540
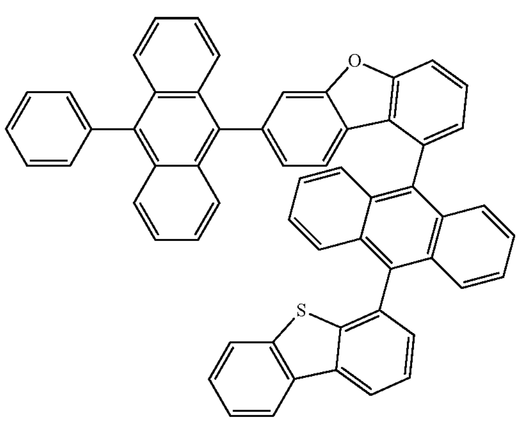
-continued
541
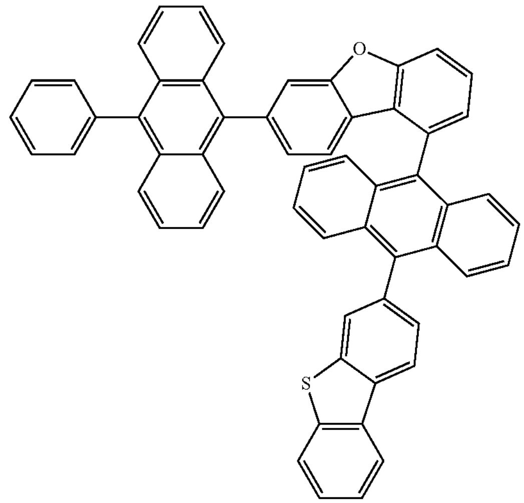
542
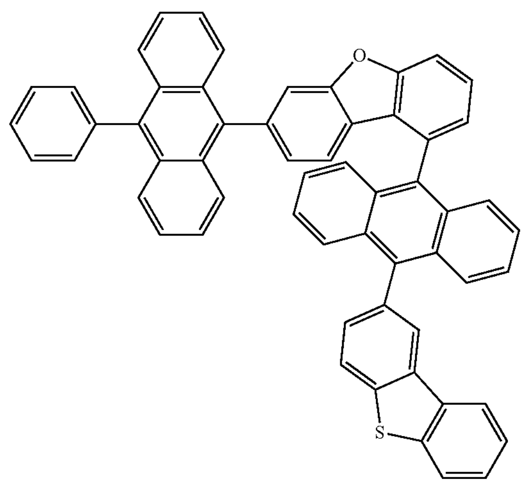
543
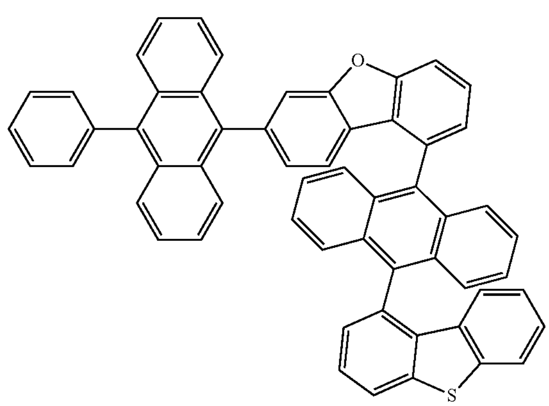

-continued
544
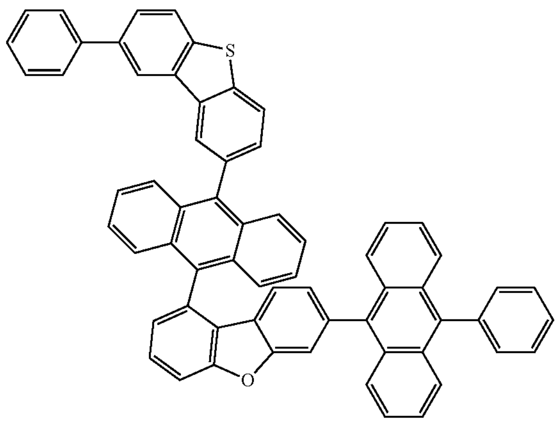
545
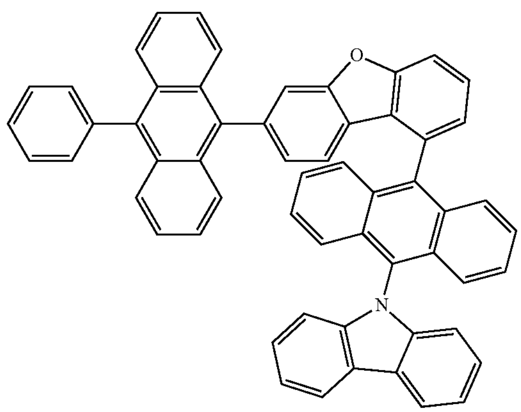
546
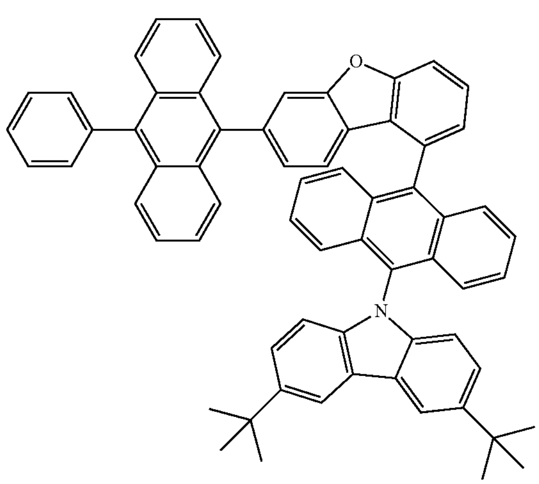
-continued
547
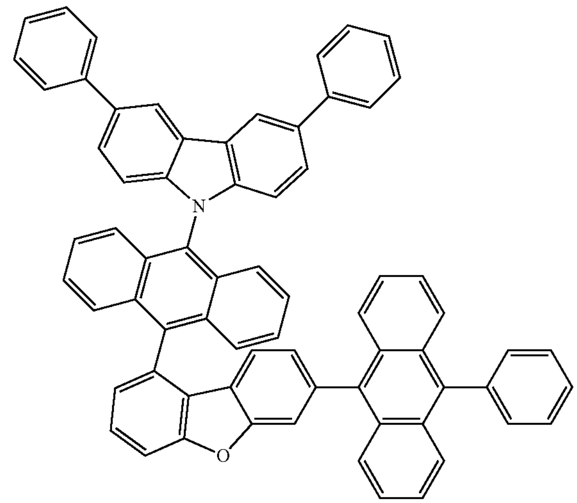
548
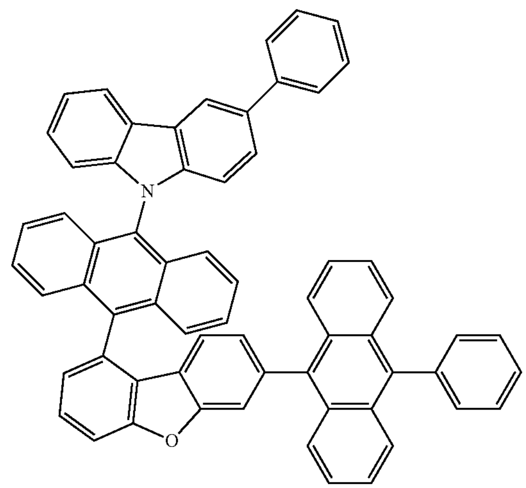
549
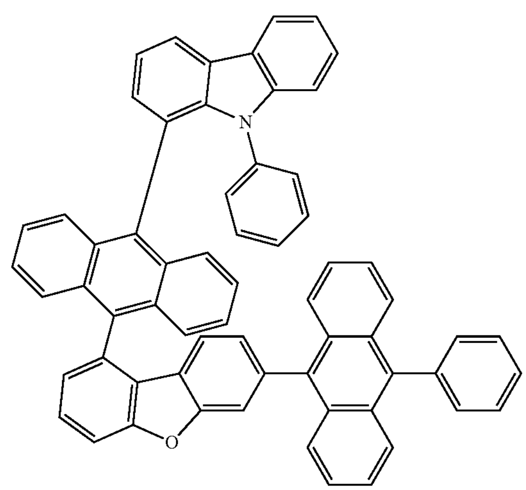

-continued
550
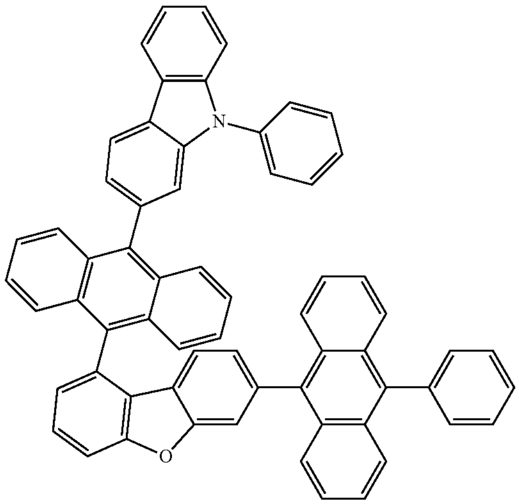
551
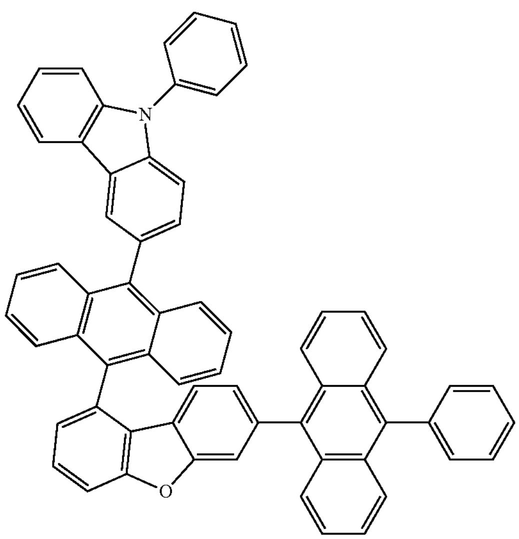
552
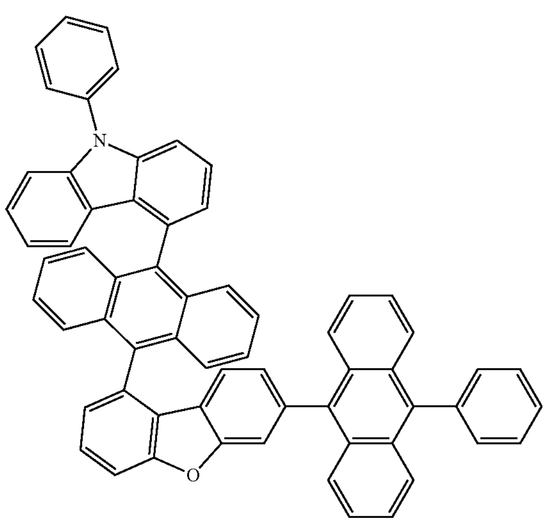
-continued
553
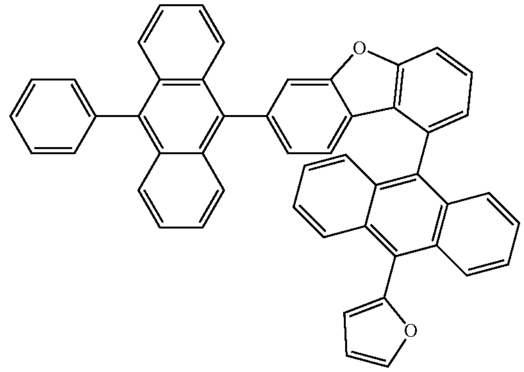
554
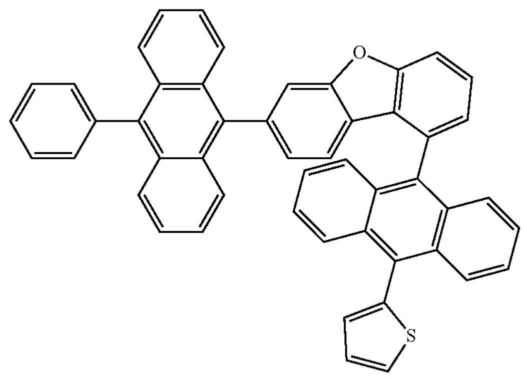
555
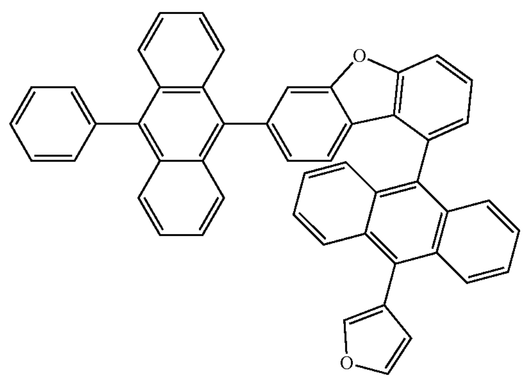
556
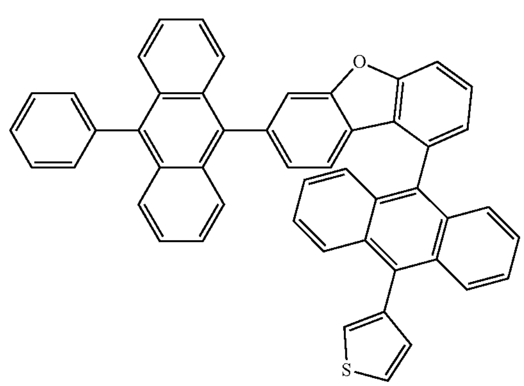

-continued
557
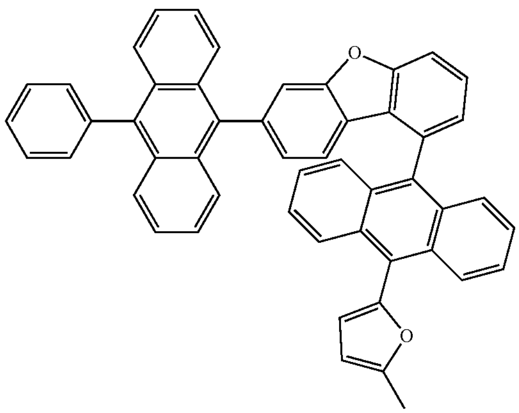
558
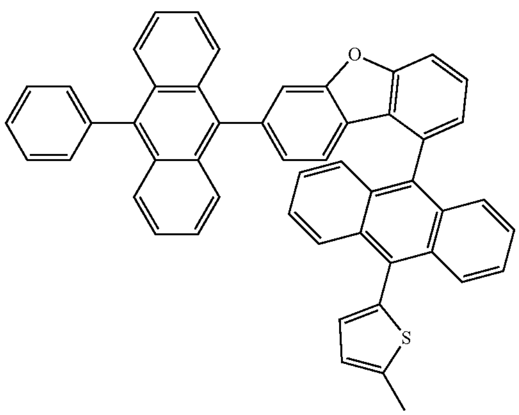
559
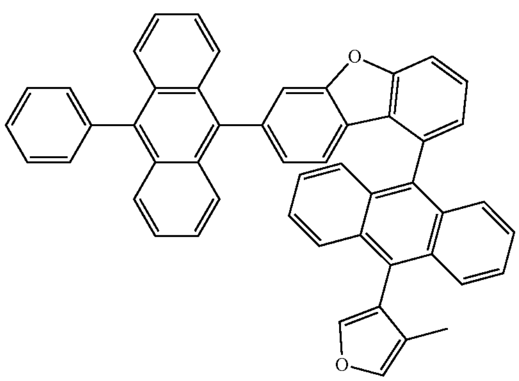
560
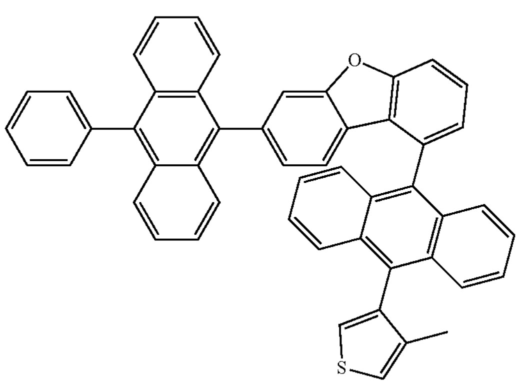
-continued
561
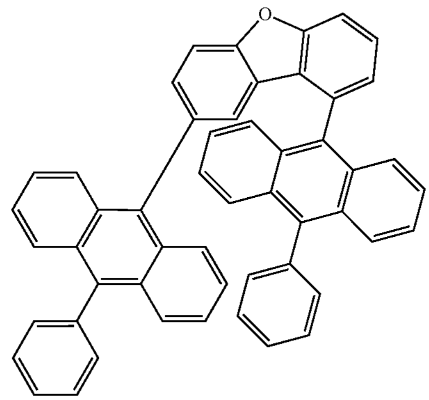
562
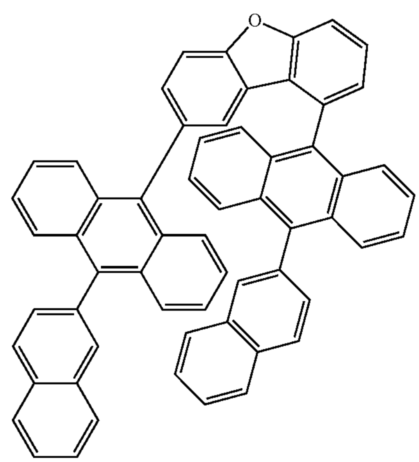
563
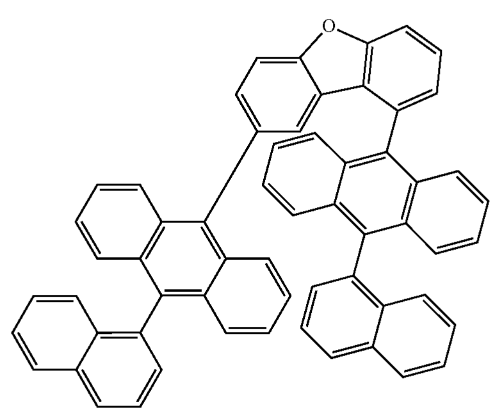

564
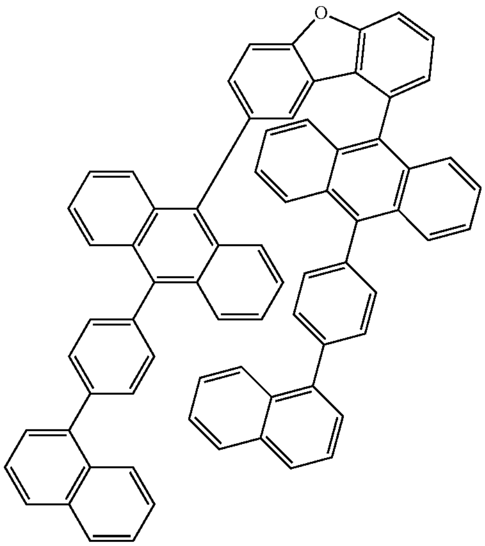
565
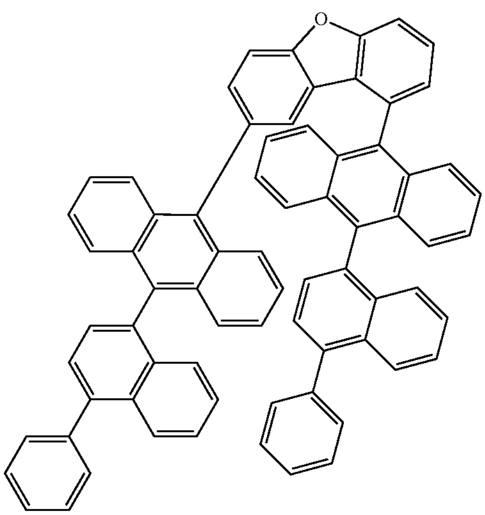
566
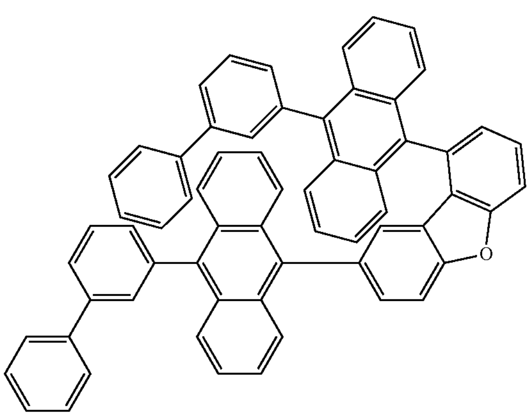
567
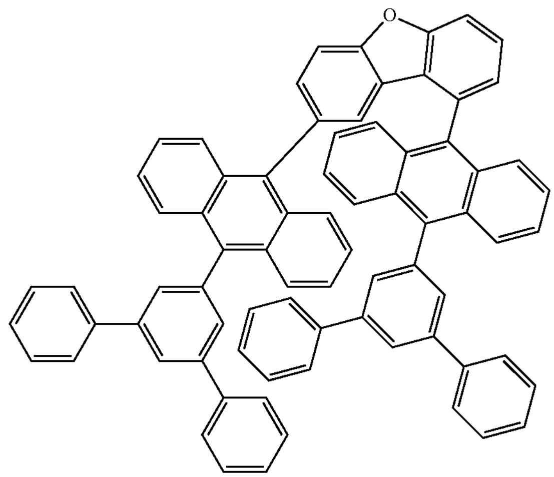
568
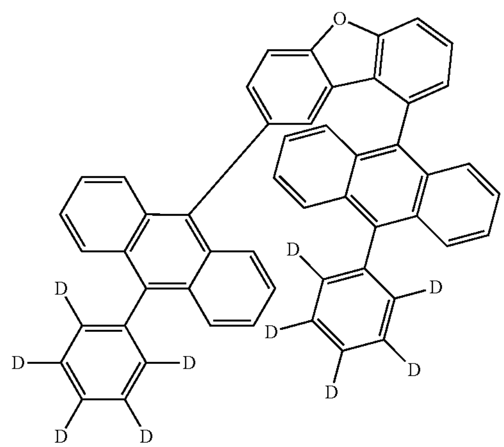
569
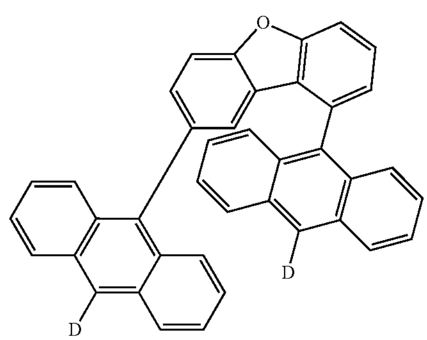
570
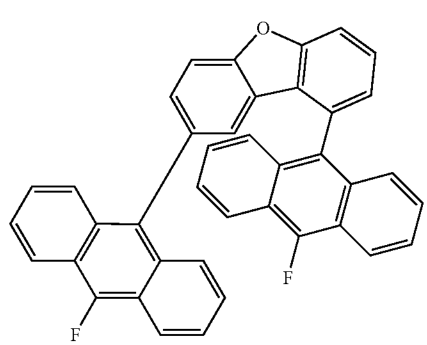

-continued
571
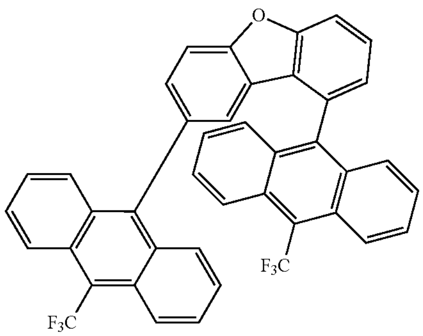
572
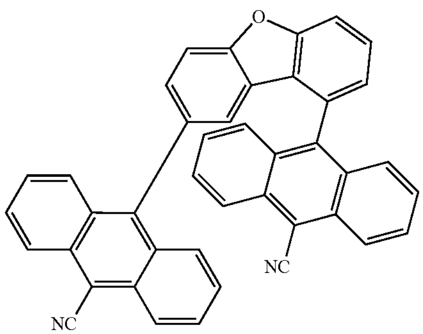
573
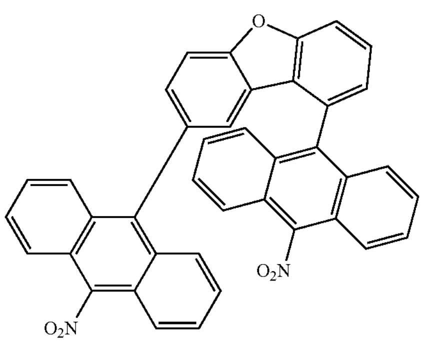
574
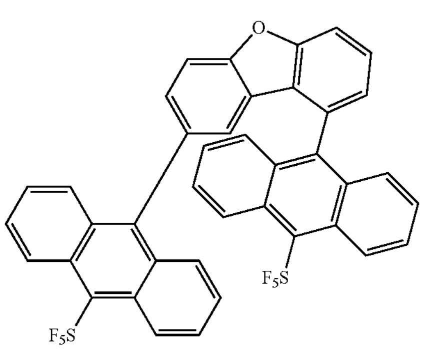
-continued
575
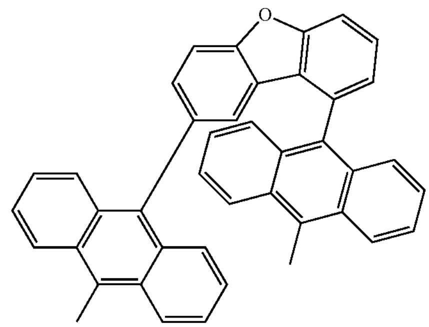
576
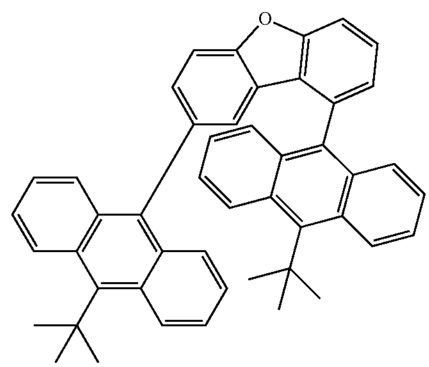
577
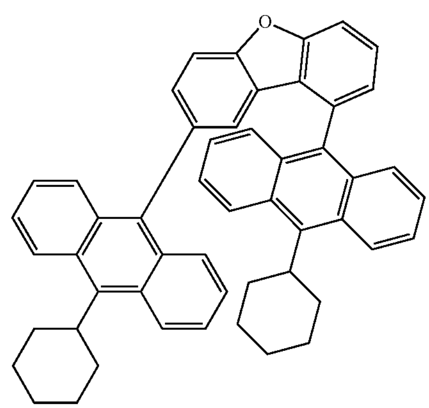
578
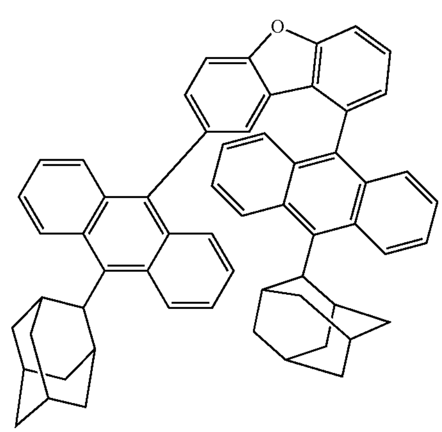

-continued
579
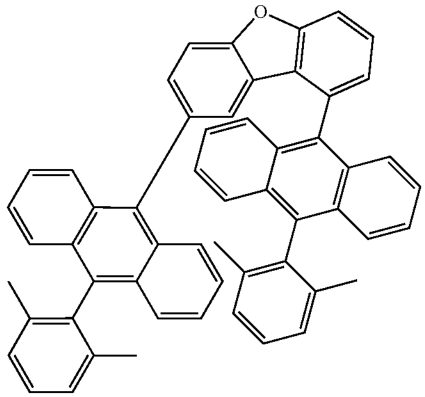
580
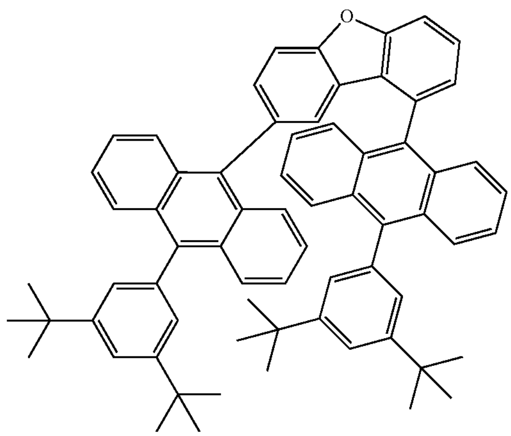
581
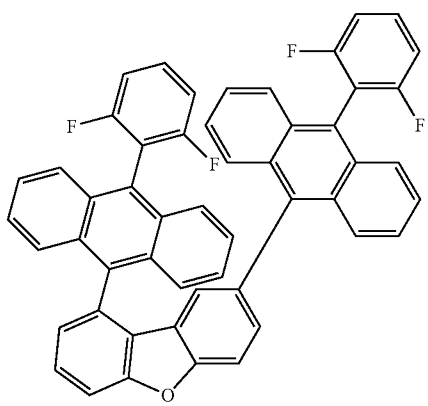
582
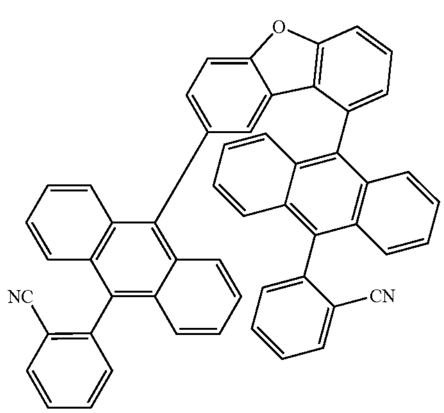
-continued
583
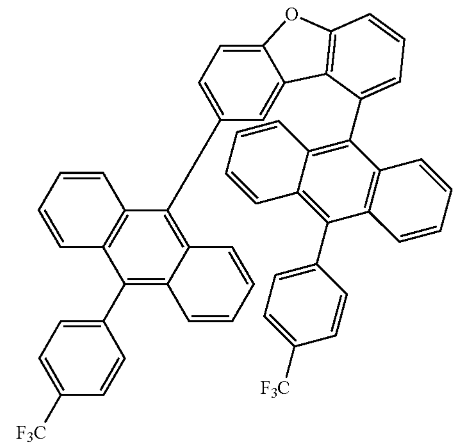
584
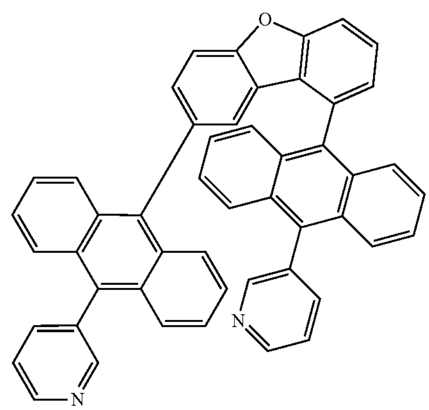
585
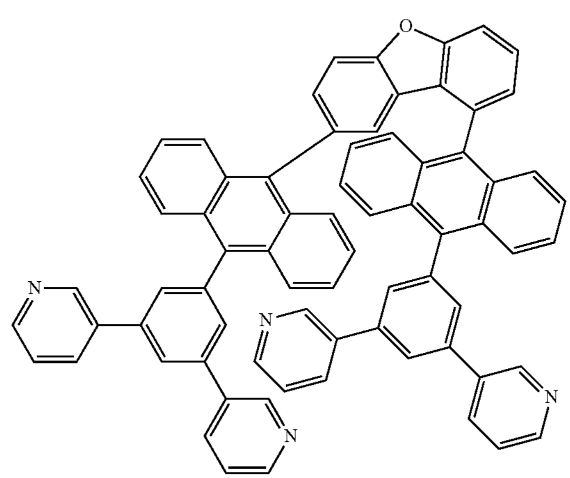

586
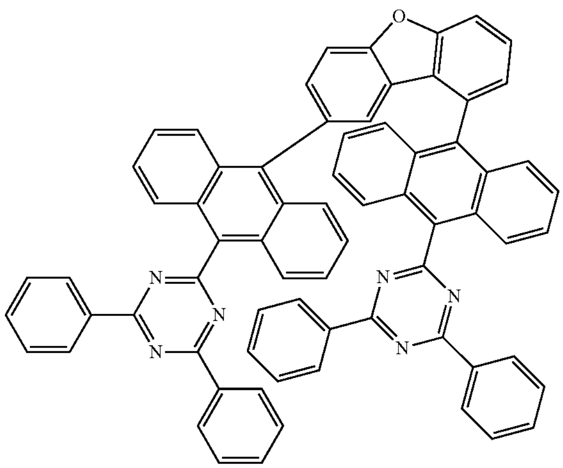
589
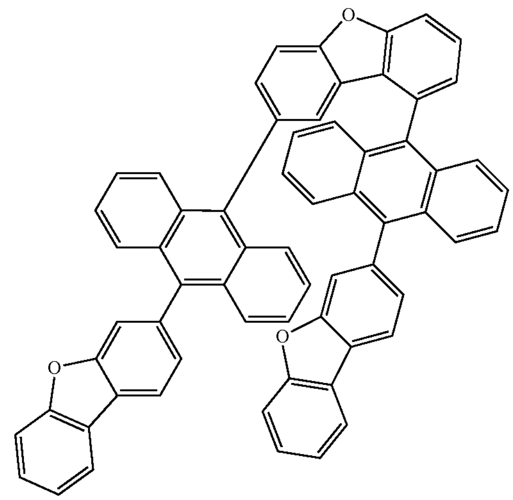
587
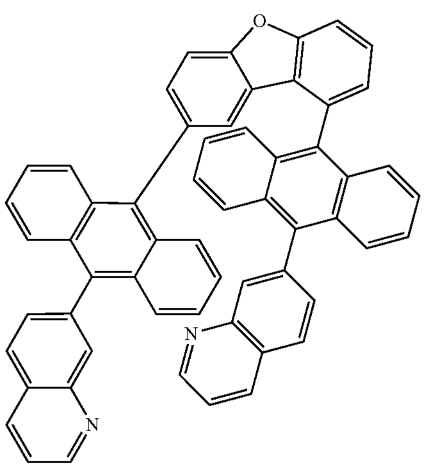
590
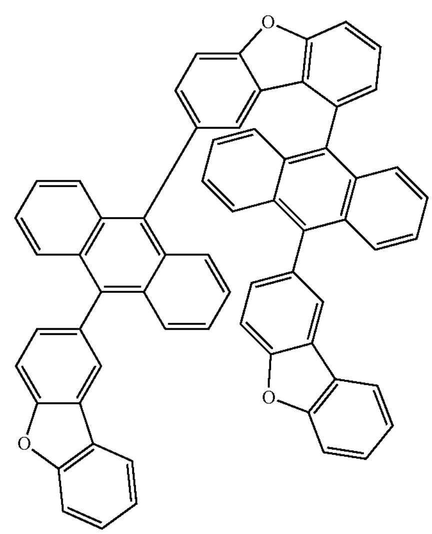
588
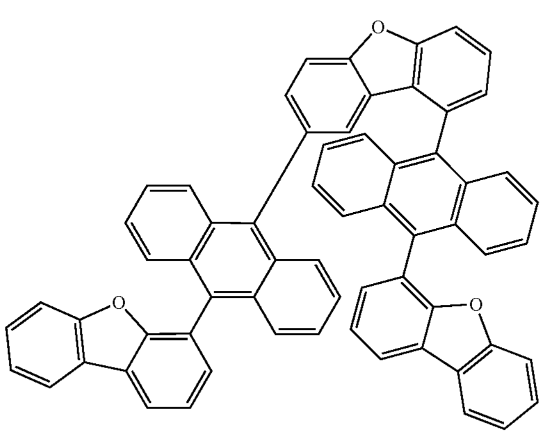
591
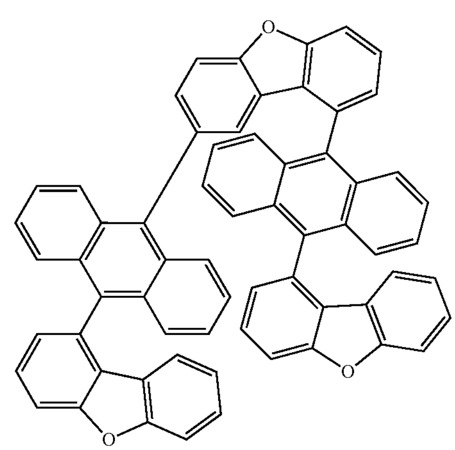

592
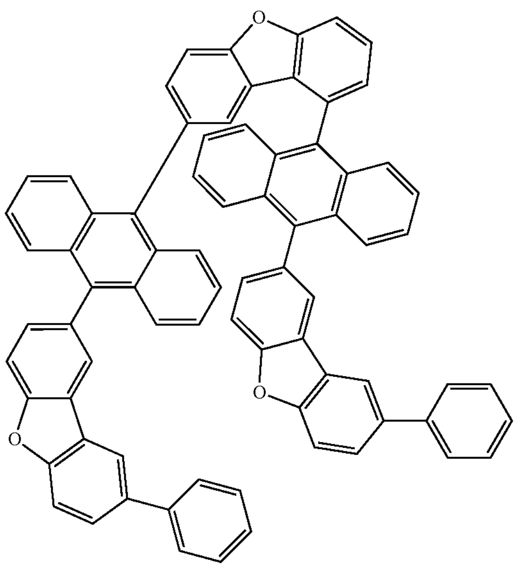
593
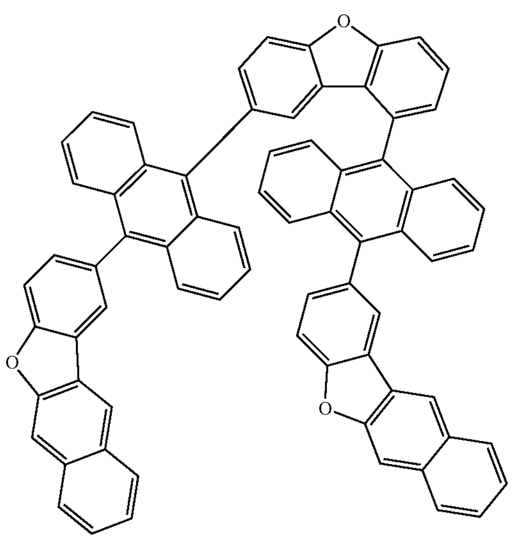
594
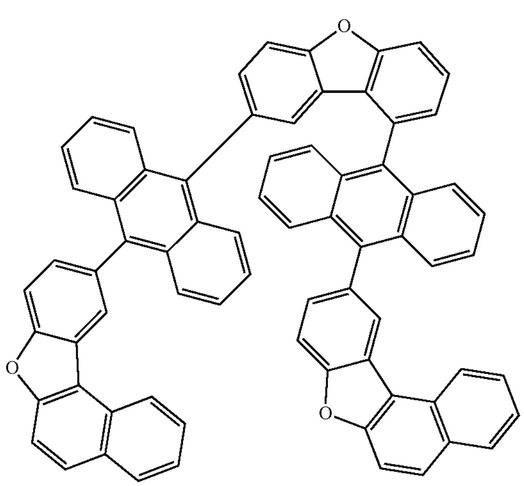
595
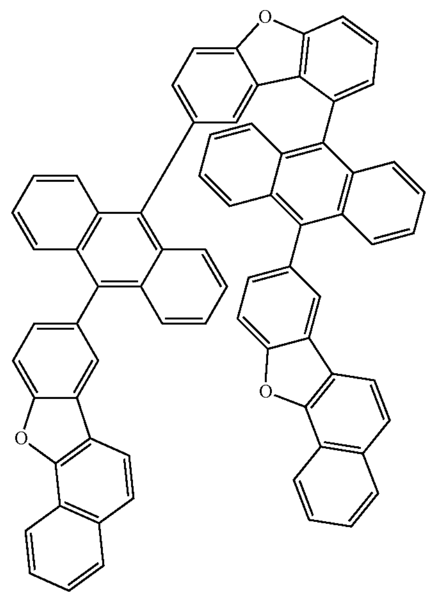
596
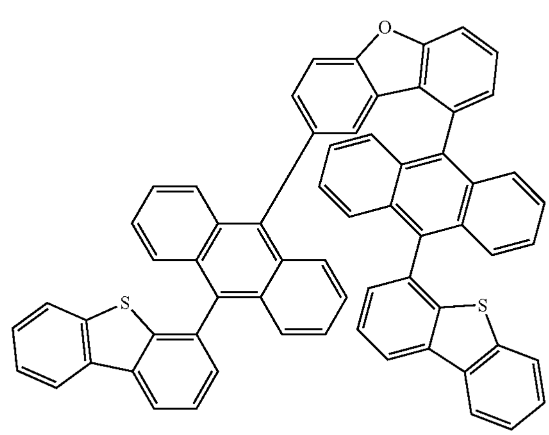

-continued
597
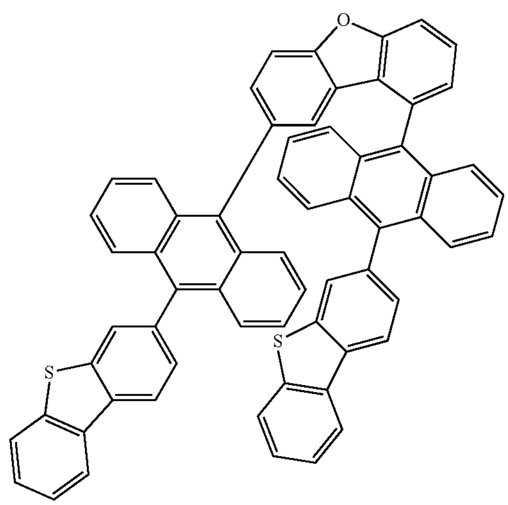
598
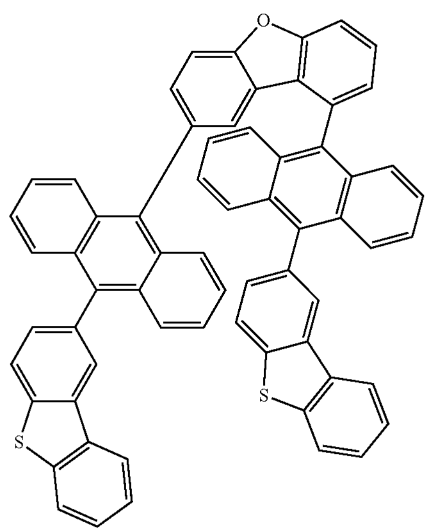
601
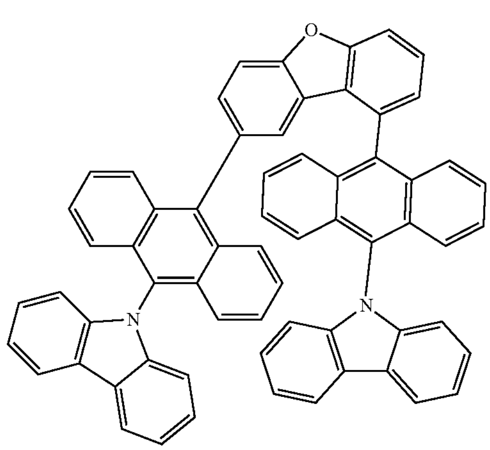
-continued
599
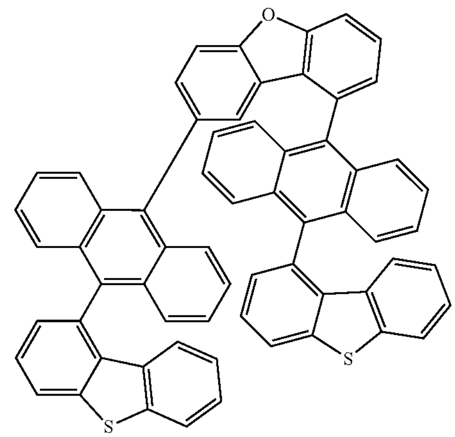
600
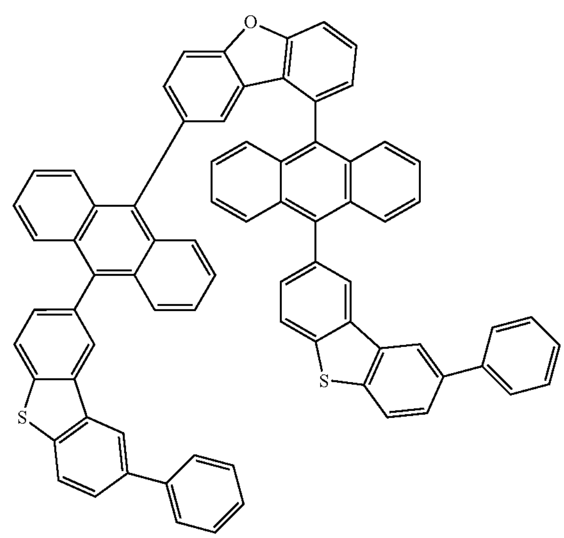
602
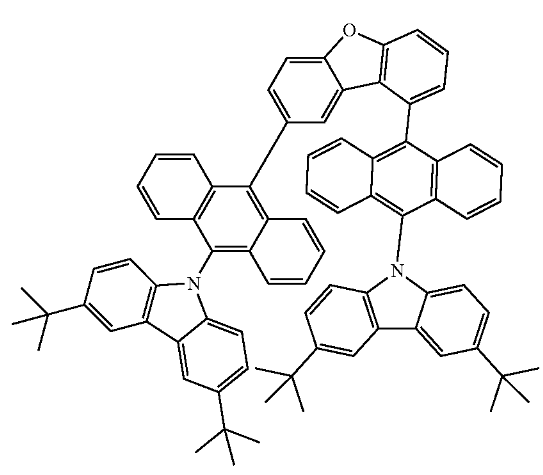

-continued
603
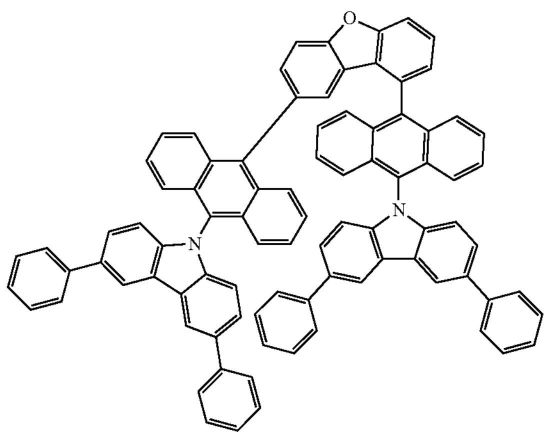
604
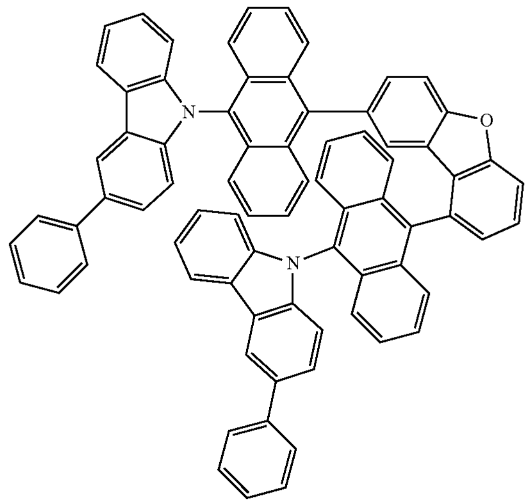
605
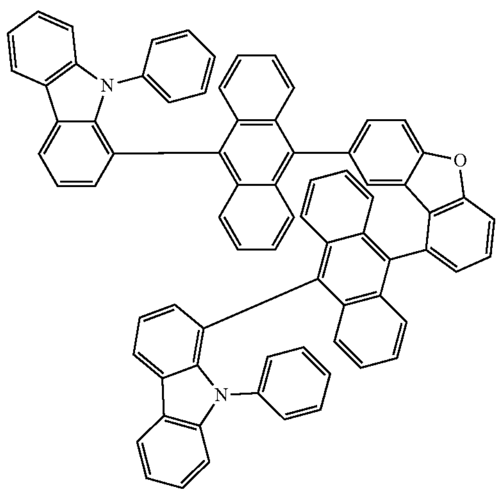
606
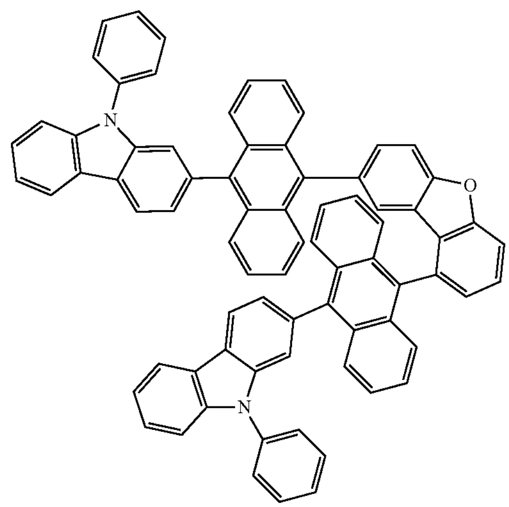
607
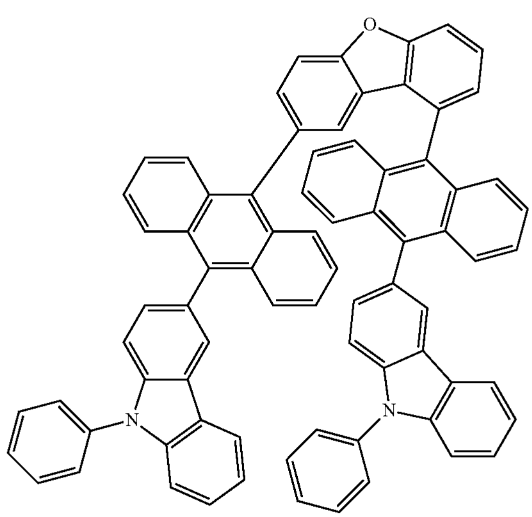
608
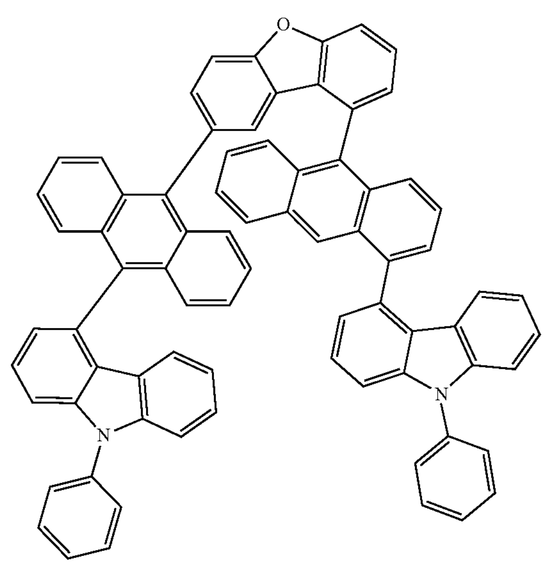

-continued
609
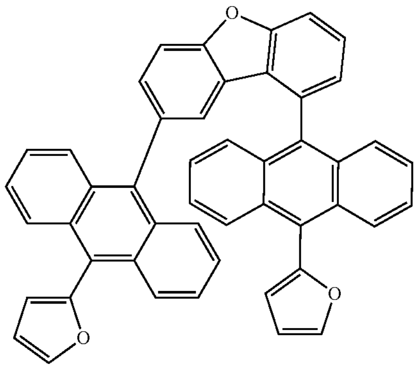
610
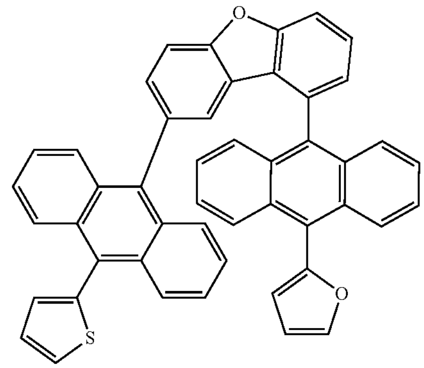
611
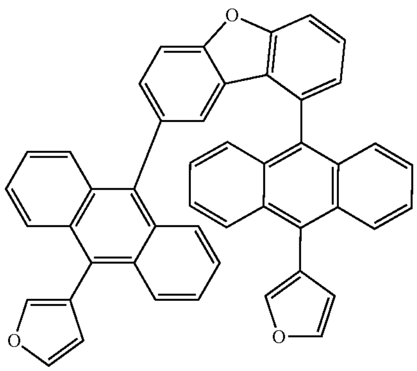
612.
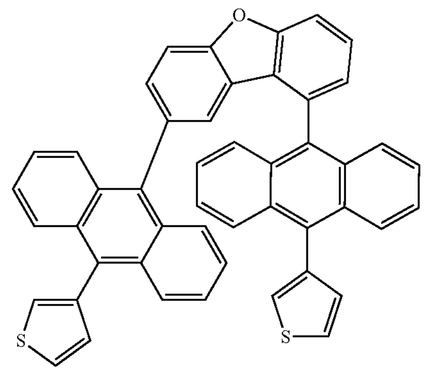
613
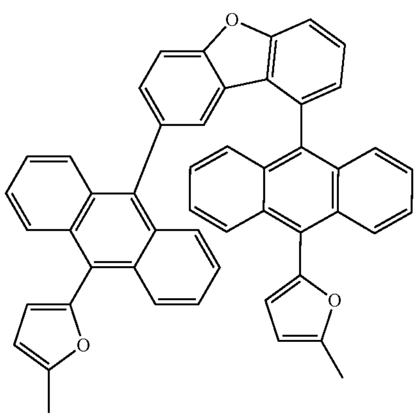
614
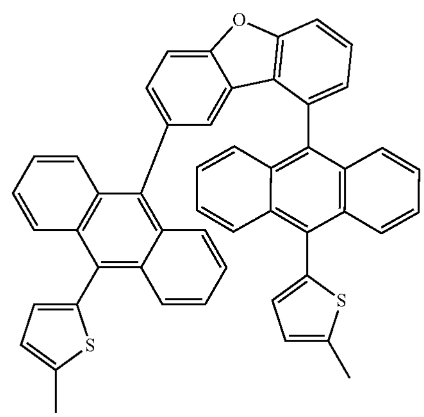
615
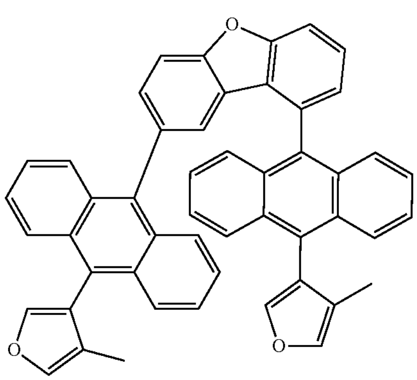
616
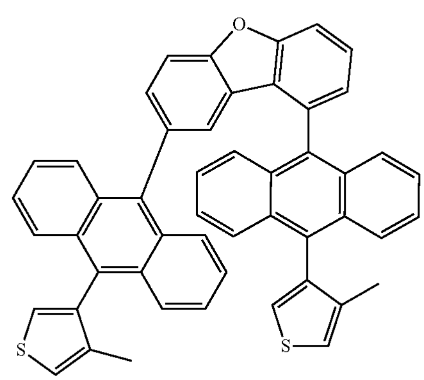

-continued
617
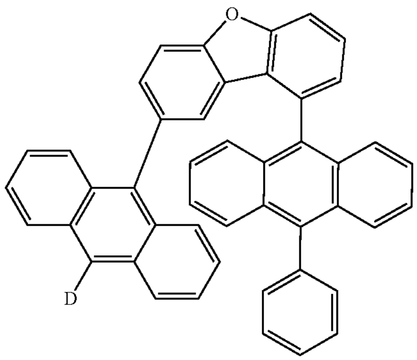
618
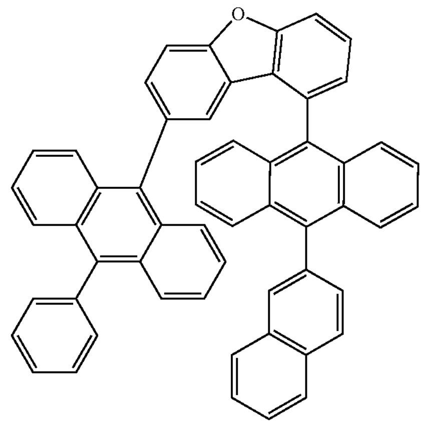
619
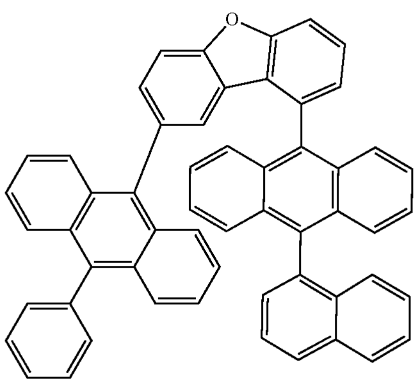
620
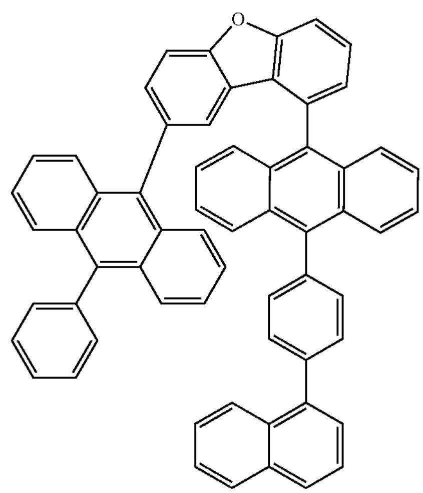
621
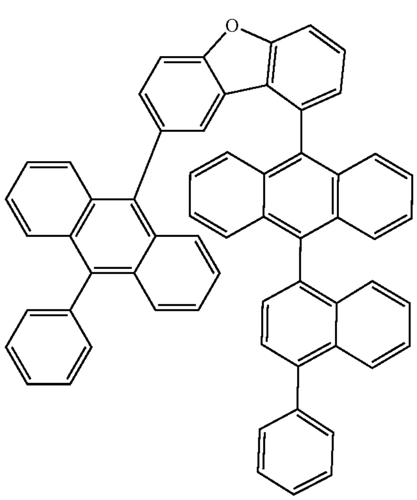
622
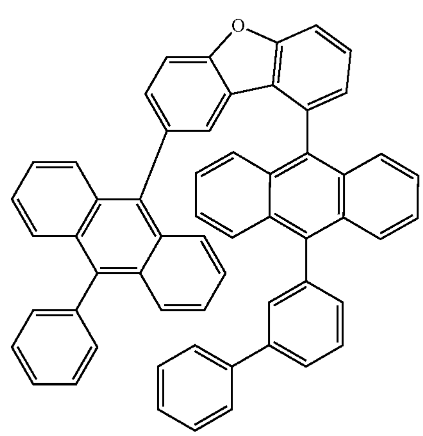

-continued
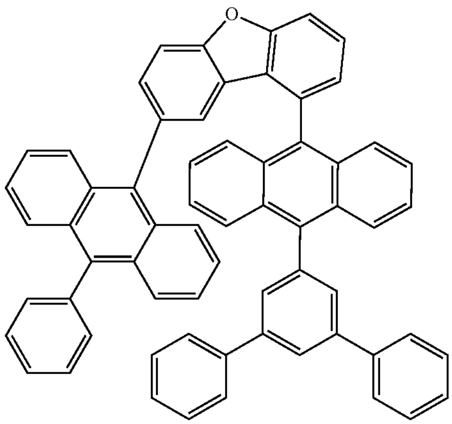
623
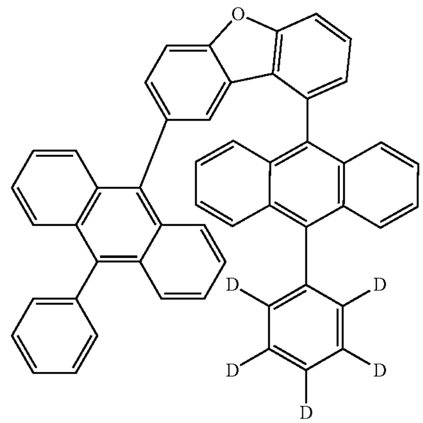
624
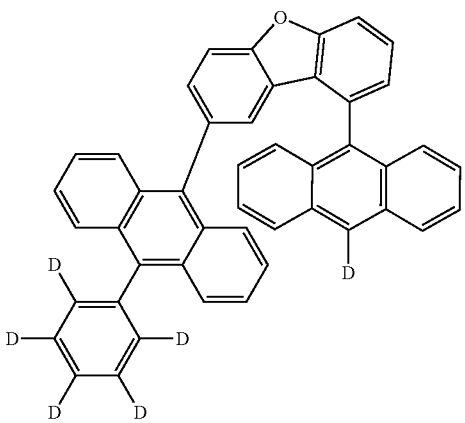
625
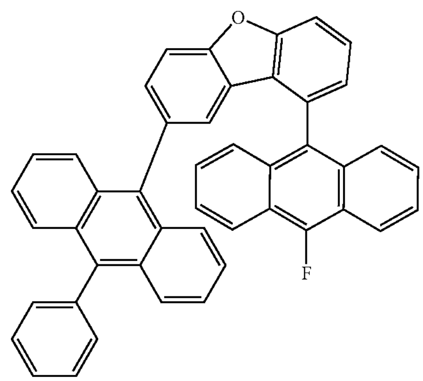
626
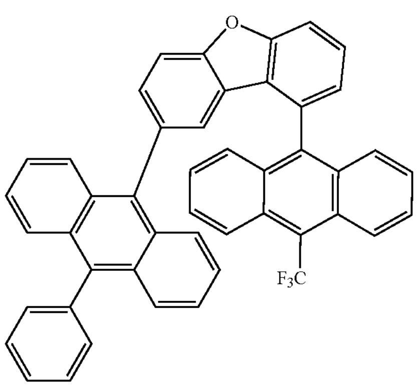
627
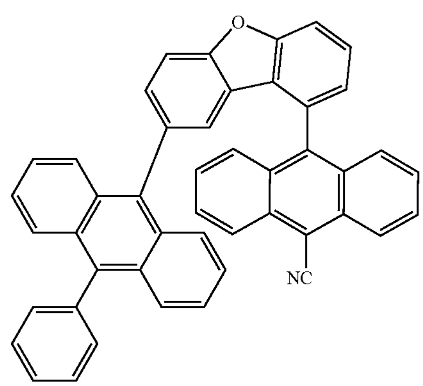
628
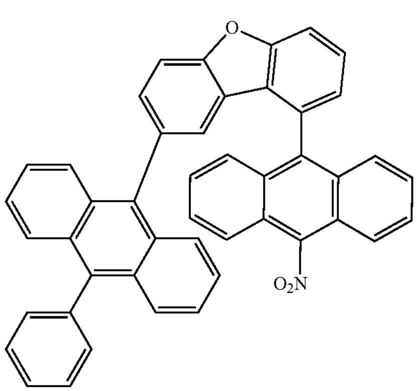
629
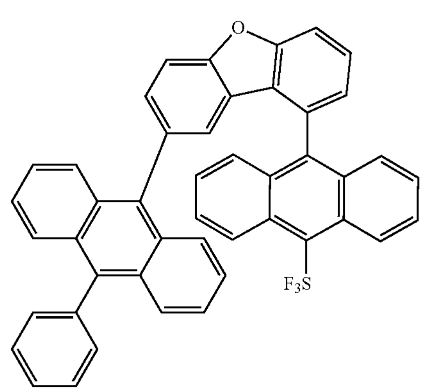
630

-continued
631
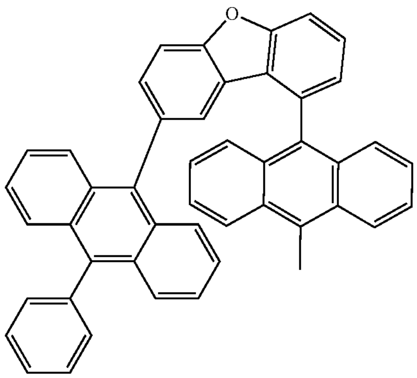
632
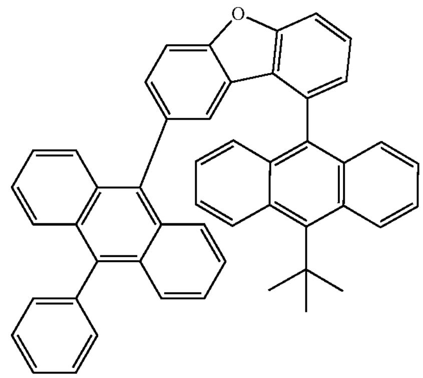
633
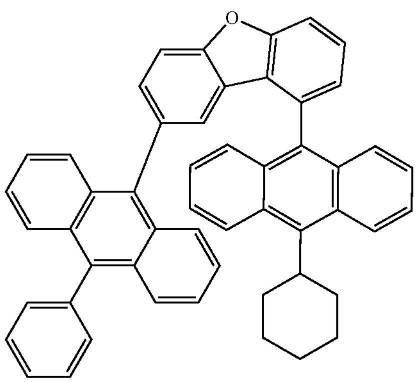
634
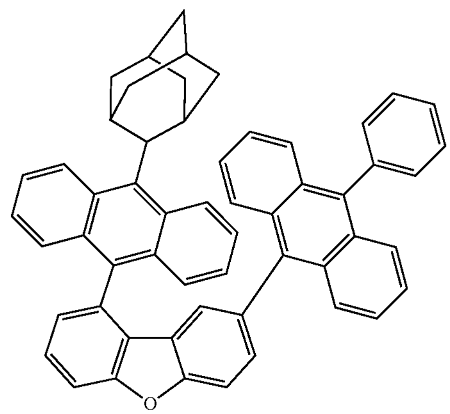
635
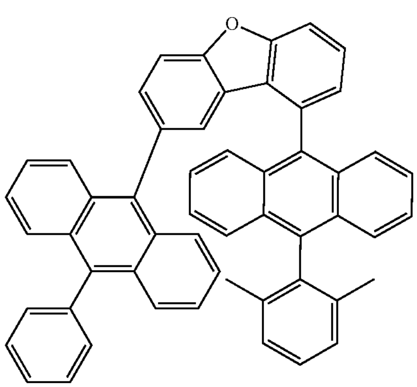
636
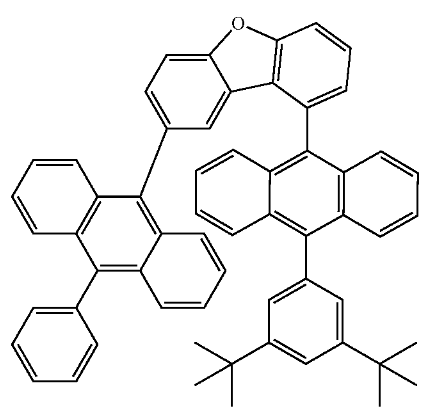
637
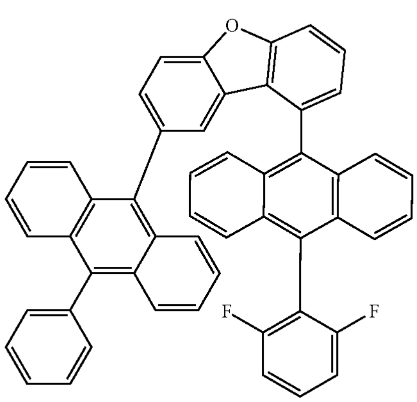
638
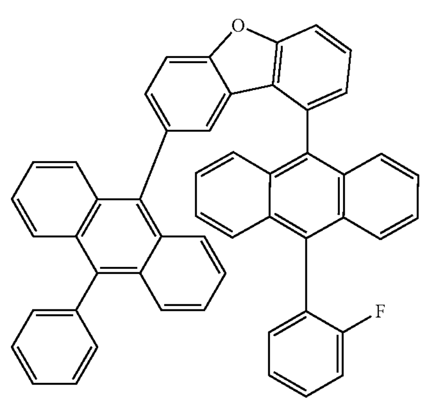

-continued
639
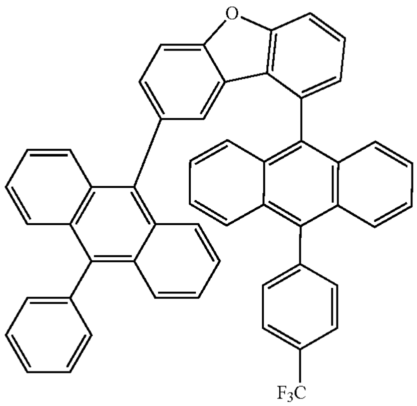
640
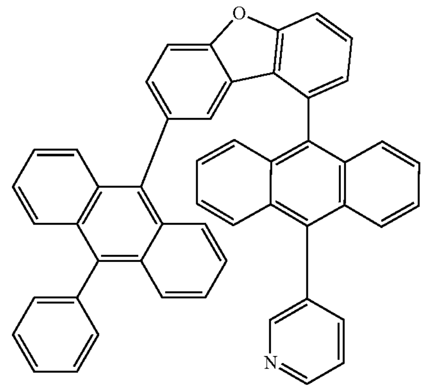
641
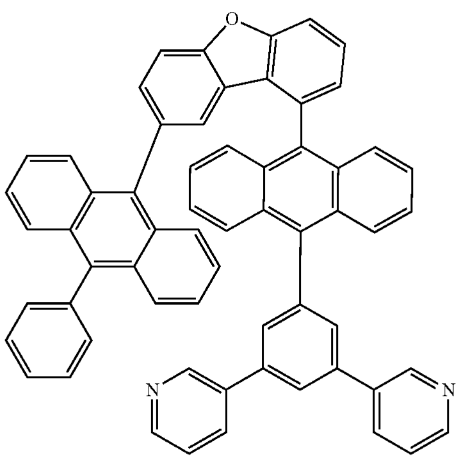
642
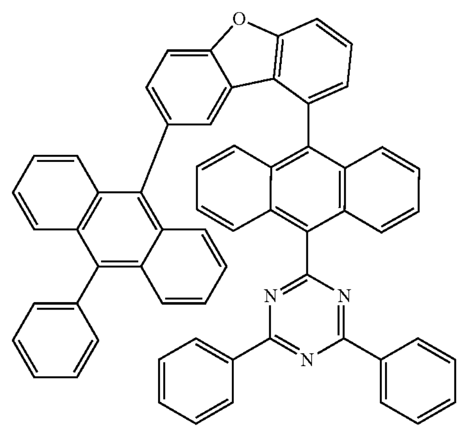
643
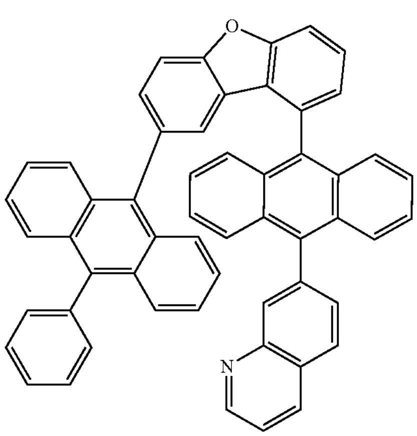
644
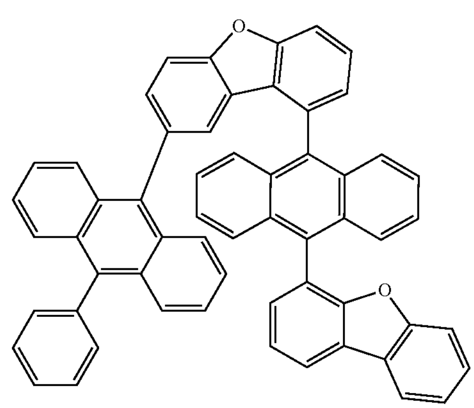

-continued
645
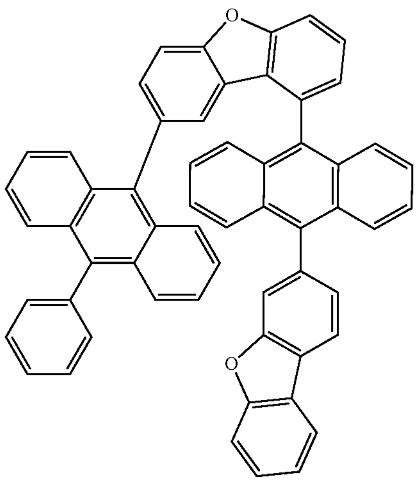
646
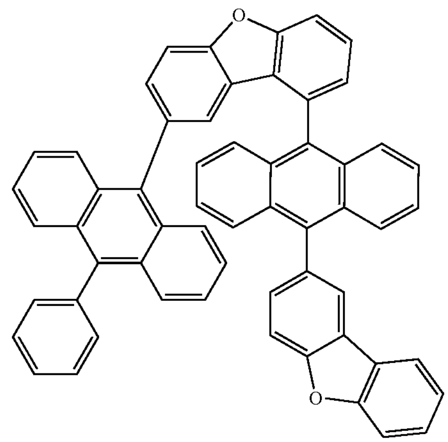
647
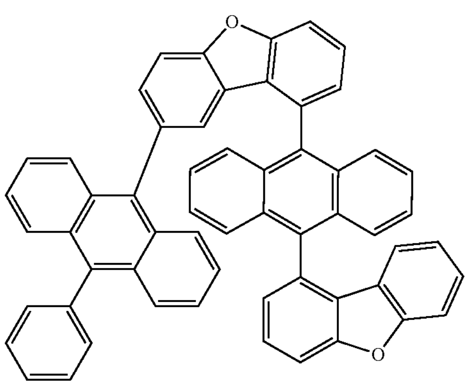
648
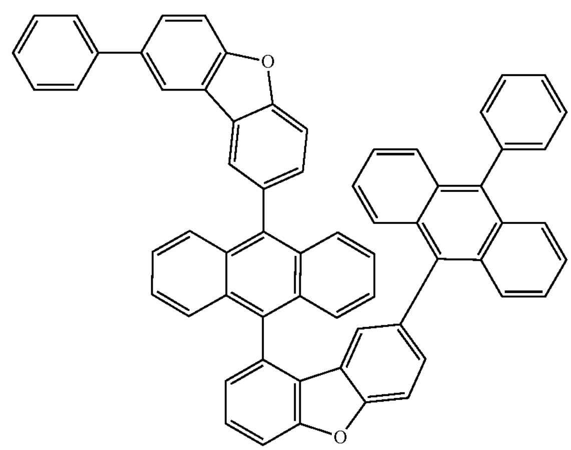
649
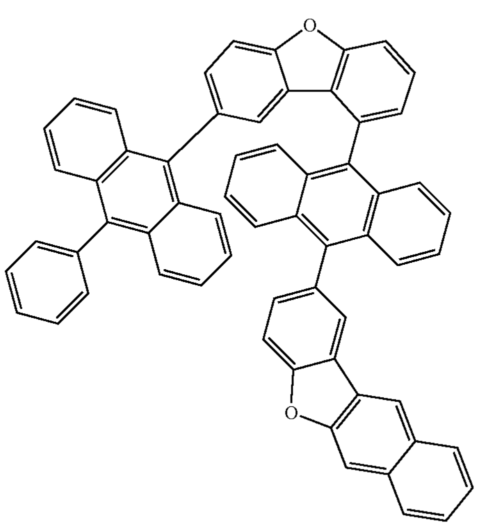
650
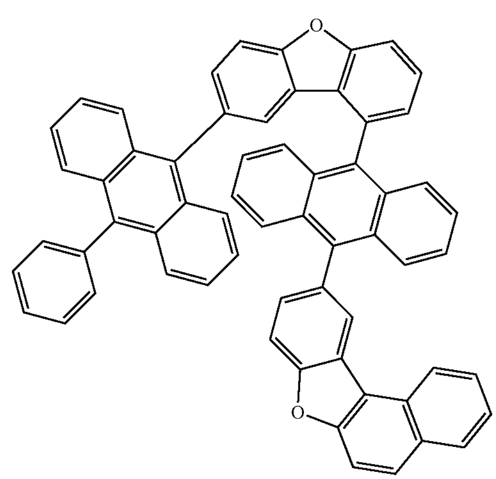

-continued
651
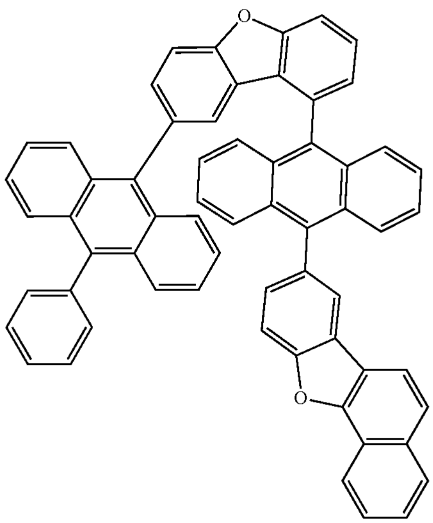
652
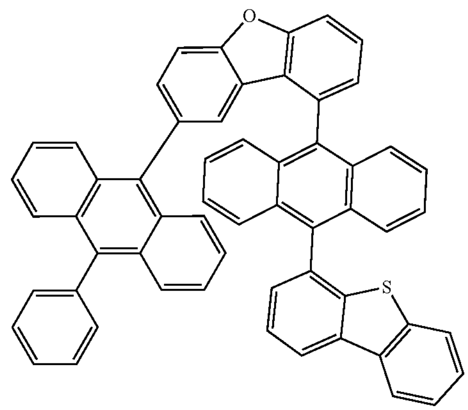
653
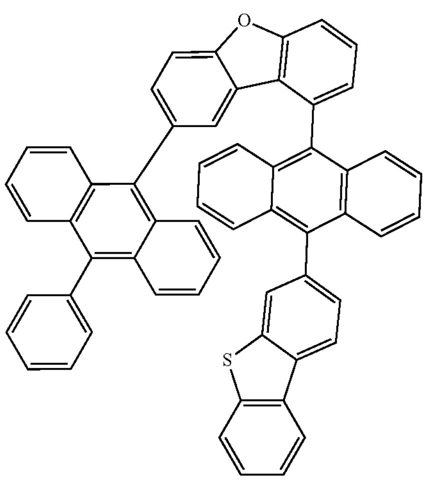
654
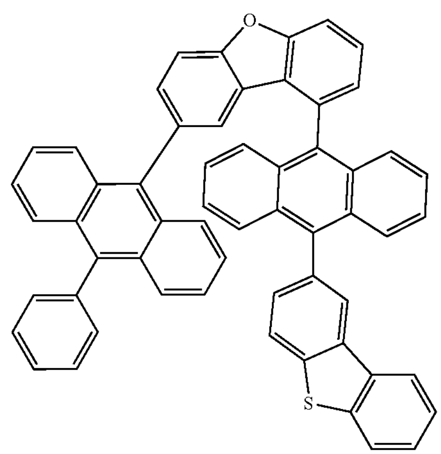
655
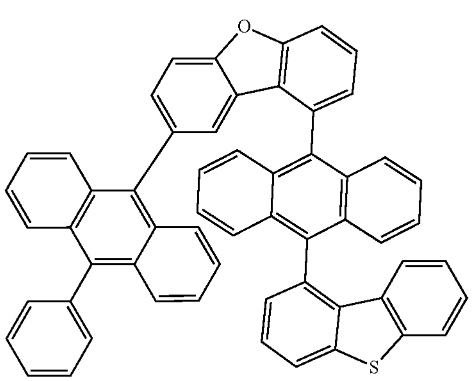
656
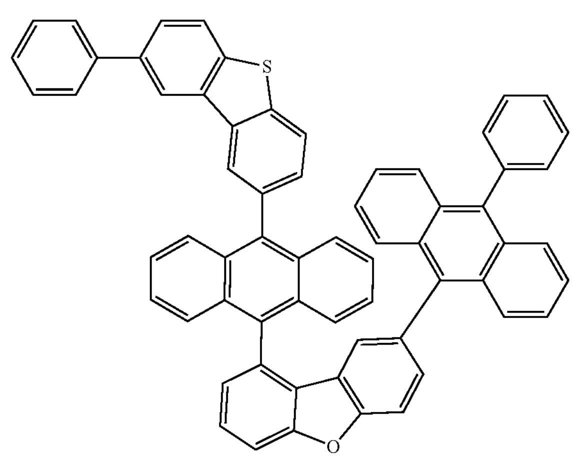

-continued
657
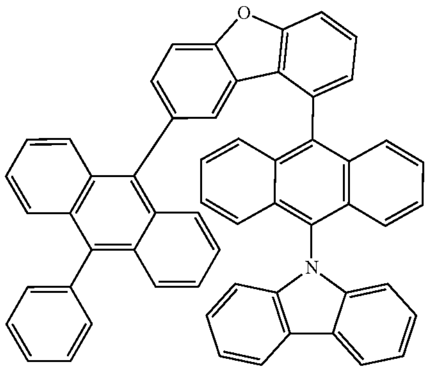
658
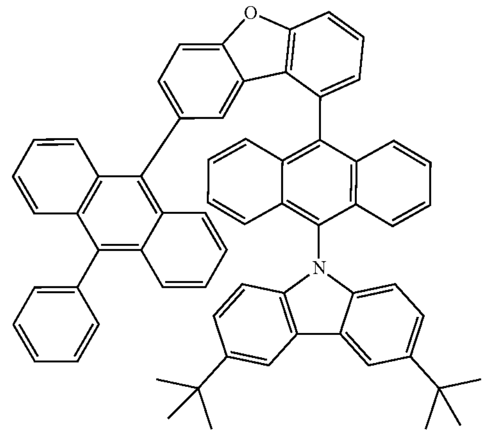
659
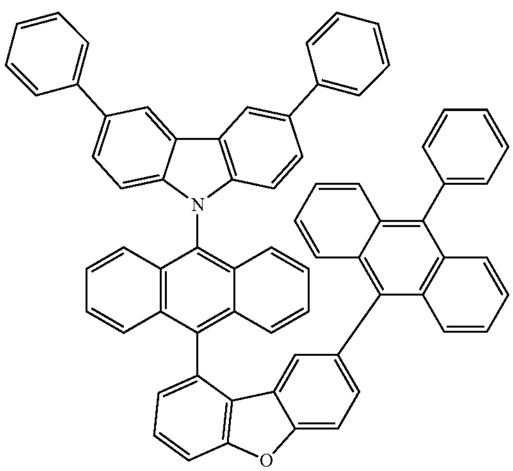
660
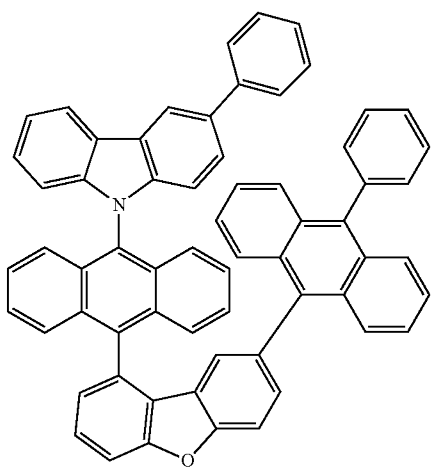
661
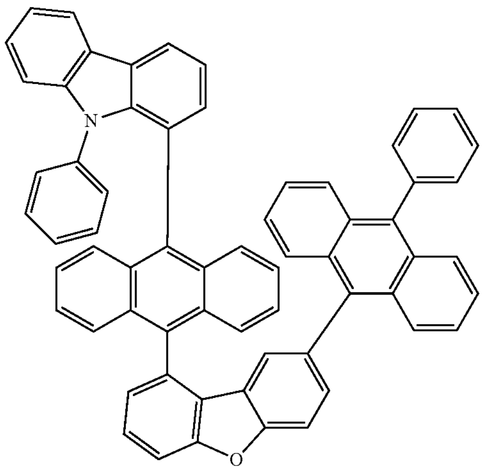
662
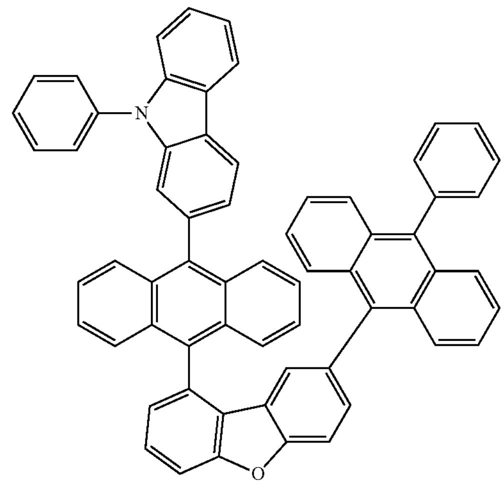

-continued
663
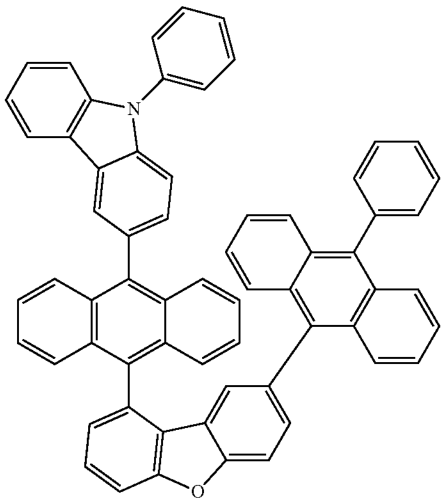
664
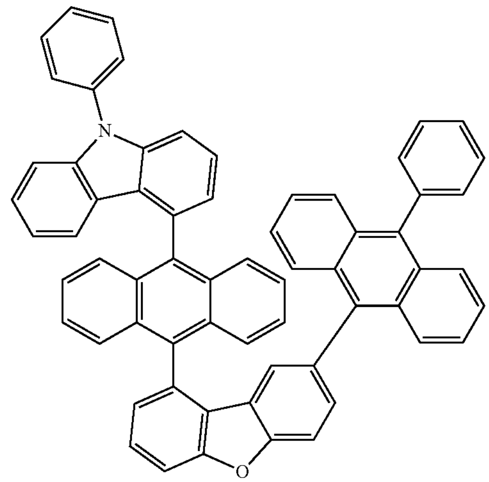
665
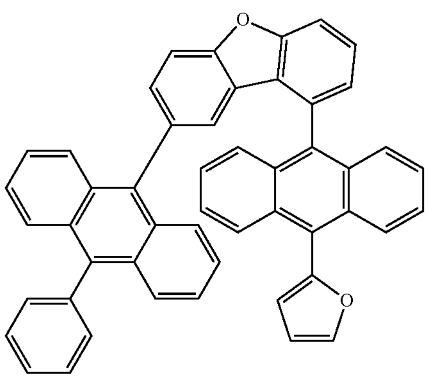
666
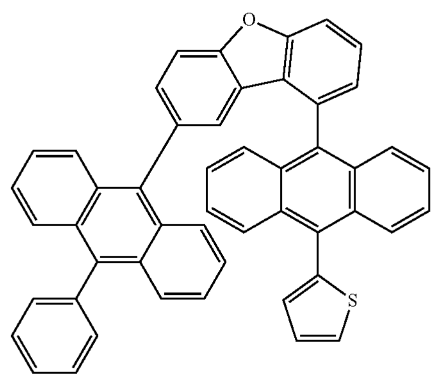
667
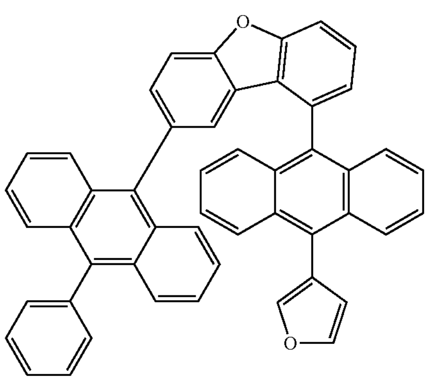
668
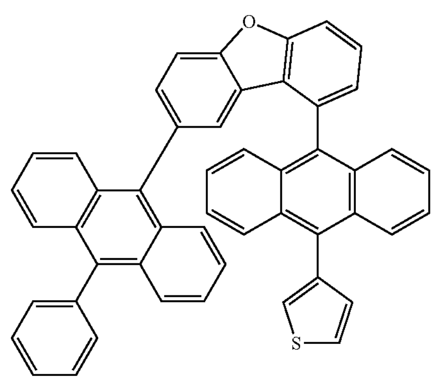
669
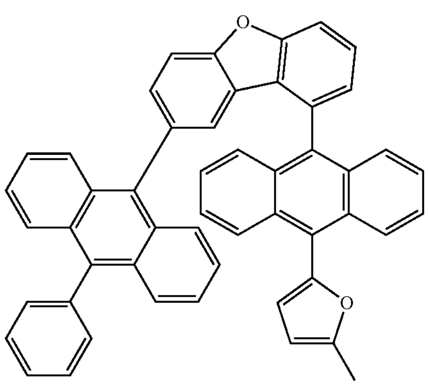
670
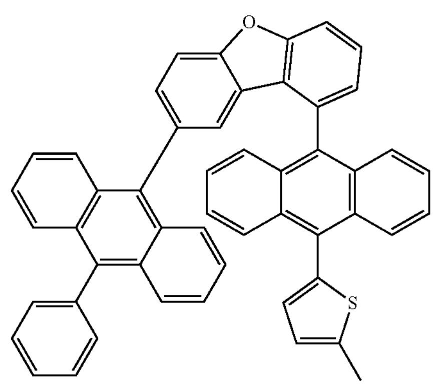

-continued
671
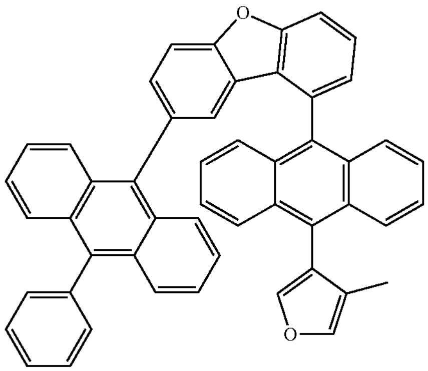
672
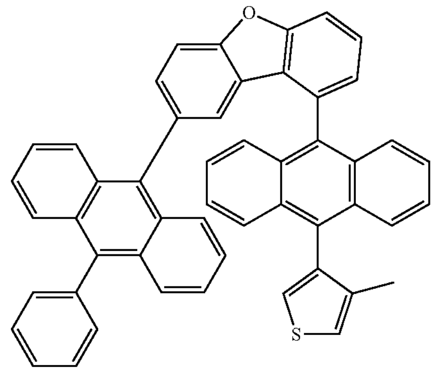
673
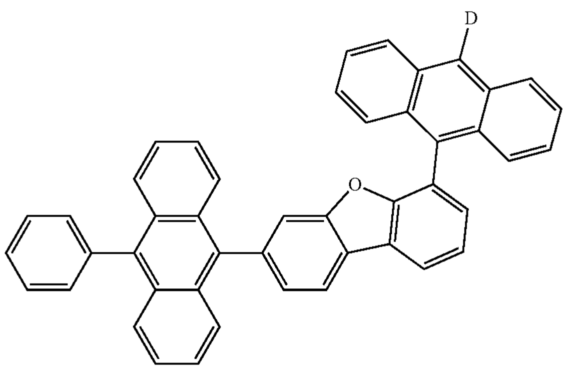
674
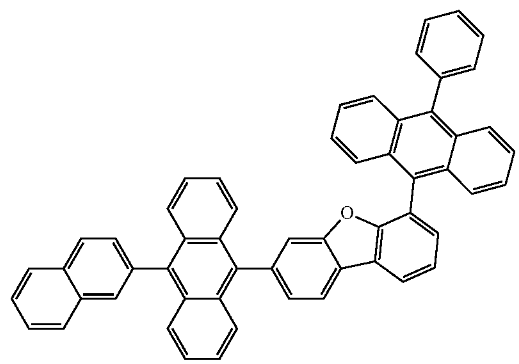
675
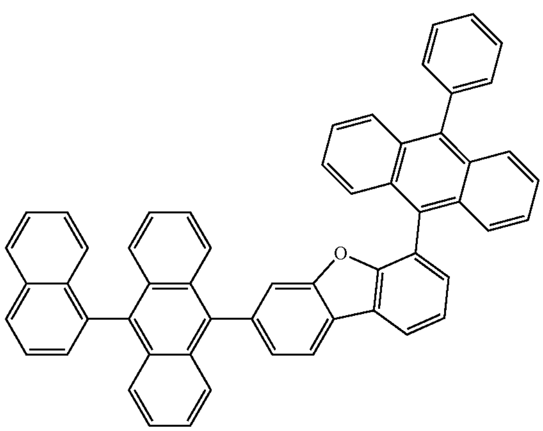
676
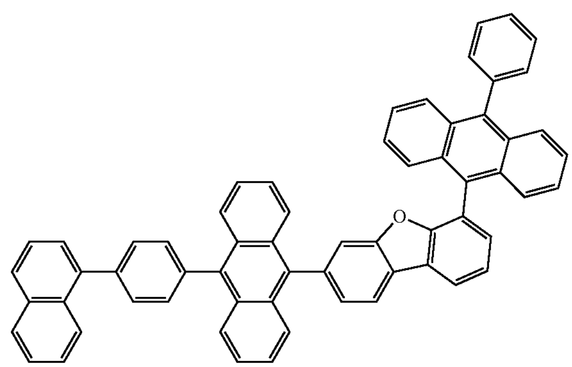
677
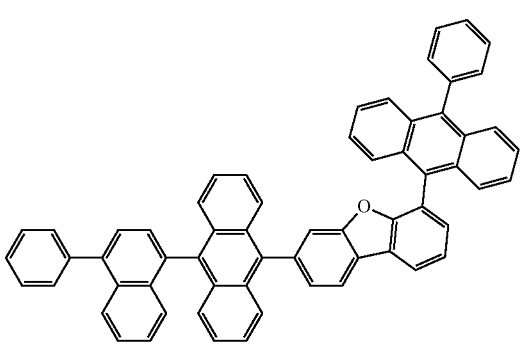
678
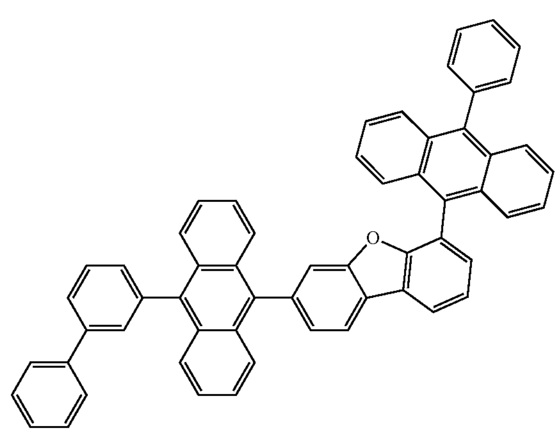

-continued
679
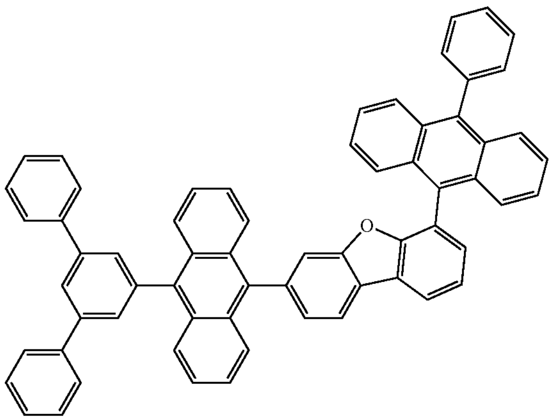
680
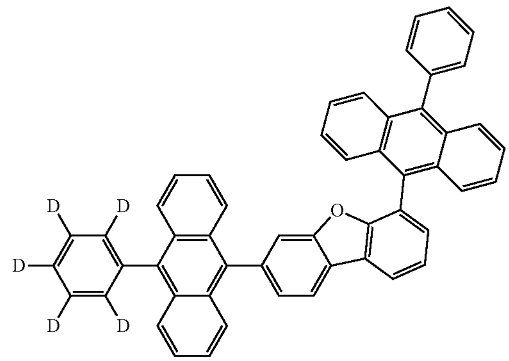
681
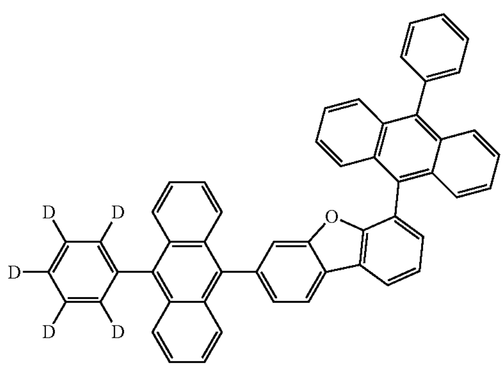
682
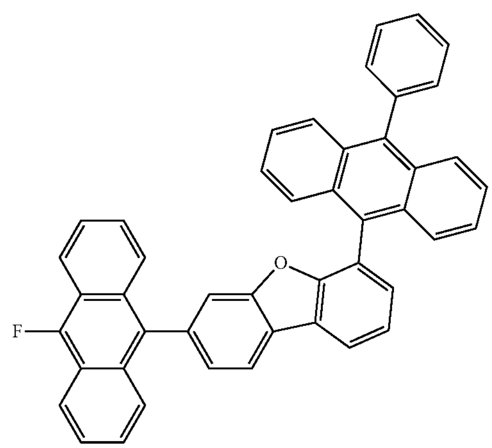
683
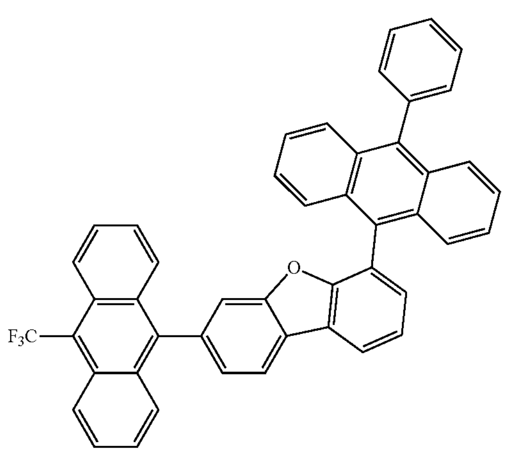
684
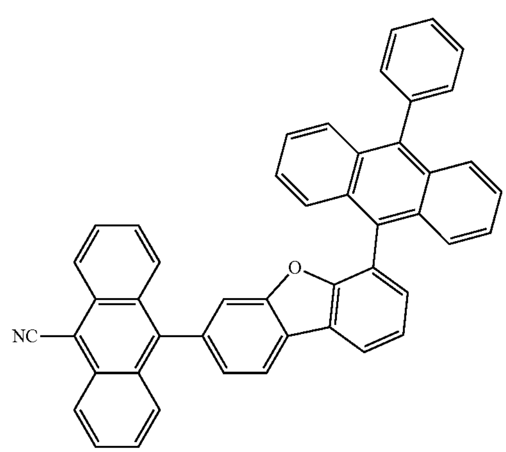

-continued
685
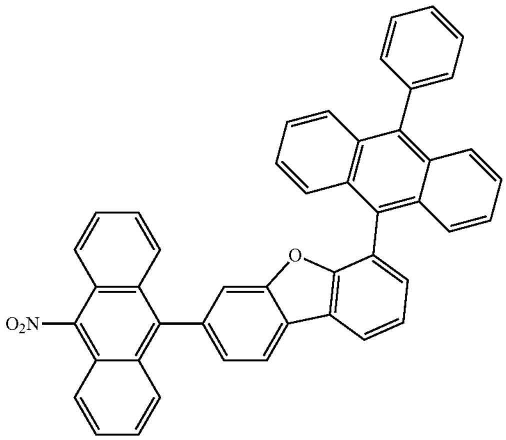
686
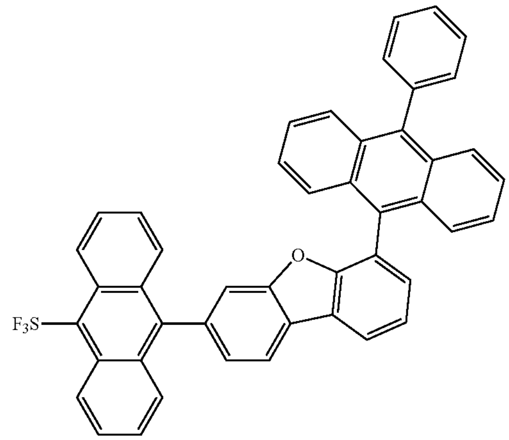
687
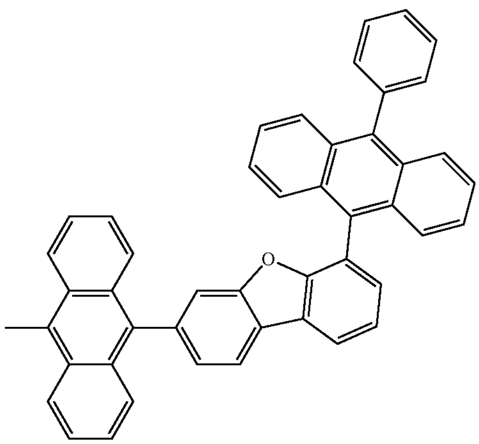
688
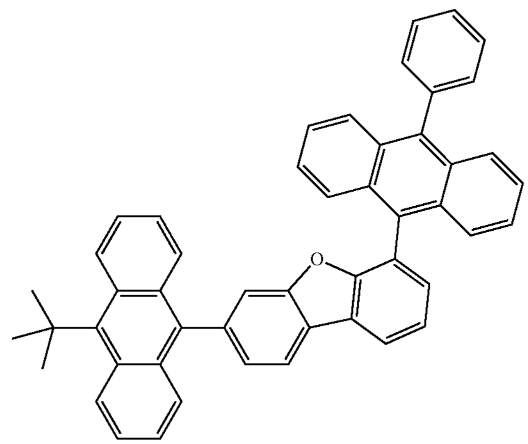
689
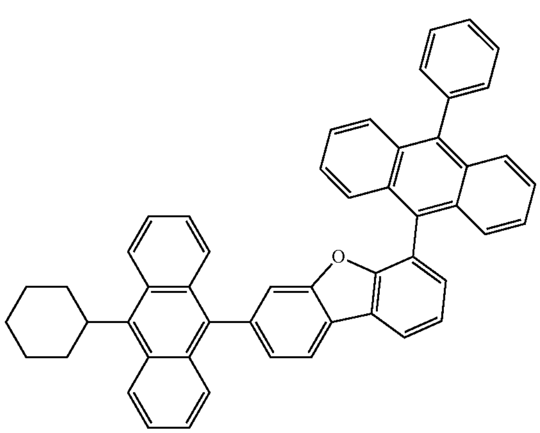
690
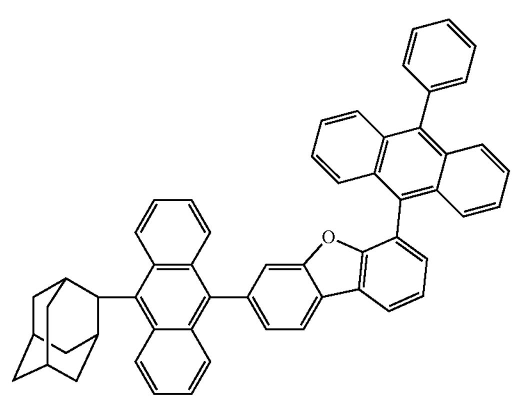

-continued
691
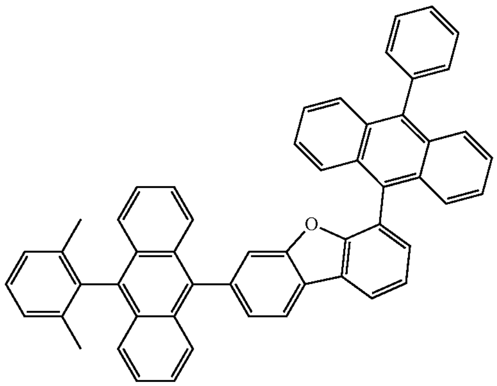
692
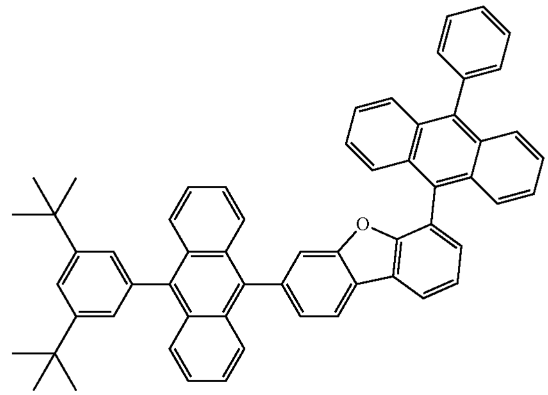
693
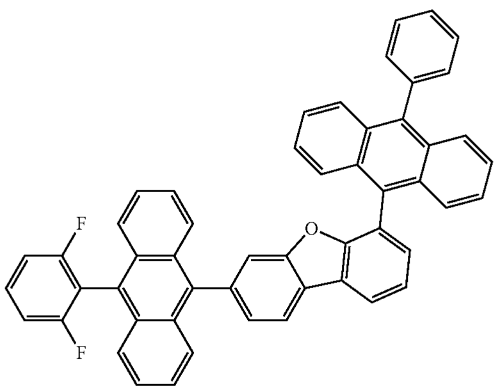
694
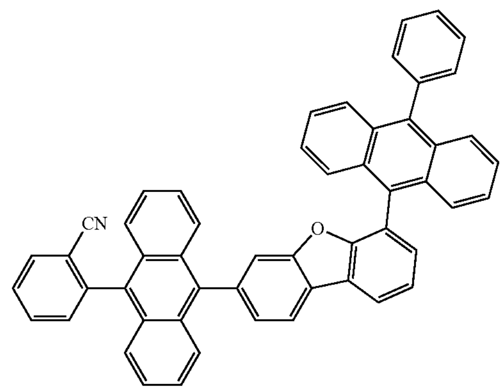
695
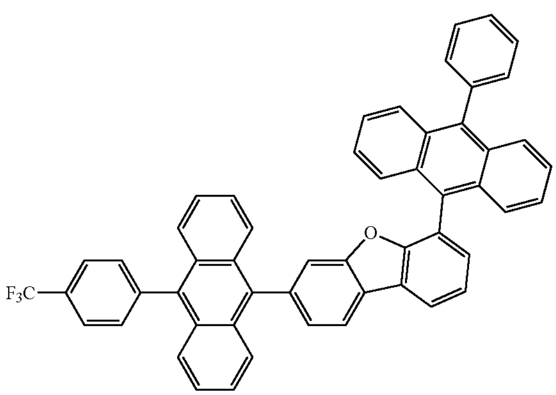
696
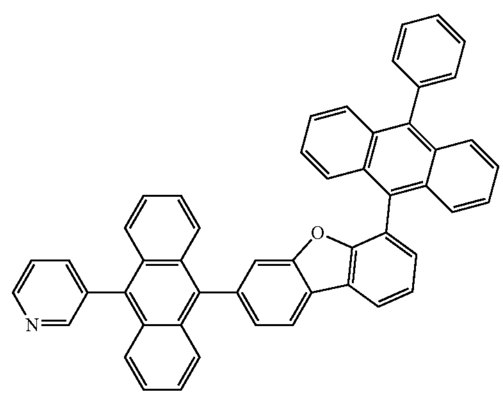
697
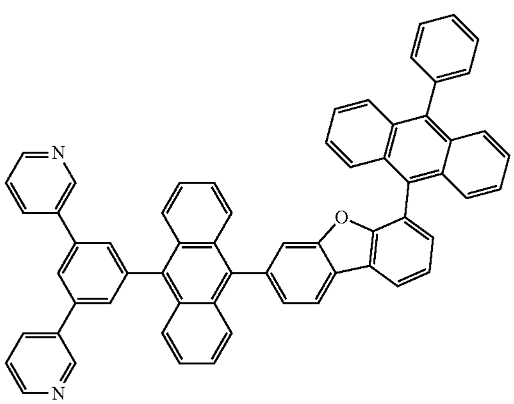
698
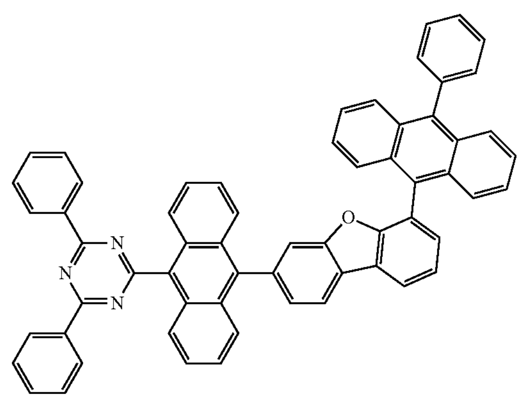

-continued
699
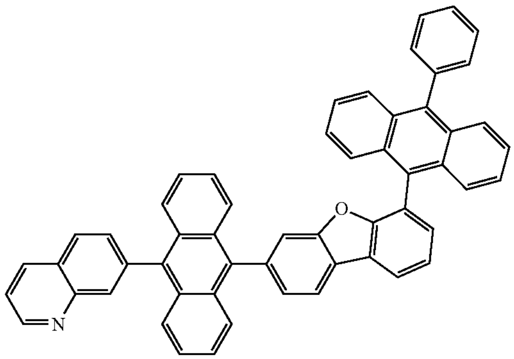
700
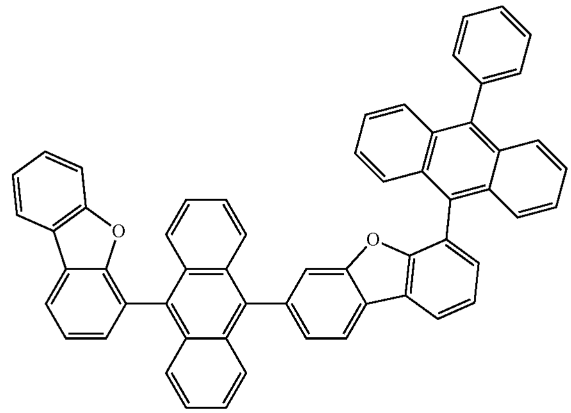
701
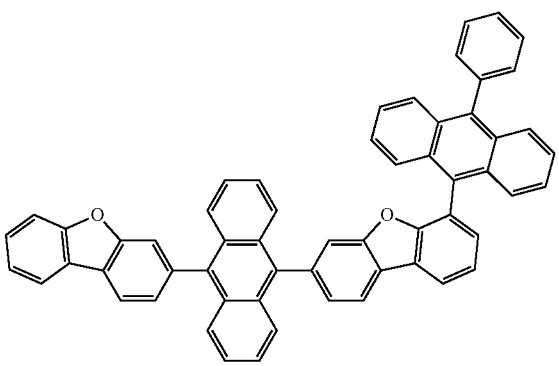
702
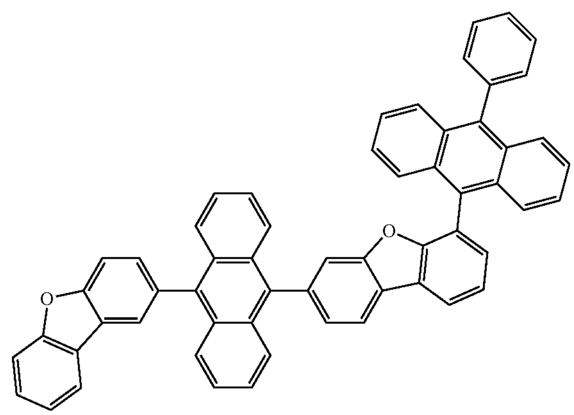
703
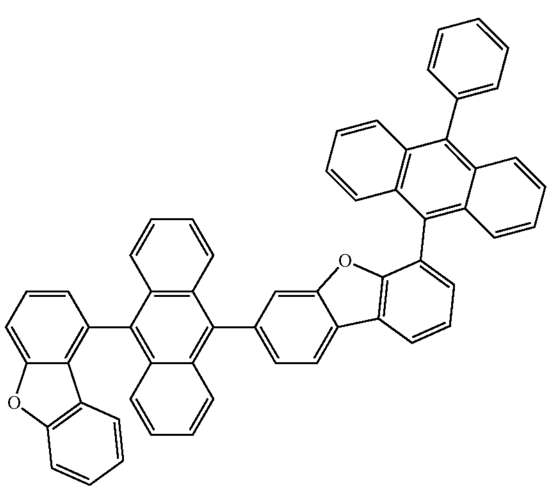
704
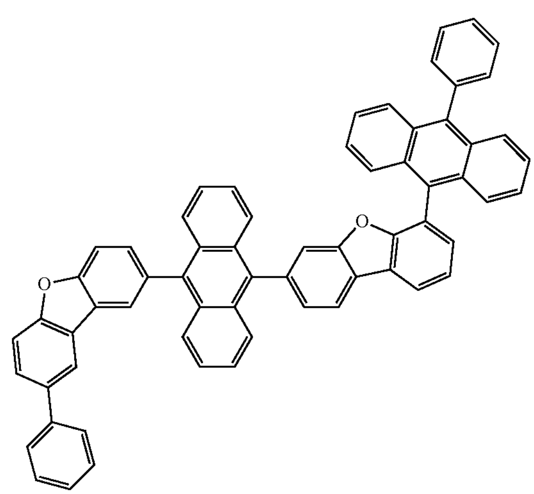

-continued
705
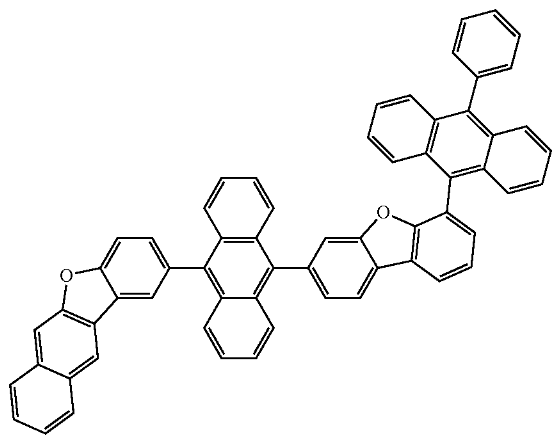
706
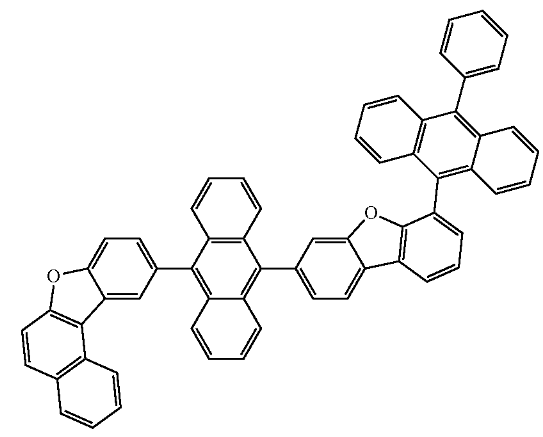
707
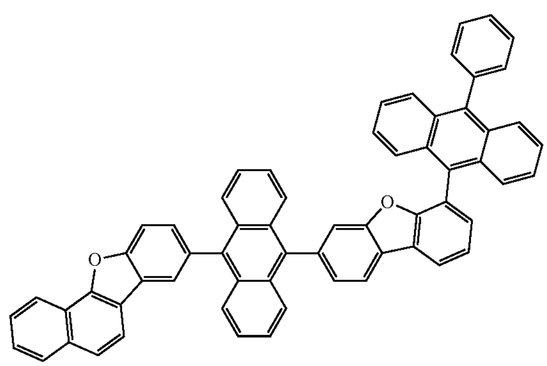
708
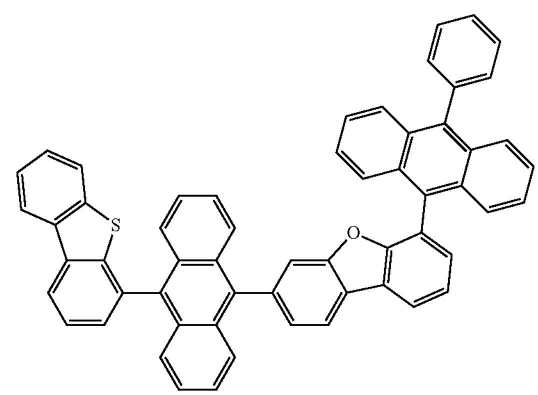
709
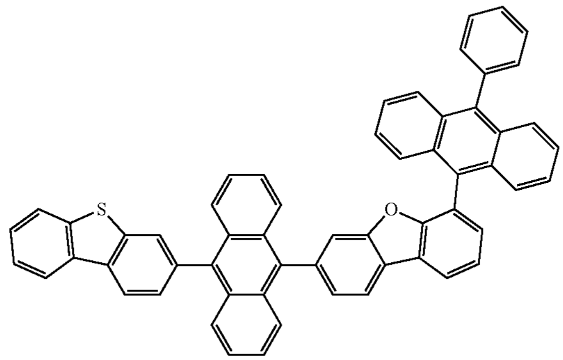
710
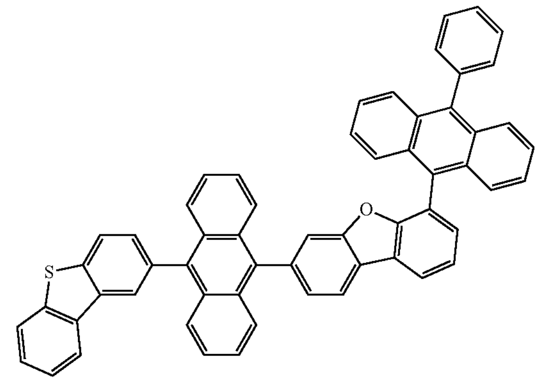

-continued
711
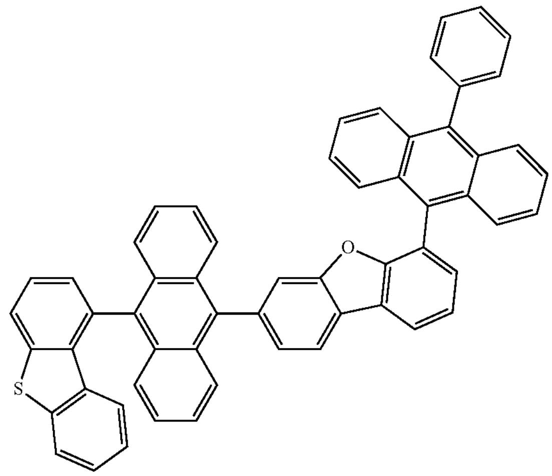
712
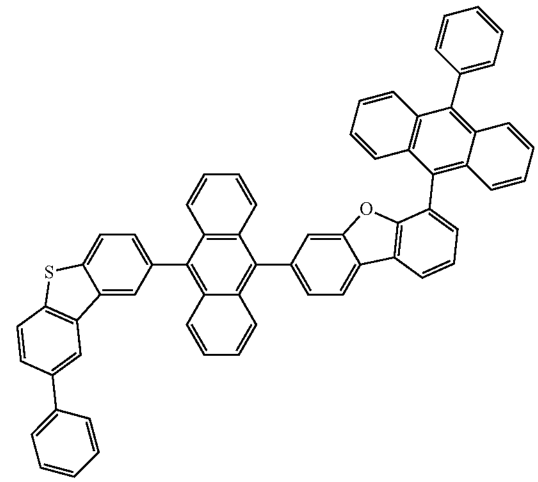
713
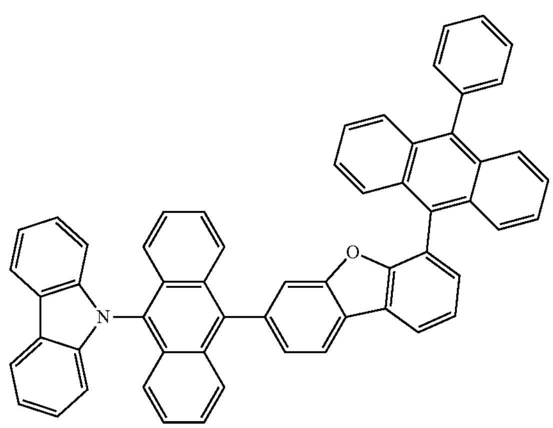
714
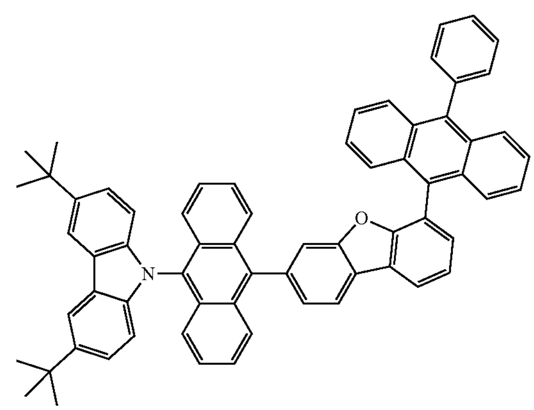
715
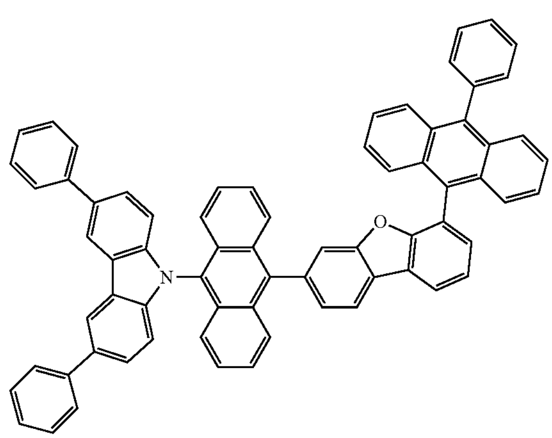
716
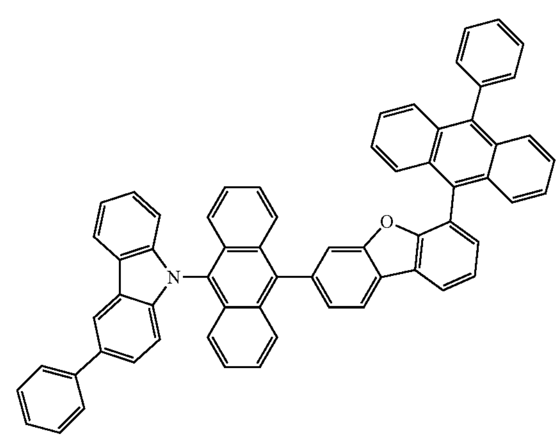

-continued
717
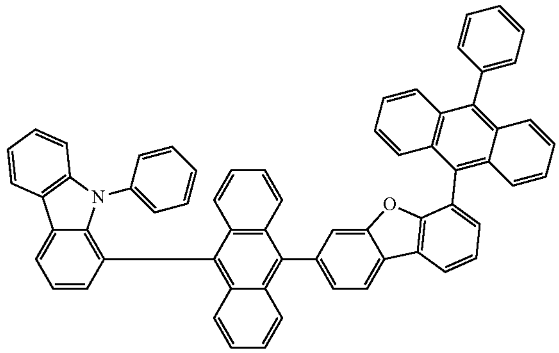
718
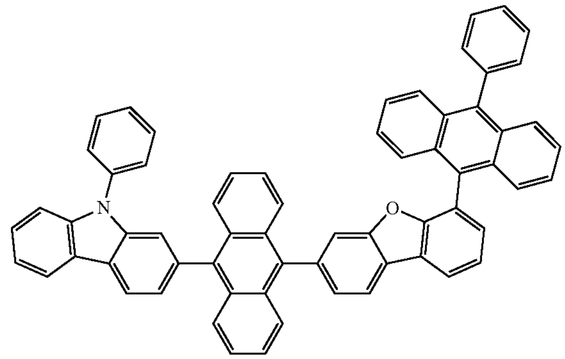
719
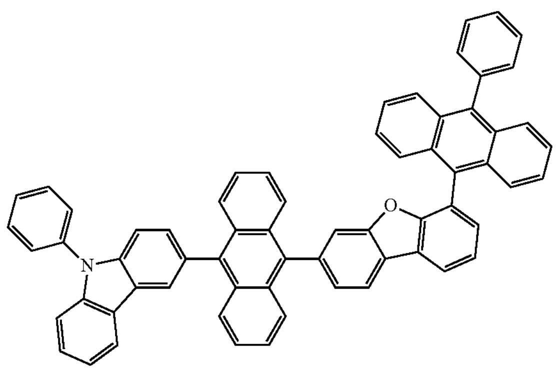
720
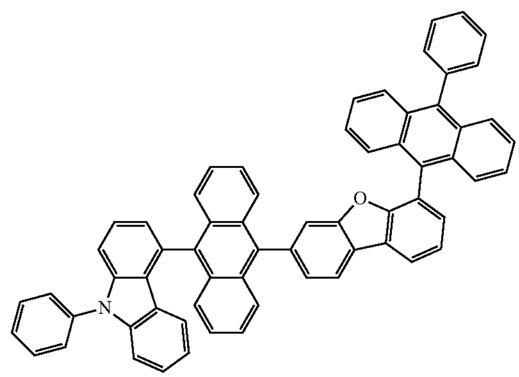
721
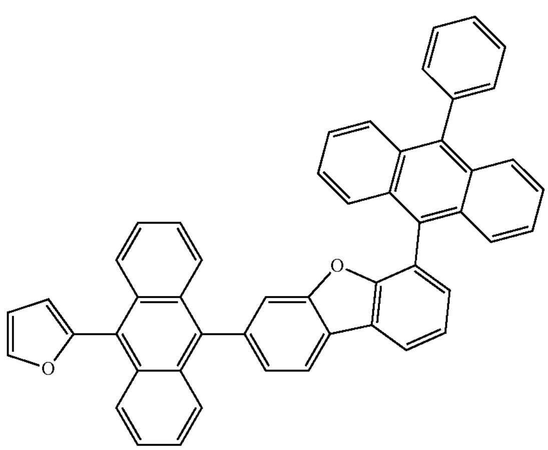
722
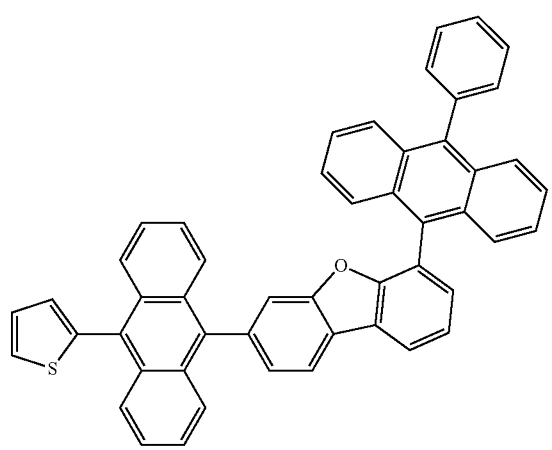

-continued
723
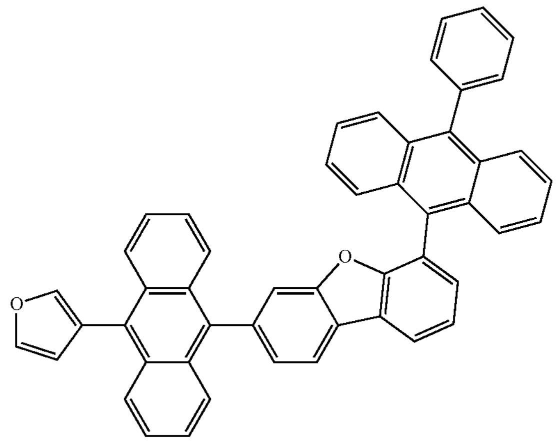
724
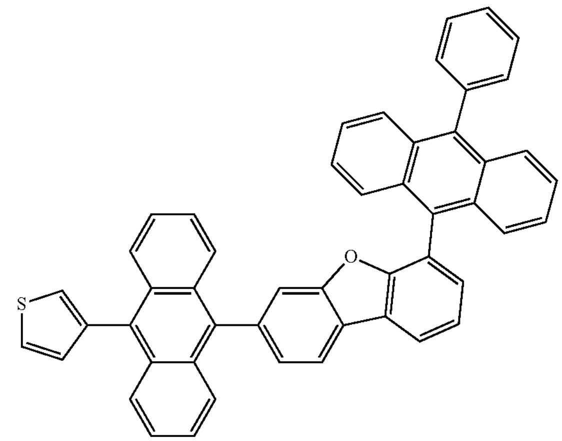
725
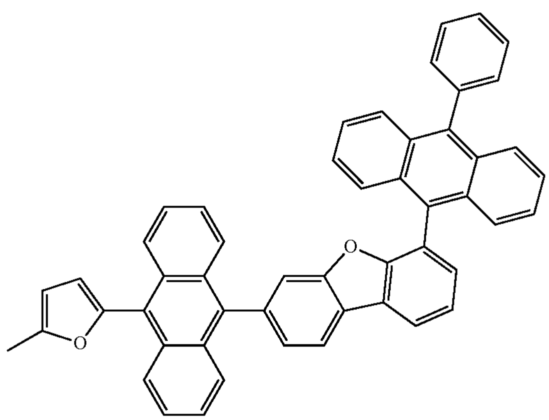
726
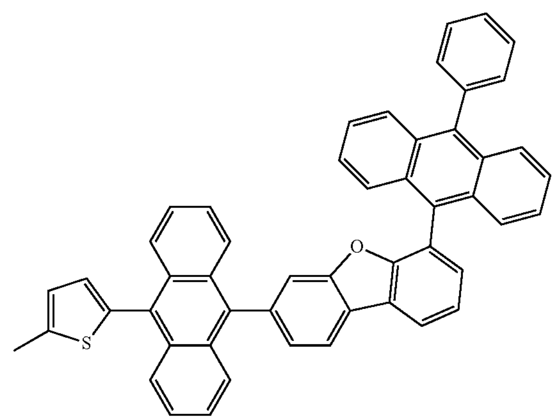
727
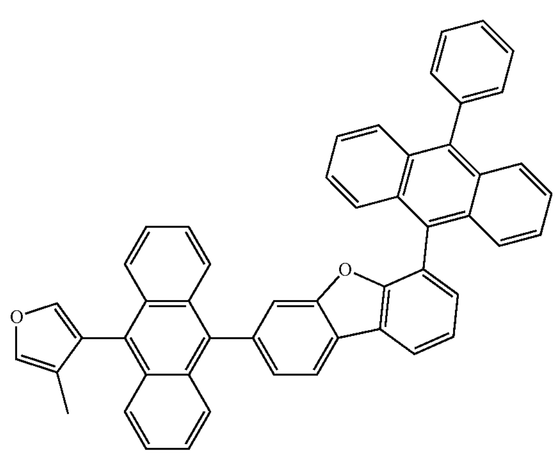
728
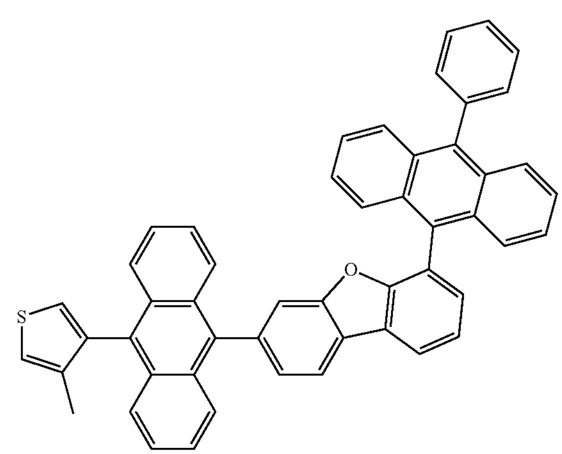

-continued
729
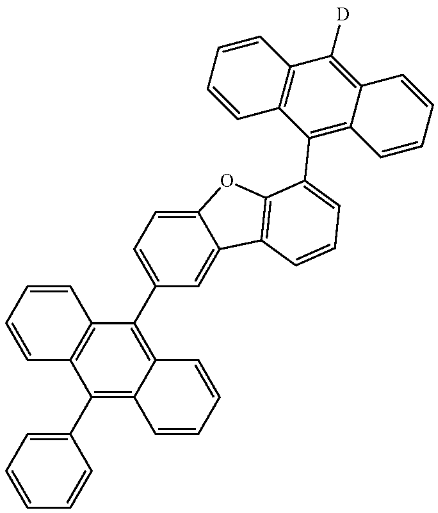
730
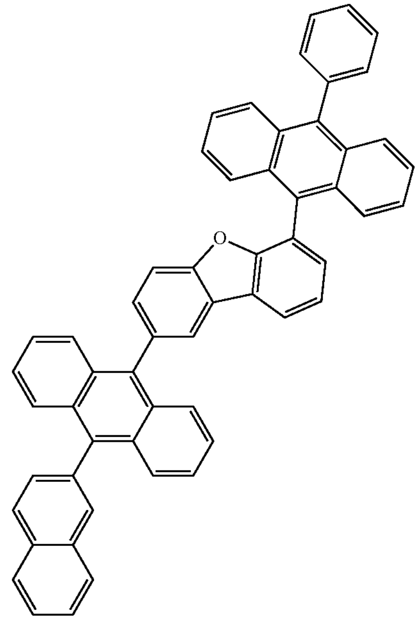
731
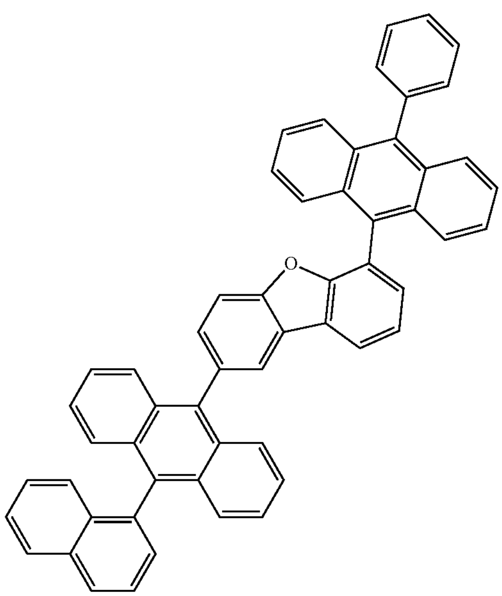
732
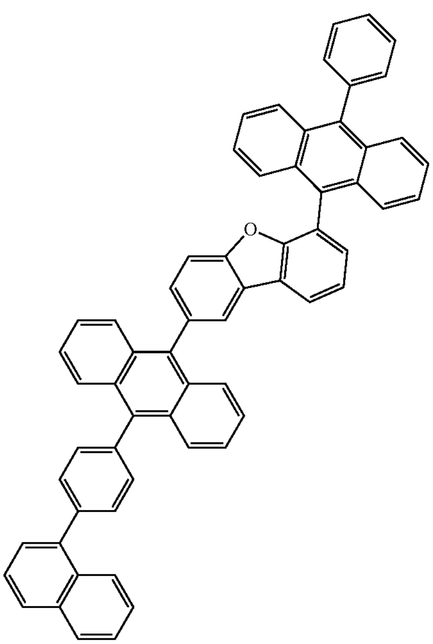

-continued
733
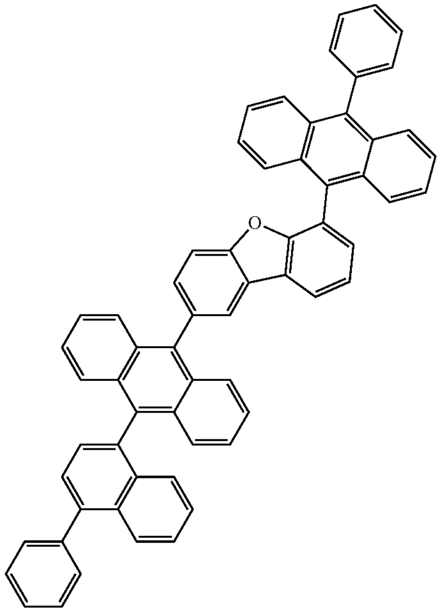
734
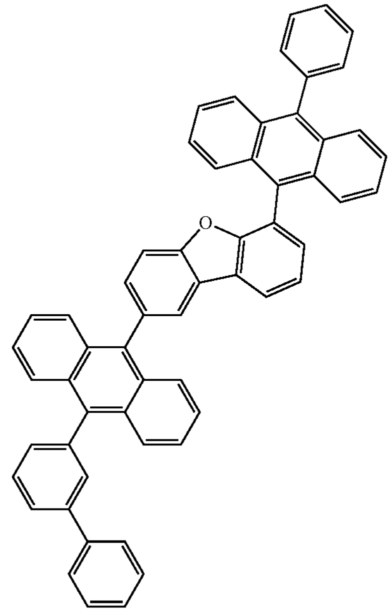
735
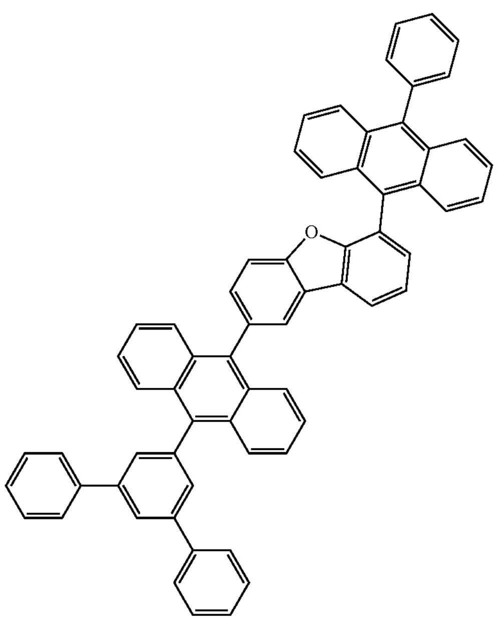
736
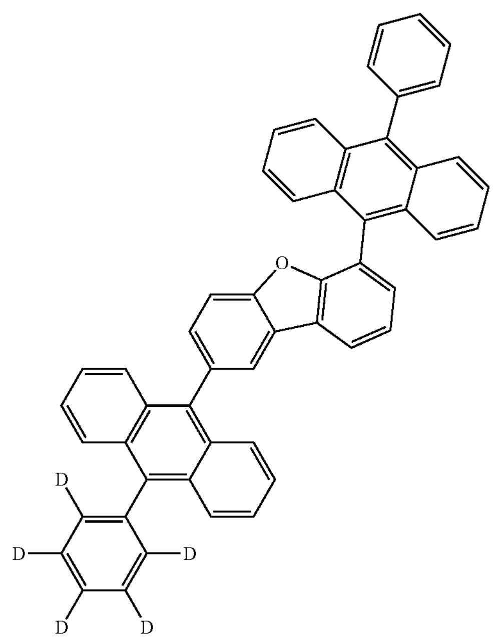

-continued
737
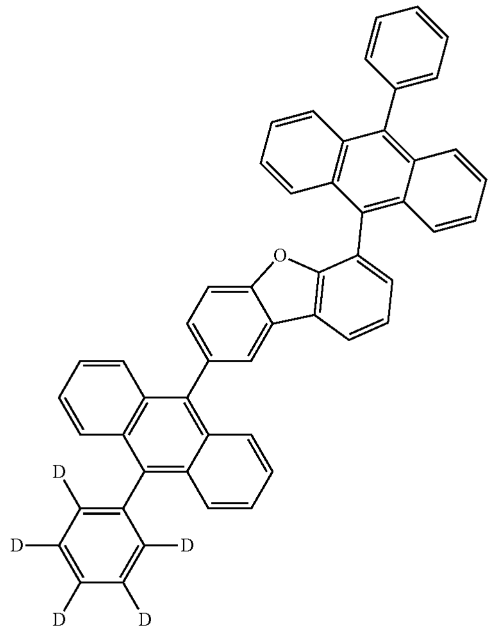
738
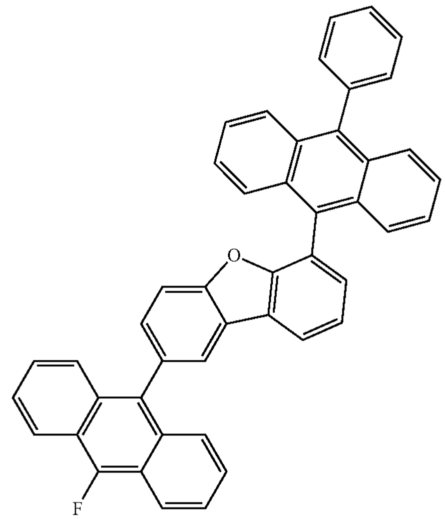
739
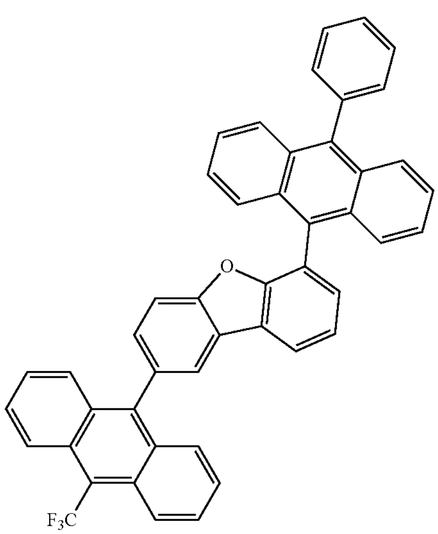
740
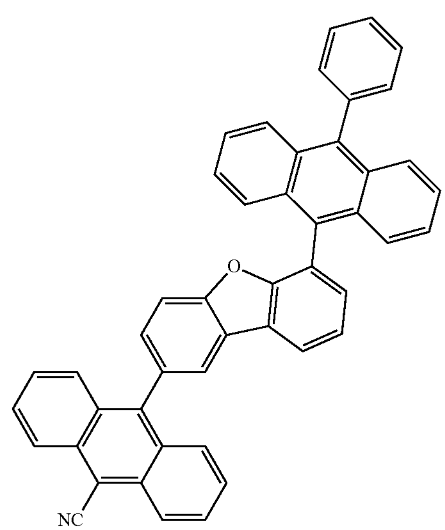

-continued
741
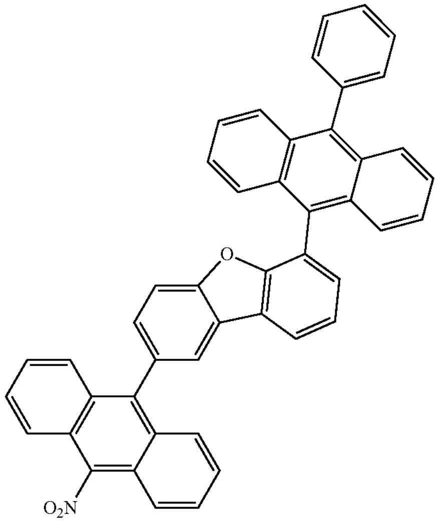
742
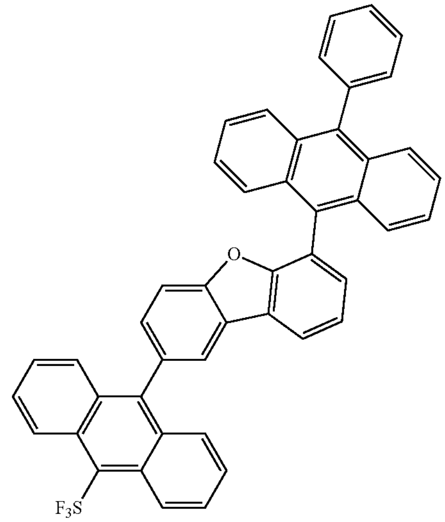
743
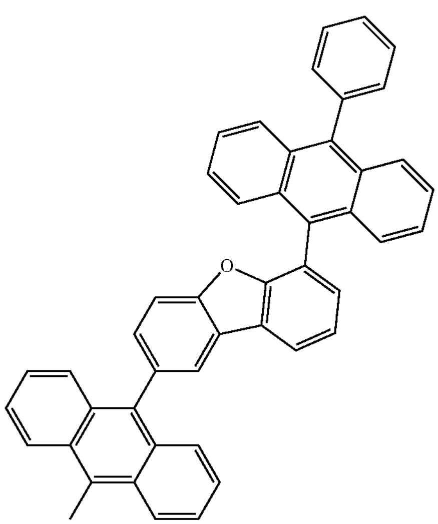
744
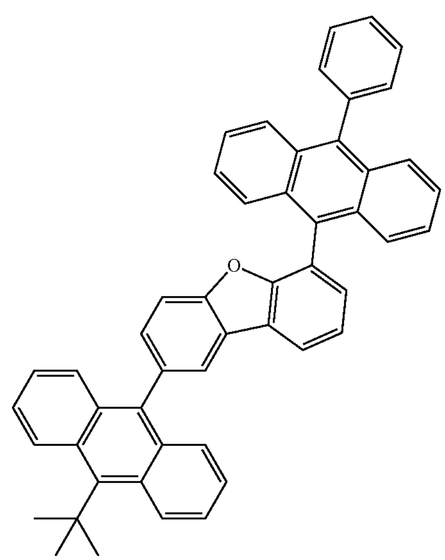

-continued
745
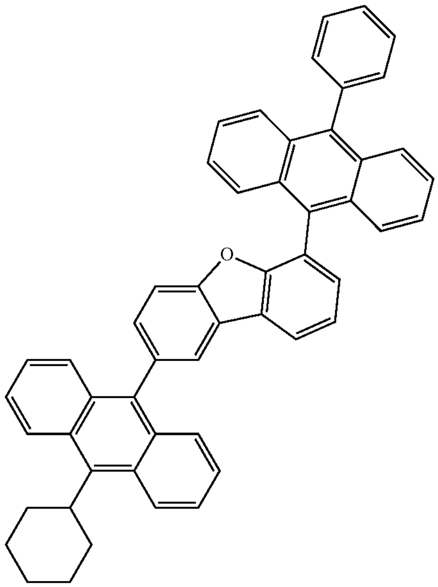
746
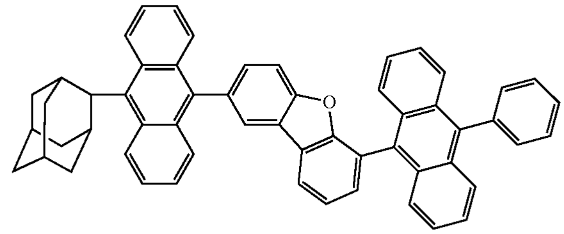
747
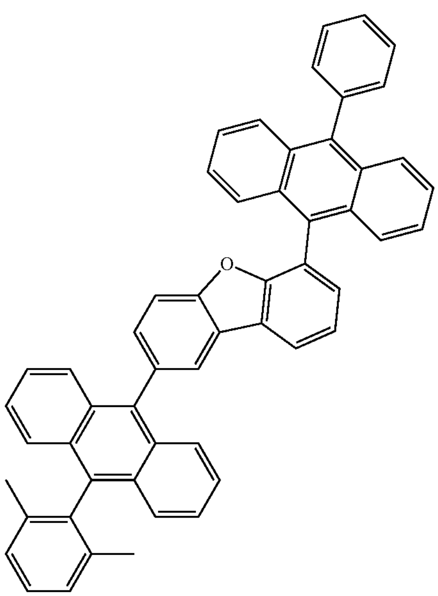
748
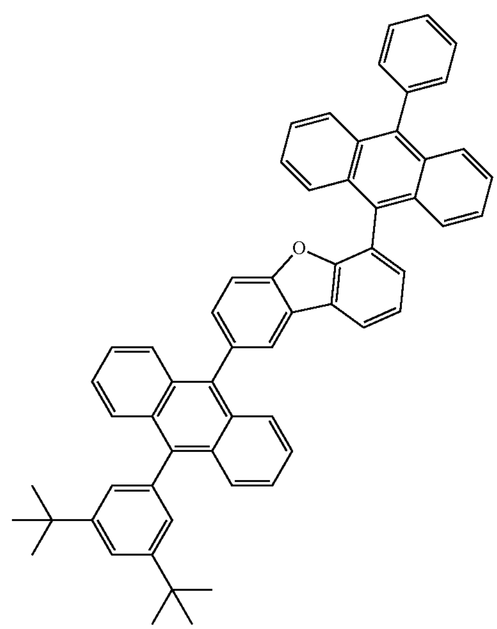

-continued
749
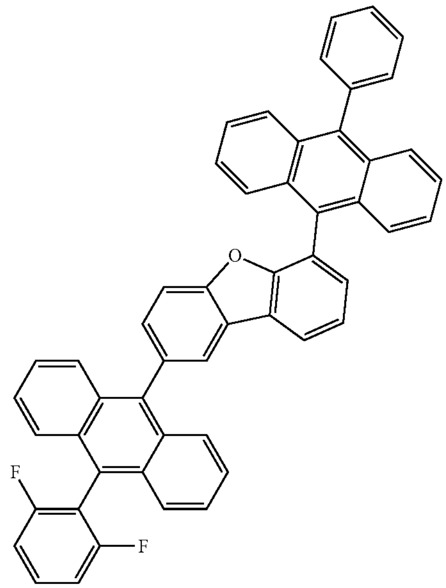
750
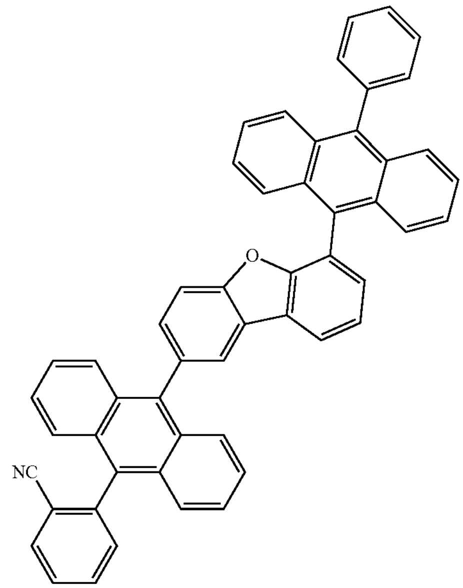
751
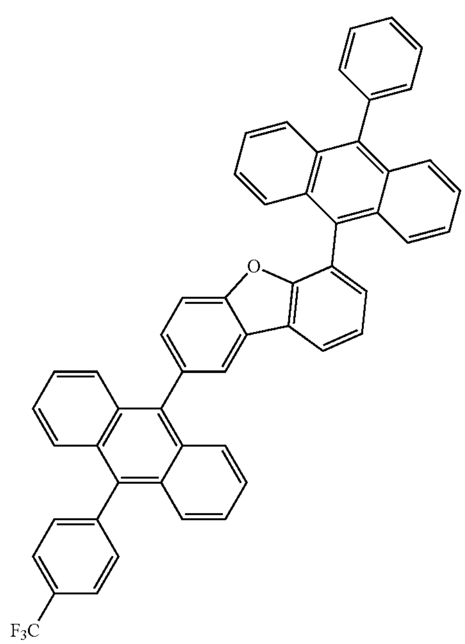
752
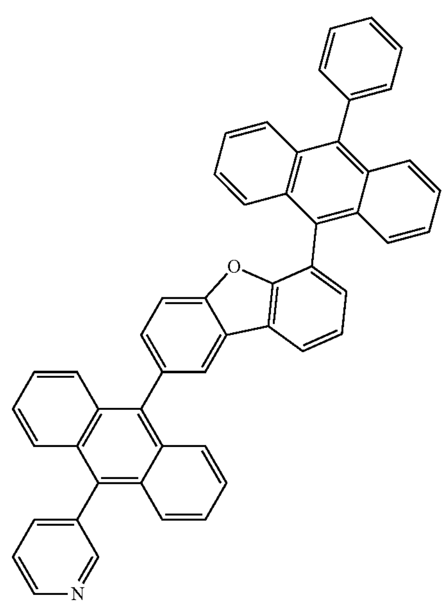

-continued
753
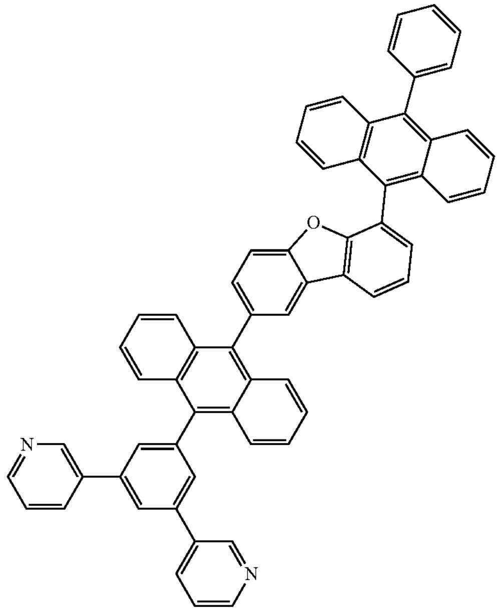
754
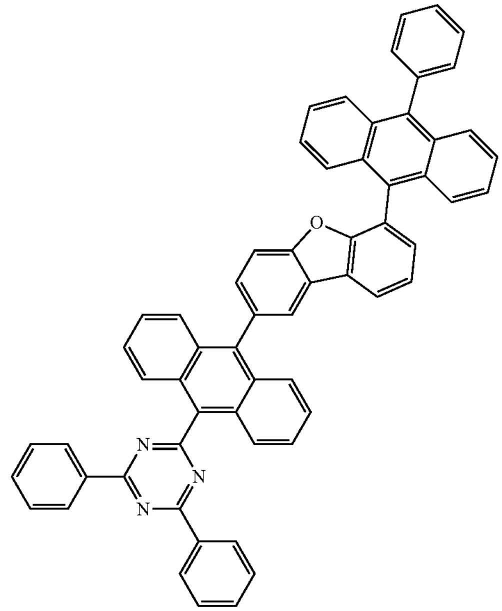
755
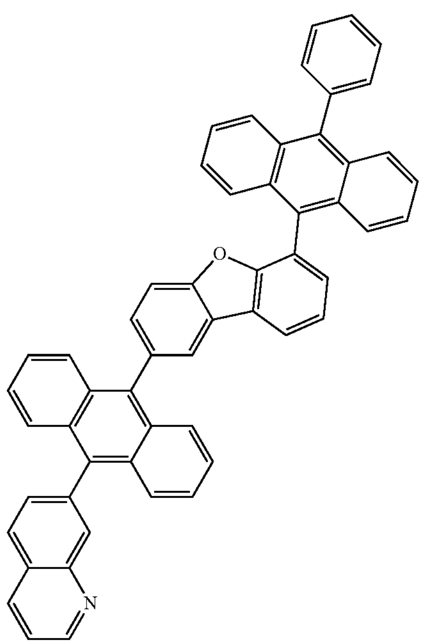
756
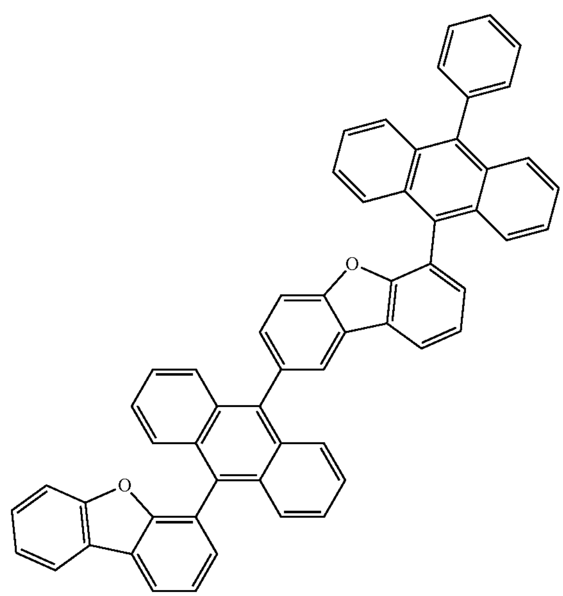

-continued
757
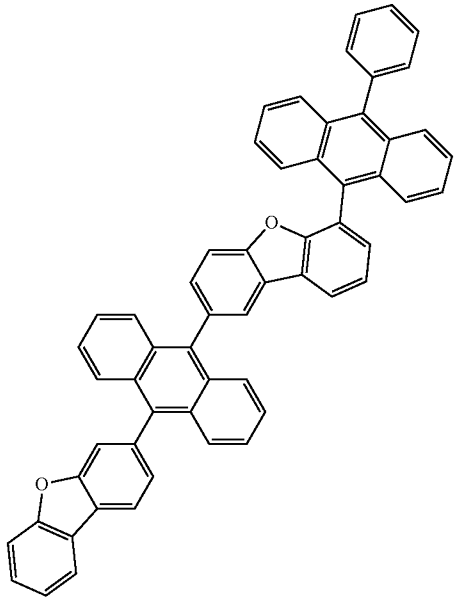
758
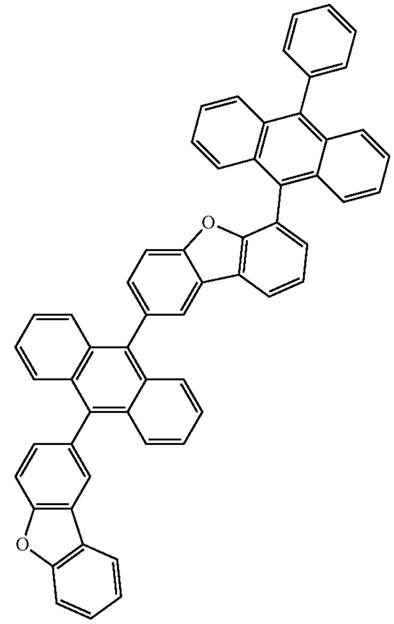
759
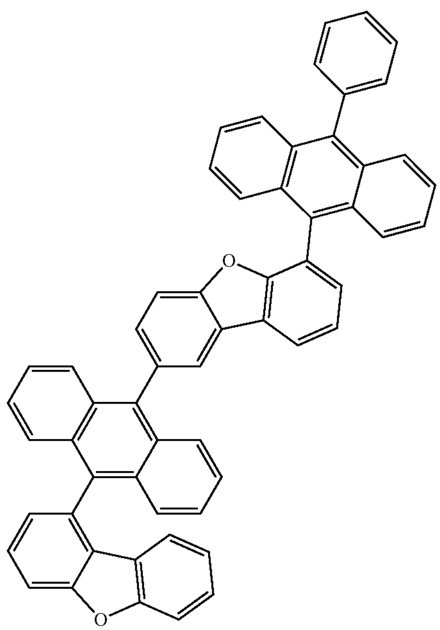
760
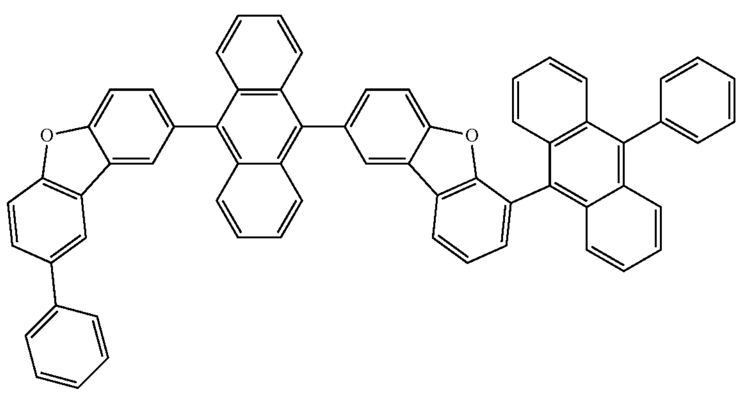

-continued
761
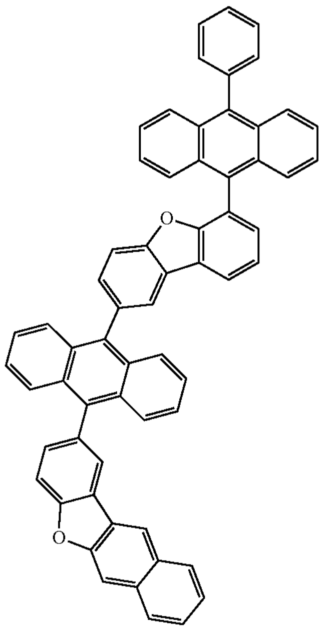
762
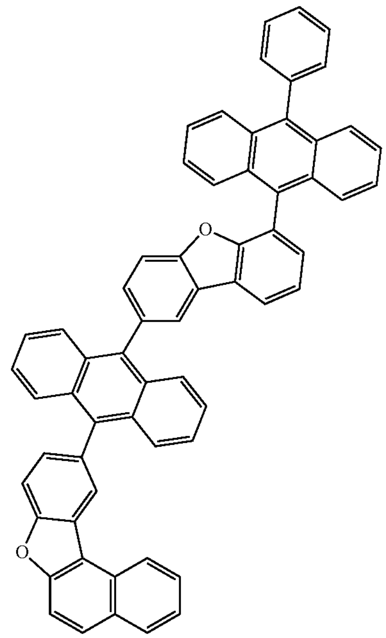
763
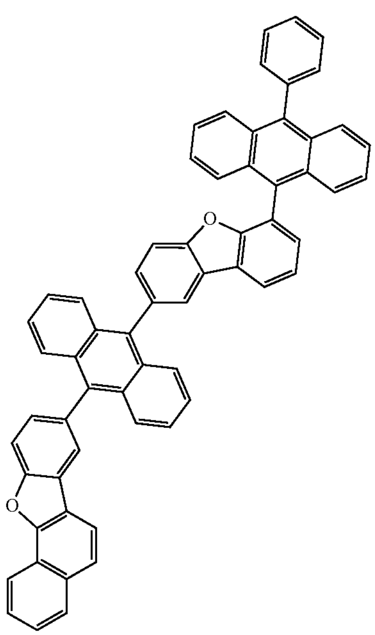
764
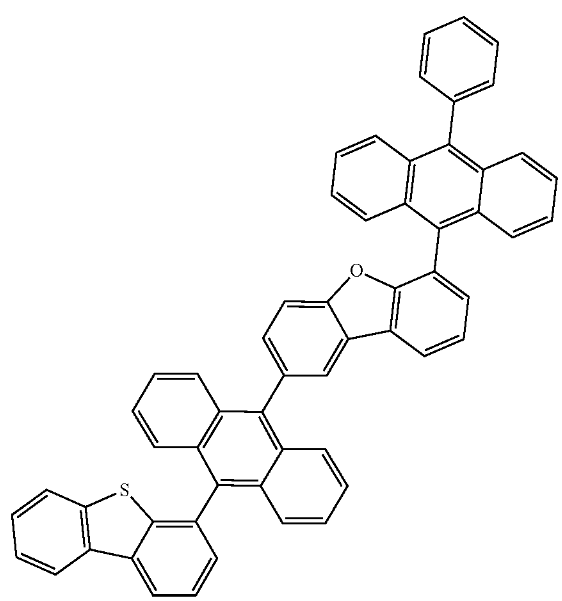

-continued
765
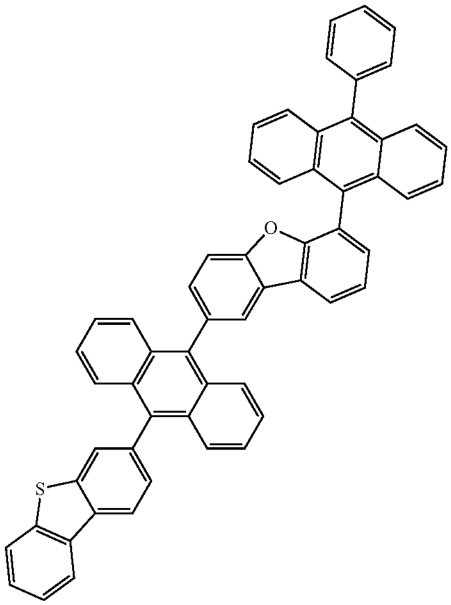
766
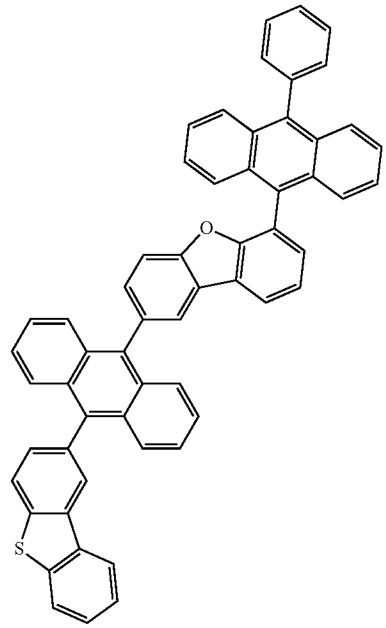
767
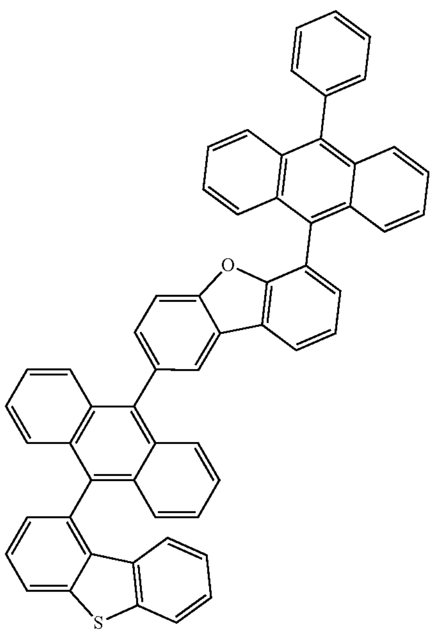
768
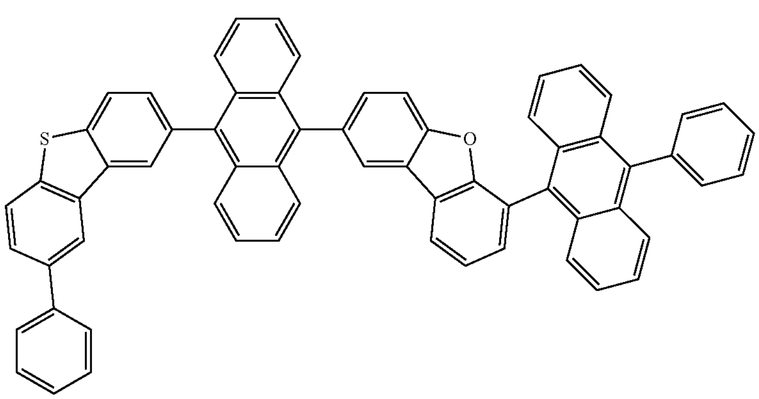

-continued
769
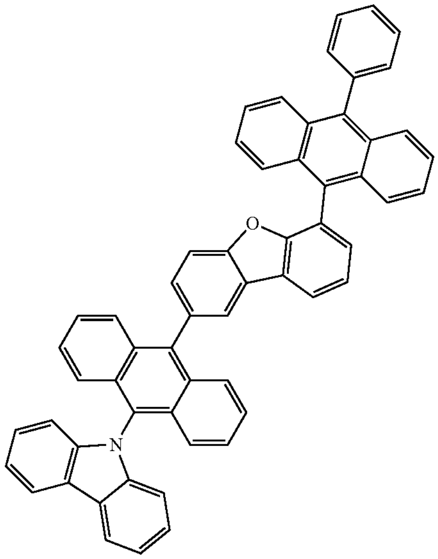
770
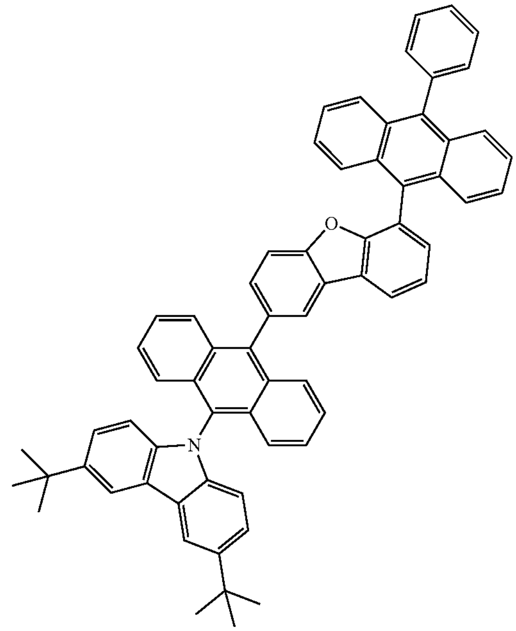
771
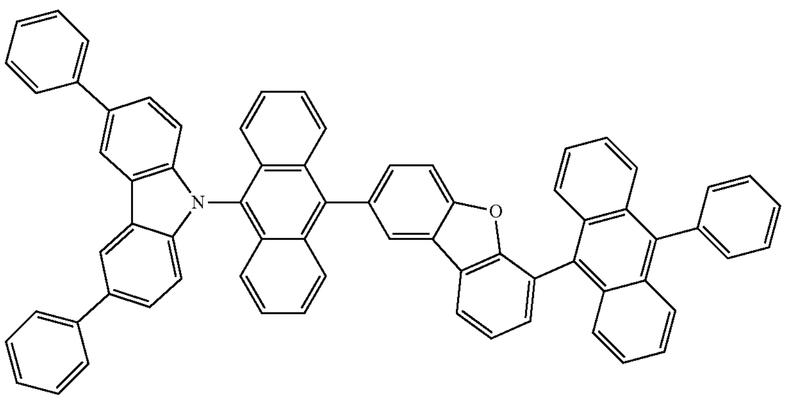
772
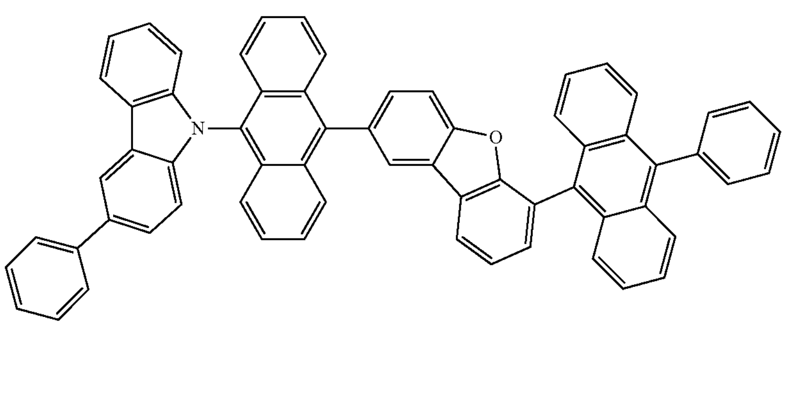

-continued
773
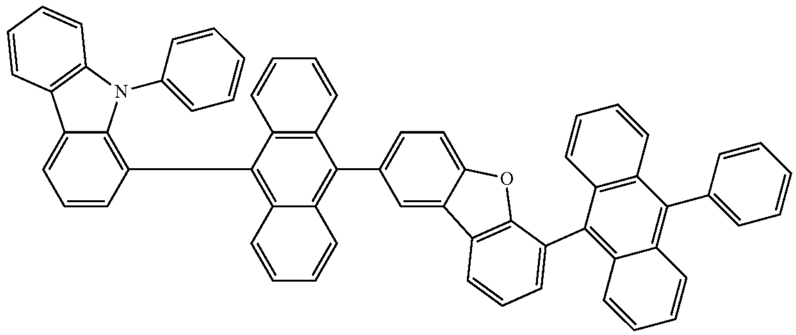
774
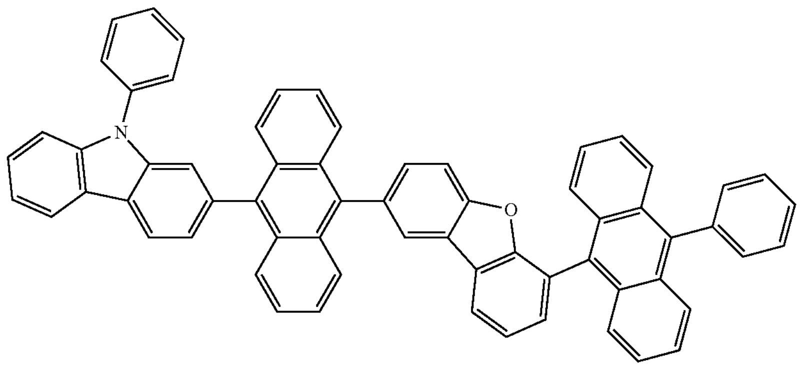
775
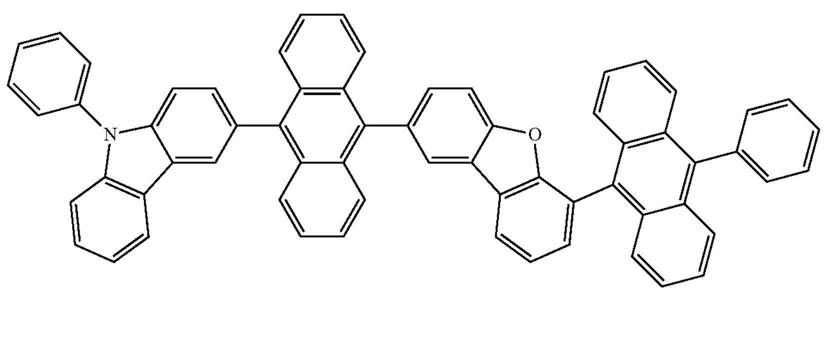
776
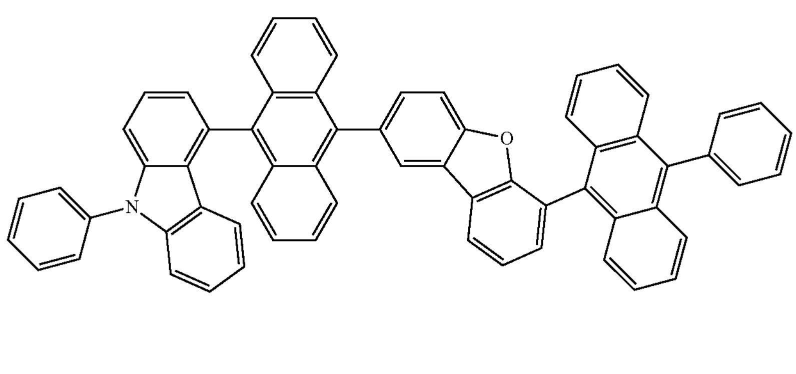

-continued
777
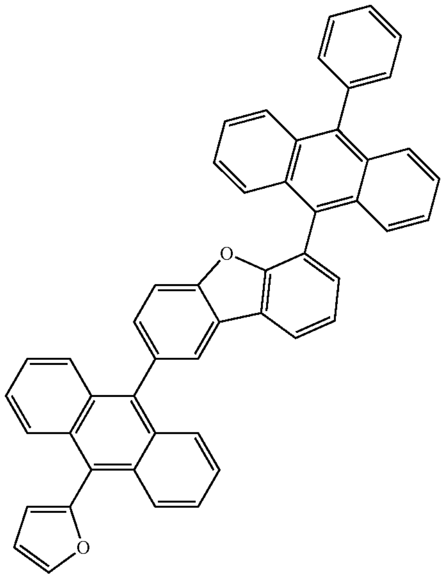
778
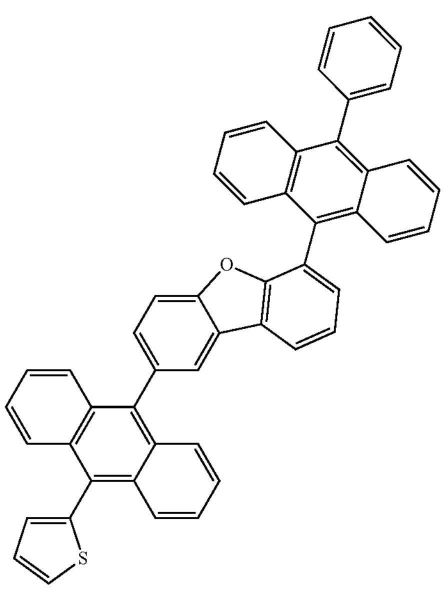
779
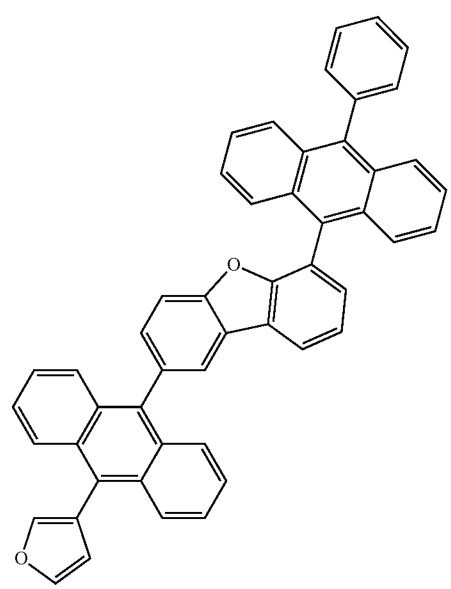

-continued
780
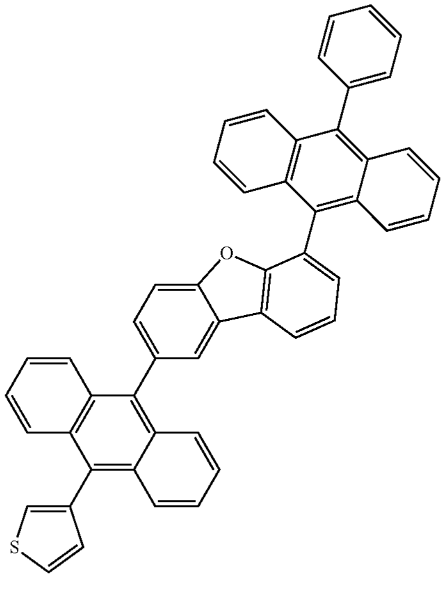
781
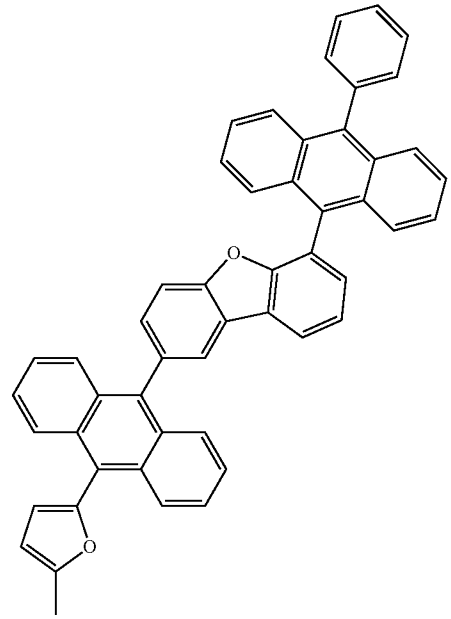
782
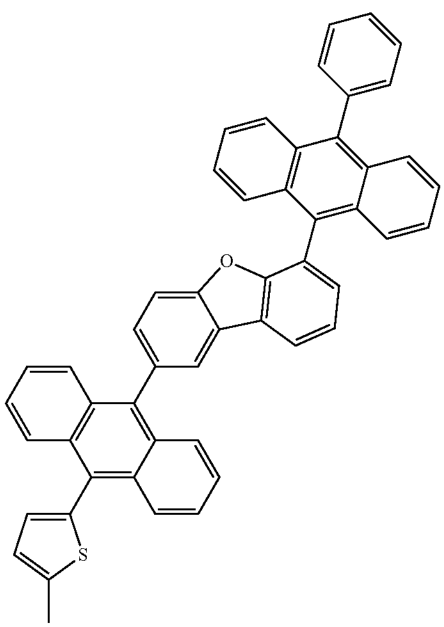
783
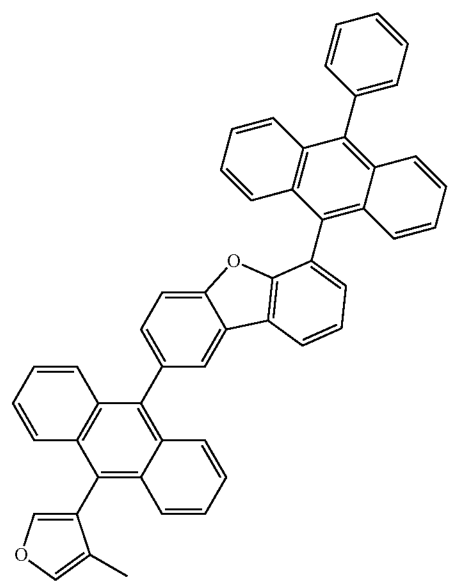

-continued
784
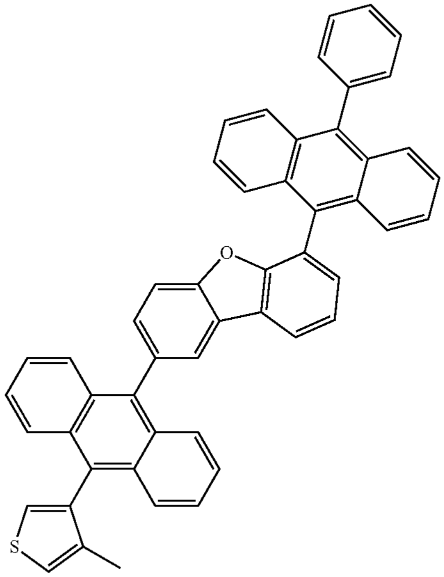
785
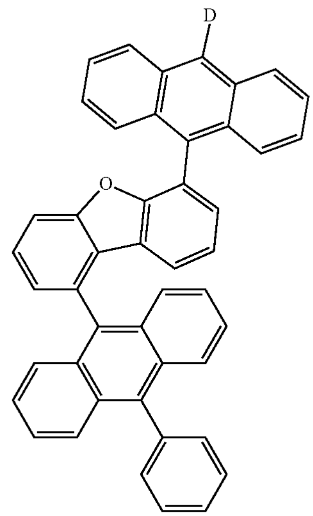
786
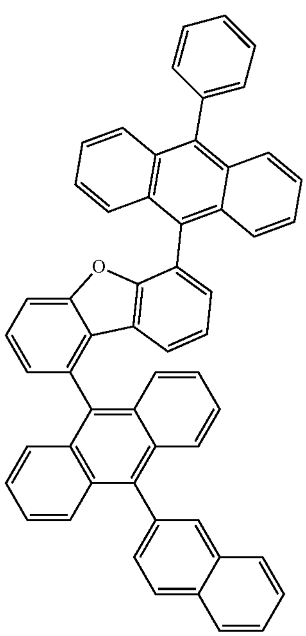
787
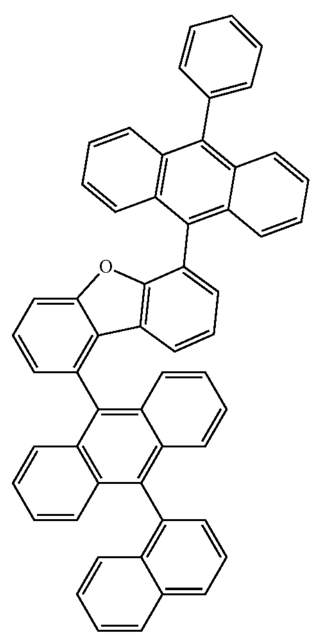

-continued
788
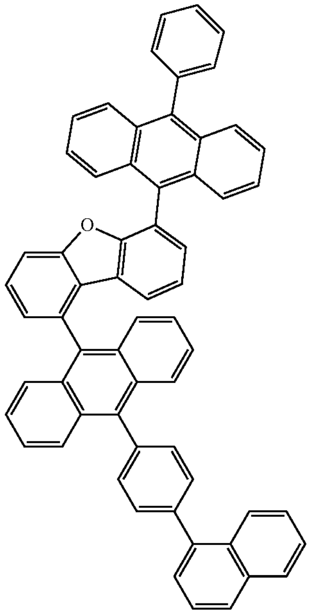
789
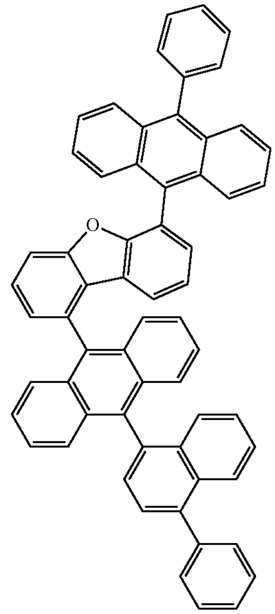
790
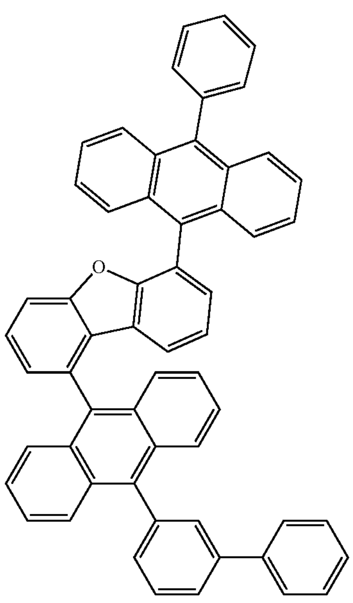
791
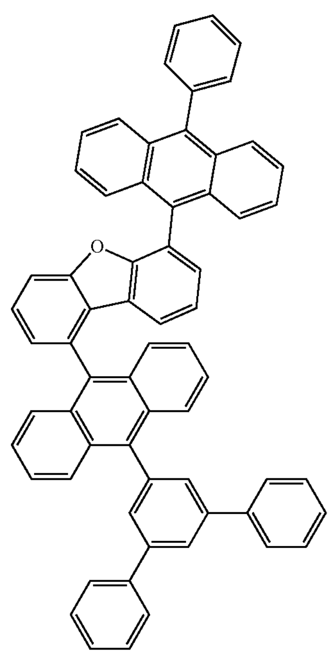

-continued
792
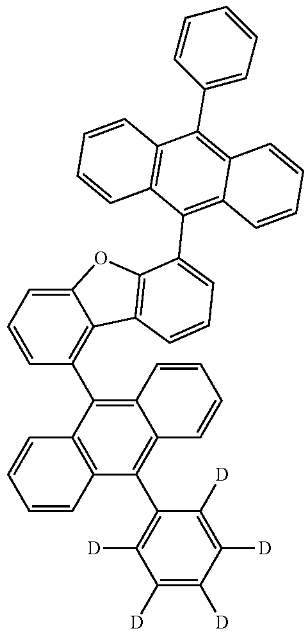
793
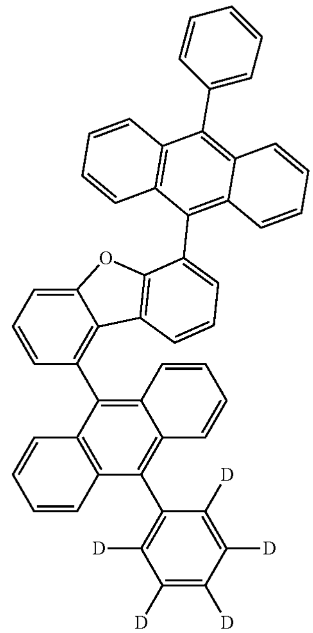
794
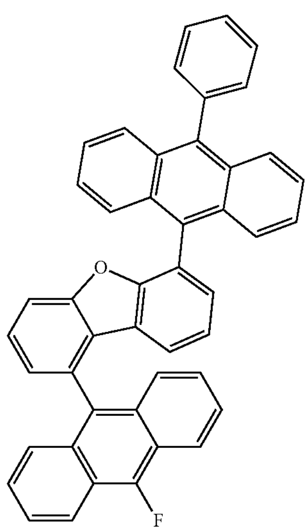
795
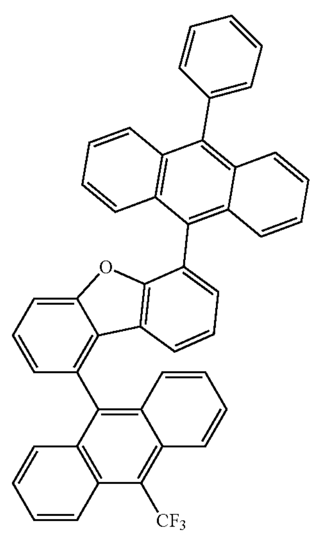

-continued
796
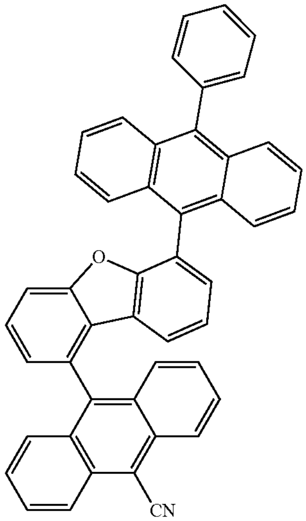
797
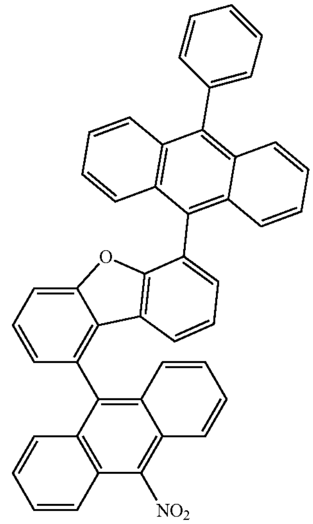
798
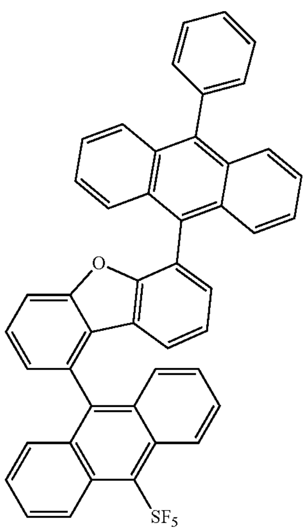
799
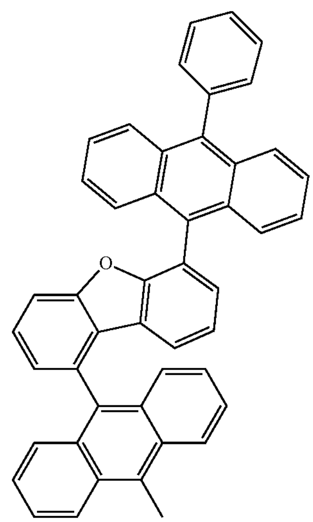
800
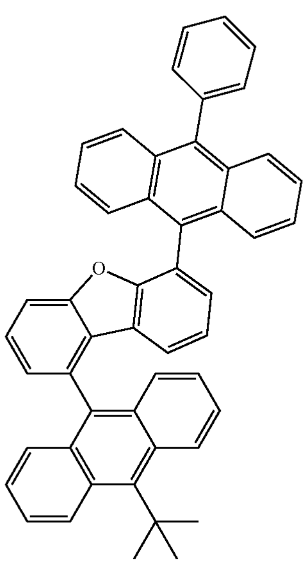
801
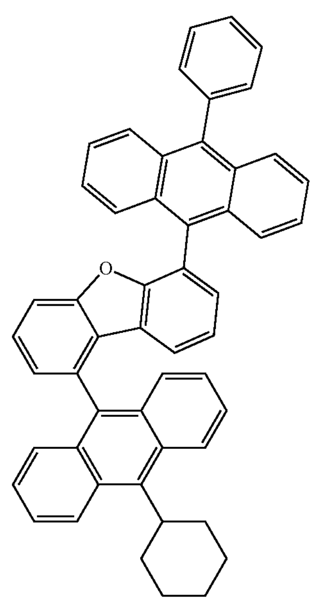

-continued
802
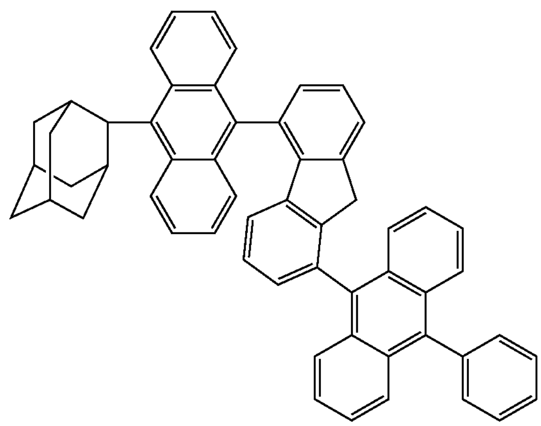
803
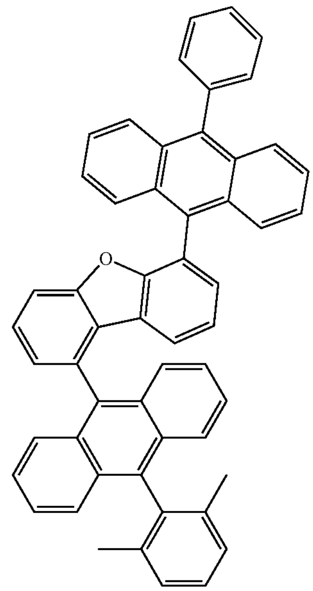
804
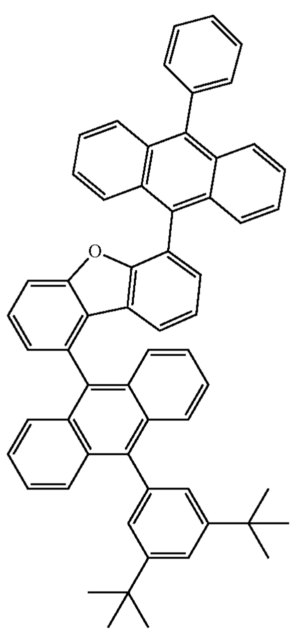
805
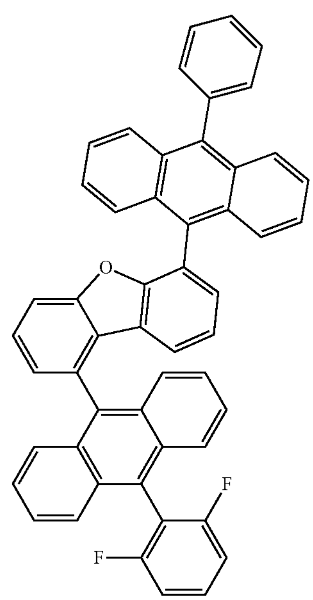

-continued
806
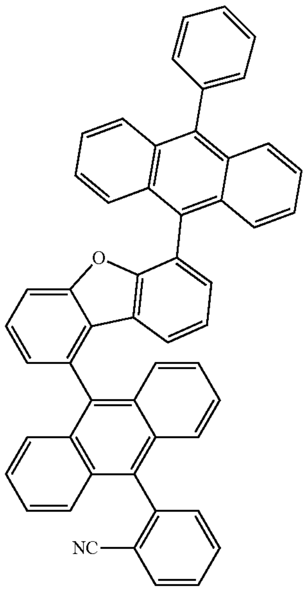
807
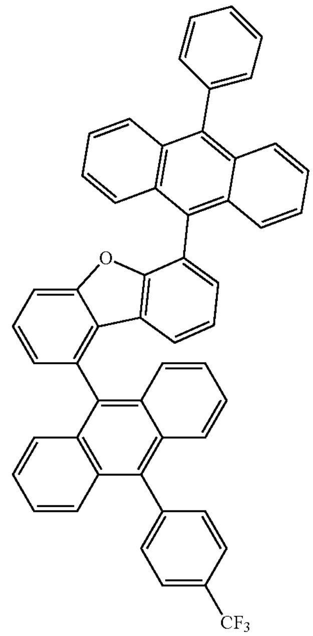
808
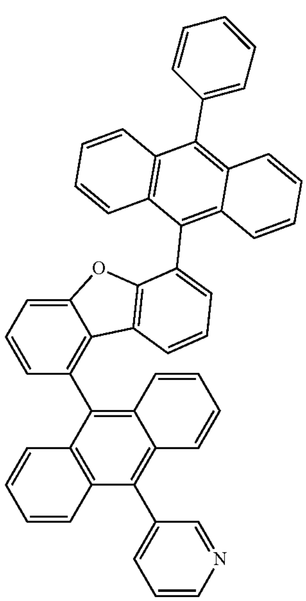
809
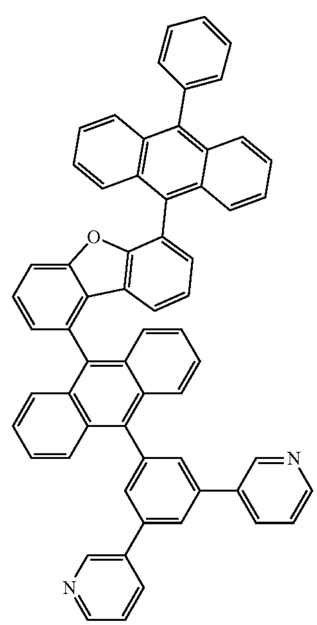

-continued
810
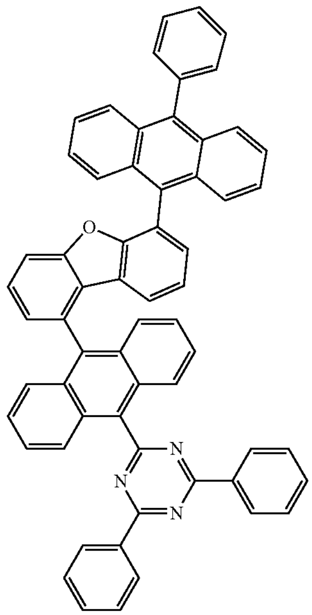
811
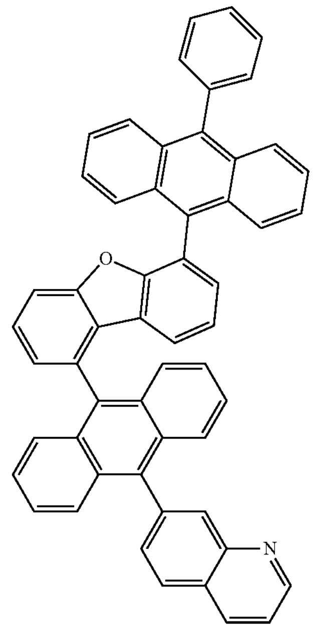
812
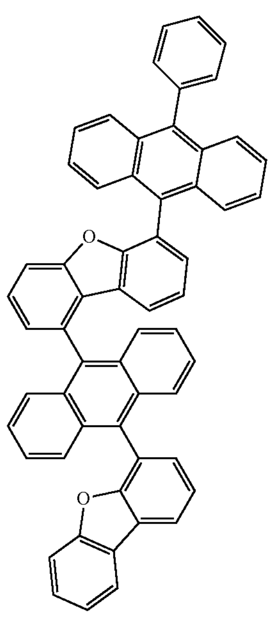
813
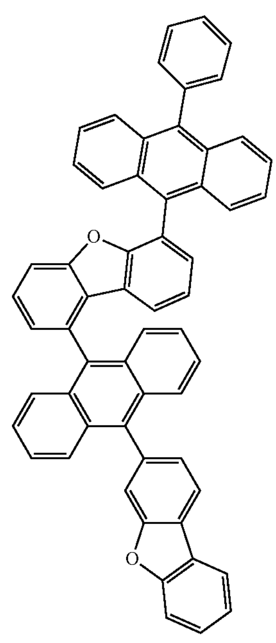

-continued
814
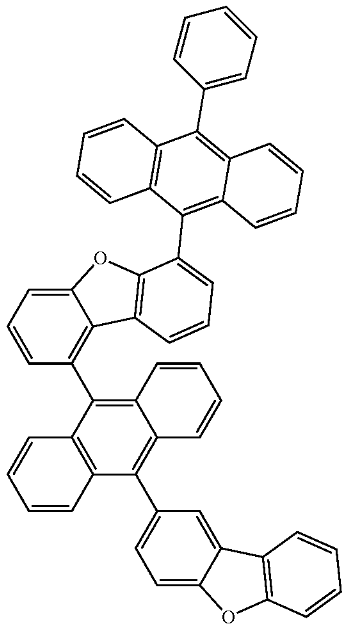
815
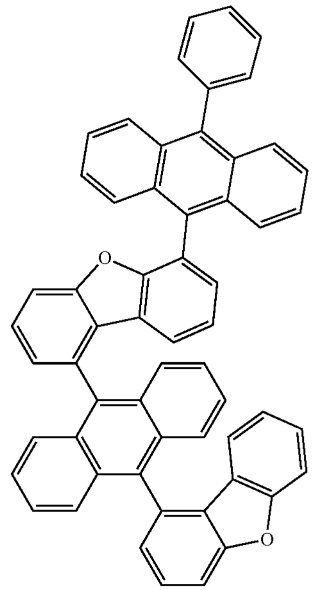
816
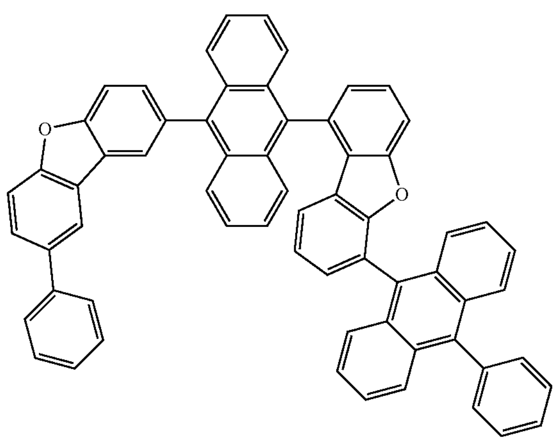
817
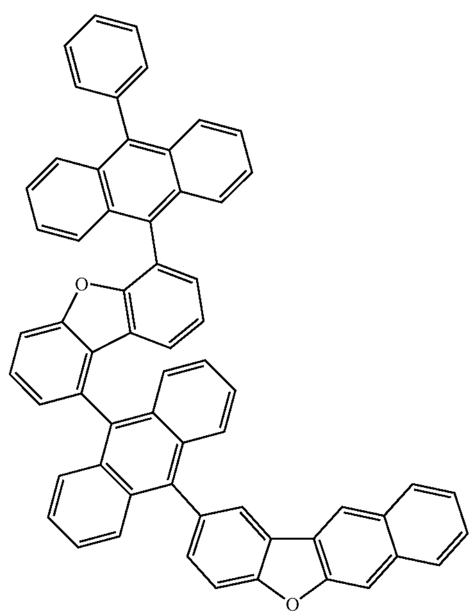

-continued
818
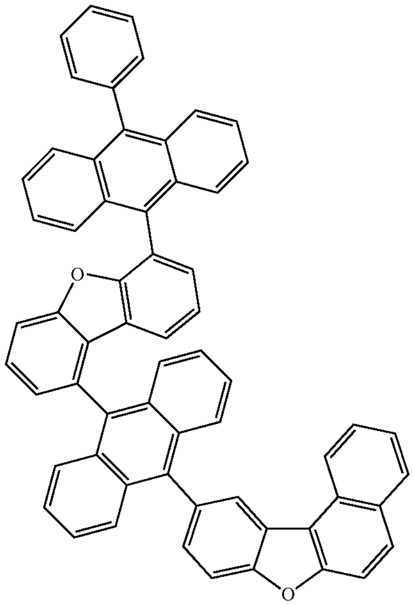
819
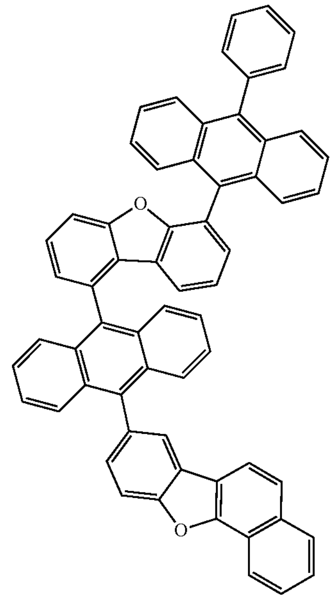
820
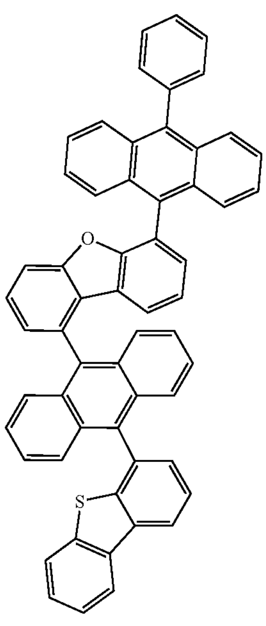
821
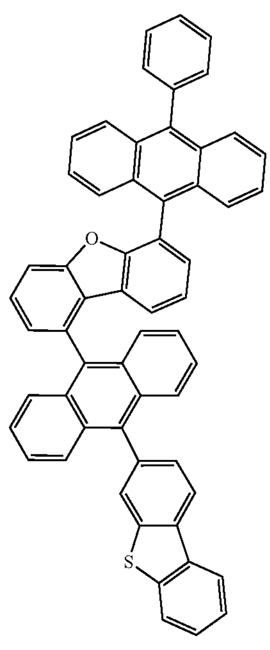

-continued
822
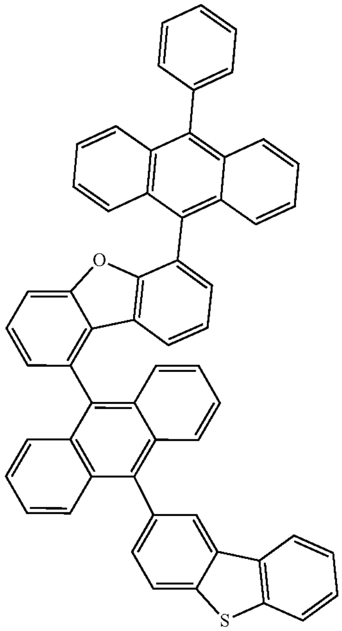
823
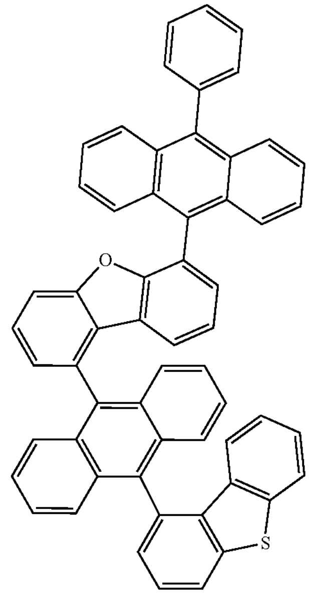
824
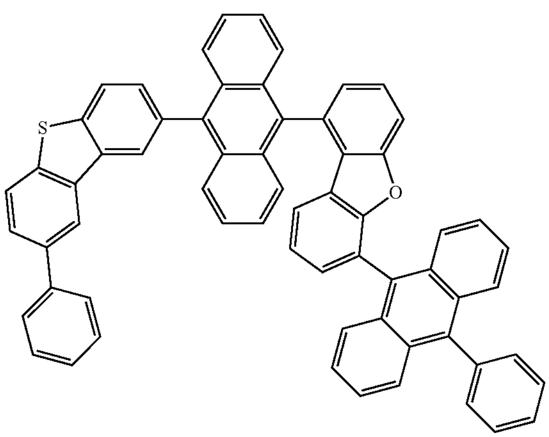
825
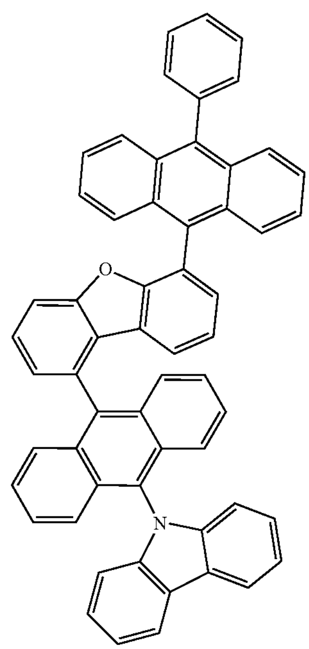

-continued
826
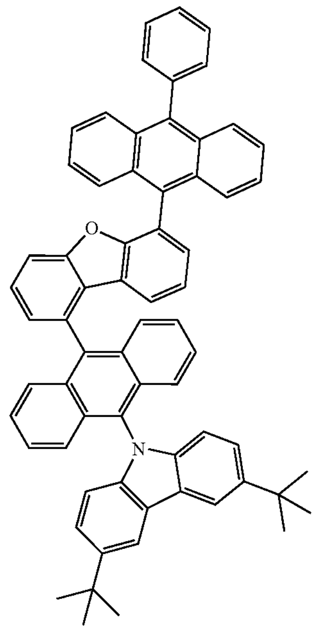
827
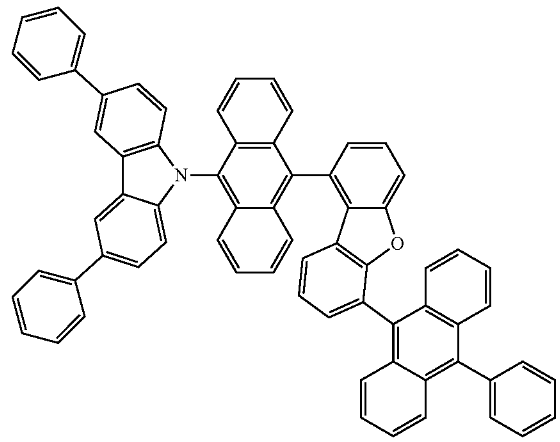
828
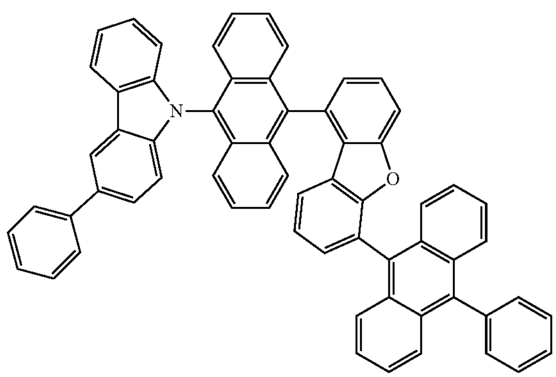
829
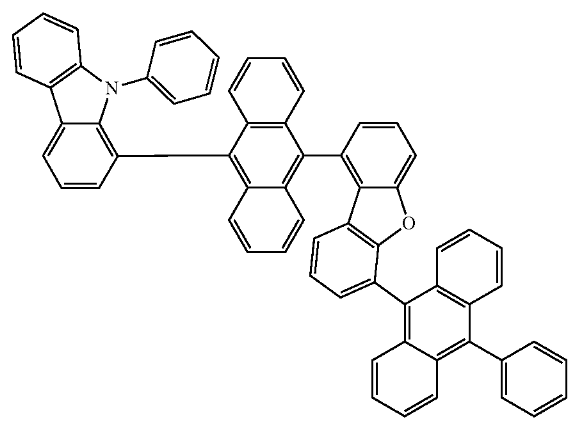
830
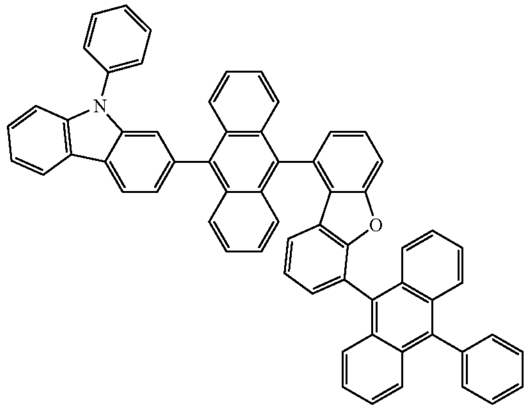
831
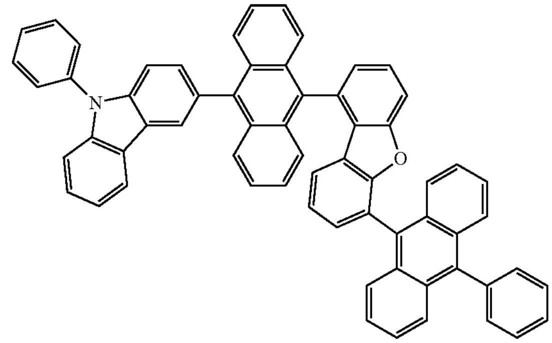

-continued
832
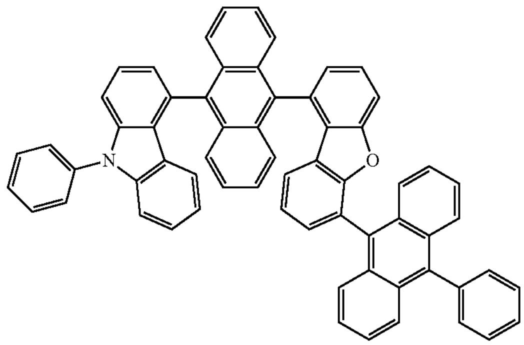
833
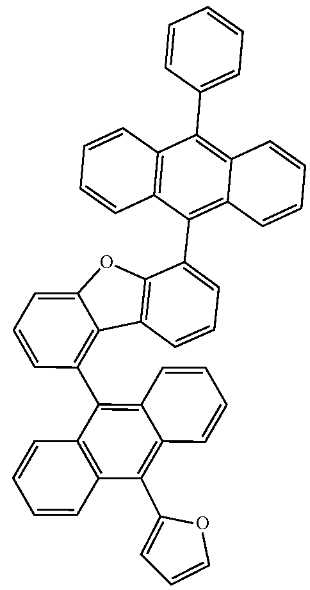
834
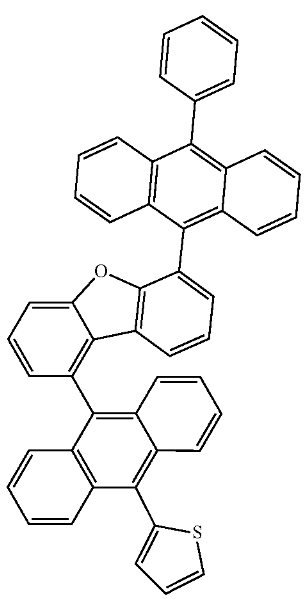
835
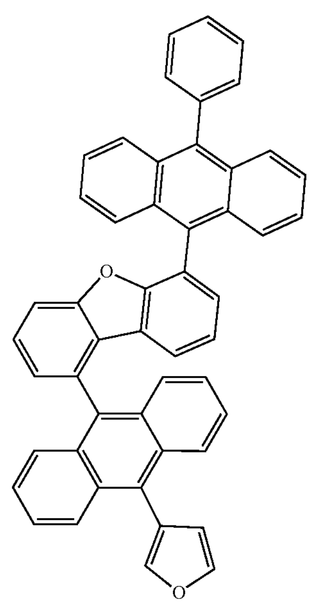

-continued
836
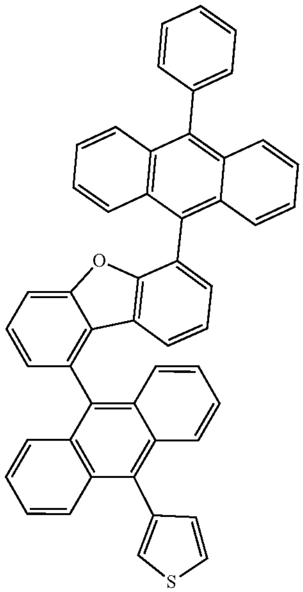
837
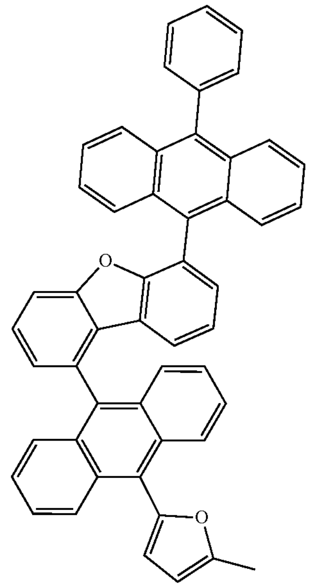
838
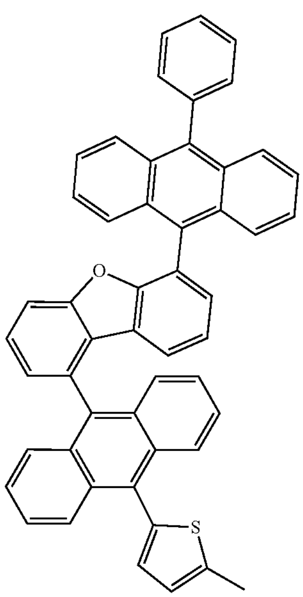
839
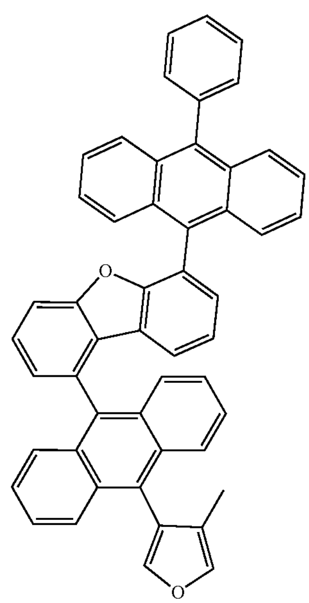

-continued
840
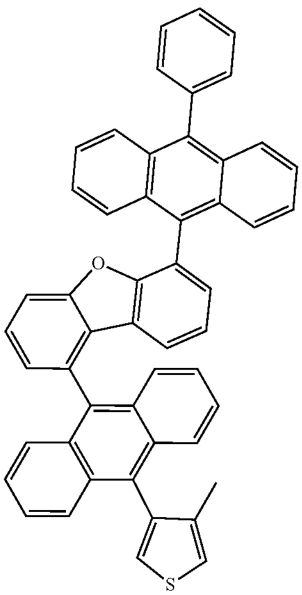
841
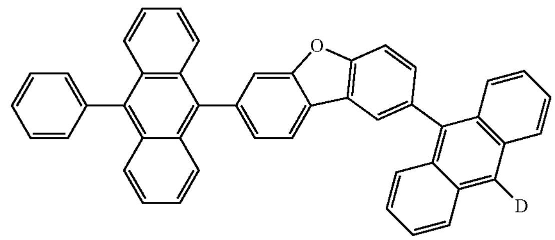
842
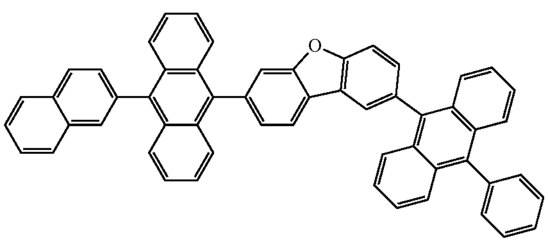
843
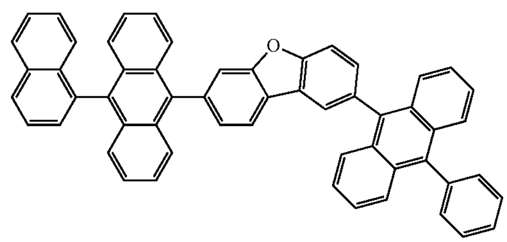
844
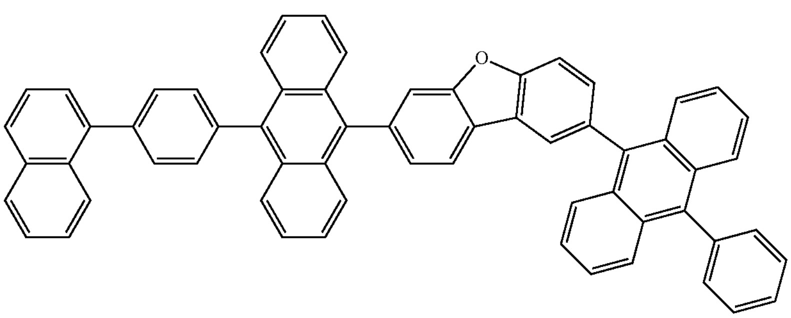
845
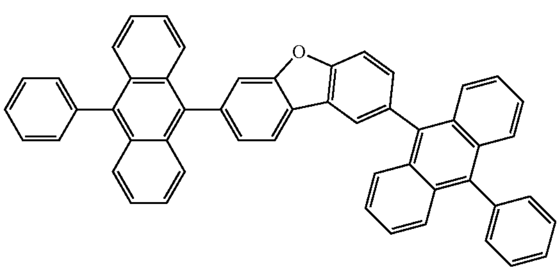
846
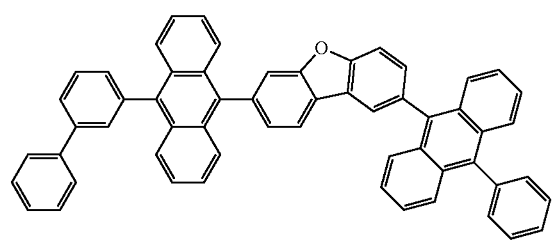

-continued
847
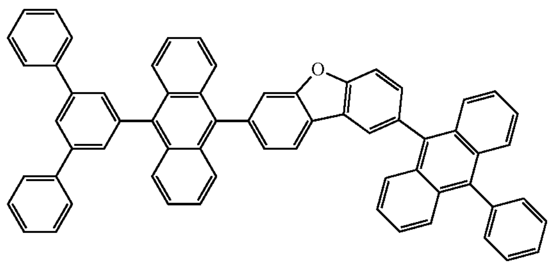
848
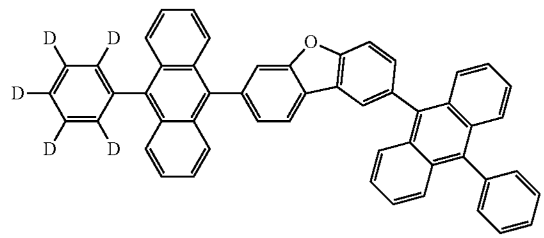
849
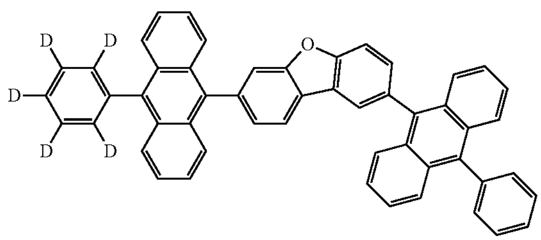
850
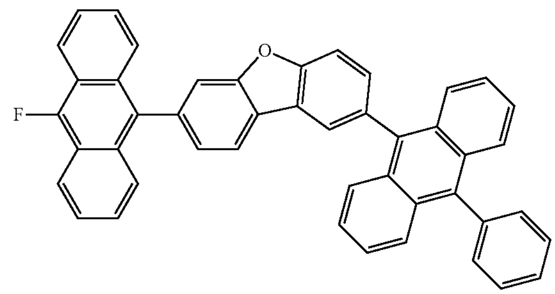
851
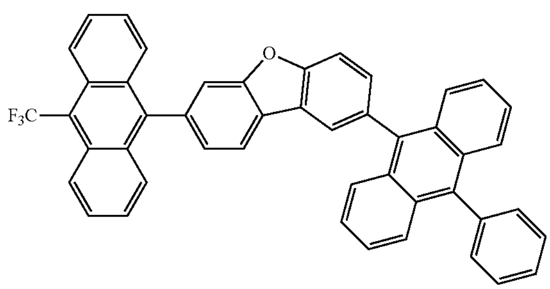
852
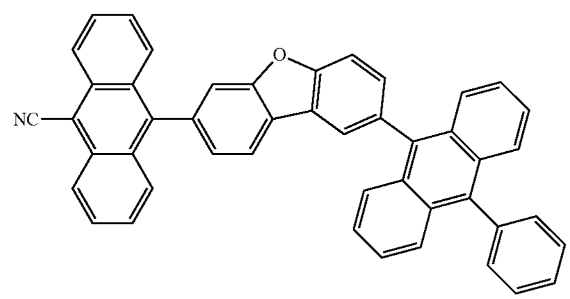
853
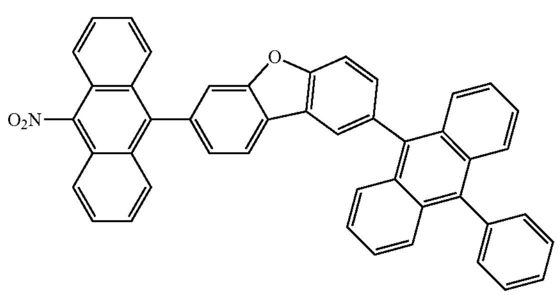
854
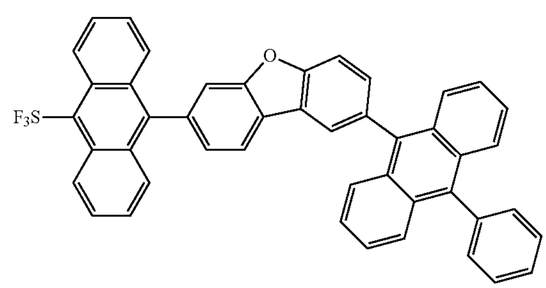
855
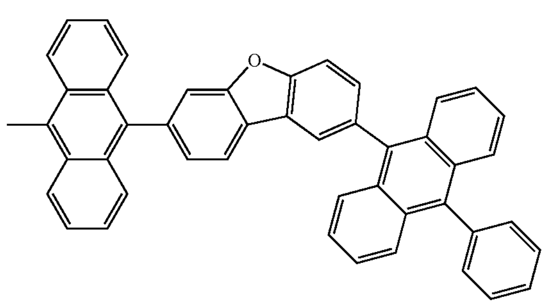
856
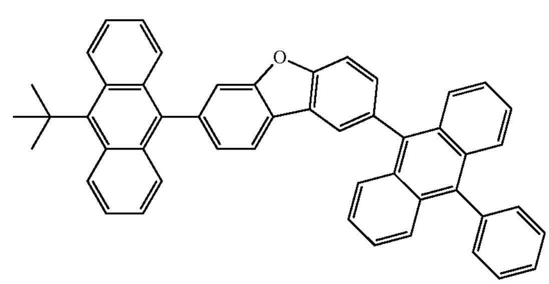

-continued
857
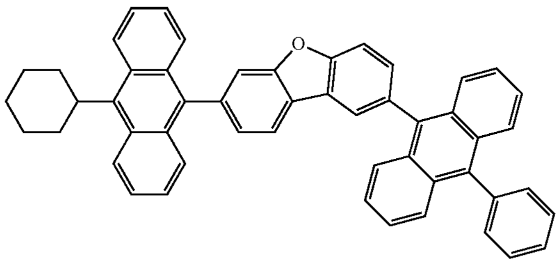
858
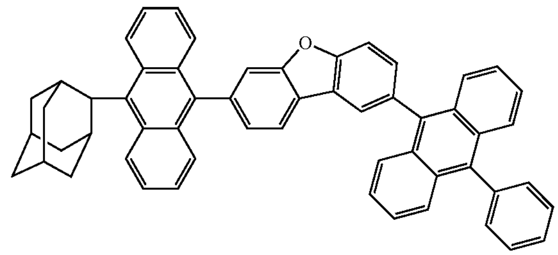
859
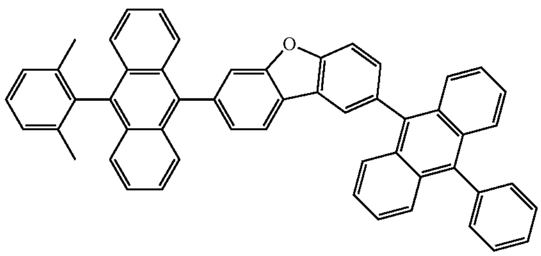
860
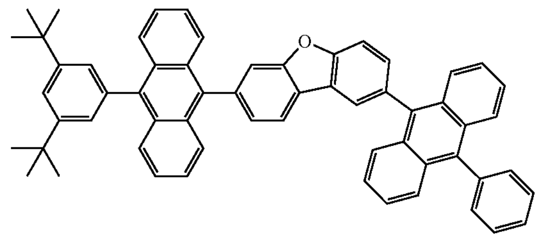
861
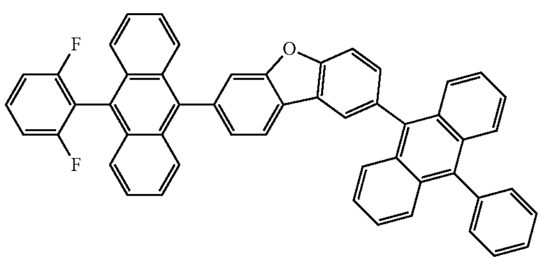
862
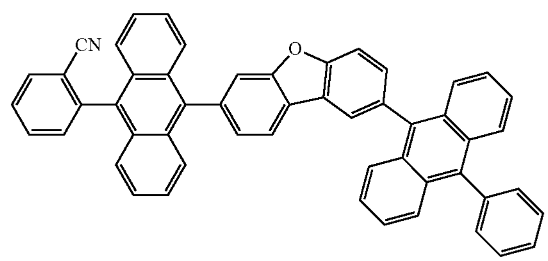
863
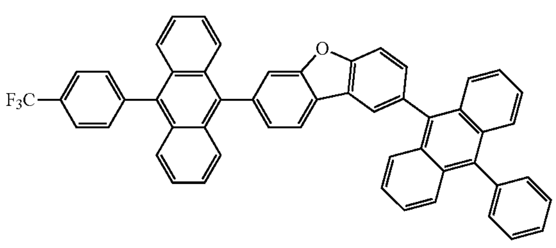
864
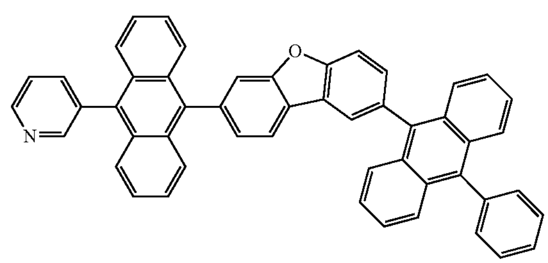
865
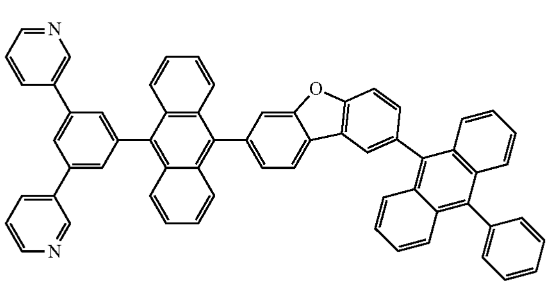
866
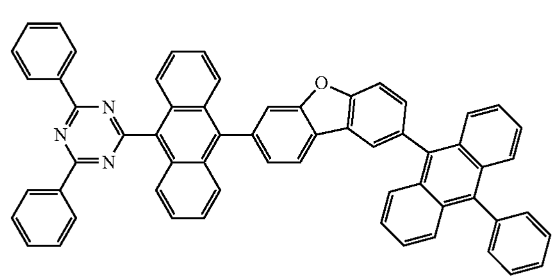

-continued
867
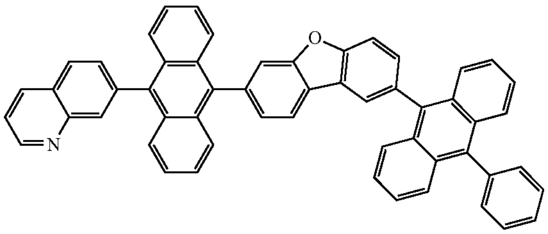
868
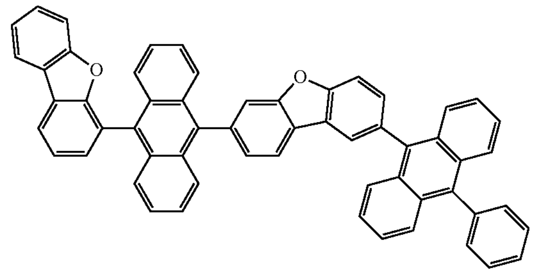
869
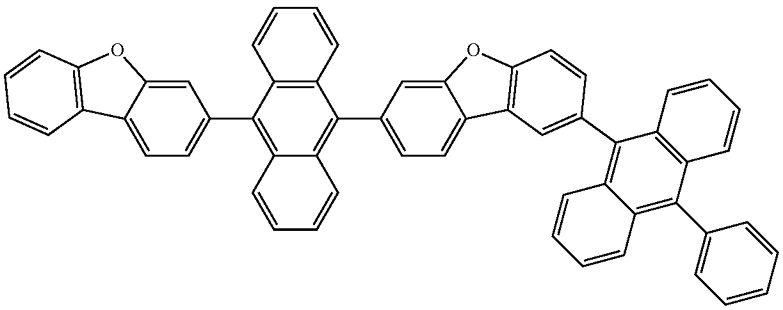
870
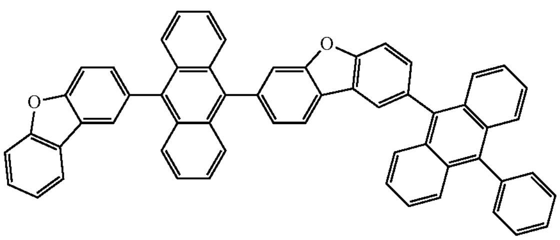
871
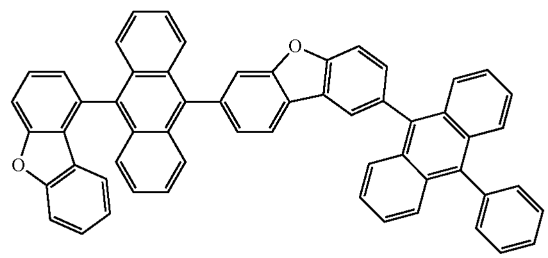
872
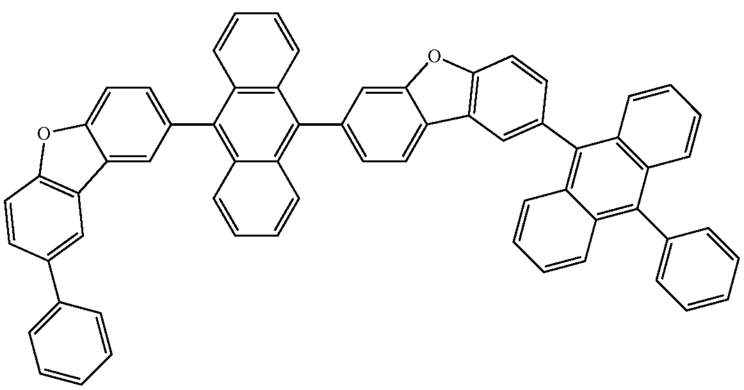
873
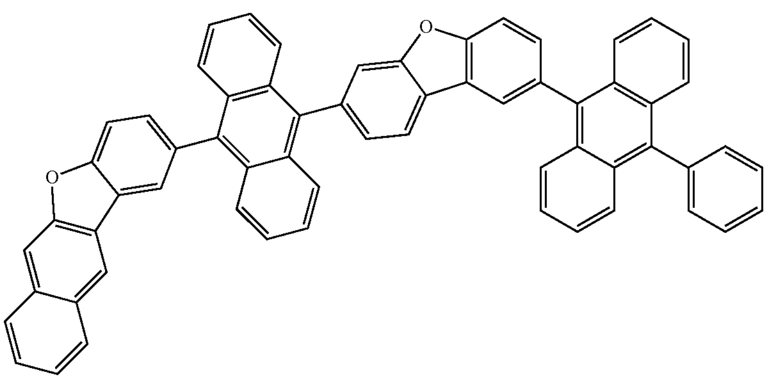

-continued
874
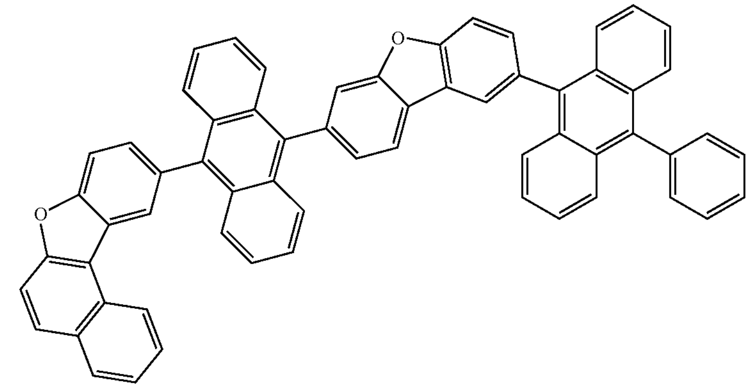
875
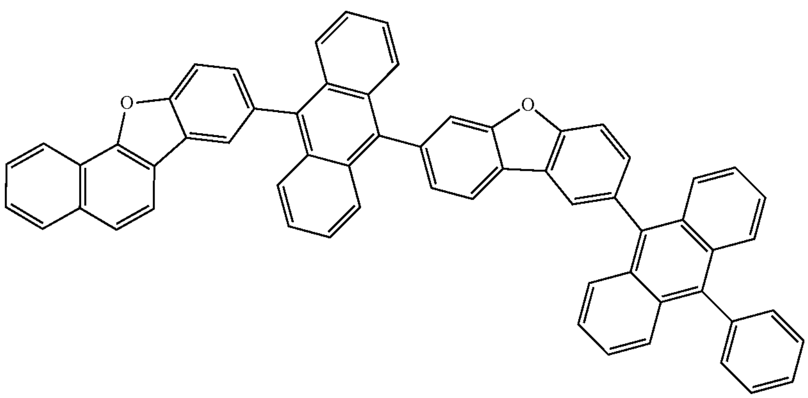
876
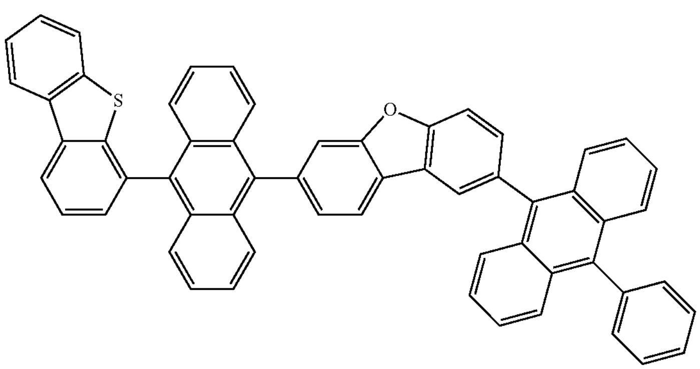
877
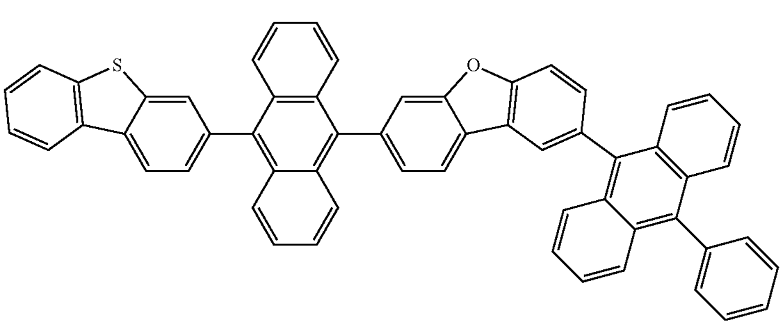

-continued
878
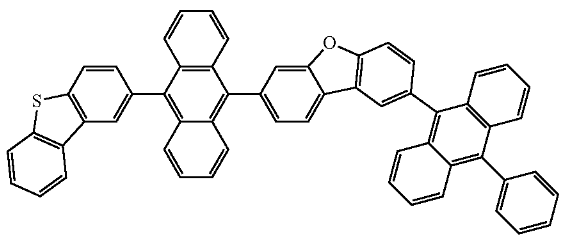
879
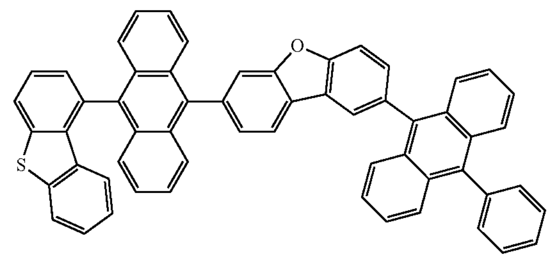
880
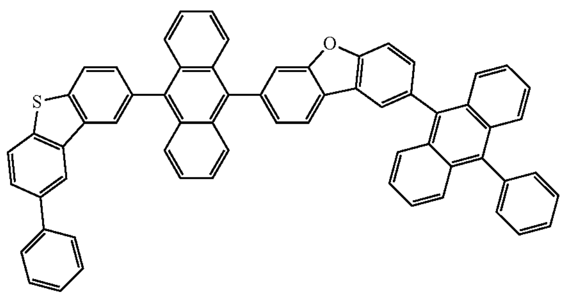
881
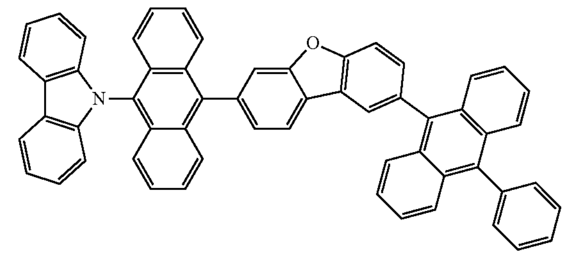
882
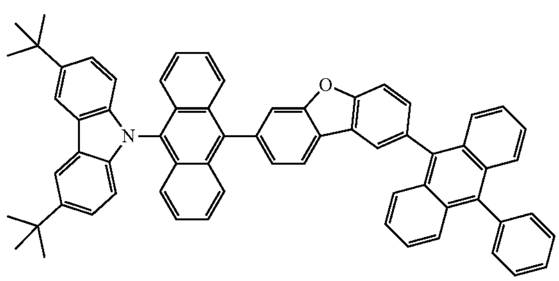
883
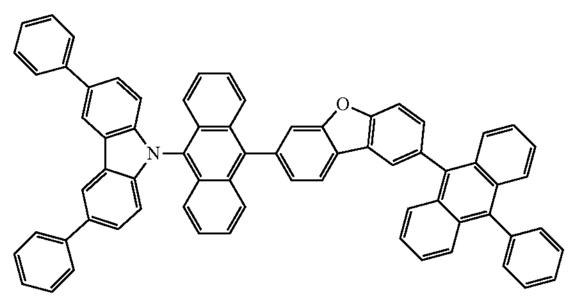
884
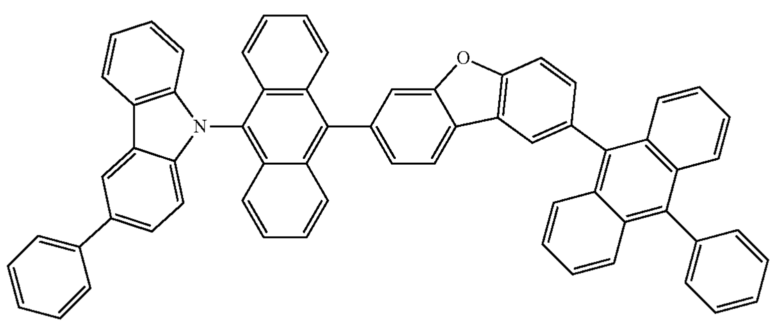
885
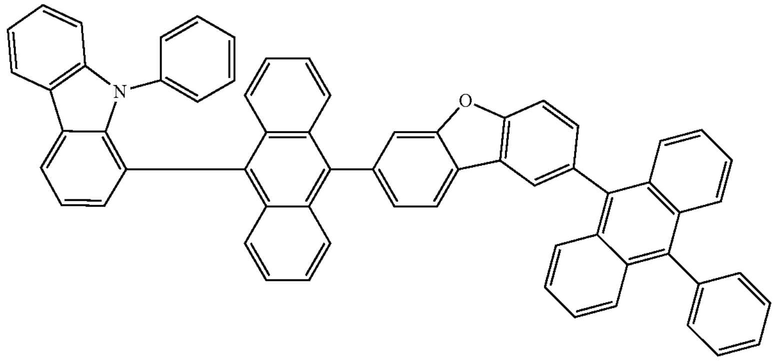

-continued
886
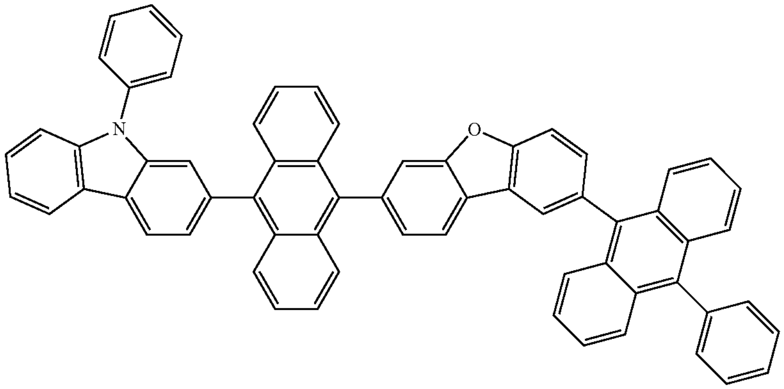
887
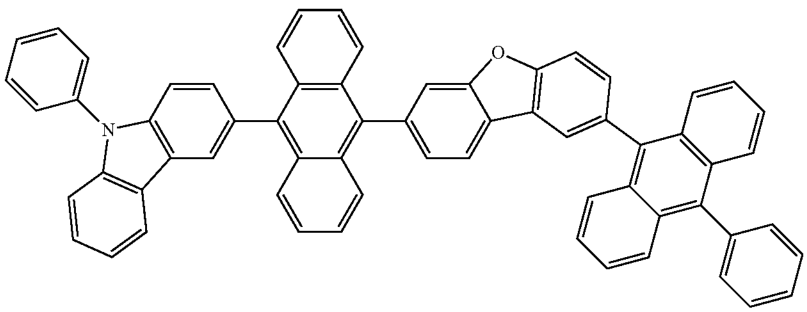
888
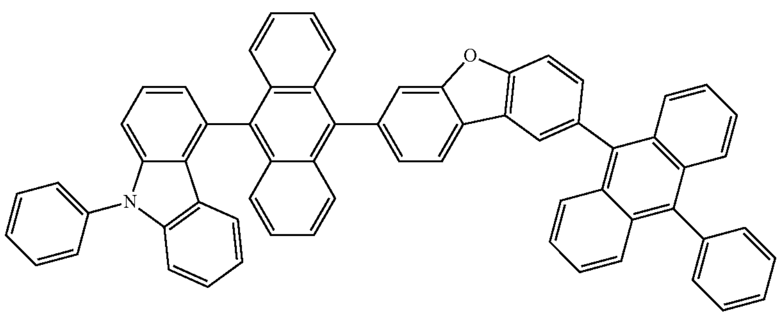
889
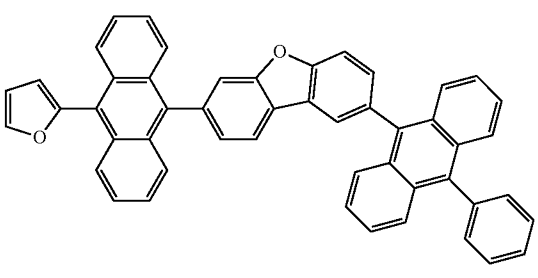
890
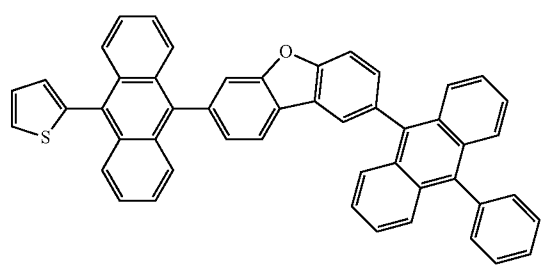
891
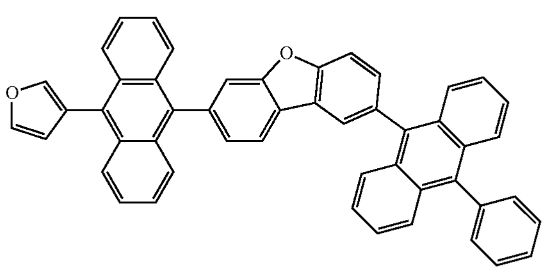
892
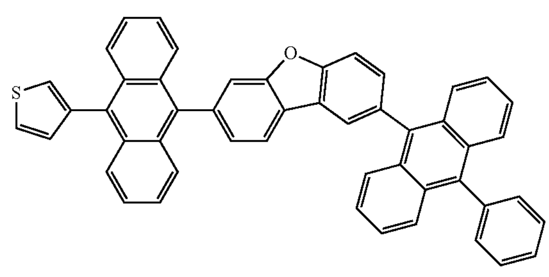

-continued
893
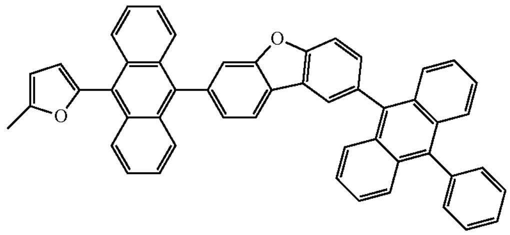
894
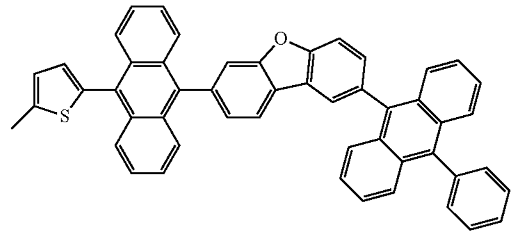
895
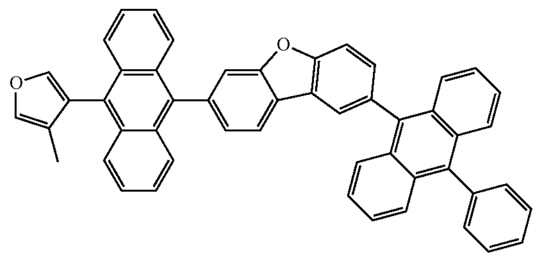
896
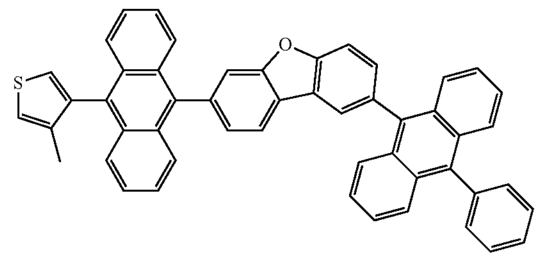
897
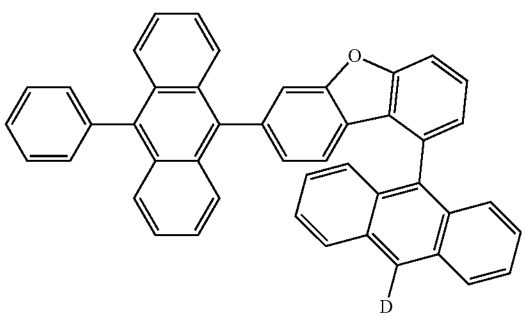
898
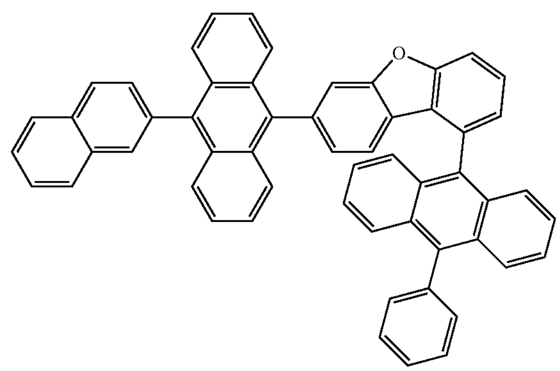
899
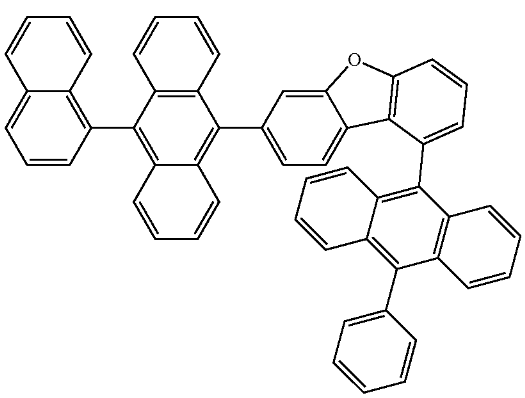
900
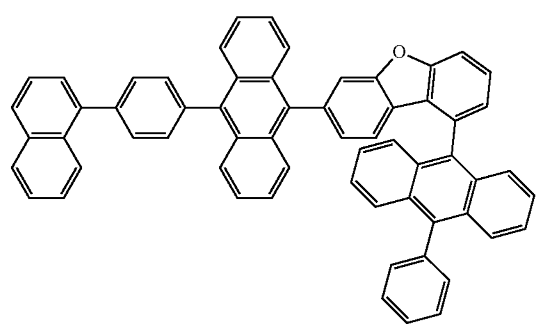

-continued
901
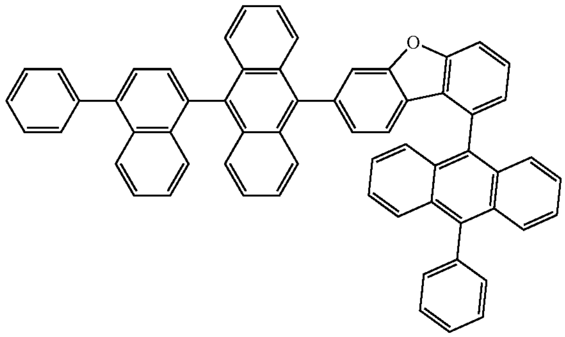
902
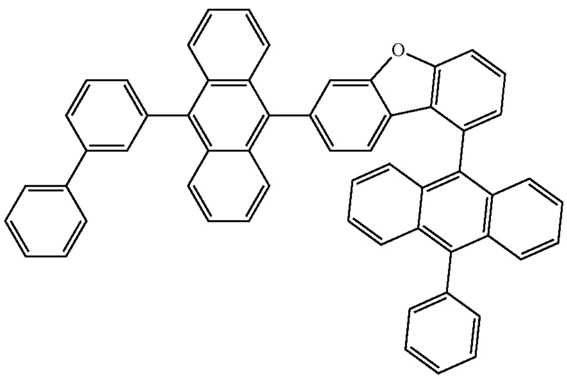
903
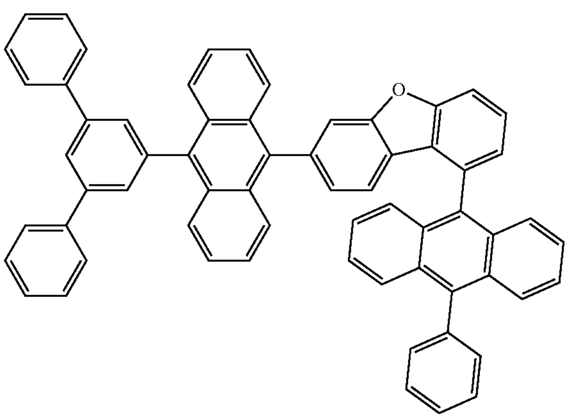
904
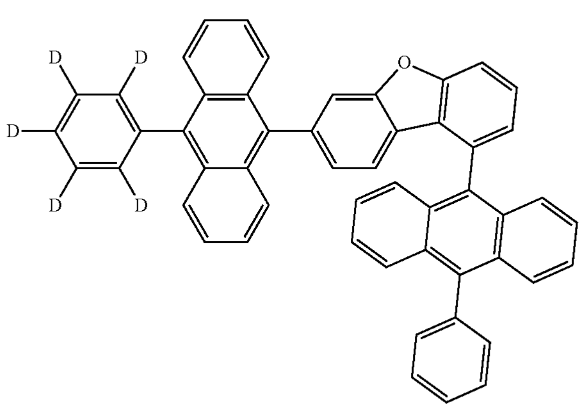
905
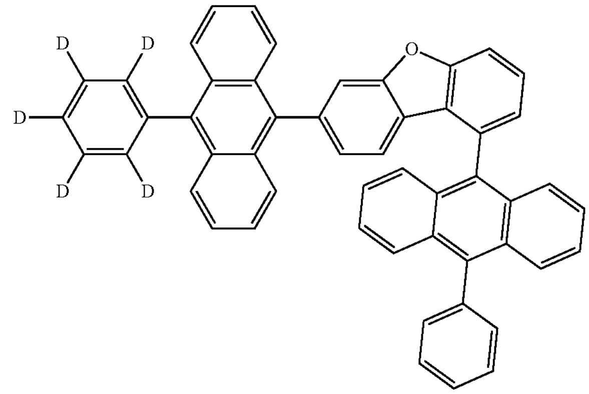
906
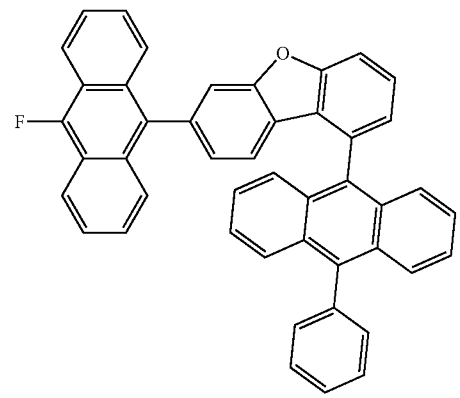
907
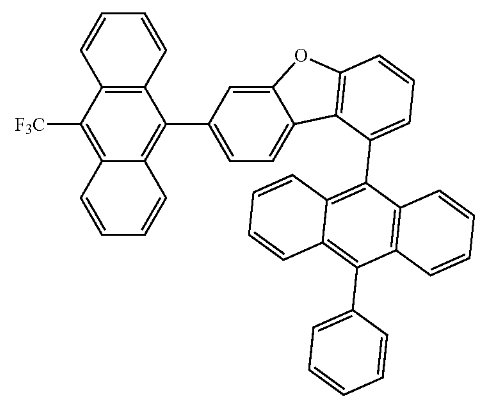
908
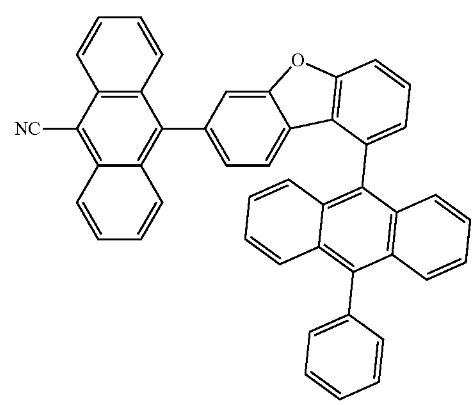

-continued
909
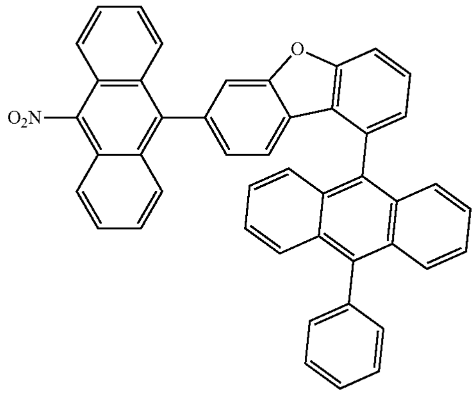
910
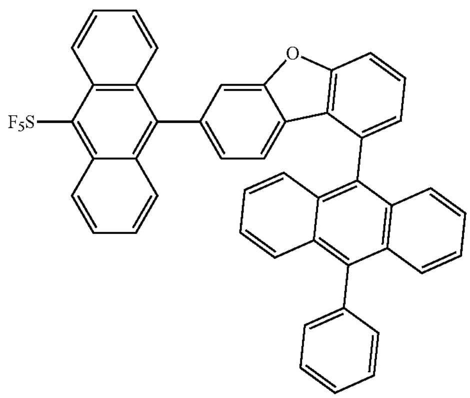
911
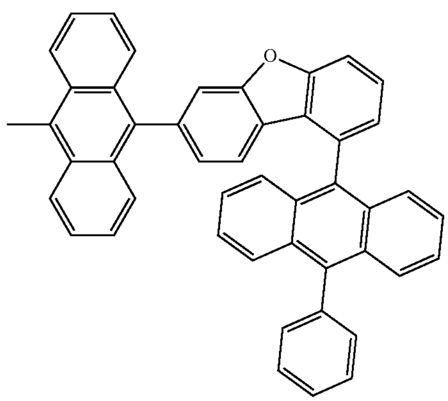
912
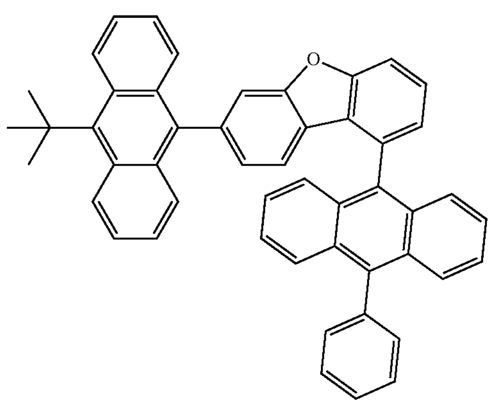
-continued
913
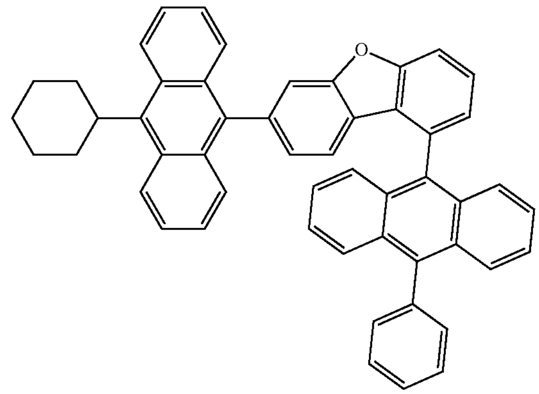
914
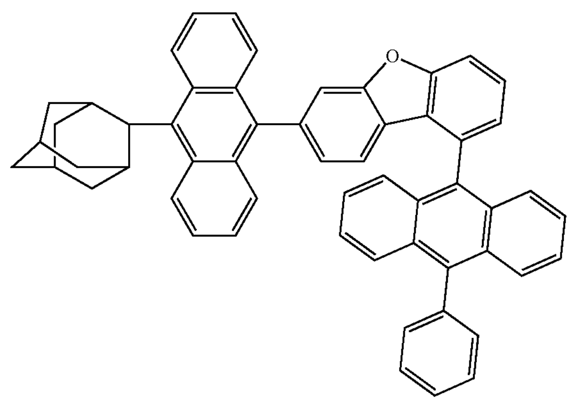
915
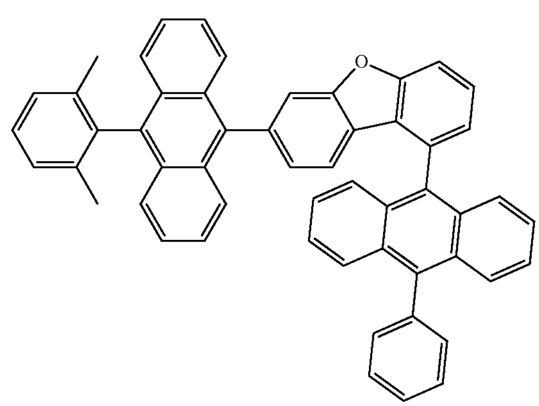

-continued
916
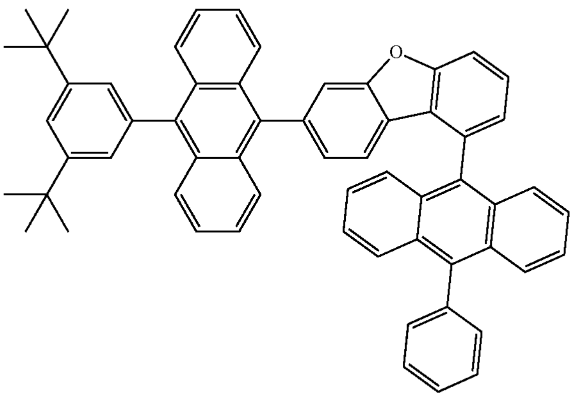
917
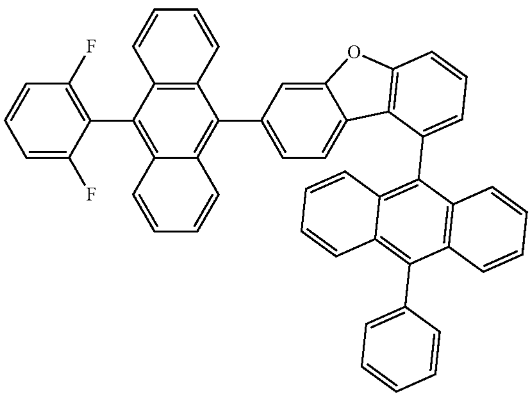
918
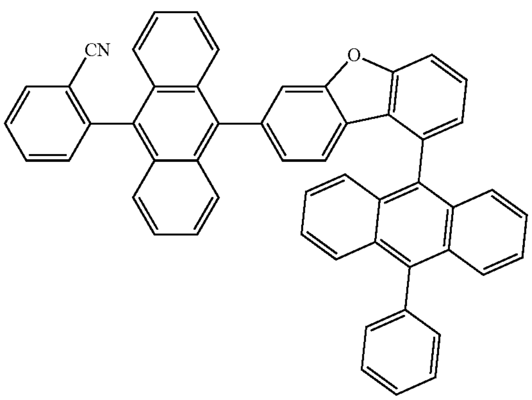
919
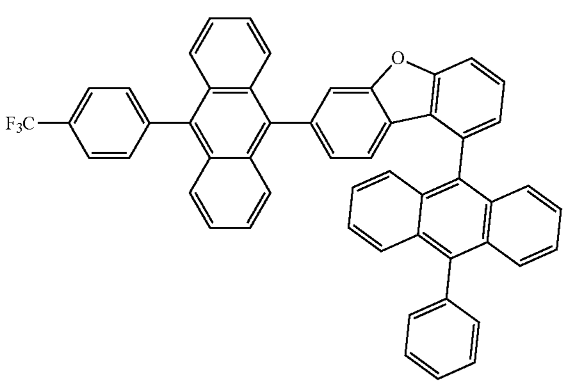
-continued
920
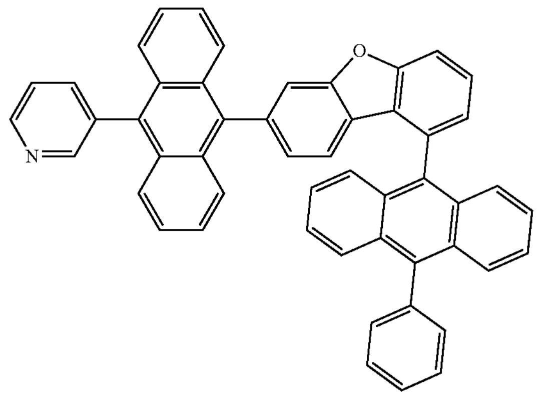
921
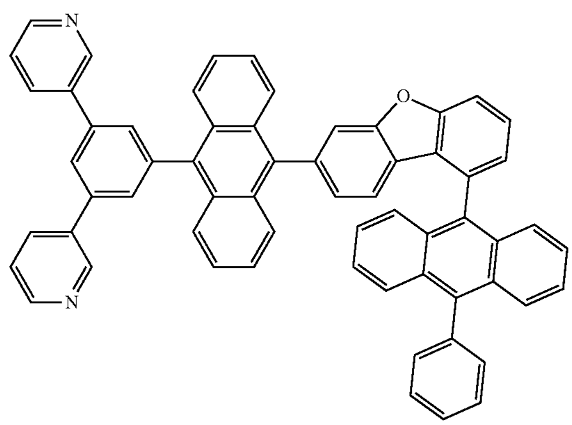
922
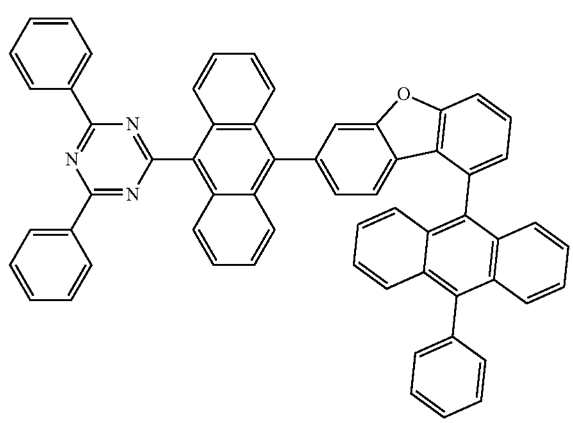

923
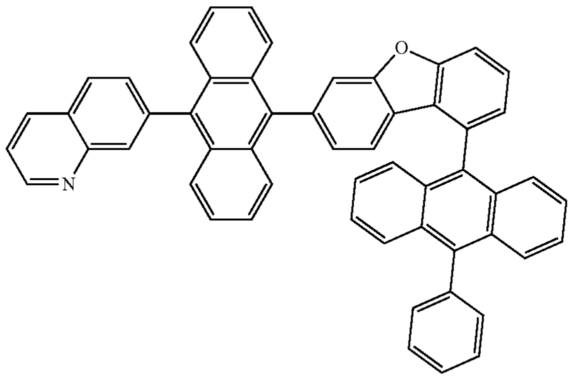
924
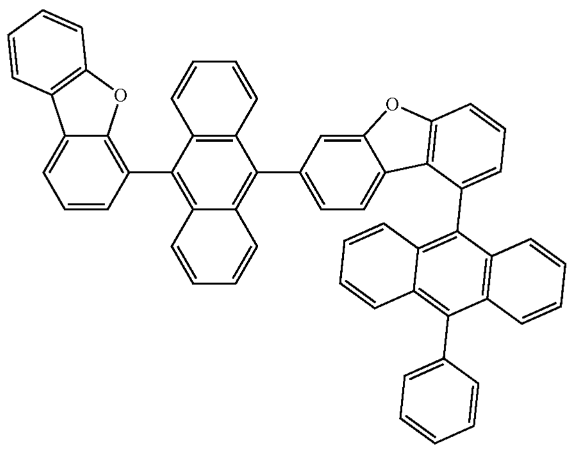
925
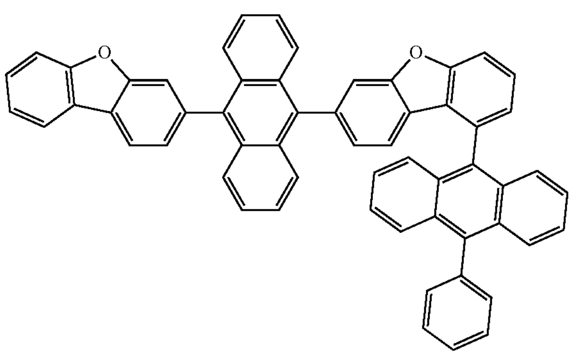
926
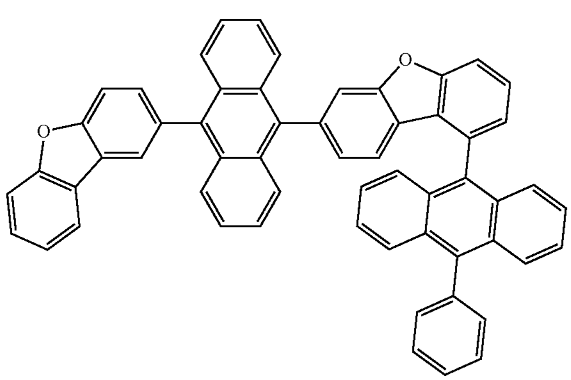
927
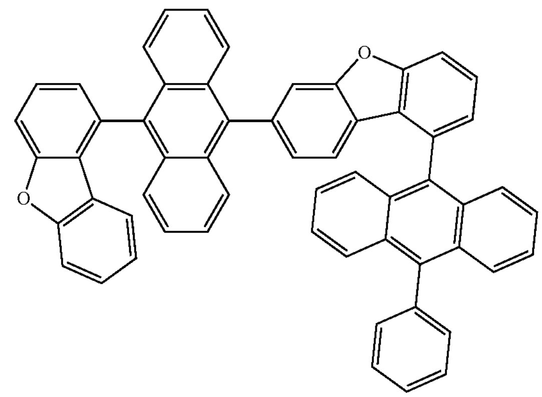
928
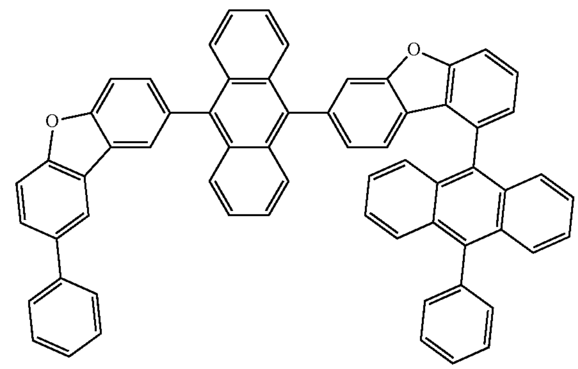
929
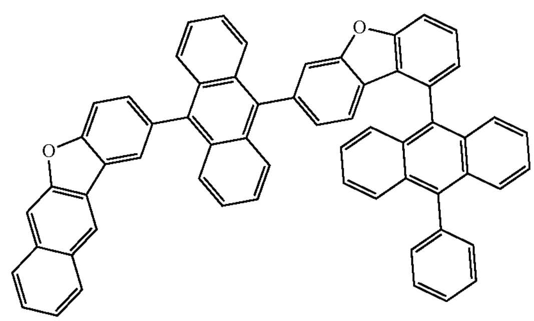
930
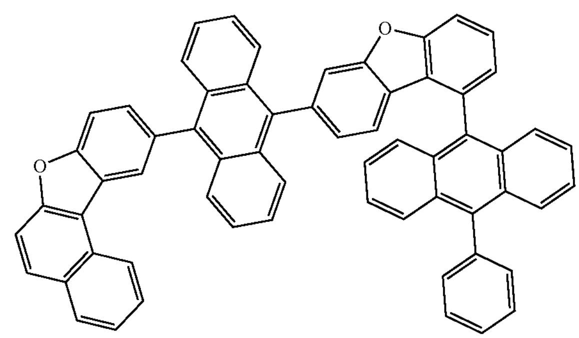

-continued
931
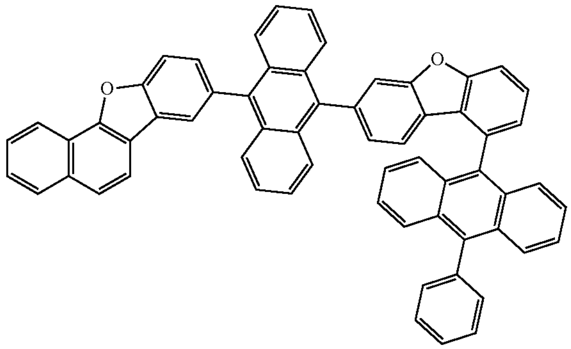
932
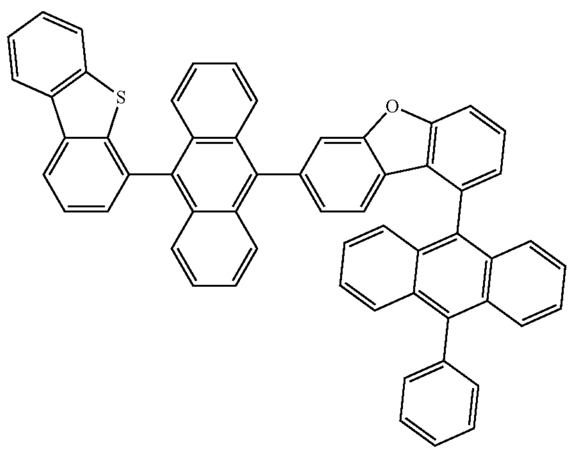
933
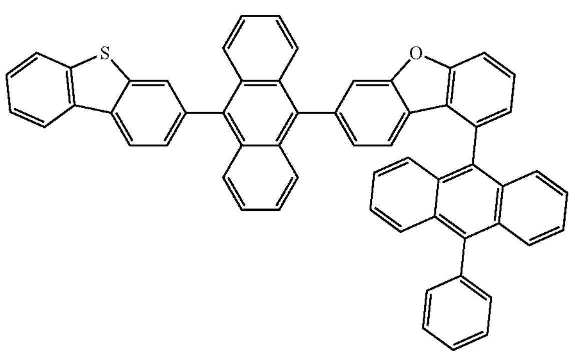
934
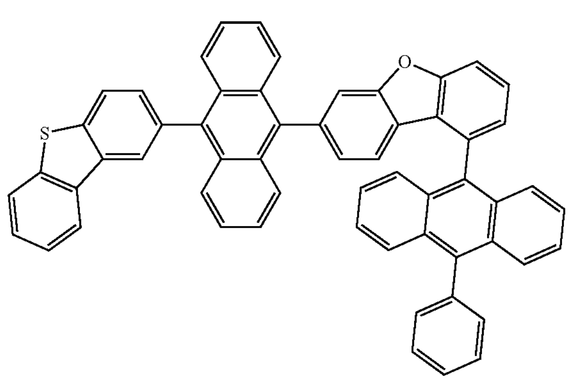
-continued
935
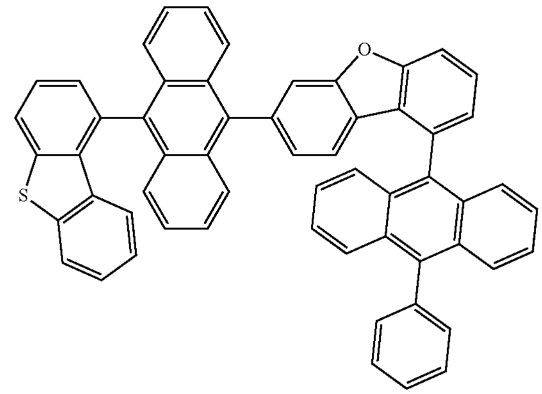
936
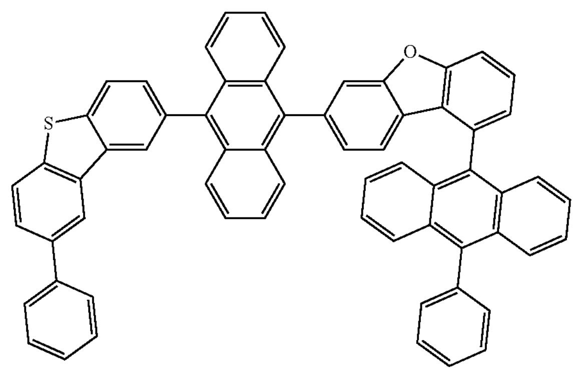
937
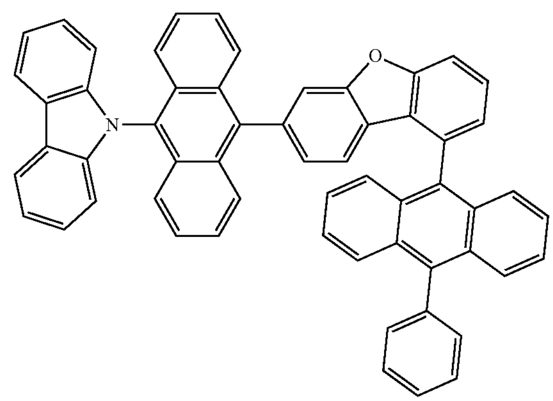
938
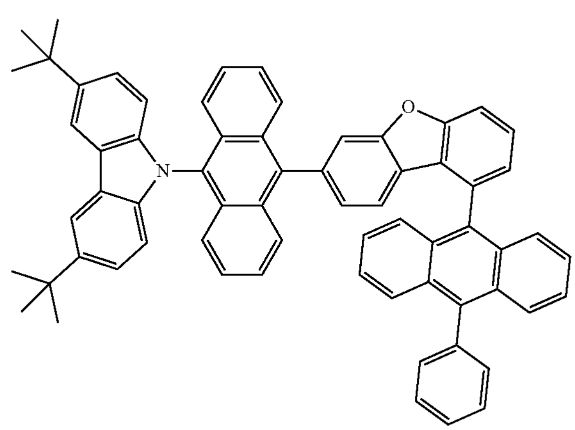

-continued
939
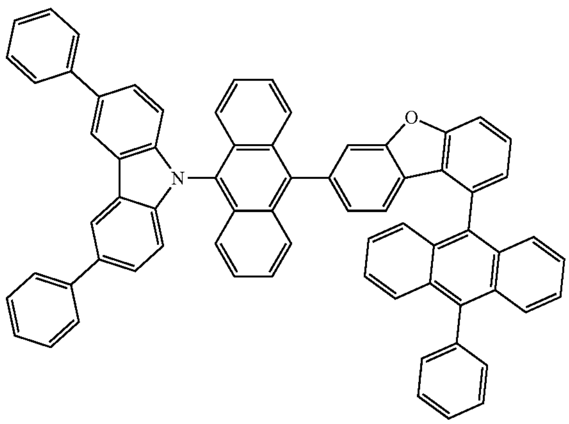
940
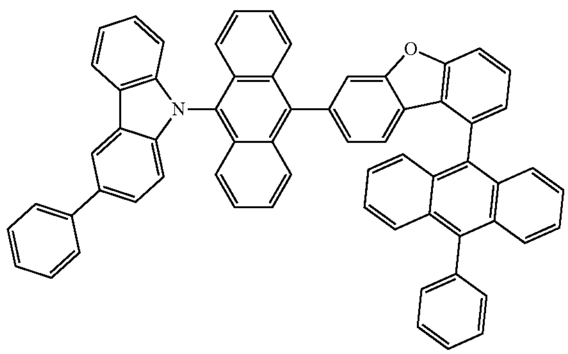
941
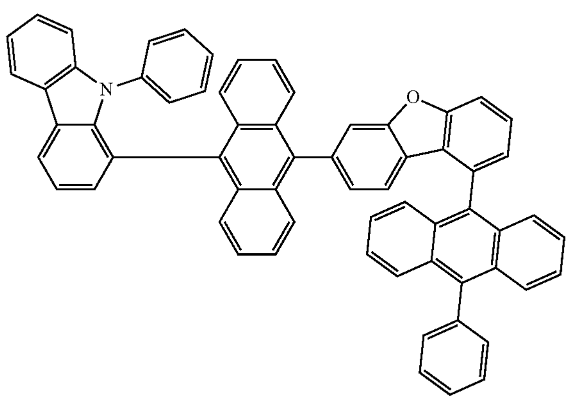
942
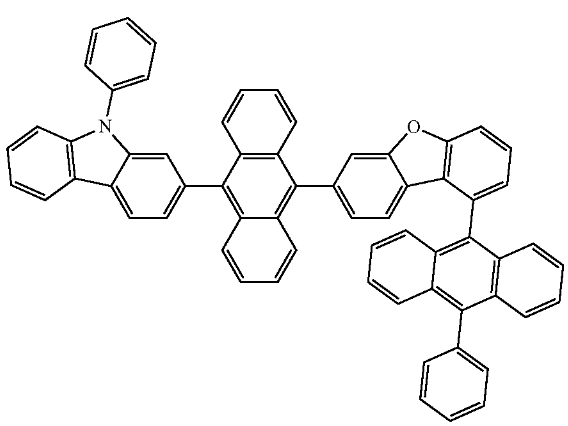
-continued
943
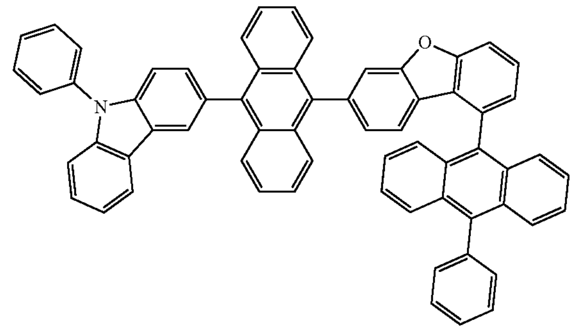
944
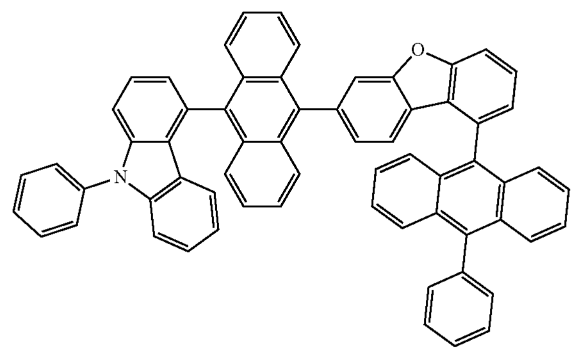
945
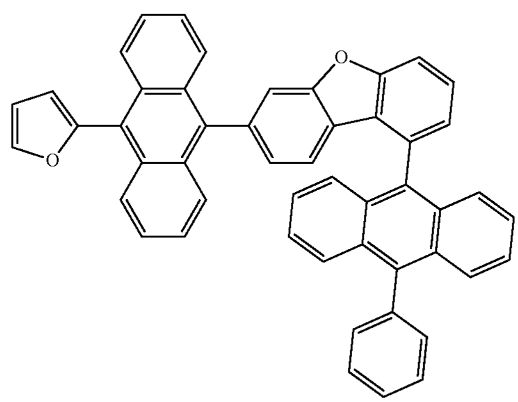
946
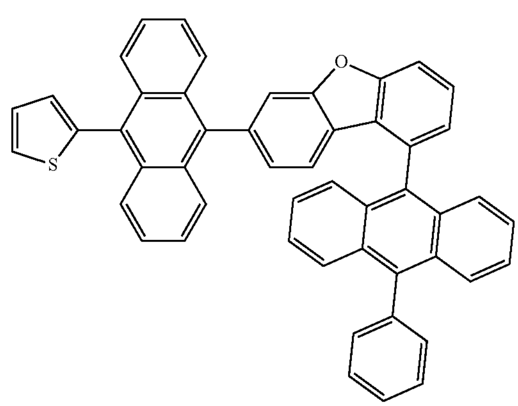

-continued
947
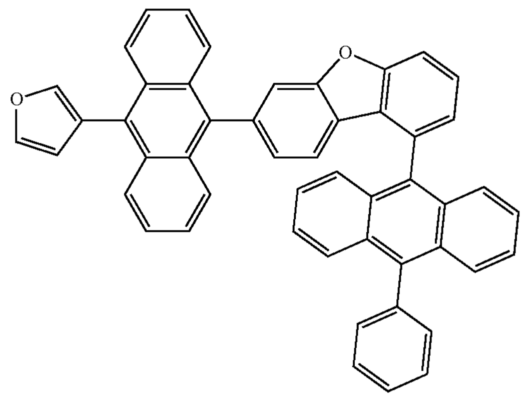
948
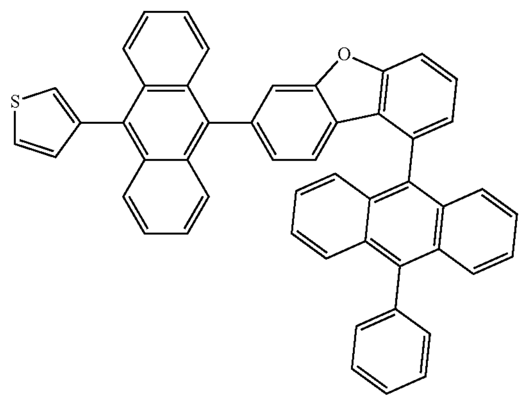
949
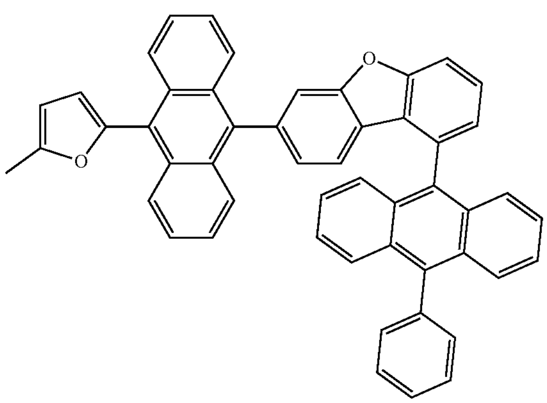
950
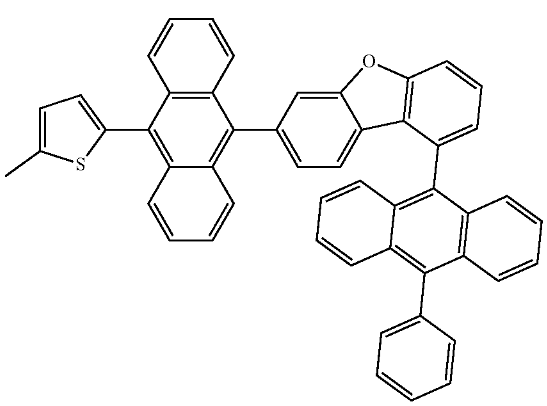
-continued
951
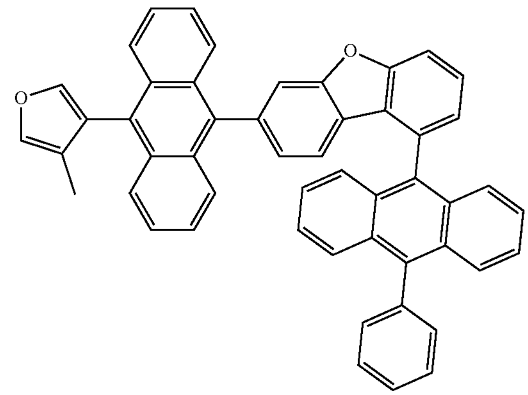
952
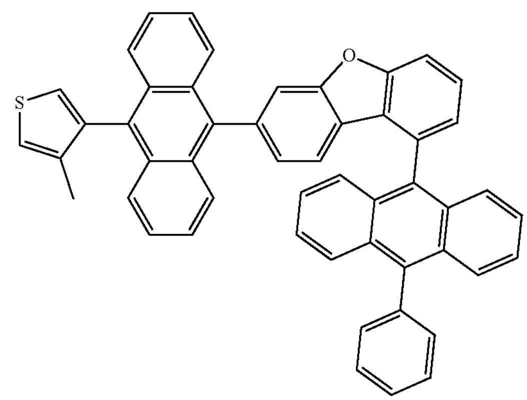
953
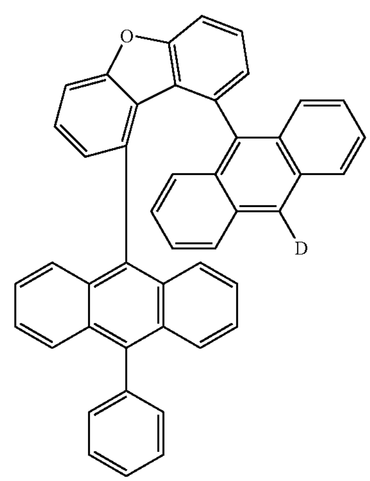

-continued
954
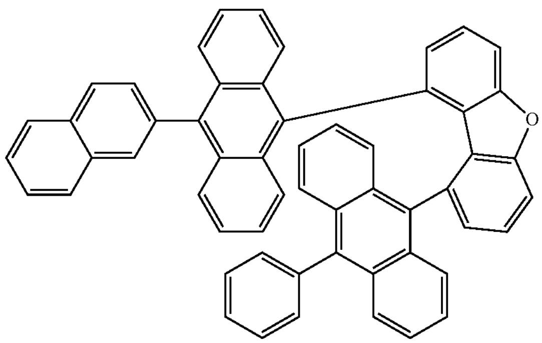
955
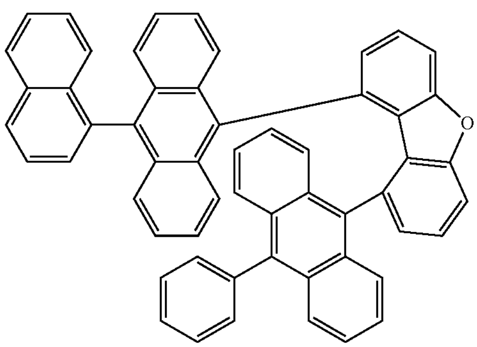
956
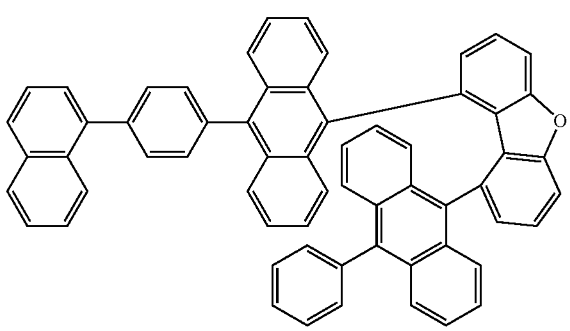
957
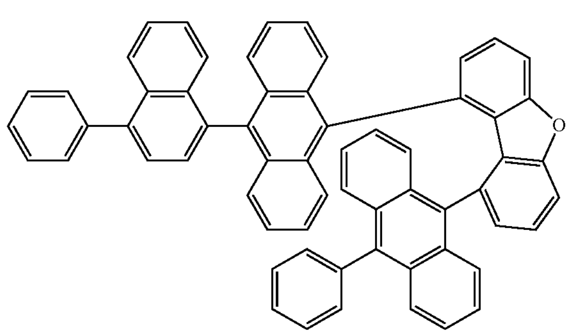
-continued
958
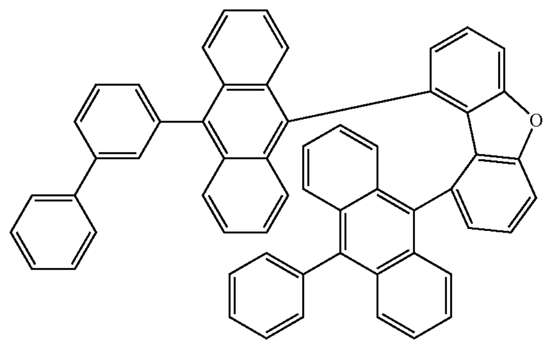
959
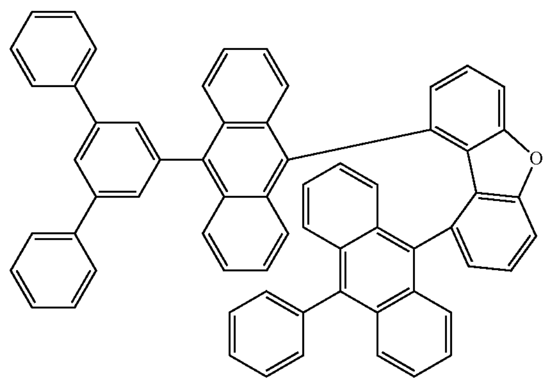
960
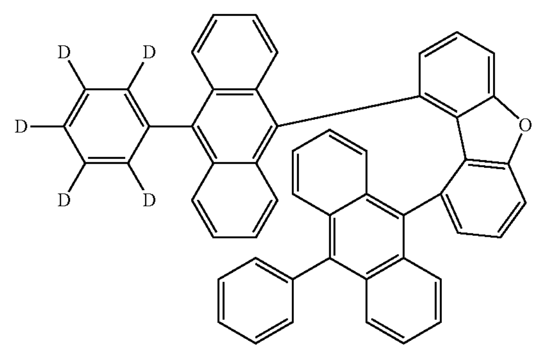
961
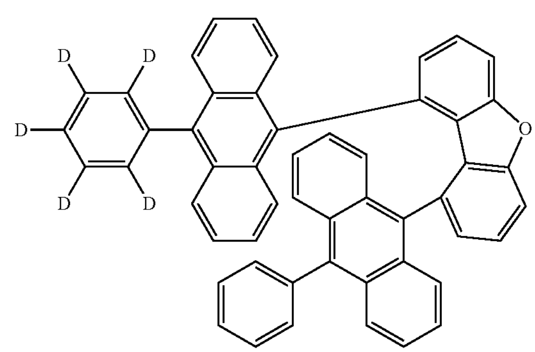

-continued
962
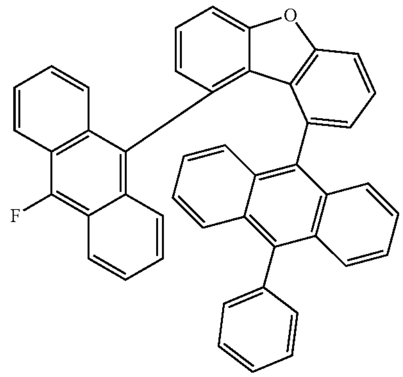
963
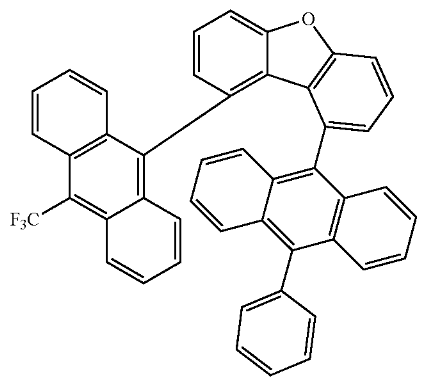
964
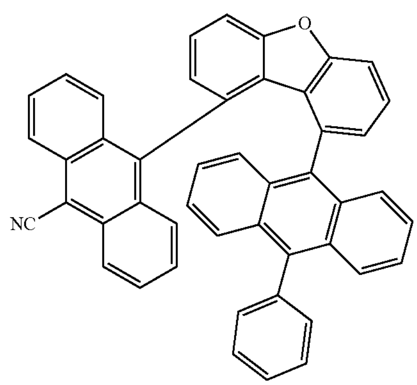
965
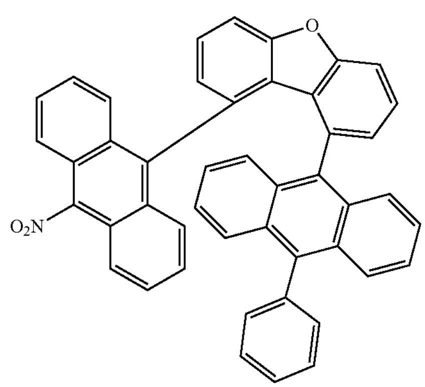
-continued
966
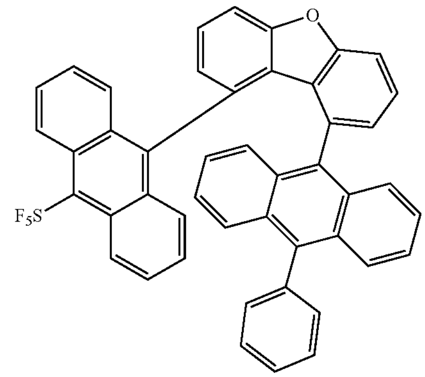
967
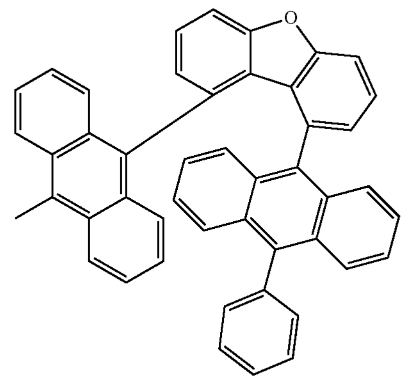
968
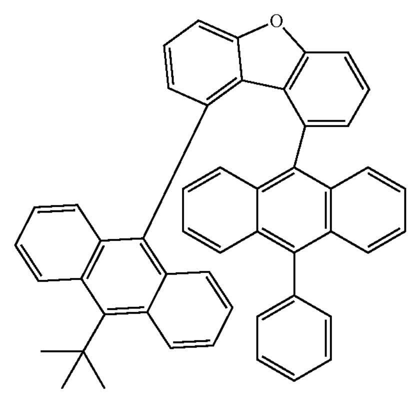
969
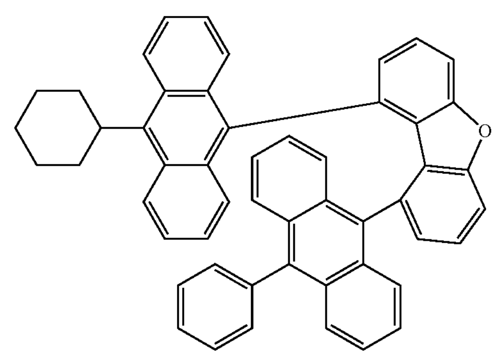

-continued
970
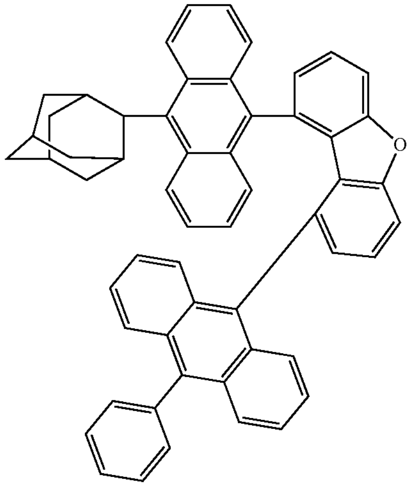
971
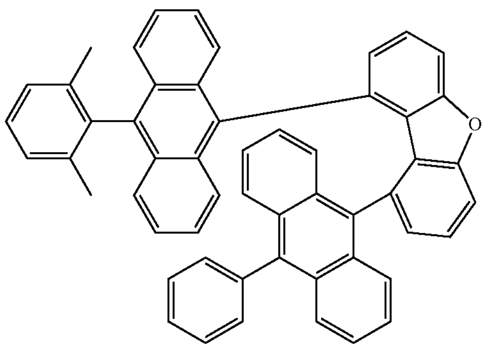
972
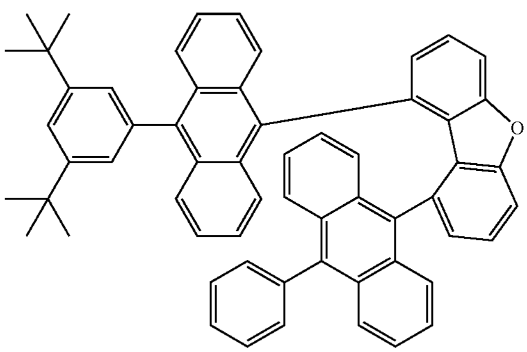
973
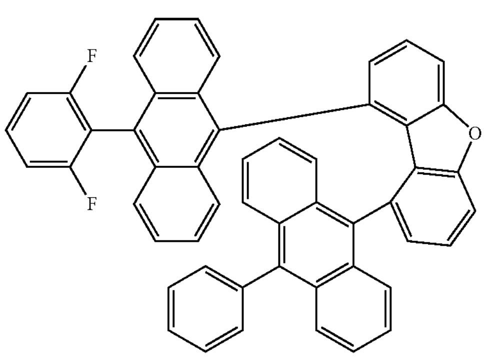
-continued
974
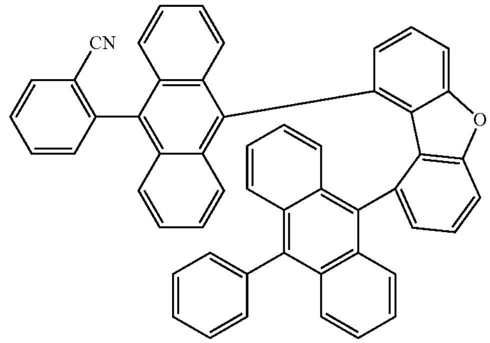
975
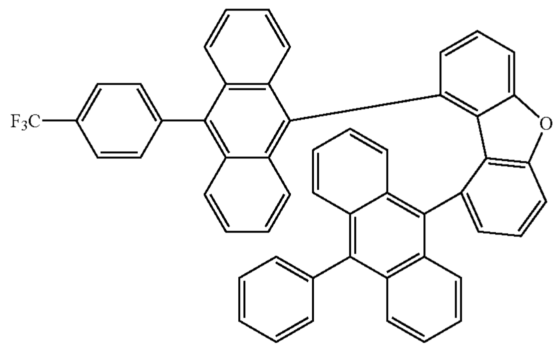
976
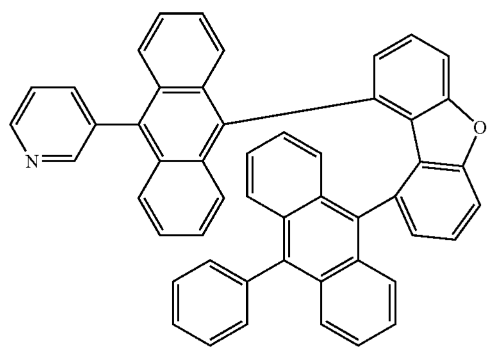
977
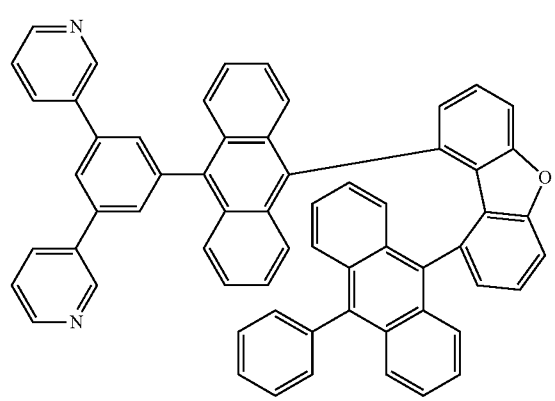

-continued
978
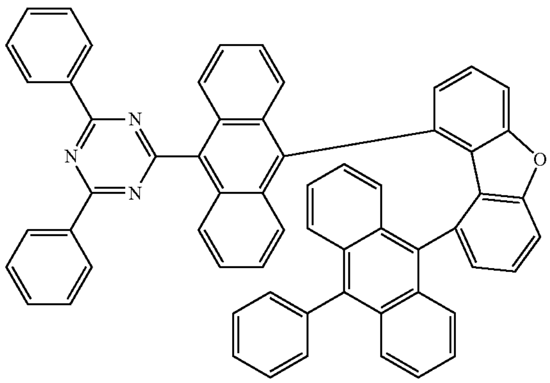
979
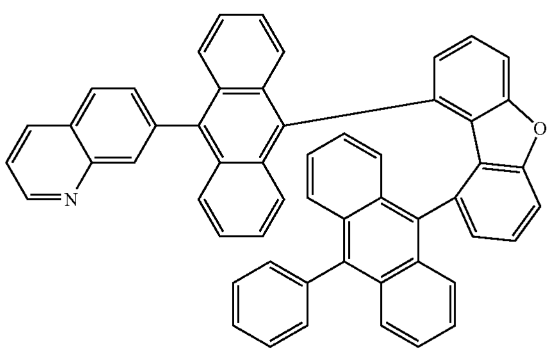
980
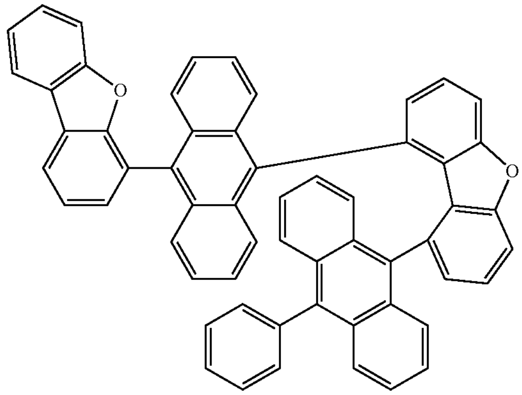
-continued
981
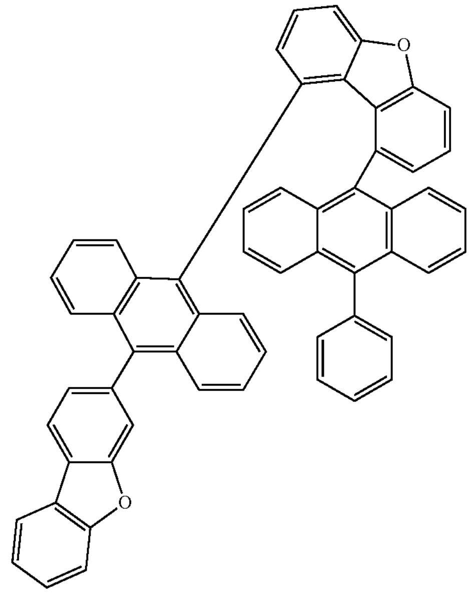
982
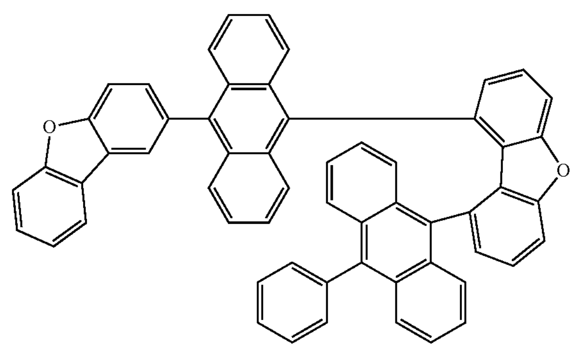
983
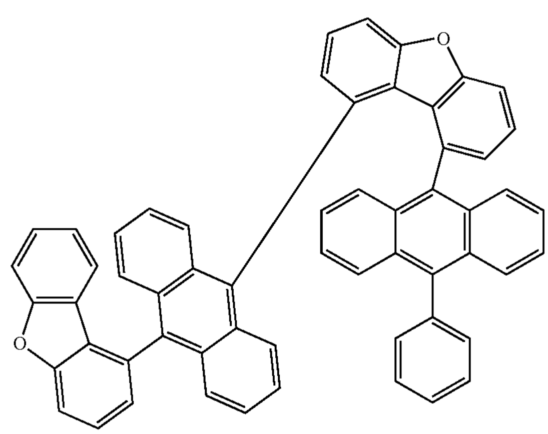

-continued
984
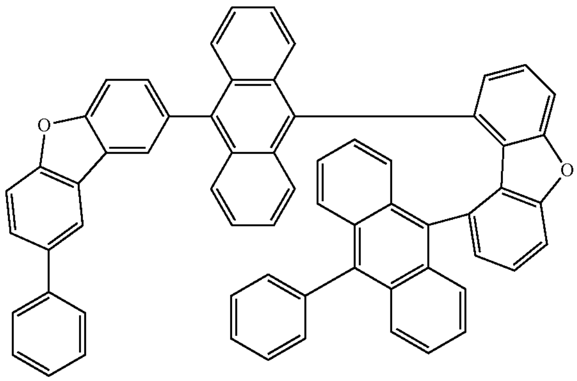
985
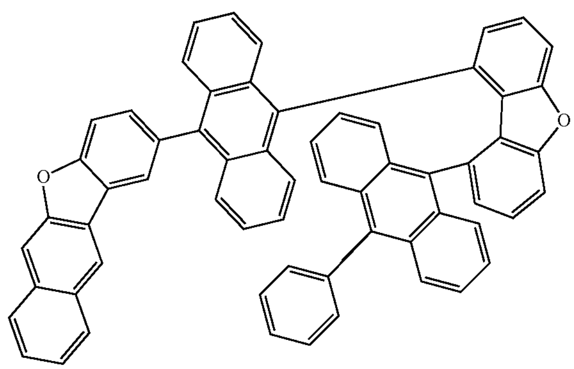
986
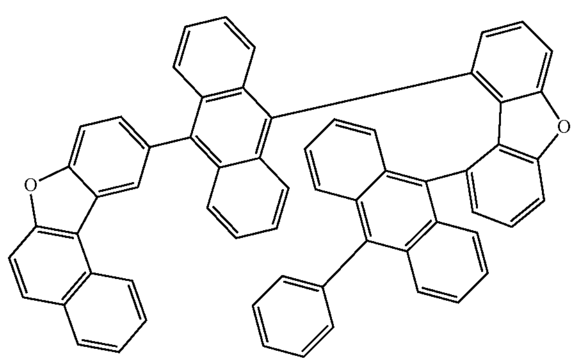
987
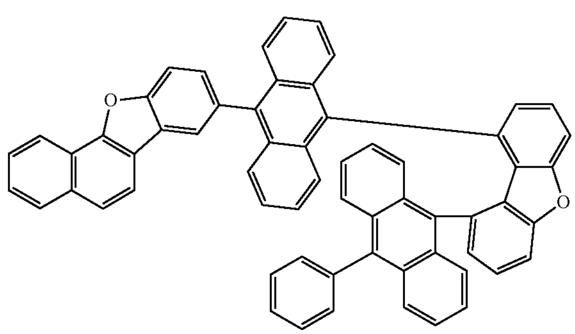
-continued
988
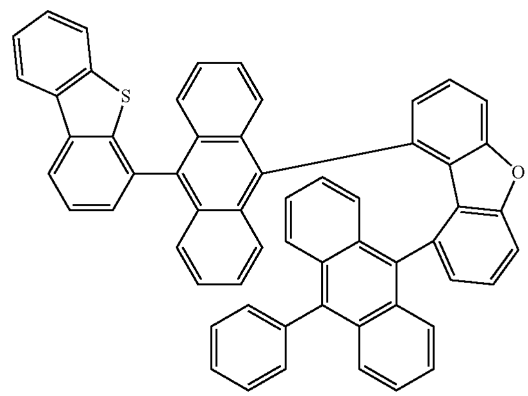
989
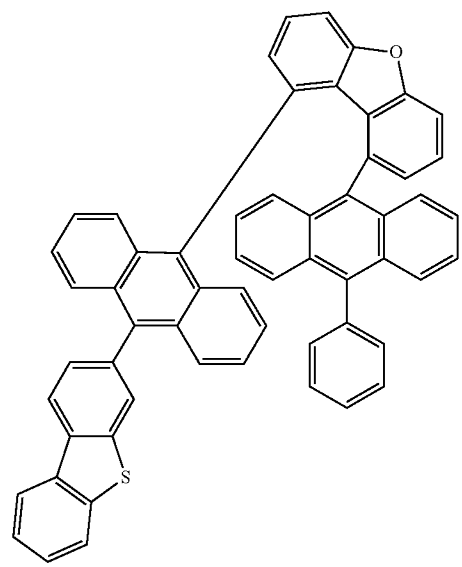
990
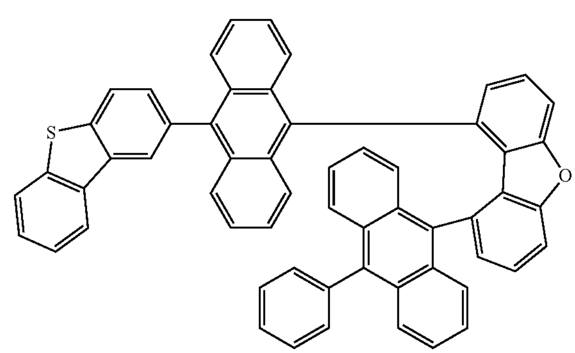

-continued
991
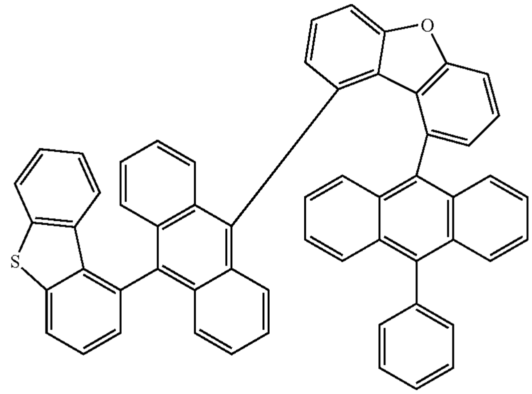
992
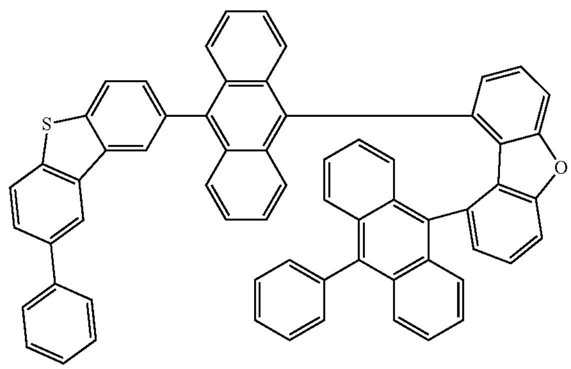
993
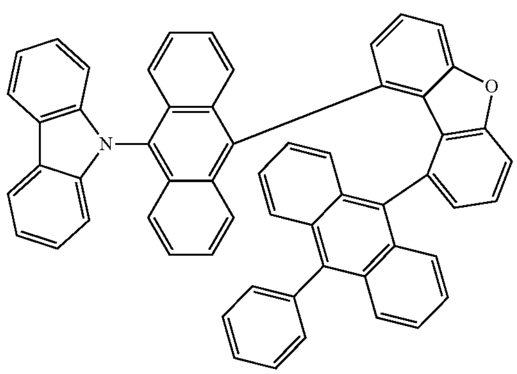
994
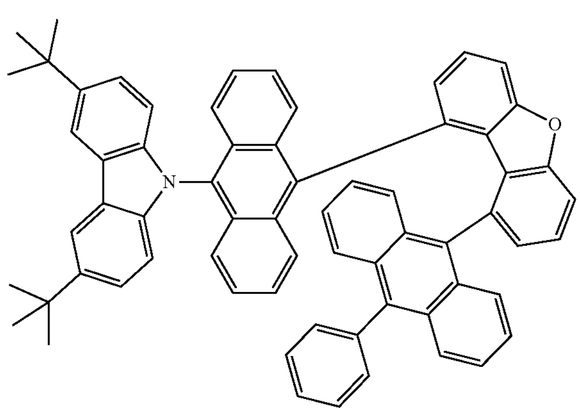
-continued
995
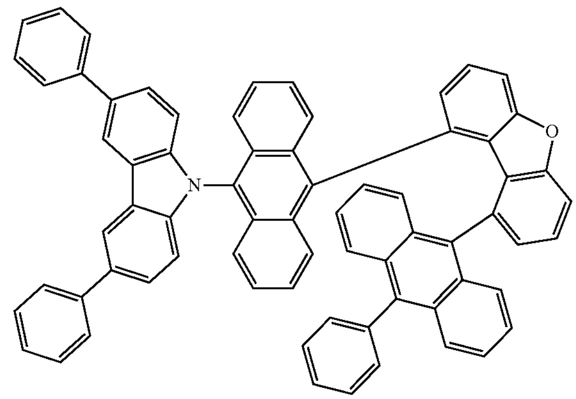
996
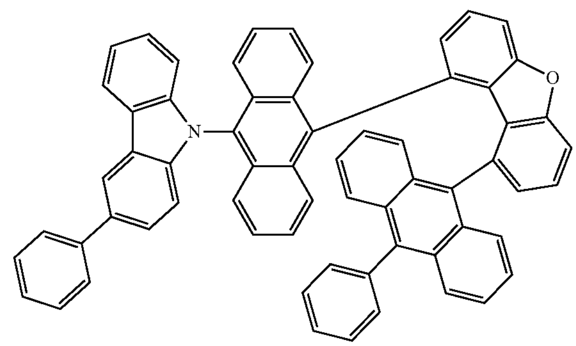
997
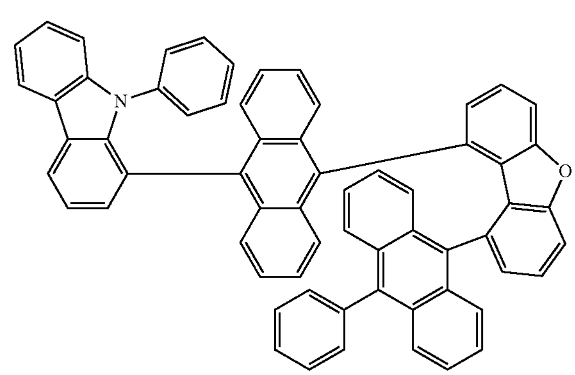

-continued
998
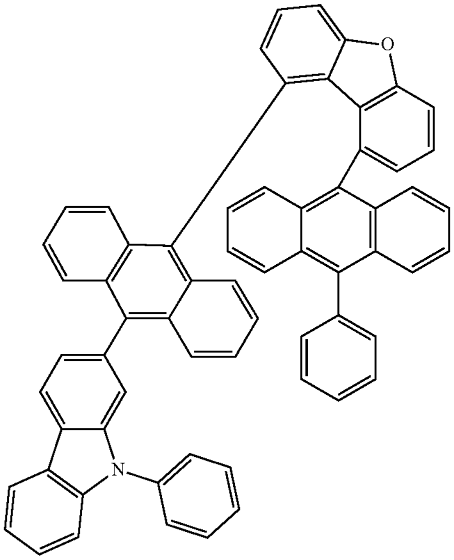
999
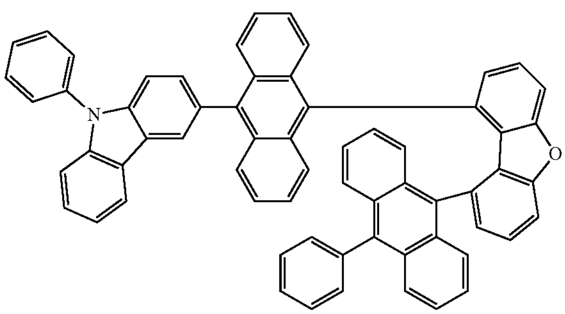
1000
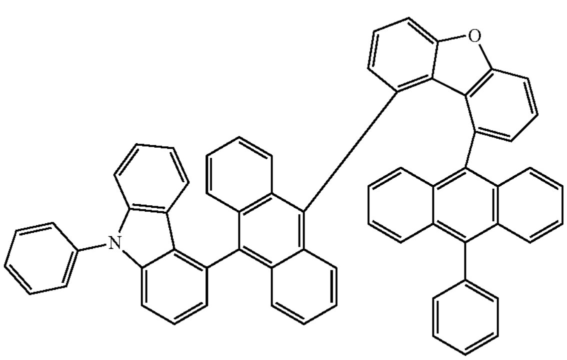
1001
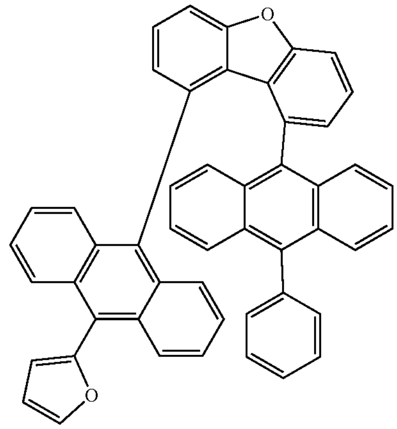
1002
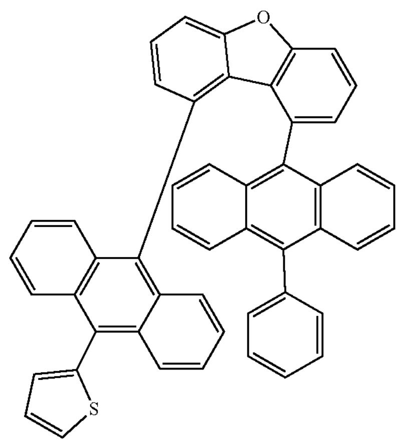
1003
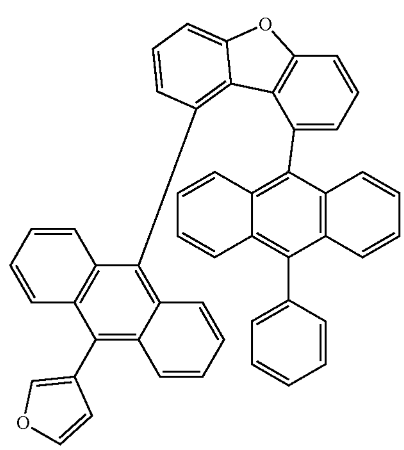

-continued
1004
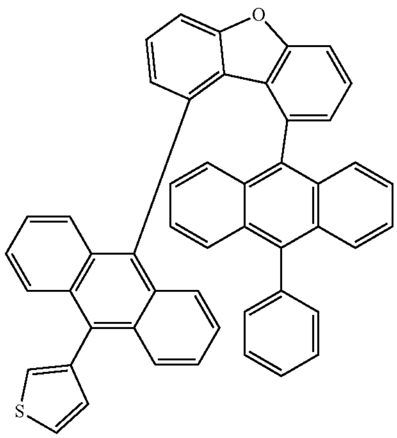
1005
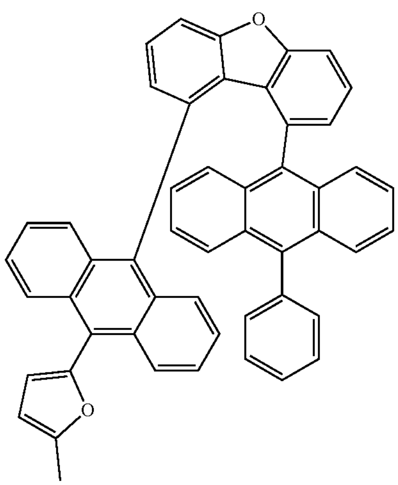
1006
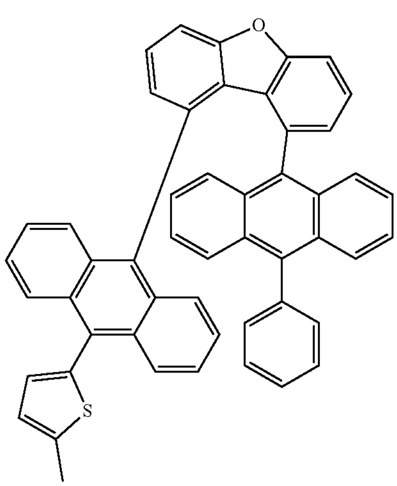
-continued
1007
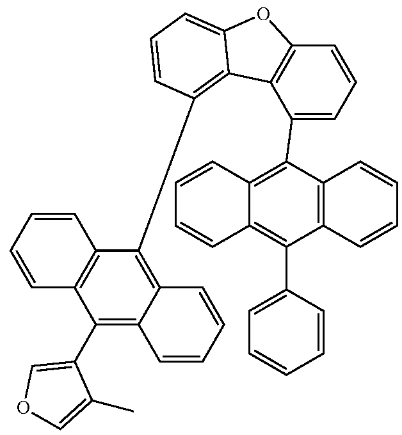
1008
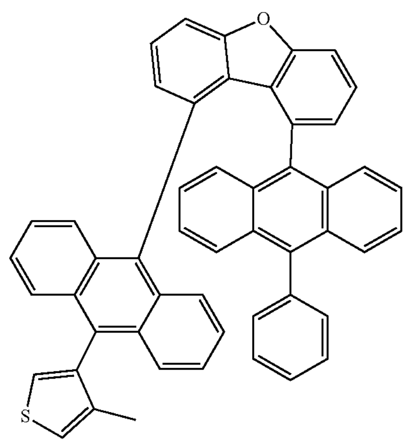
1009
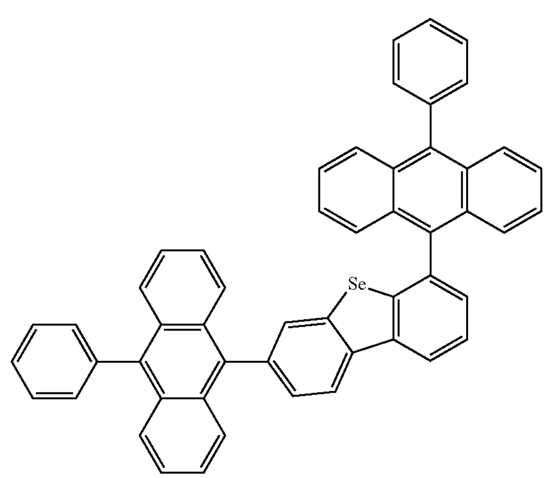

-continued
1010
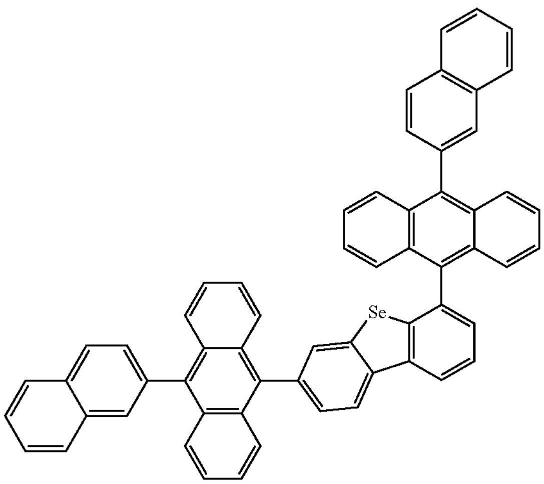
1011
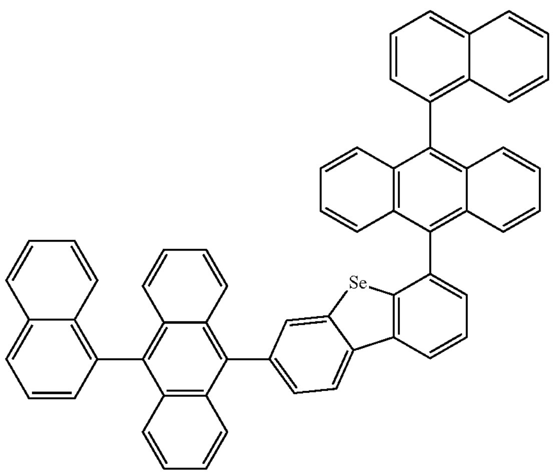
1012
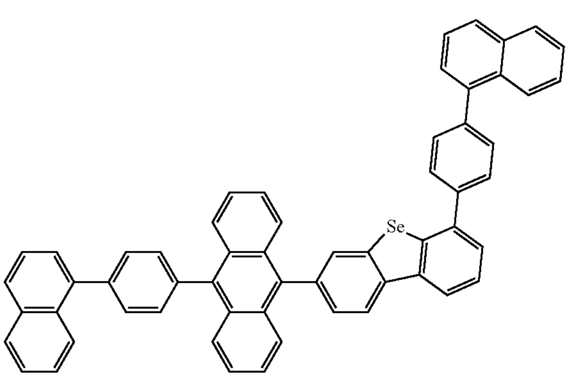
-continued
1013
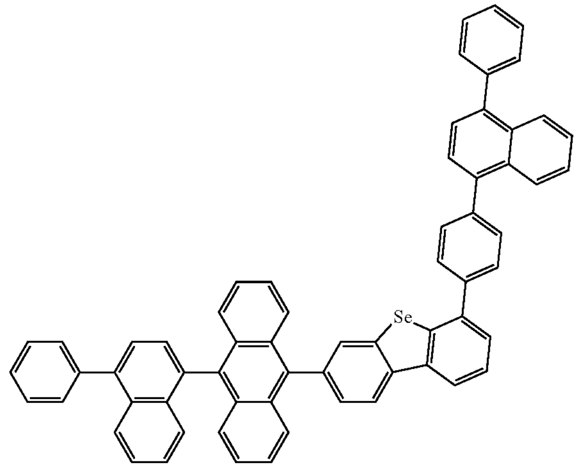
1014
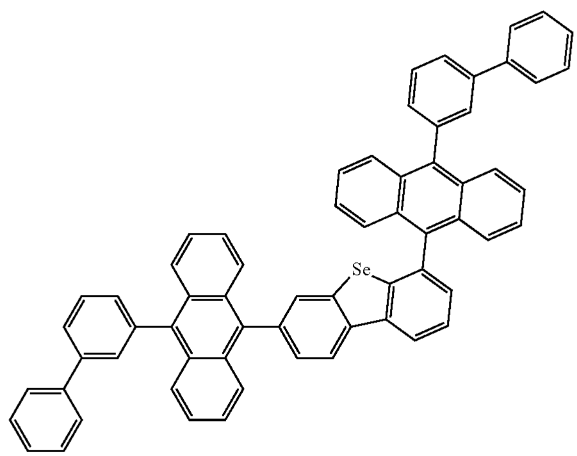
1015
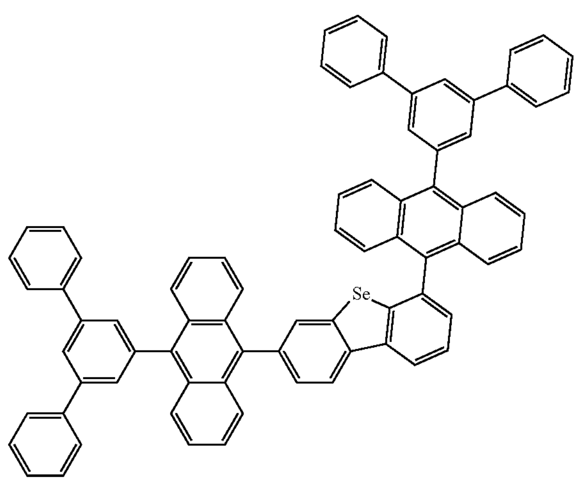

1016
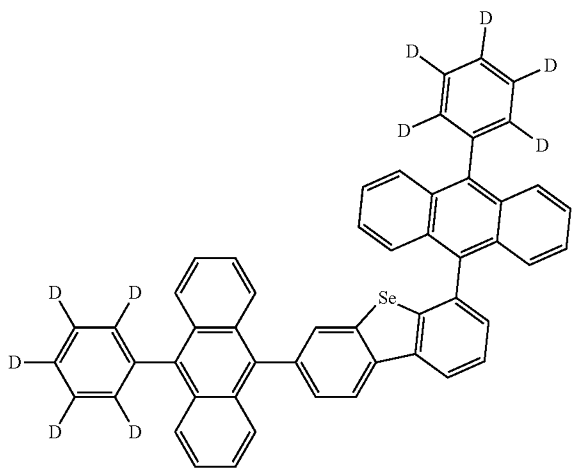
1017
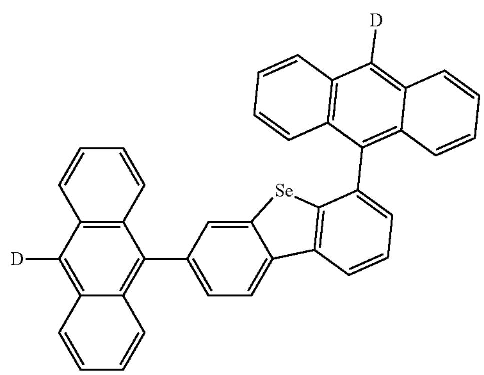
1018
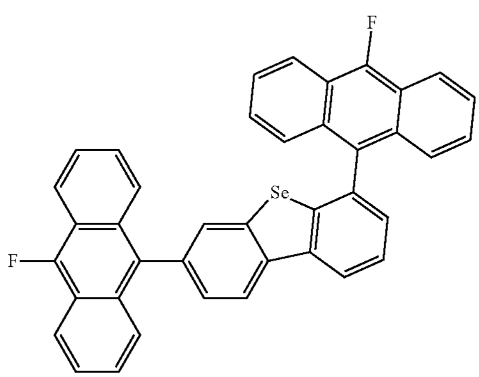
1019
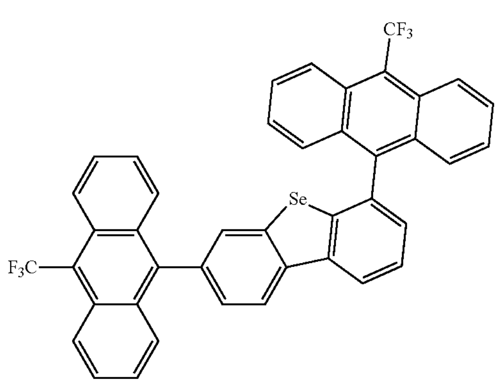
1020
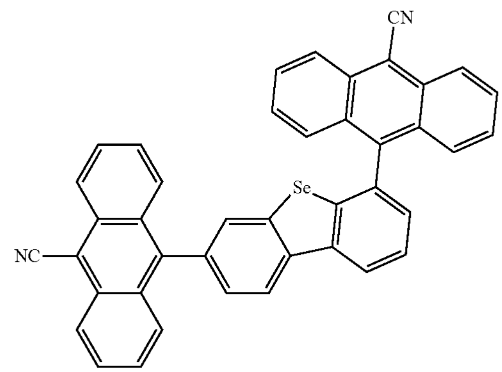
1021
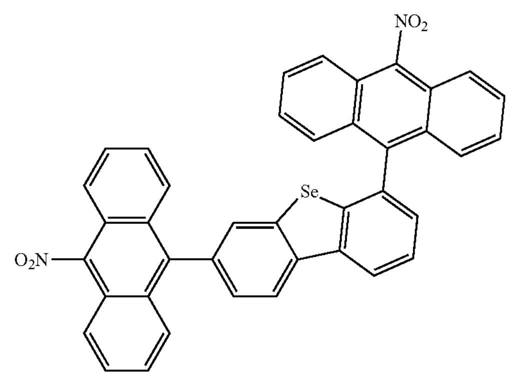
1022
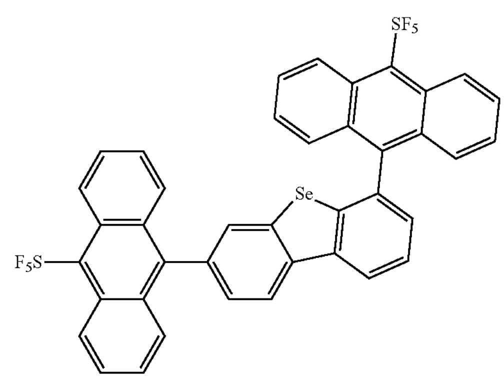
1023
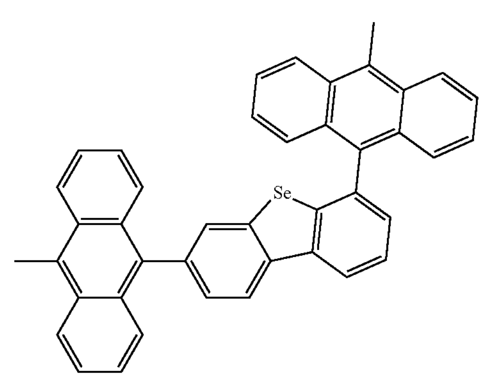

-continued
1024
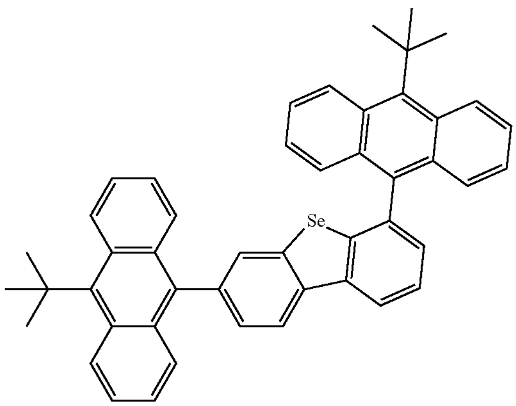
1025
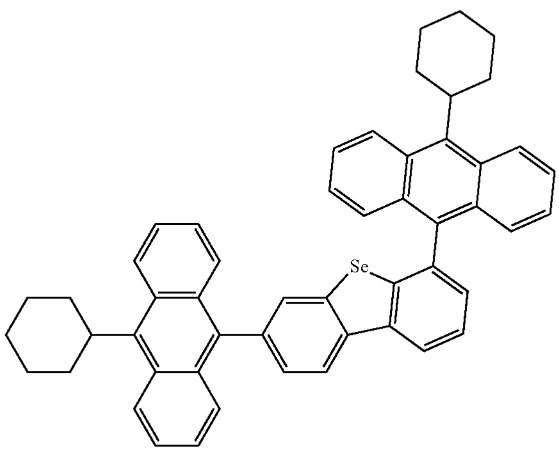
1026
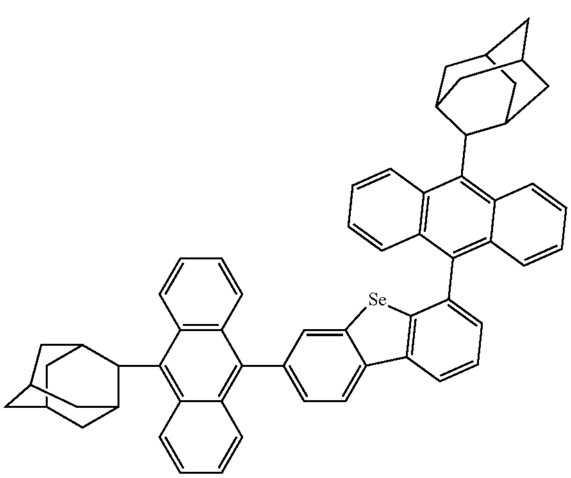
-continued
1027
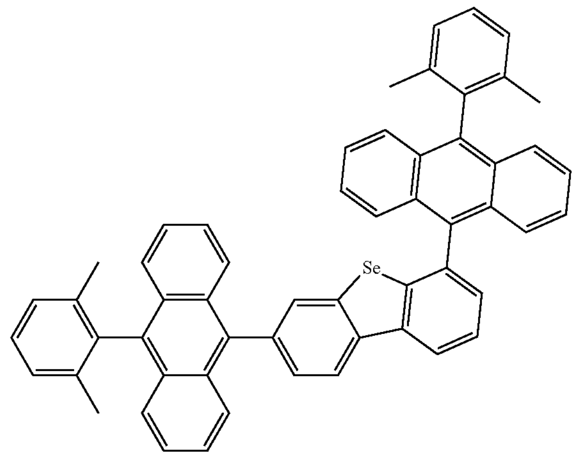
1028
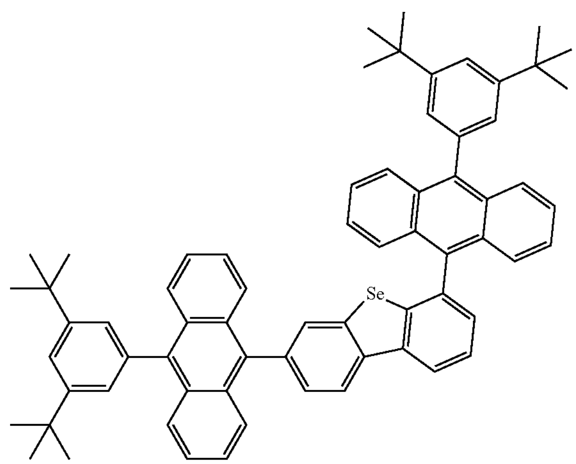
1029
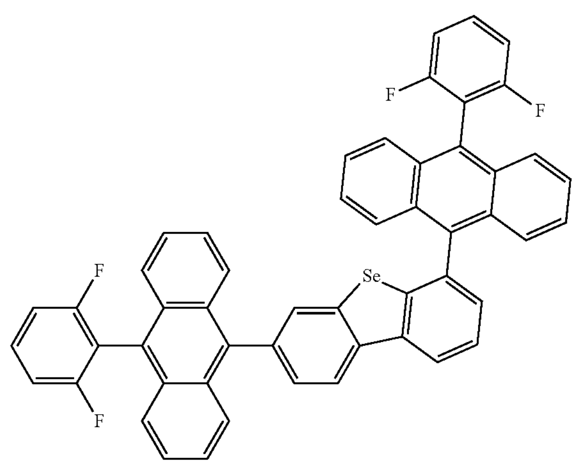

-continued
1028
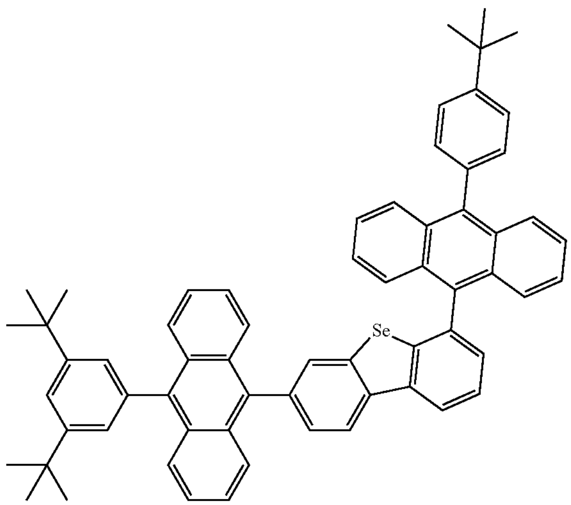
1029
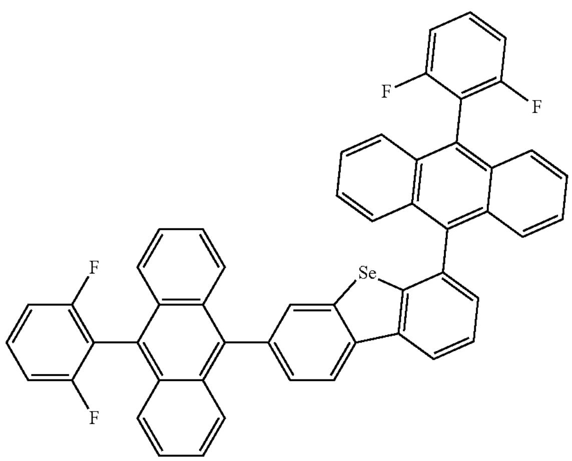
1030
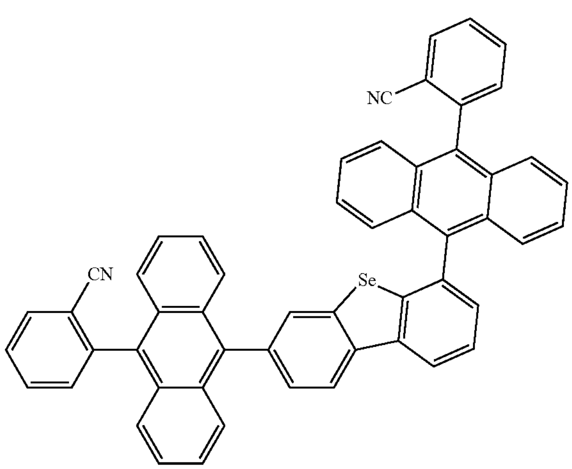
-continued
1031
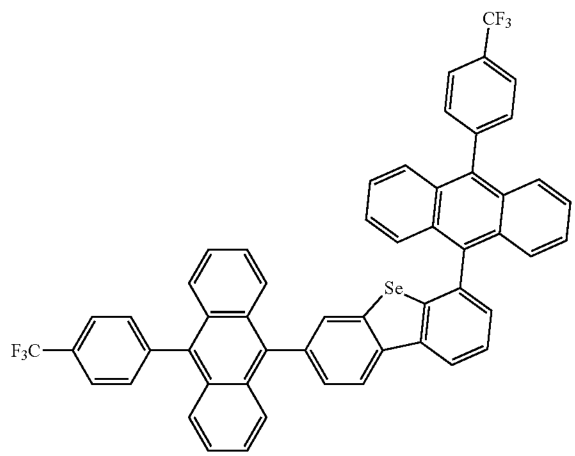
1032
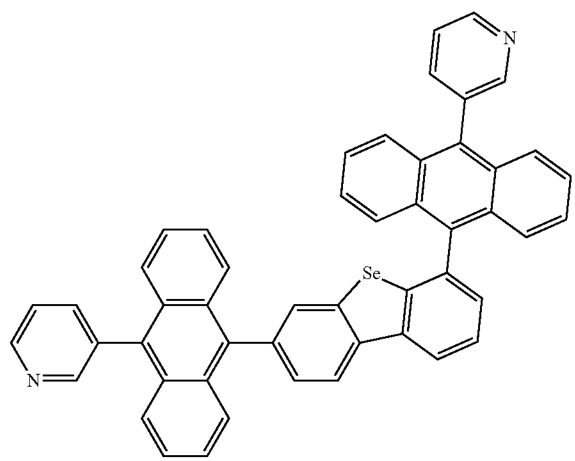
1033
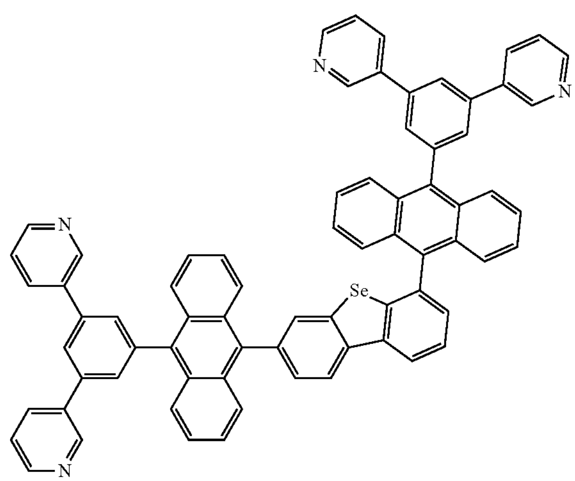

-continued
1034
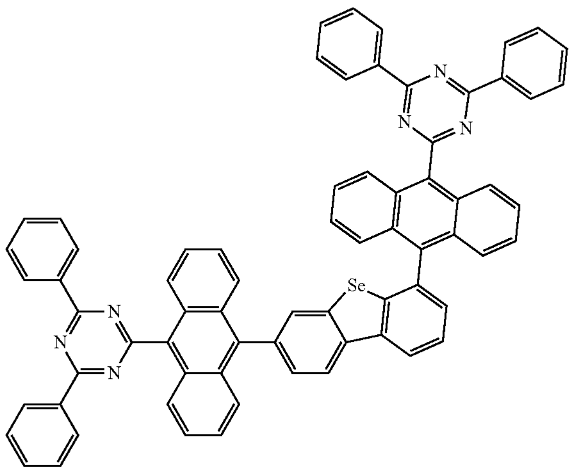
1035
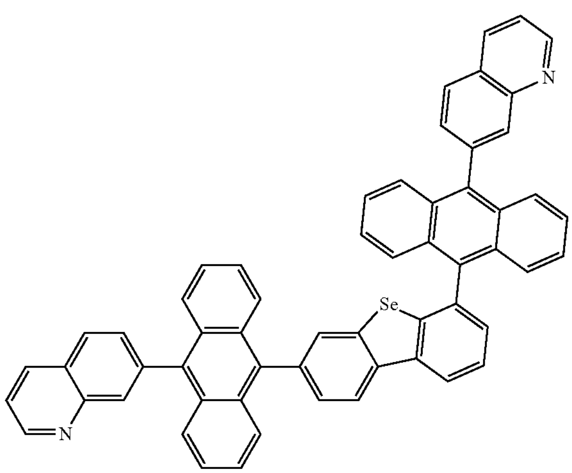
1036
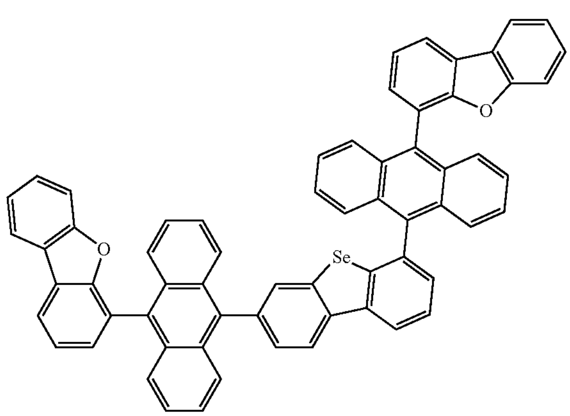
-continued
1037
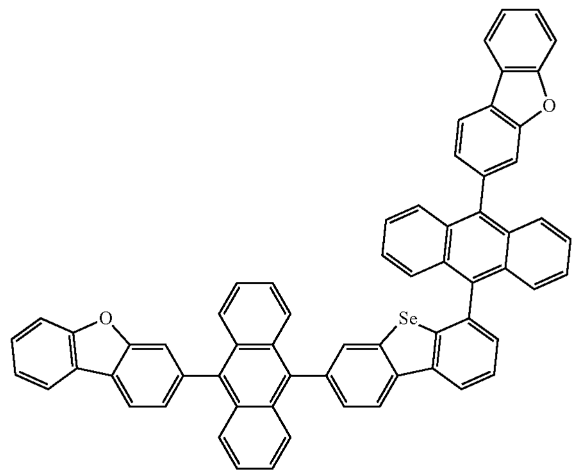
1038
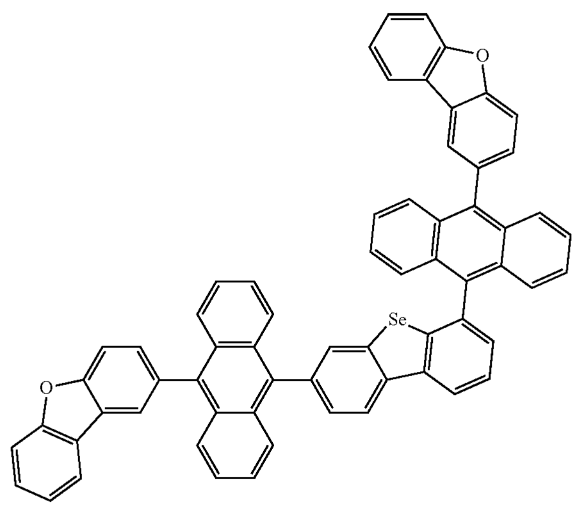
1039
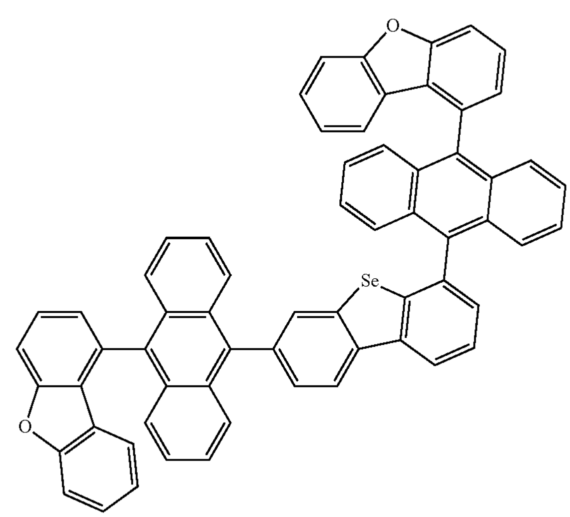

-continued
1040
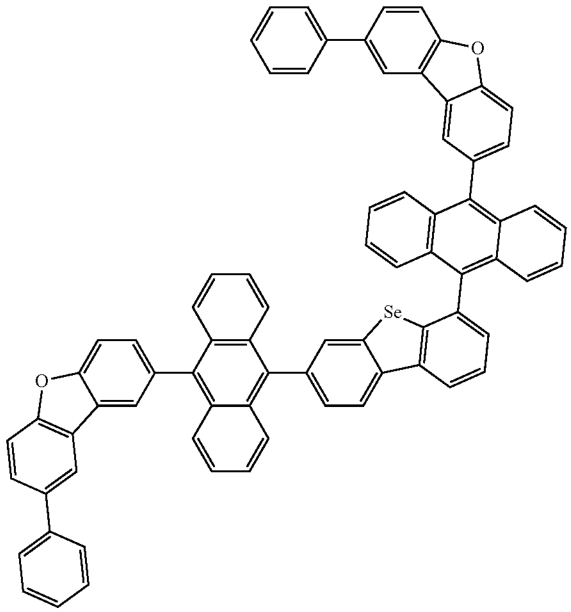
1041
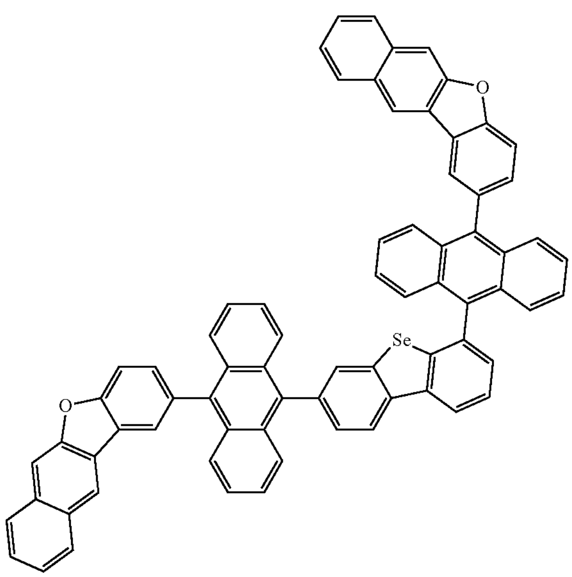
-continued
1042
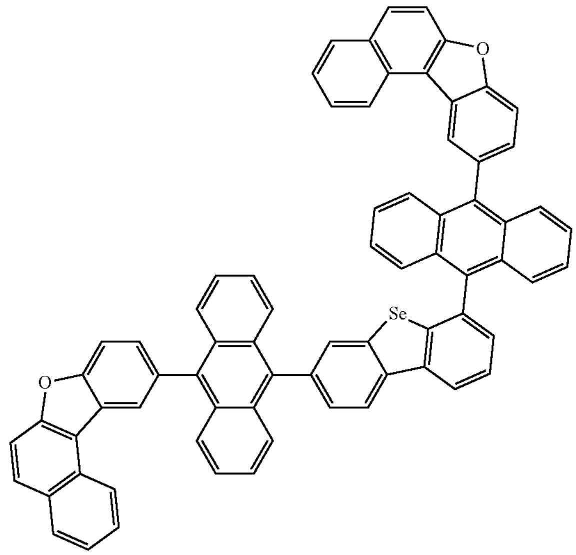
1043
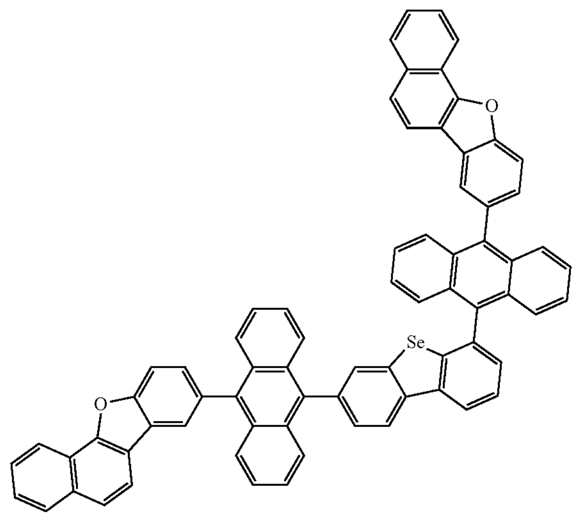
1044
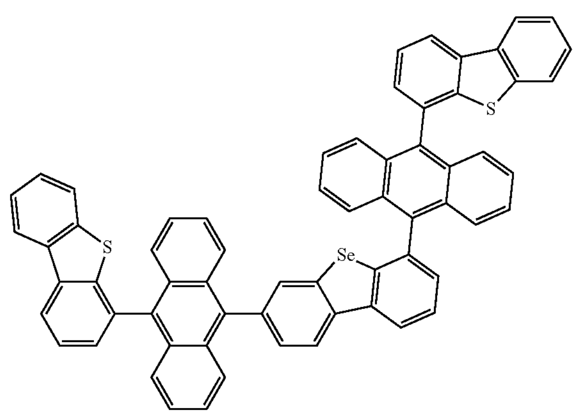

-continued
1045
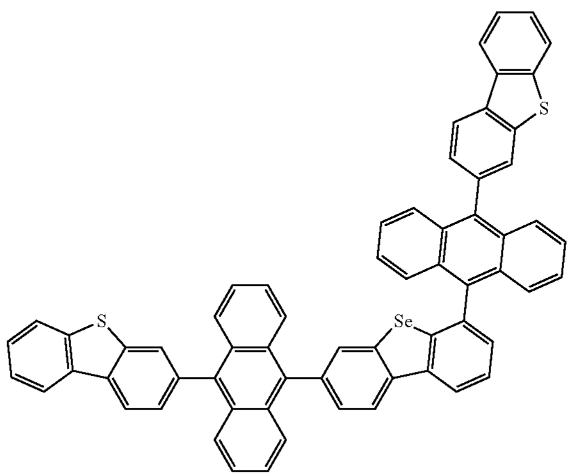
1046
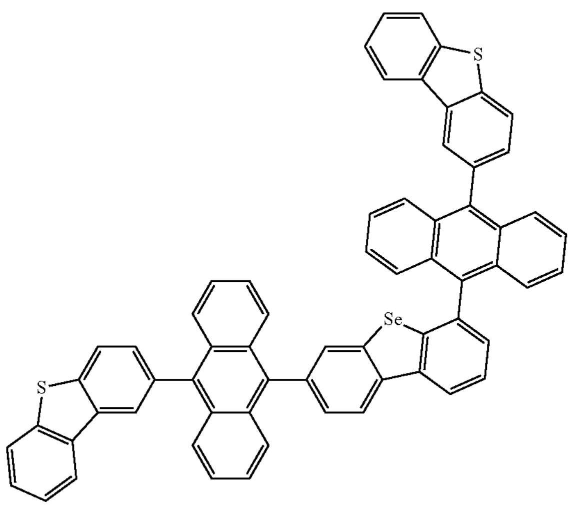
1047
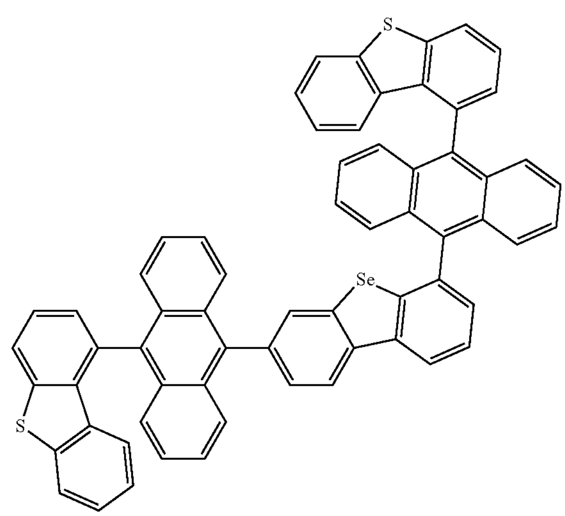
-continued
1048
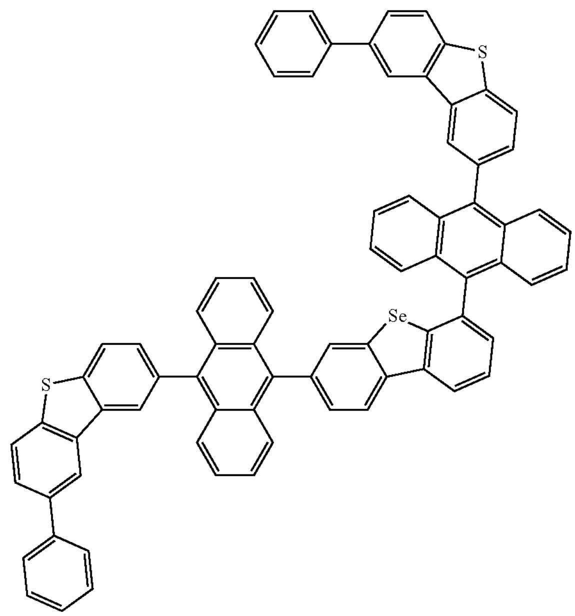
1049
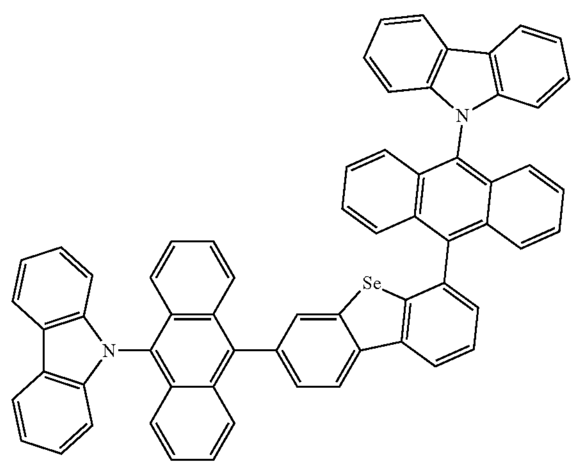
1050
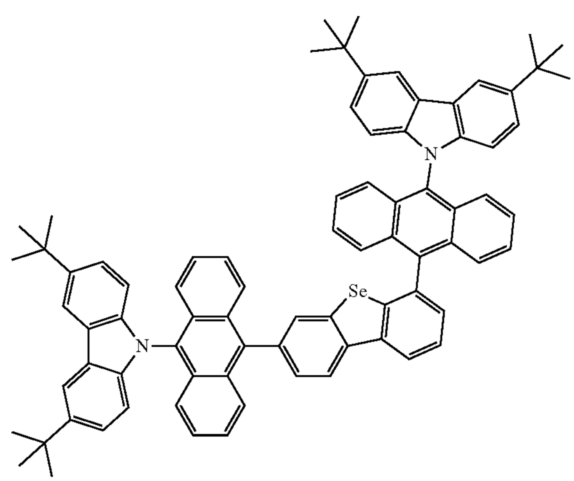

-continued
1051
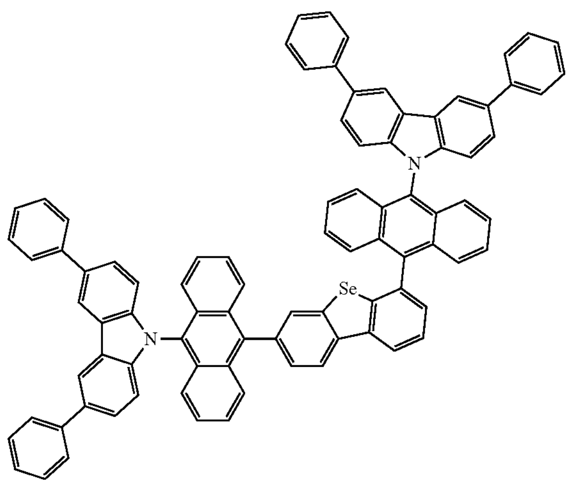
1052
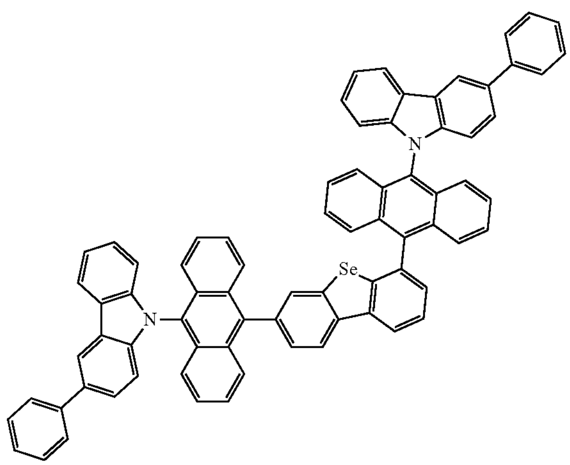
1053
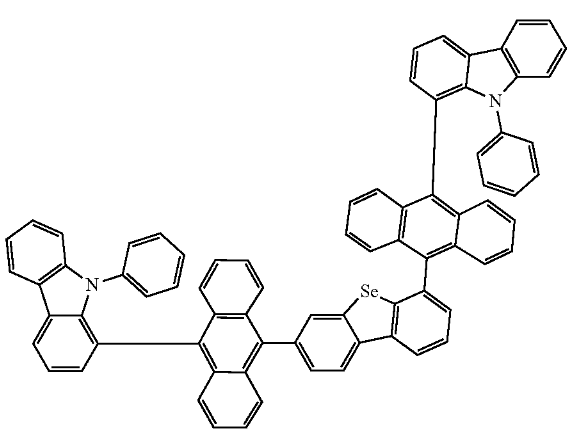
-continued
1054
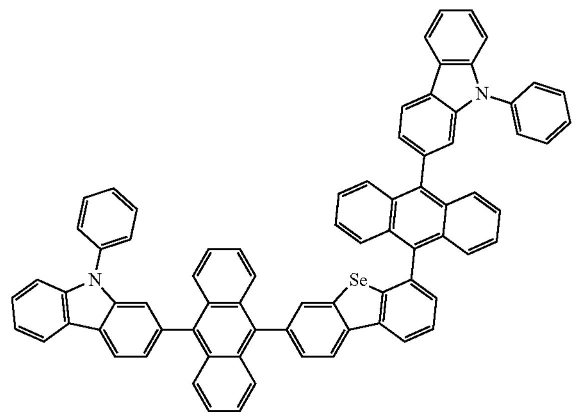
1055
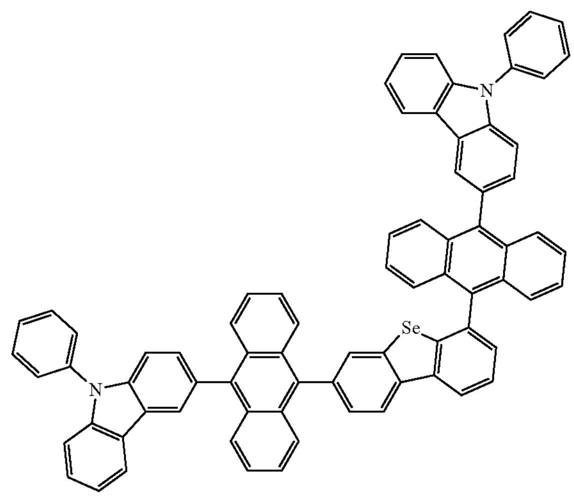
1056
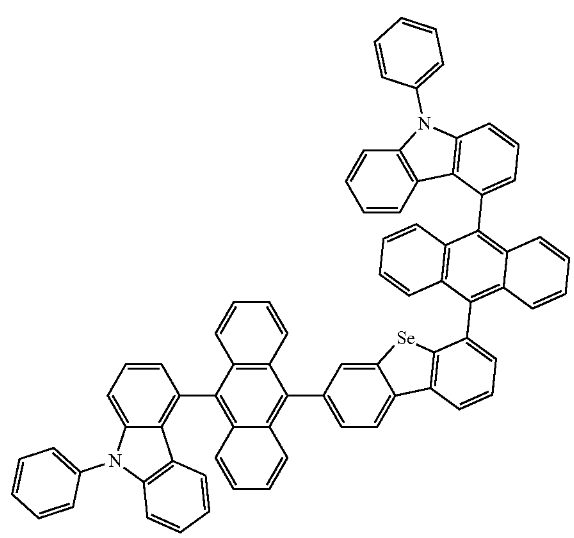

-continued
1057
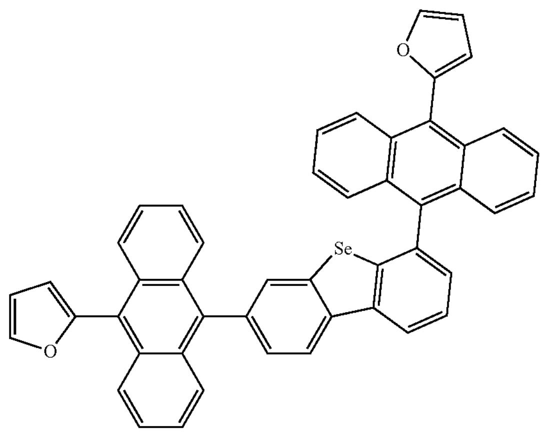
1058
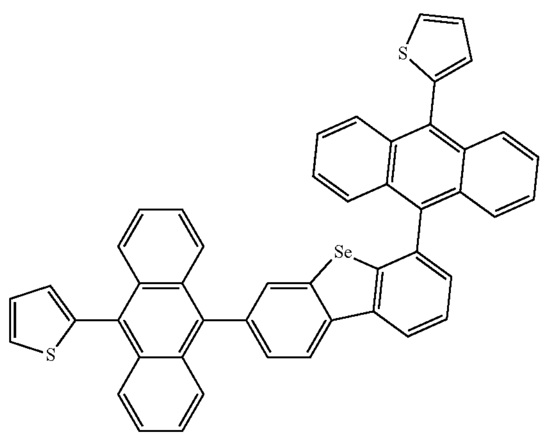
1059
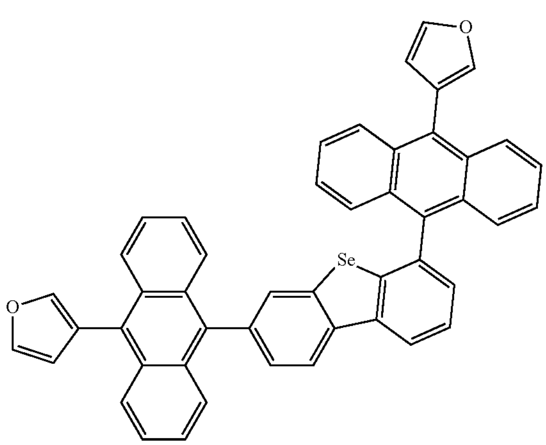
-continued
1060
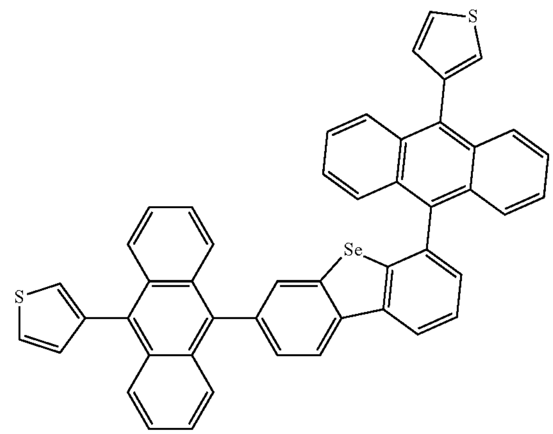
1061
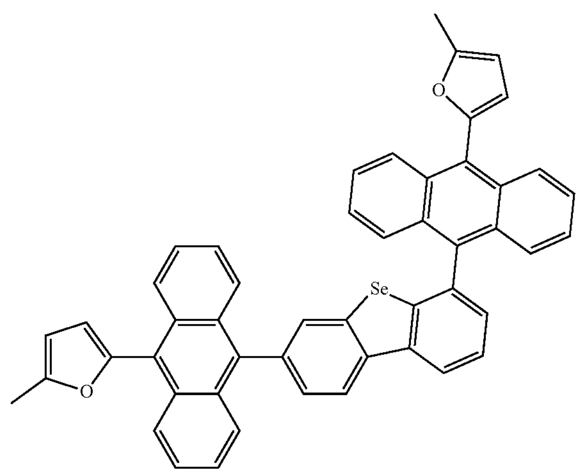
1062
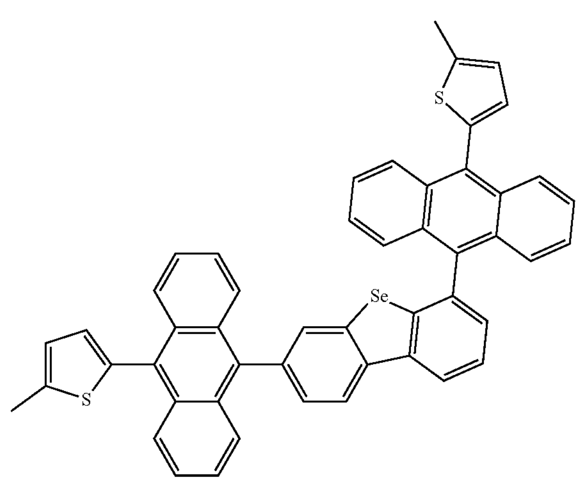

1063
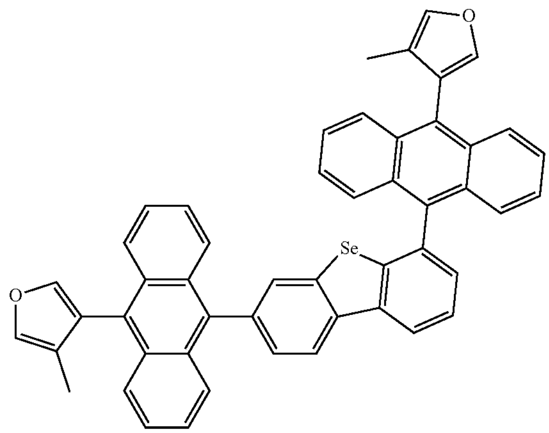
1064
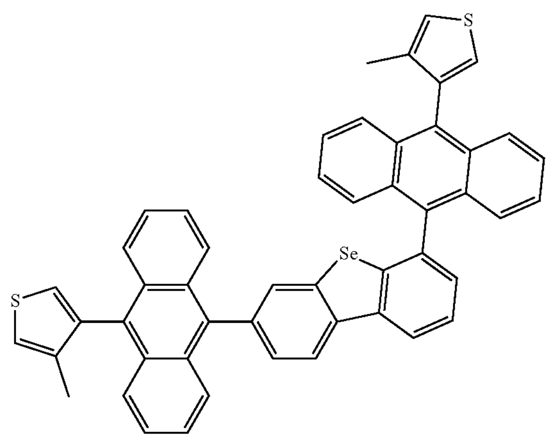
1065
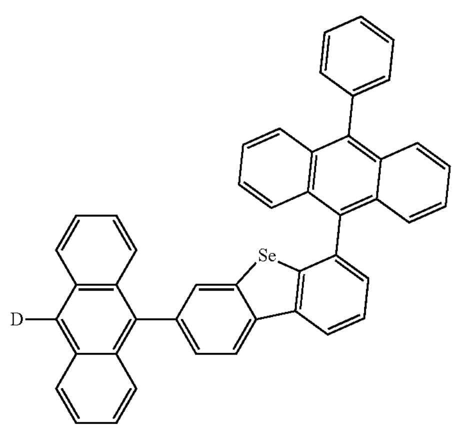
1066
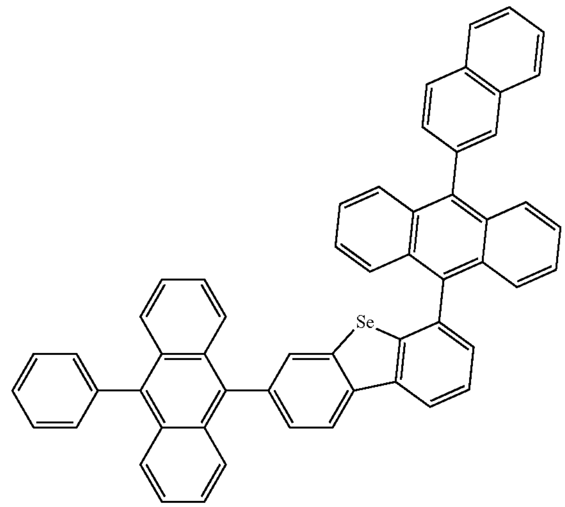
1067
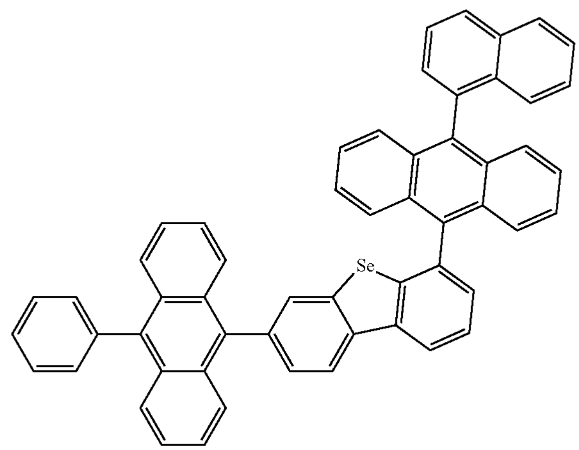
1068
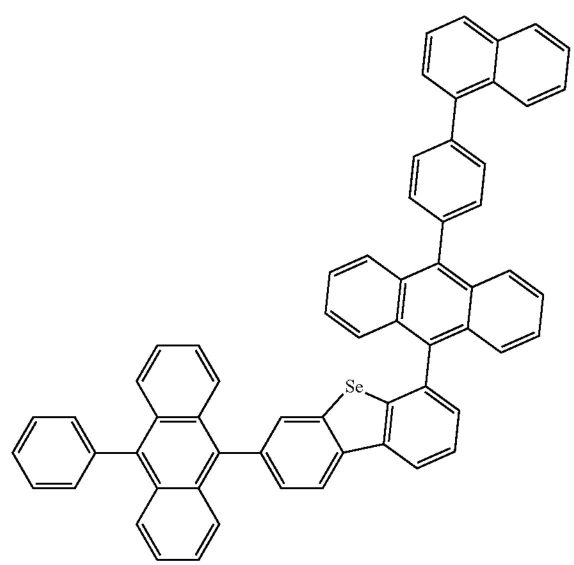

-continued
1069
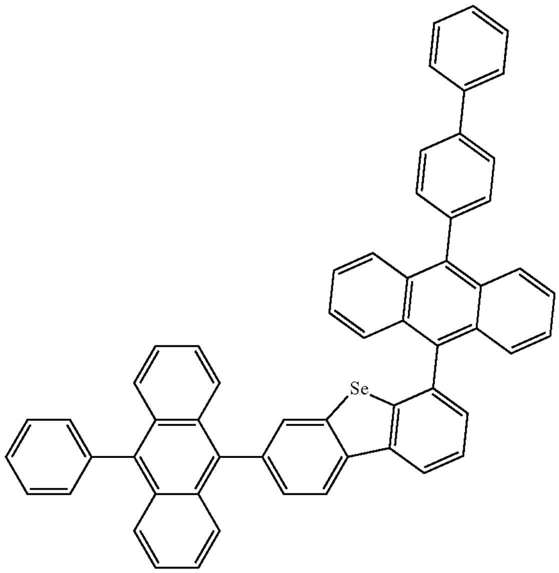
1070
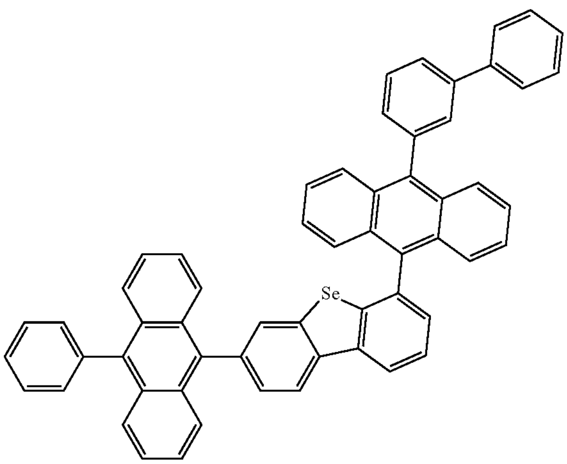
1071
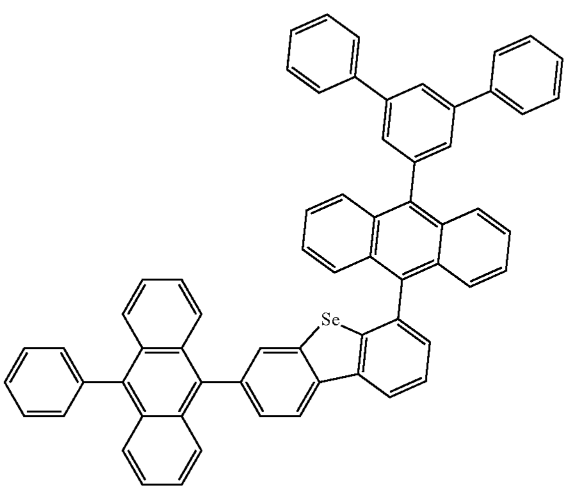
-continued
1072
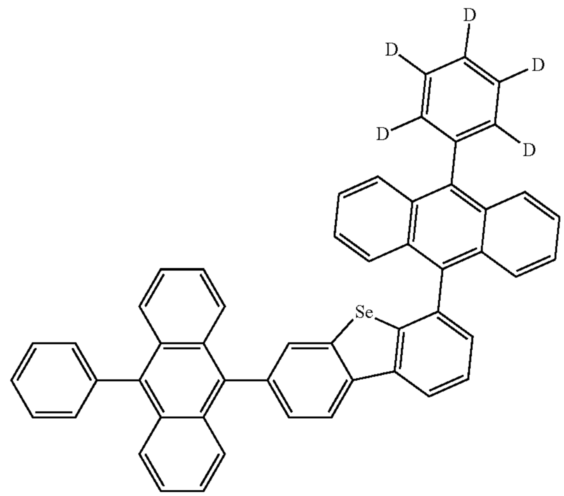
1073
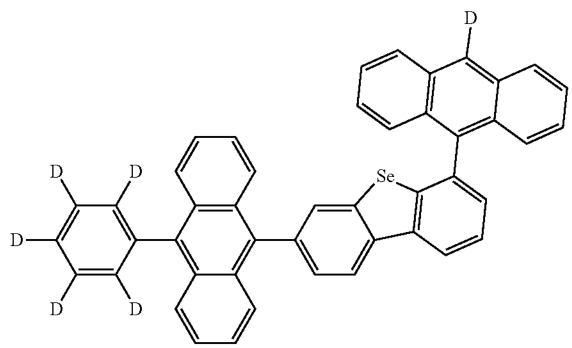
1074
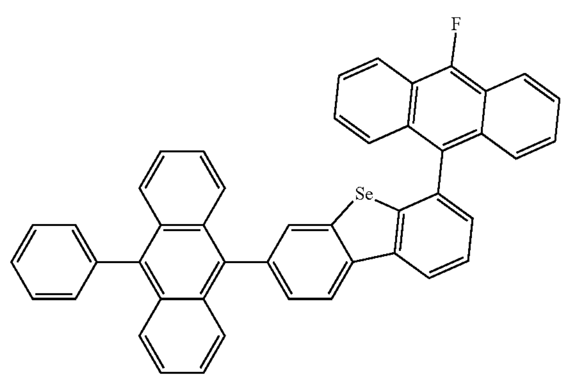

1075
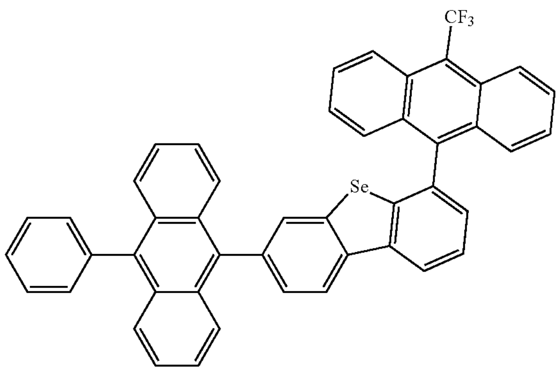
1076
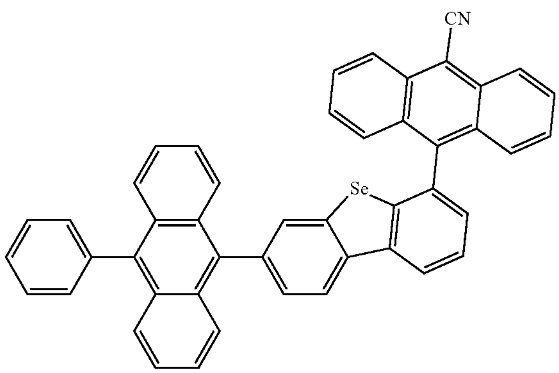
1077
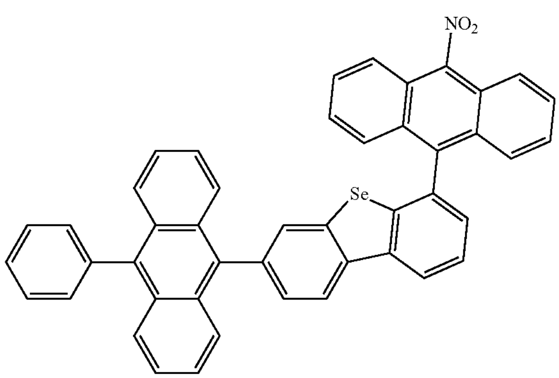
1078
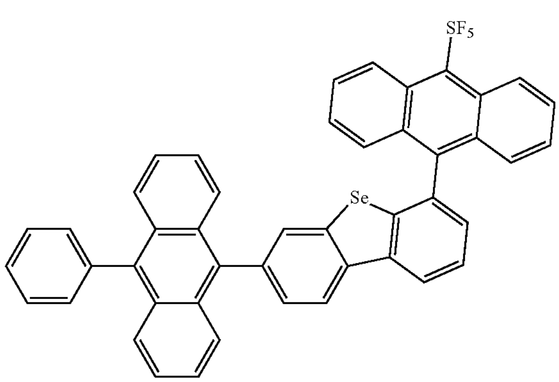
1079
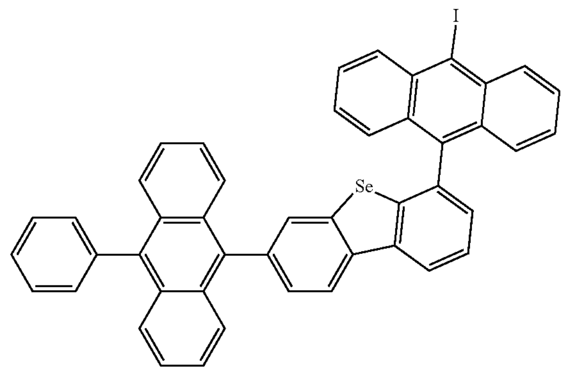
1080
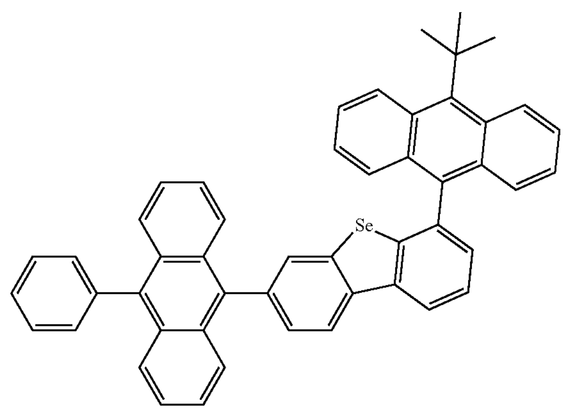
1081
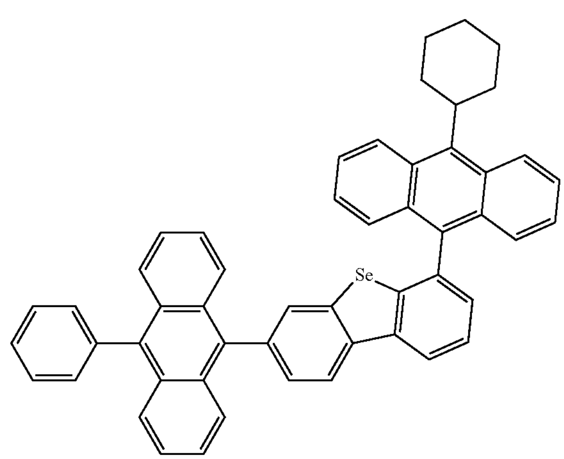

-continued
1082
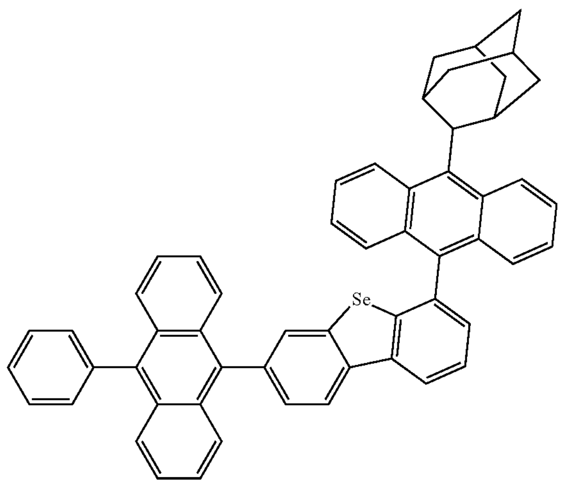
1083
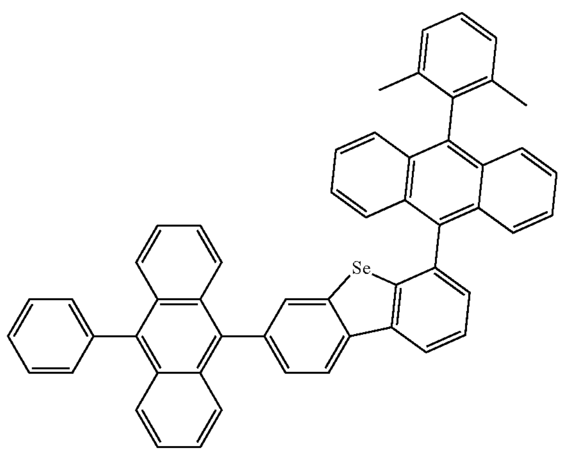
1084
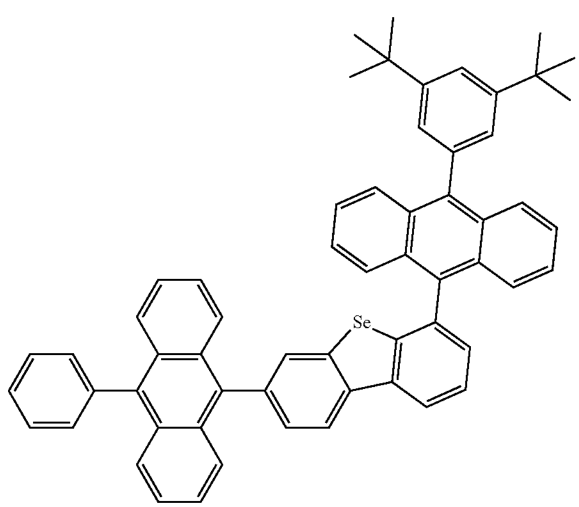
-continued
1085
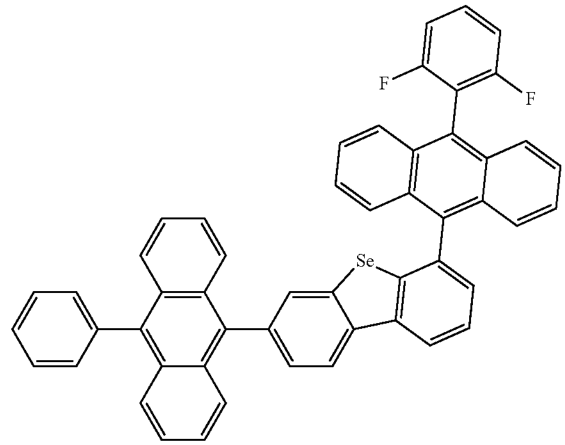
1086
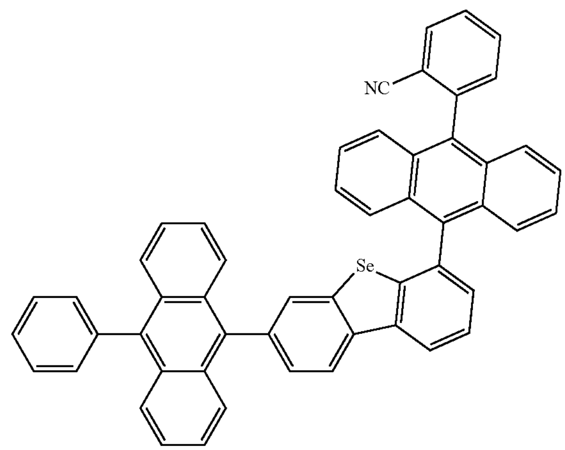
1087
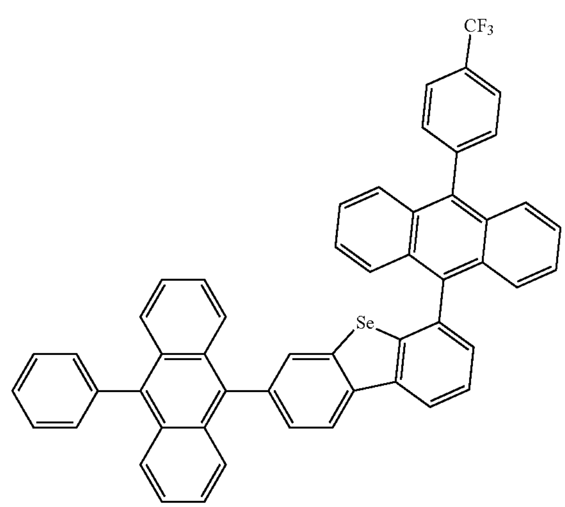

-continued
1088
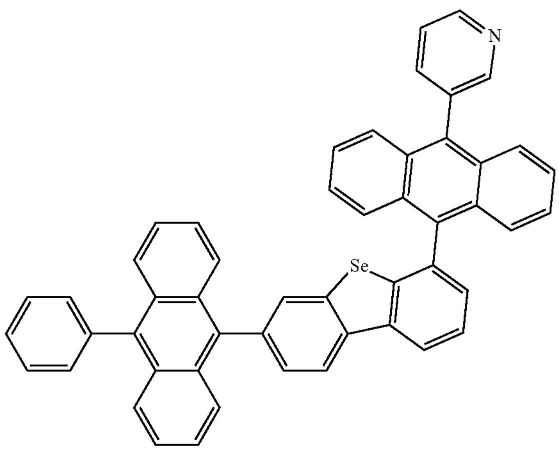
1089
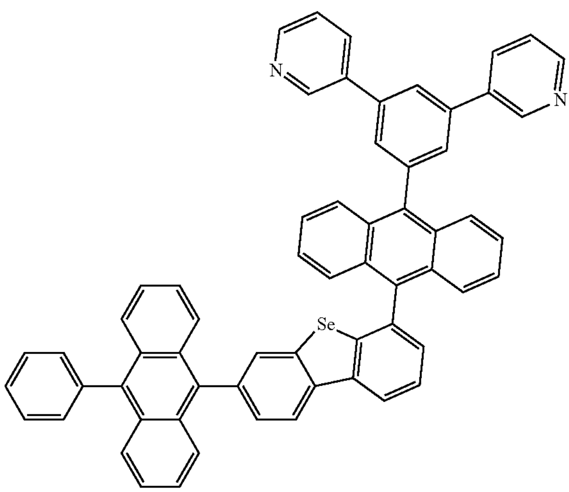
1090
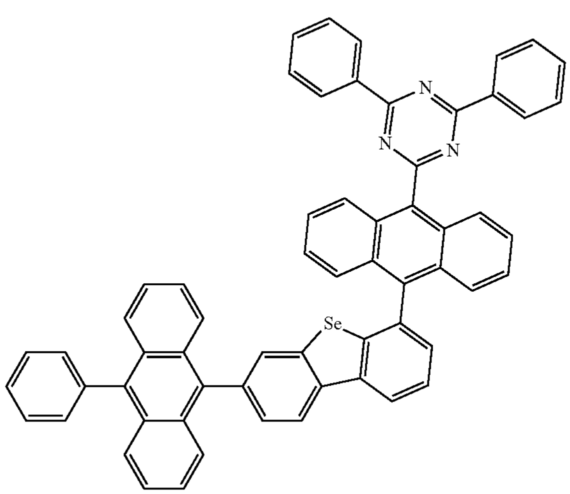
-continued
1091
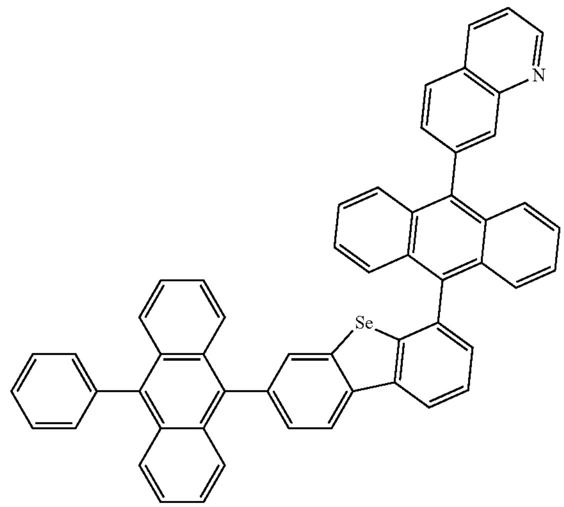
1092
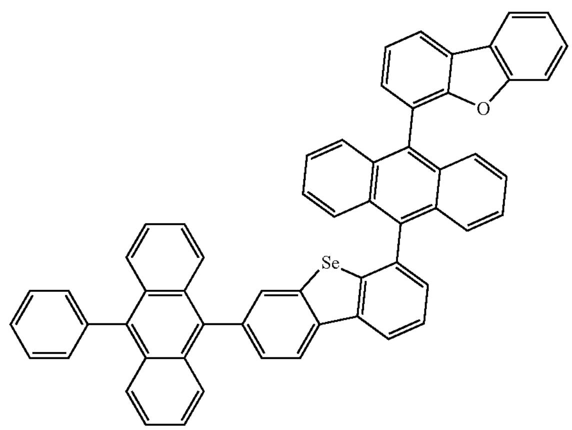
1093
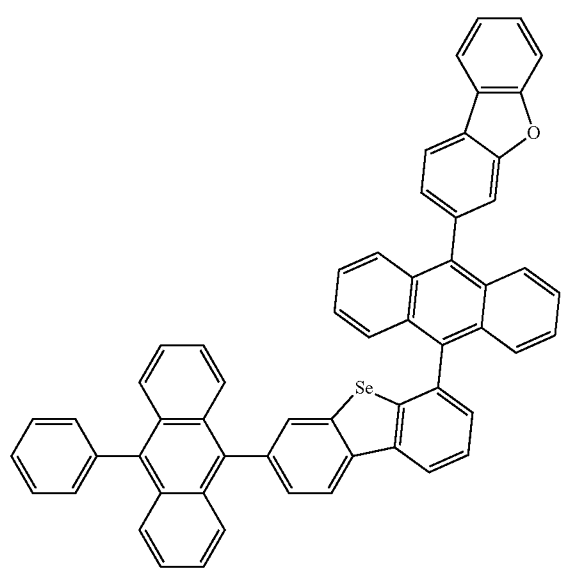

-continued
1094
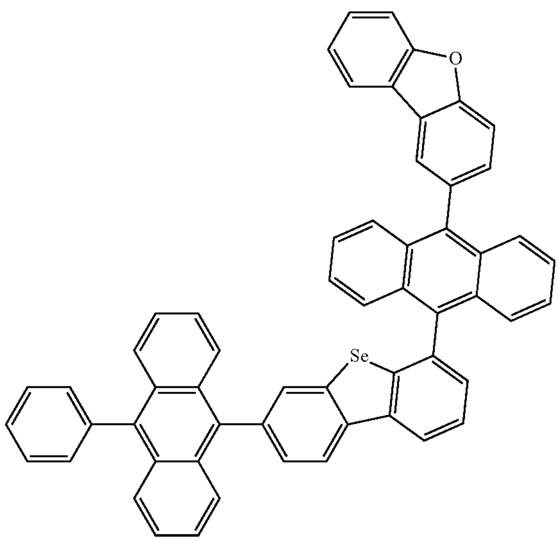
1095
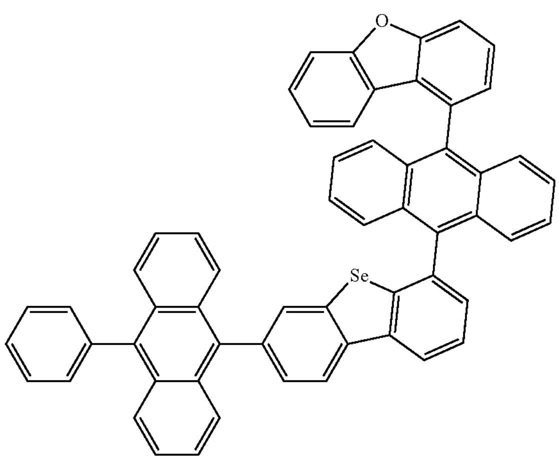
1096
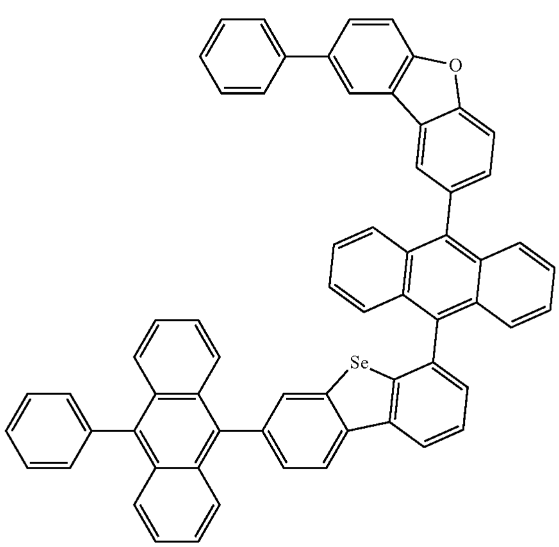
-continued
1097
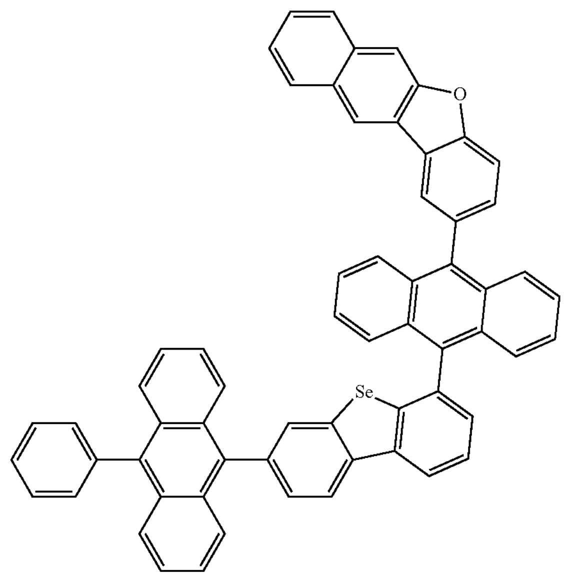
1098
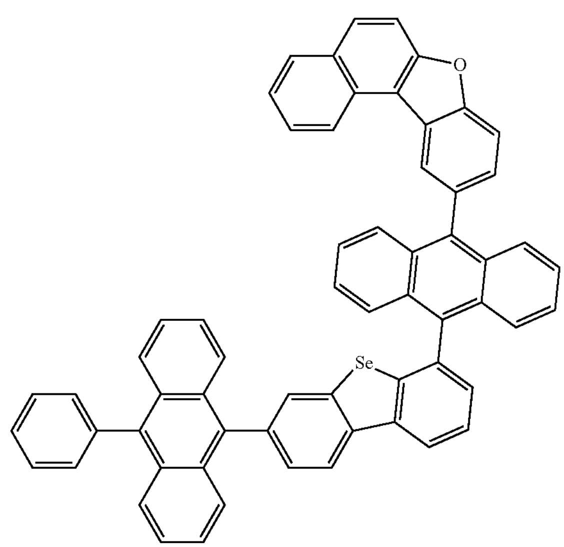

-continued
1099
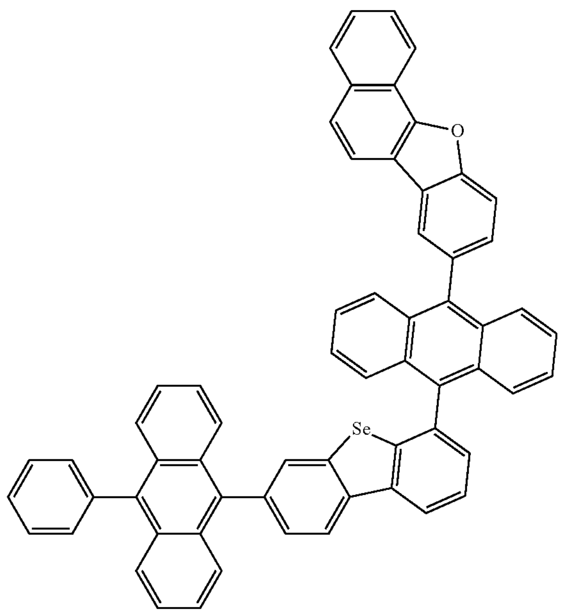
1100
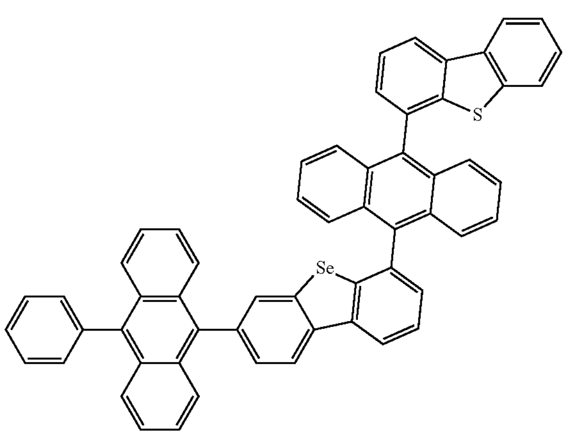
1101
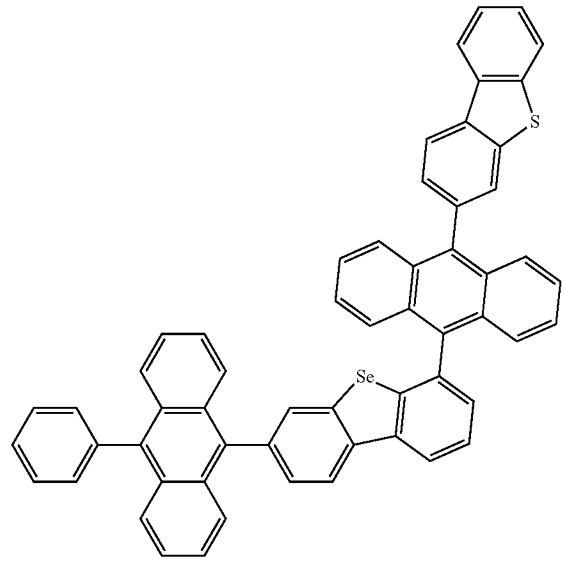
1102
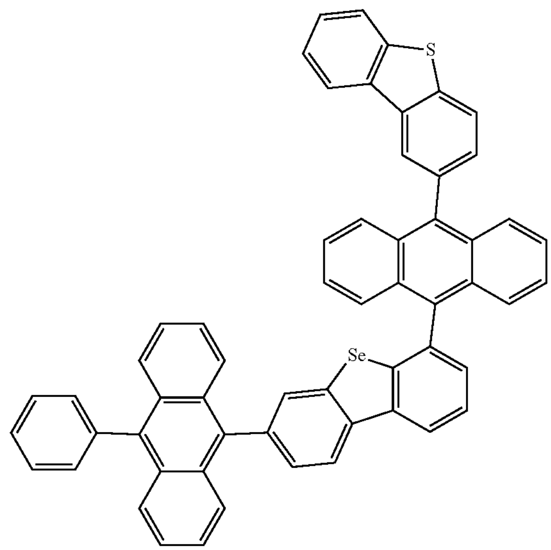
1103
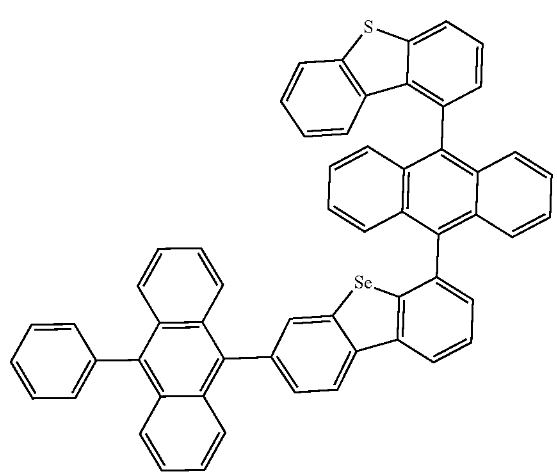

-continued
1104
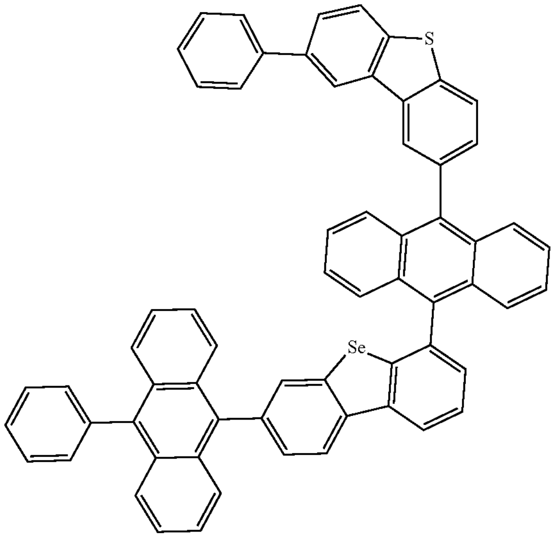
1105
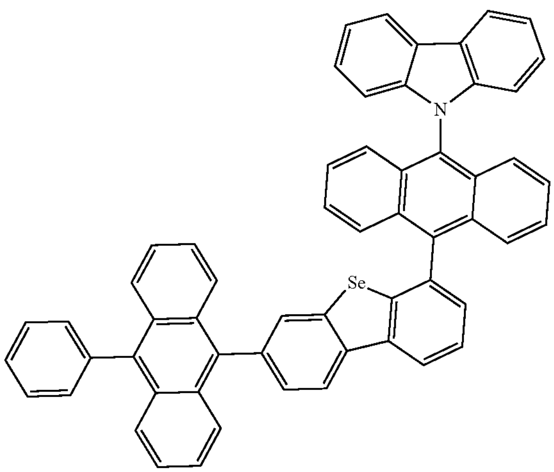
1106
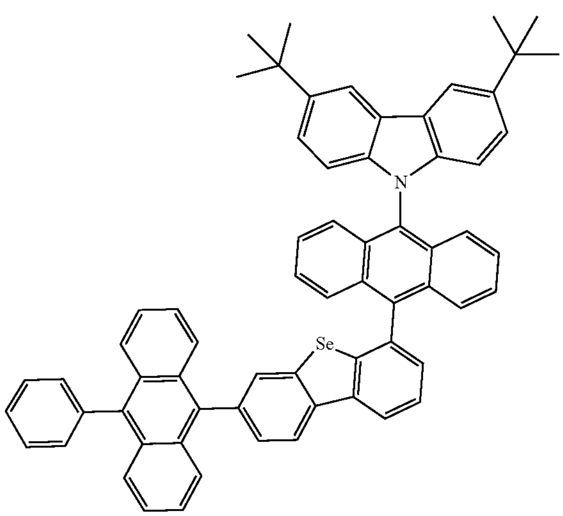
-continued
1107
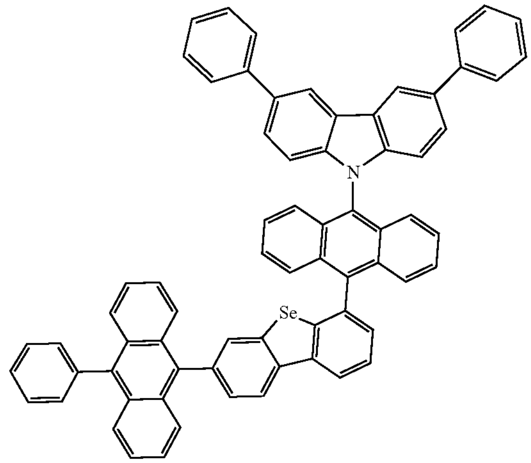
1108
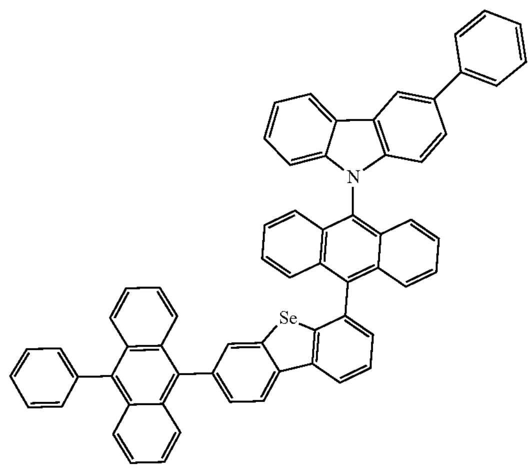
1109
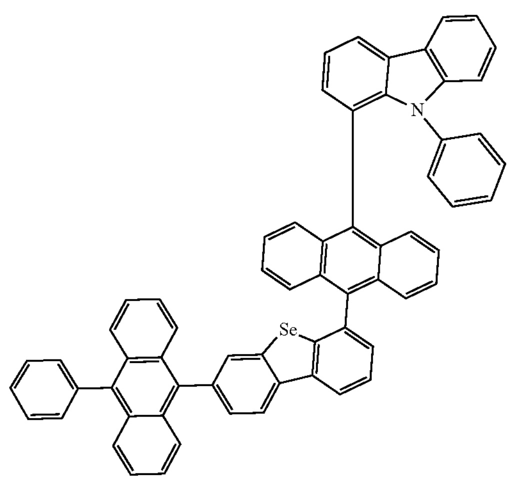

-continued
1110
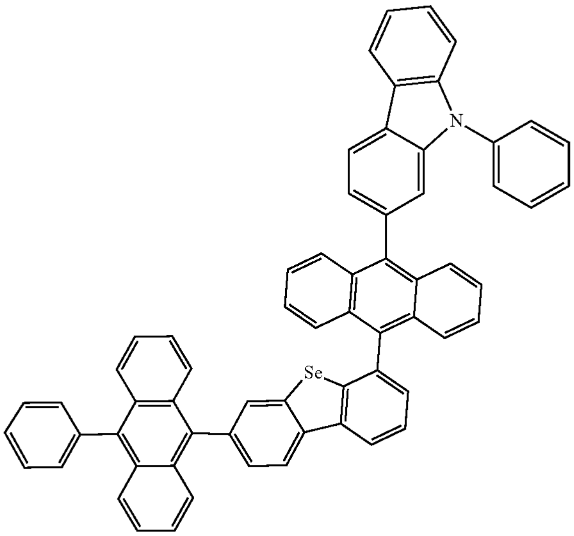
1111
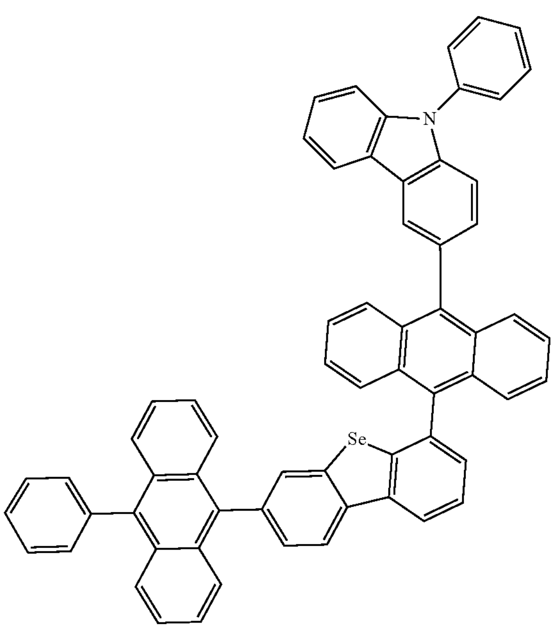
-continued
1112
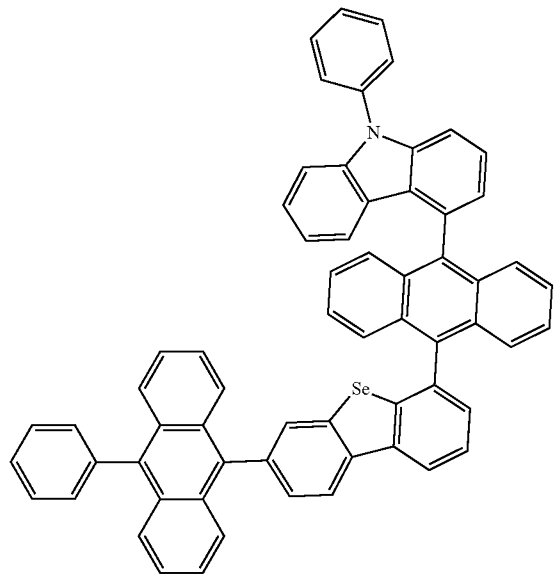
1113
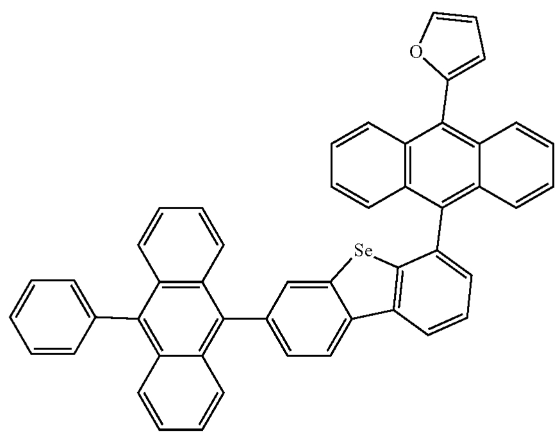
1114
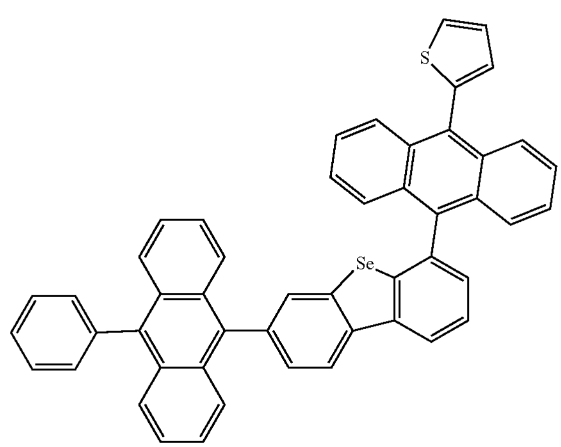

-continued
1115
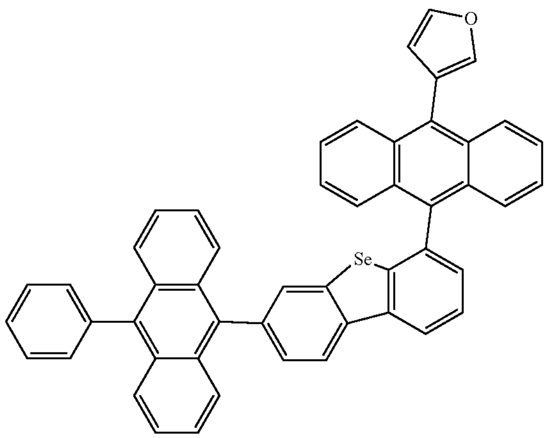
1116
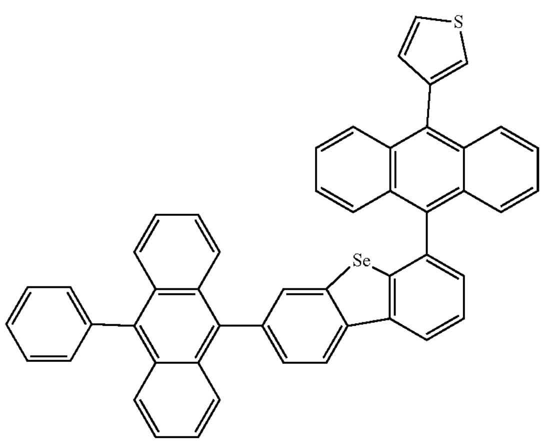
1117
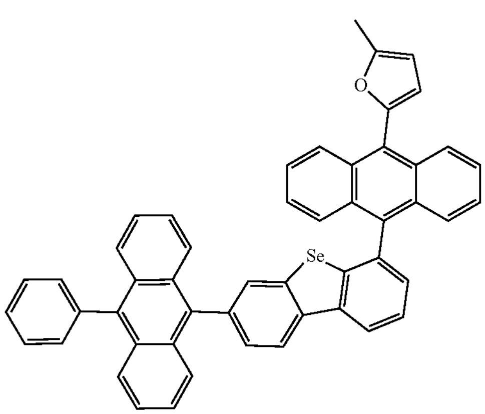
-continued
1118
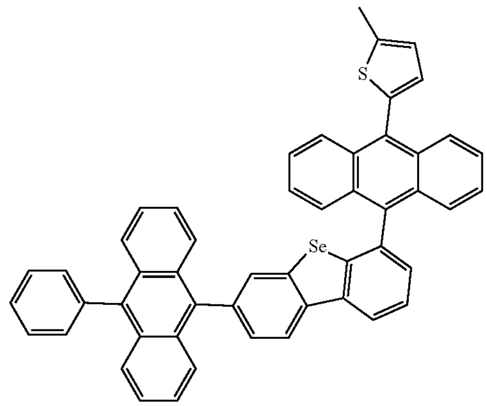
1119
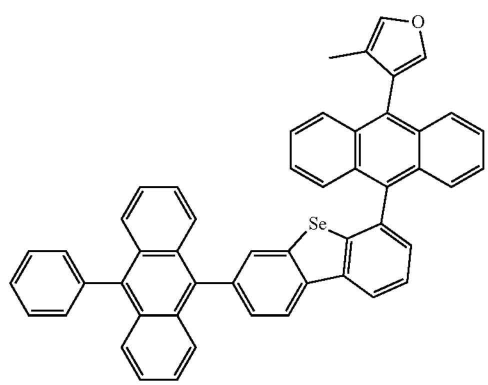
1120
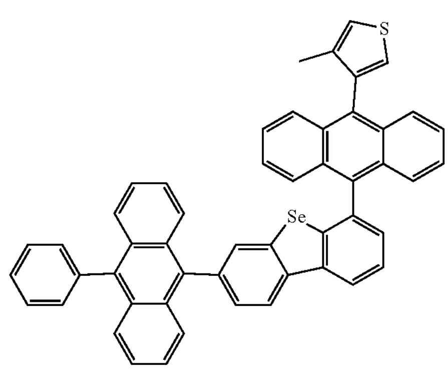

-continued
1121
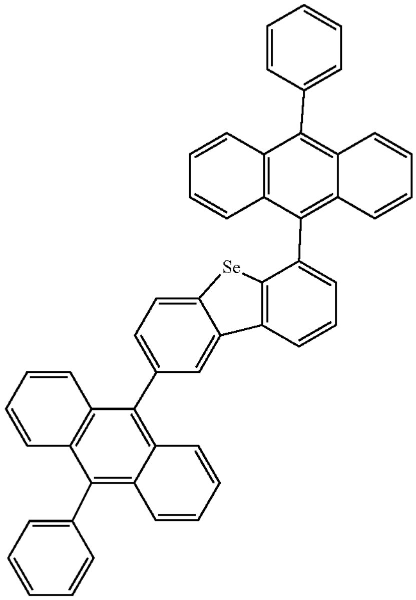
1122
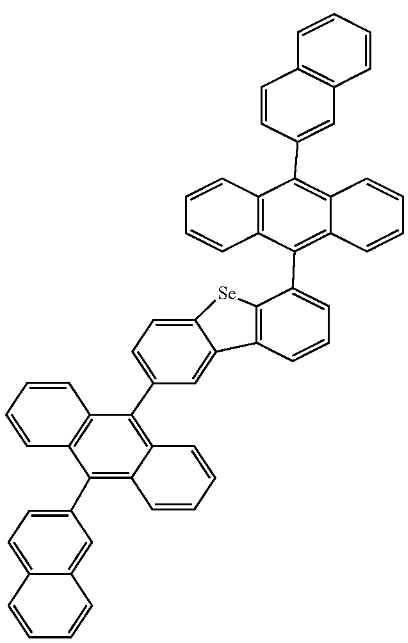
-continued
1123
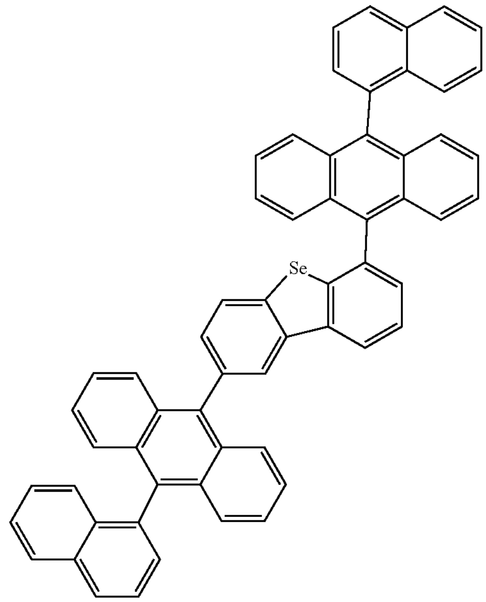
1124
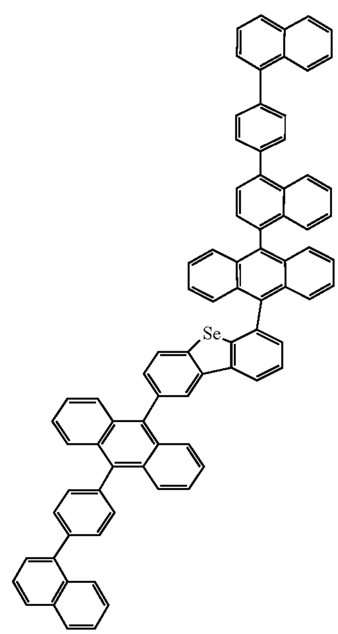

1125
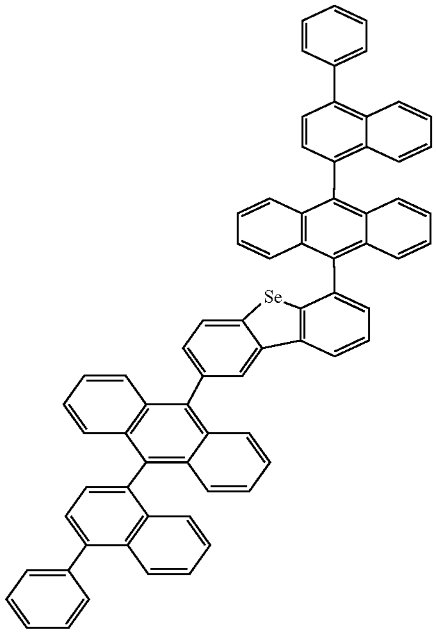
1126
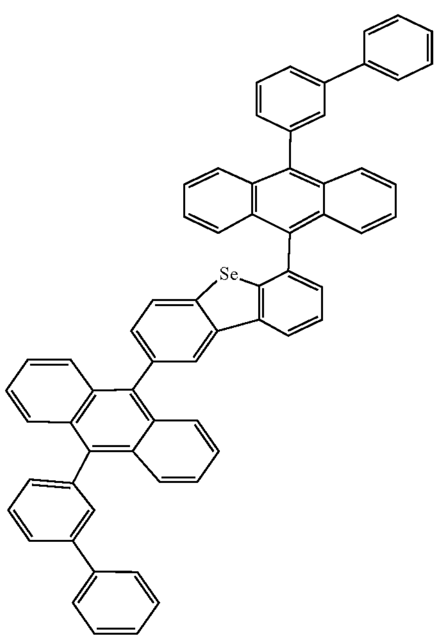
1127
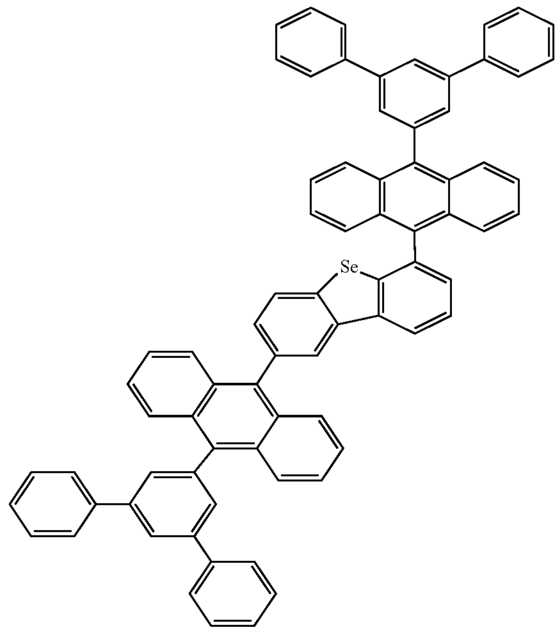
1128
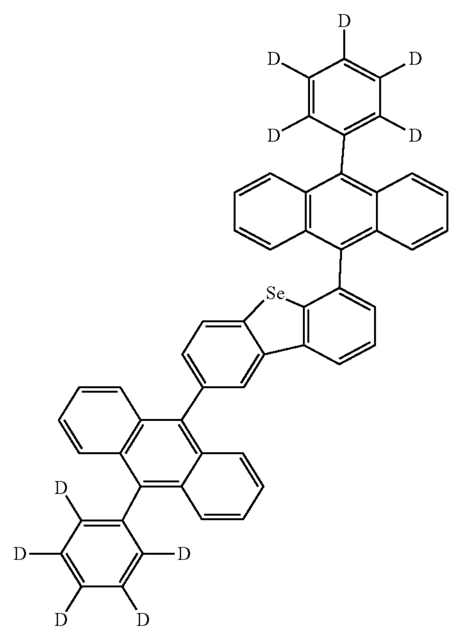

-continued
1129
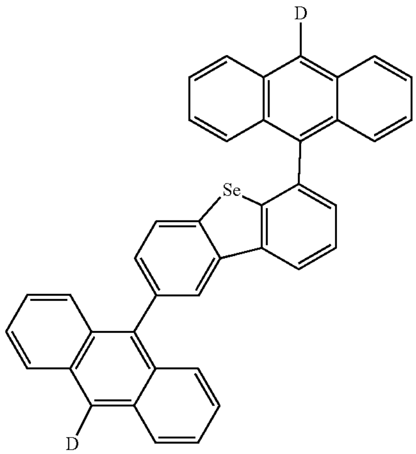
1130
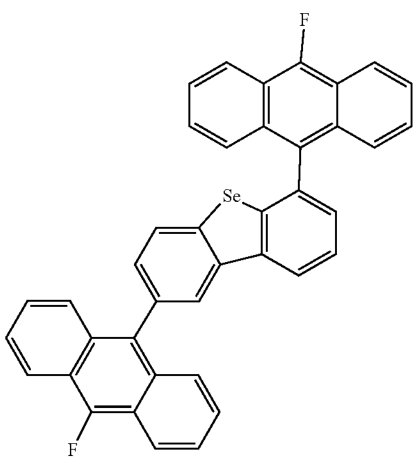
1131
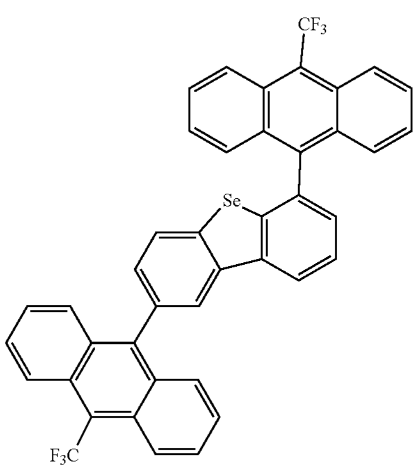
-continued
1132
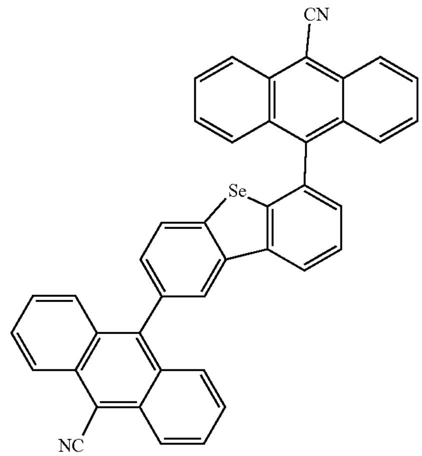
1133
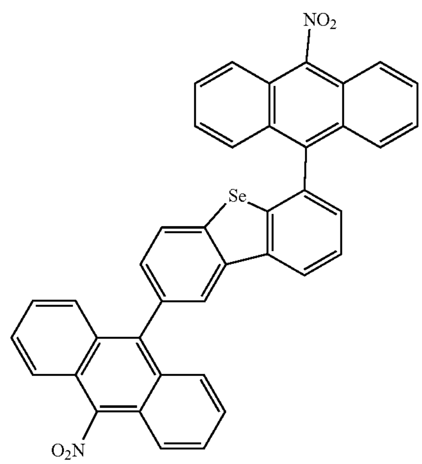
1134
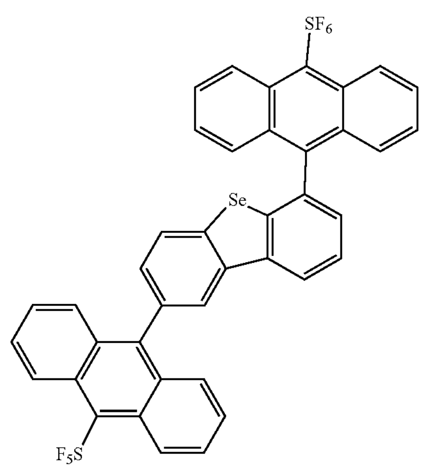

-continued
1135
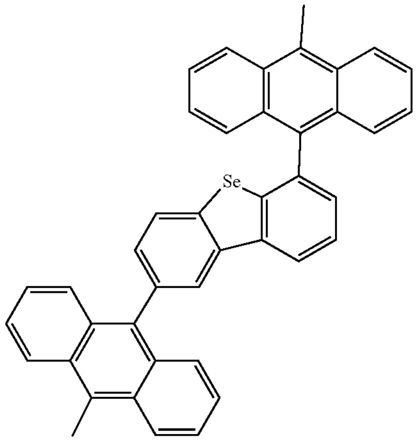
1136
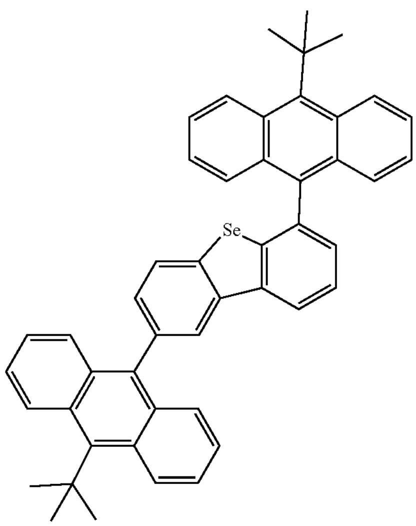
1137
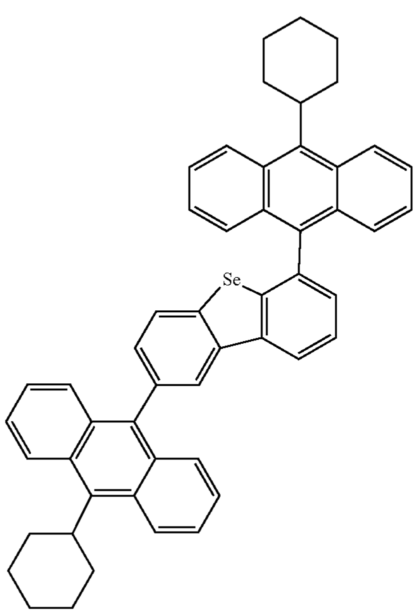
-continued
1138
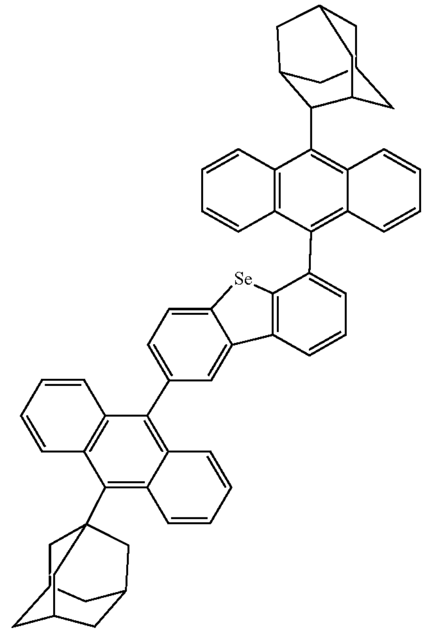
1139
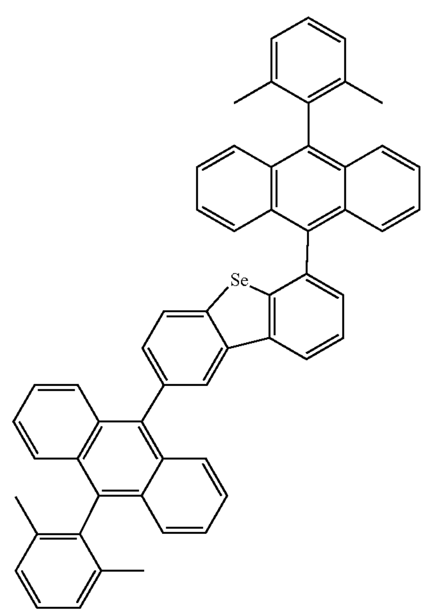

-continued
1140
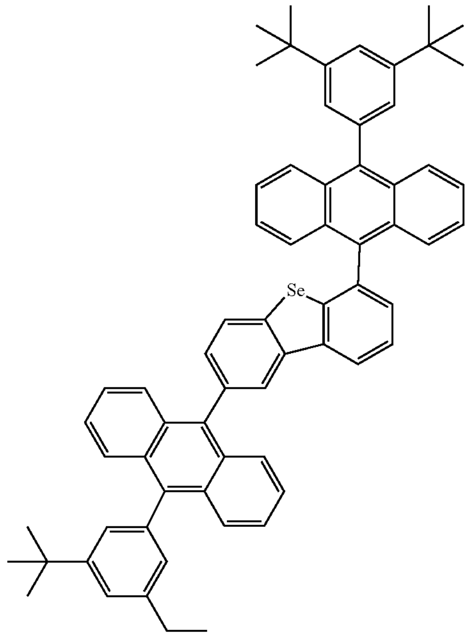
1141
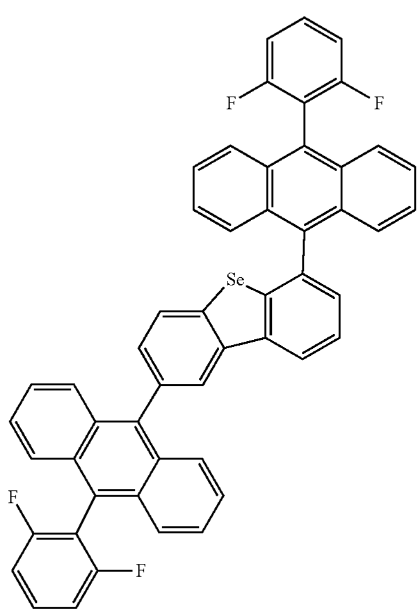
-continued
1142
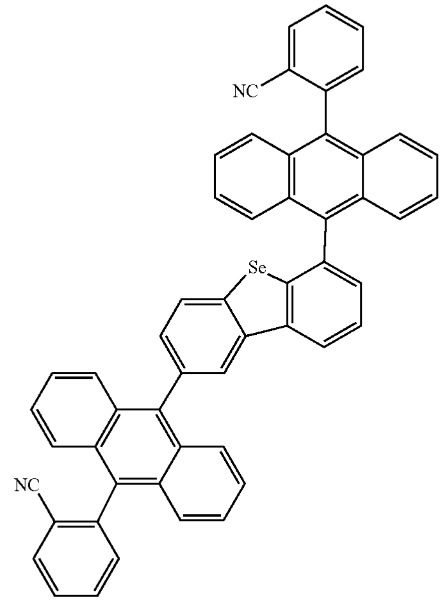
1143
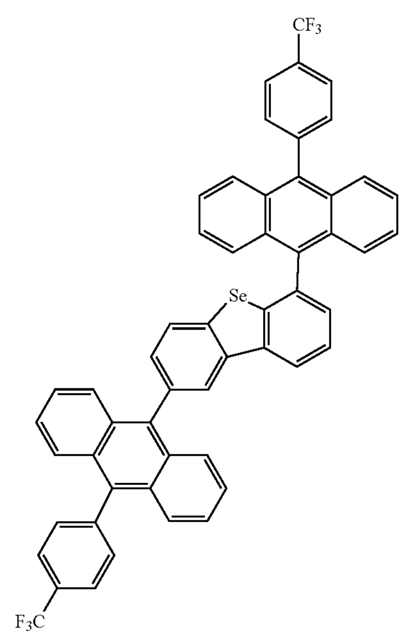

1144
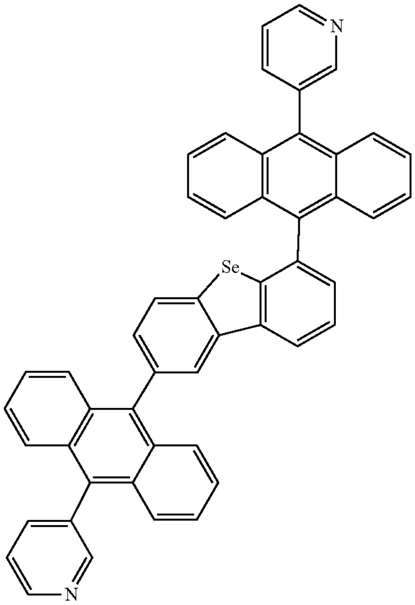
1145
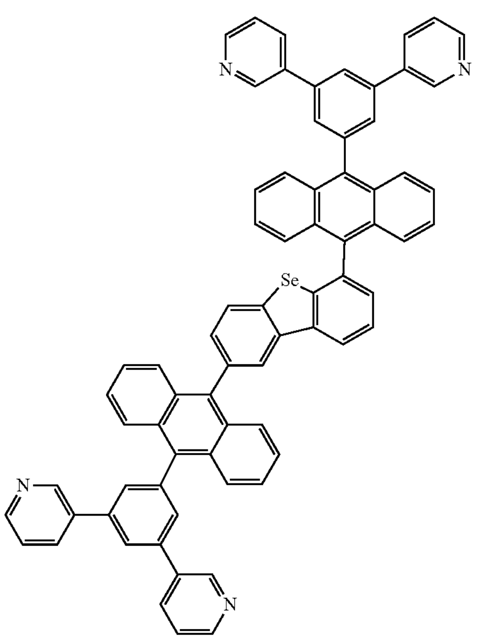
1146
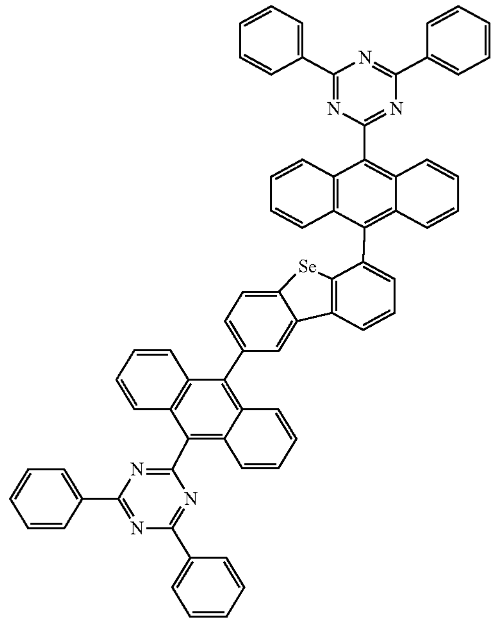
1147
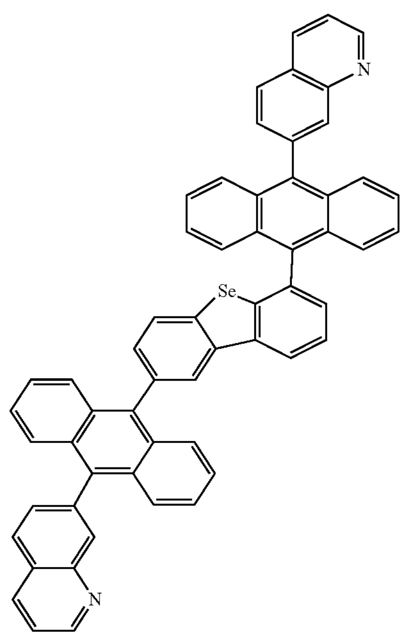

-continued
1148
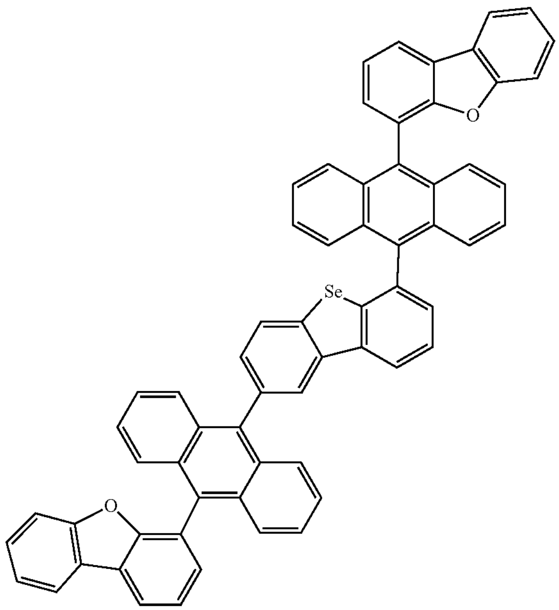
1149
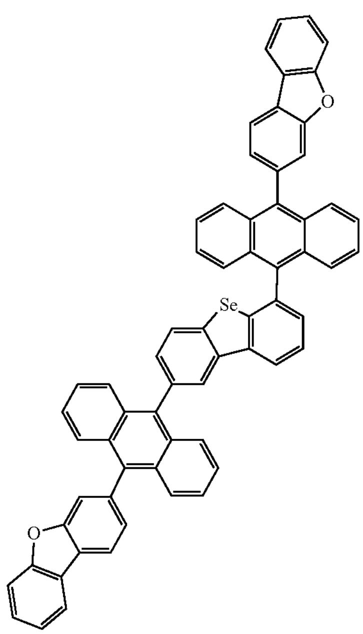
-continued
1150
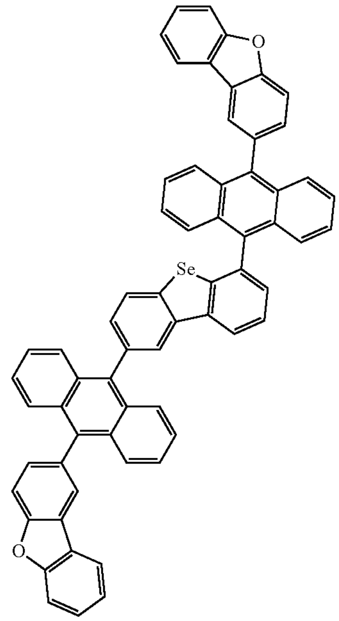
1151
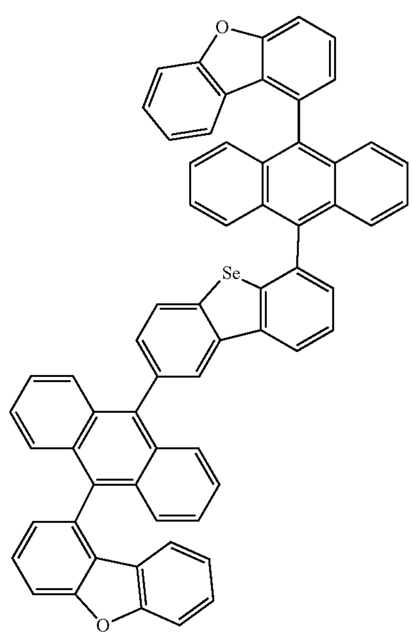

-continued
1152
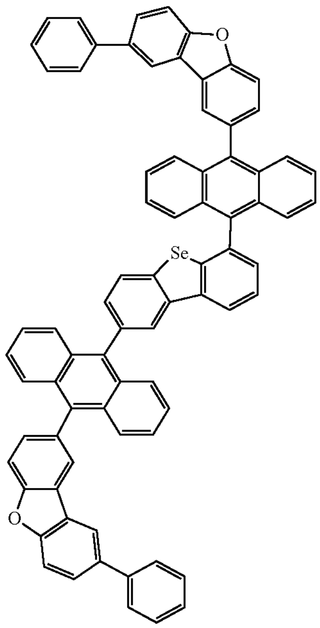
1153
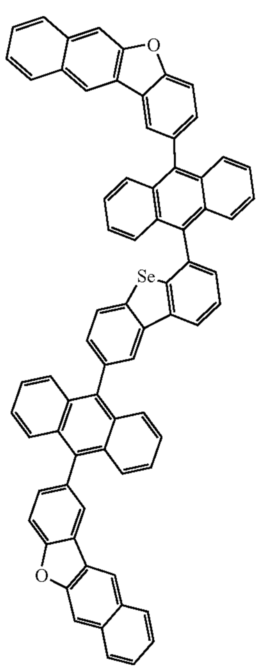
-continued
1154
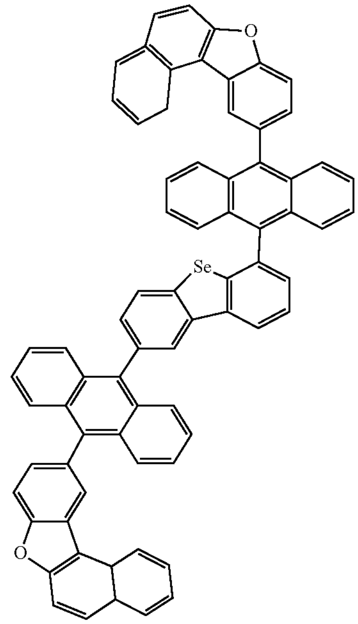
1155
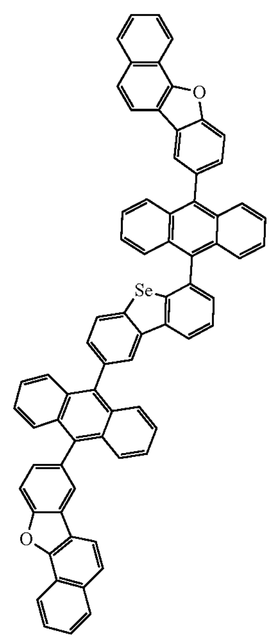

-continued
1156
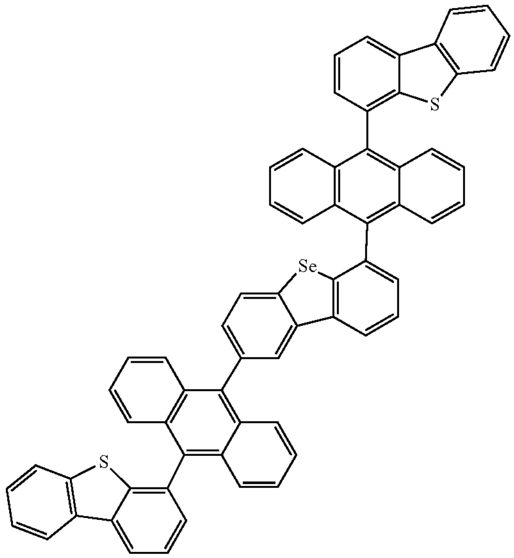
1157
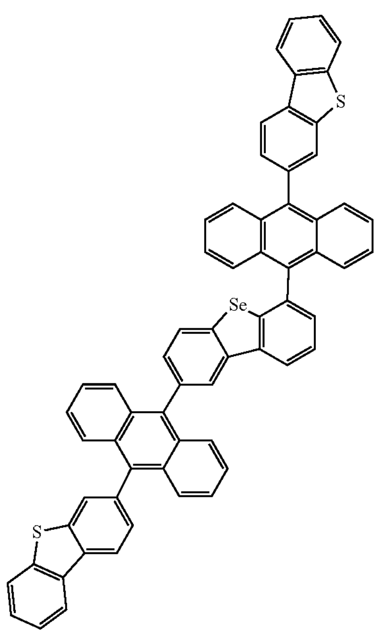
-continued
1158
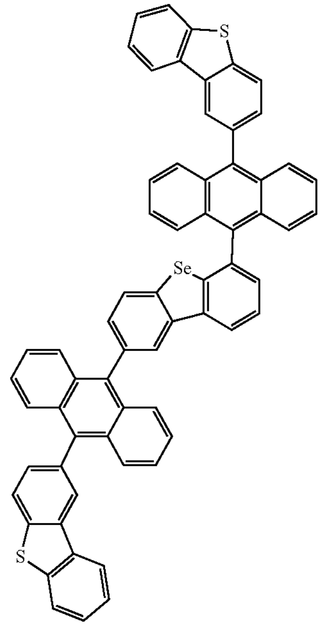
1159
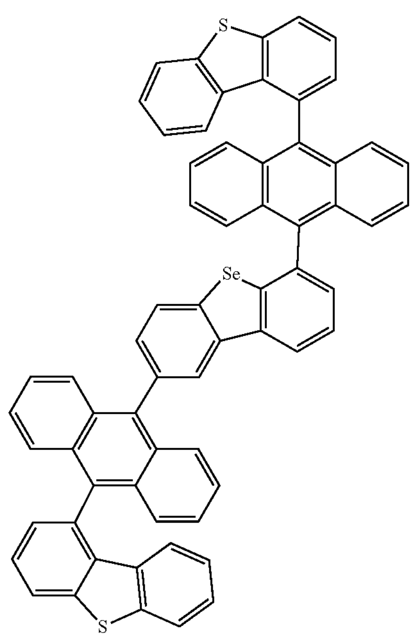

-continued
1160
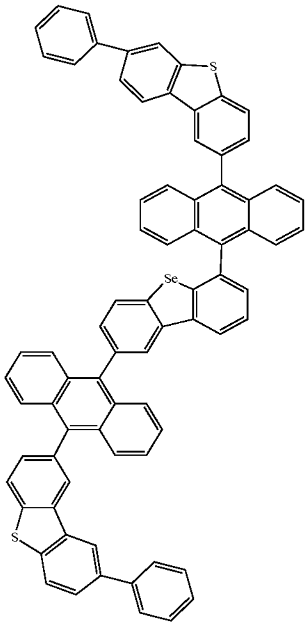
1161
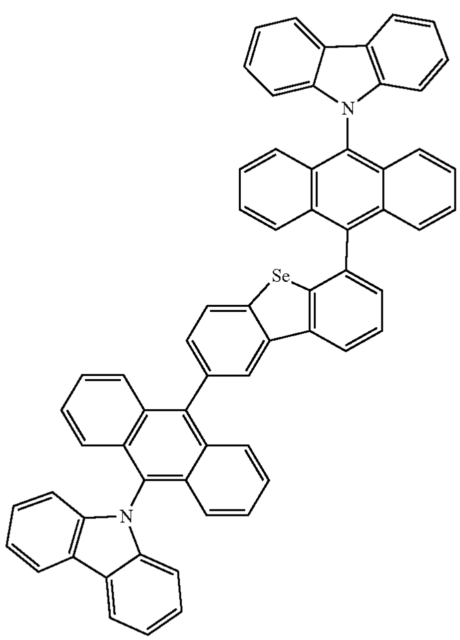
-continued
1162
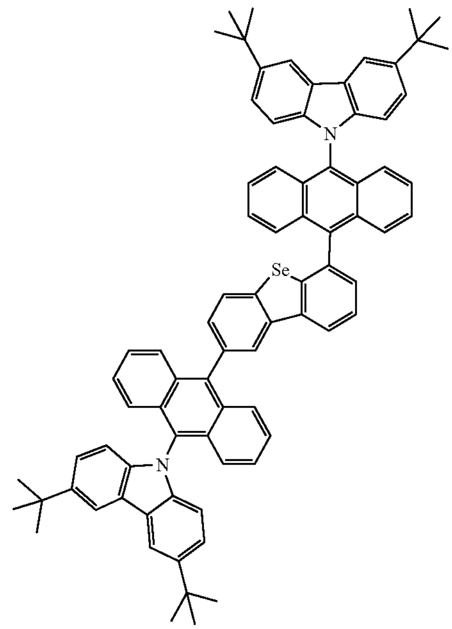
1163
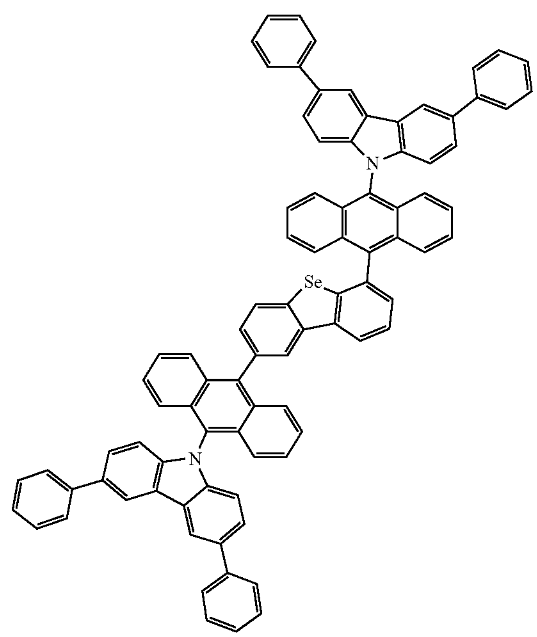

-continued
1164
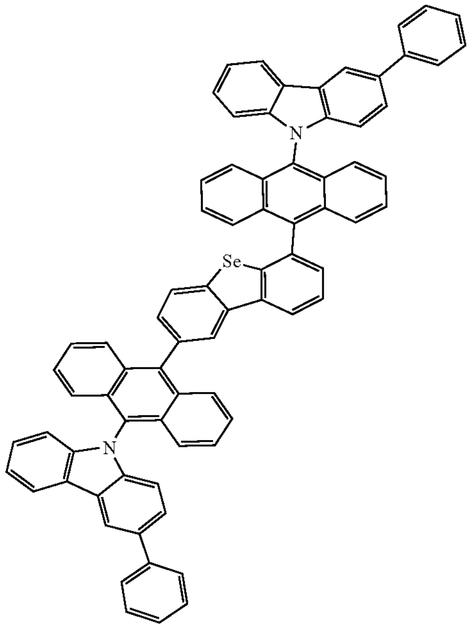
1165
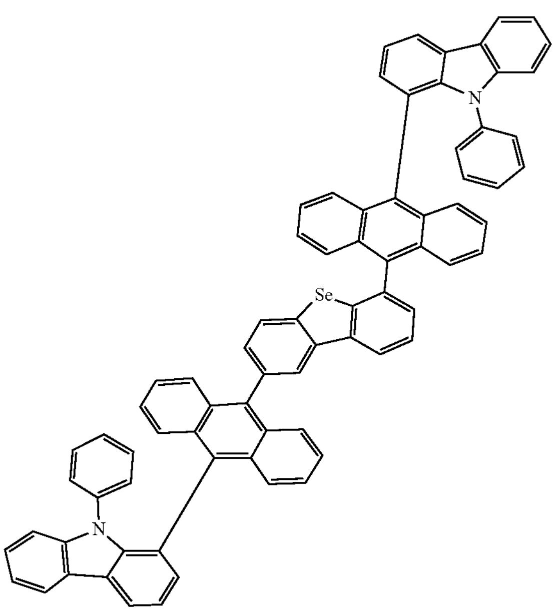
-continued
1166
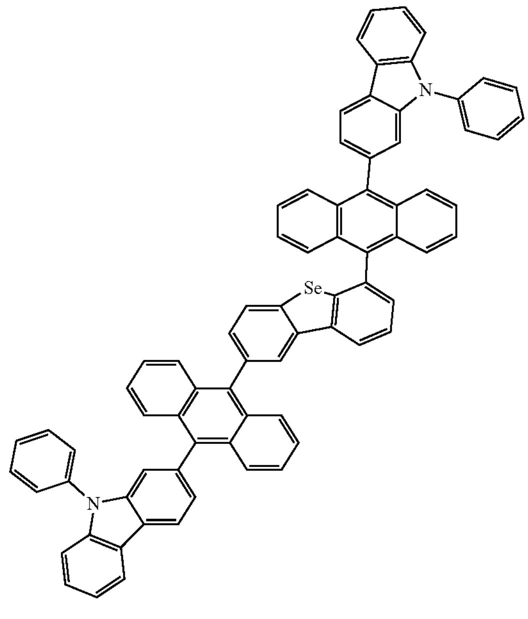
1167
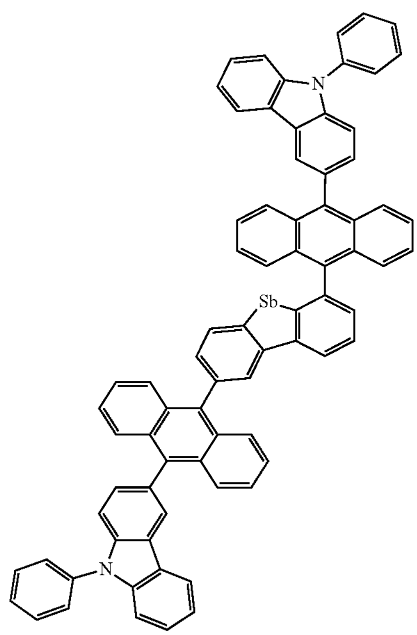

-continued
1168
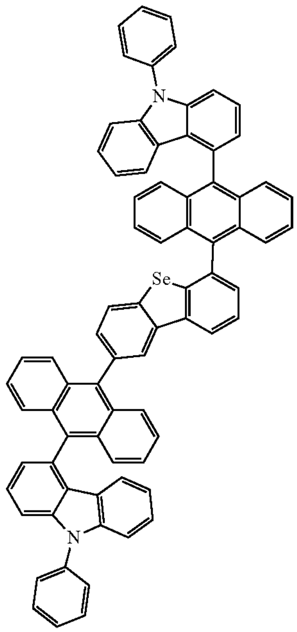
1169
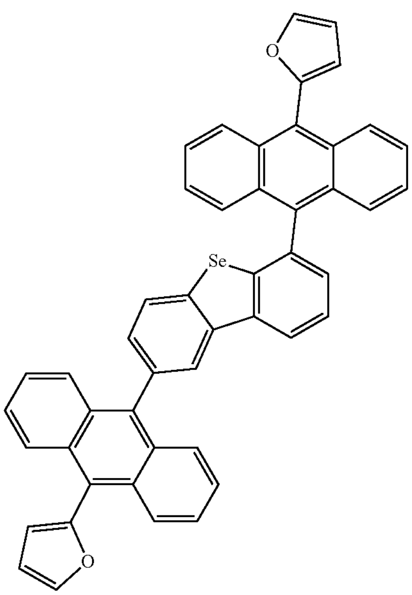
-continued
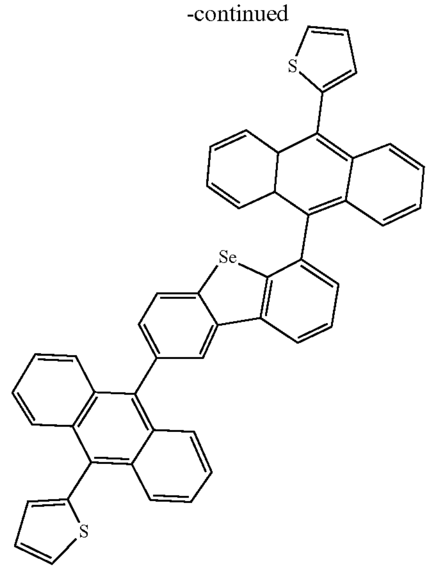
1171
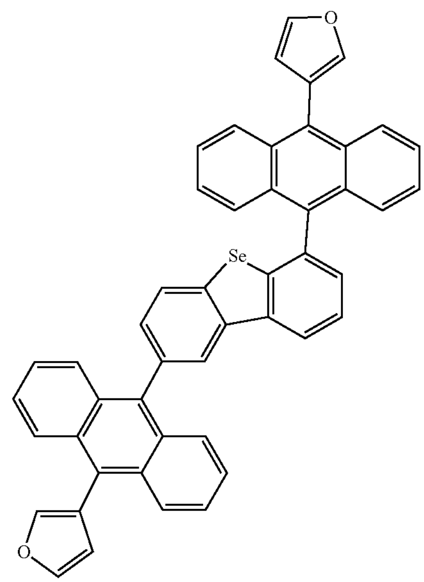
1172
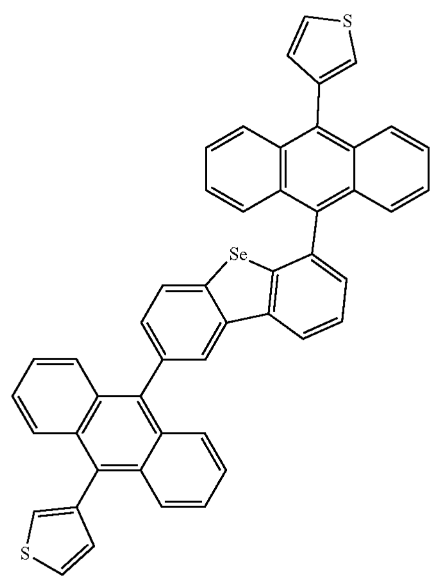

-continued
1173
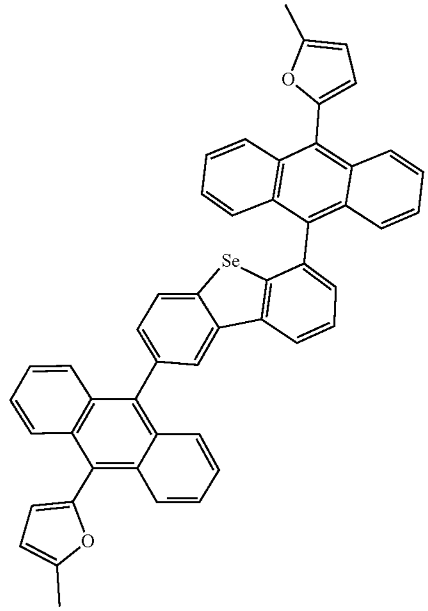
1174
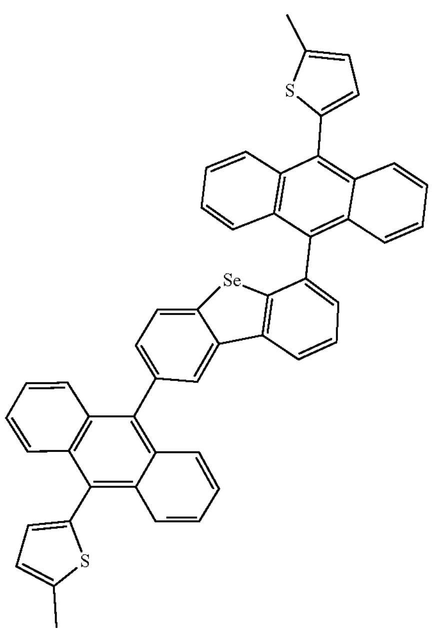
-continued
1175
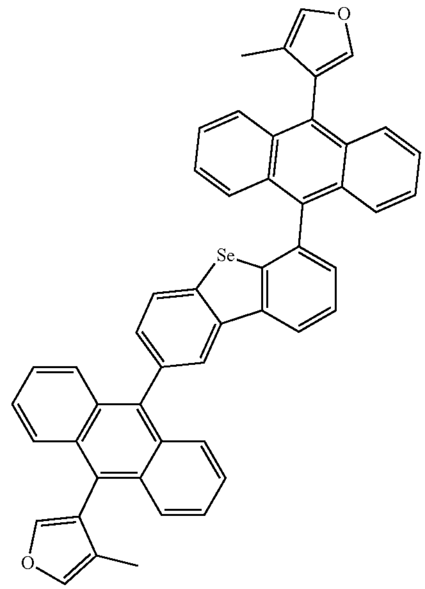
1176
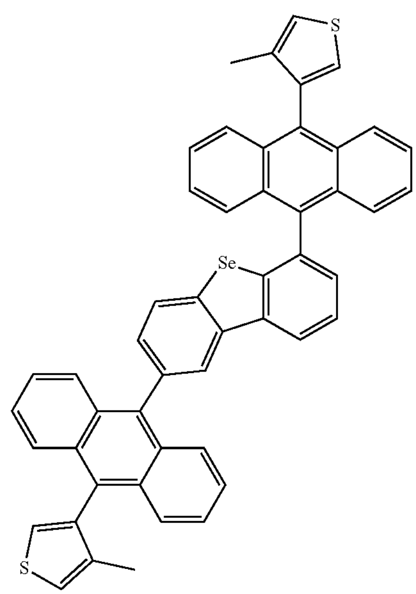

1177
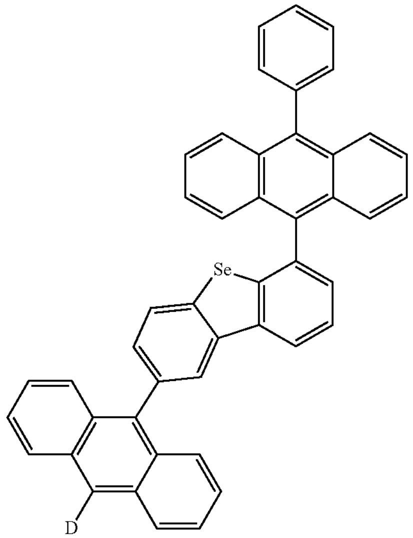
1179
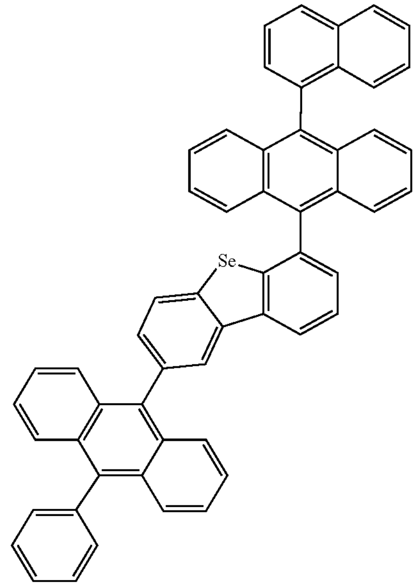
1178
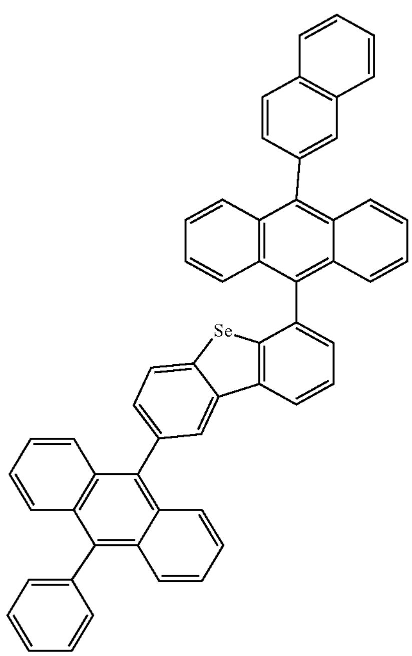
1180
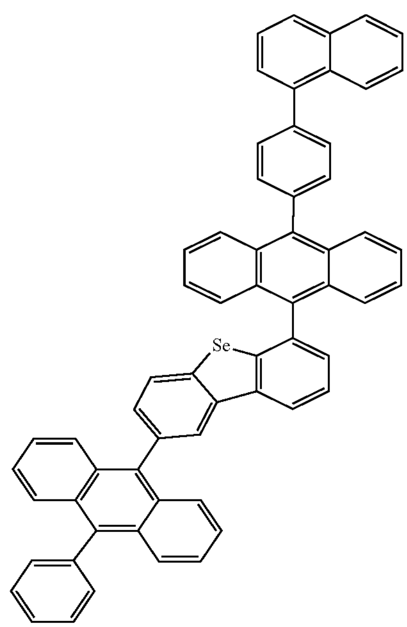

-continued
1181
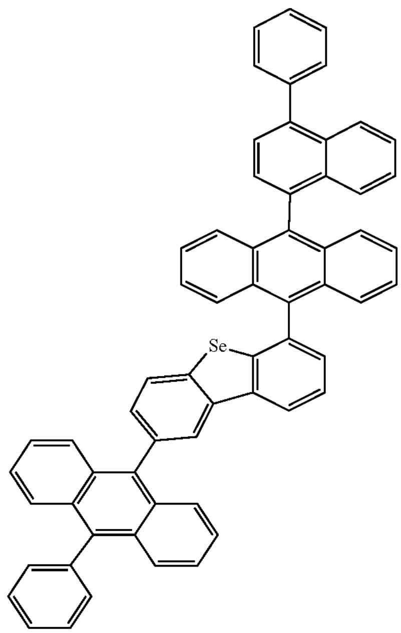
1182
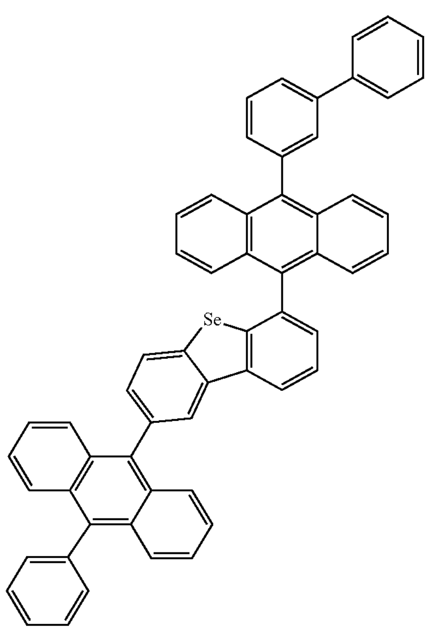
-continued
1183
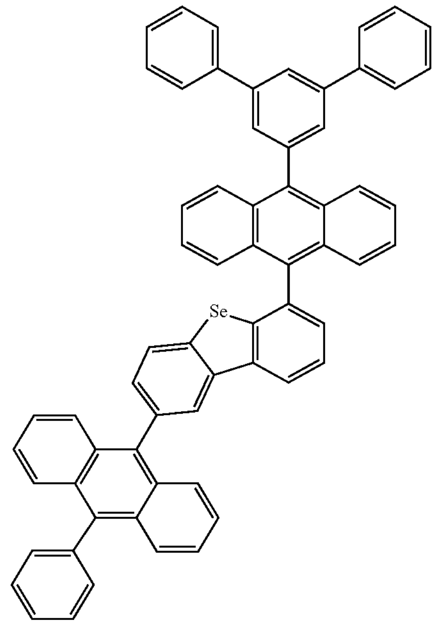
1184
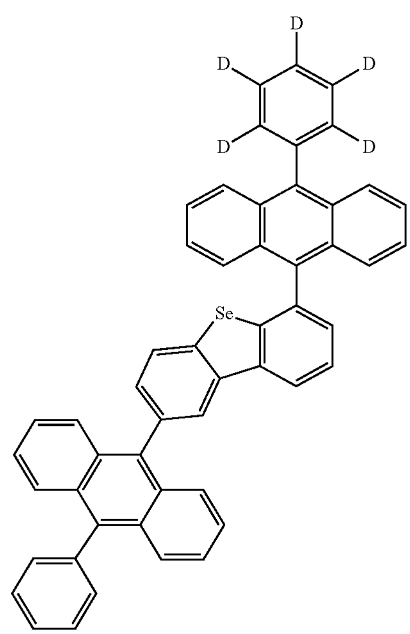

-continued
1185
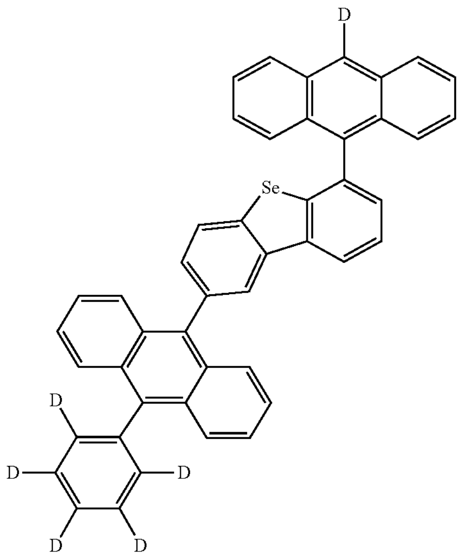
1186
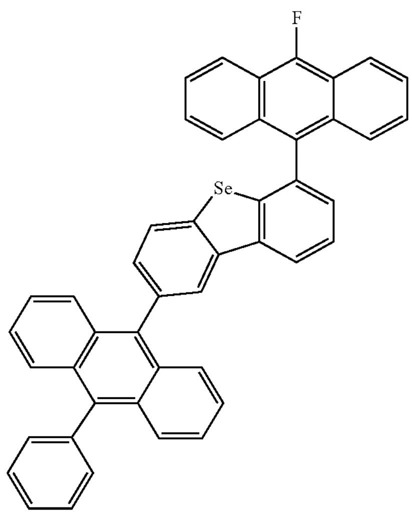
1187
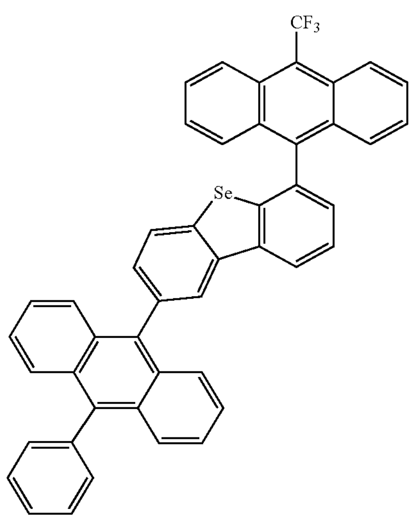
-continued
1188
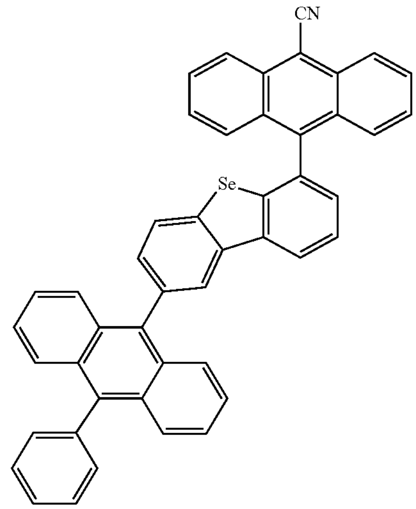
1189
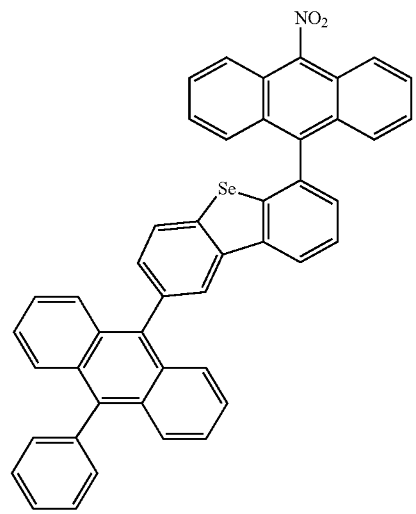
1190
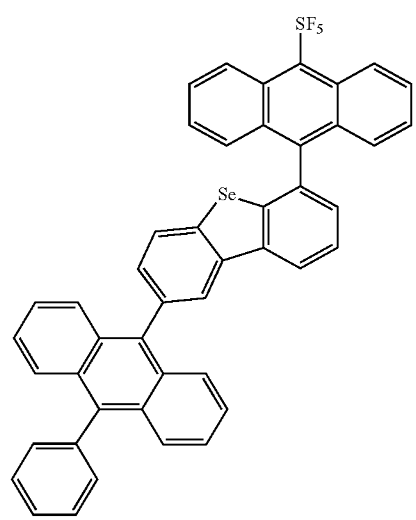

-continued
1191
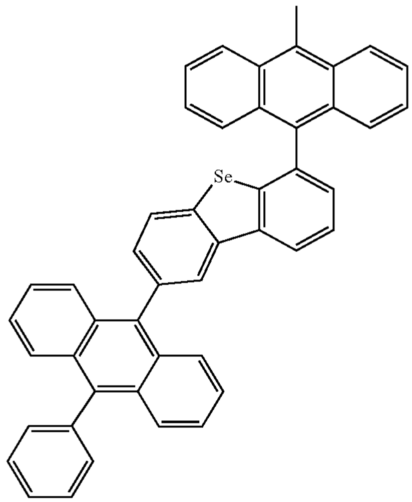
1192
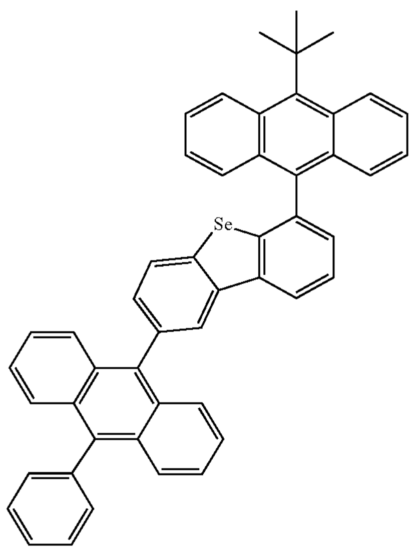
1193
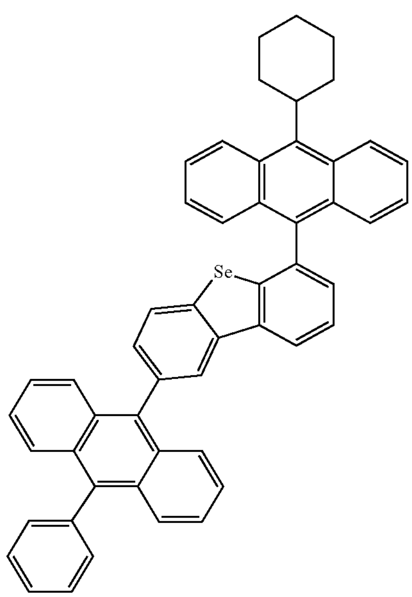
-continued
1194
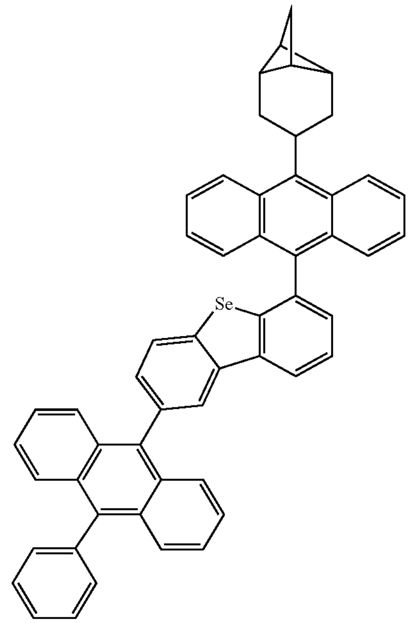
1195
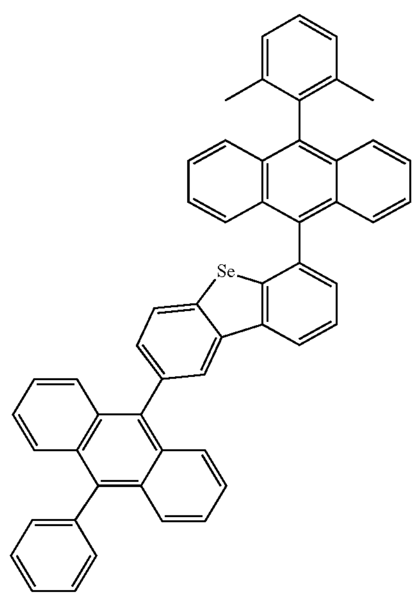

-continued
1196
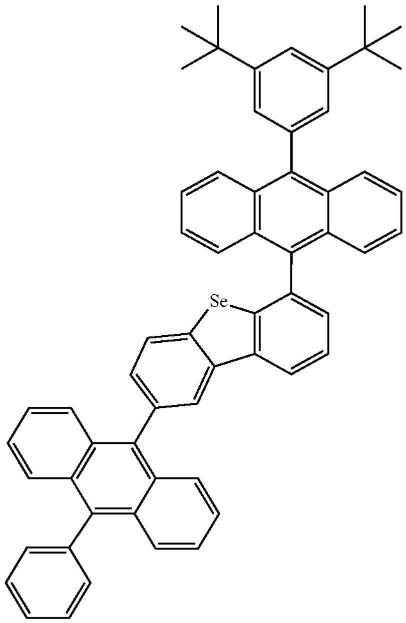
1197
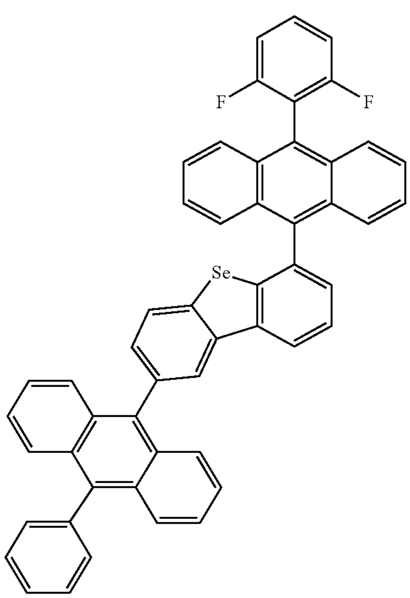
-continued
1198
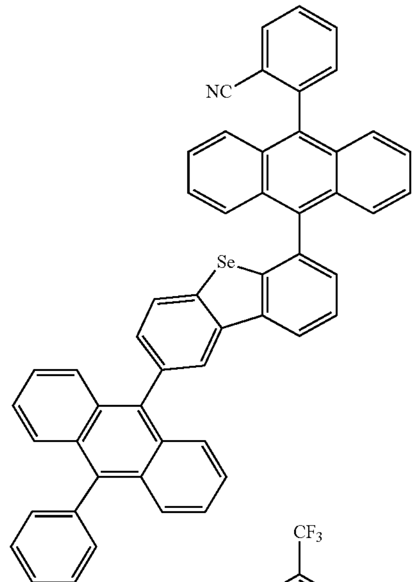
1199
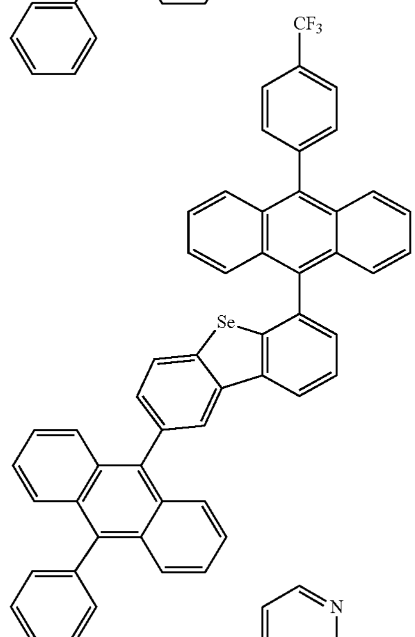
1200
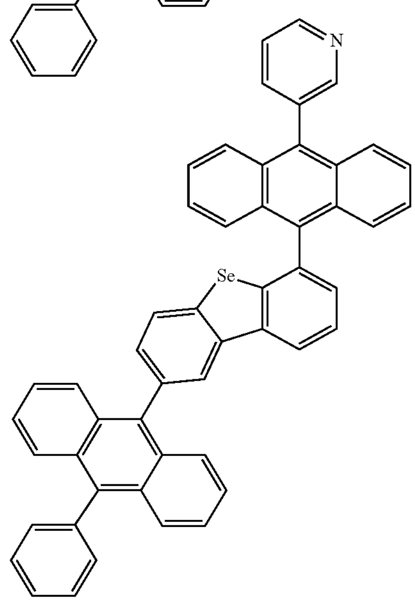

1201
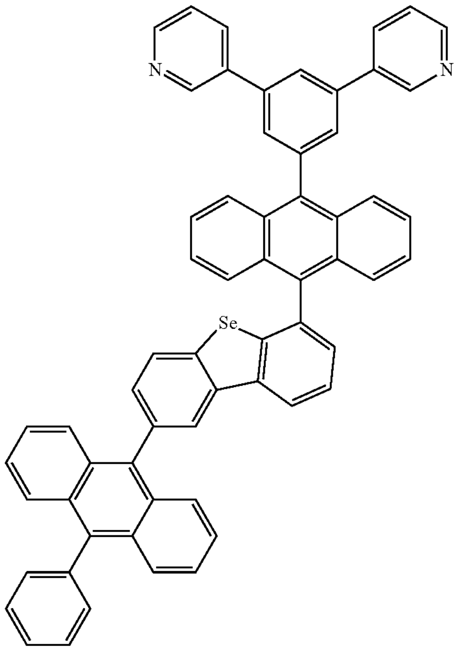
1202
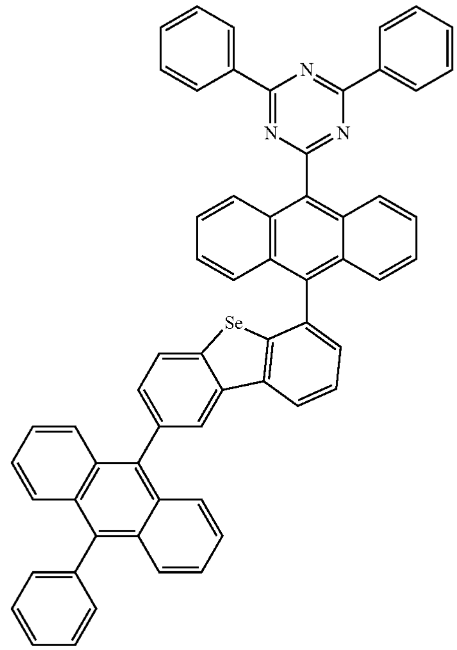
1203
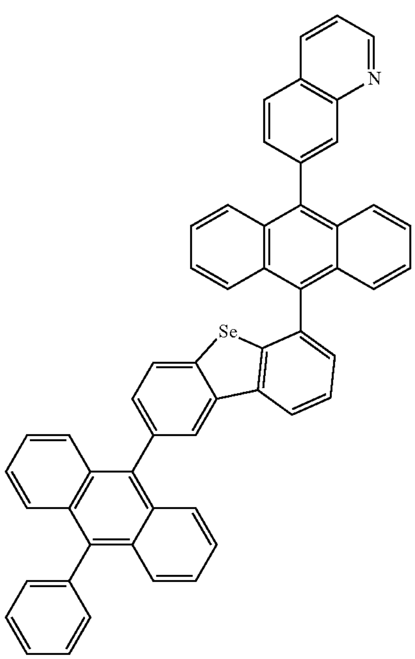
1204
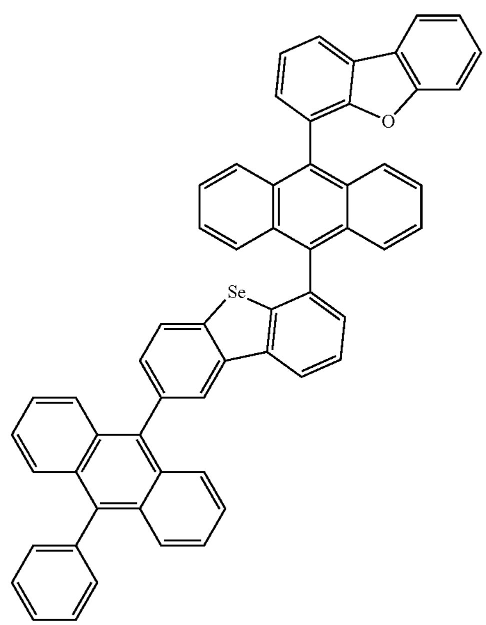

-continued
1205
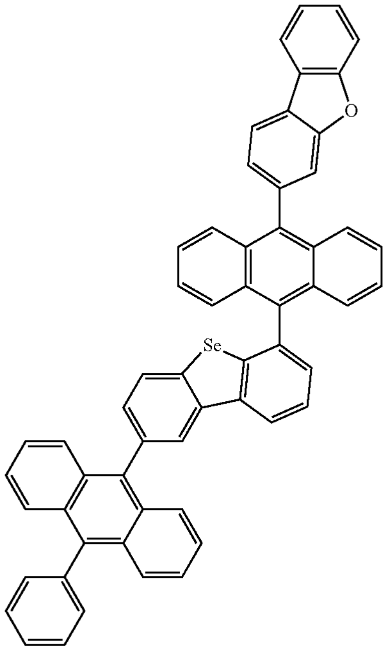
1206
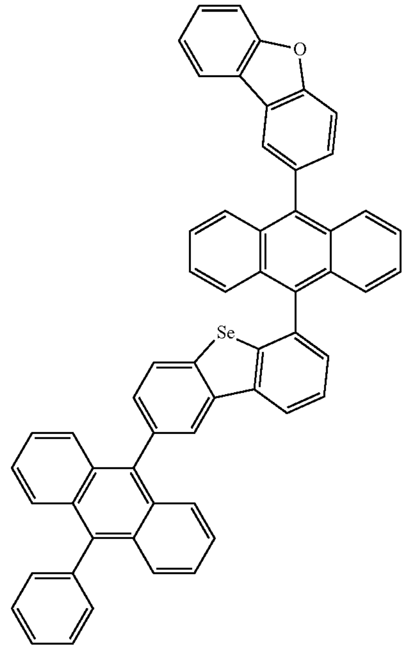
1207
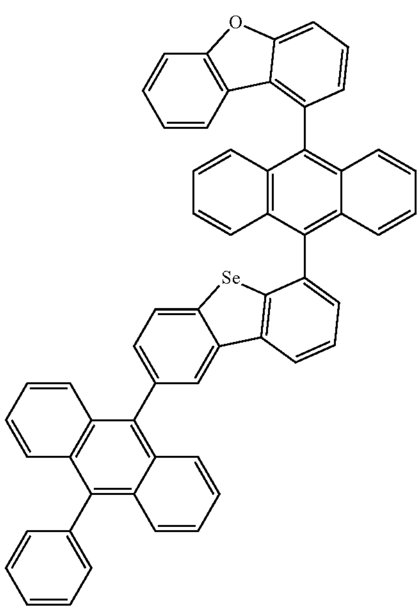
1208
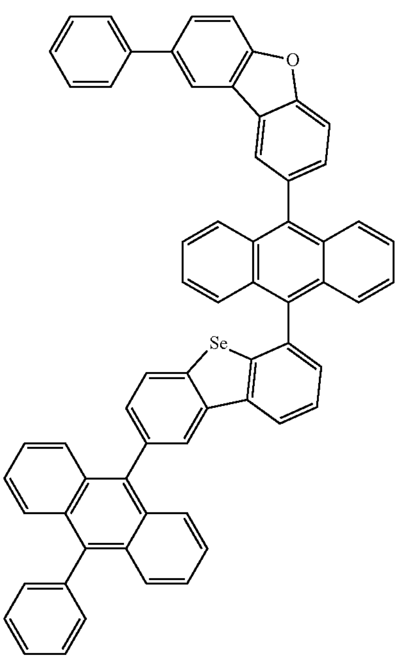

-continued
1209
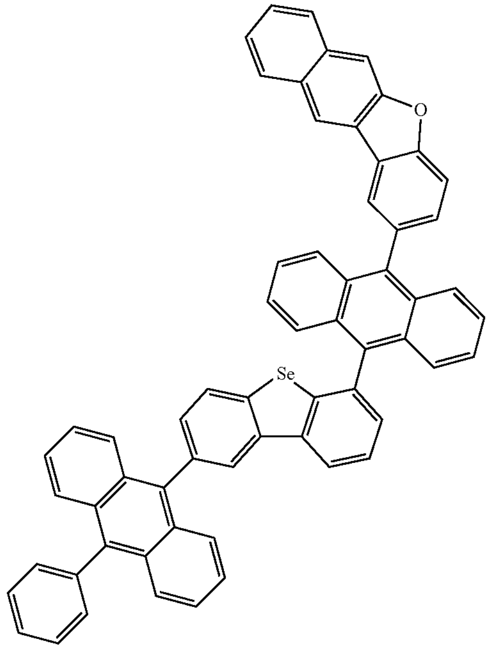
1210
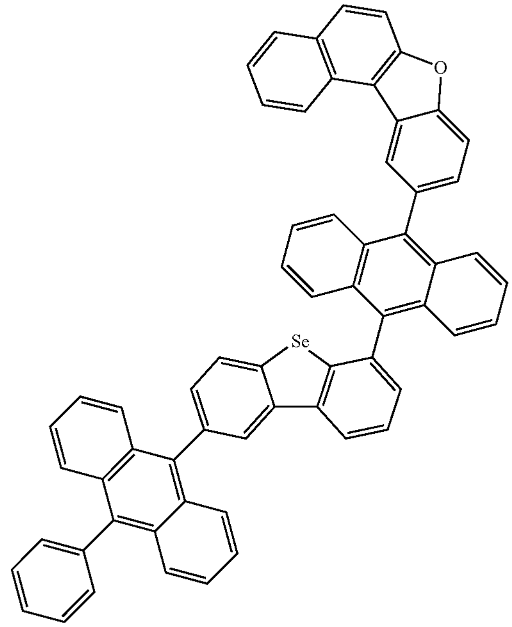
1211
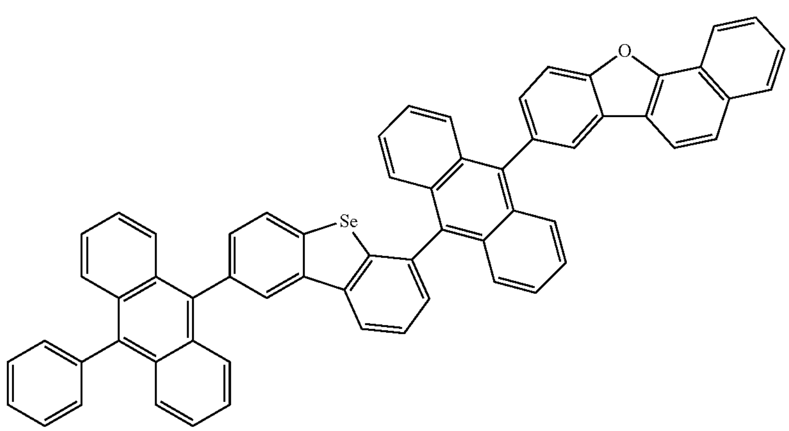

-continued
1212
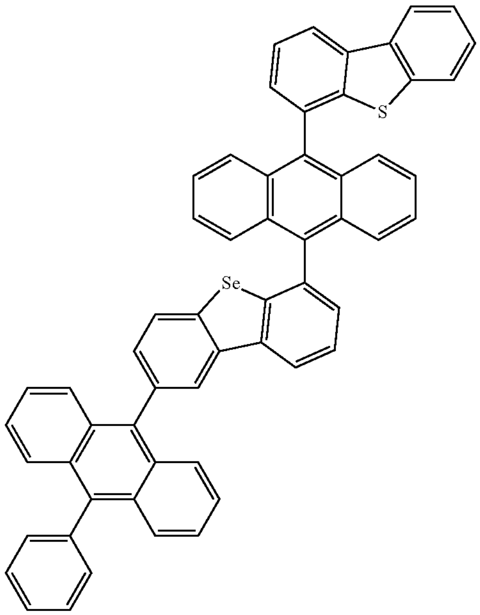
1213
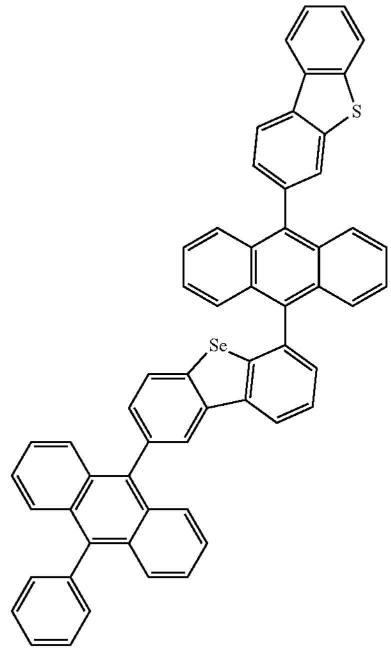
1214
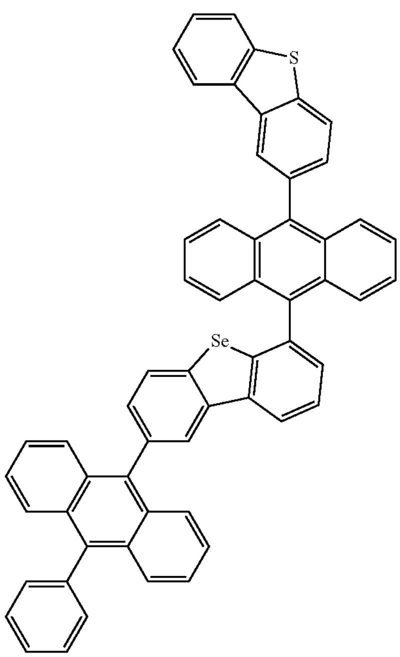
1215
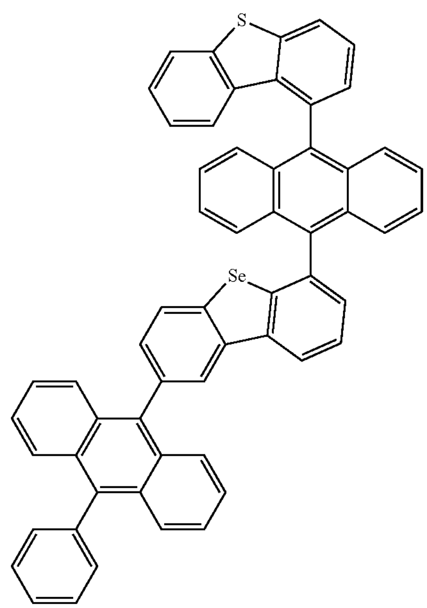

-continued
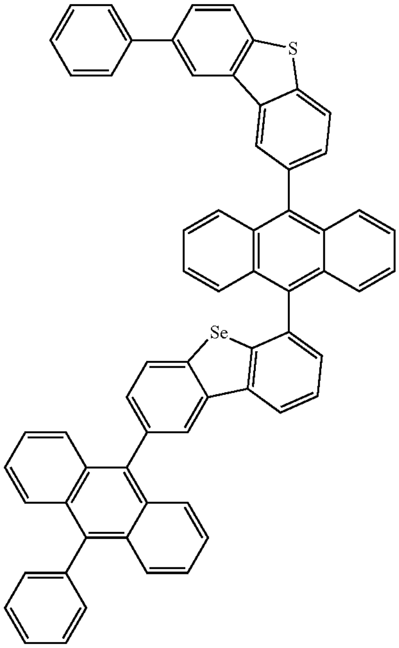
1216
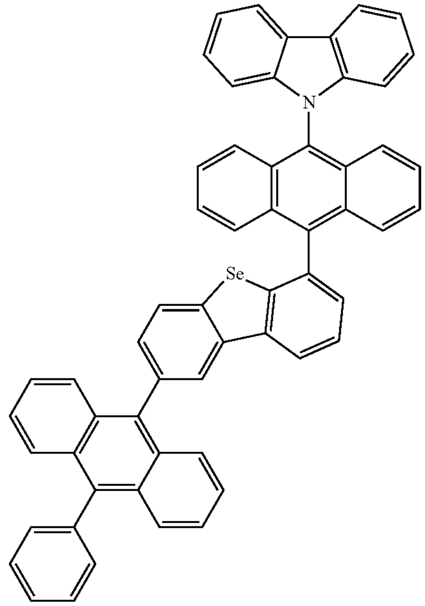
1217
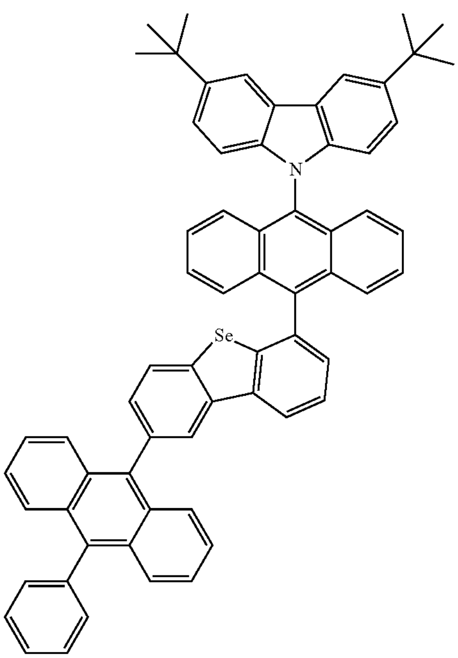
1218
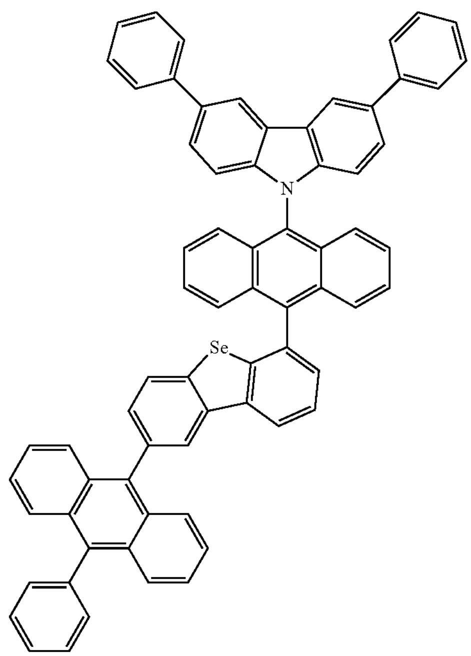
1219

-continued
1220
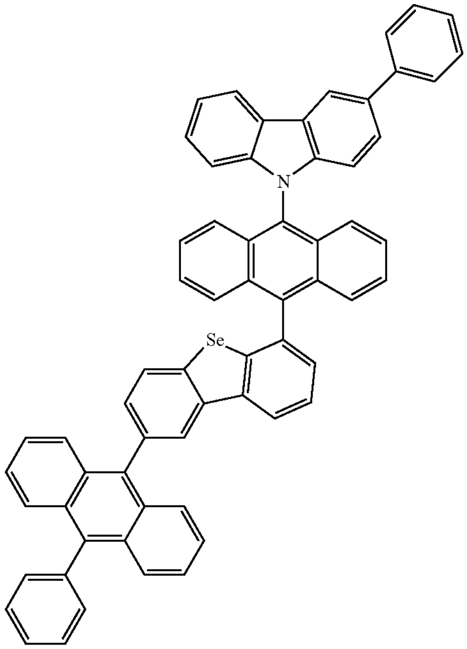
1221
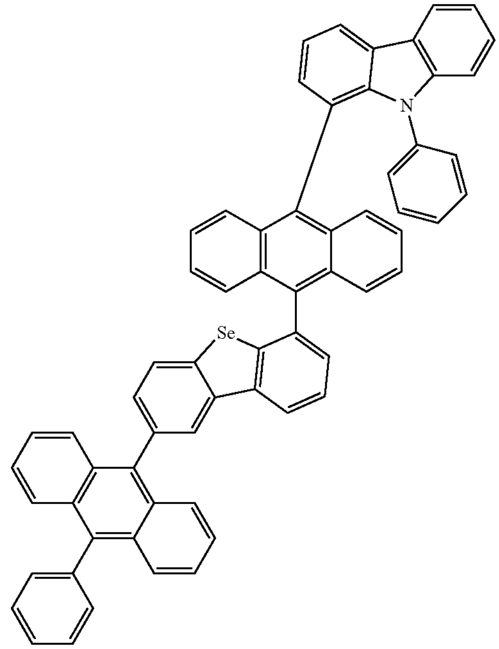
1222
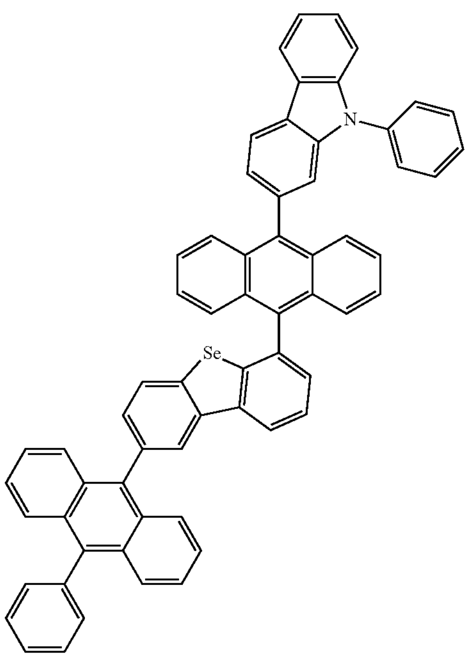
1223
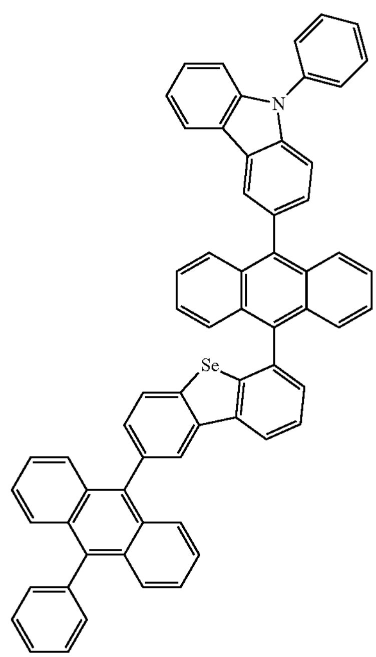

-continued
1224
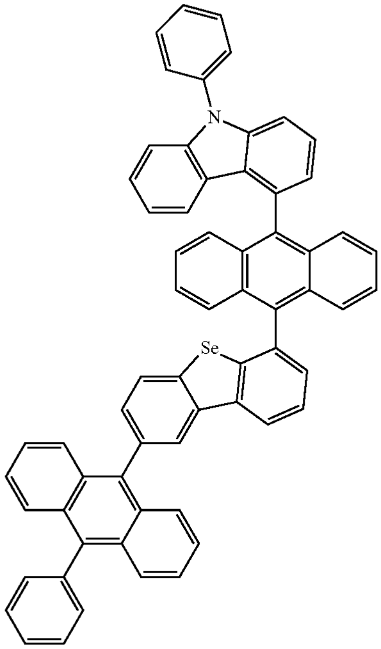
1225
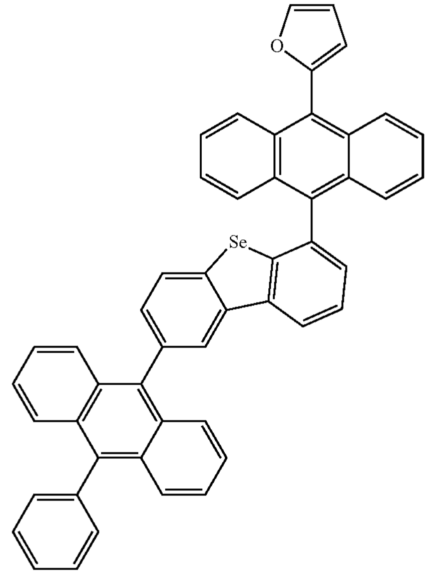
1226
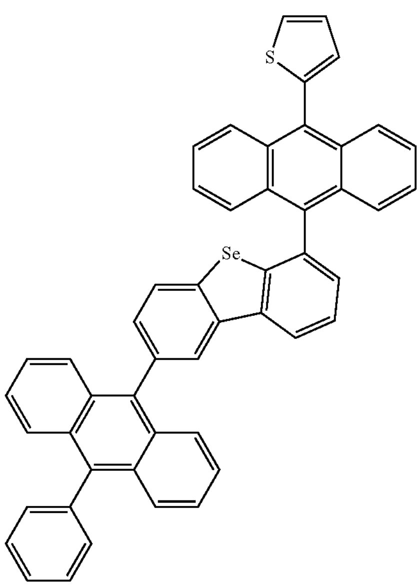
1227
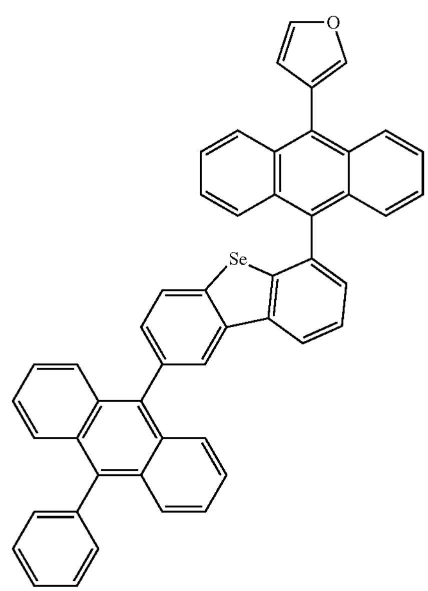

-continued
1228
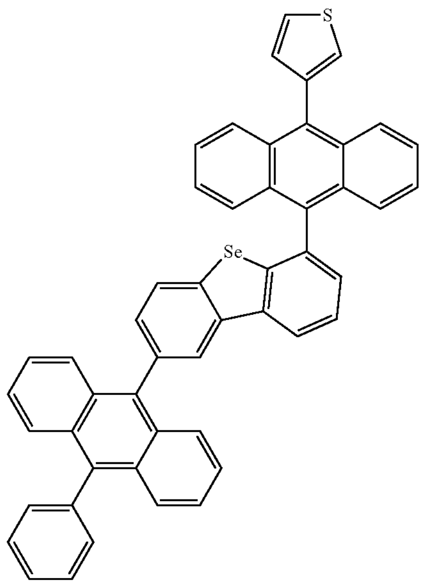
1229
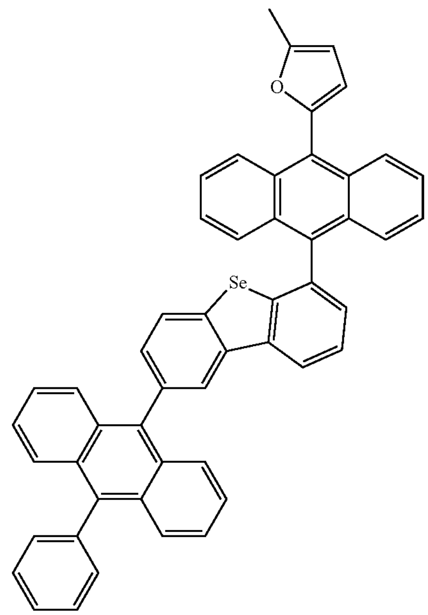
1230
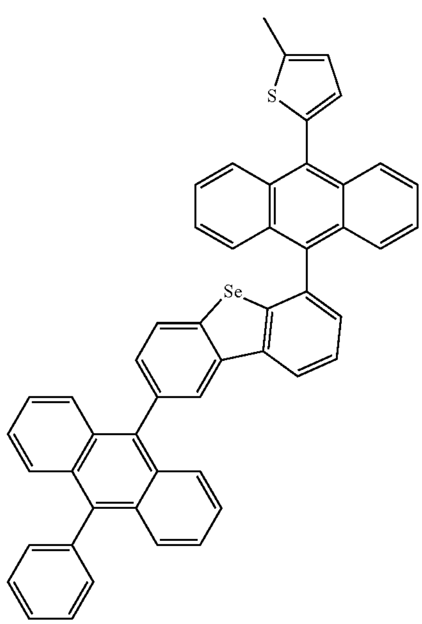
1231
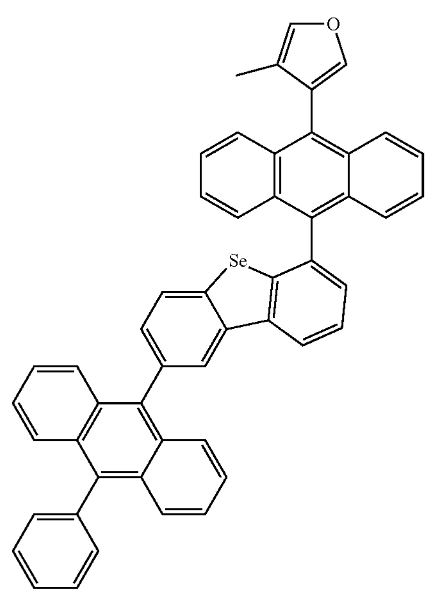

-continued
1232
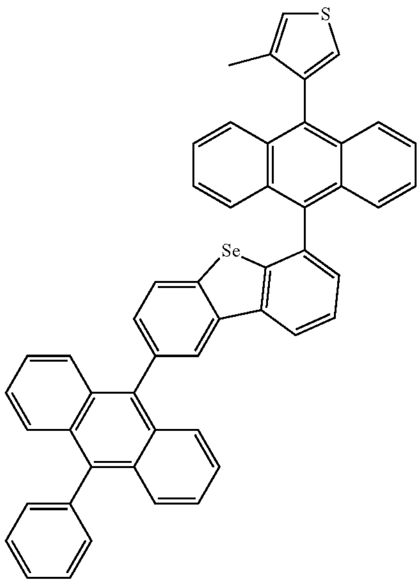
1233
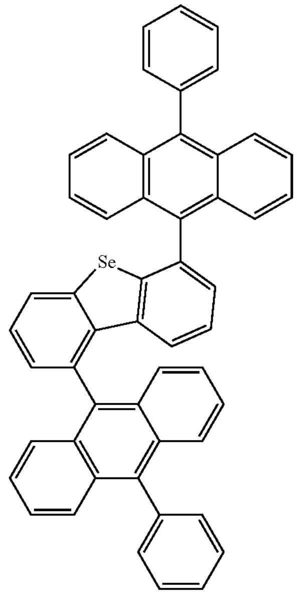
1234
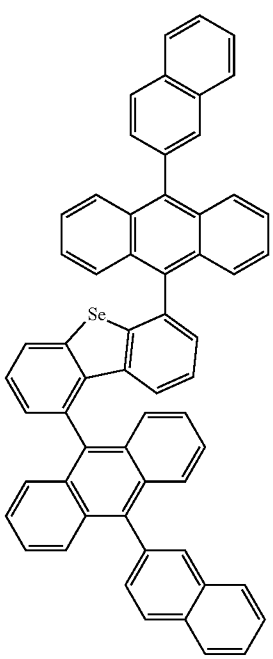
1235
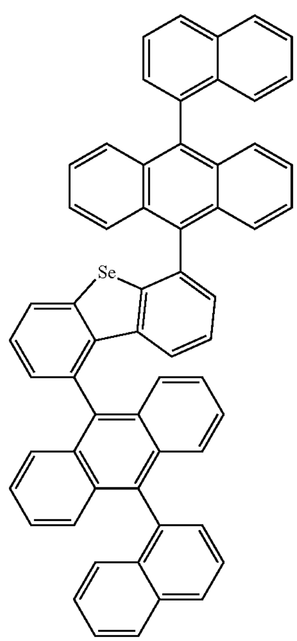

-continued
1236
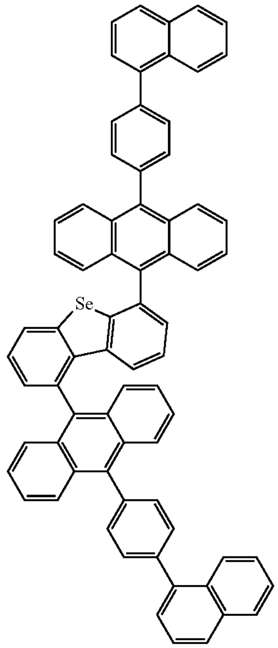
1237
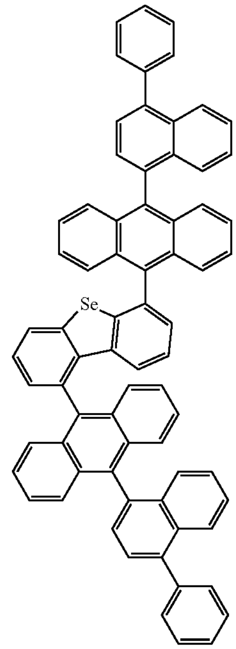
1238
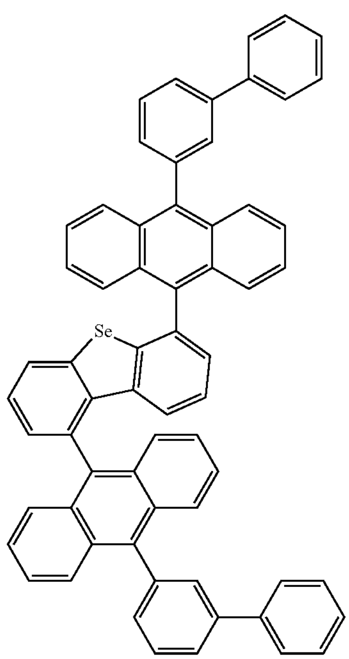
1239
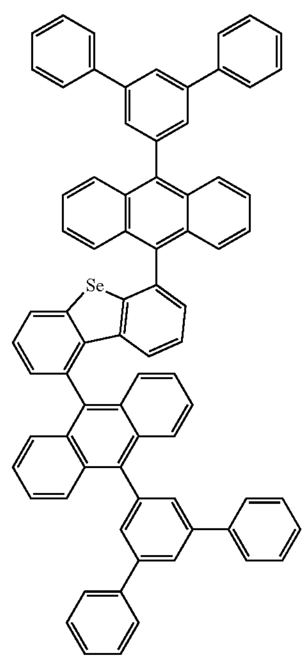

-continued
1240
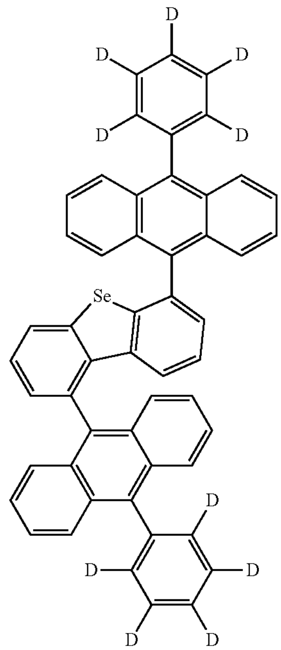
1241
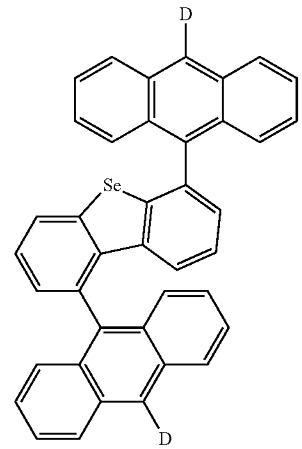
1242
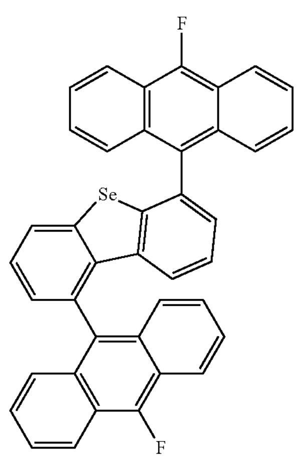
1243
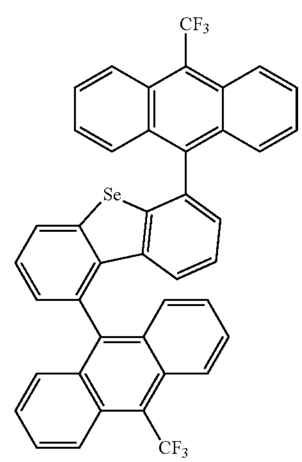
1244
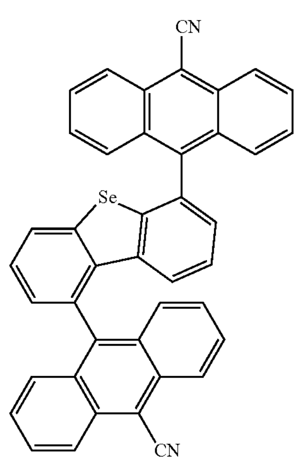
1245
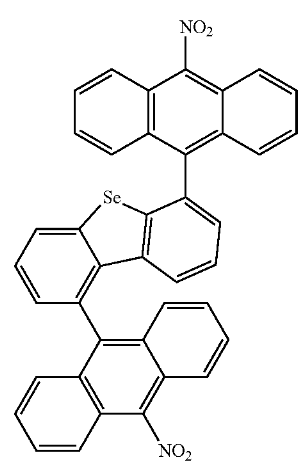

-continued
1246
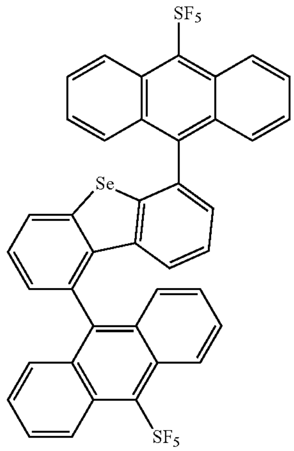
1247
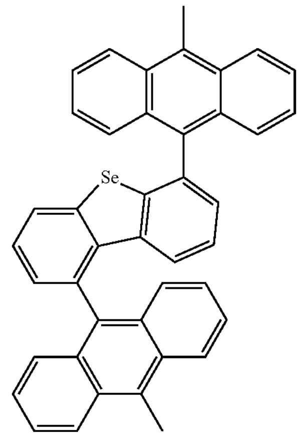
1248
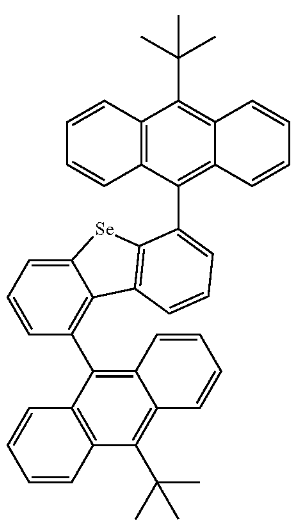
1249
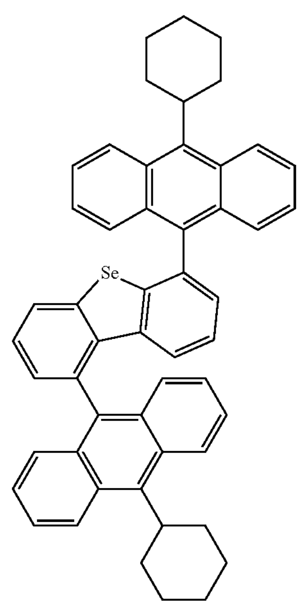

-continued
1250
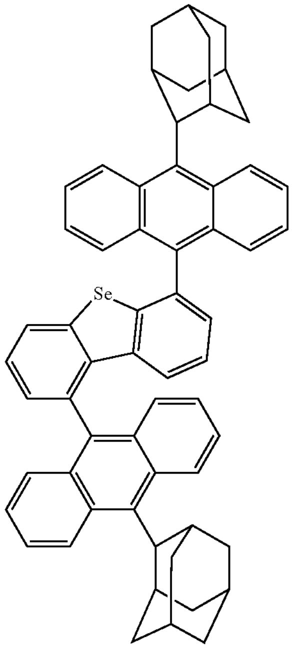
1251
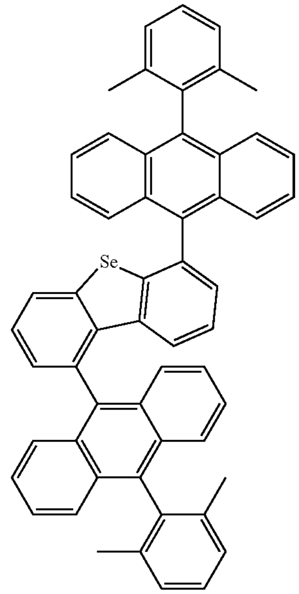
1252
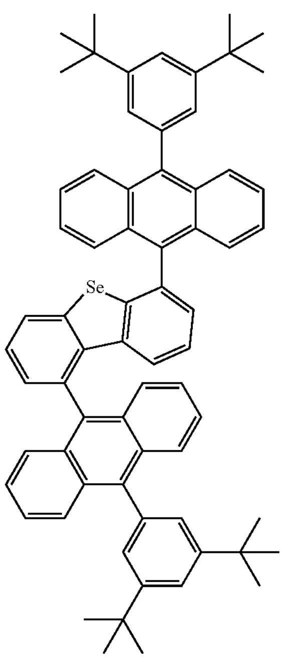
1253
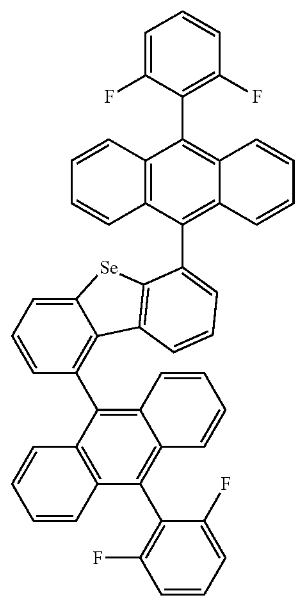

-continued
1254
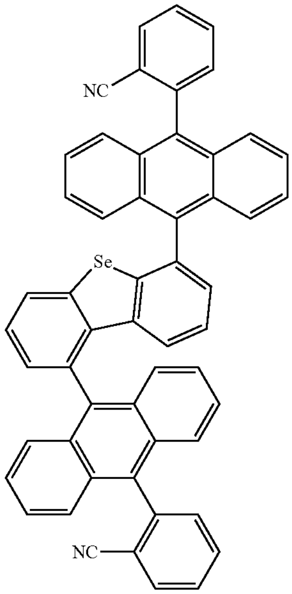
1255
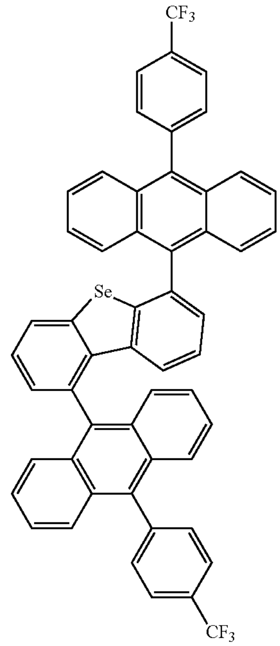
1256
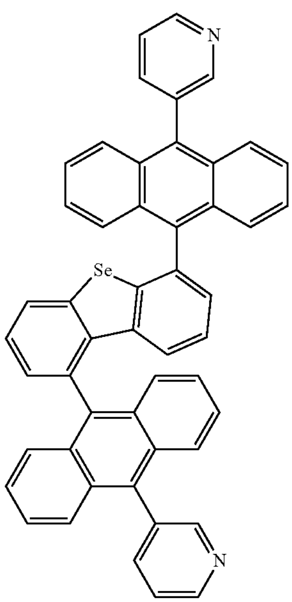
1257
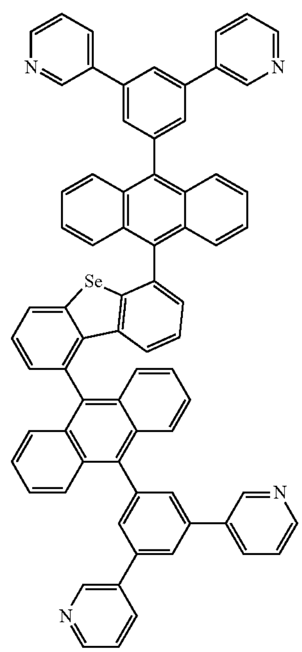

-continued
1258
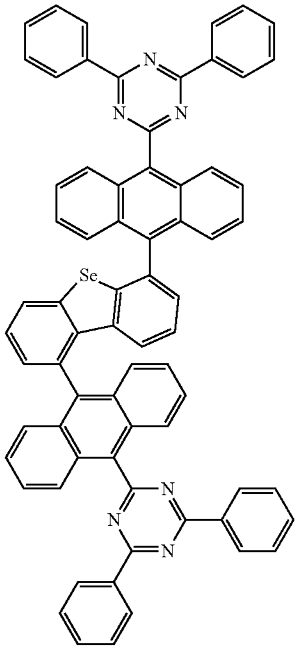
1259
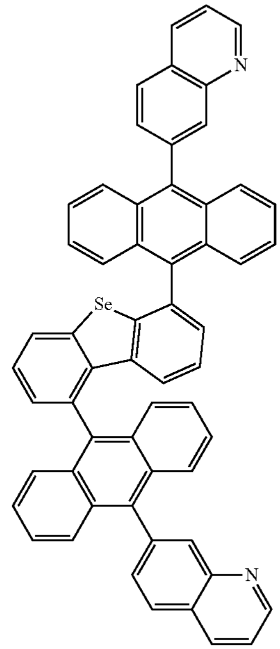
1260
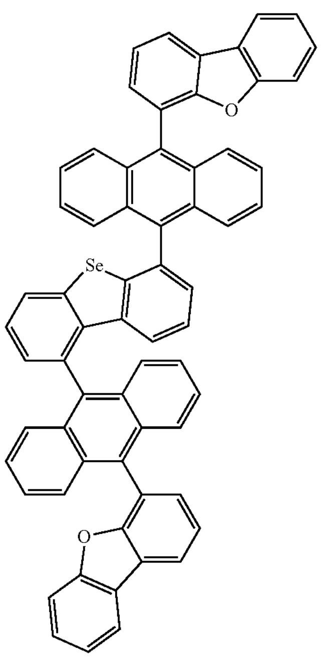
1261
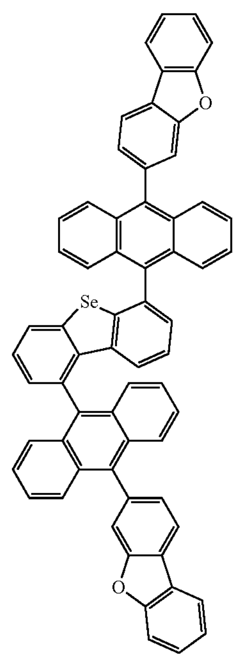

-continued
1262
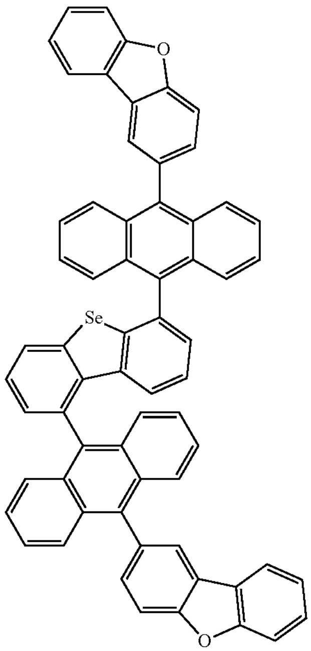
1263
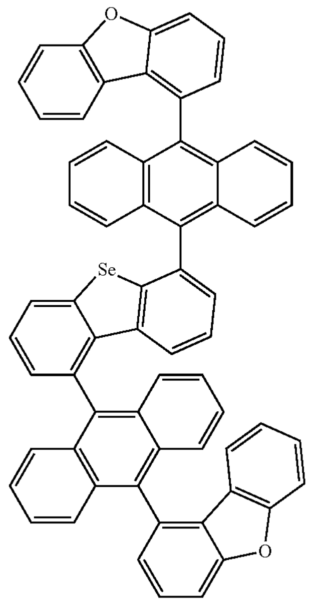
1264
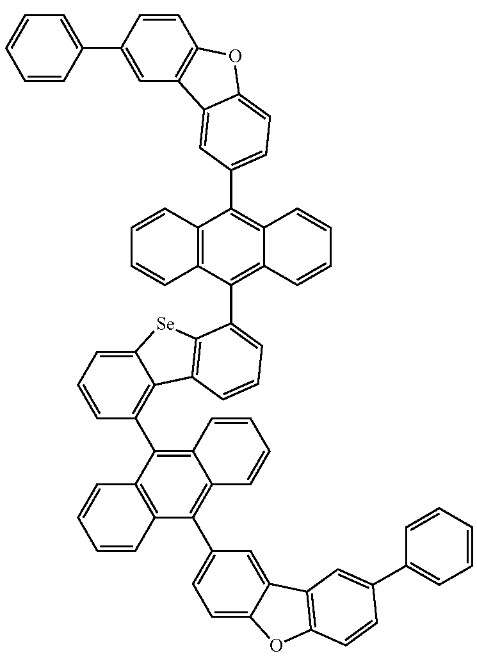
1265
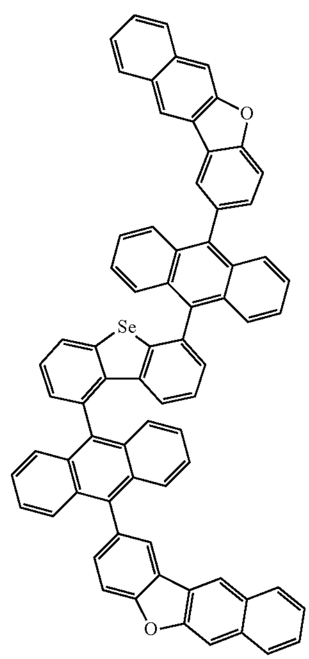

-continued
1266
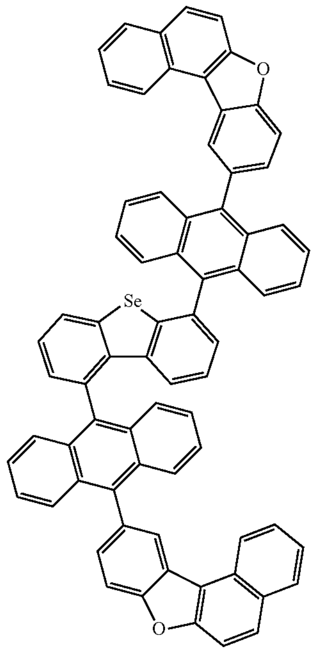
1267
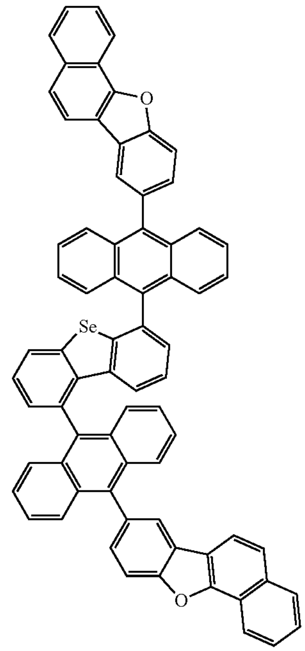
1268
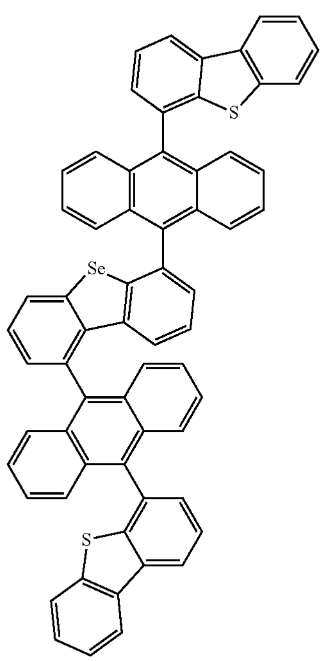
1269
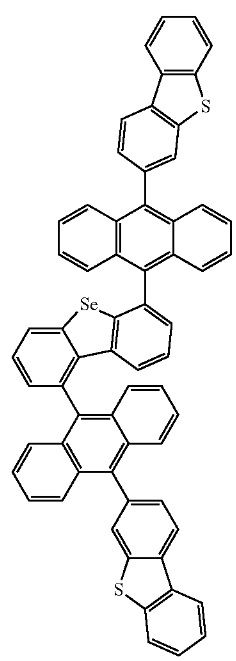

-continued
1270
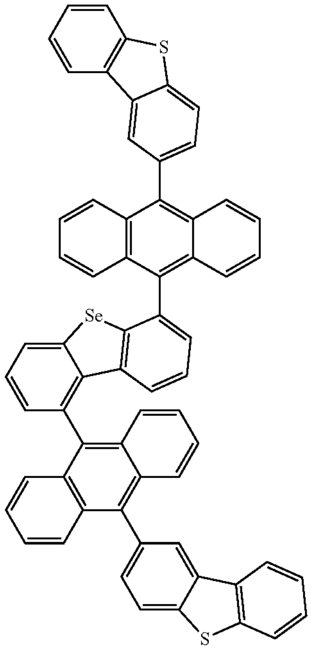
1271
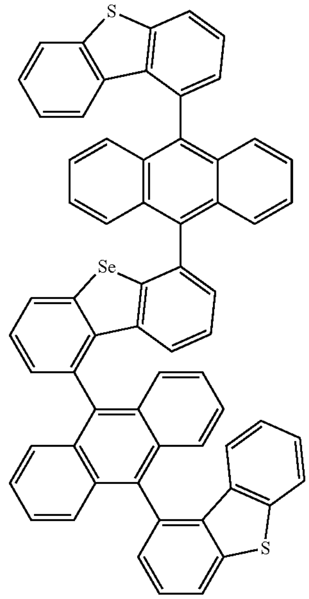
1272
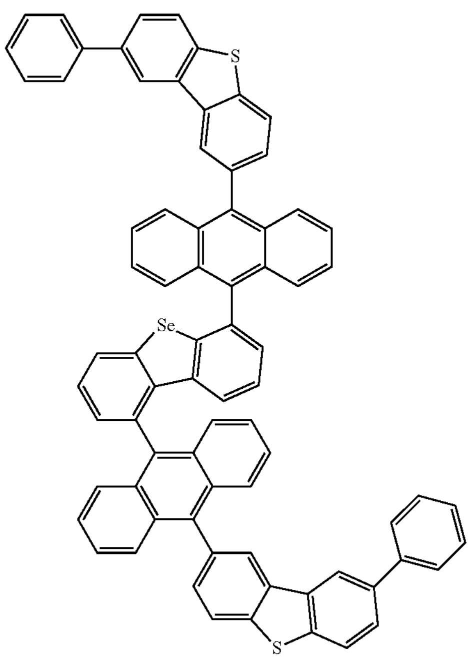
1273
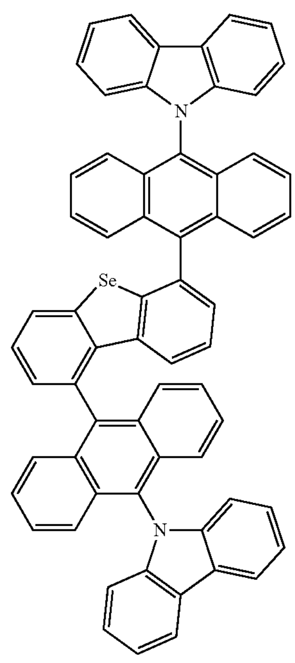

-continued
1274
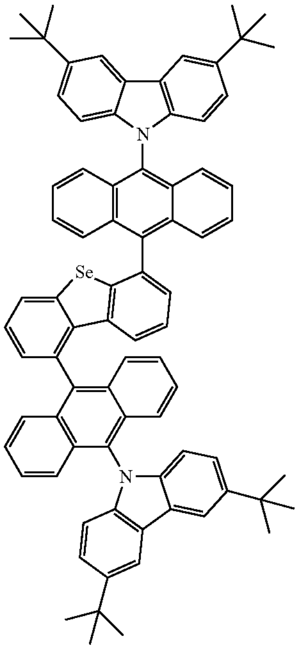
1275
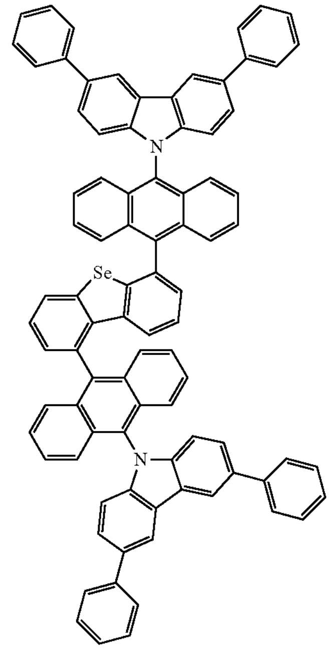
1276
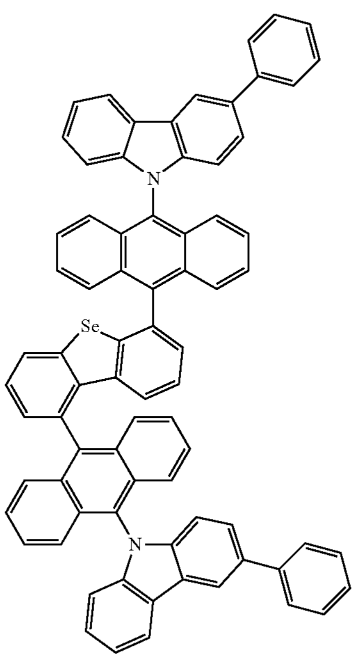
1277
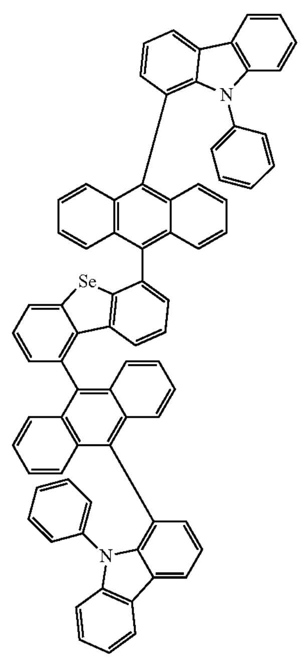

-continued
1278
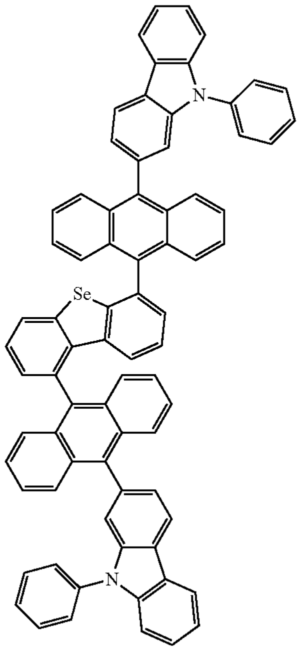
1279
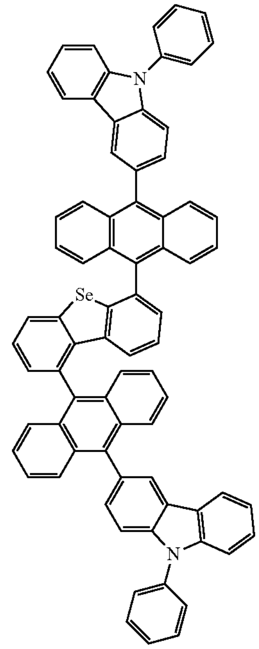
1280
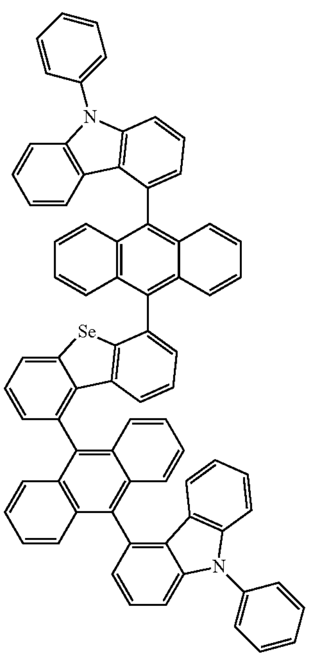
1281
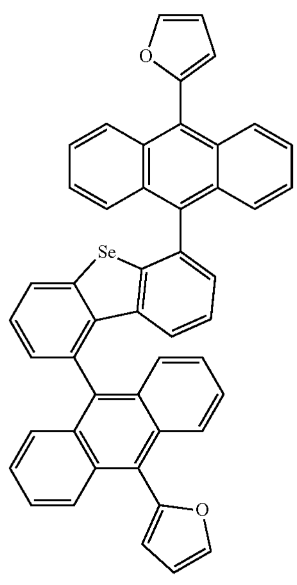

-continued
1282
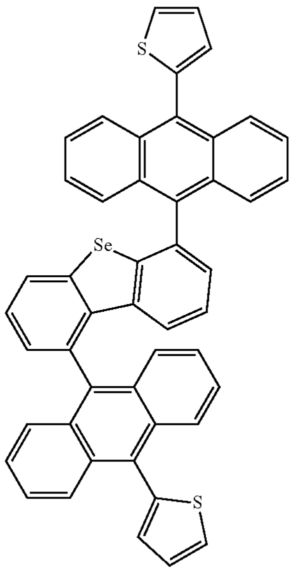
1283
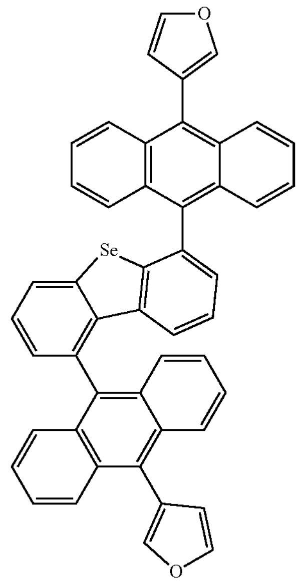
1284
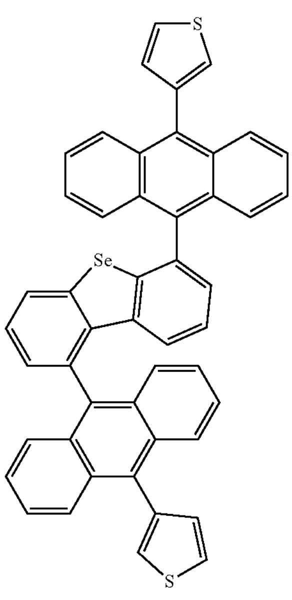
1285
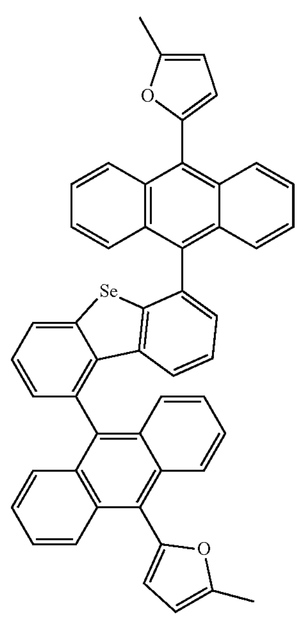

-continued
1286
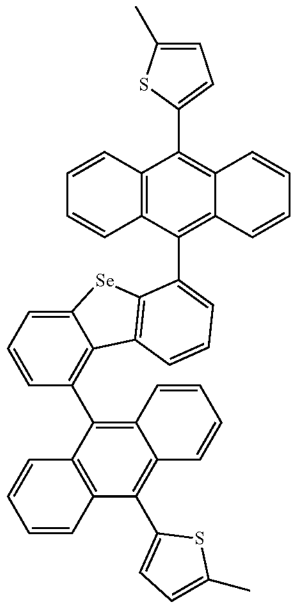
1287
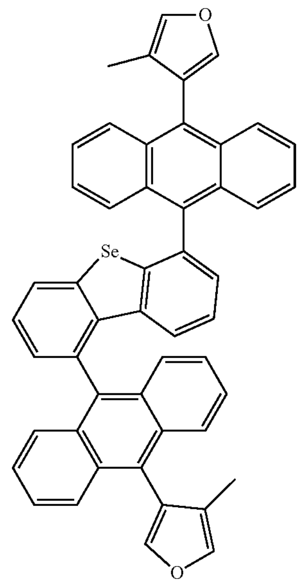
1288
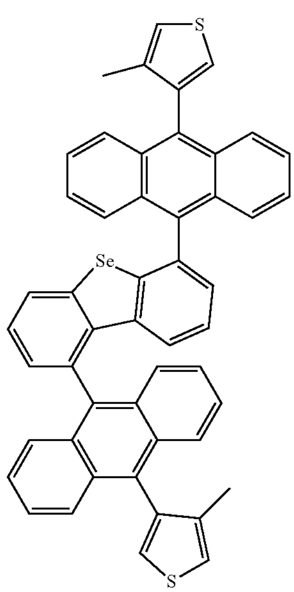
1289
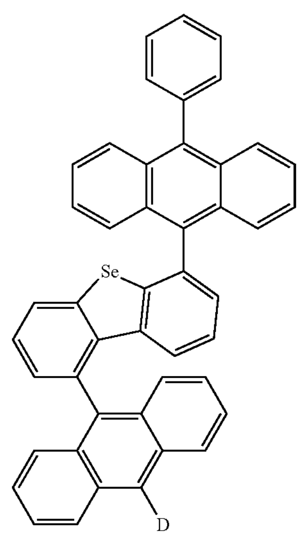

-continued
1290
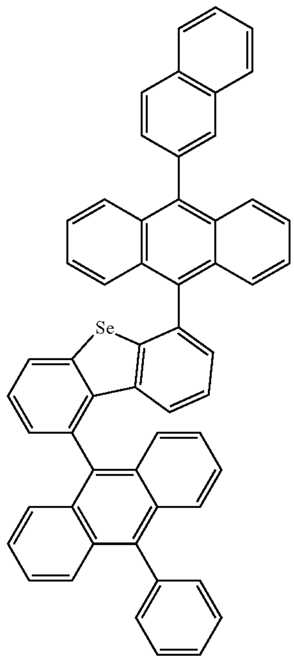
1291
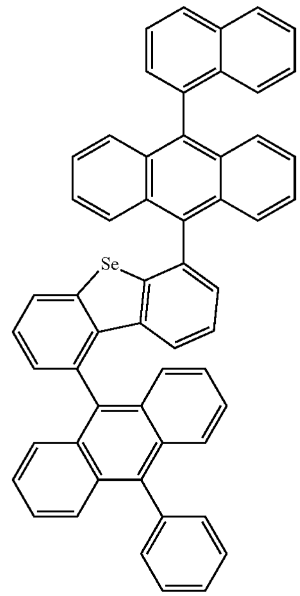
1292
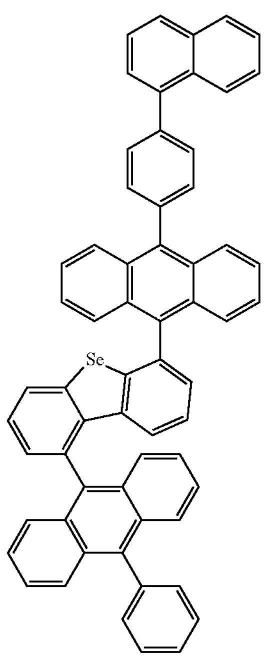
1293
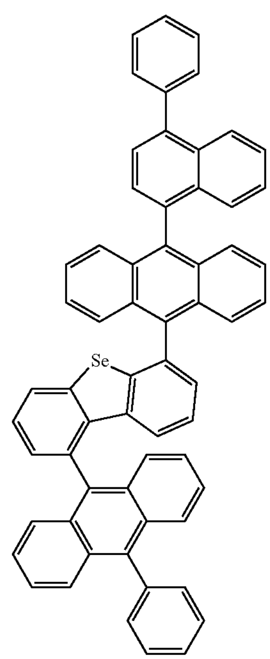

-continued
1294
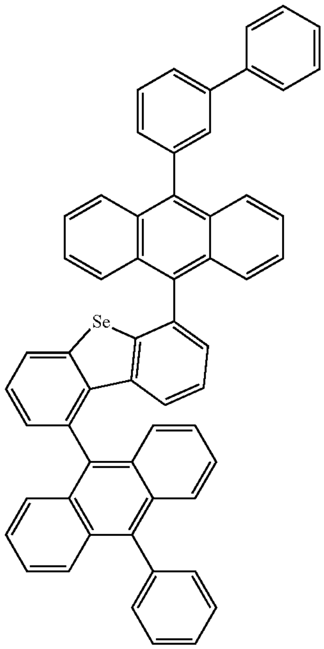
1295
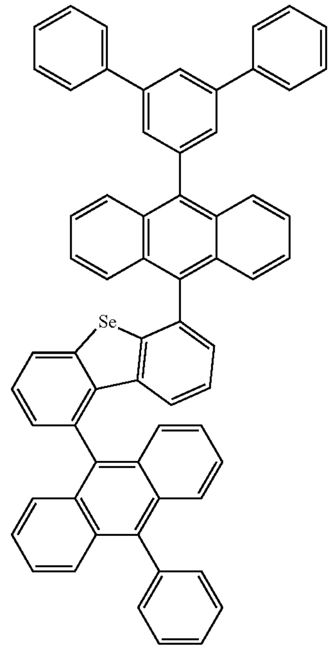
1296
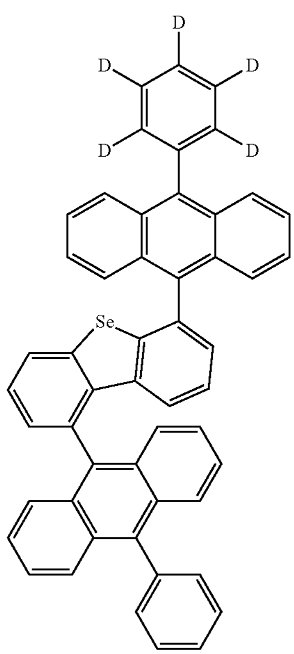
1297
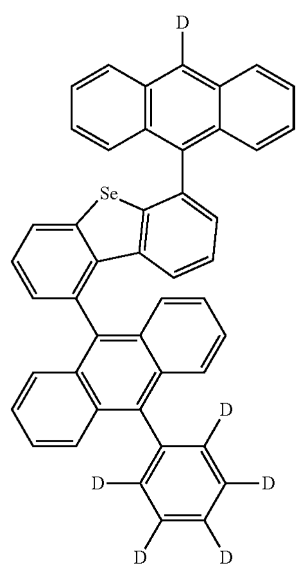

-continued
1298
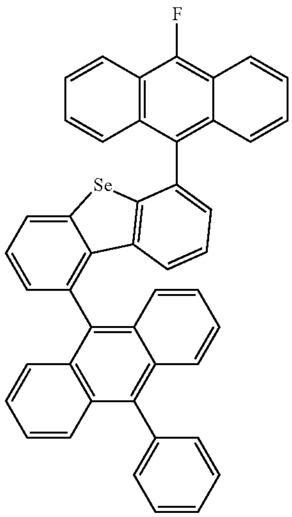
1299
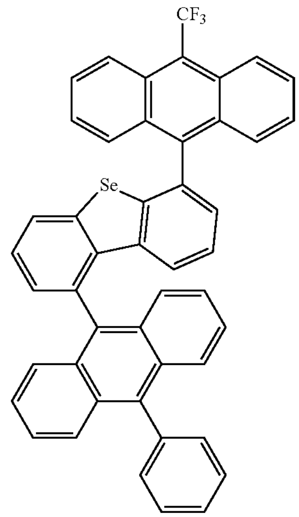
1300
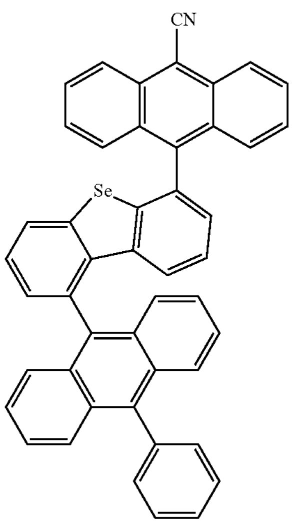
1301
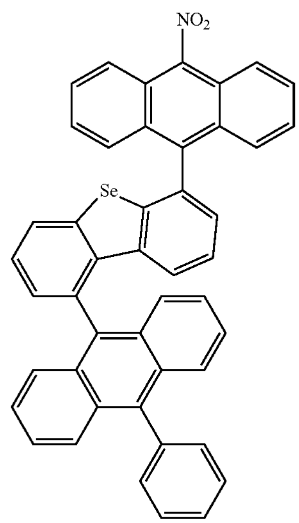
1302
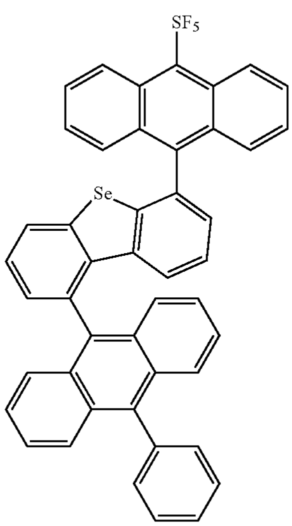
1303
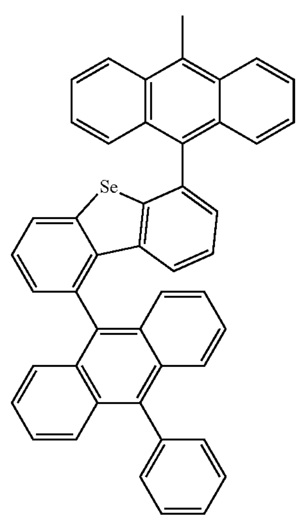

-continued
1304
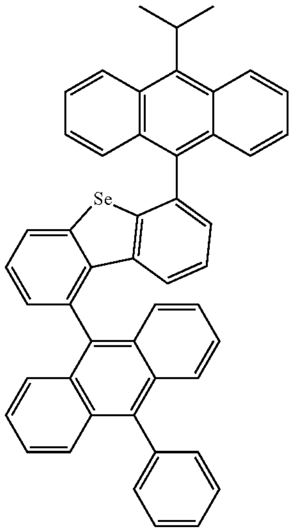
1305
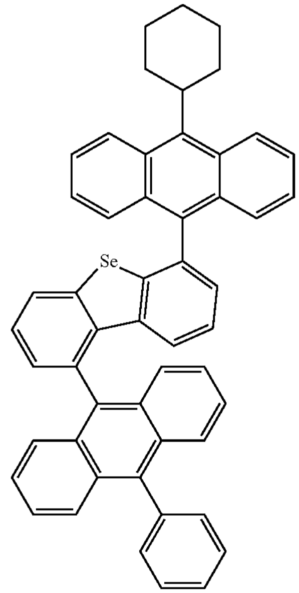
1306
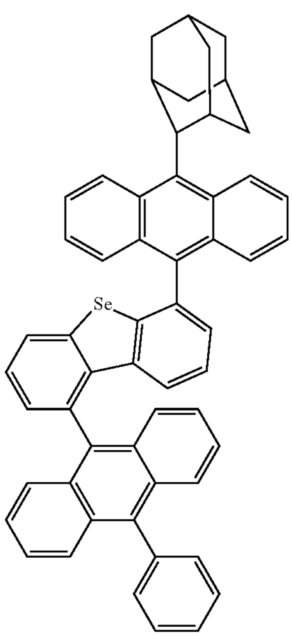
1307
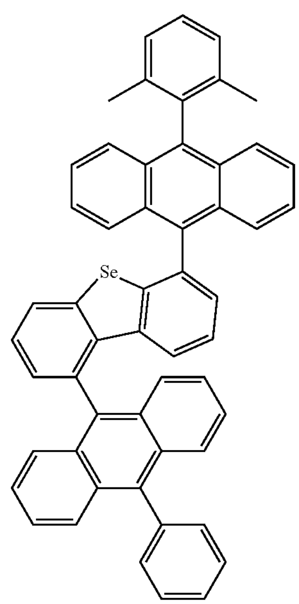

-continued
1308
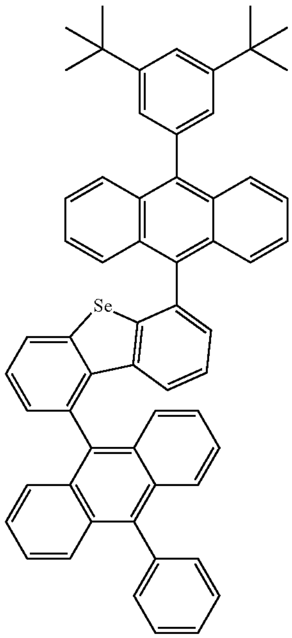
1309
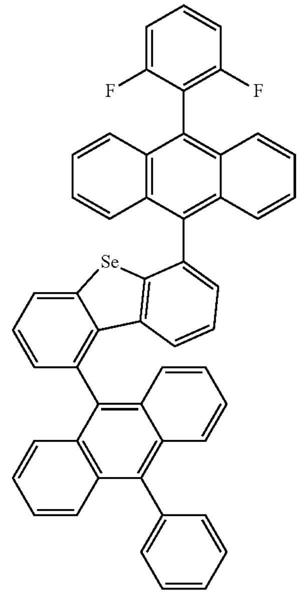
1310
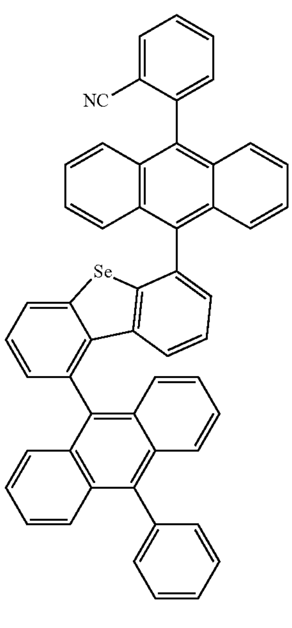
1311
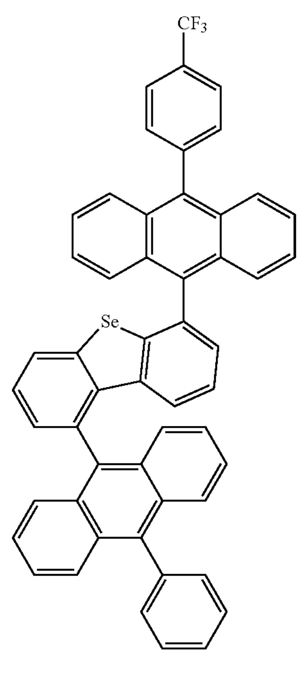

-continued
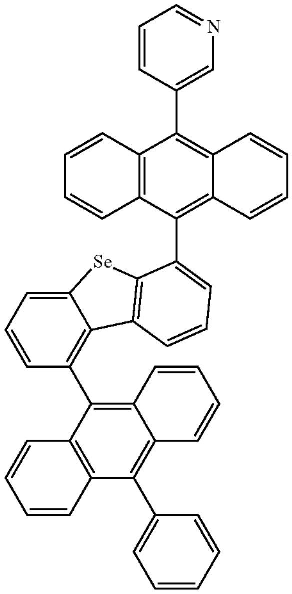
1312
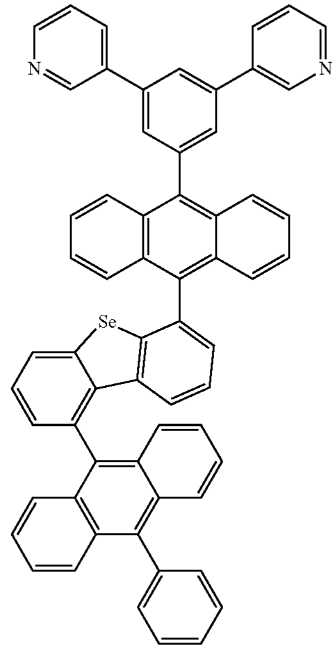
1313
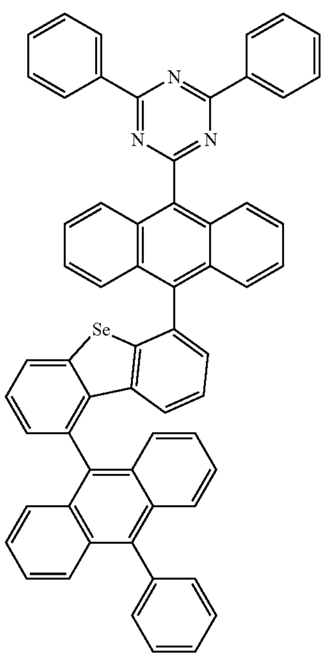
1314
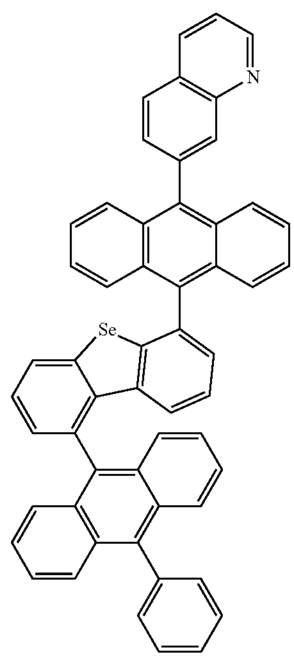
1315

-continued
1316
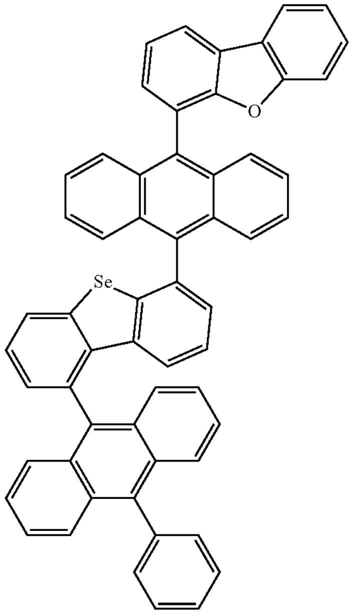
1317
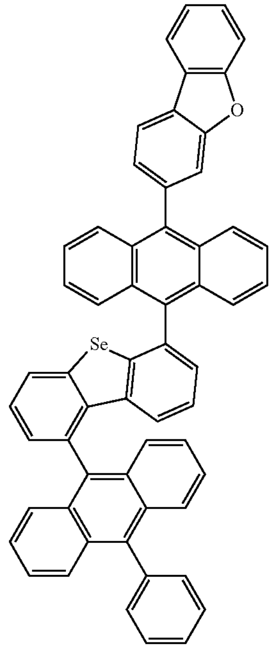
1318
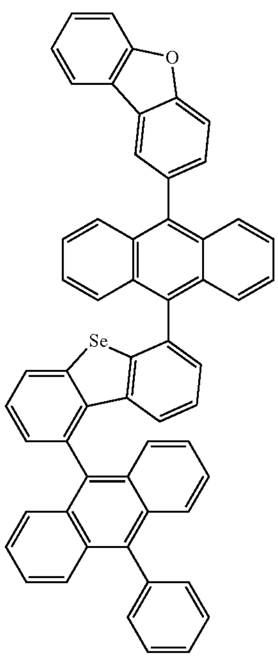
1319
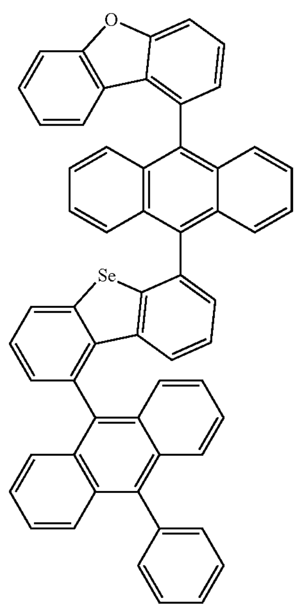

-continued
1320
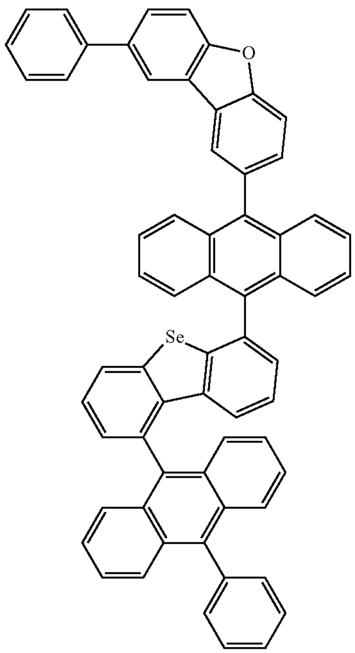
1321
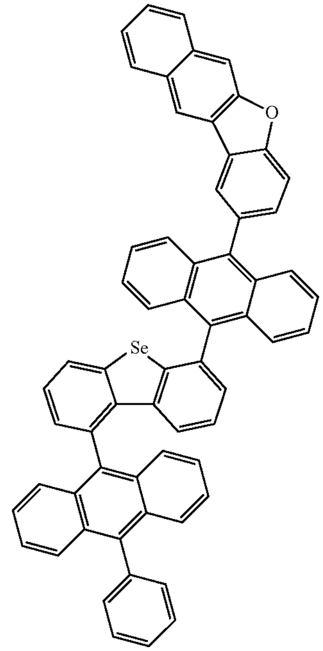
1322
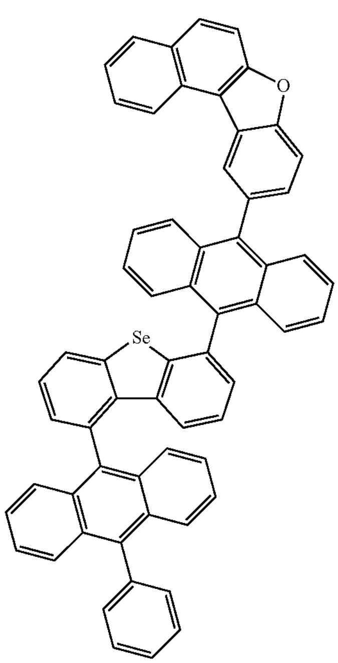
1323
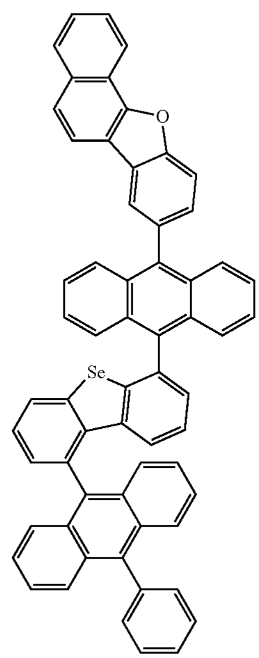

-continued
1324
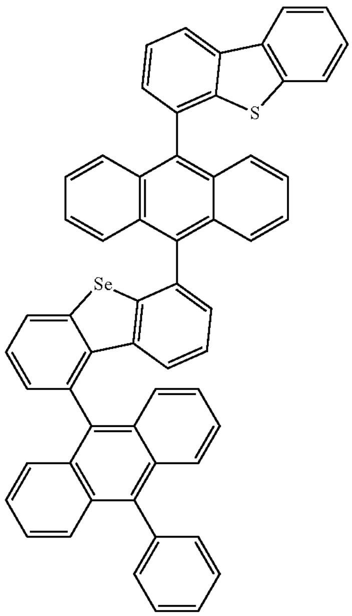
1325
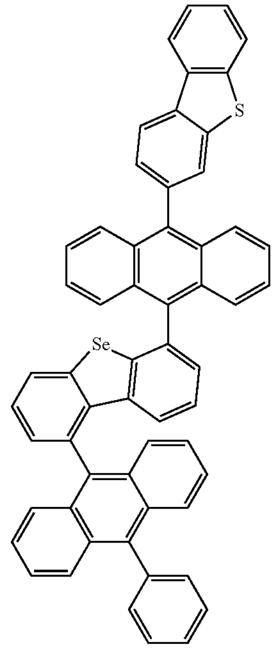
1326
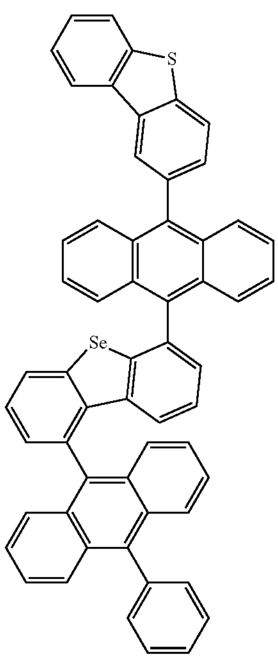
1327
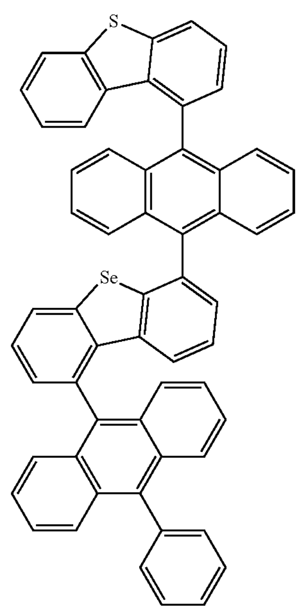

-continued
1328
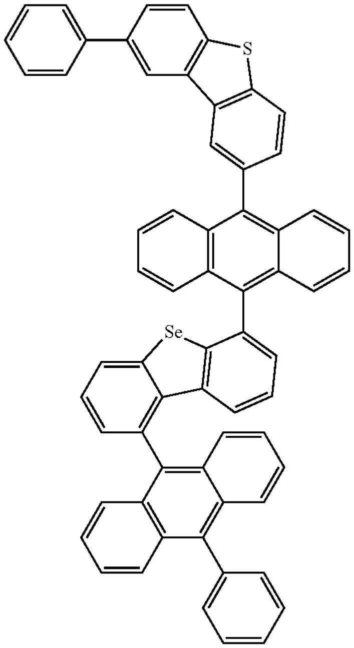
1329
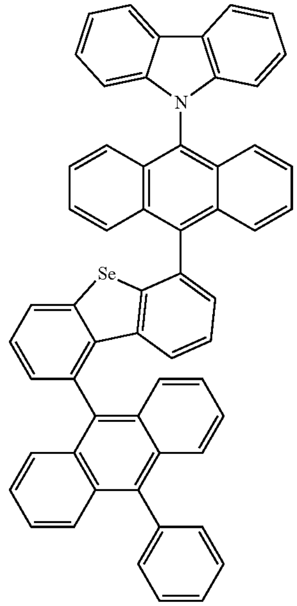
1330
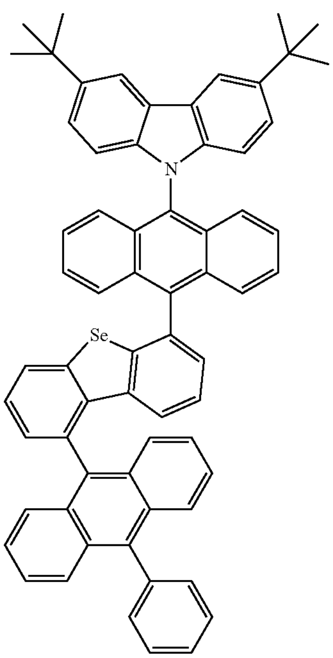
1331
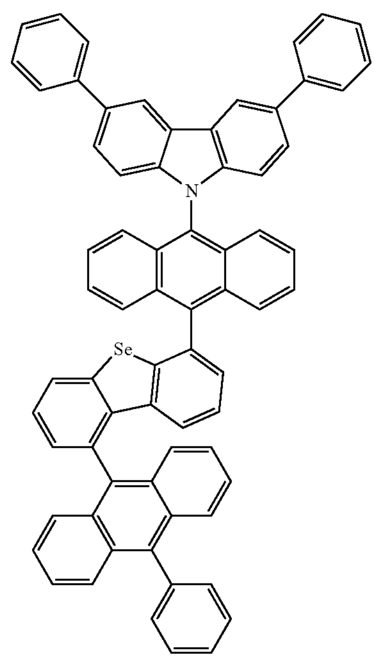

-continued
1332
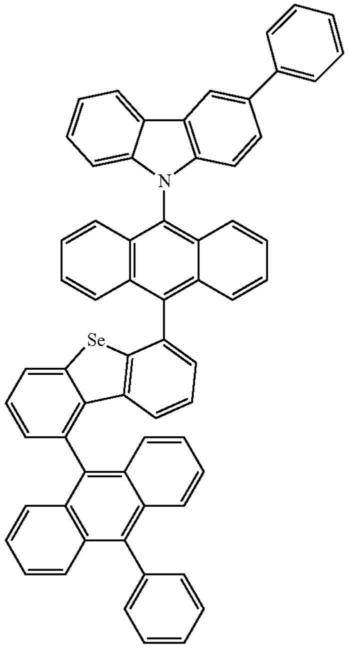
1333
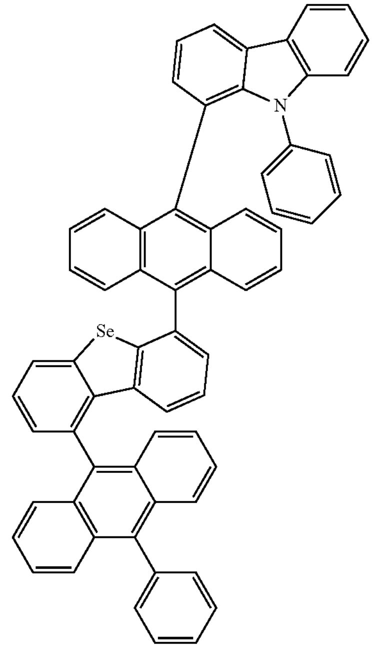
1334
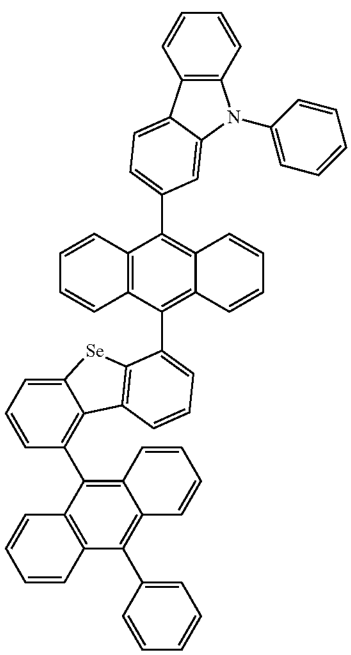
1335
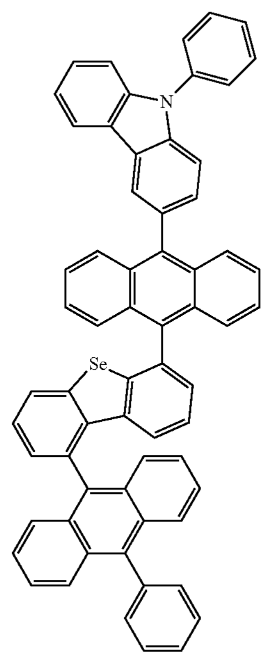

-continued
1336
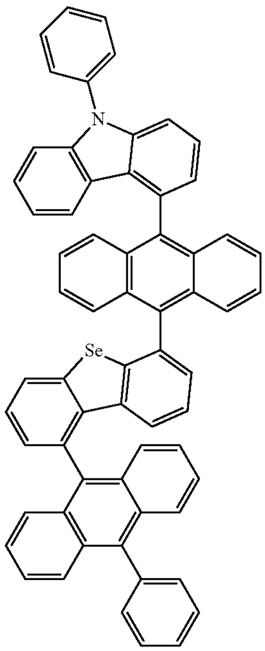
1337
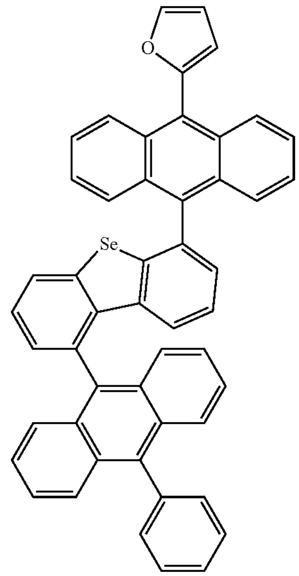
1338
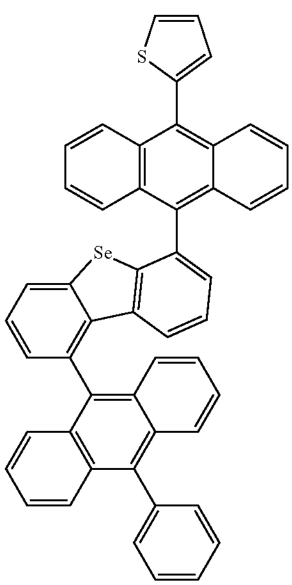
1339
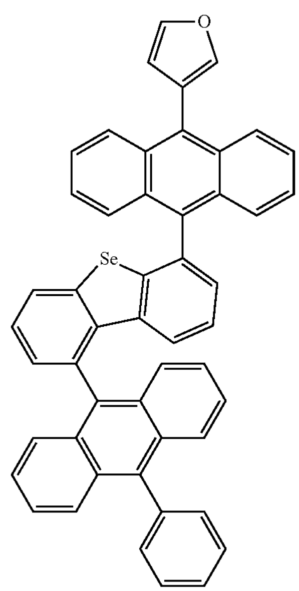

-continued
1340
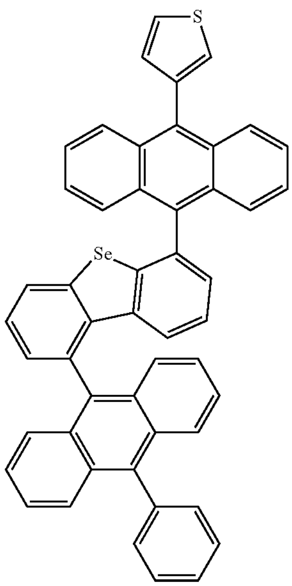
1341
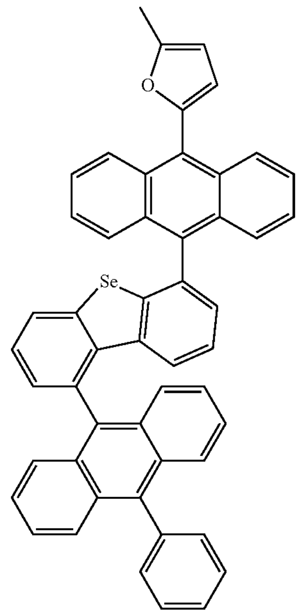
1342
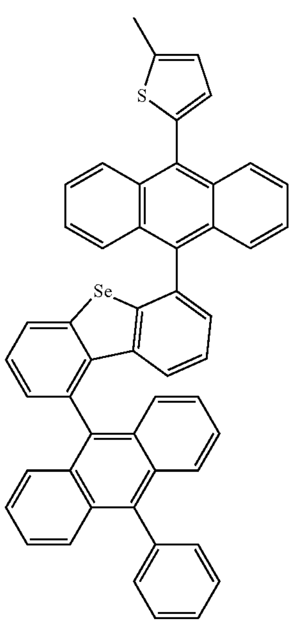
1343
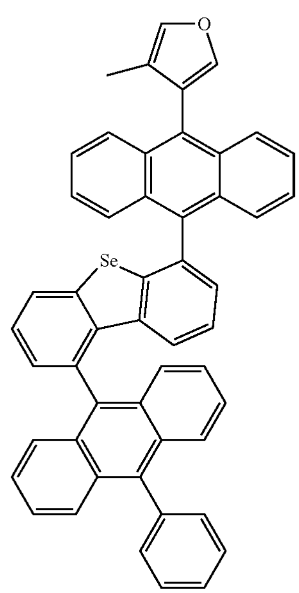

-continued
1344
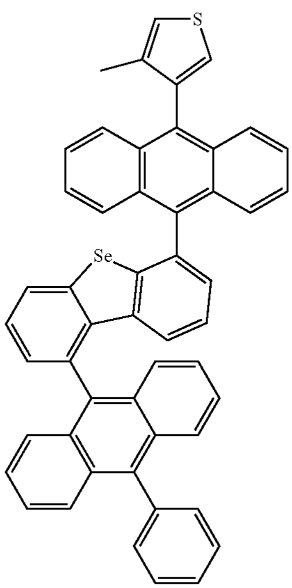
1345
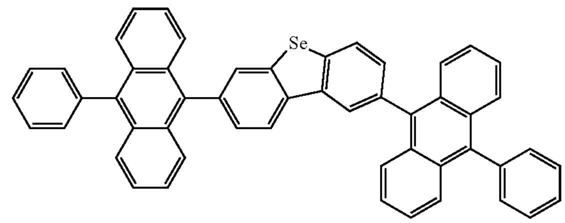
1346
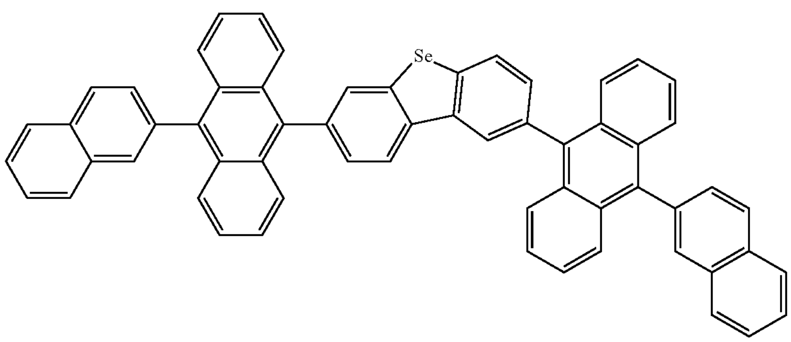
1347
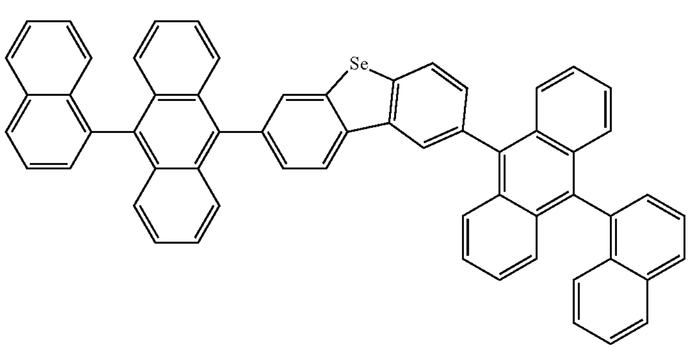

-continued
1348
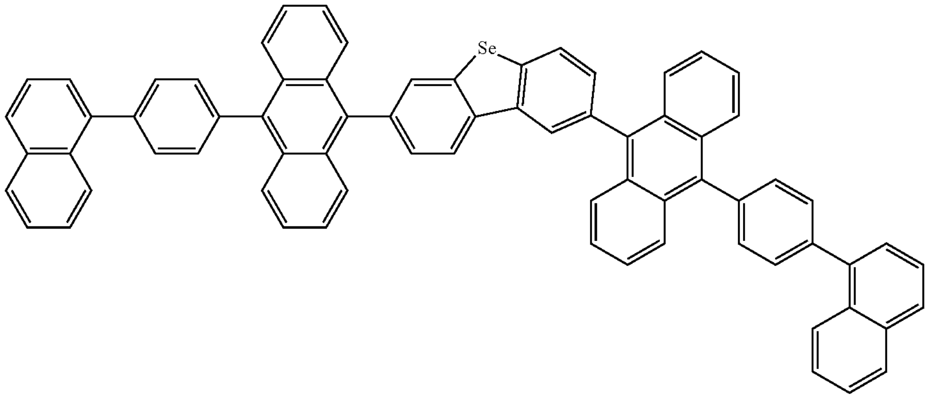
1349
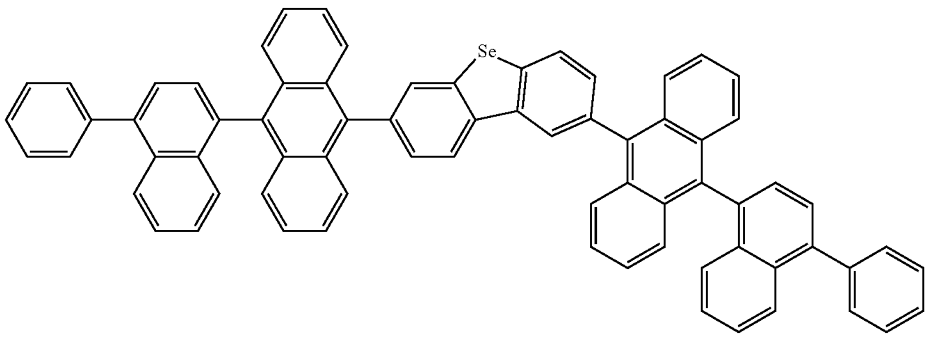
1350
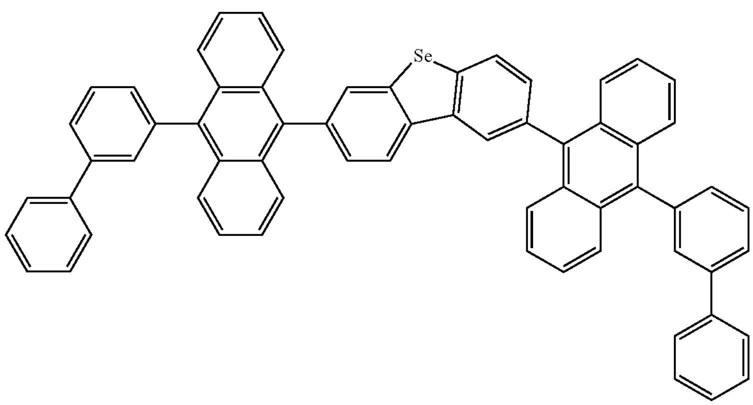
1351
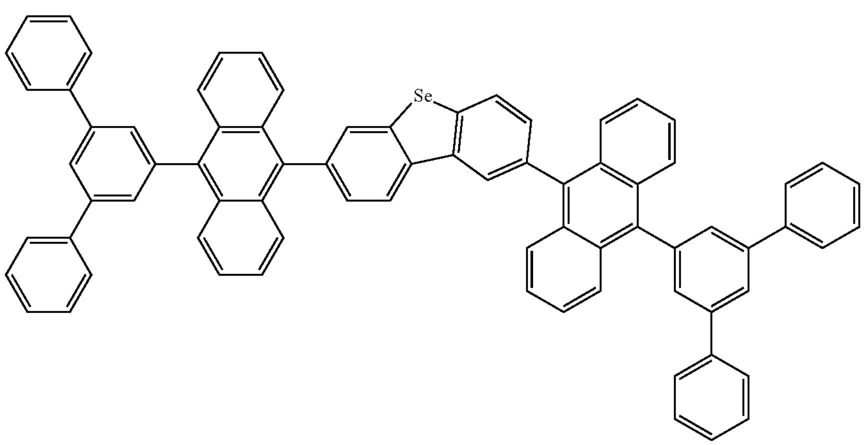

-continued
1352
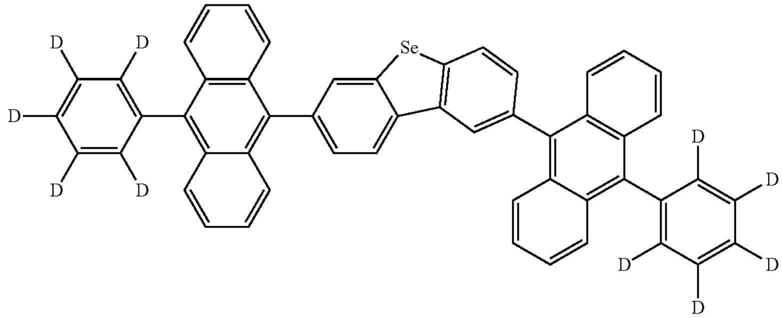
1353
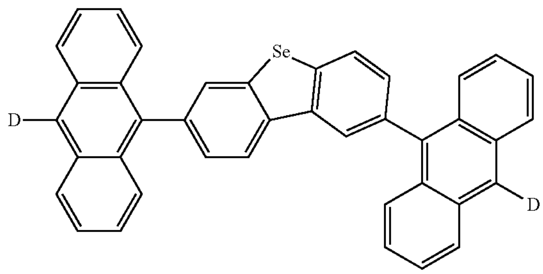
1354
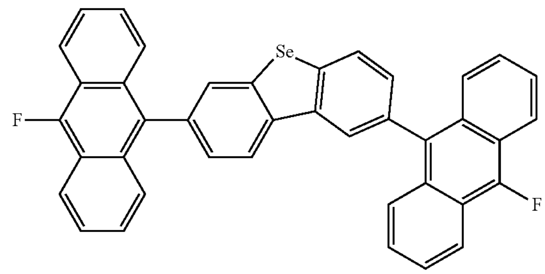
1355
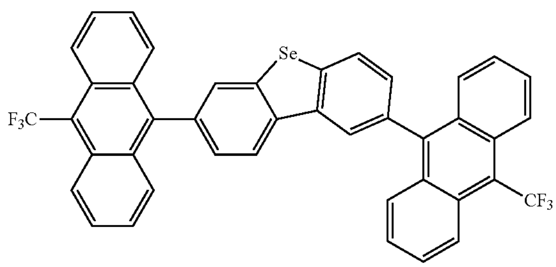
1356
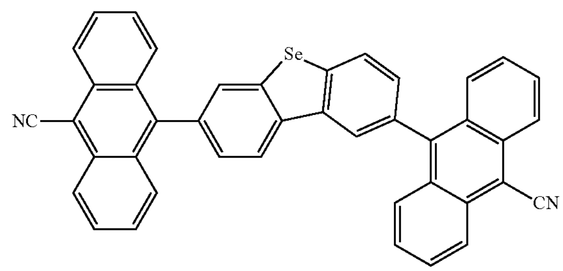
1357
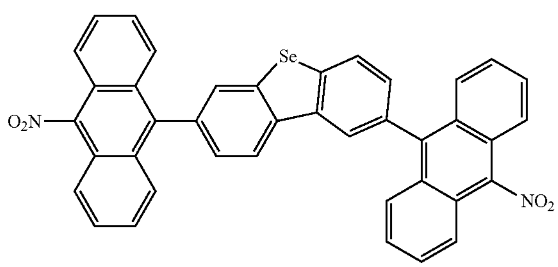
1358
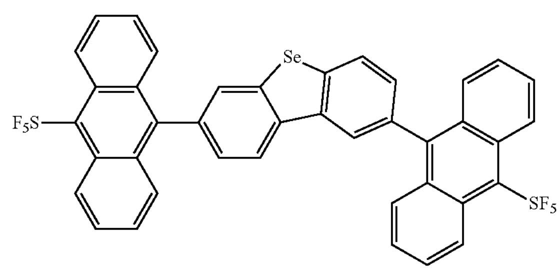
1359
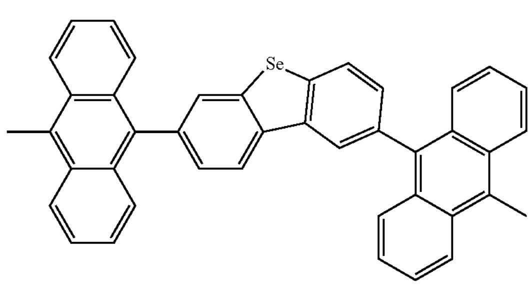
1360
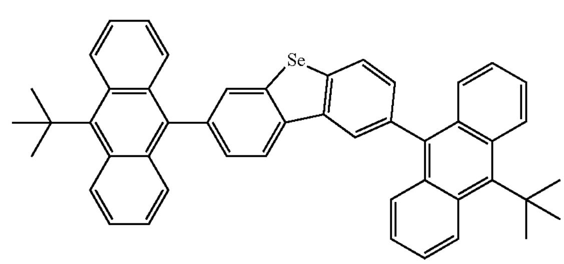

-continued
1361
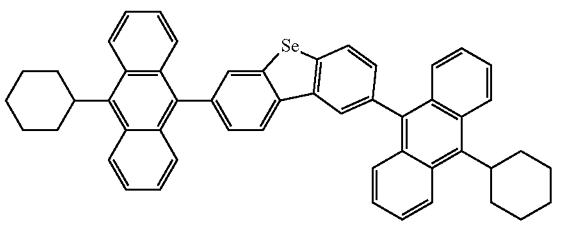
1362
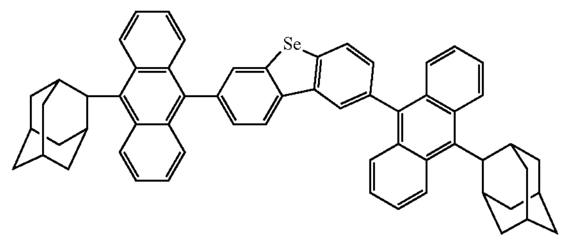
1363
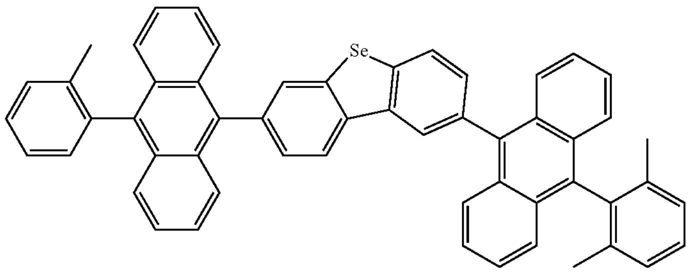
1364
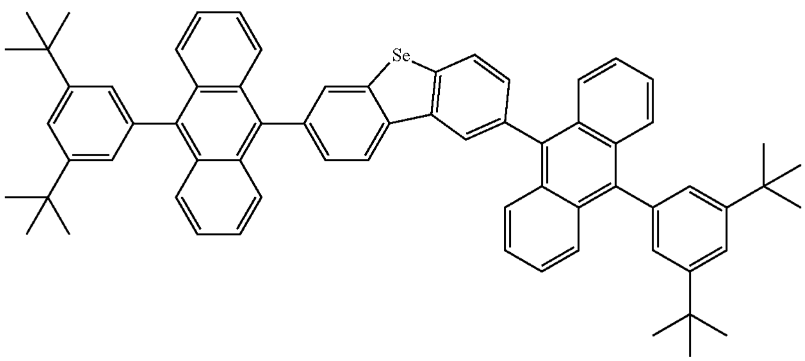
1365
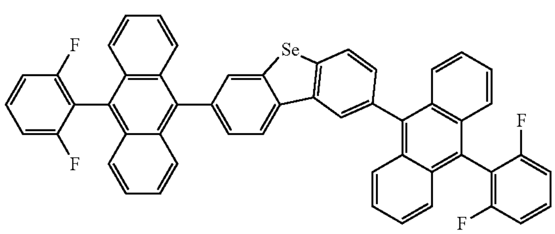
1366
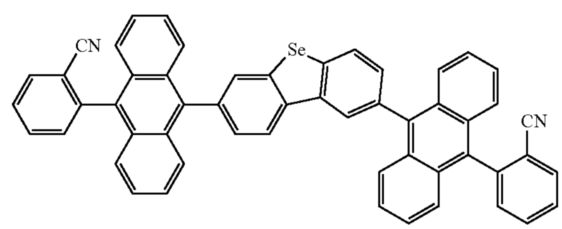
1367
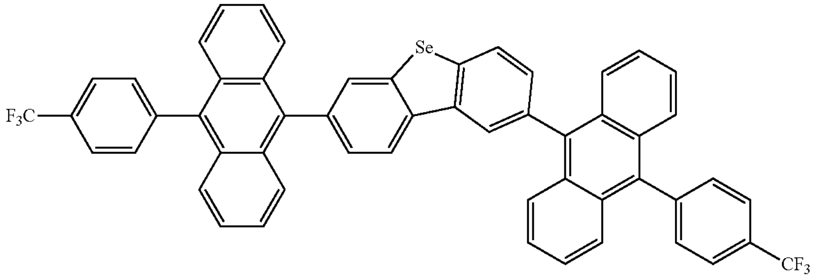

-continued
1368
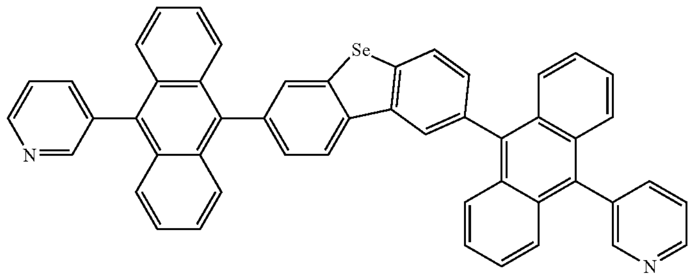
1369
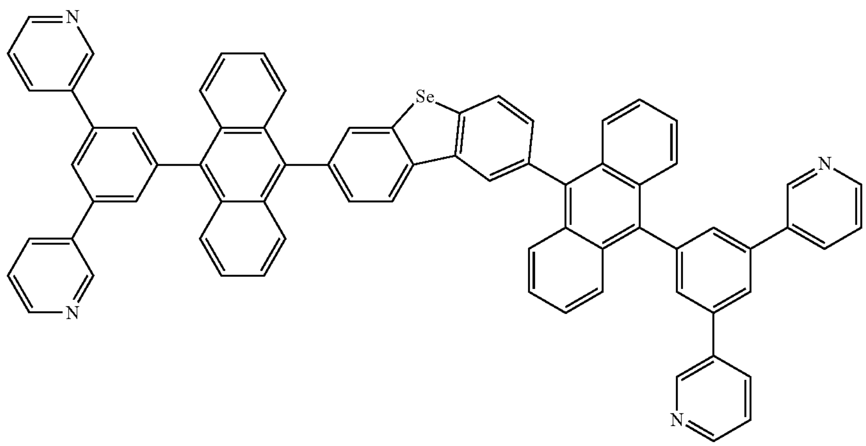
1370
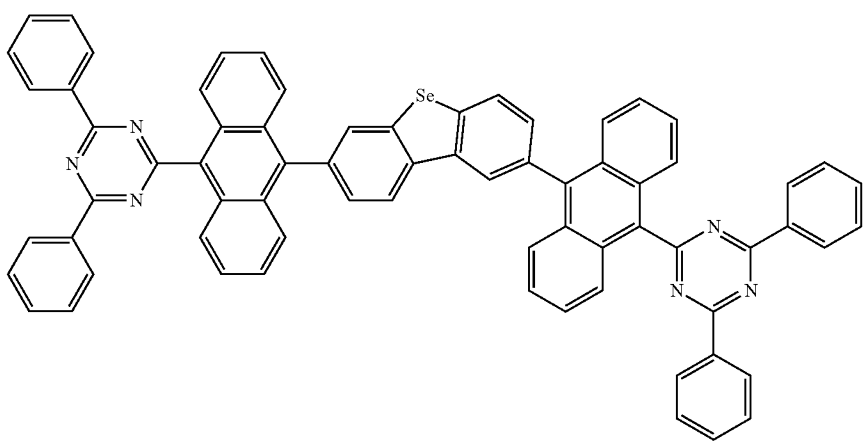
1371
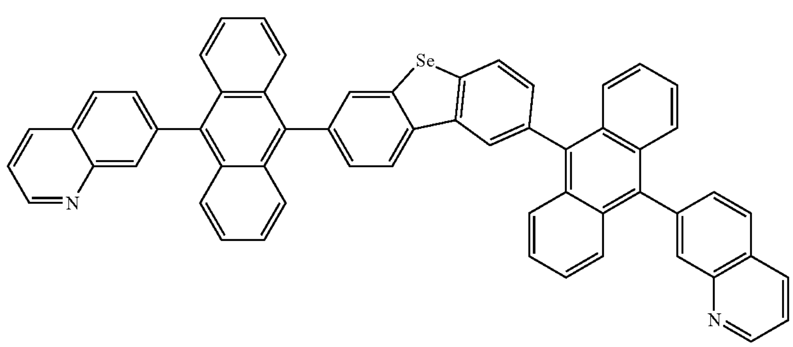

-continued
1372
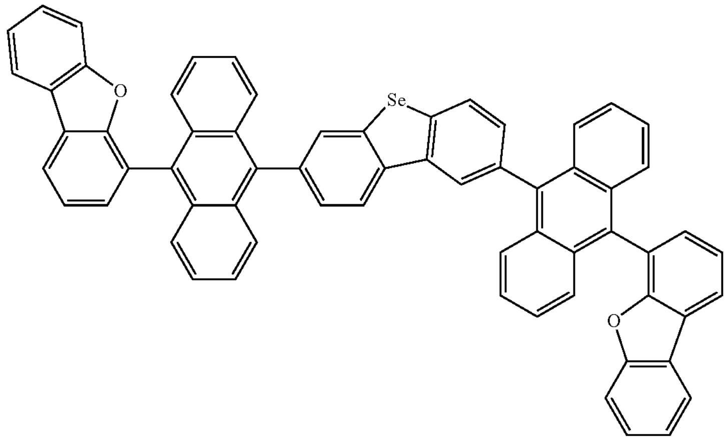
1373
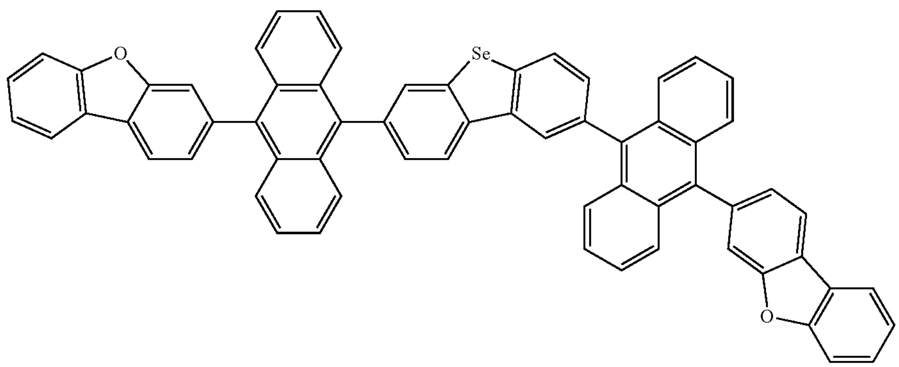
1374
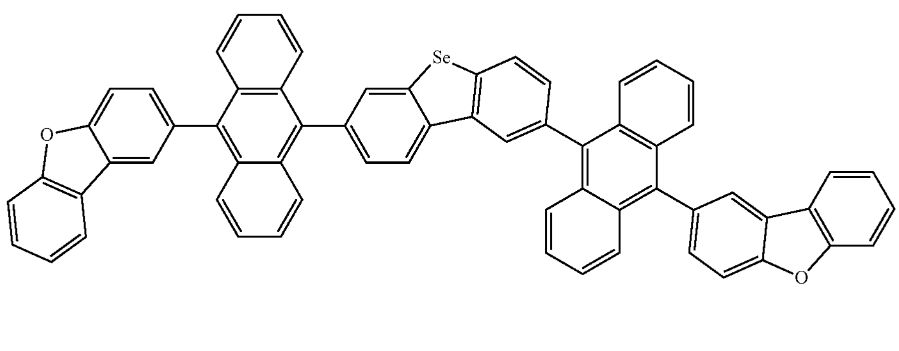
1375
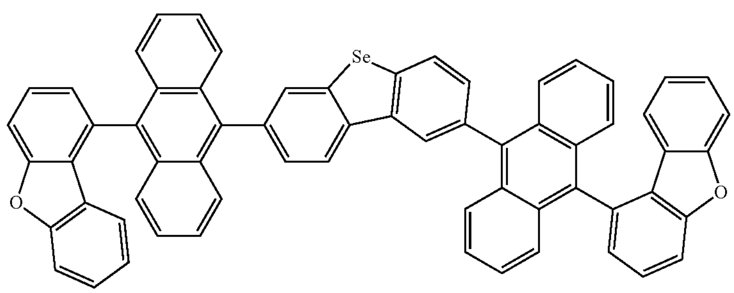

-continued
1376
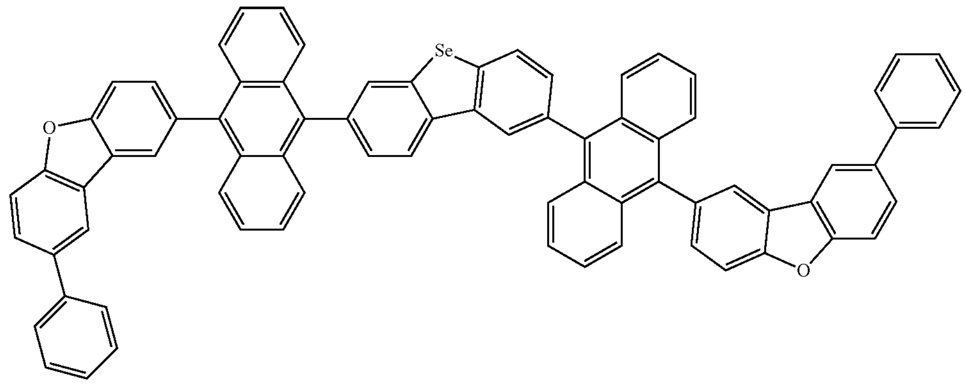
1377
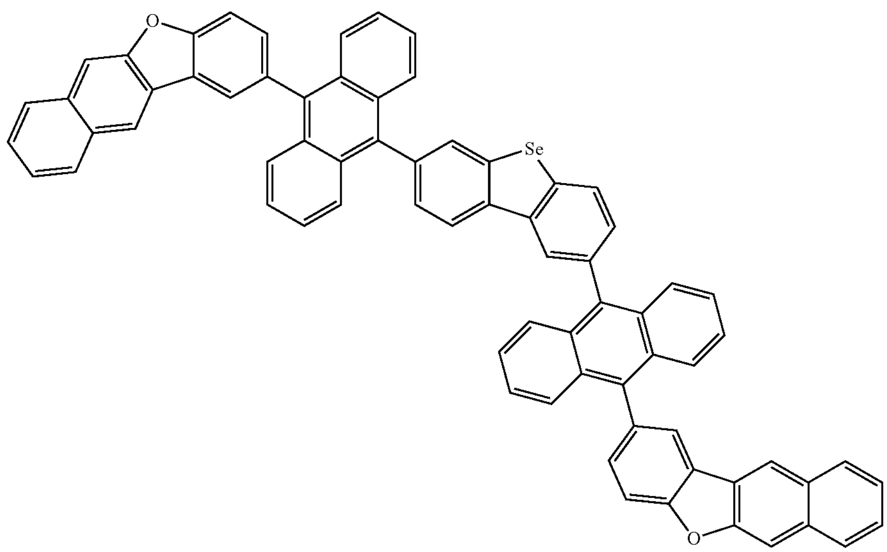
1378
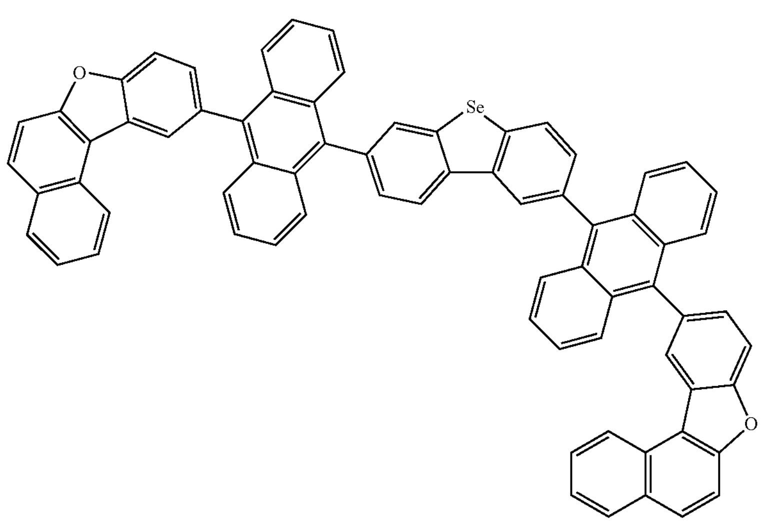

-continued
1379
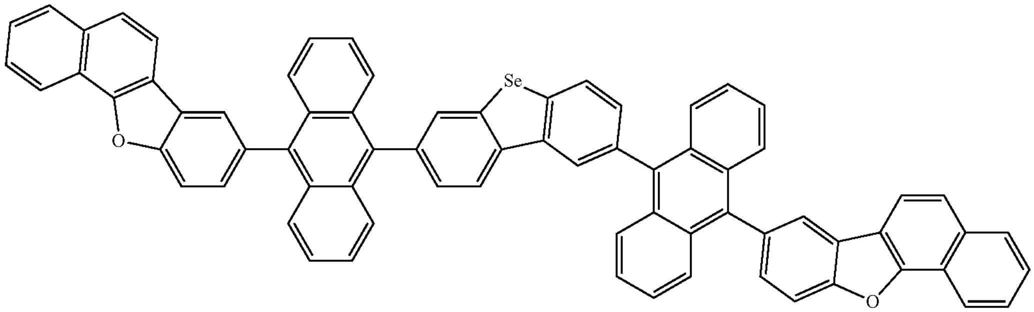
1380
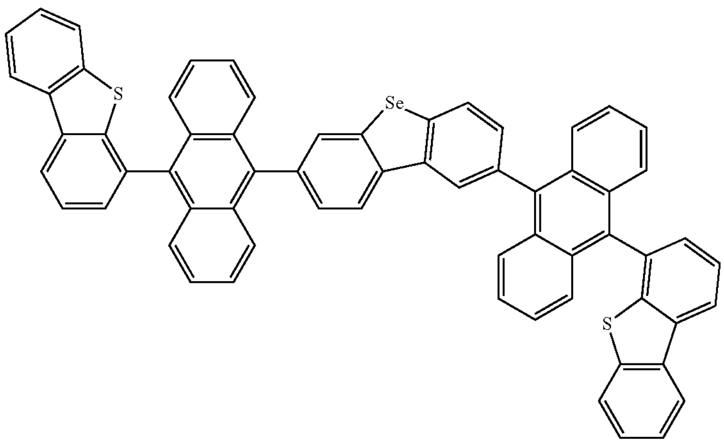
1381
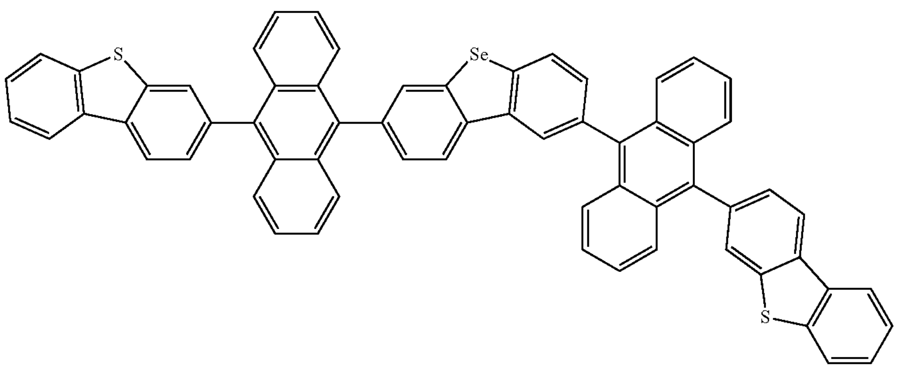
1382
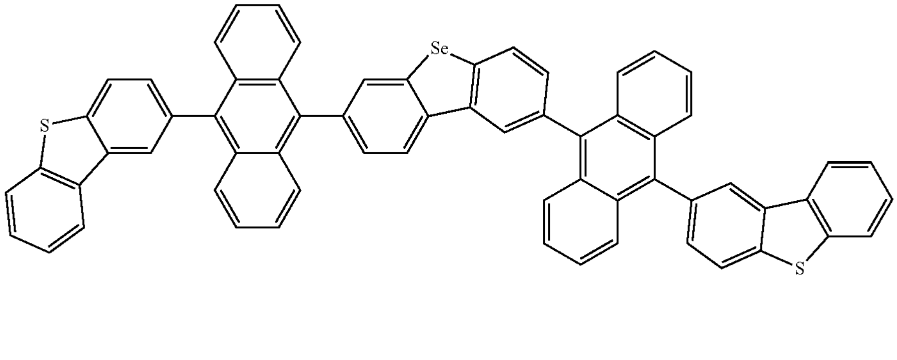

-continued
1383
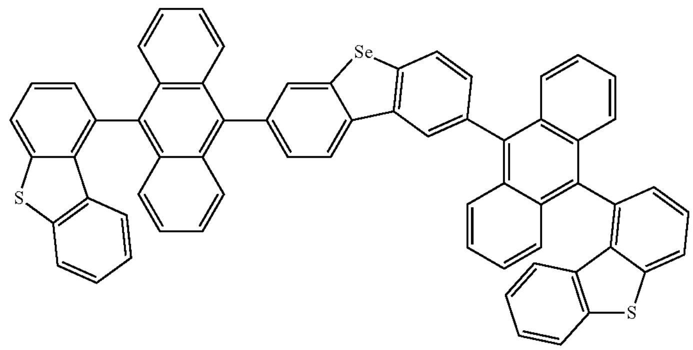
1384
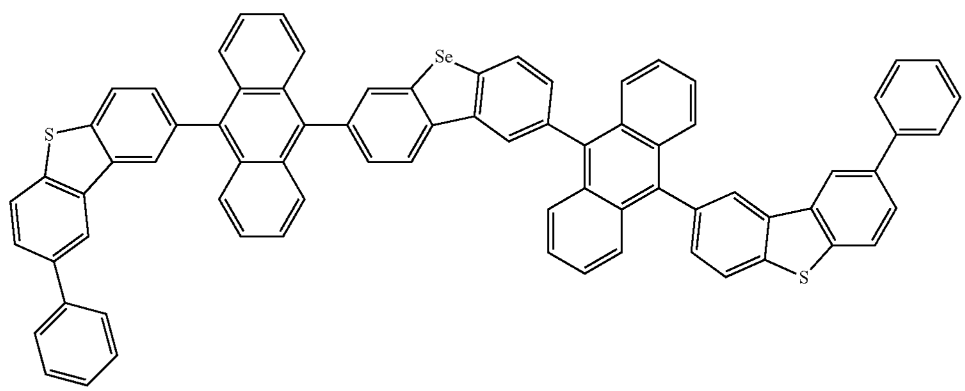
1385
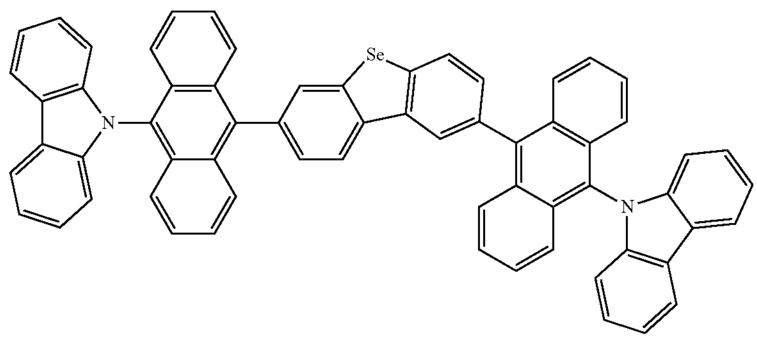
1386
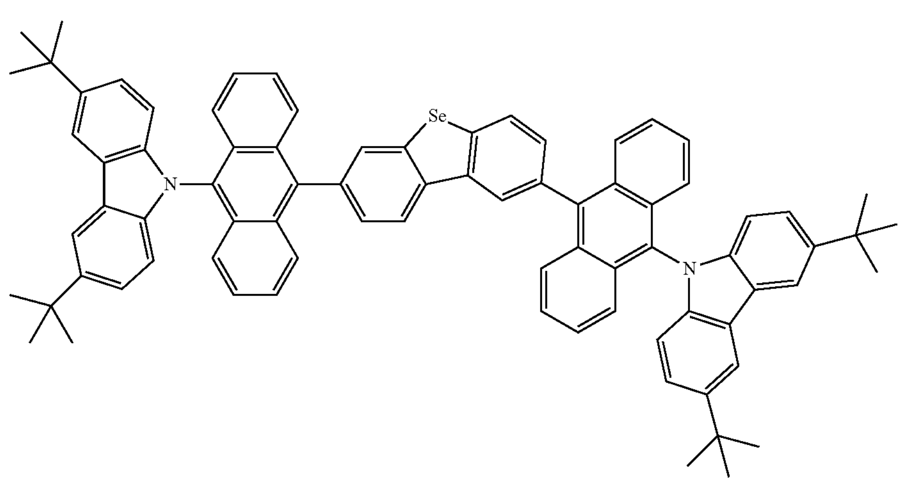

-continued
1387
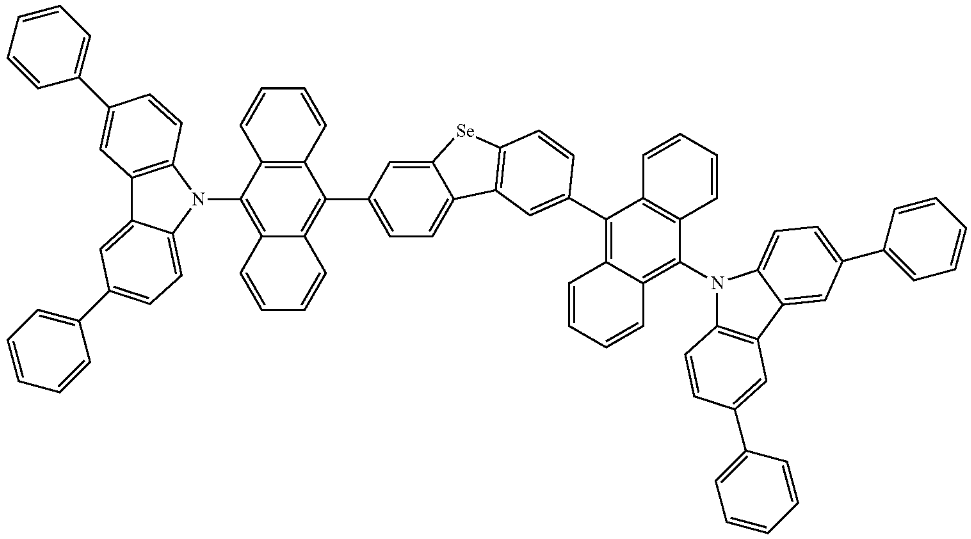
1388
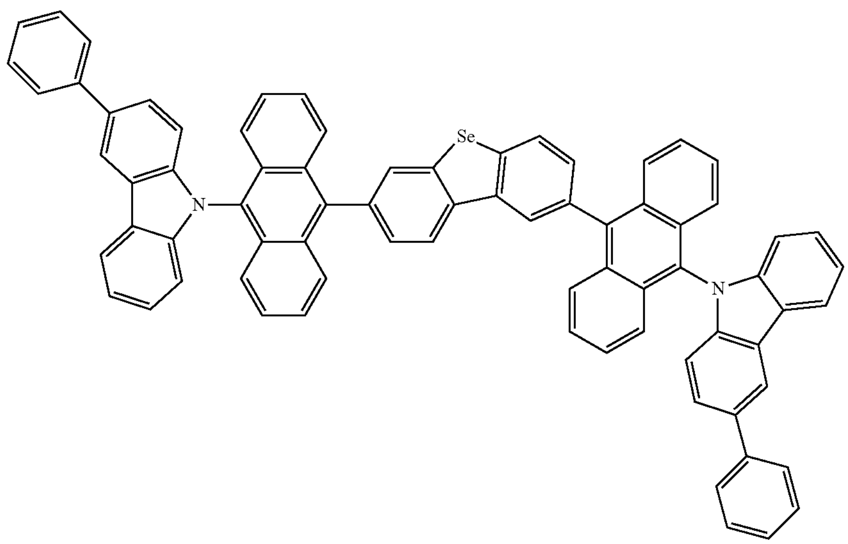
1389
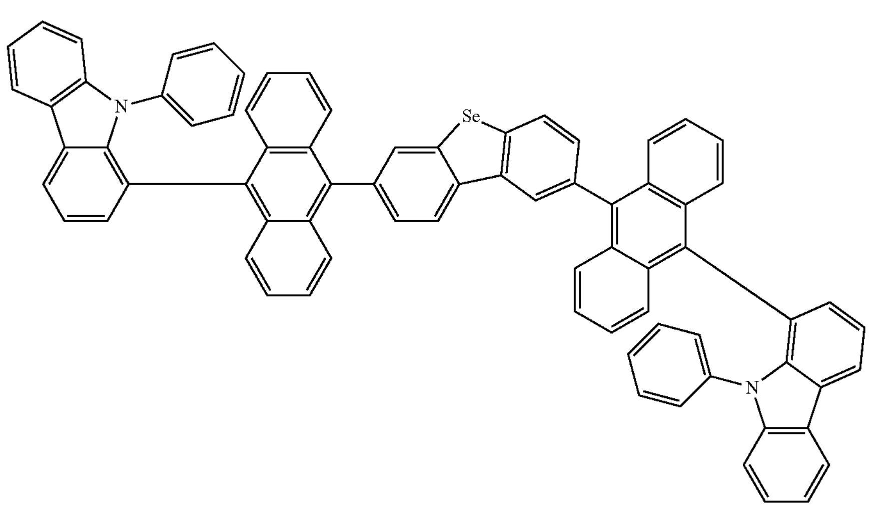

-continued
1390
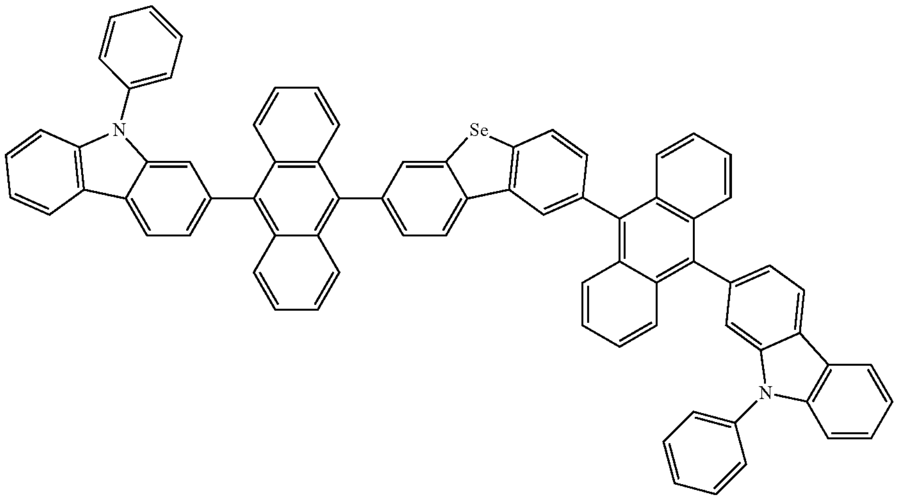
1391
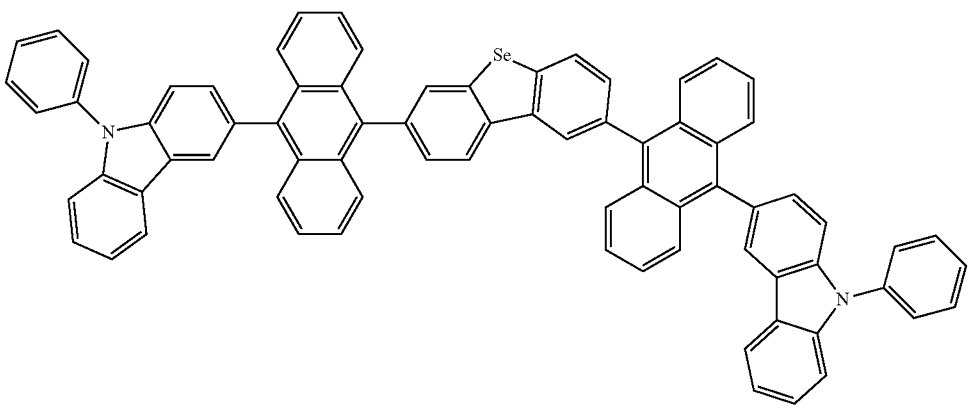
1392
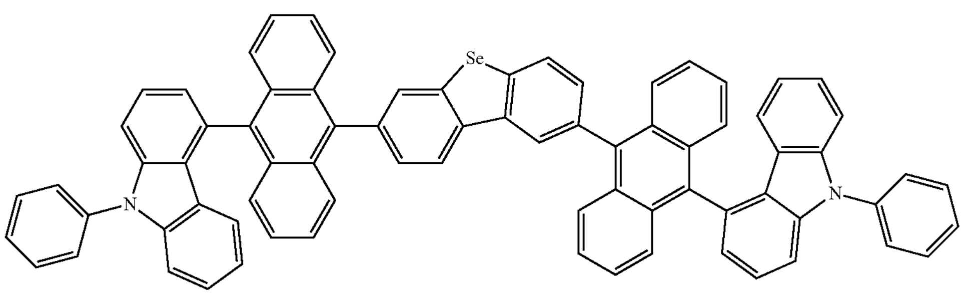
1393
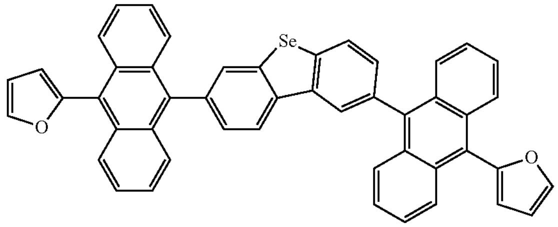
1394
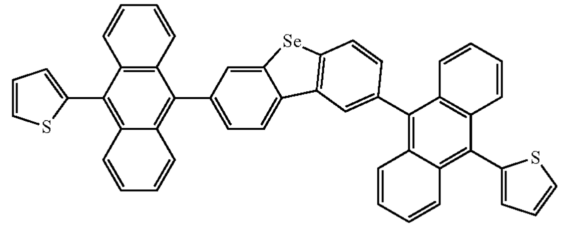

-continued
1395
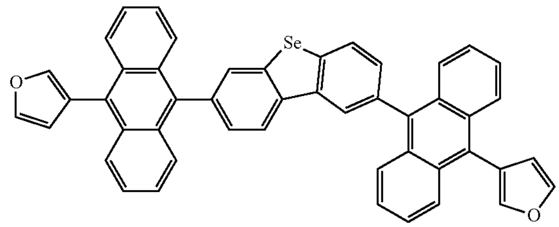
1396
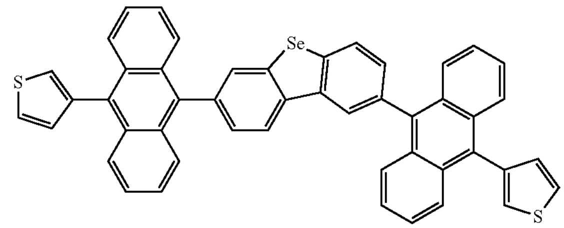
1397
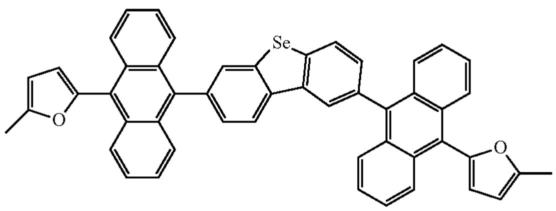
1398
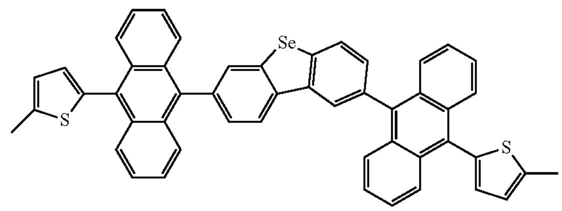
1399
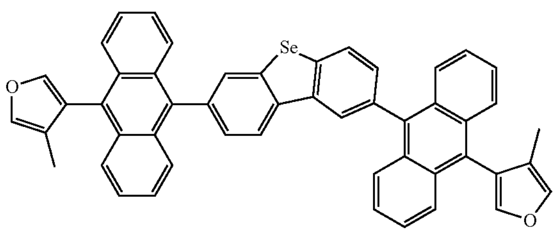
1400
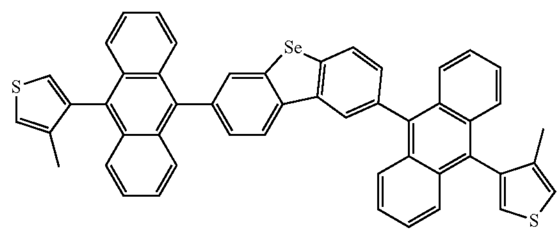
1401
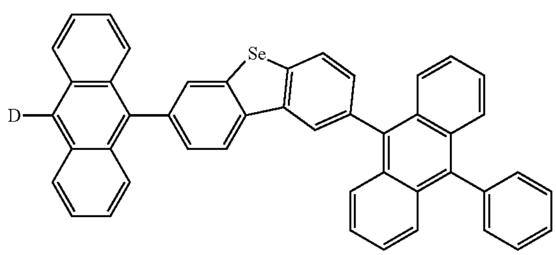
1402
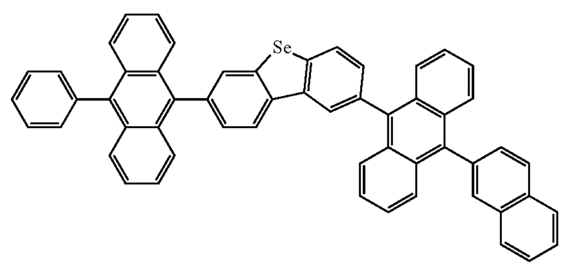
1403
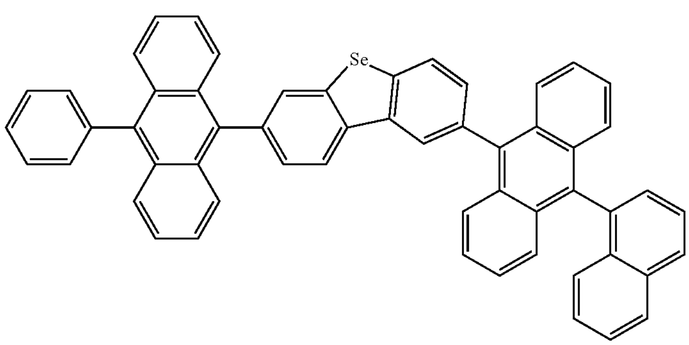

-continued
1404
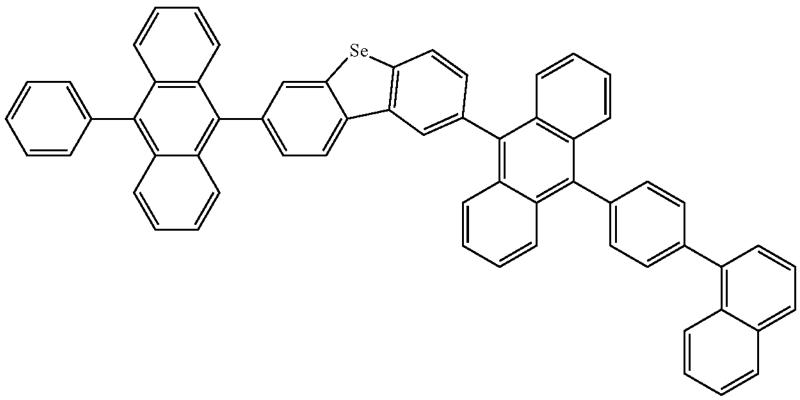
1405
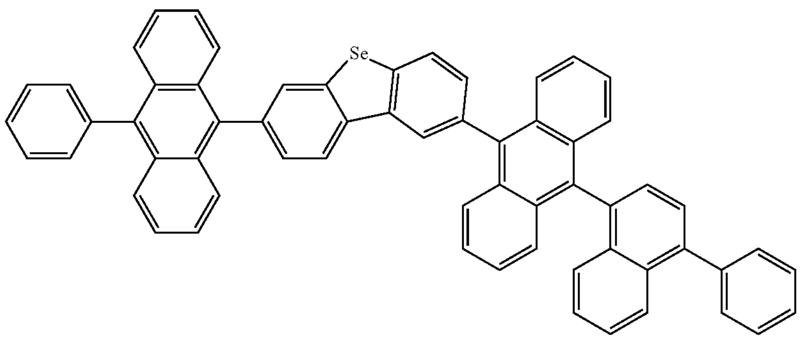
1406
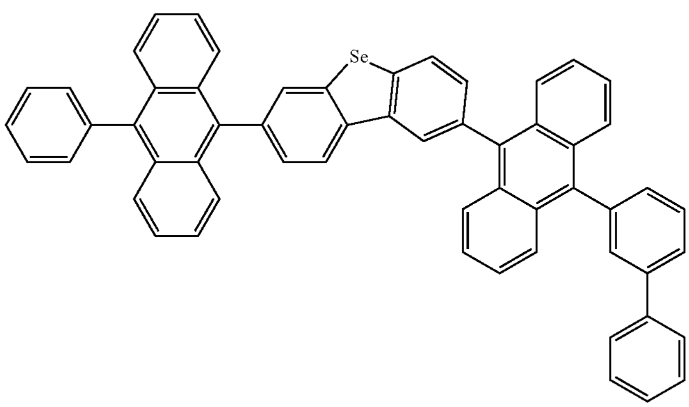
1407
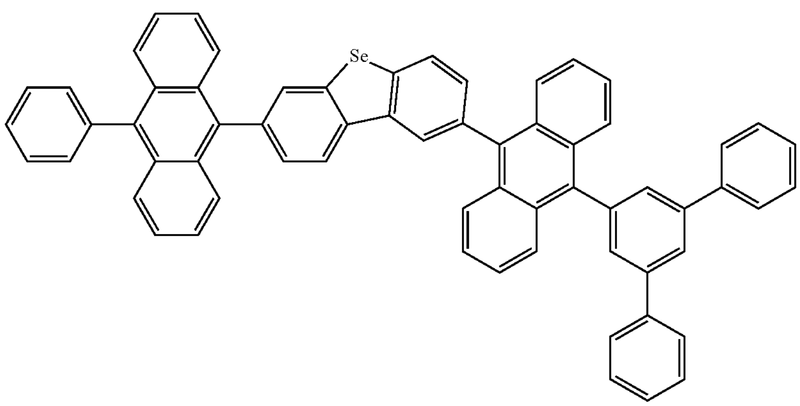

-continued
1408
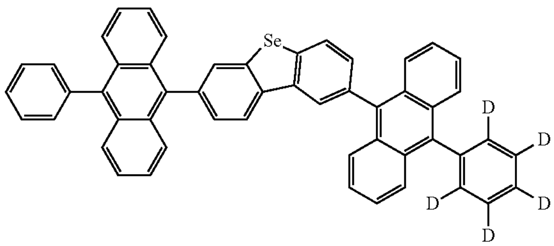
1409
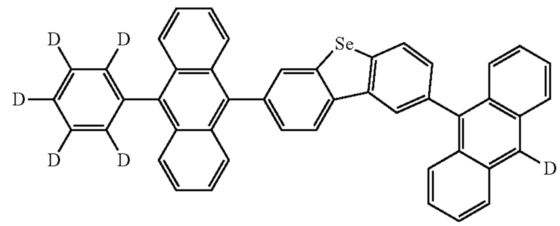
1410
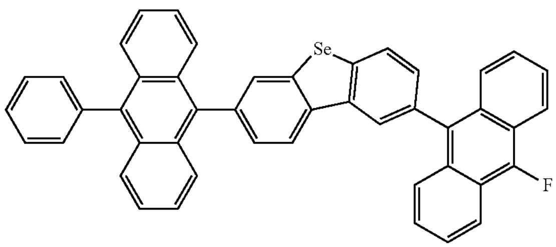
1411
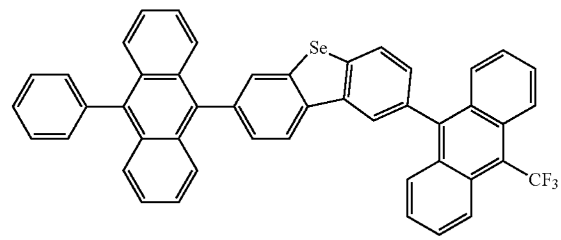
1412
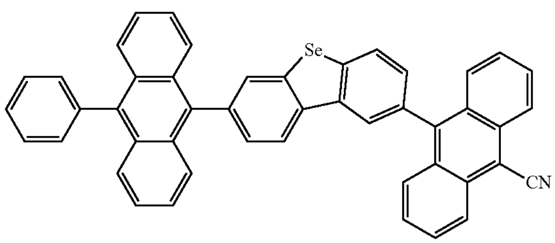
1413
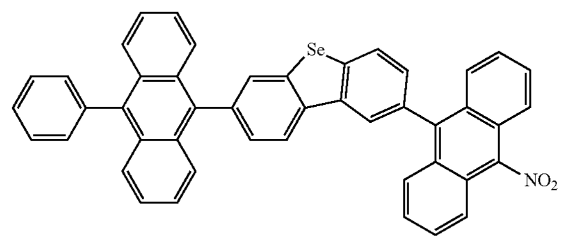
1414
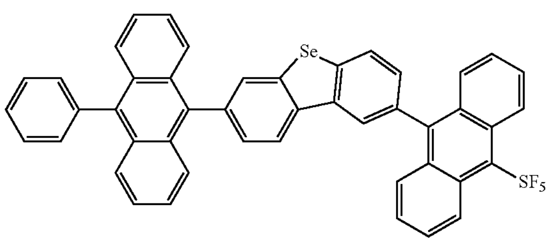
1415
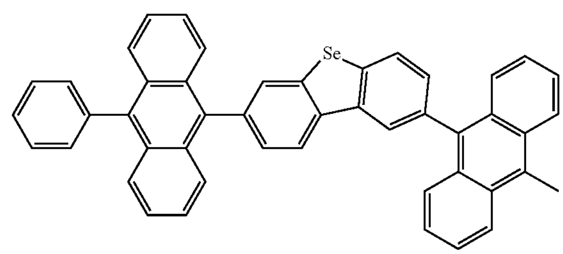
1416
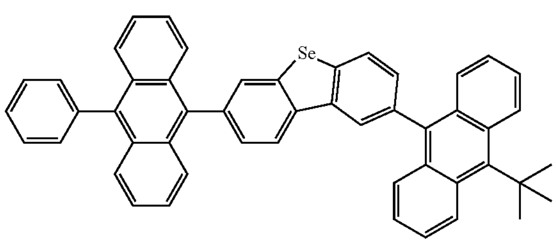
1417
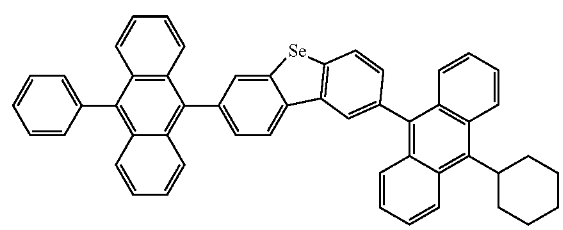
1418
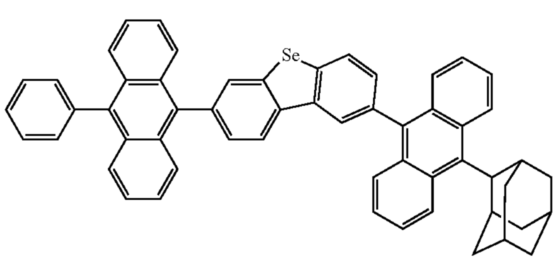
1419
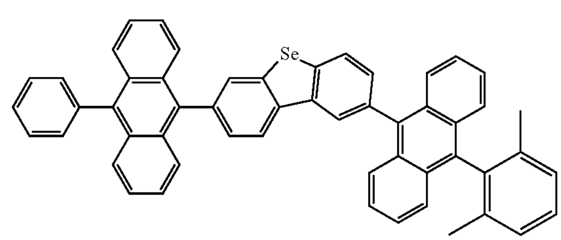

-continued
1420
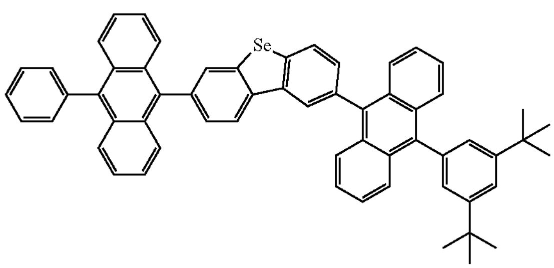
1421
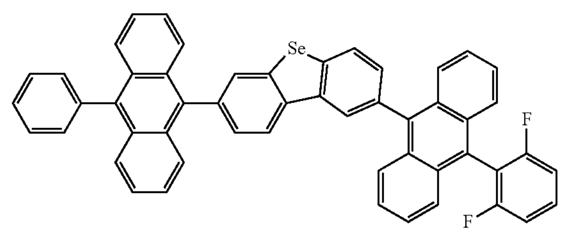
1422
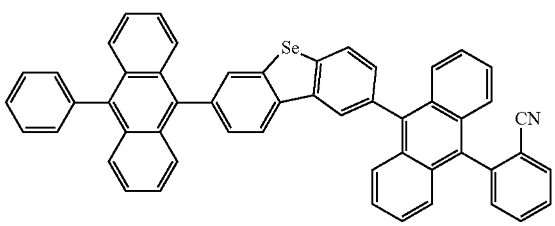
1423
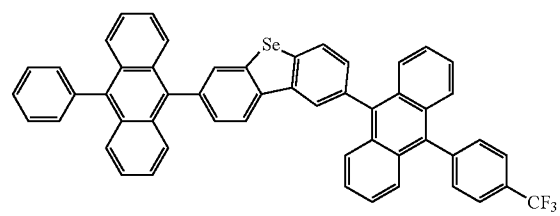
1424
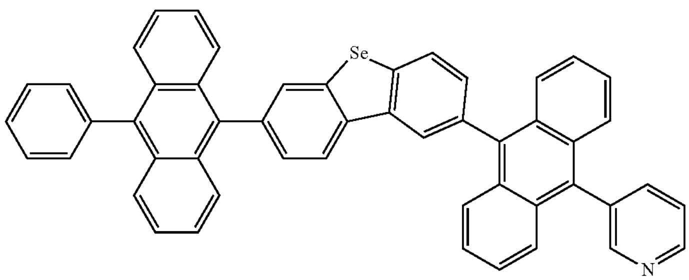
1425
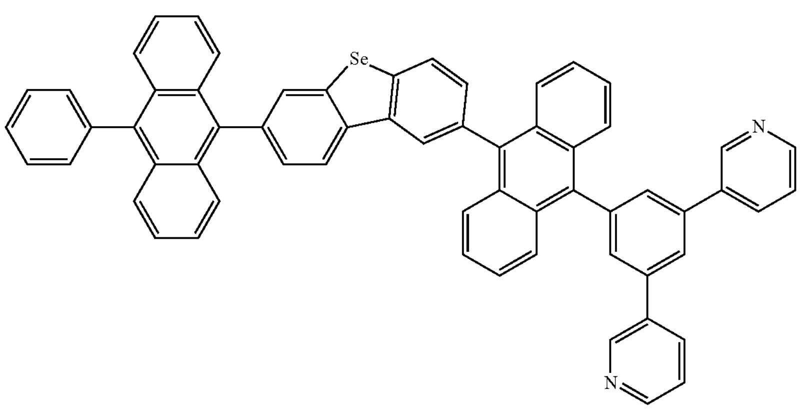
1426
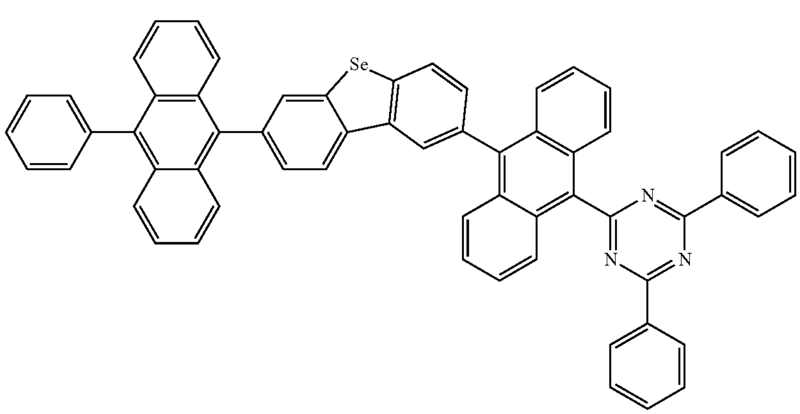

-continued
1427
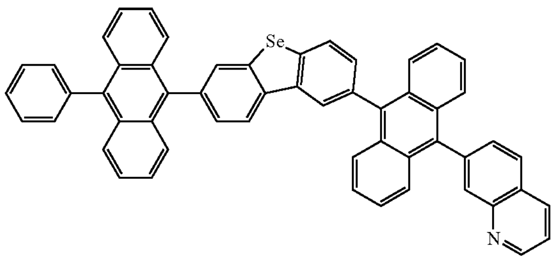
1428
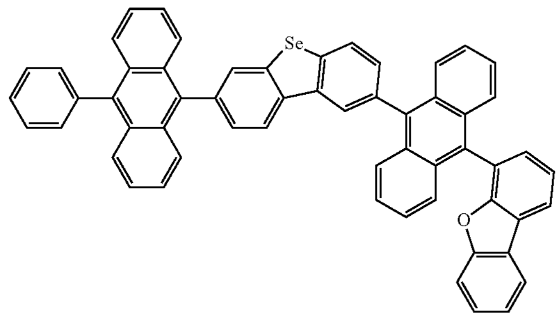
1429
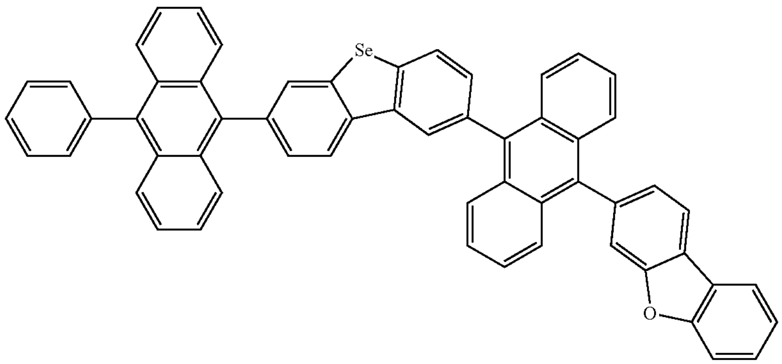
1430
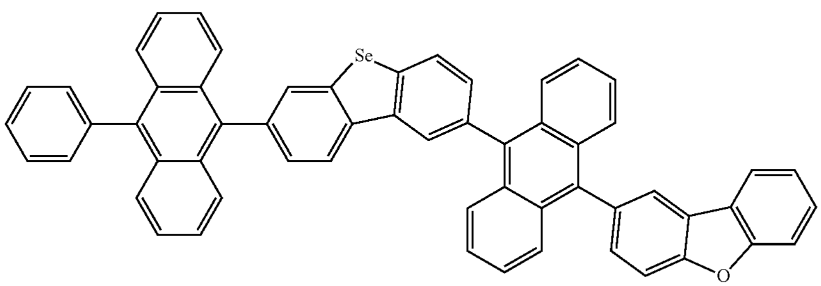
1431
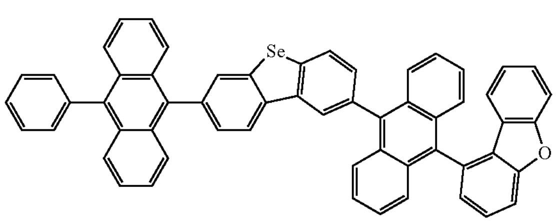
1432
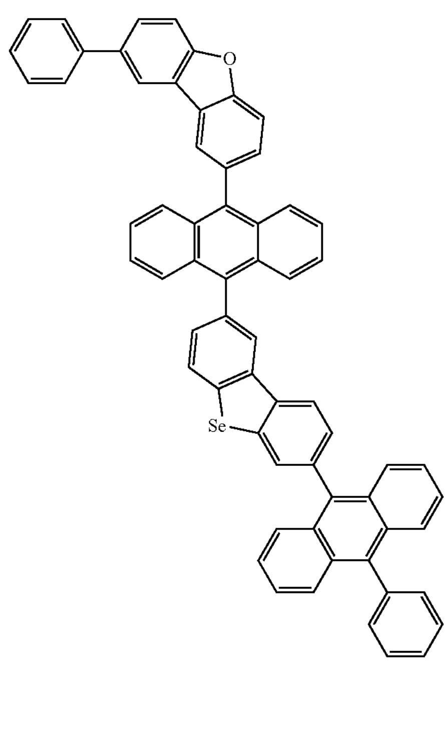

-continued
1433
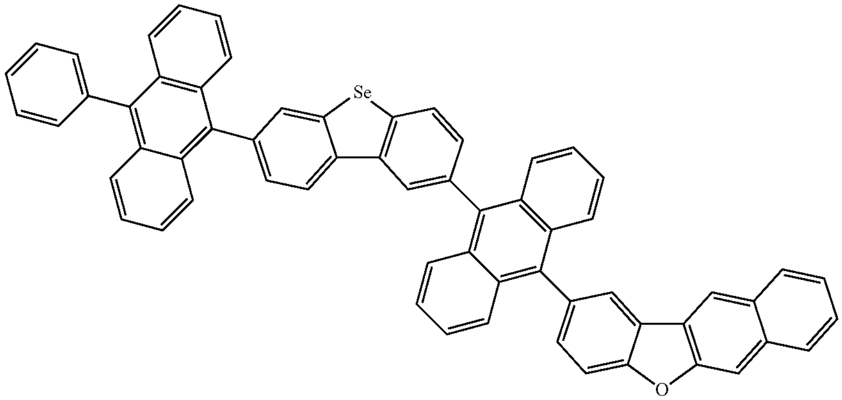
1434
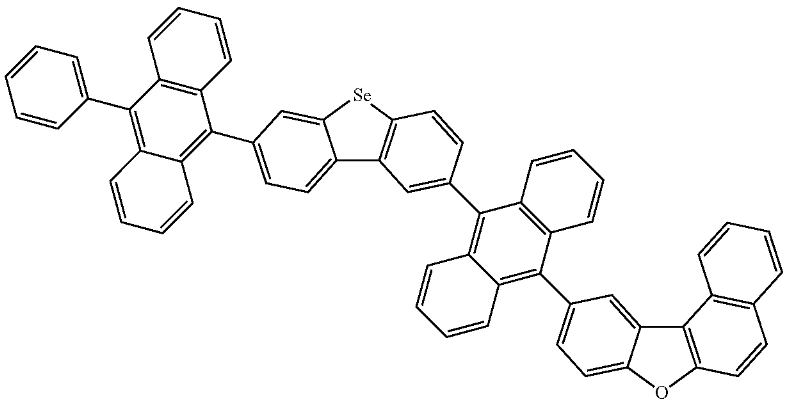
1435
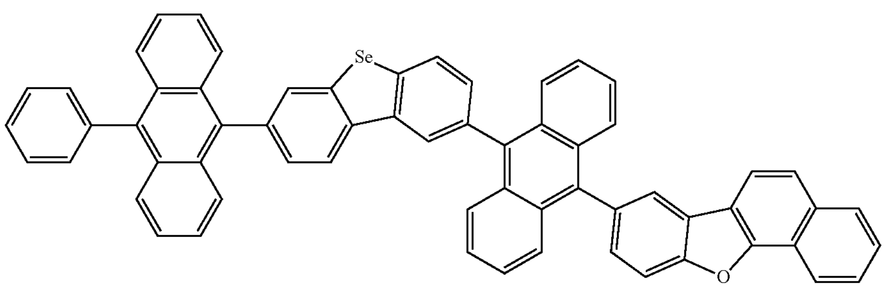
1436
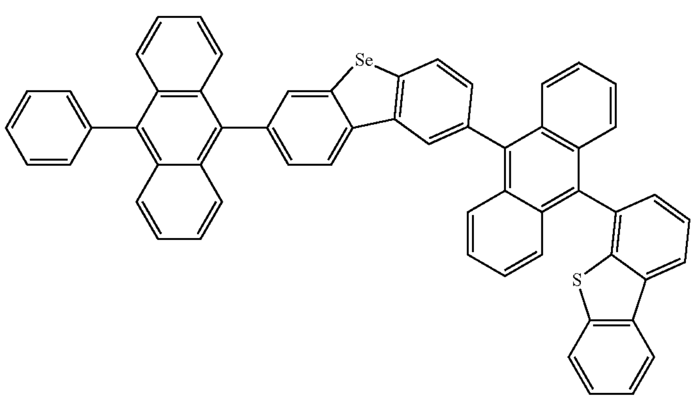

-continued
1437
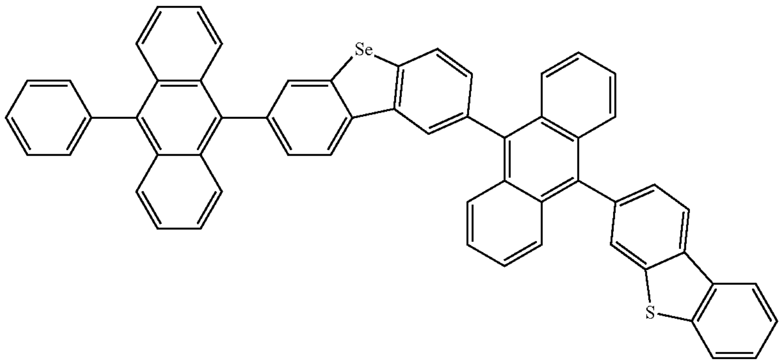
1438
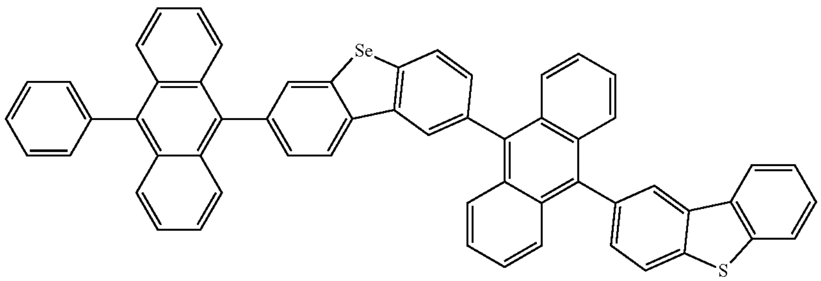
1439
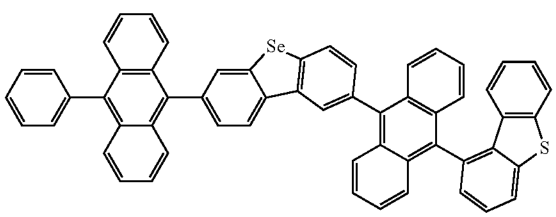
1440
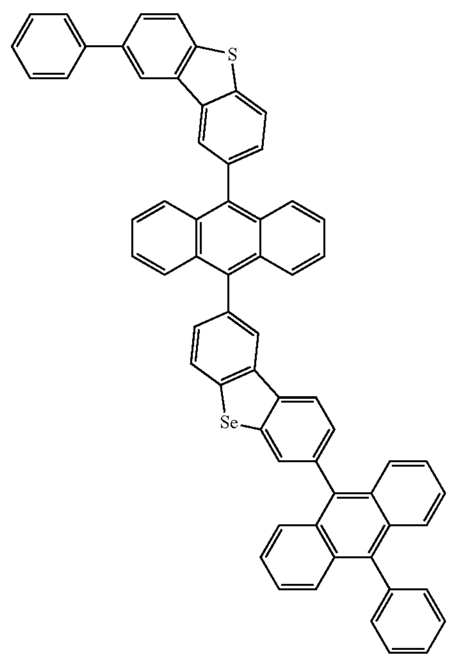
1441
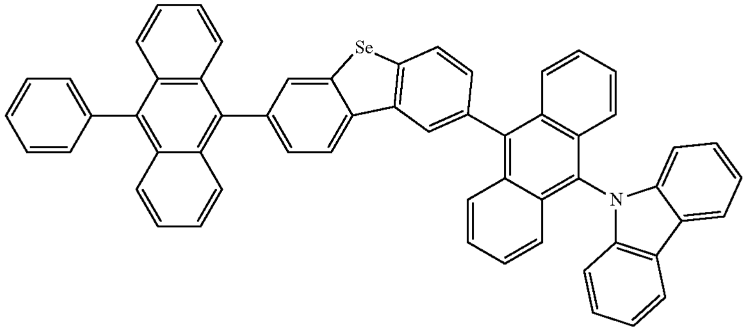

-continued
1442
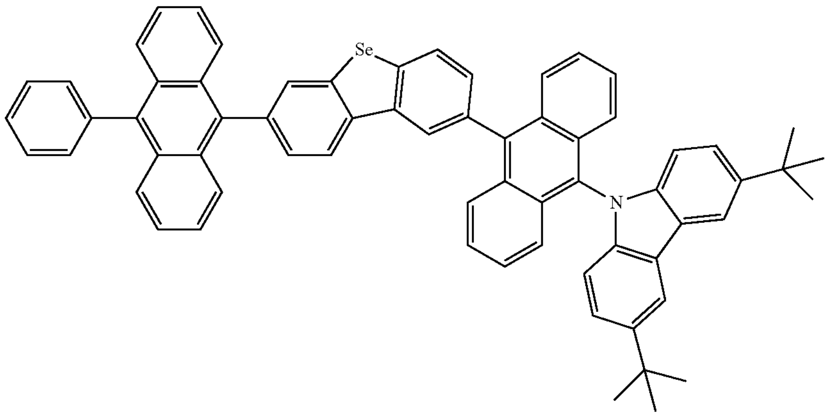
1443
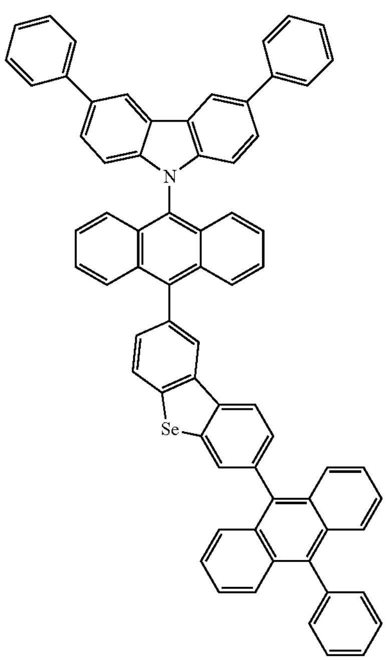
1444
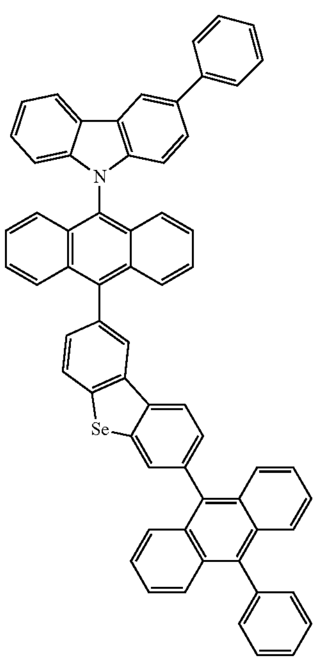

-continued
1445
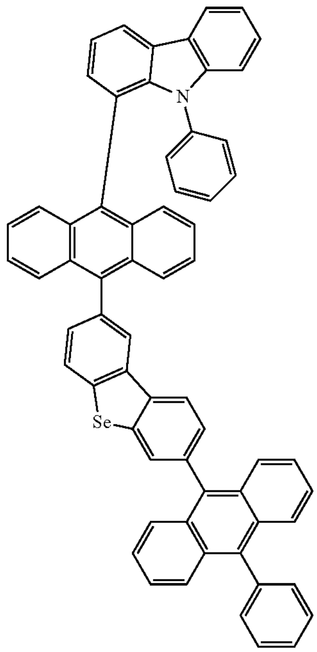
1446
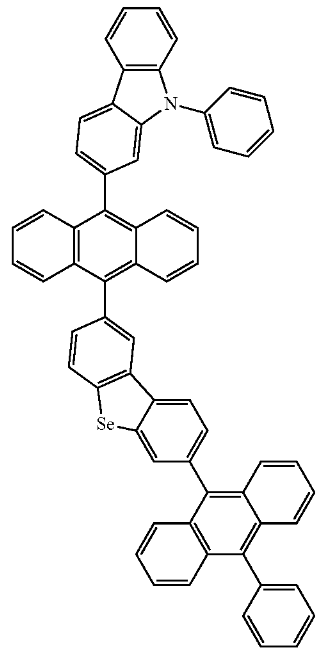
1447
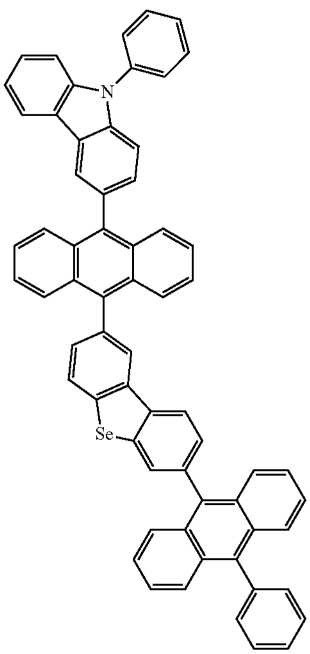
1448
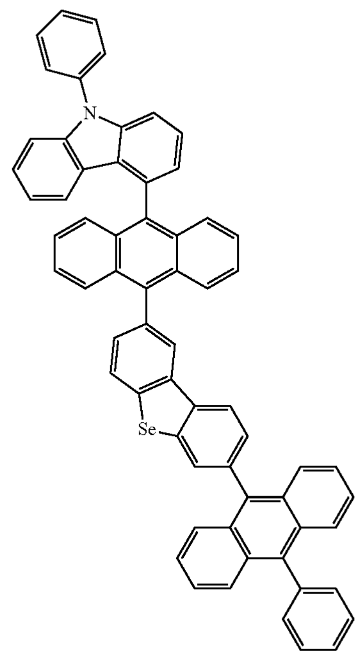
1449
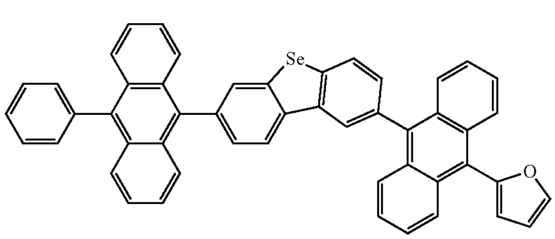
1450
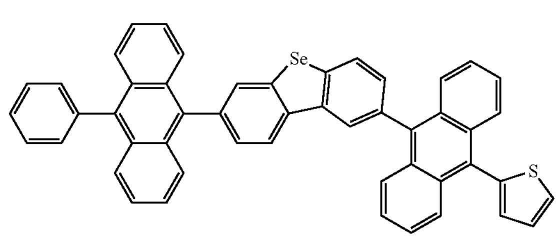

-continued
1451
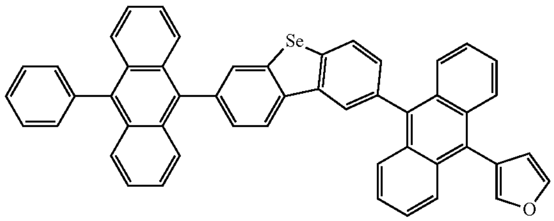
1452
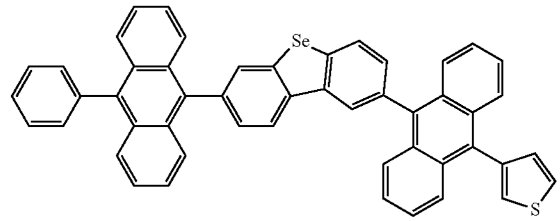
1453
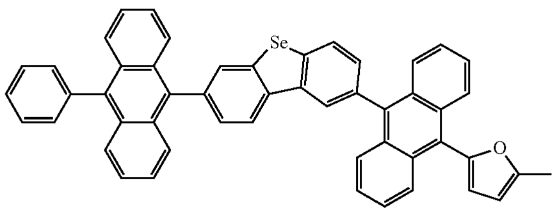
1454
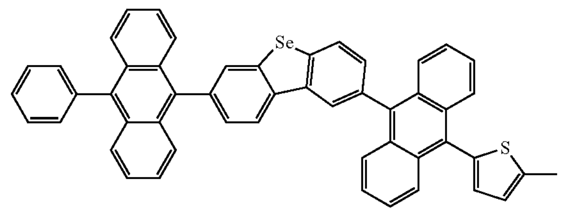
1455
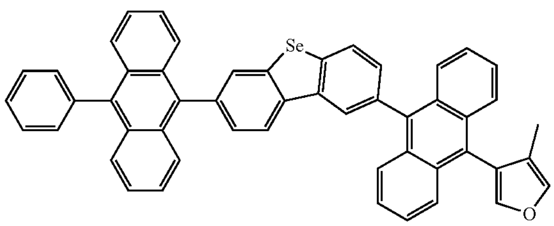
1456
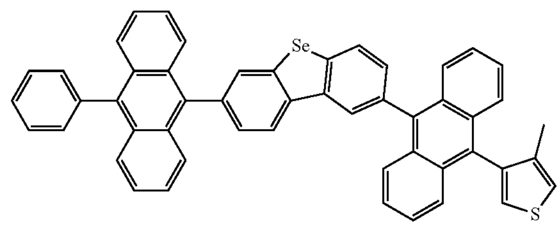
1457
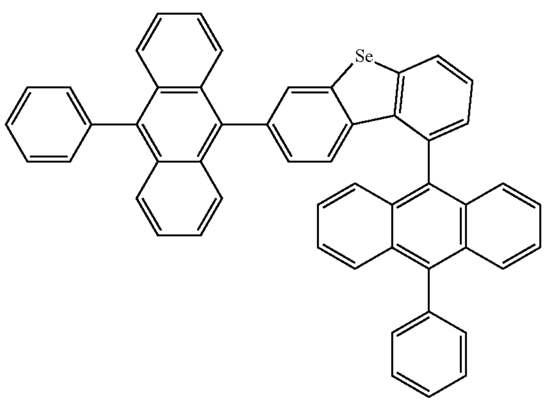
1458
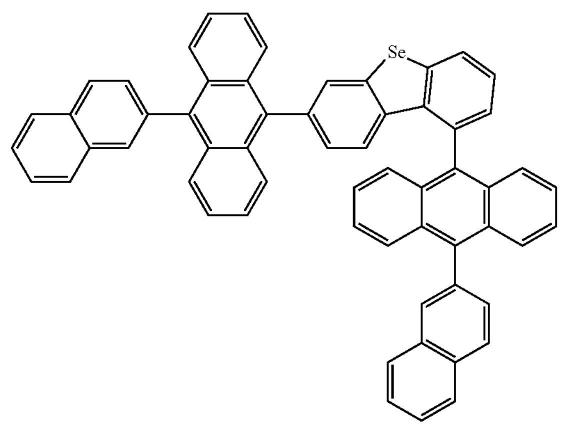
1459
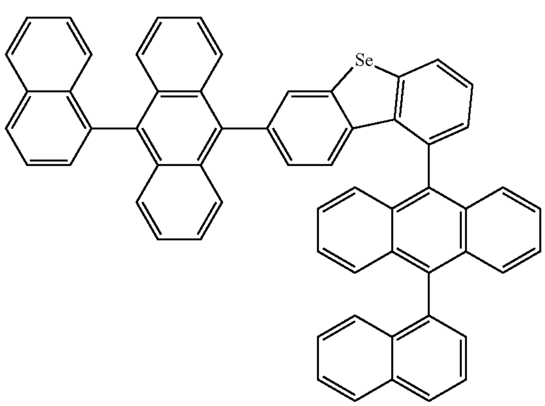
1460
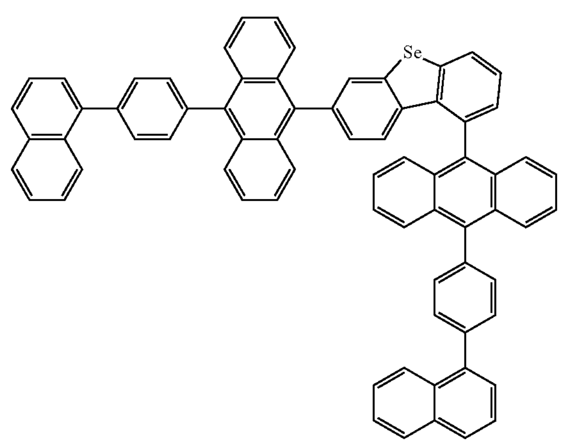

-continued
1461
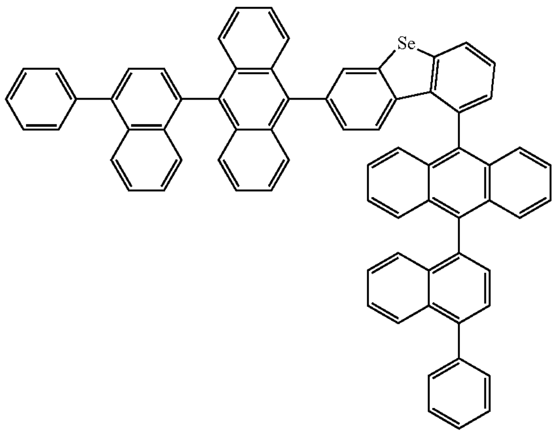
1462
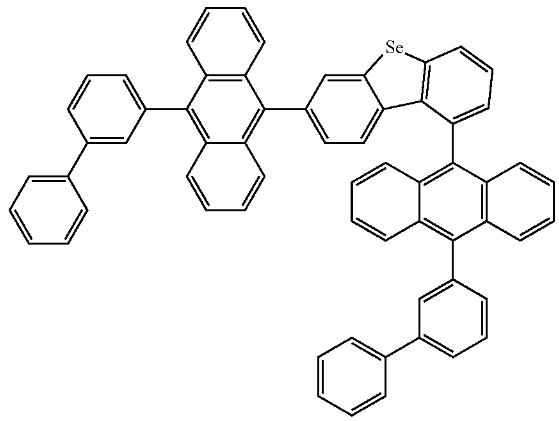
1463
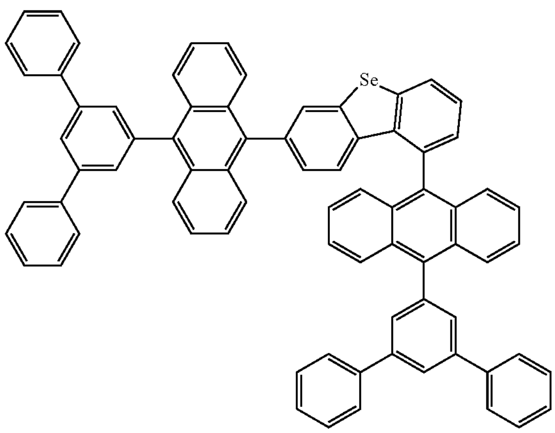
1464
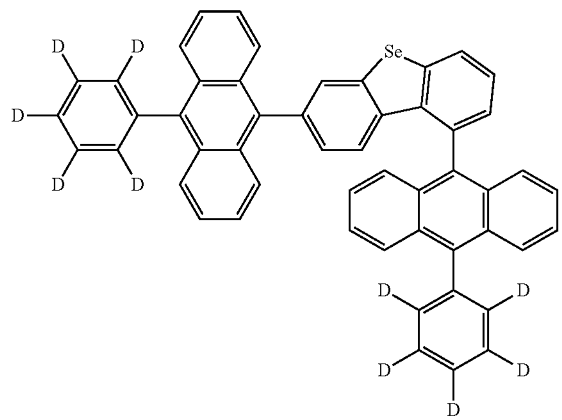
1465
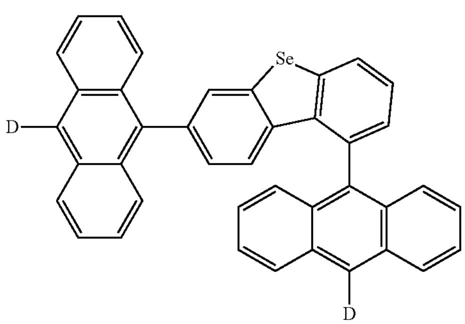
1466
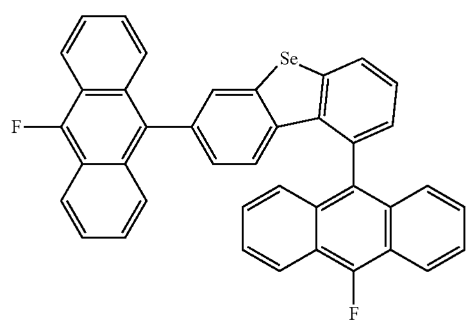
1467
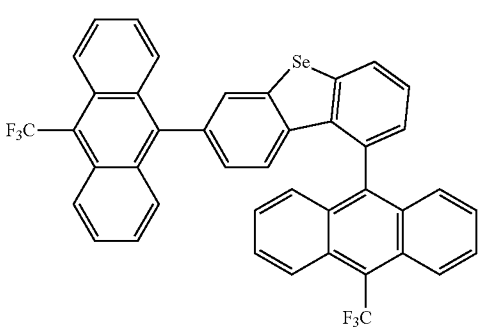
1468
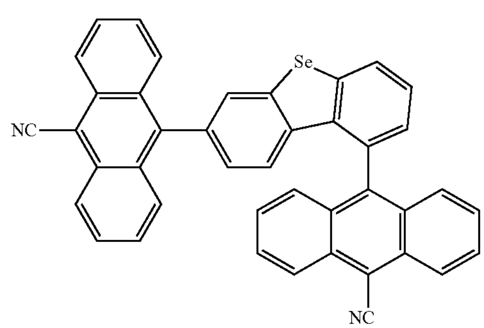

-continued
1469
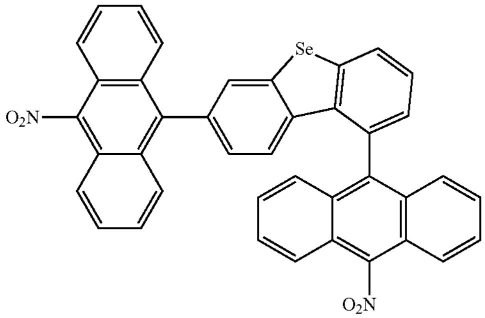
1470
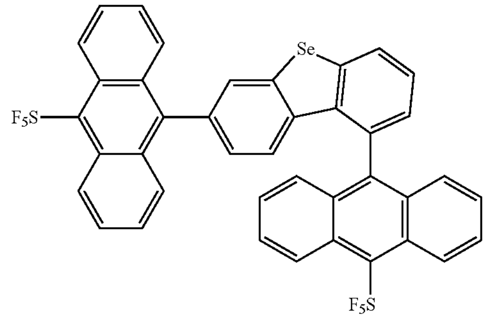
1471
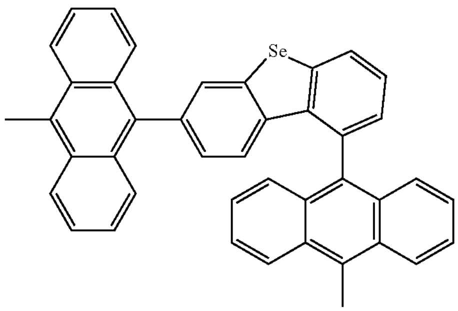
1472
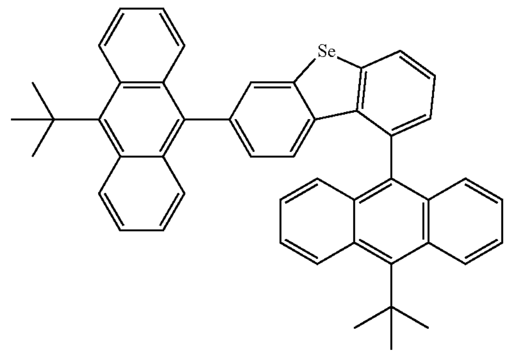
1473
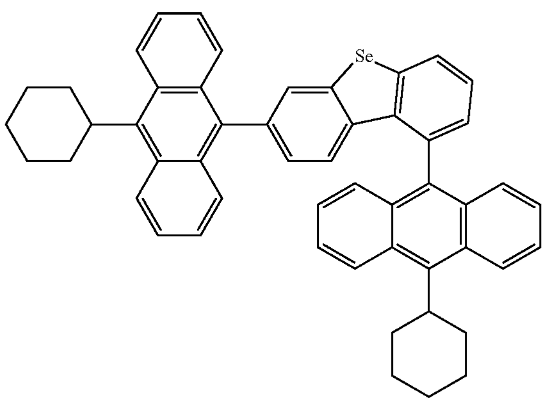
1474
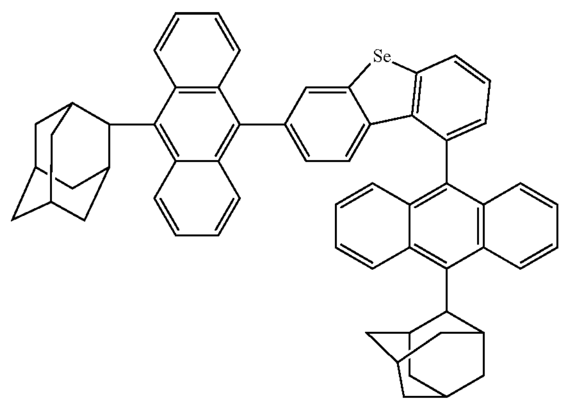
1475
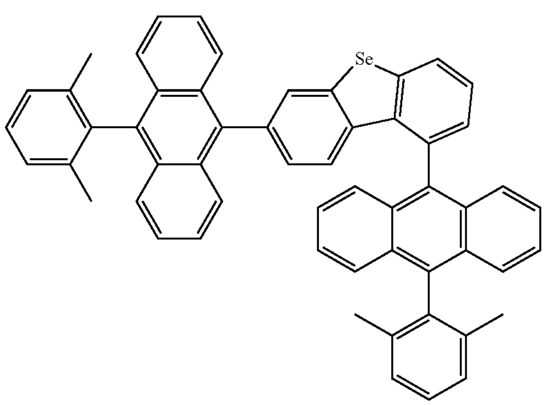
1476
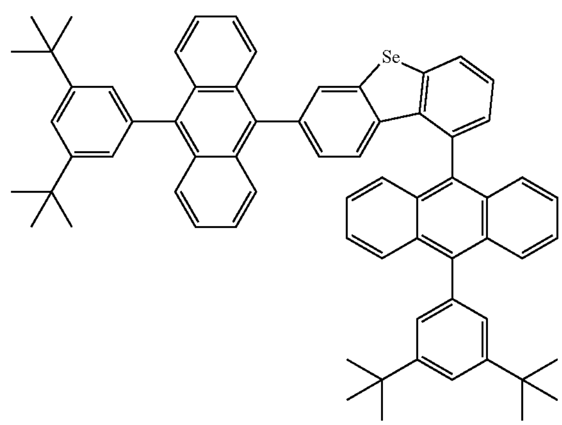

-continued
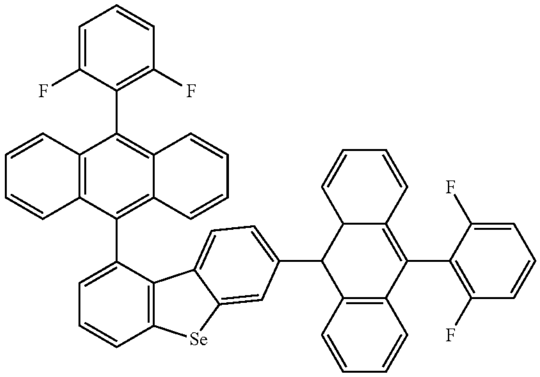
1477
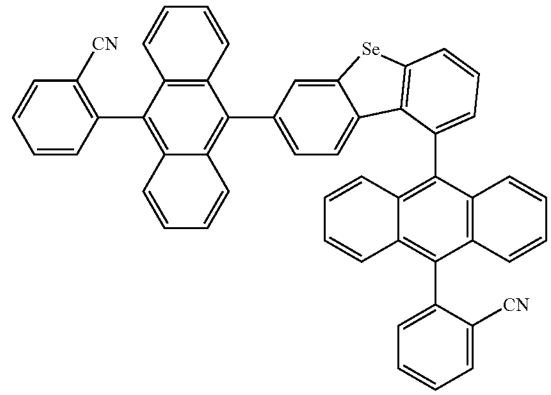
1478
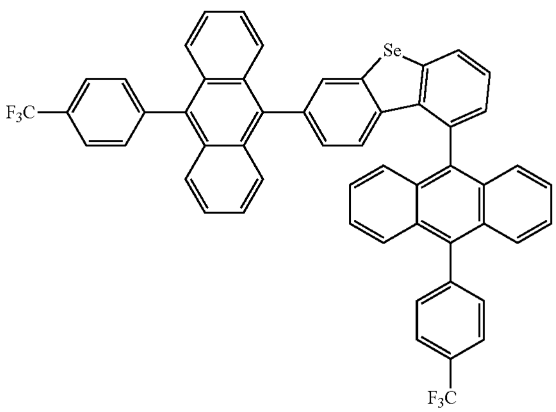
1479
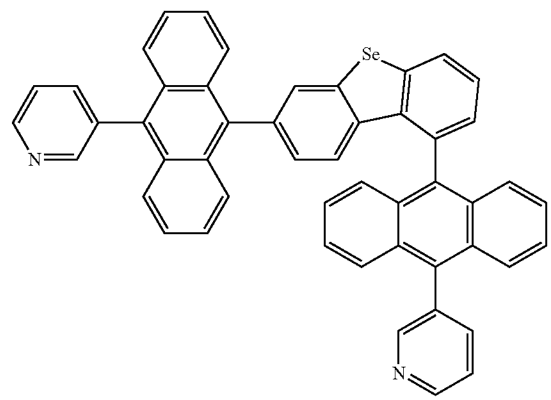
1480
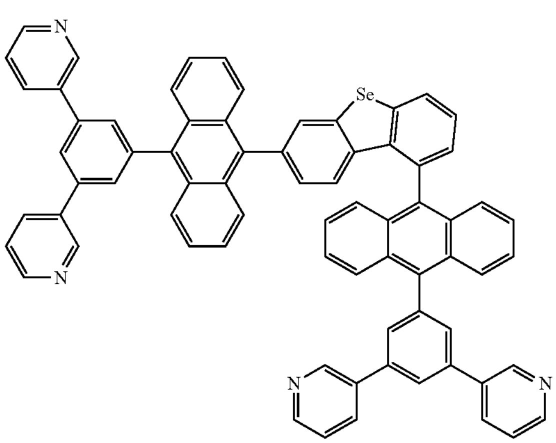
1481
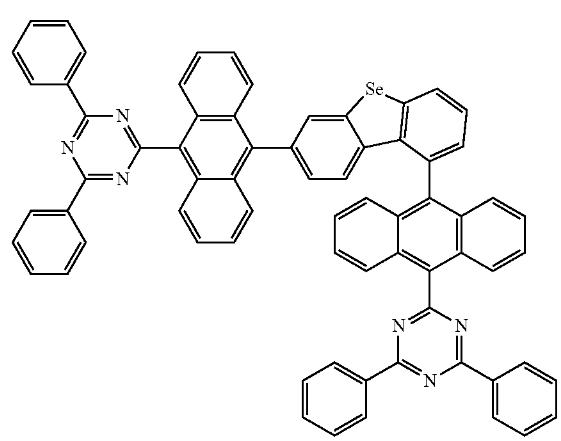
1482

-continued
1483
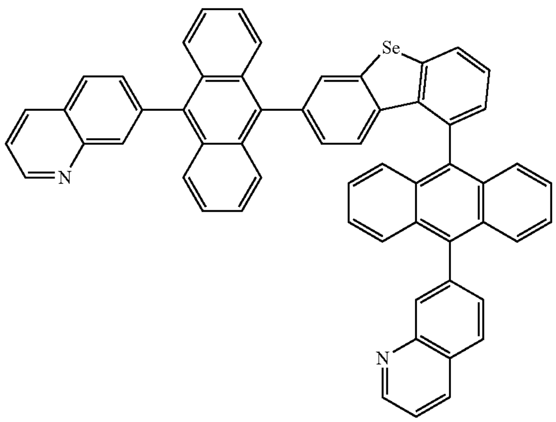
1484
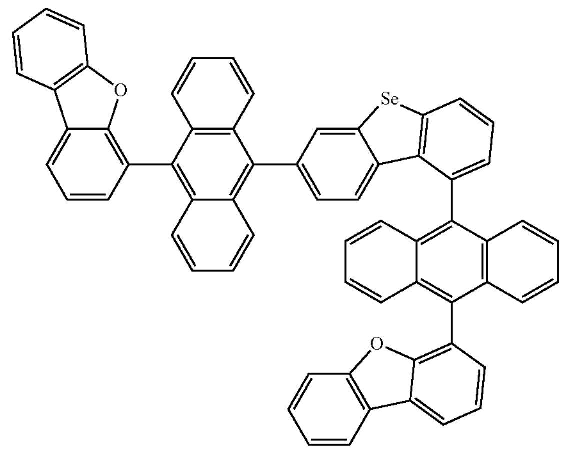
1485
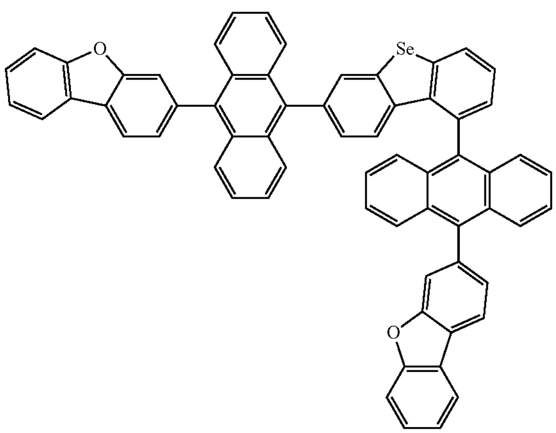
1486
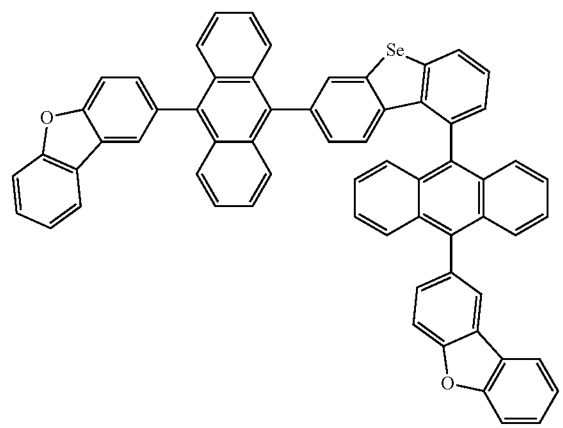
1487
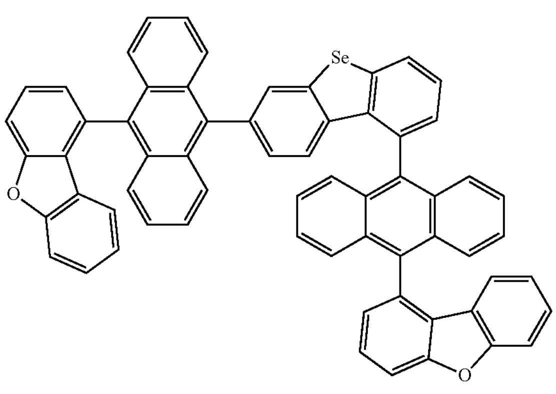
1488
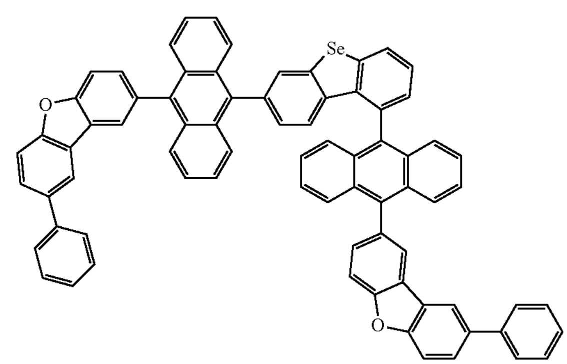

-continued
1489
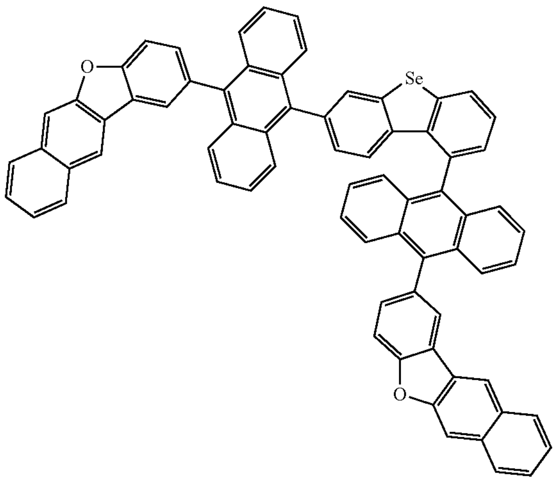
1490
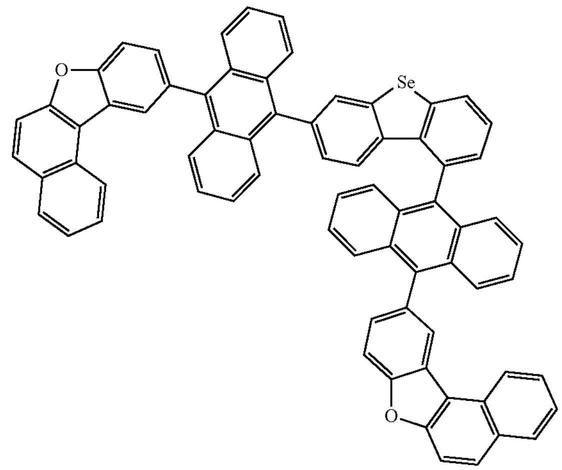
1491
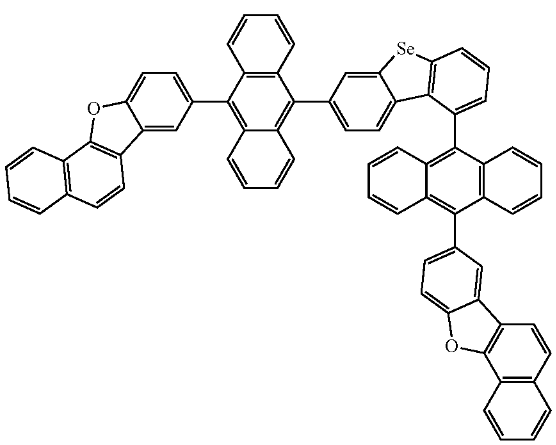
1492
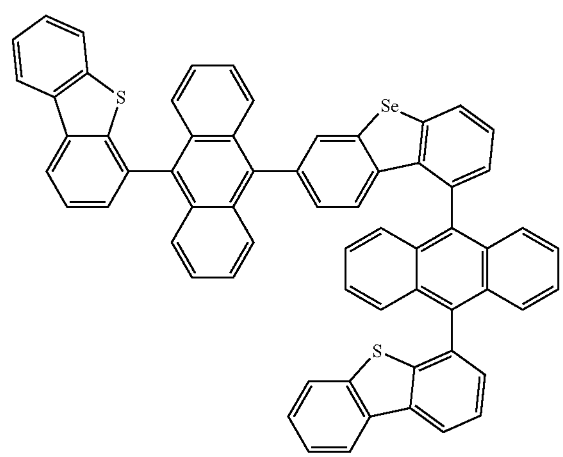
1493
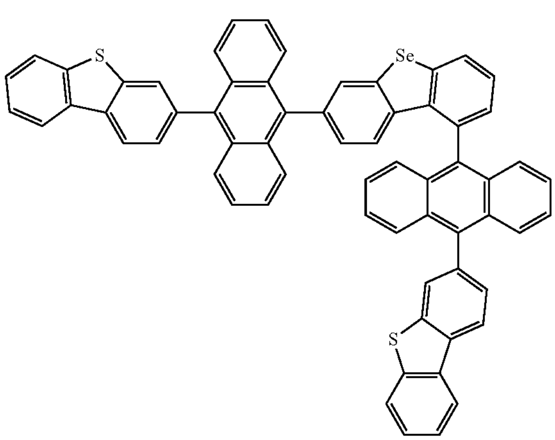
1494
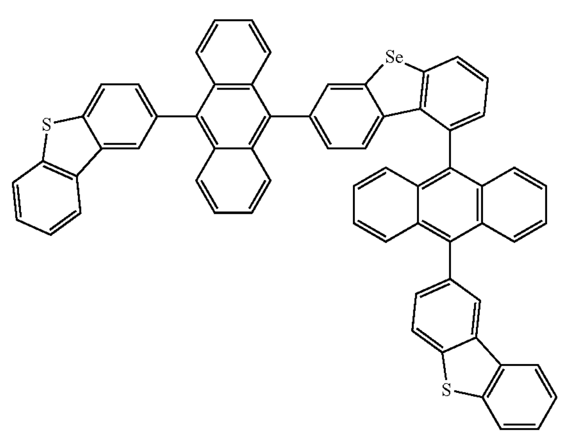

-continued
1495
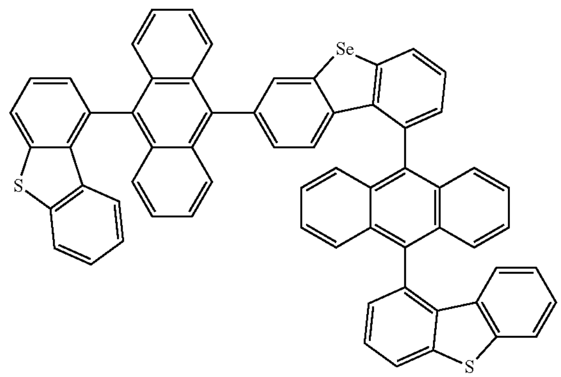
1496
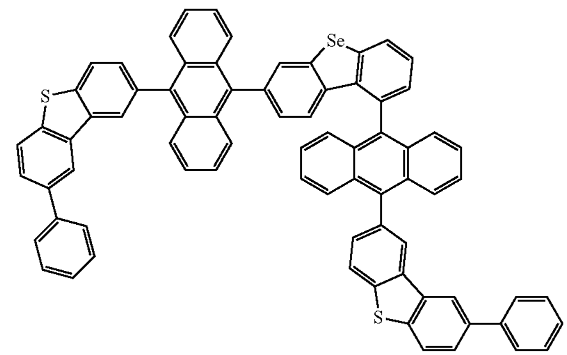
1497
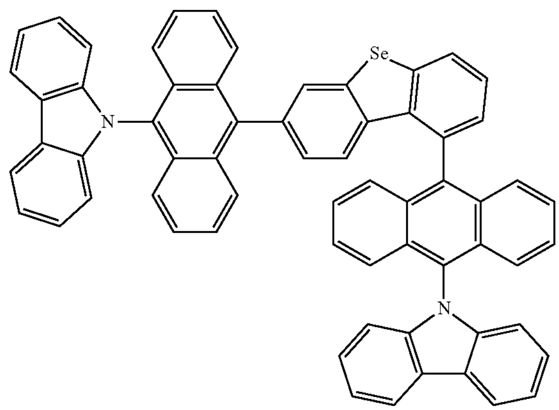
1498
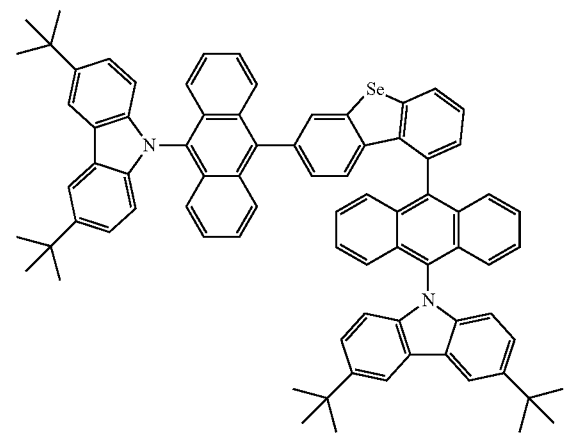
1499
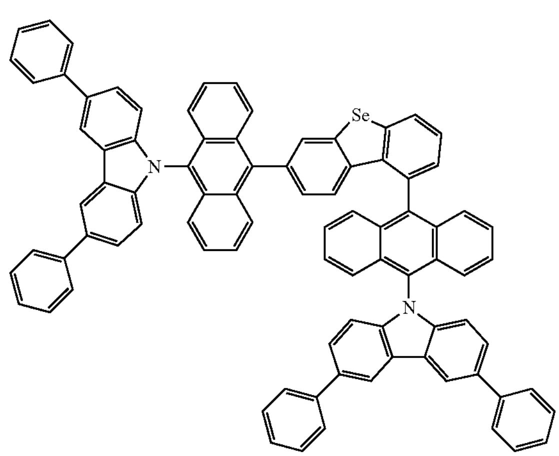
1500
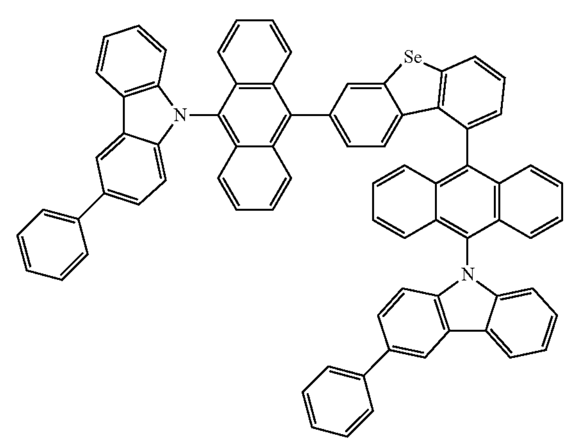

1501
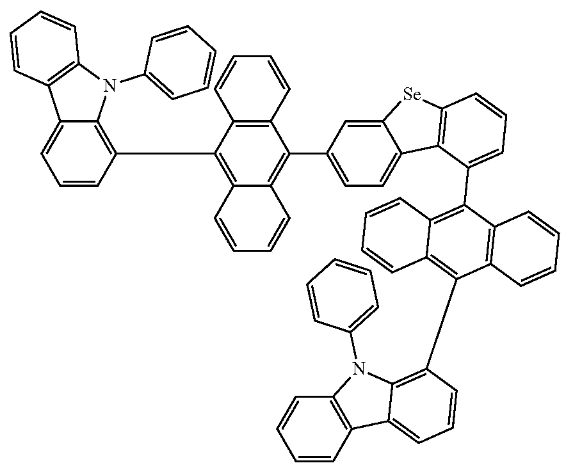
1502
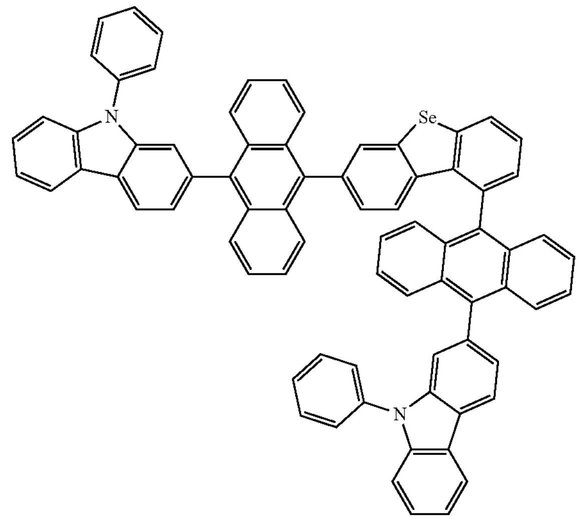
1503
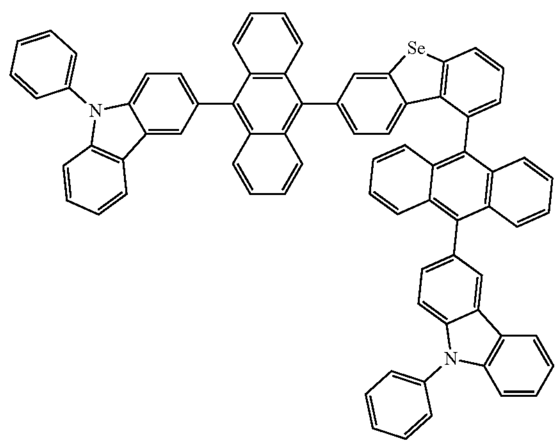
1504
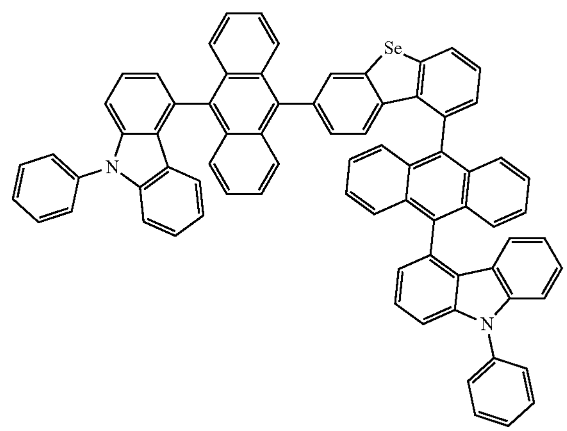
1505
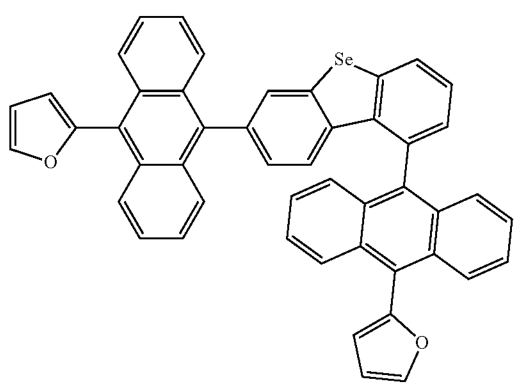
1506
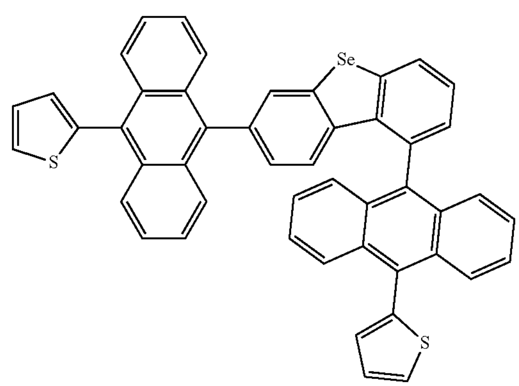

-continued
1507
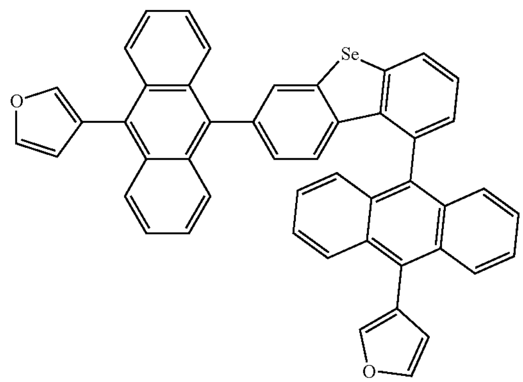
1508
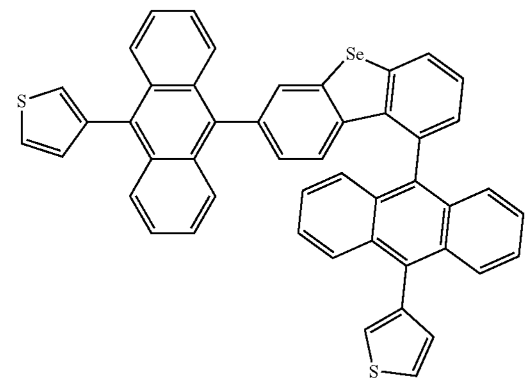
1509
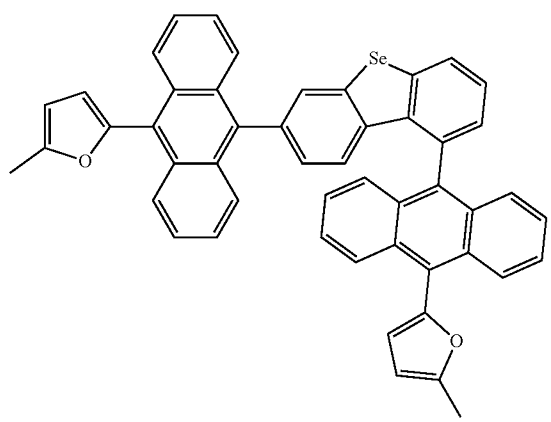
1510
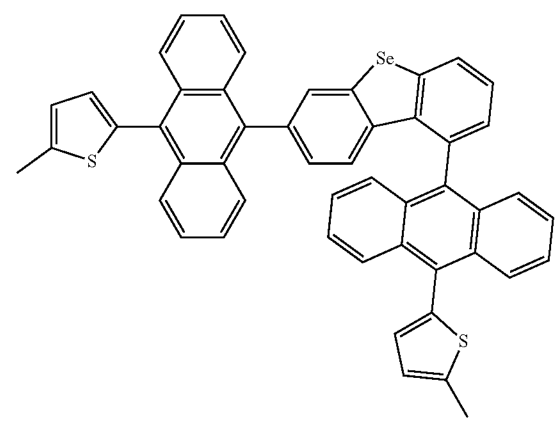
1511
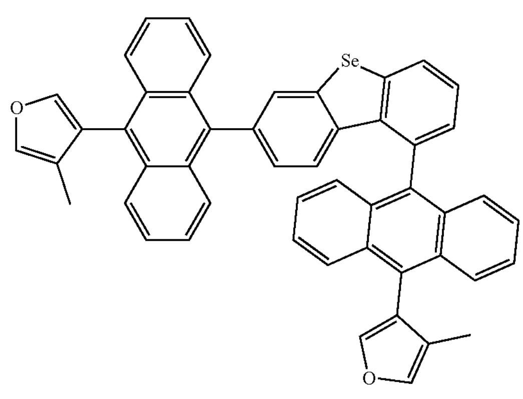
1512
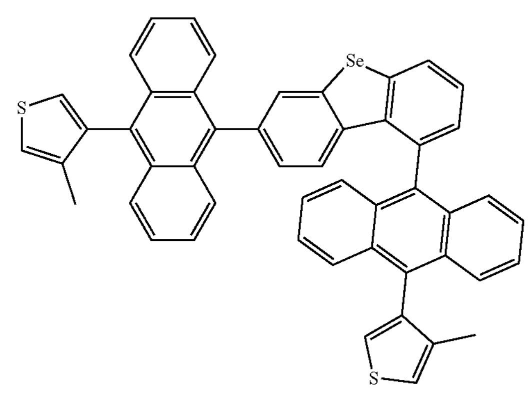

-continued
1513
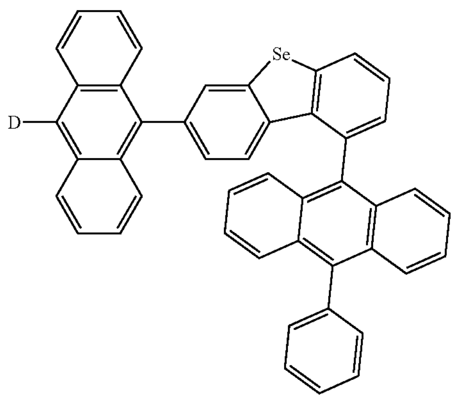
1514
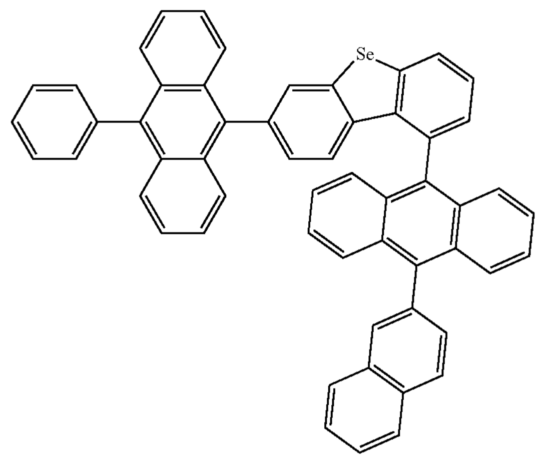
1515
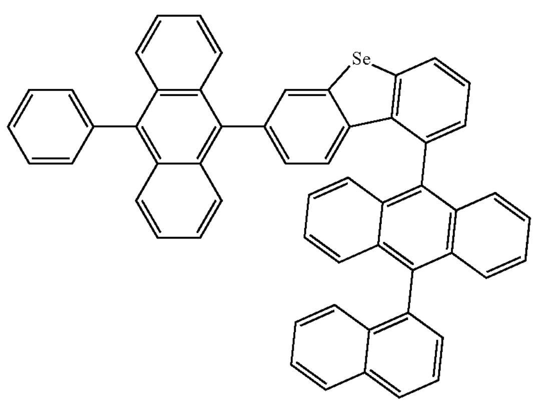
1516
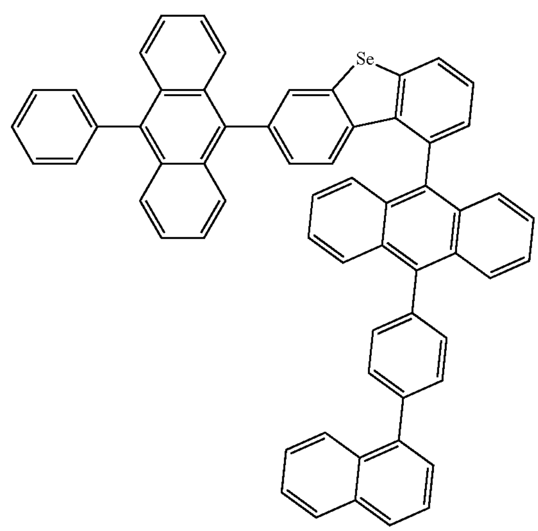
1517
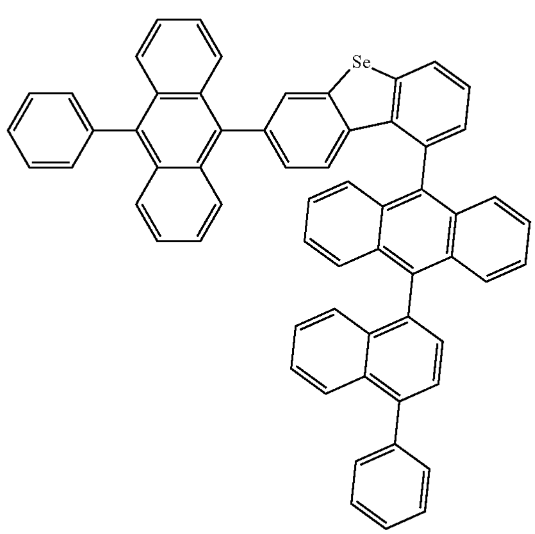
1518
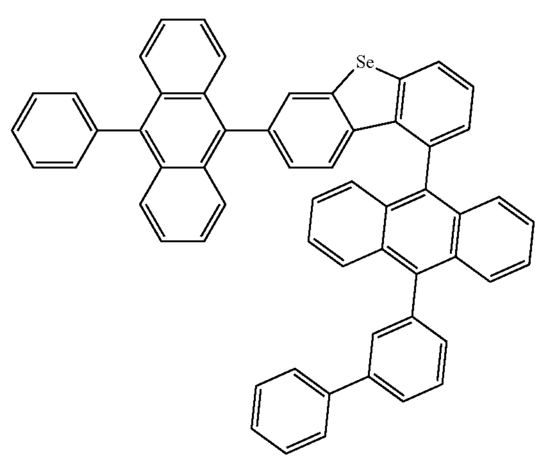

-continued
1519
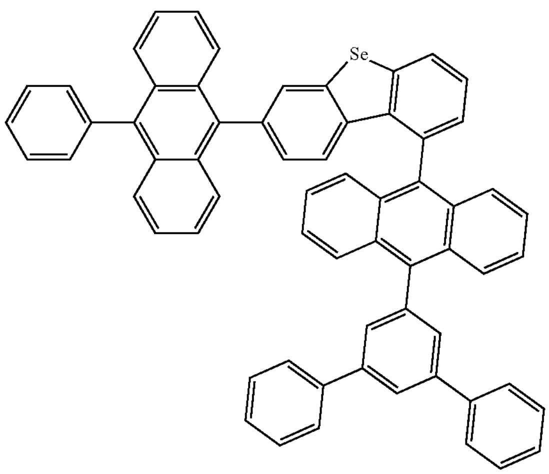
1520
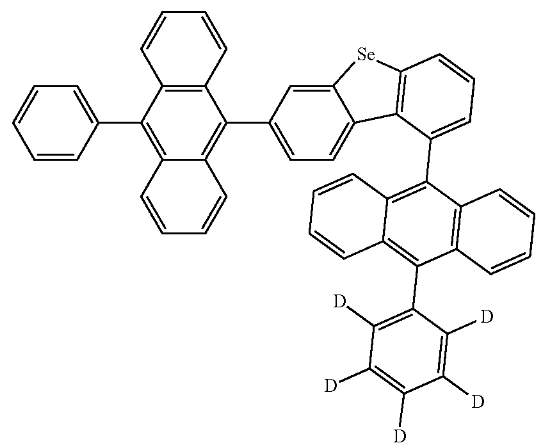
1521
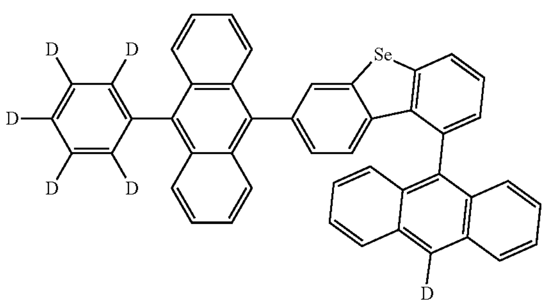
1522
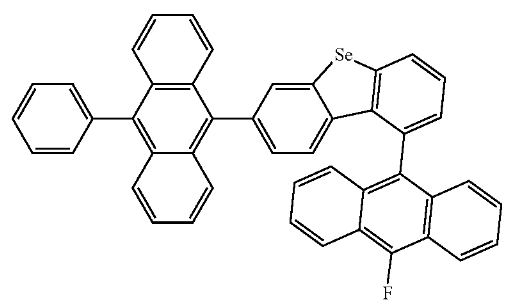
1523
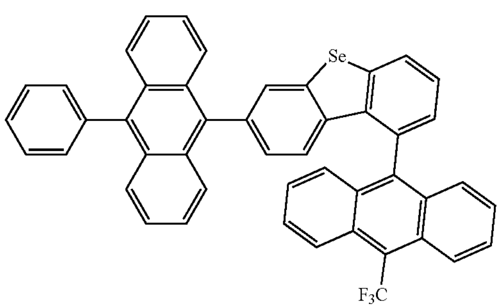
1524
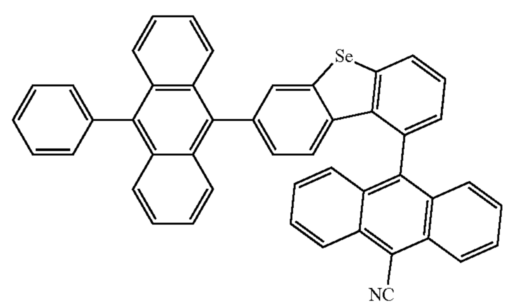
1525
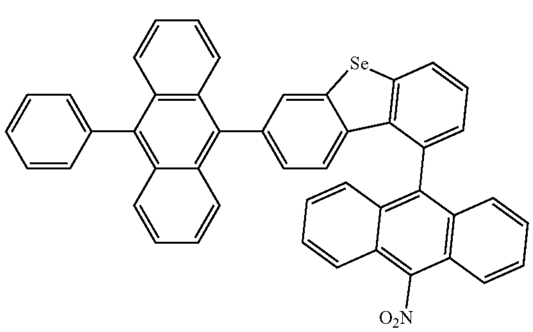
1526
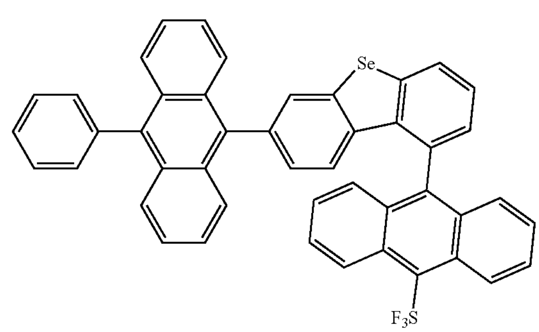

-continued
1527
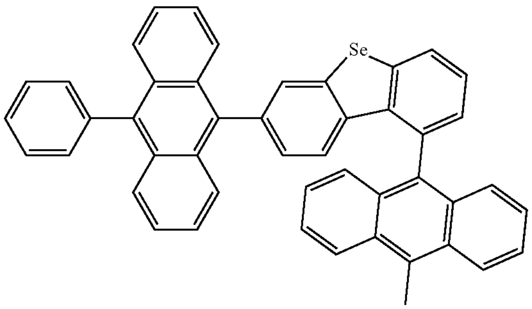
1528
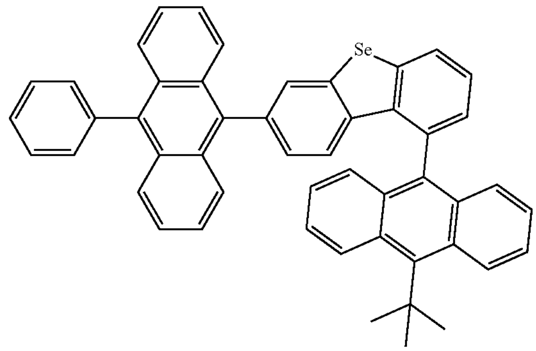
1529
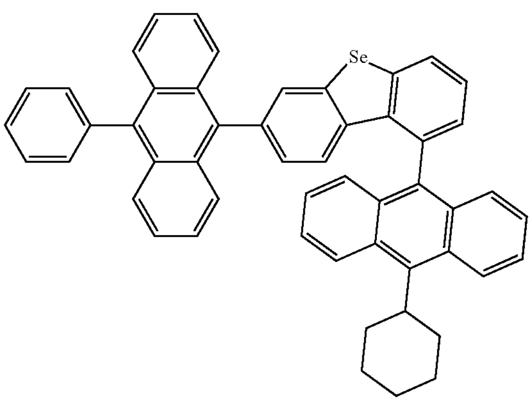
1530
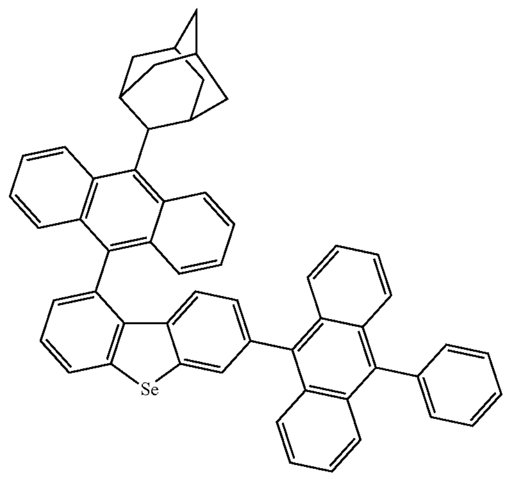
1531
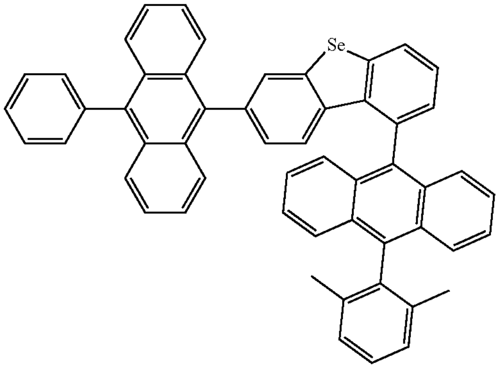
1532
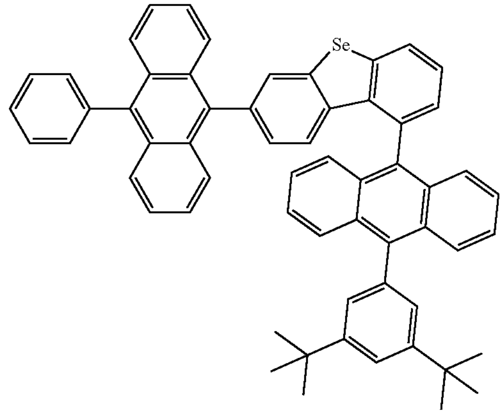

-continued
1533
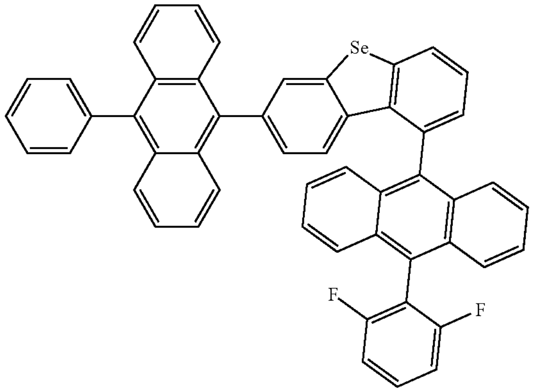
1534
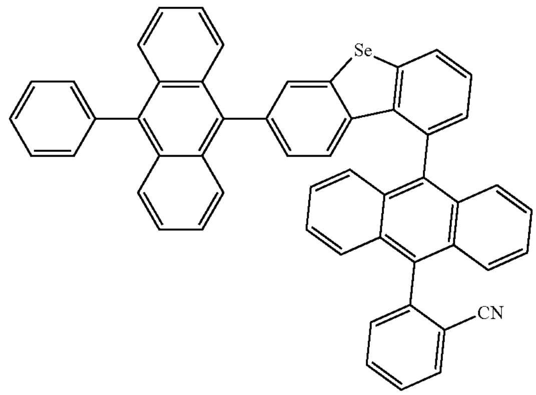
1535
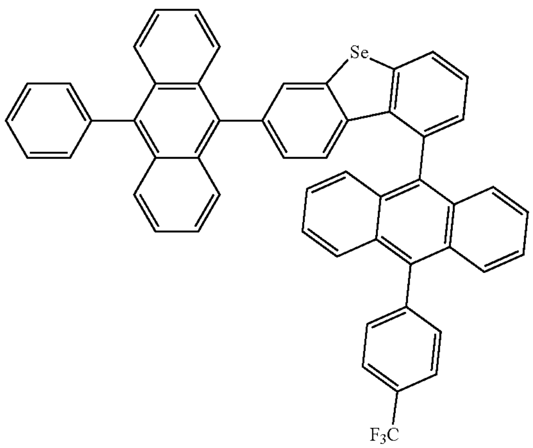
1536
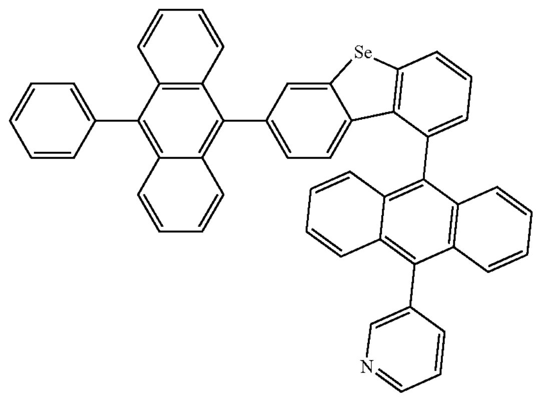
1537
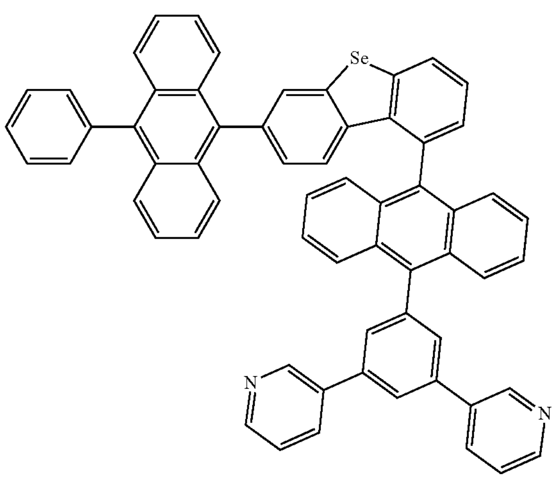
1538
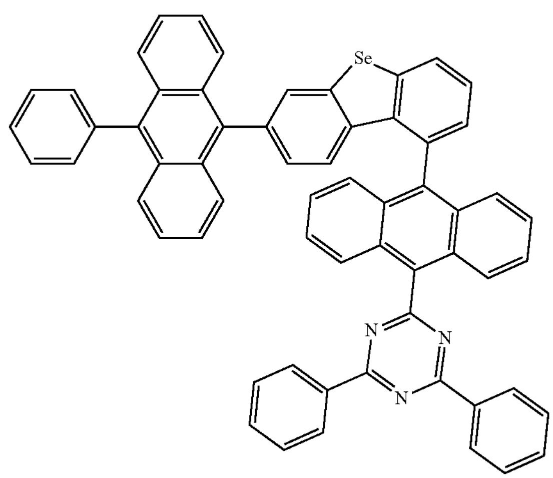

-continued
1539
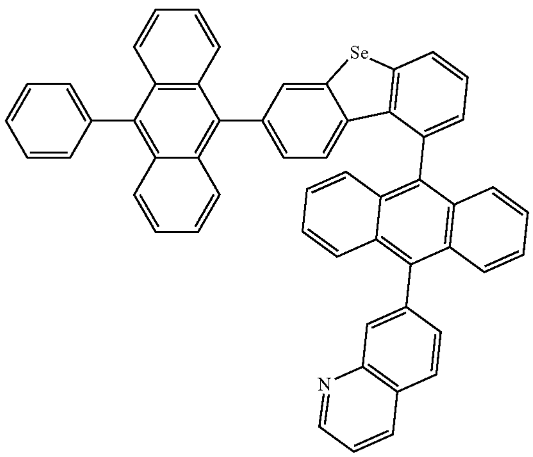
1540
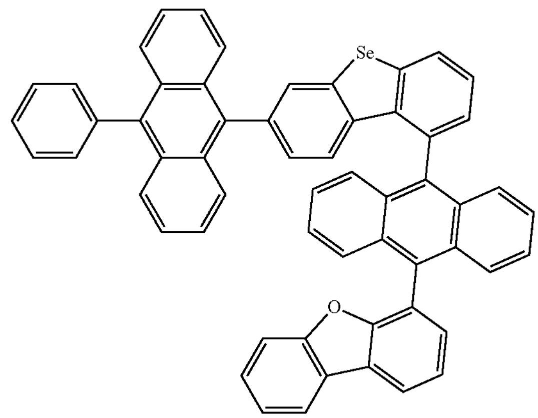
1541
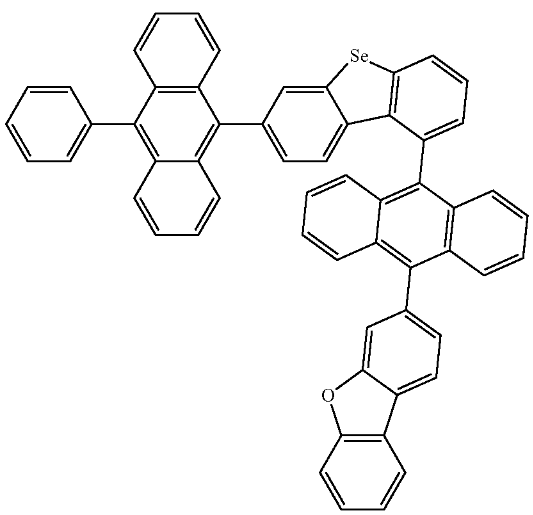
1542
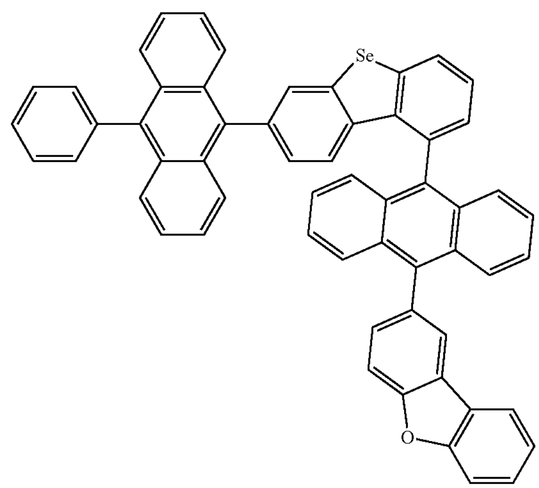
1543
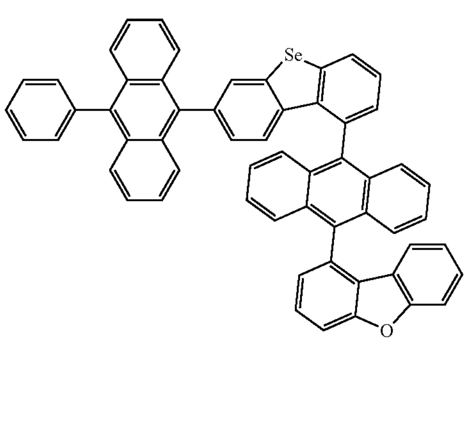
1544
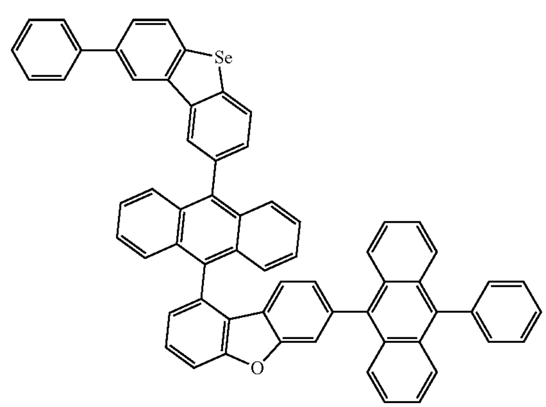

-continued
1545
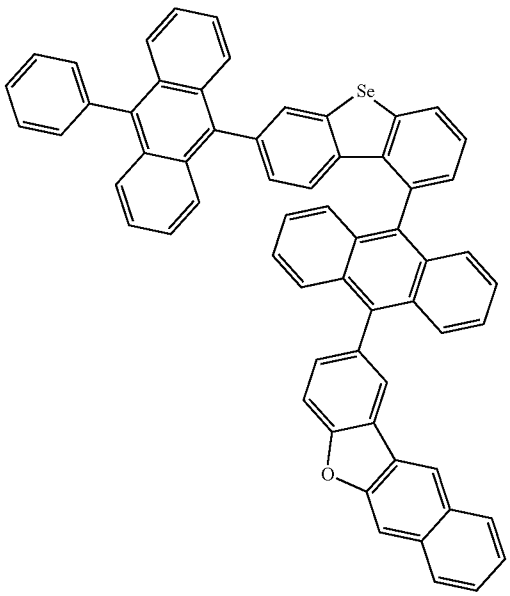
1546
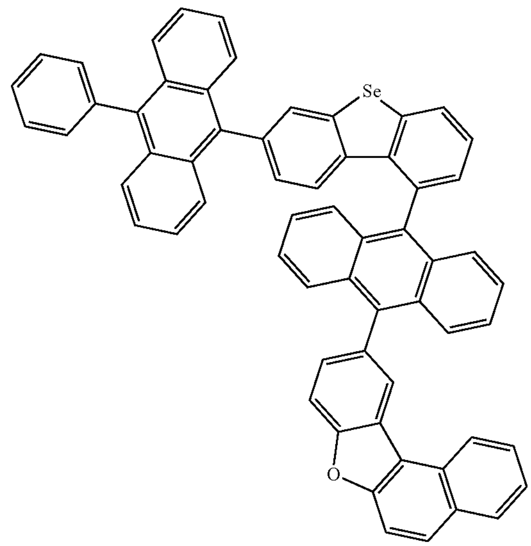
1547
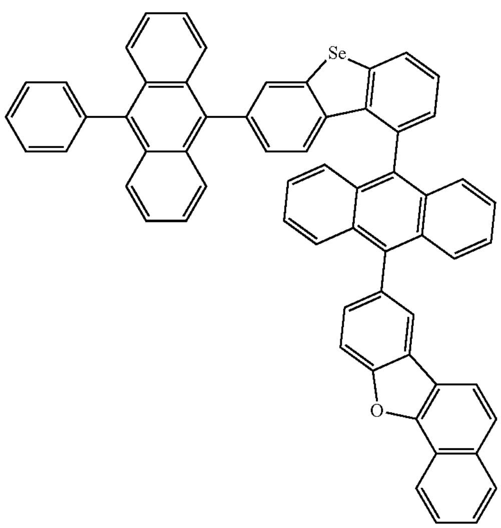
1548
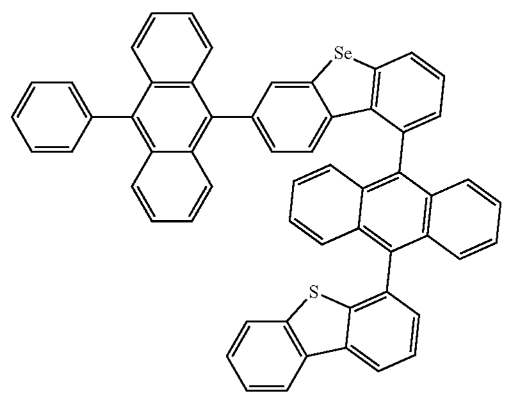
1549
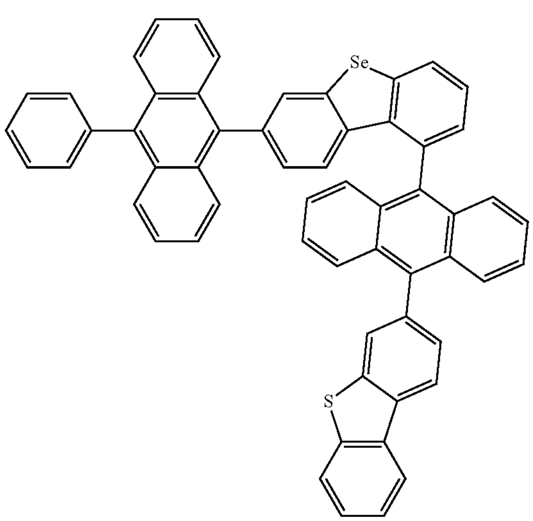
1550
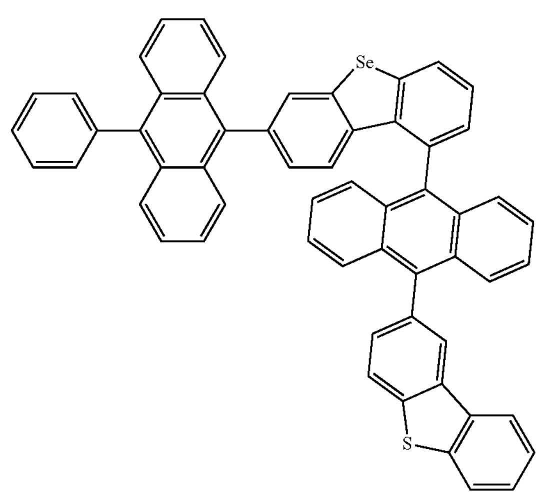

-continued
1551
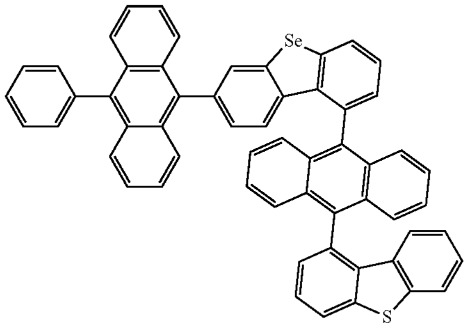
1552
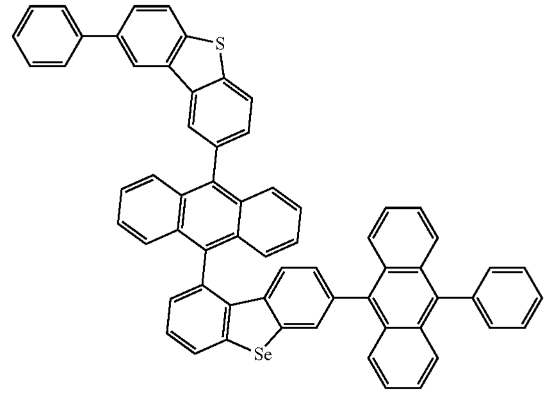
1553
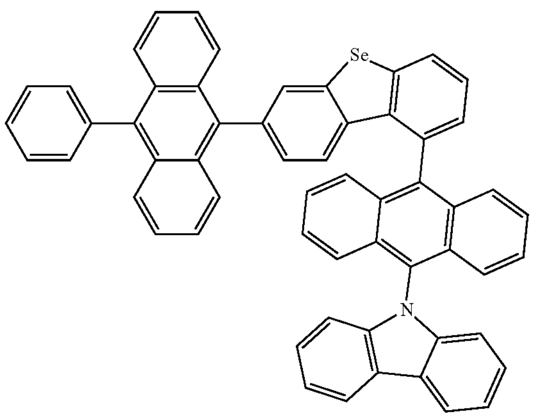
1554
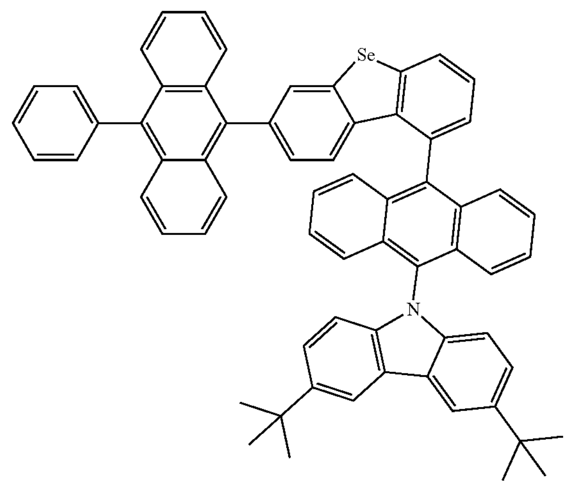
1555
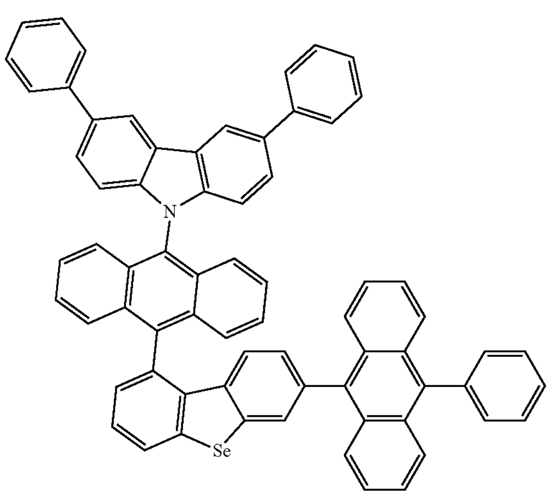
1556
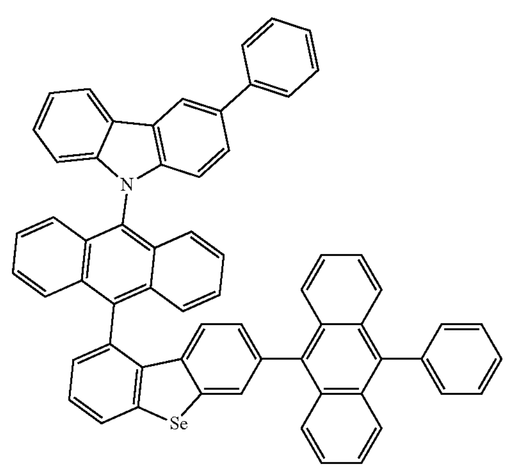

-continued
1557
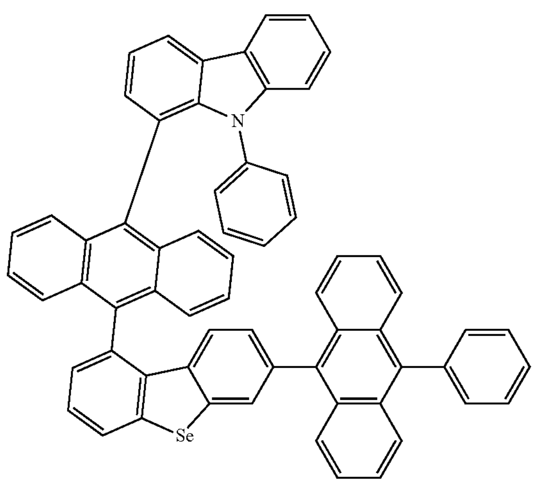
1558
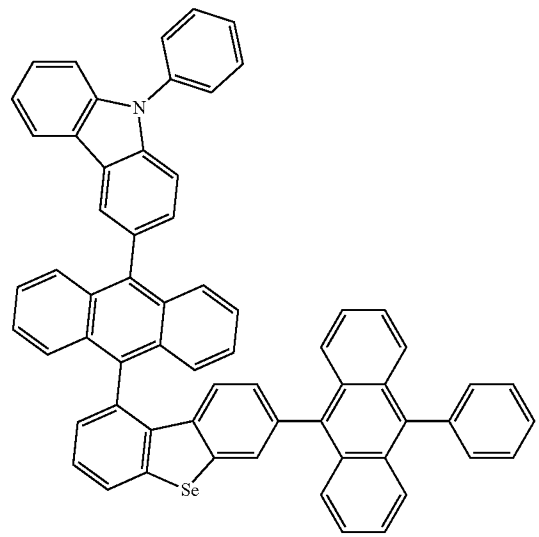
1559
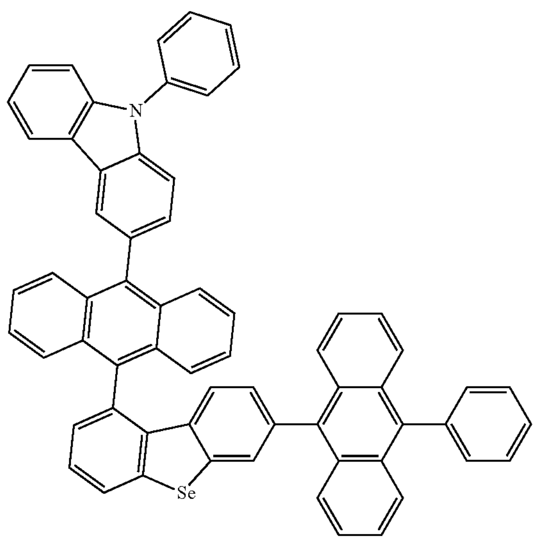
1560
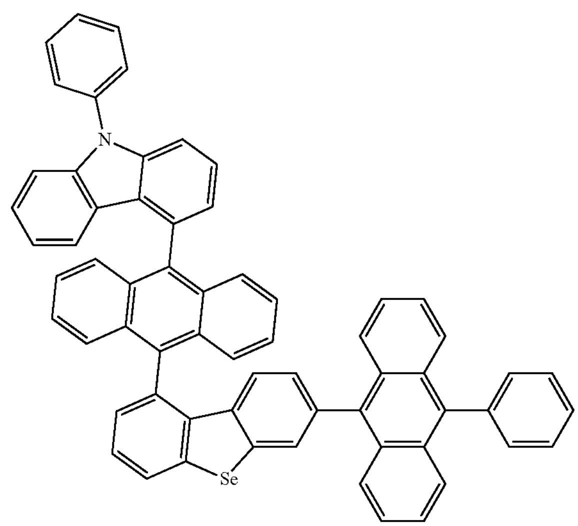
1561
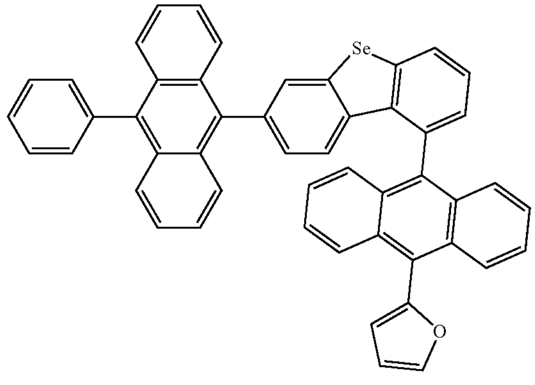
1562
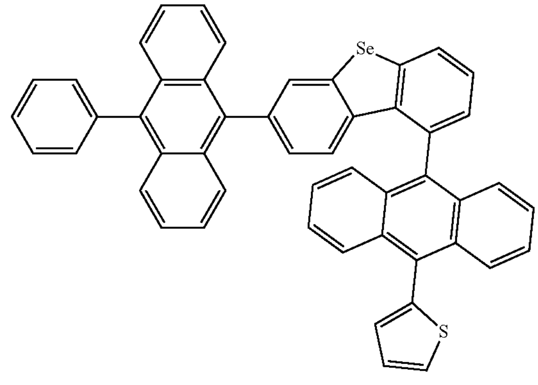

-continued
1563
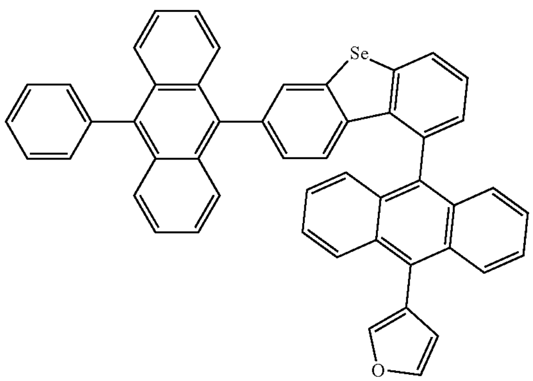
1564
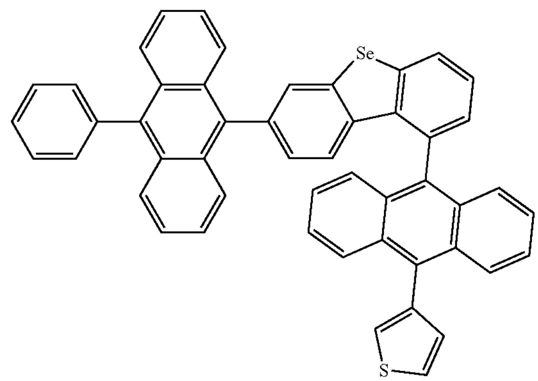
1565
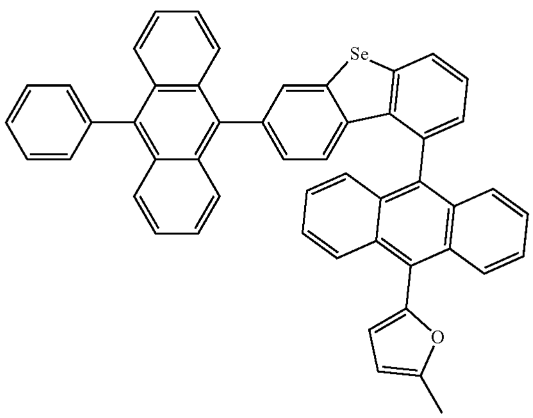
1566
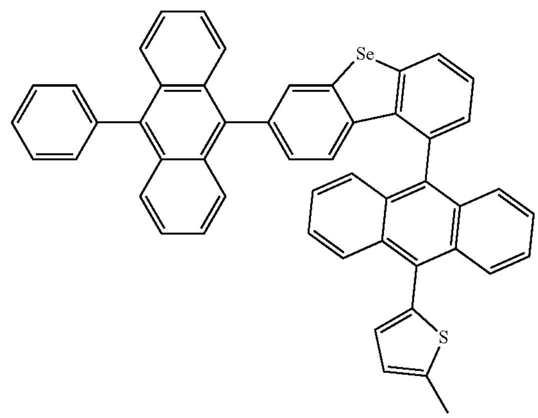
1567
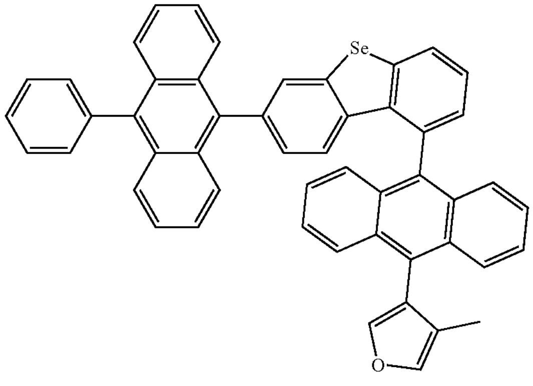
1568
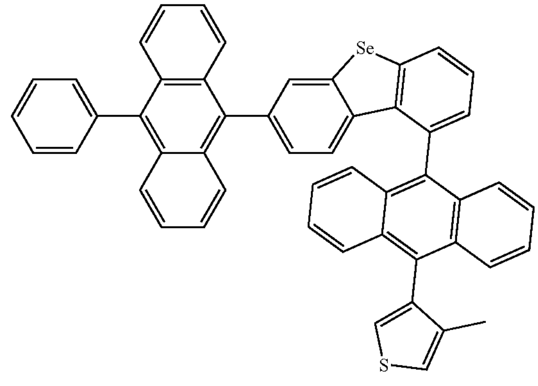

-continued
1569
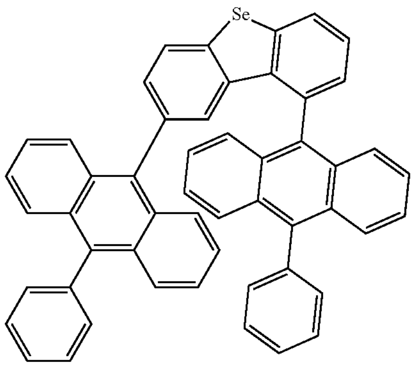
1570
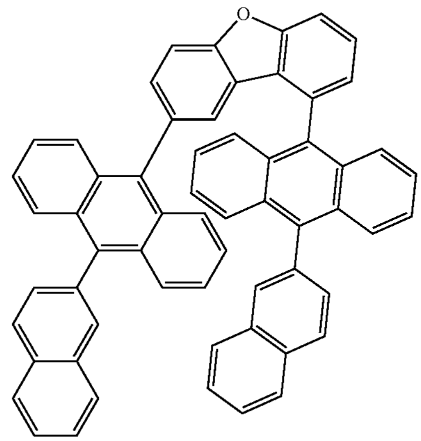
1571
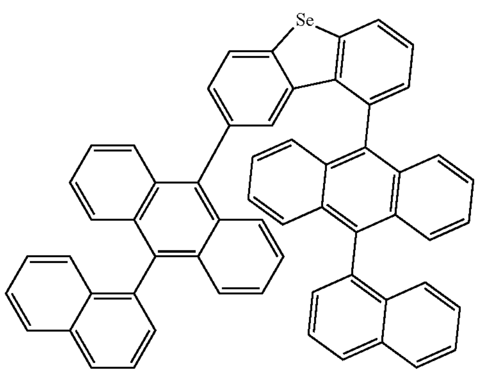
1572
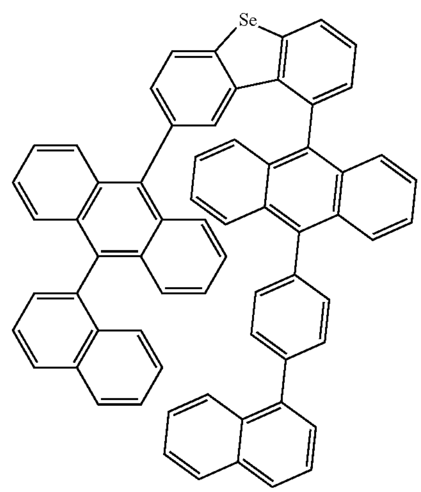
1573
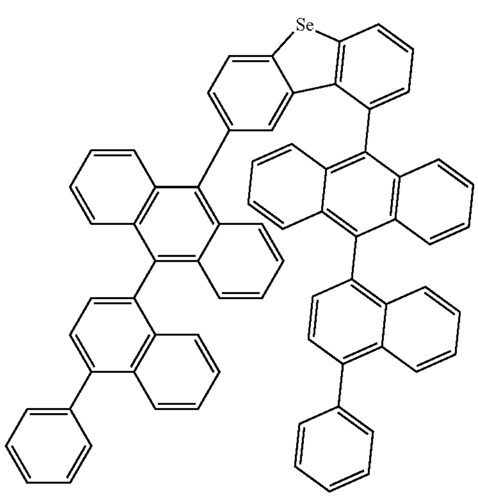
1574
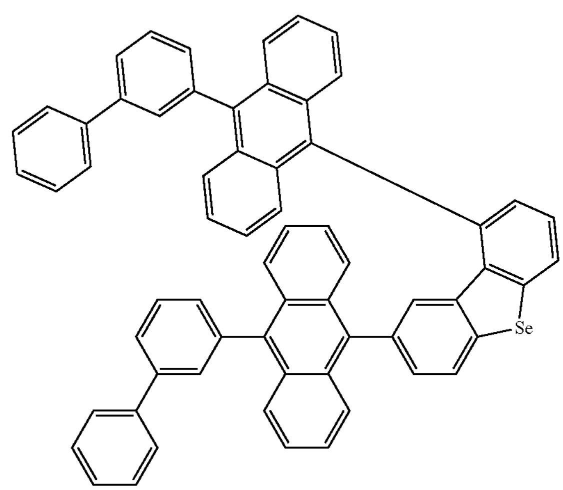

-continued
1575
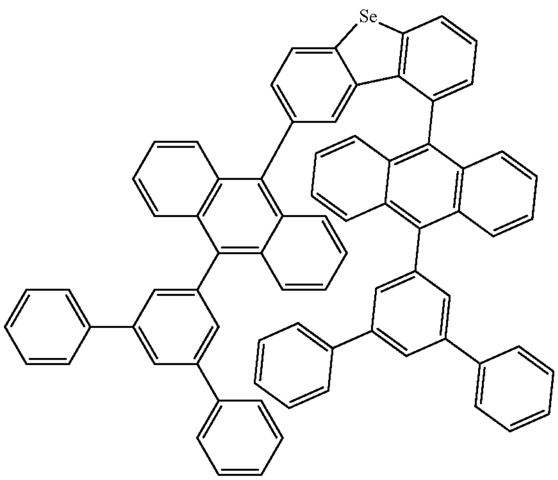
1576
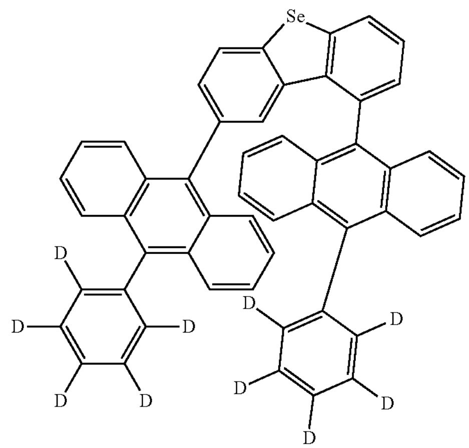
1577
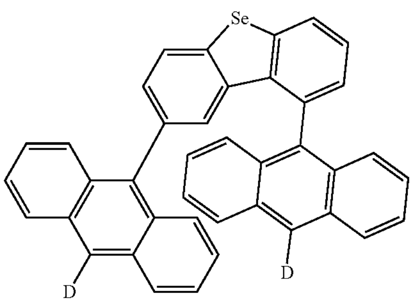
1578
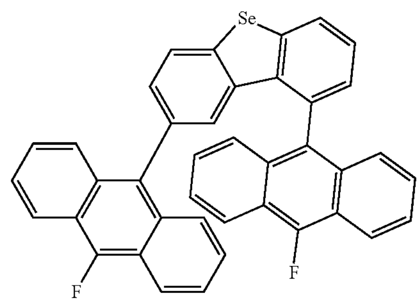
1579
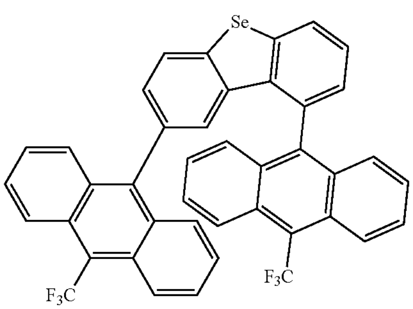
1580
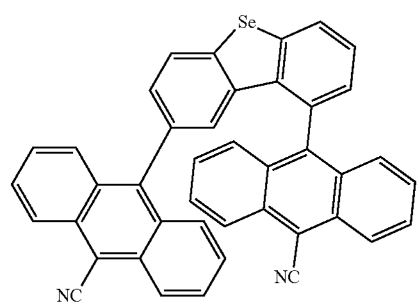
1581
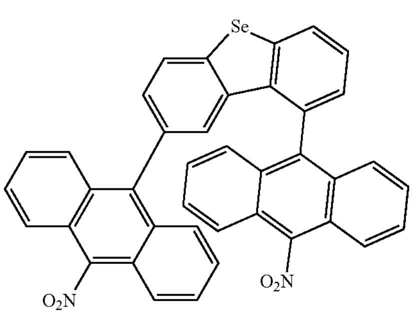
1582
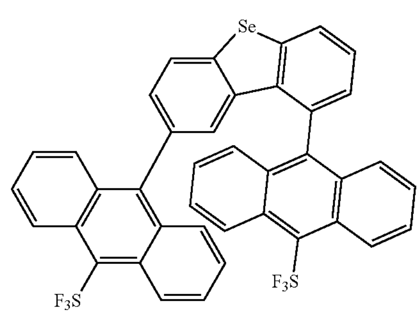

-continued
1583
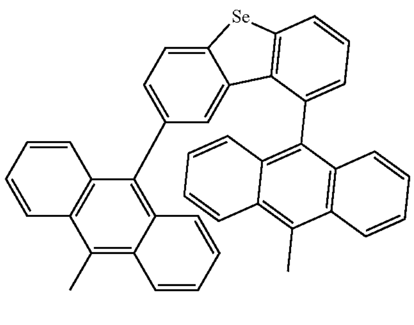
1584
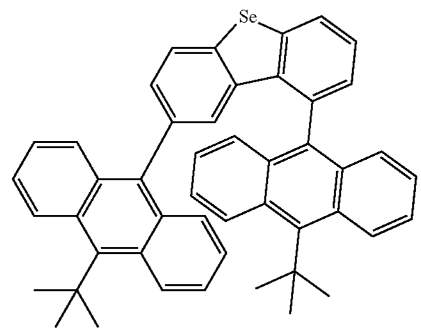
1585
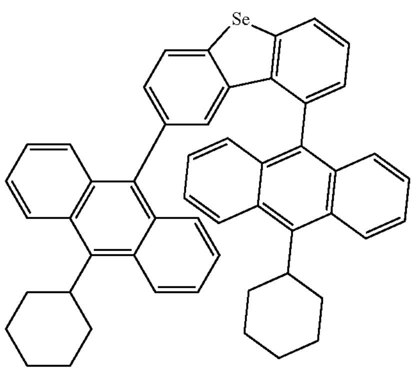
1586
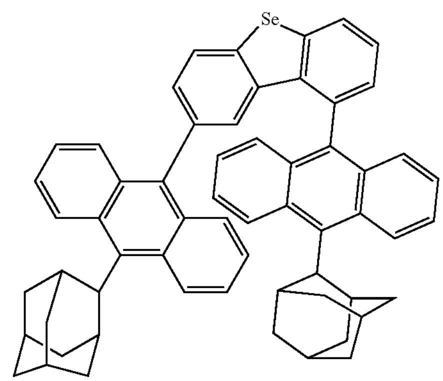
1587
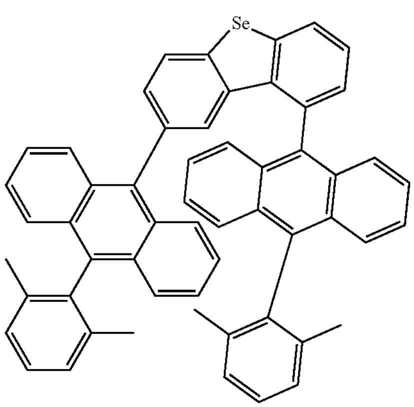
1588
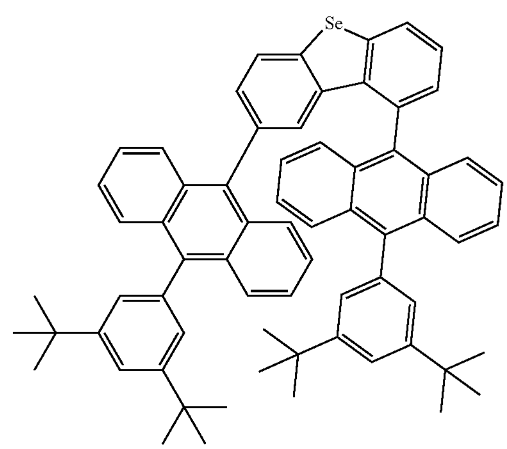
1589
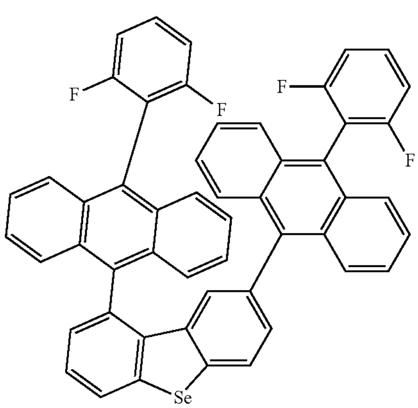
1590
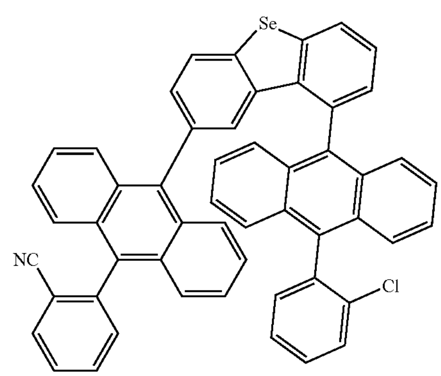

-continued
1591
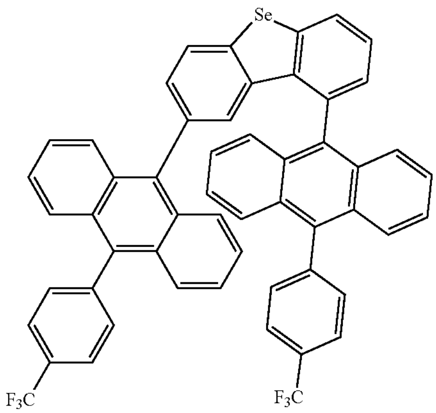
1592
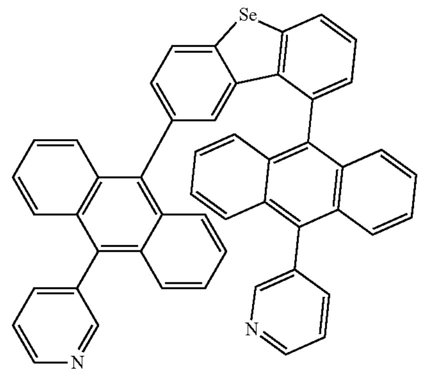
1593
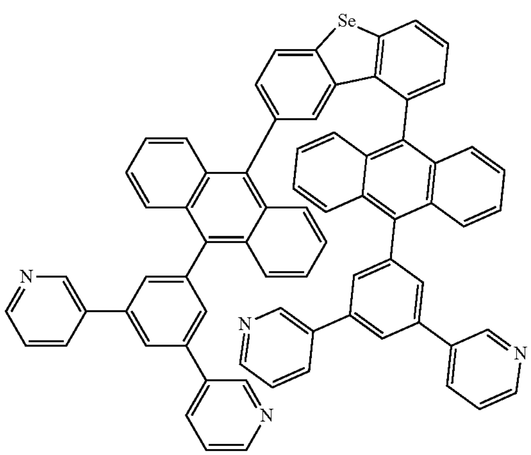
1594
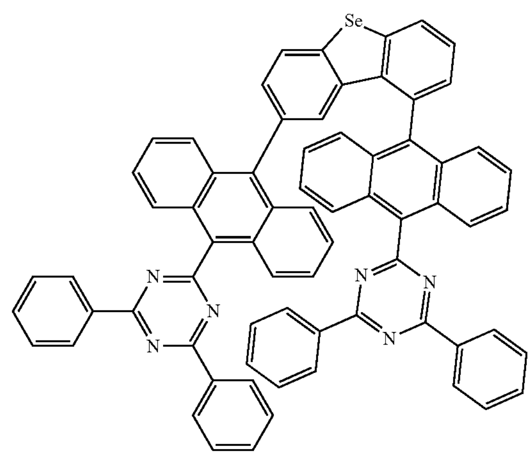
1595
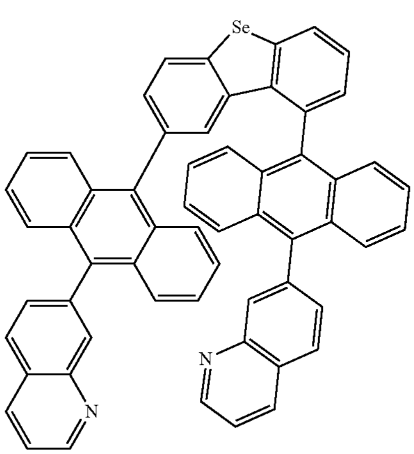
1596
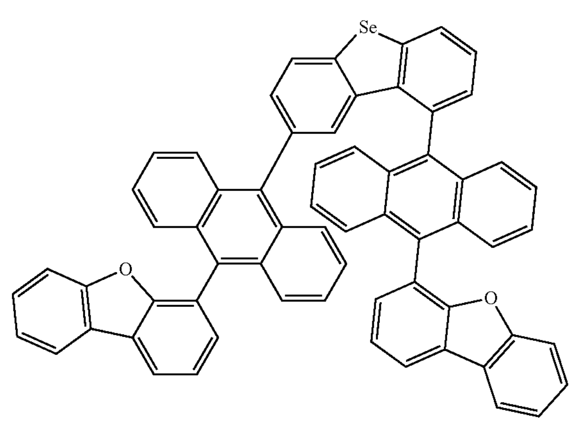

-continued
1597
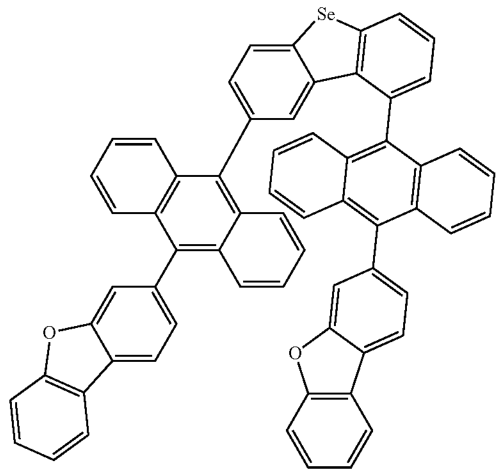
1598
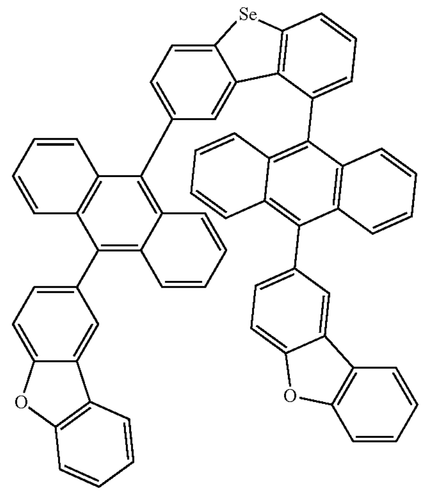
1599
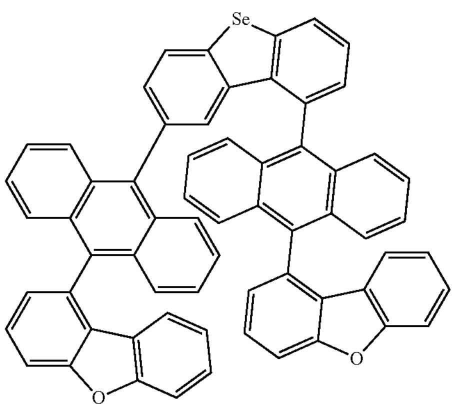
1600
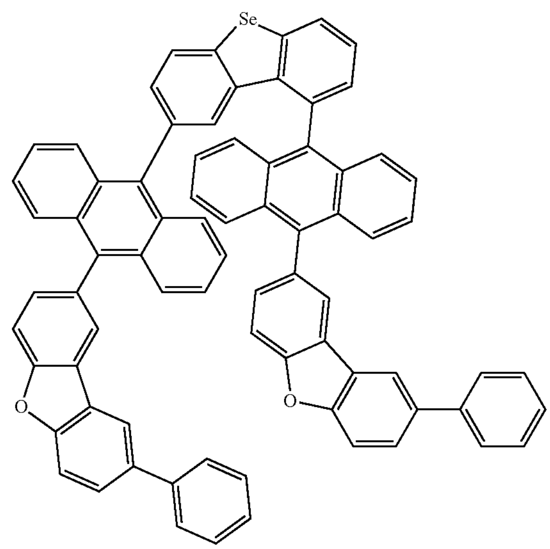
1601
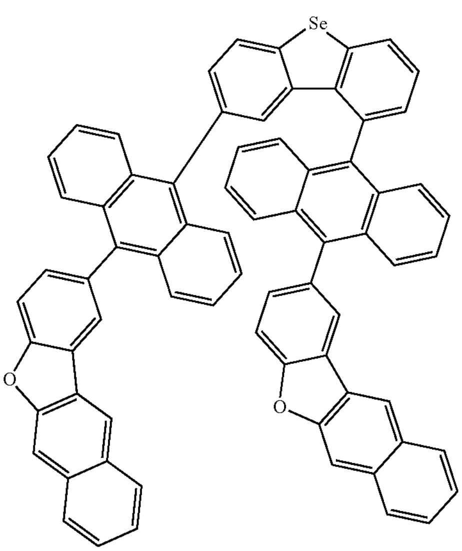
1602
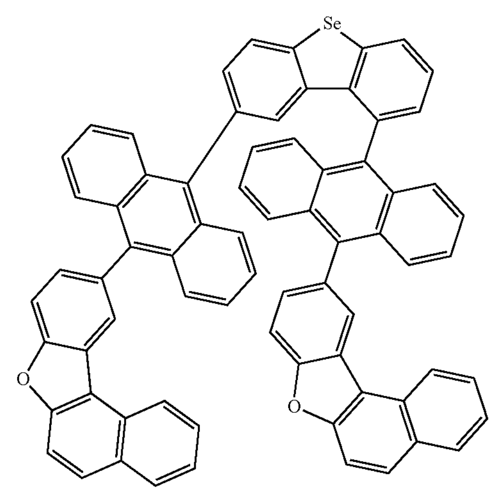

-continued
1603
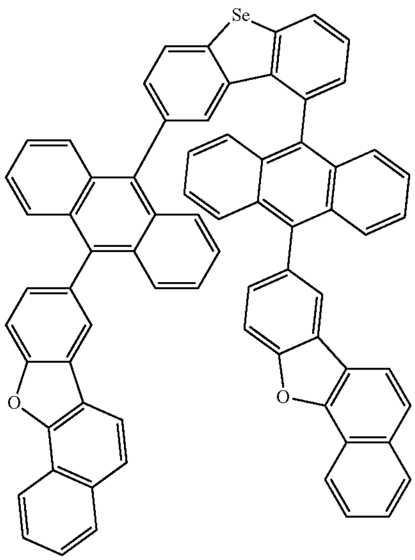
1604
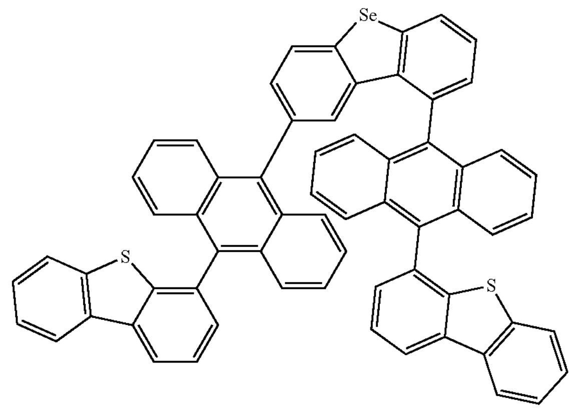
1605
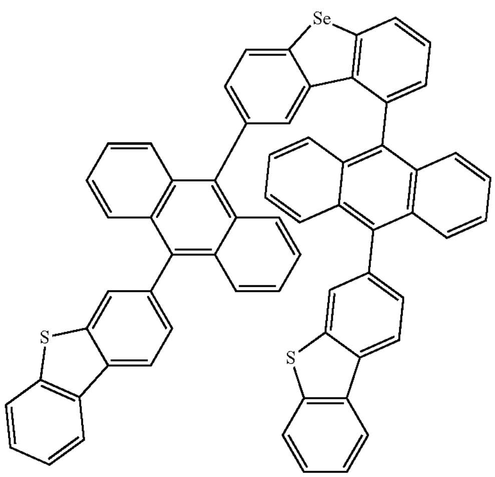
1606
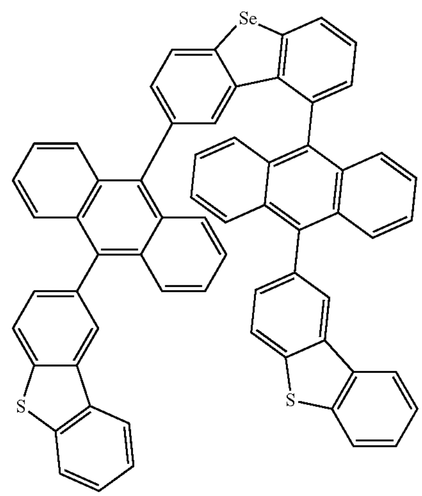
1607
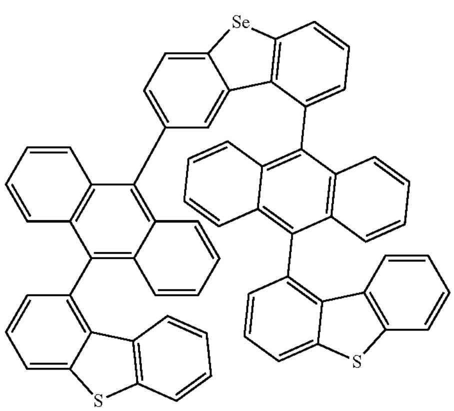
1608
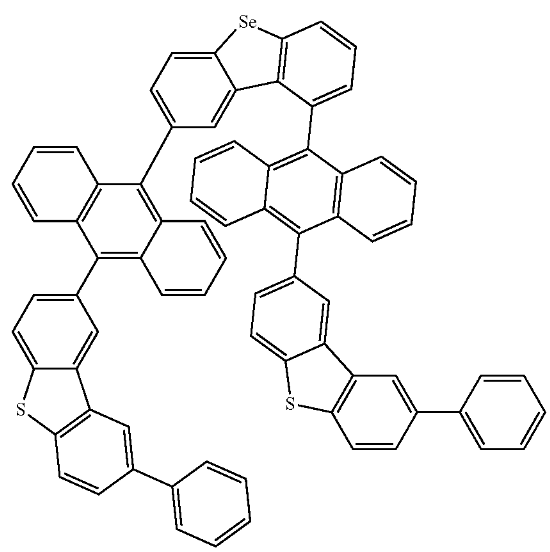

-continued
1609
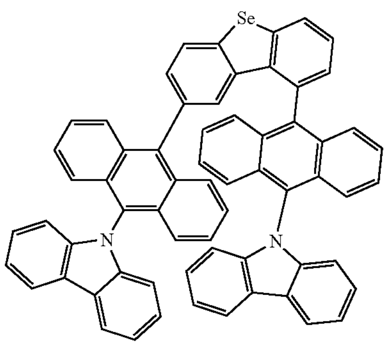
1610
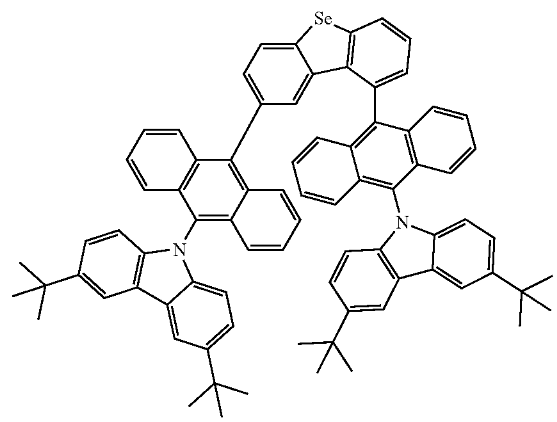
1611
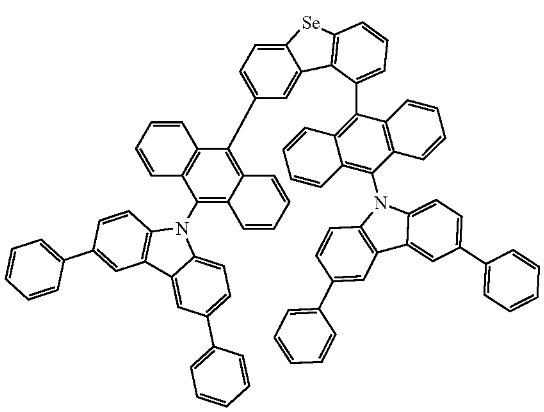
1612
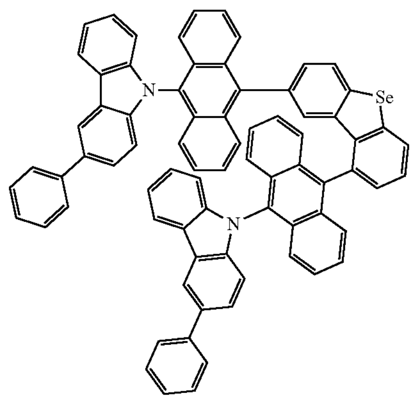
1613
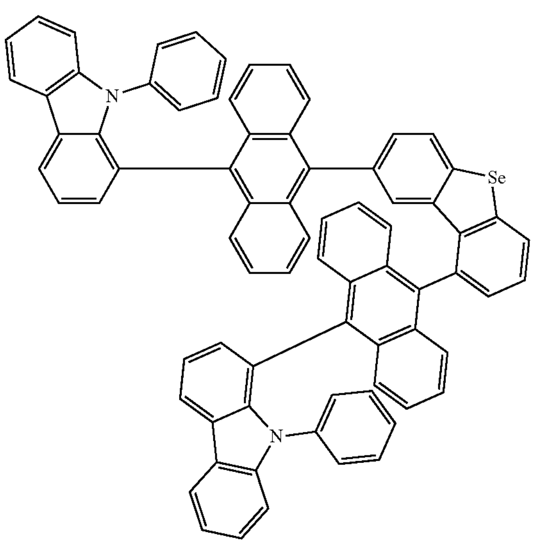
1614
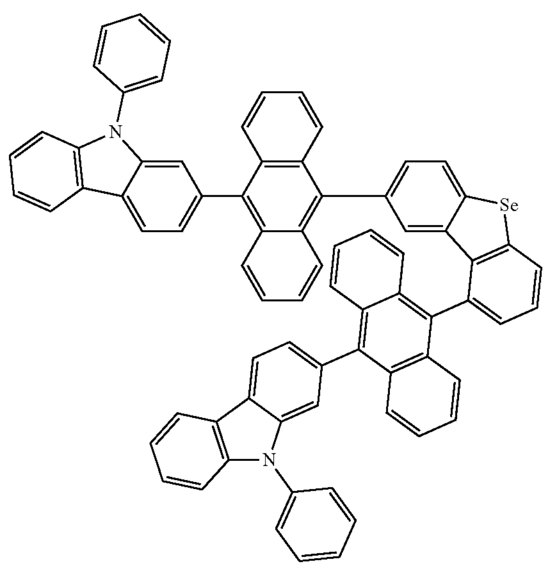

-continued
1615
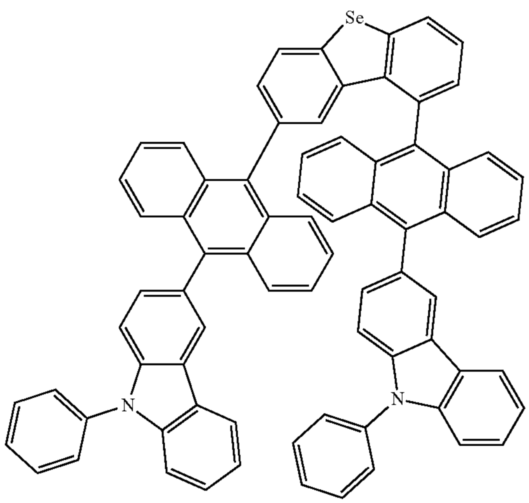
1616
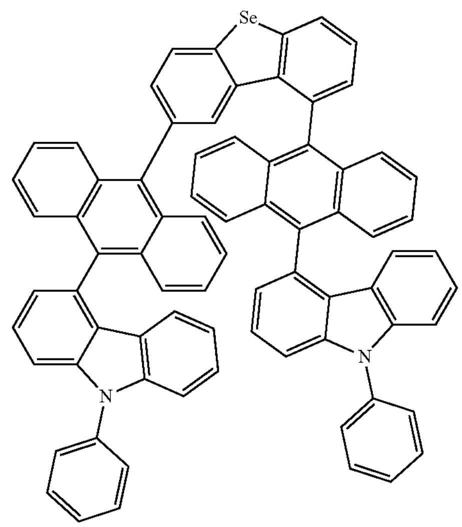
1617
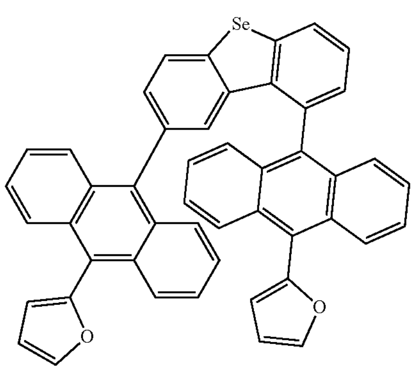
1618
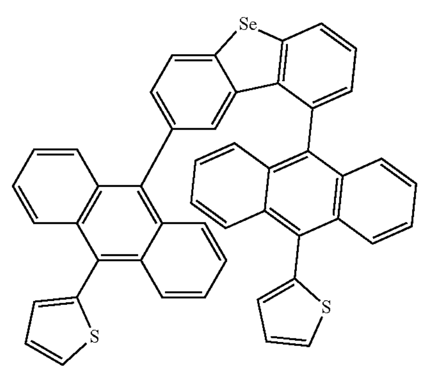
1619
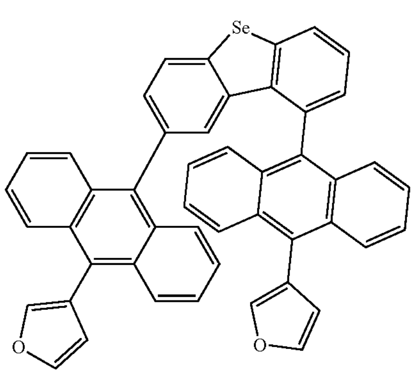
1620
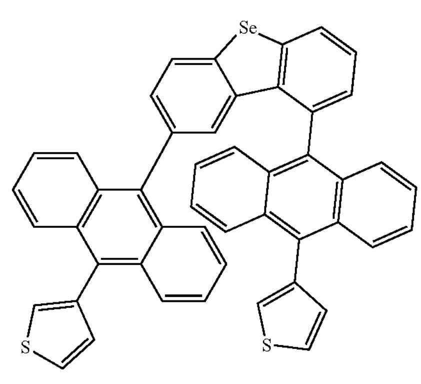

-continued
1621
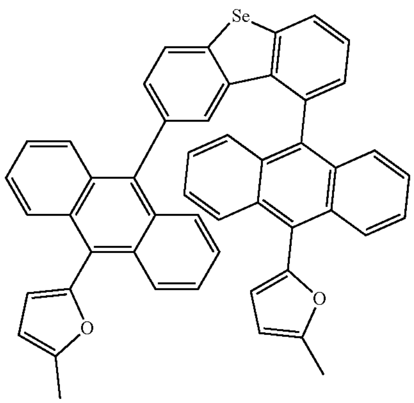
1622
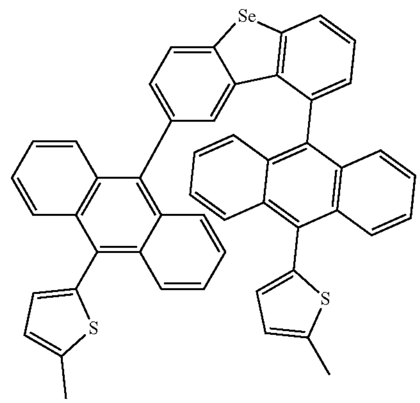
1623
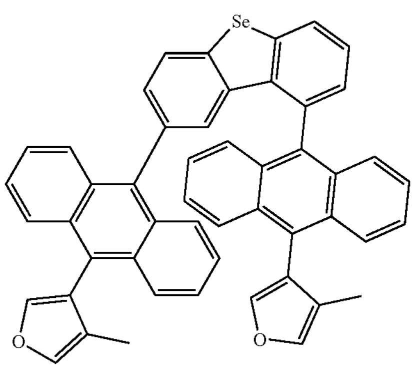
1624
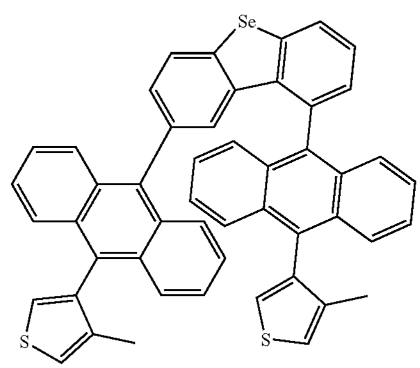
1625
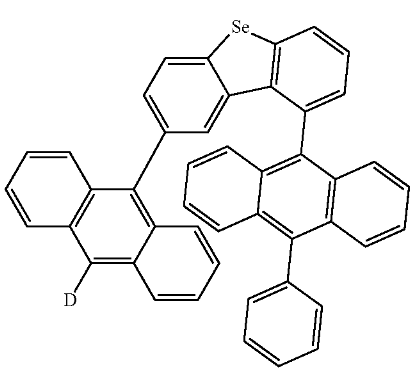
1626
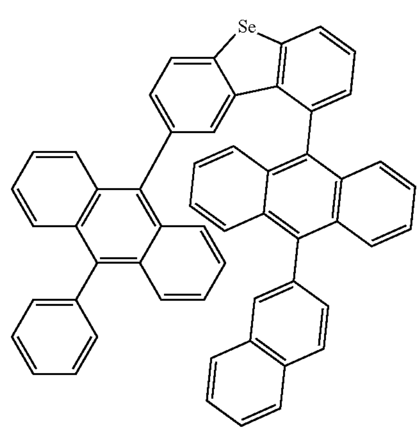

-continued
1627
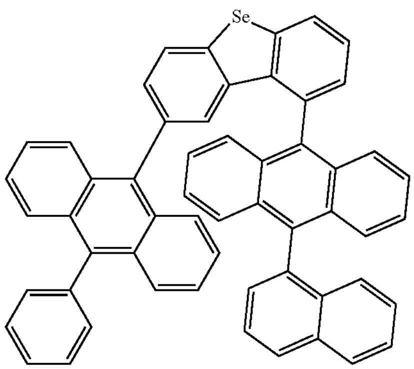
1628
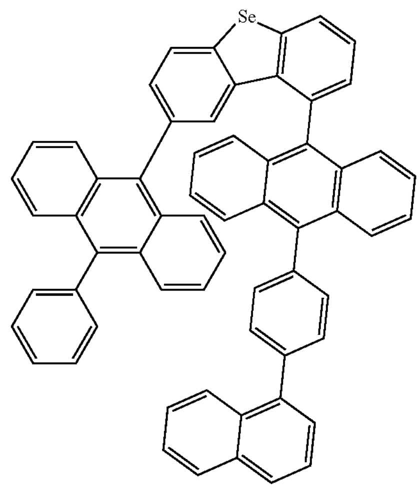
1629
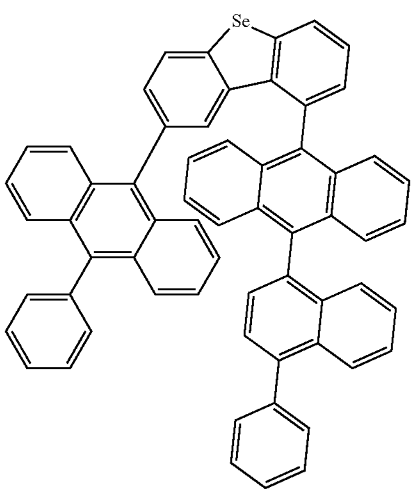
1630
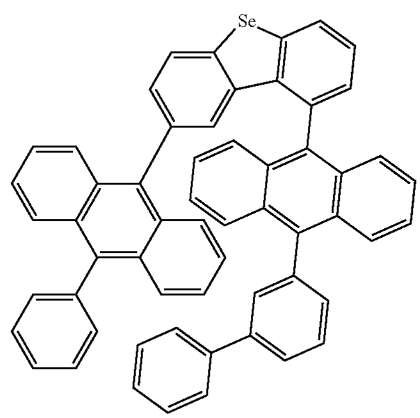
1631
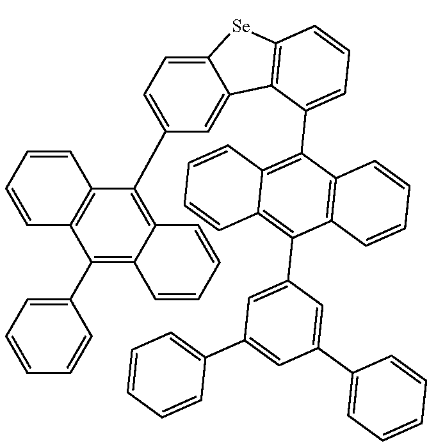
1632
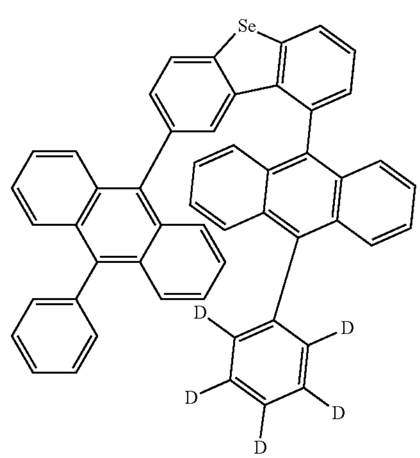

-continued
1633
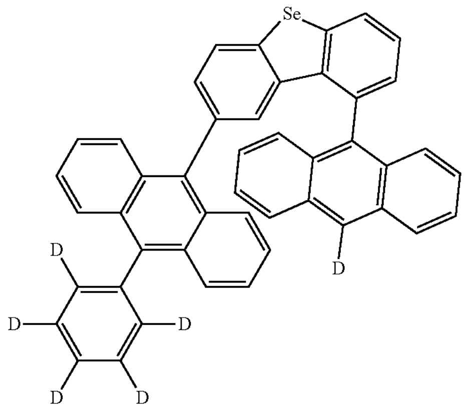
1634
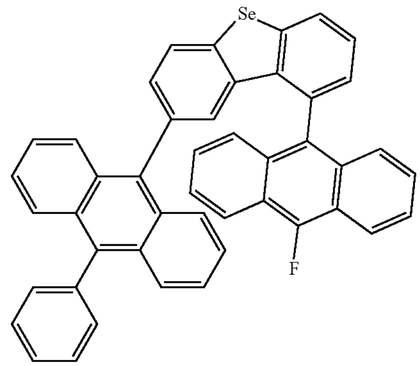
1635
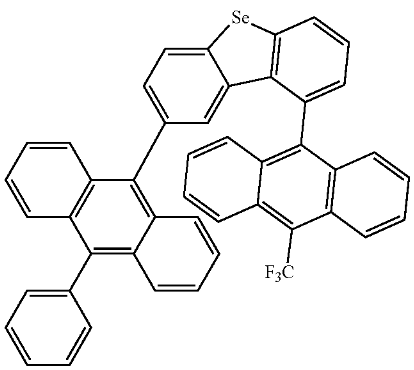
1636
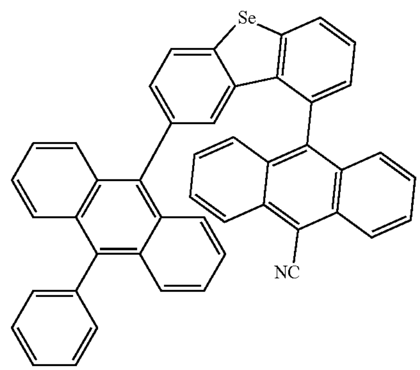
1637
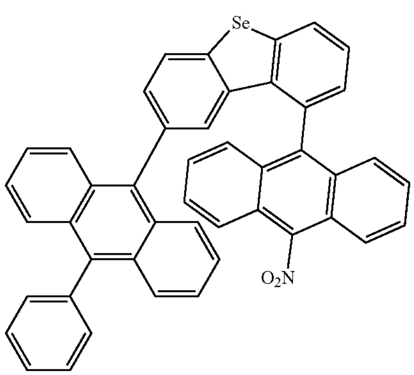
1638
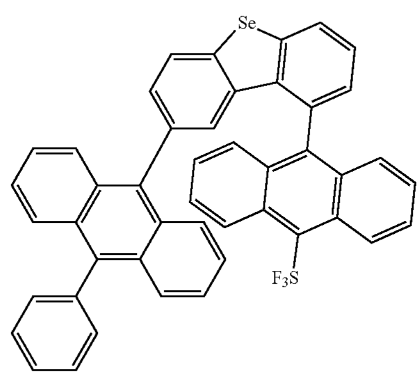
1639
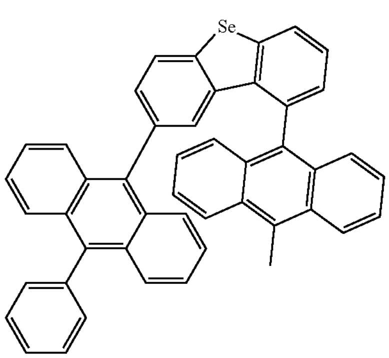
1640
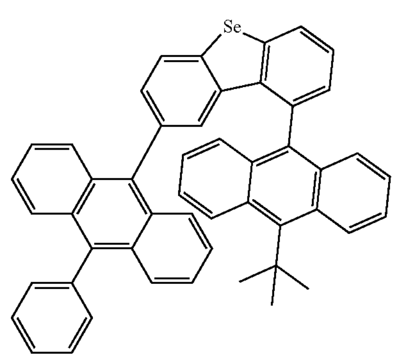

-continued
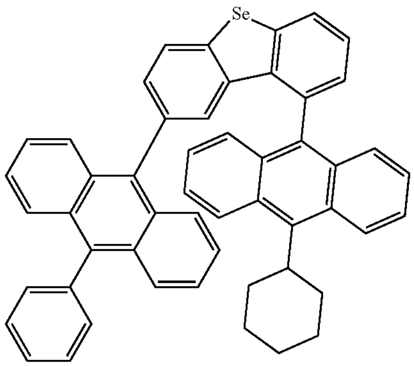
1641
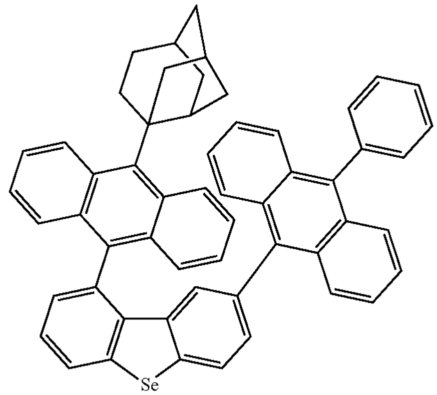
1642
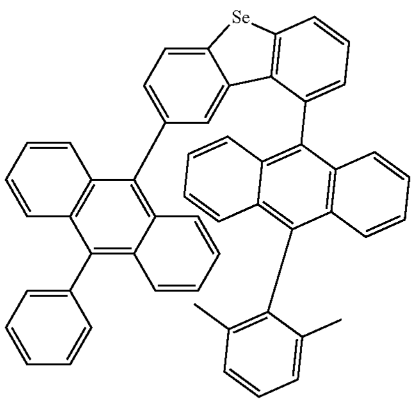
1643
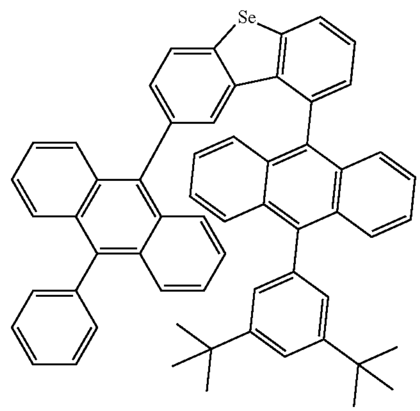
1644
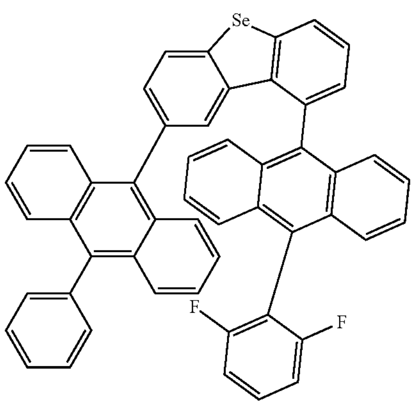
1645
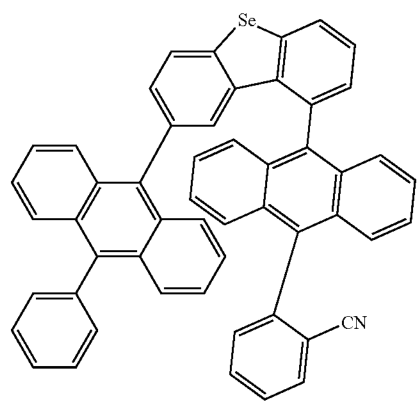
1646
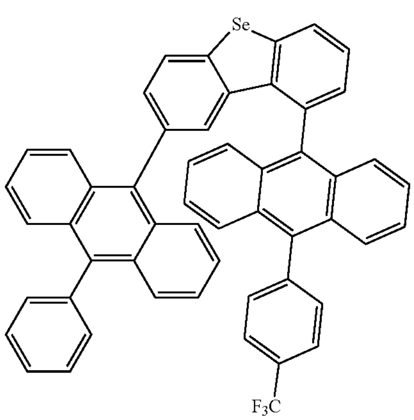
1647
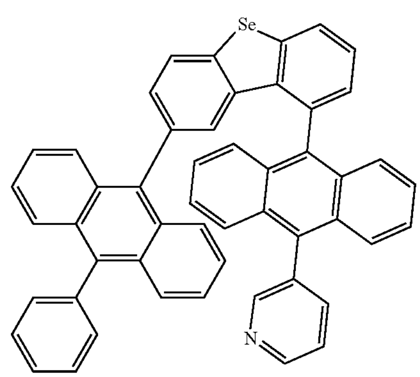
1648

-continued
1649
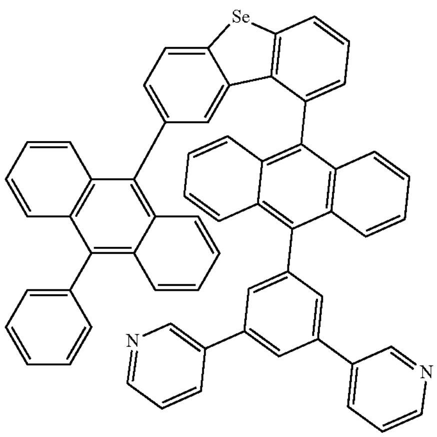
1650
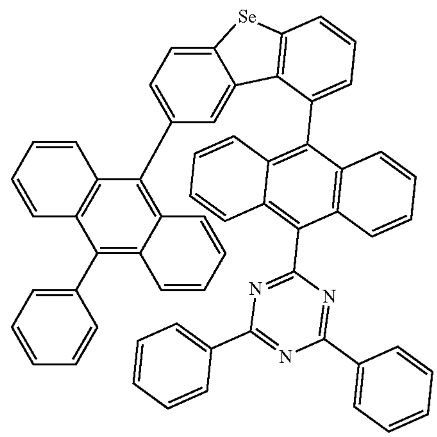
1651
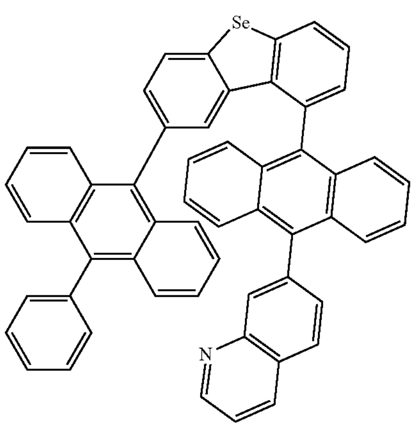
1652
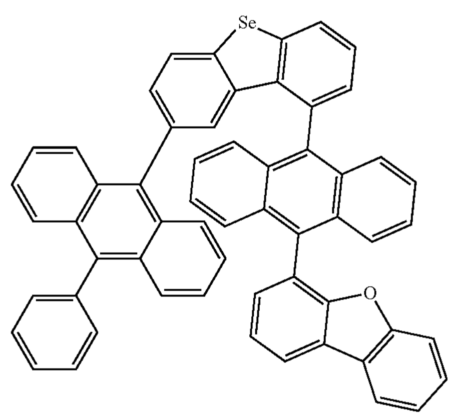
1653
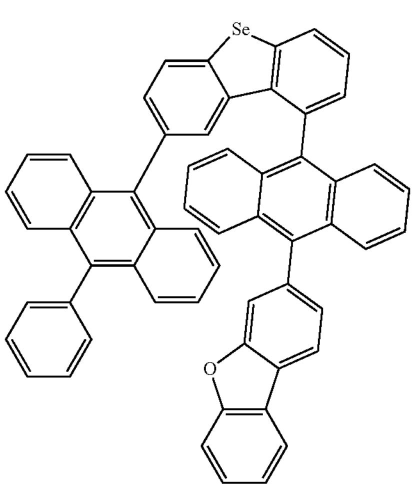
1654
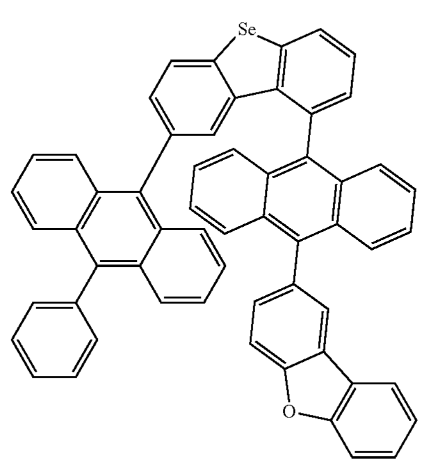

-continued
1655
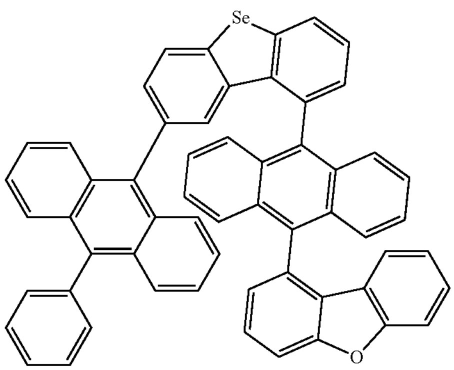
1656
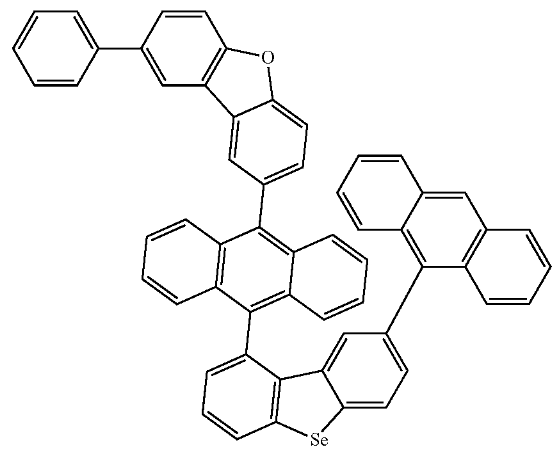
1657
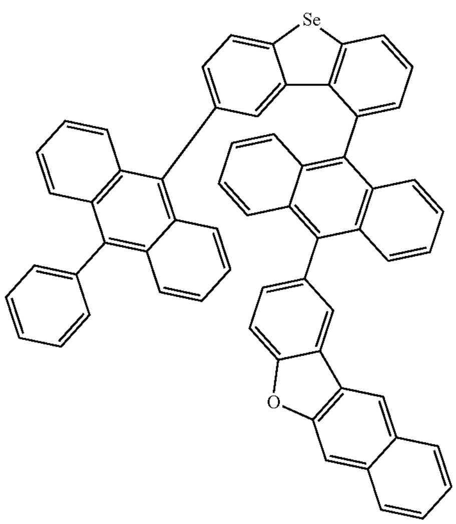
1658
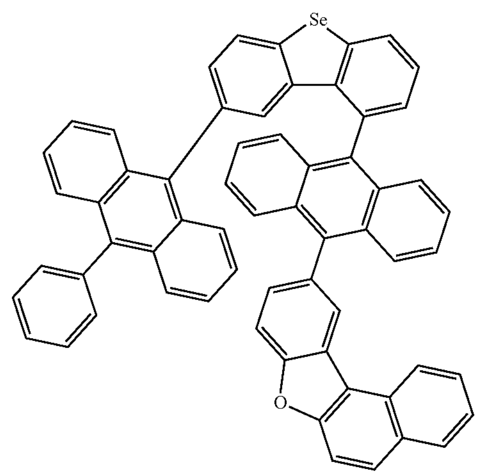
1659
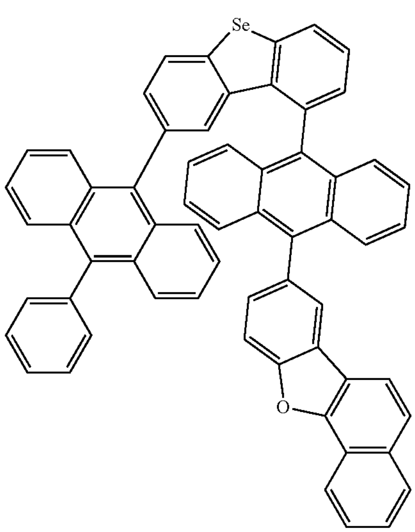
1660
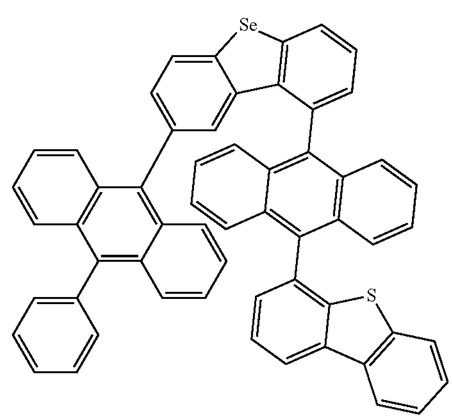

-continued
1661
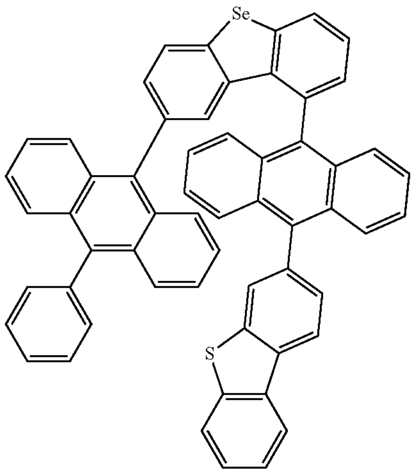
1662
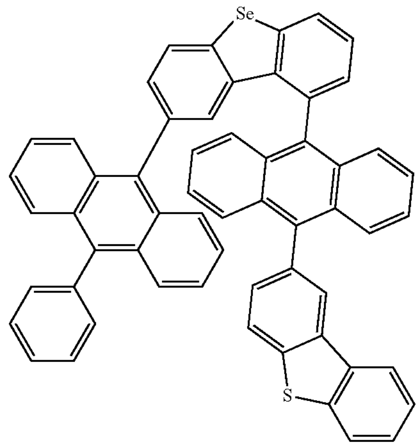
1663
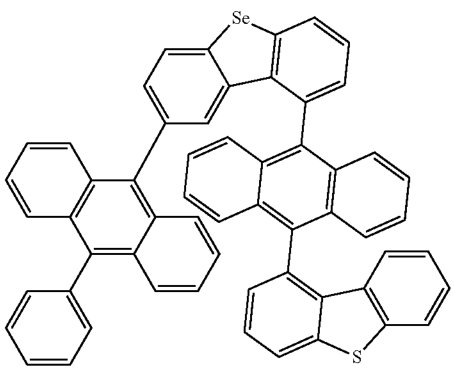
1664
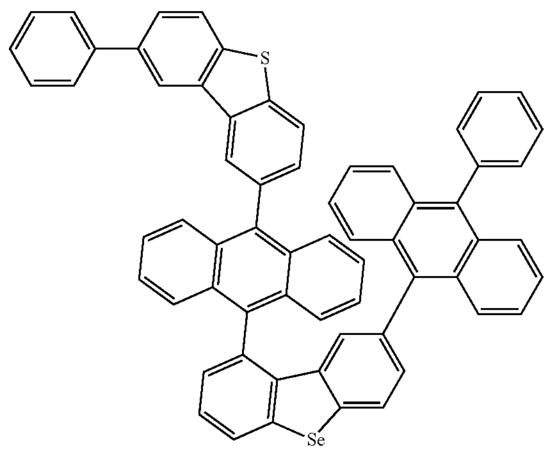
1665
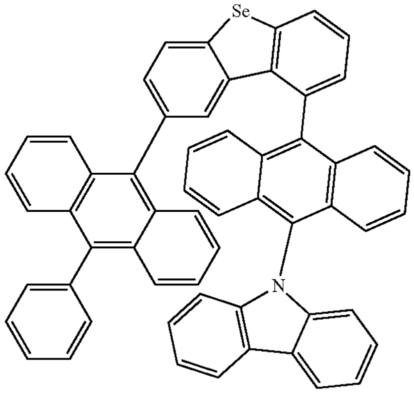
1666
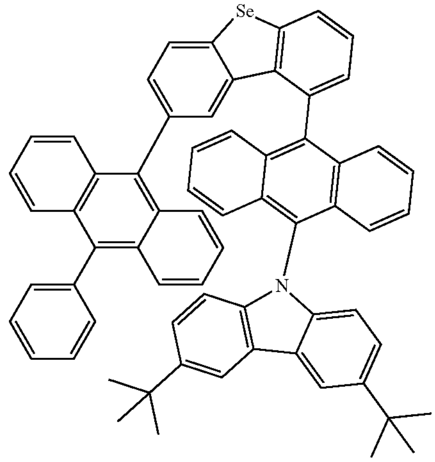

-continued
1667
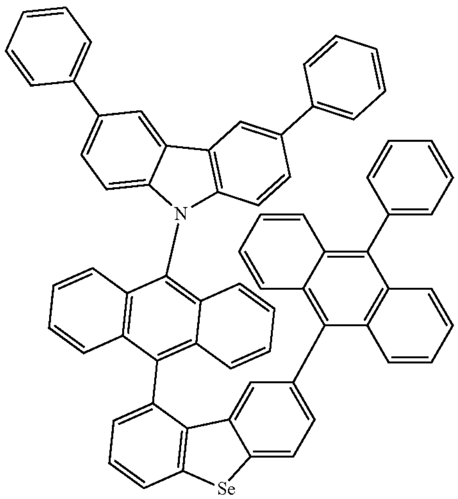
1668
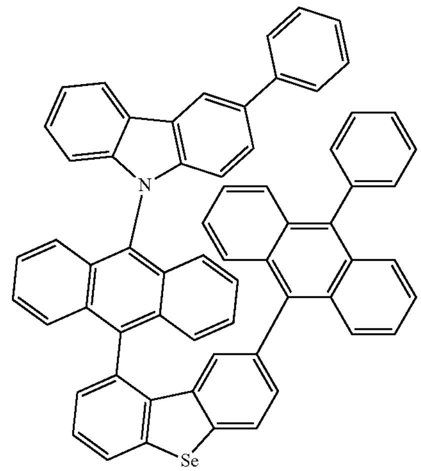
1669
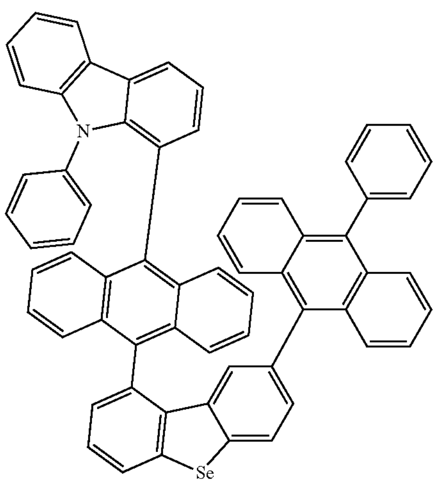
1670
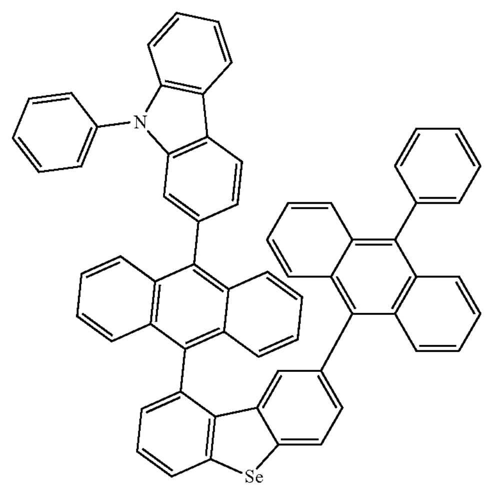
1671
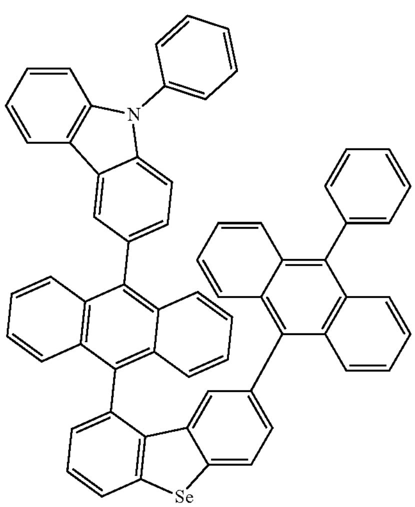
1672
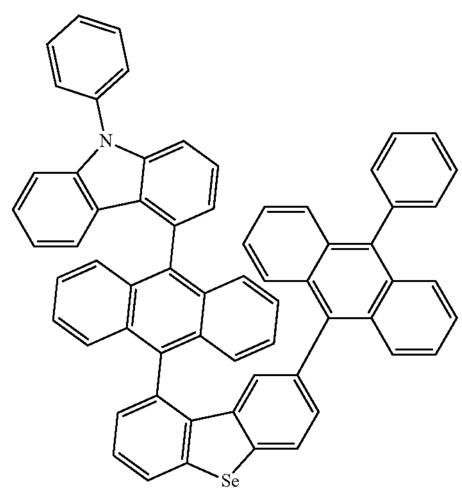

-continued
1673
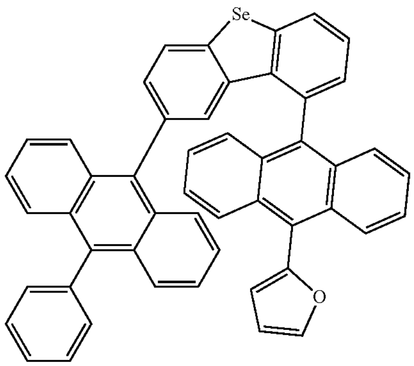
1674
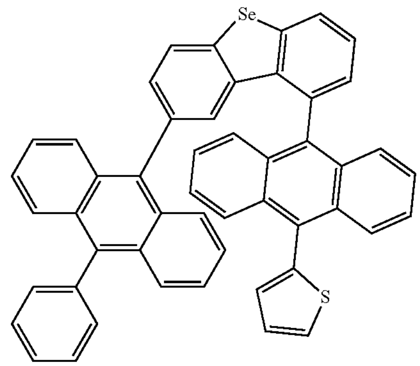
1675
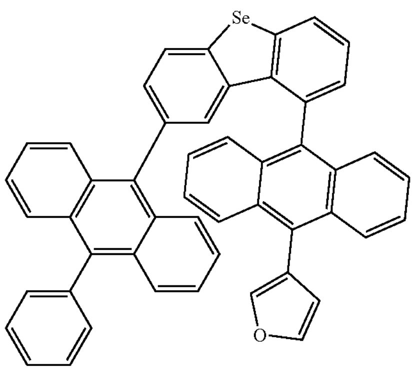
1676
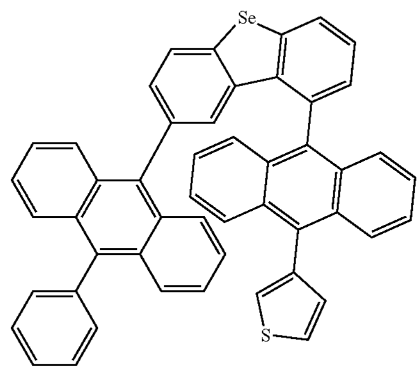
1677
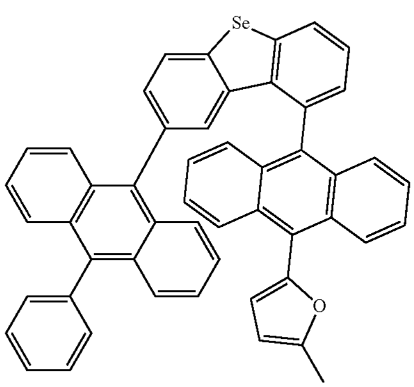
1678
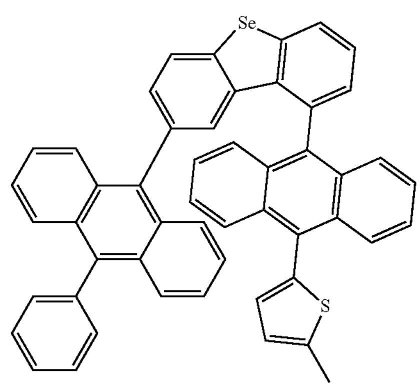
1679
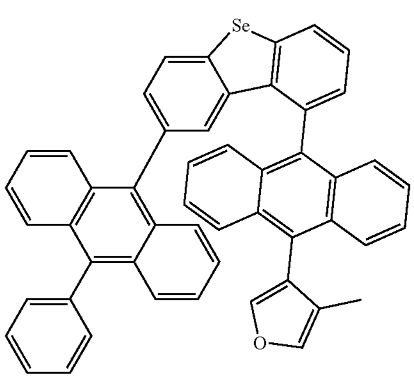
1680
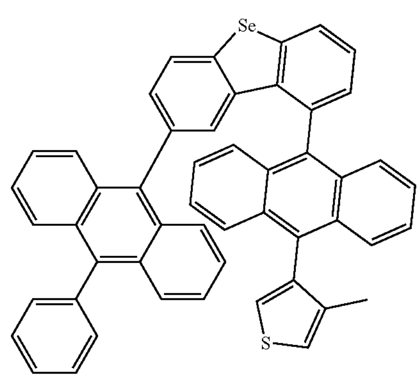

-continued
1681
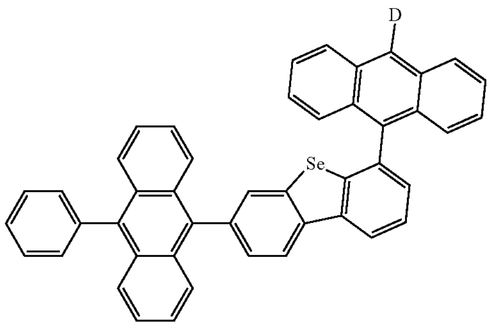
1682
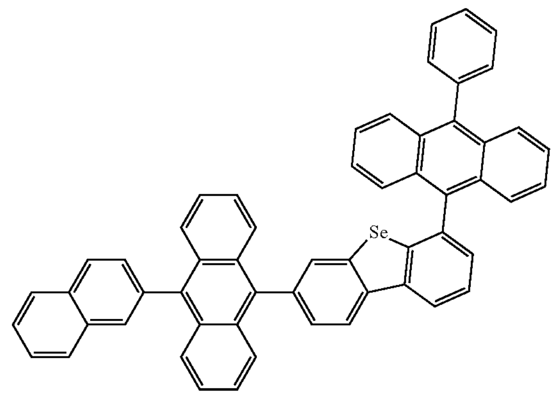
1683
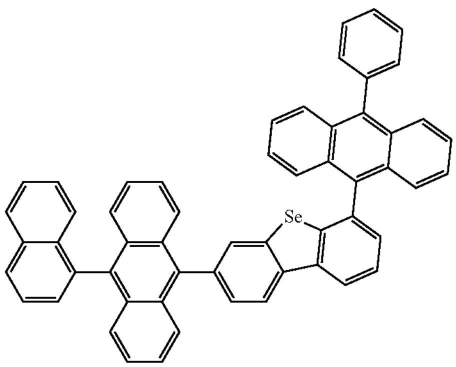
1684
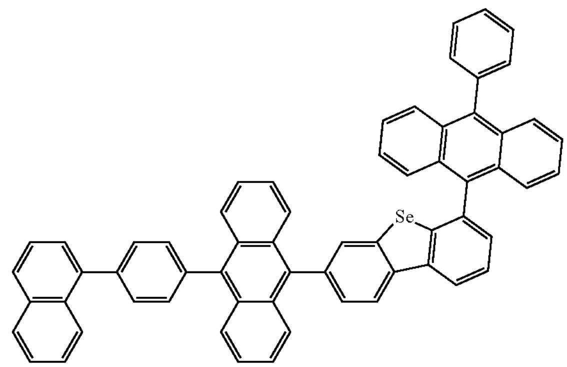
1685
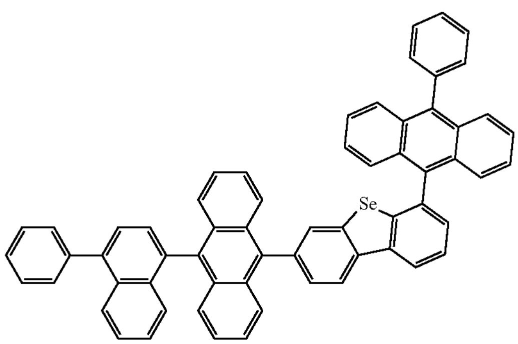
1686
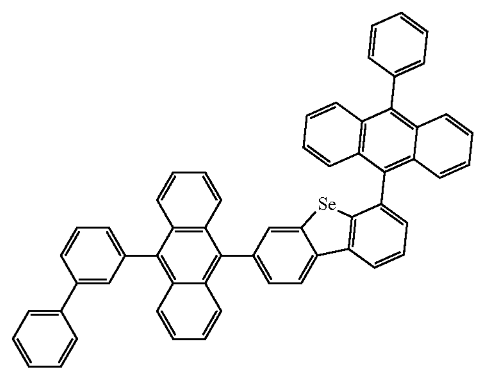
1687
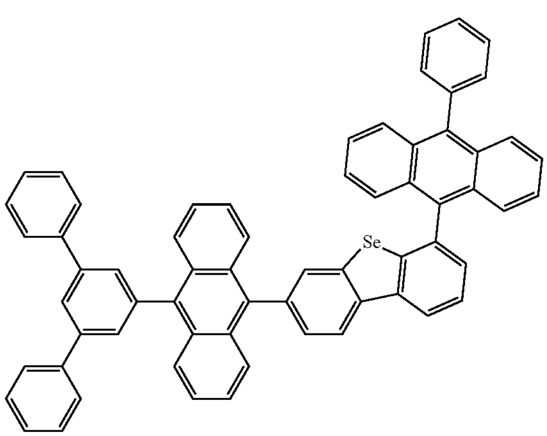
1688
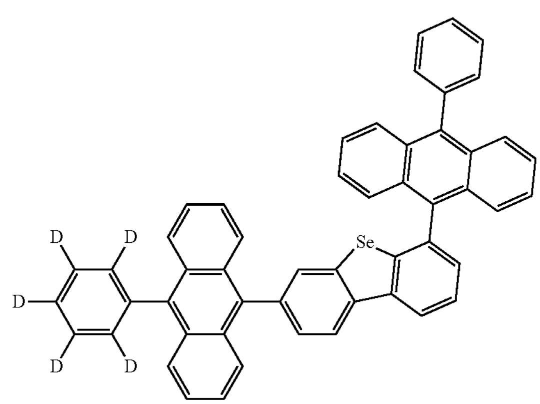

-continued
1689
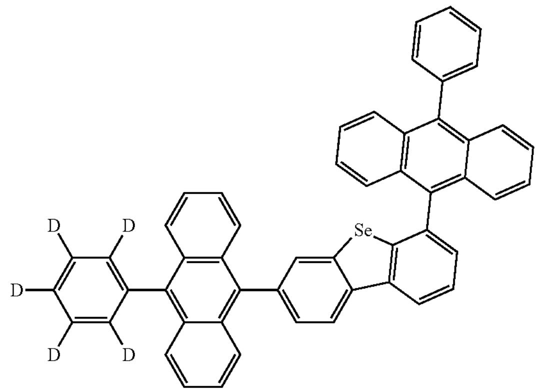
1690
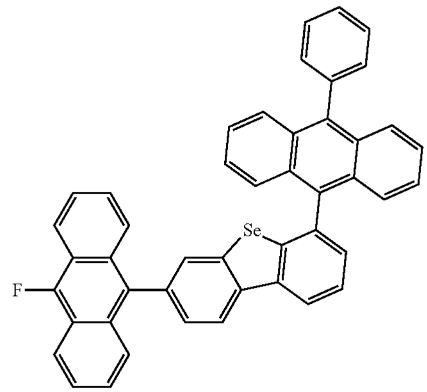
1691
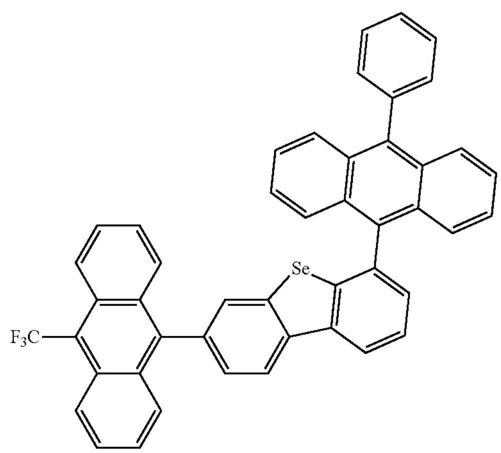
1692
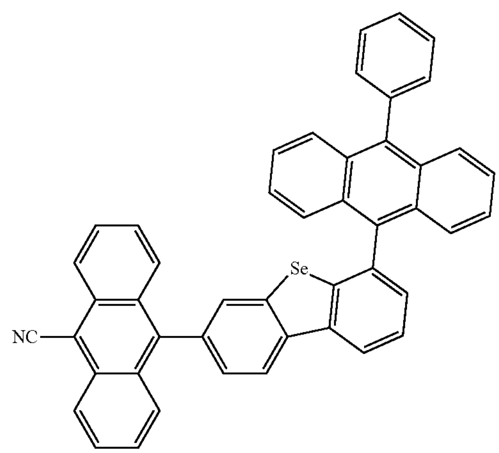
1693
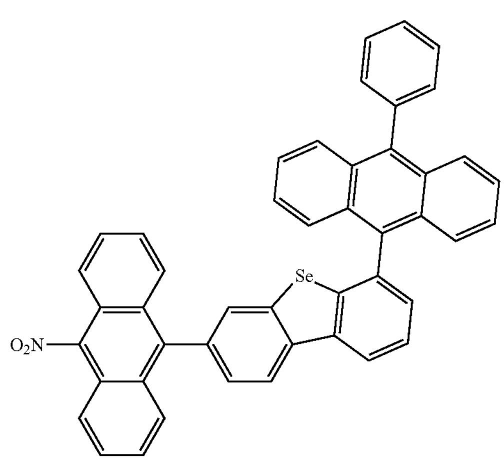
1694
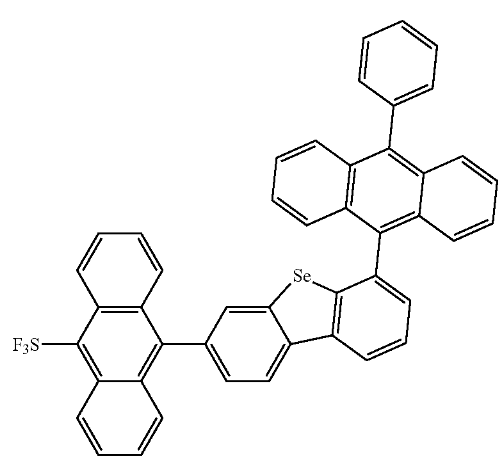

-continued
1695
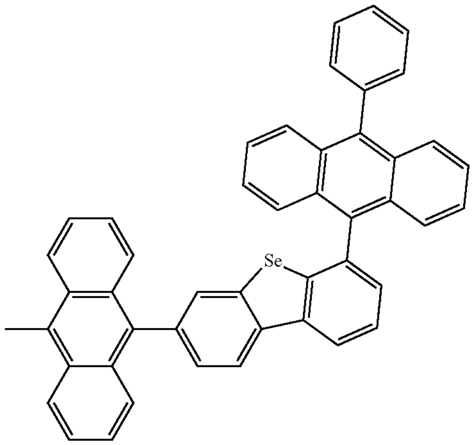
1696
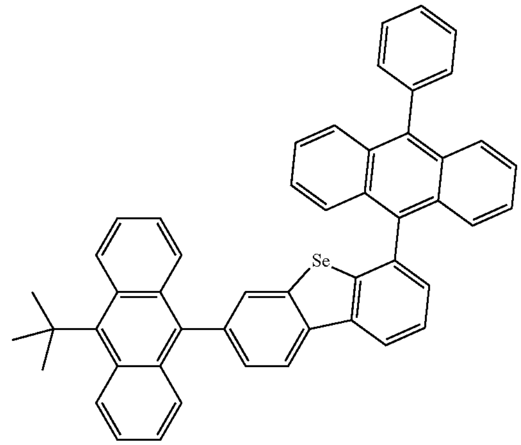
1697
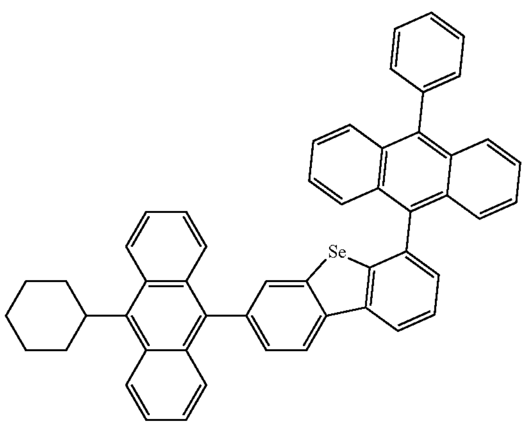
1698
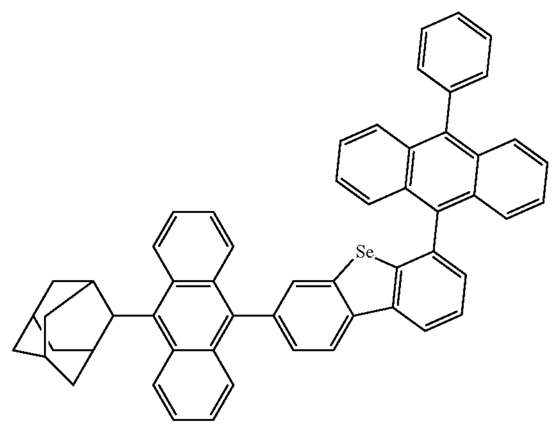
1699
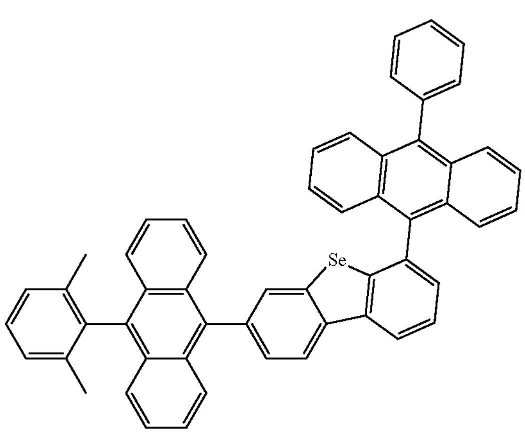
1700
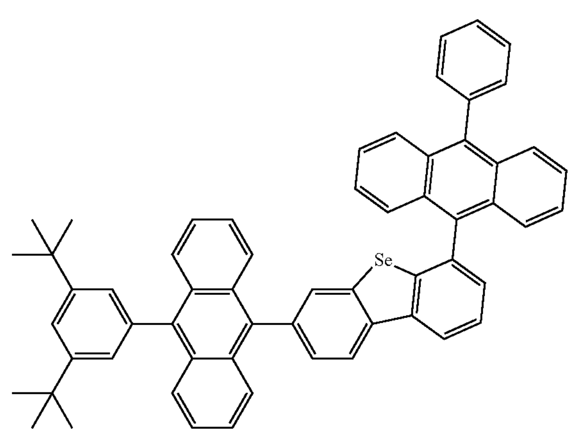

-continued
1701
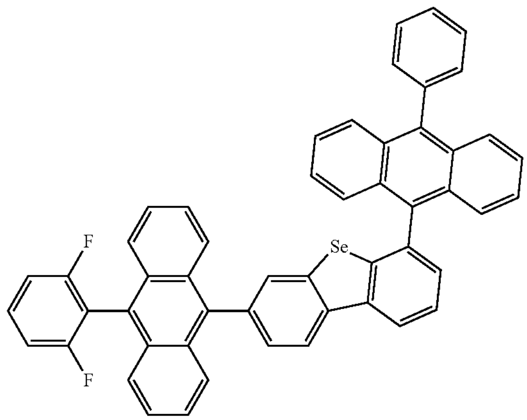
1702
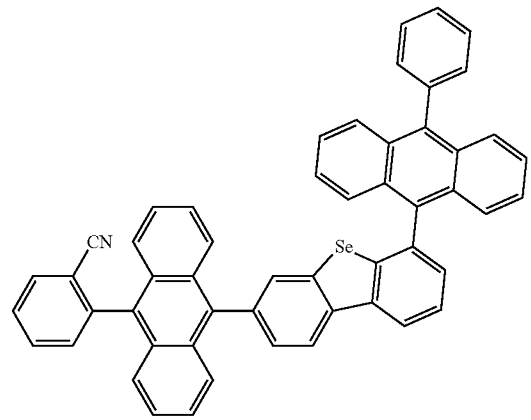
1703
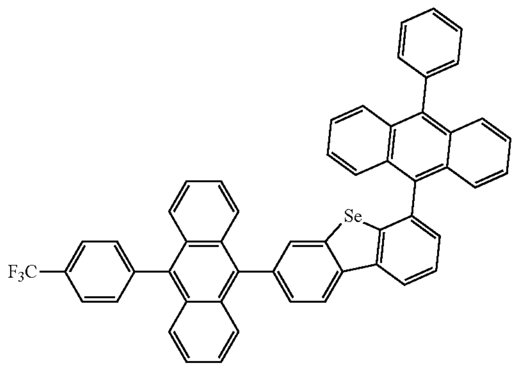
1704
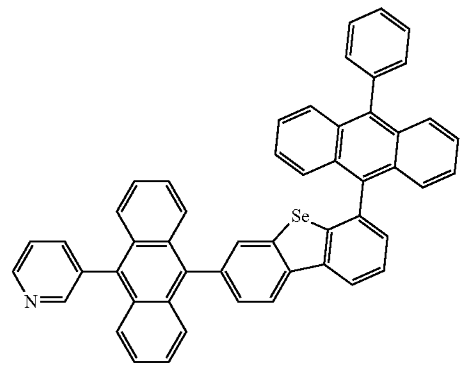
1705
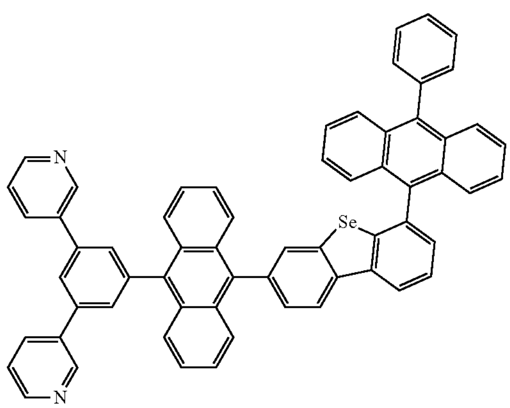
1706
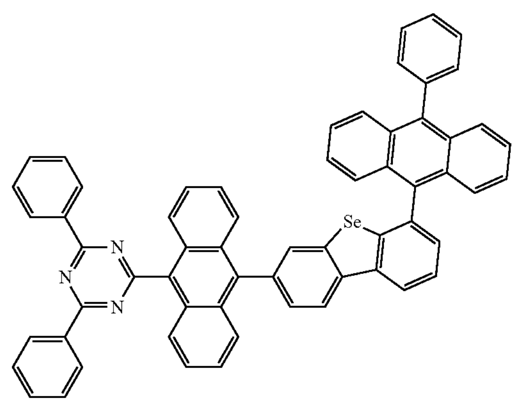
1707
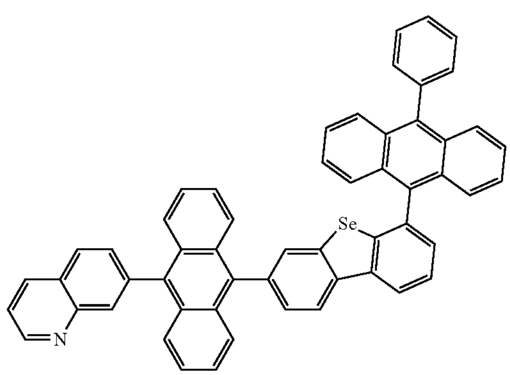
1708
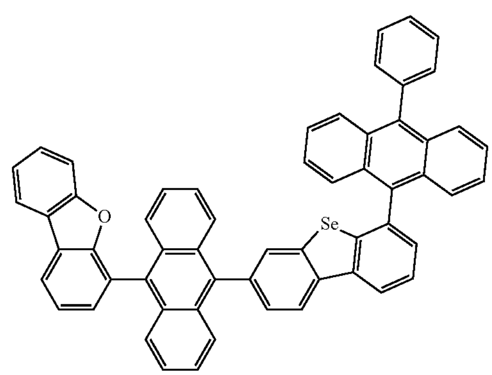

-continued
1709
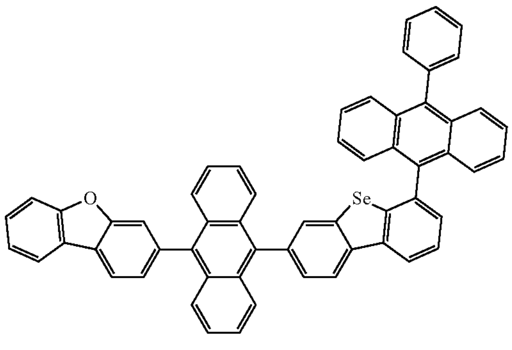
1710
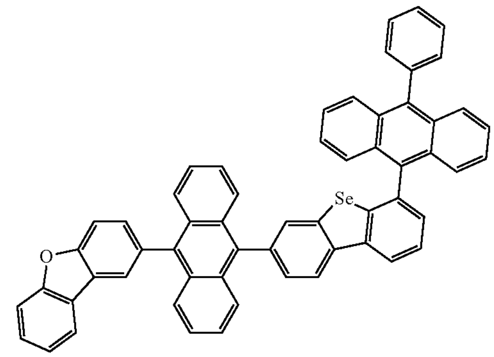
1711
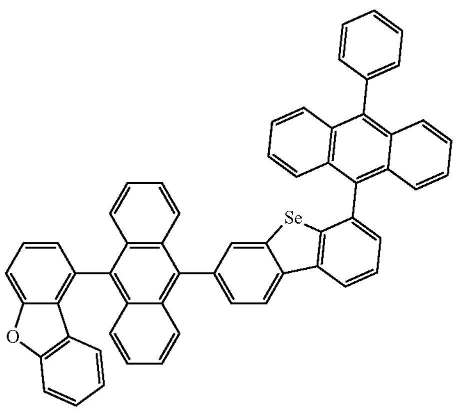
1712
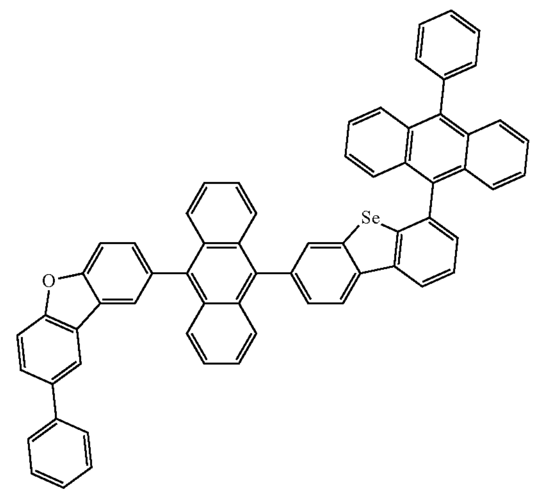
1713
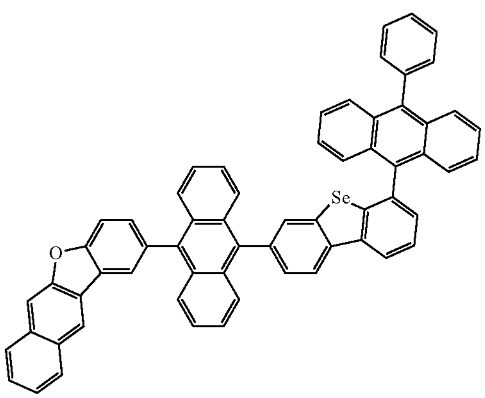
1714
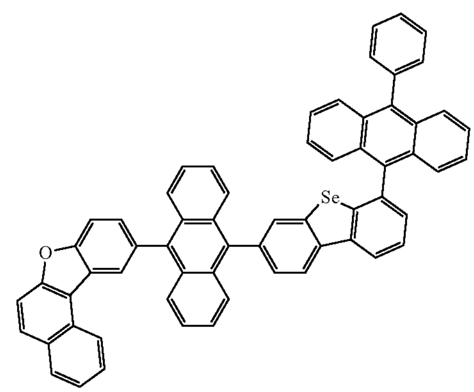
1715
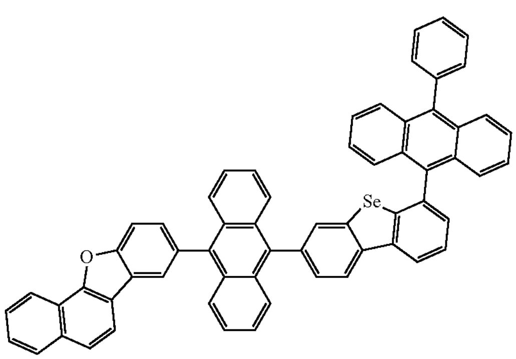
1716
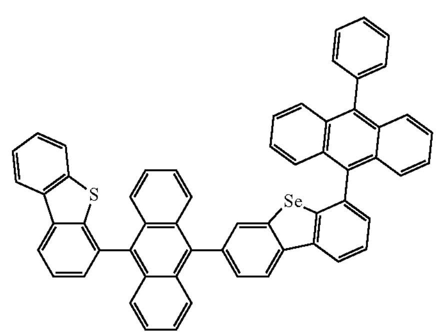

-continued
1717
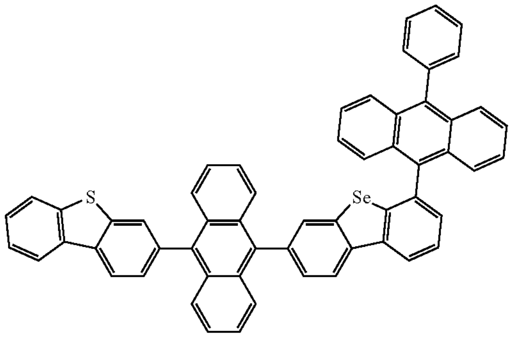
1718
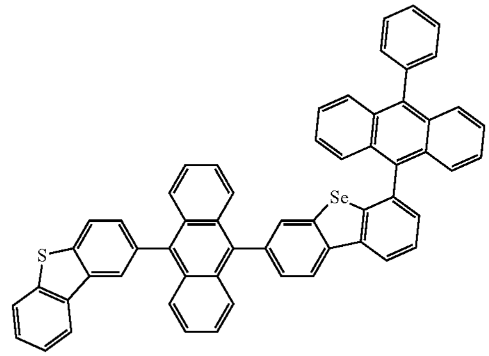
1719
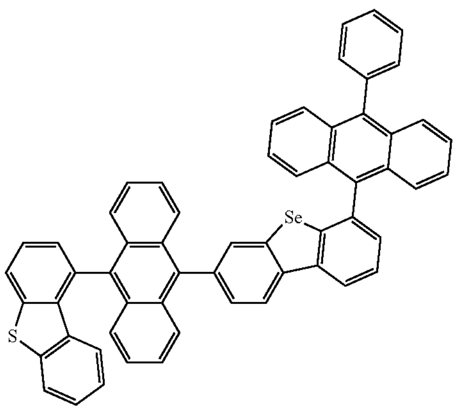
1720
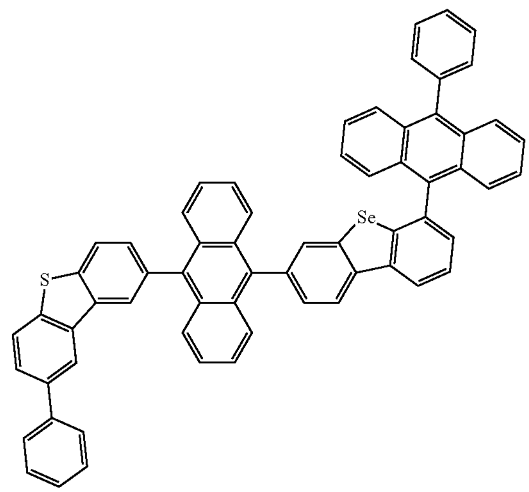
1721
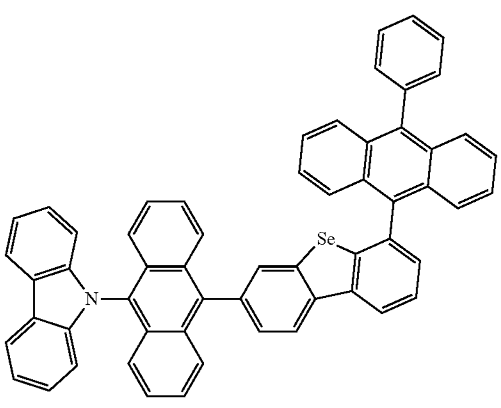
1722
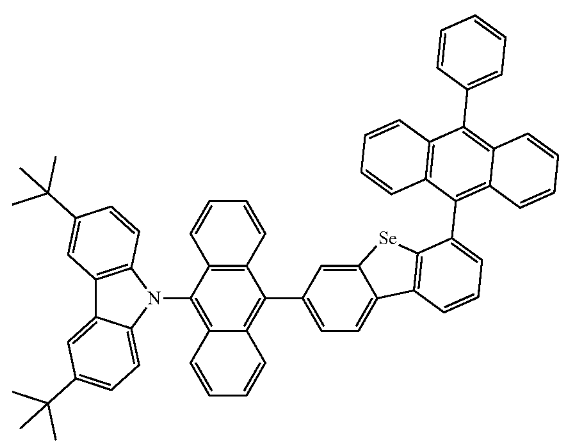

-continued
1723
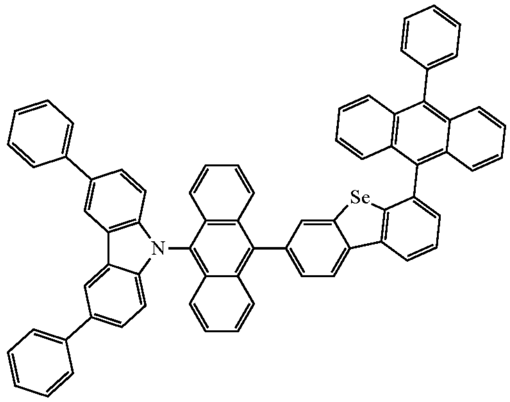
1724
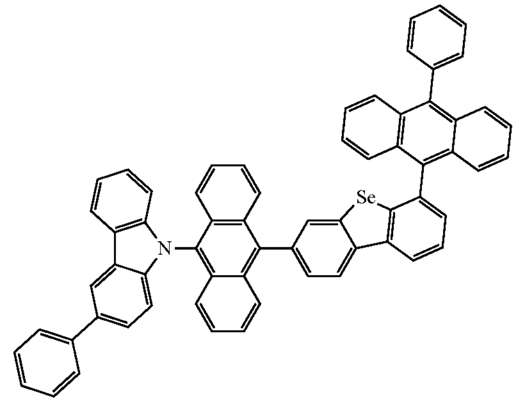
1725
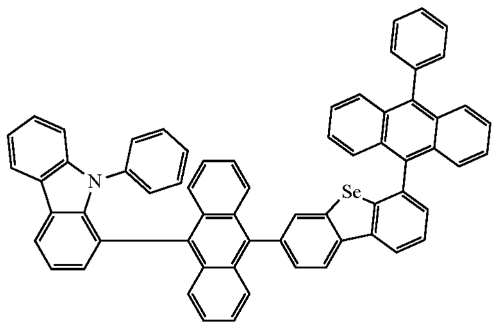
1726
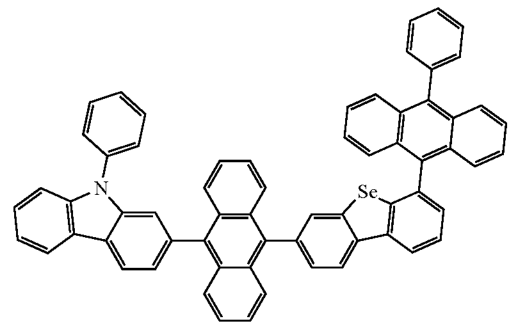
1727
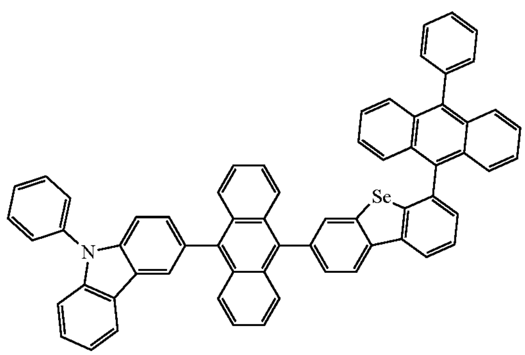
1728
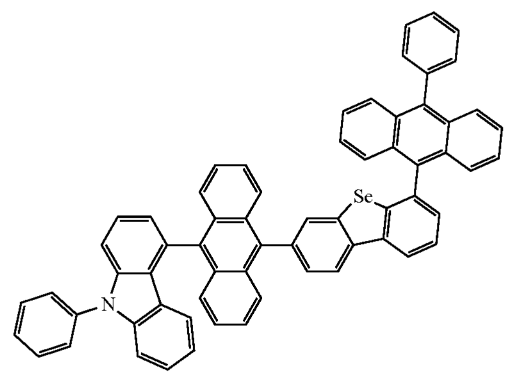
1729
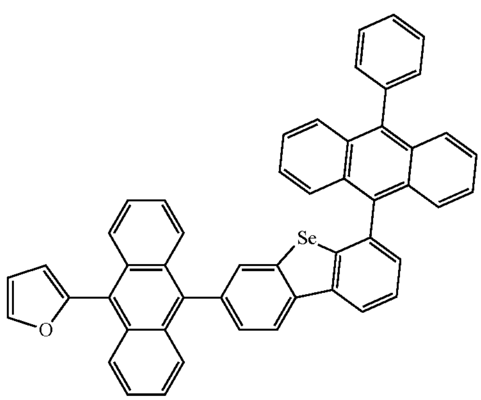
1730
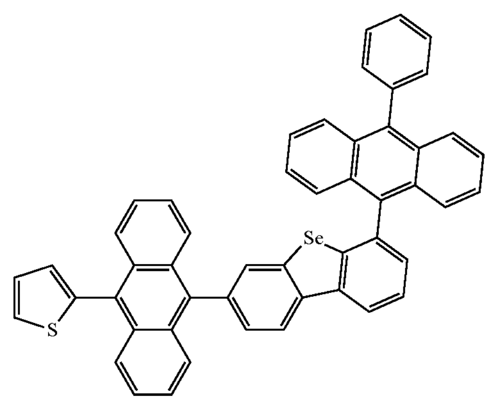

-continued
1731
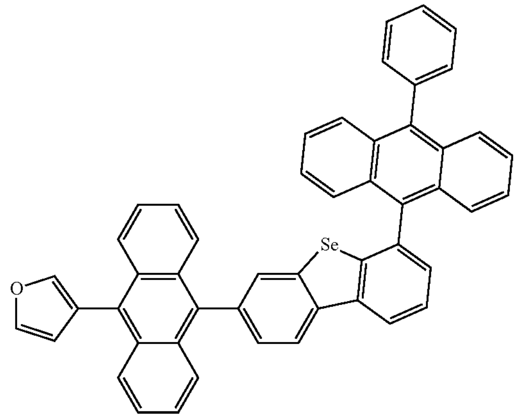
1732
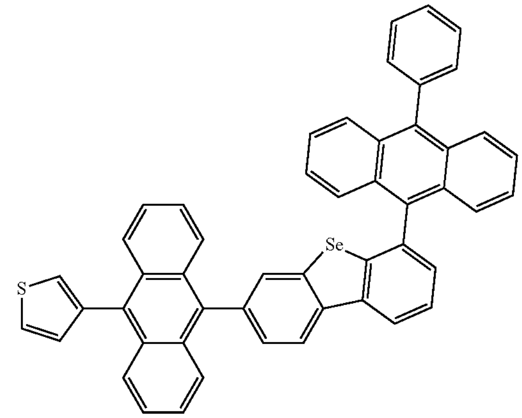
1733
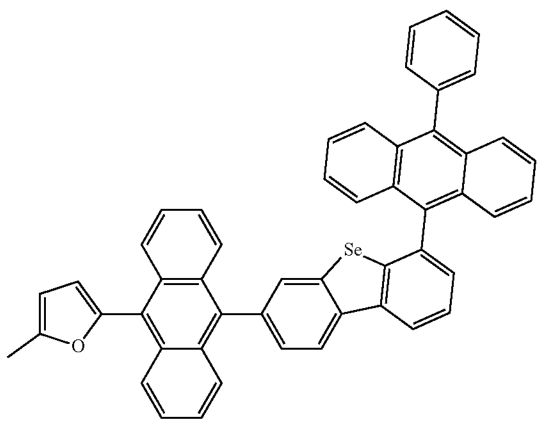
1734
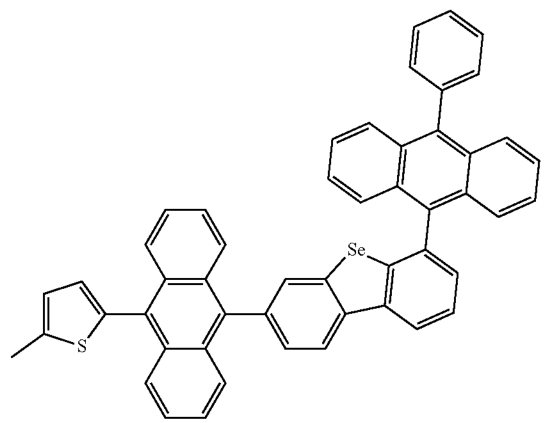
1735
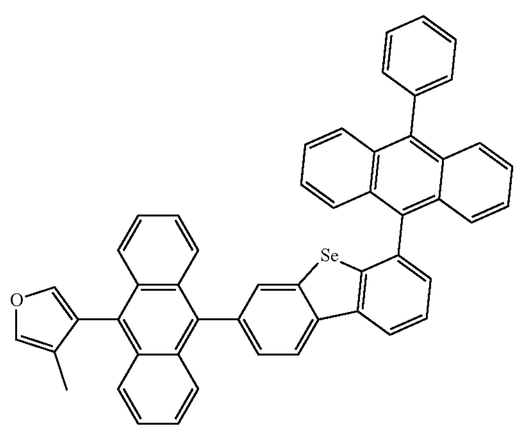
1736
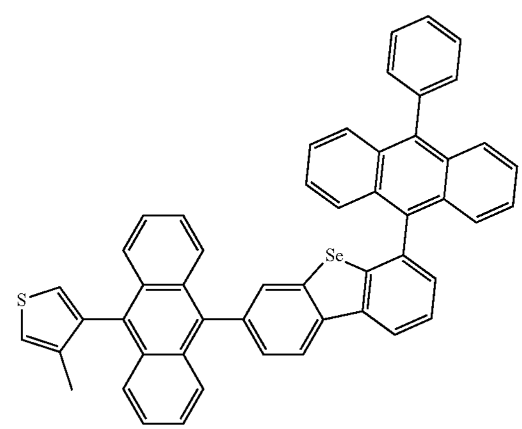

-continued
1737
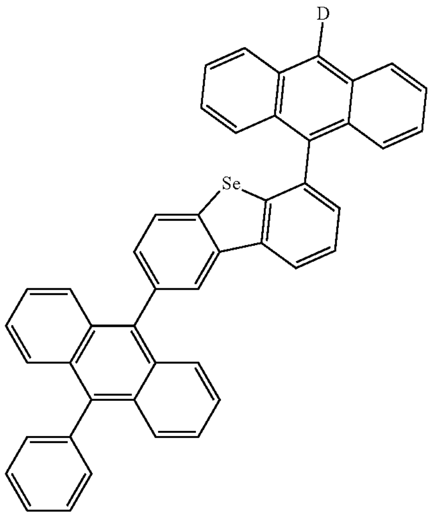
1738
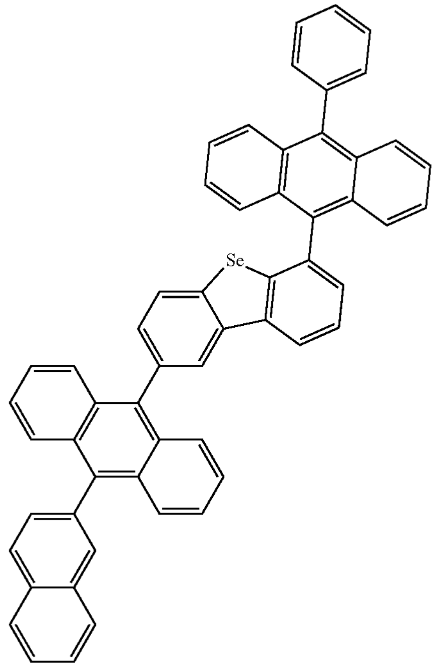
1739
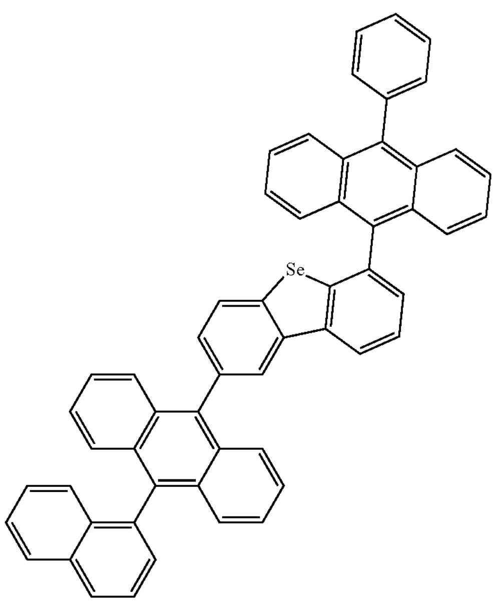
1740
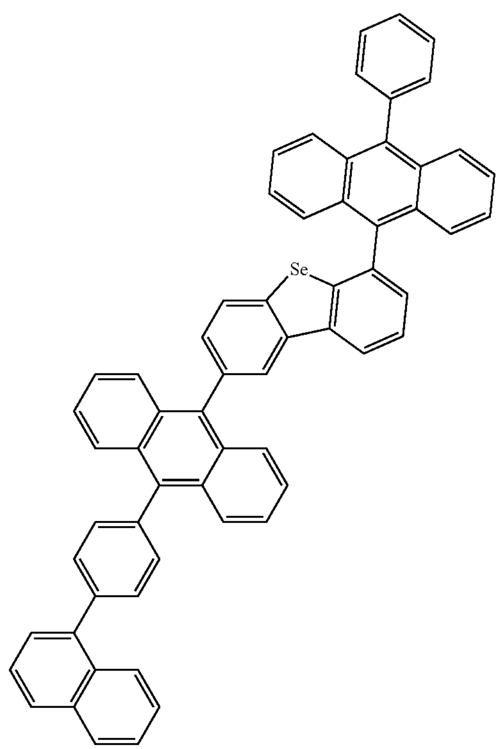

-continued
1741
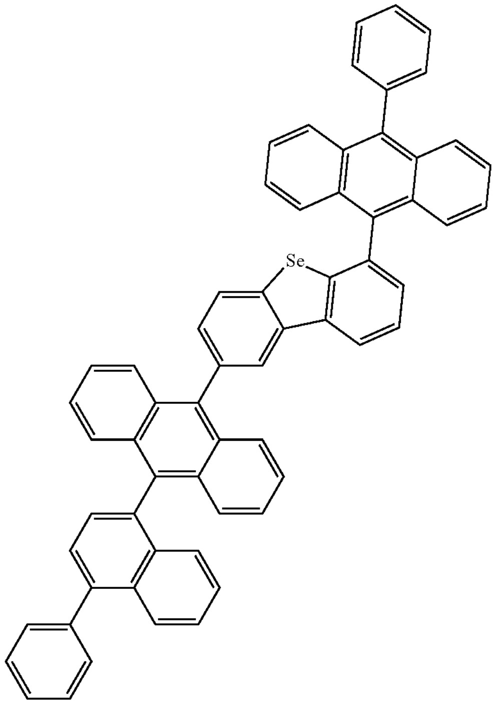
1742
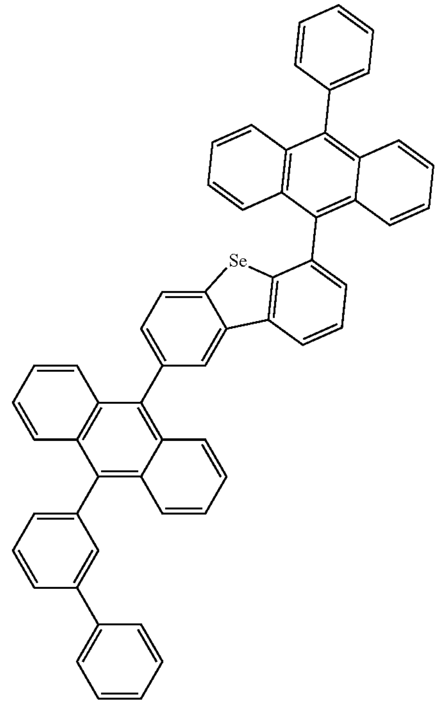
1743
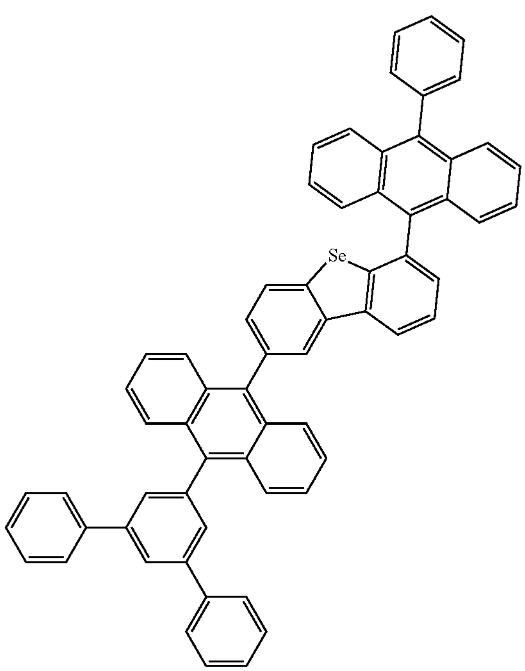
1744
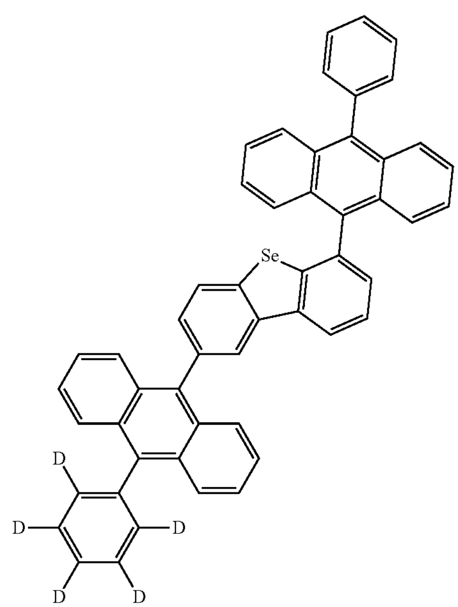

-continued
1745
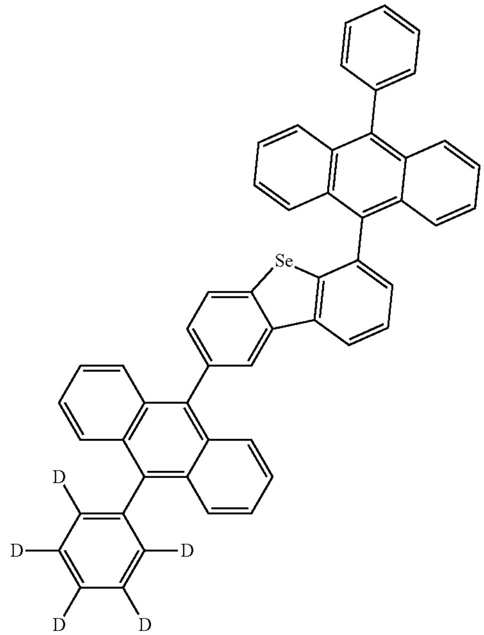
1746
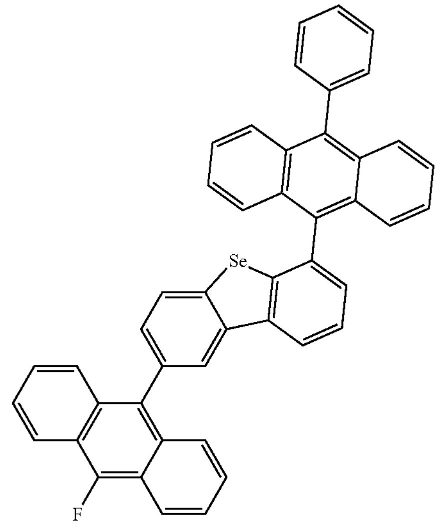
1747
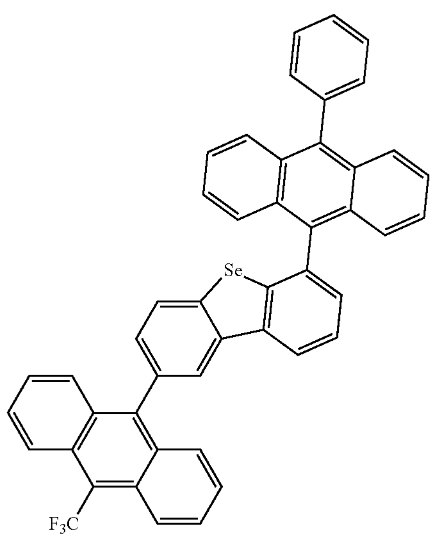
1748
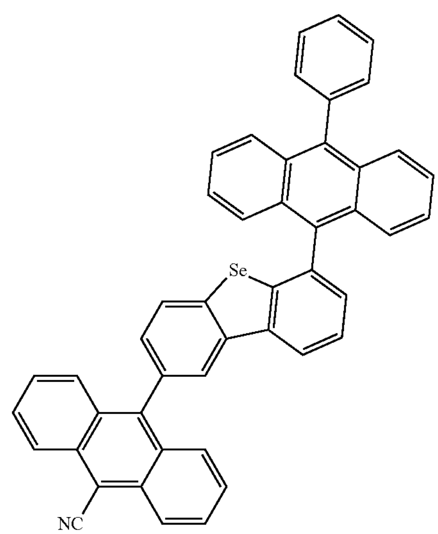

-continued
1749
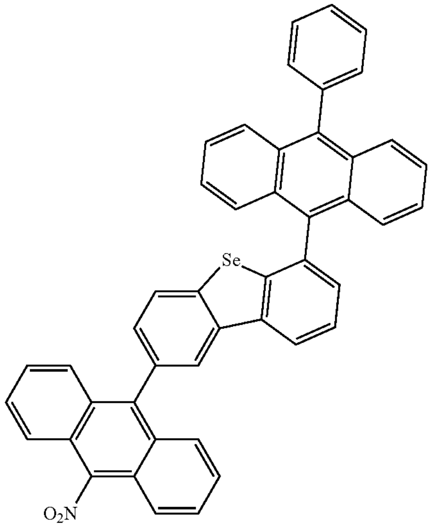
1750
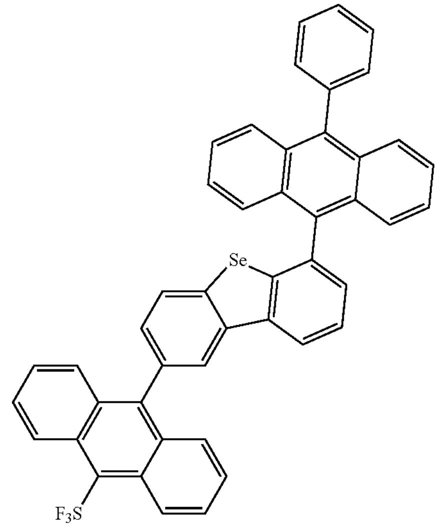
1751
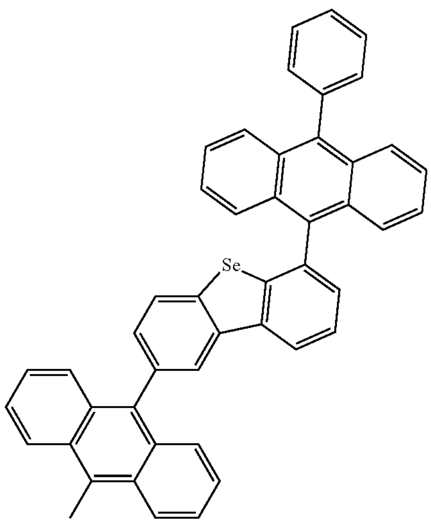
1752
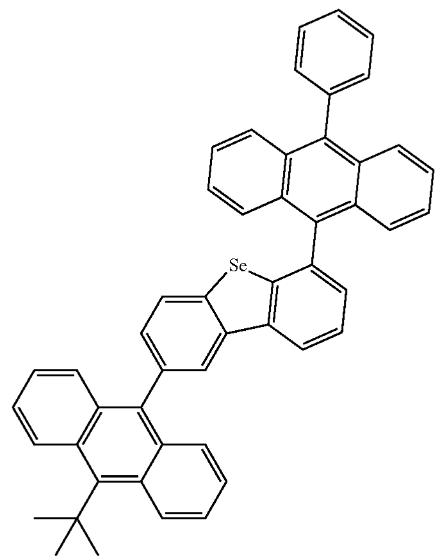
1753
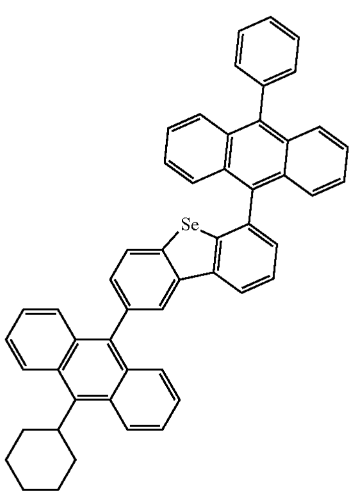
1754
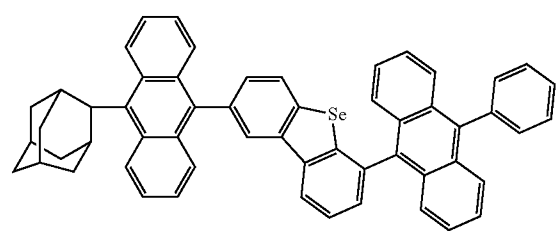

-continued
1755
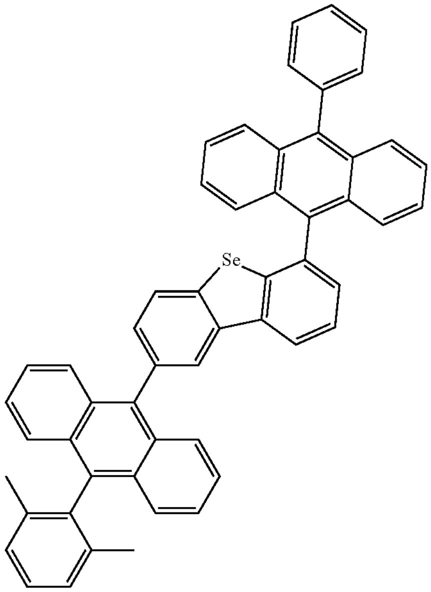
1756
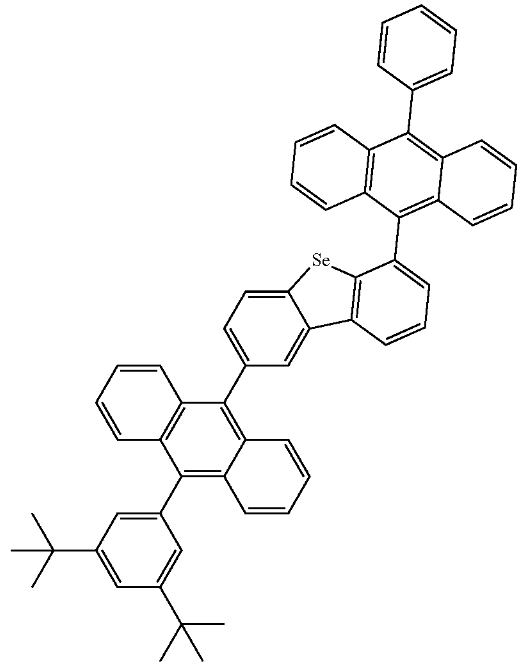
1757
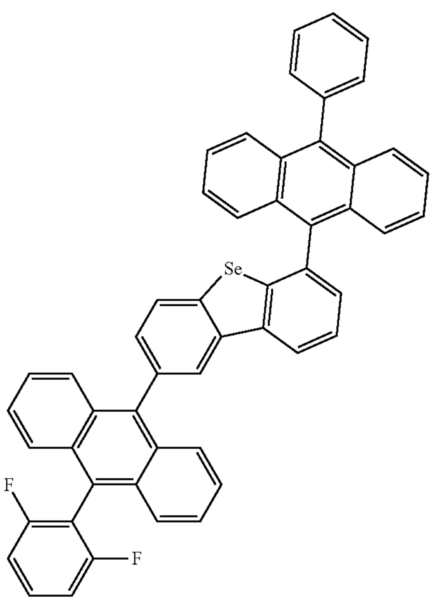
1758
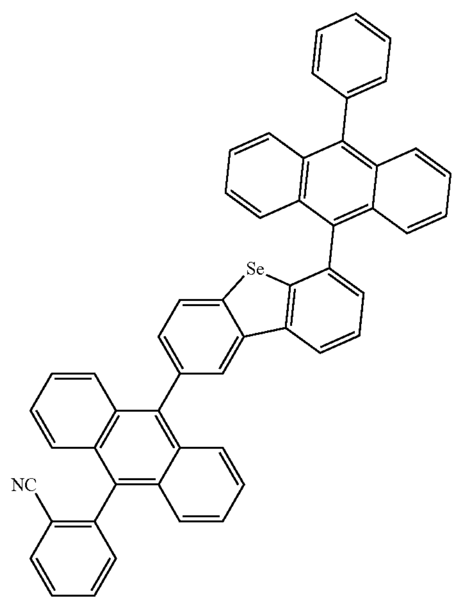

-continued
1759
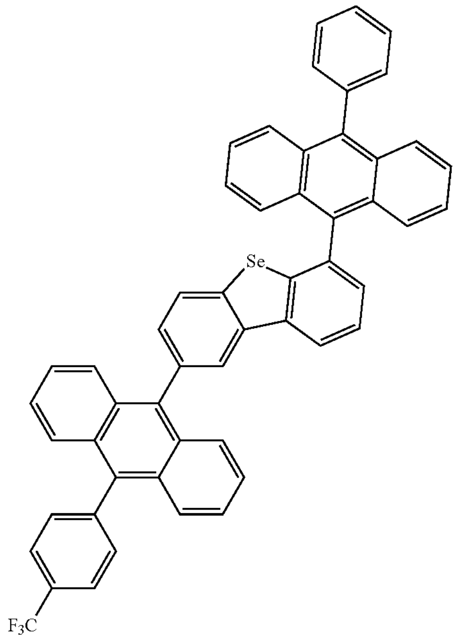
1760
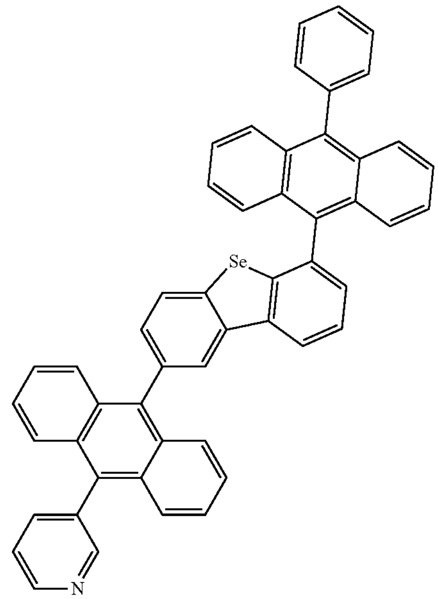
1761
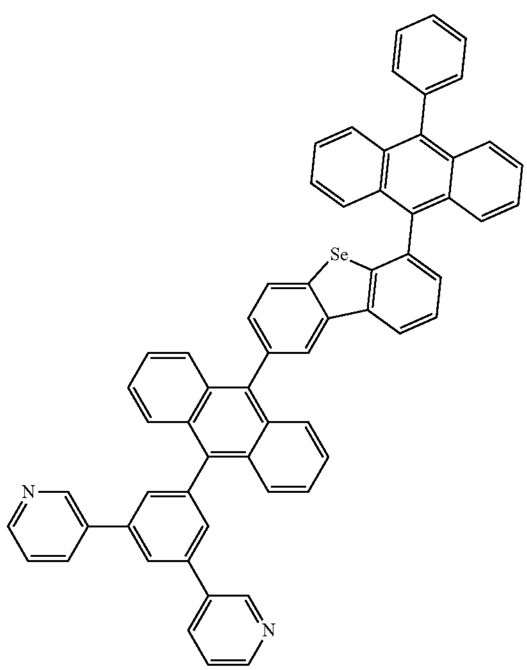
1762
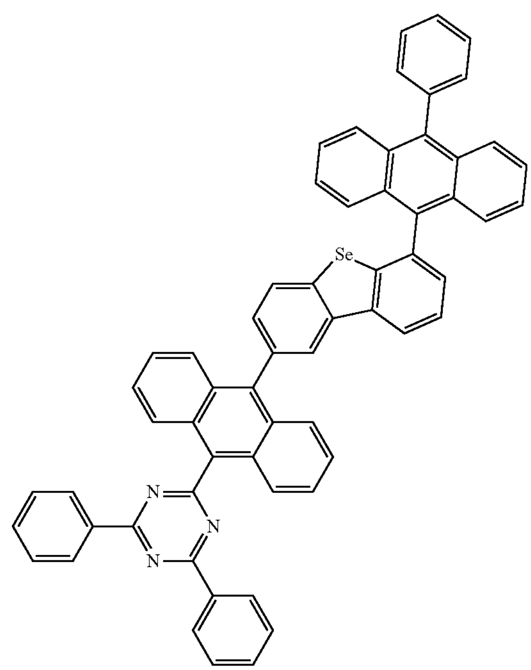

-continued
1763
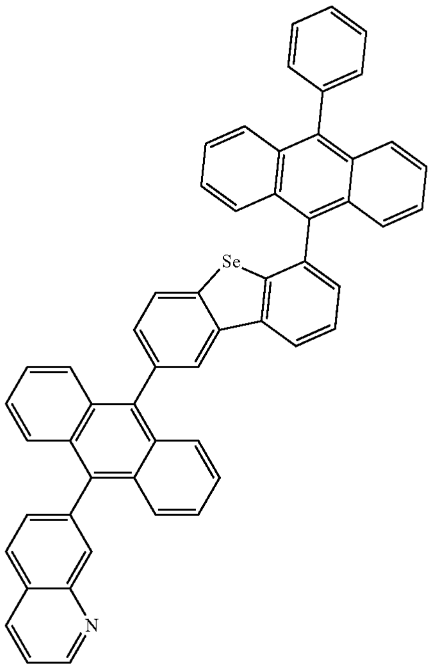
1764
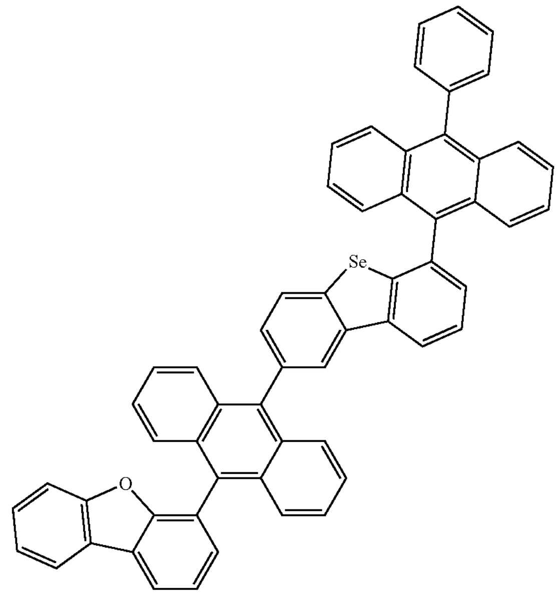
1765
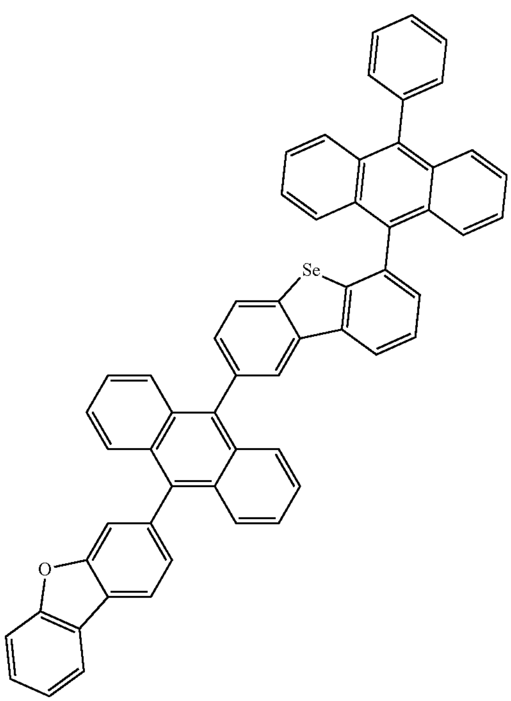
1766
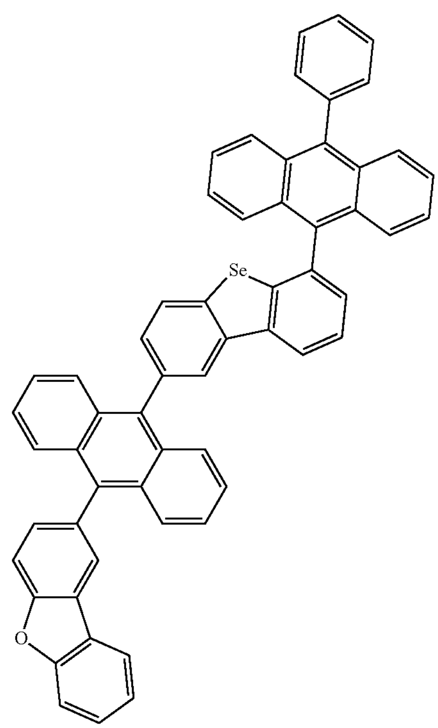

-continued
1767
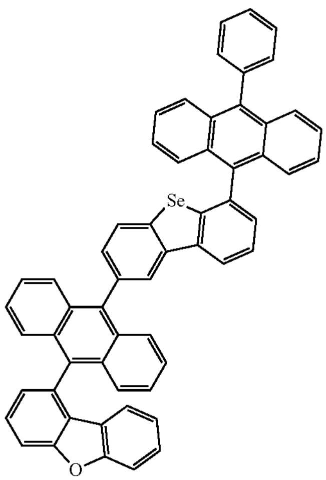
1768
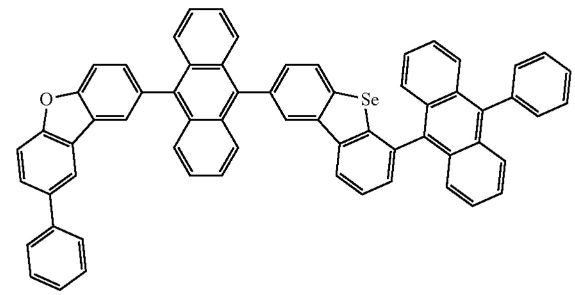
1769
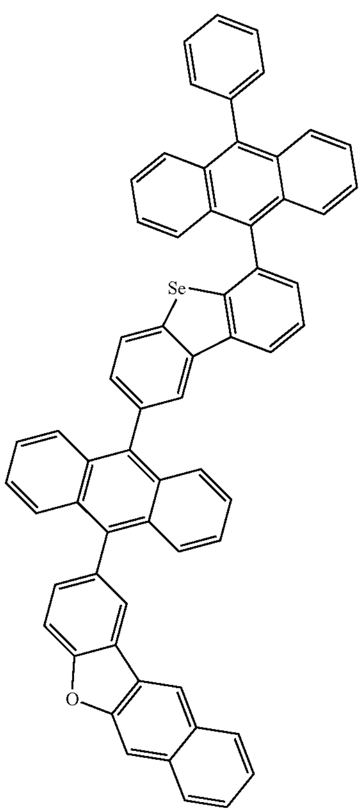
1770
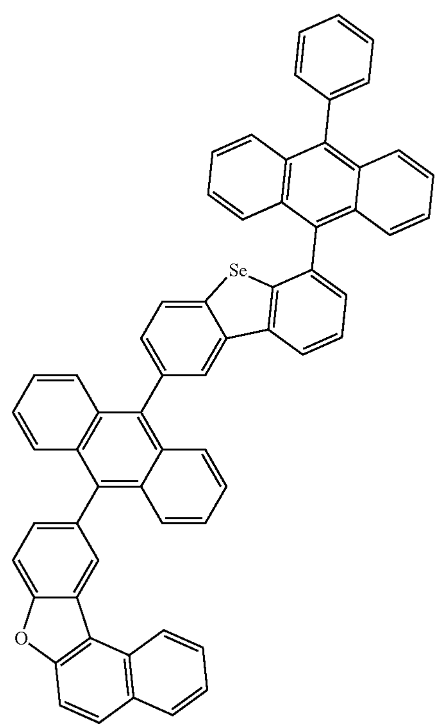

-continued
1771
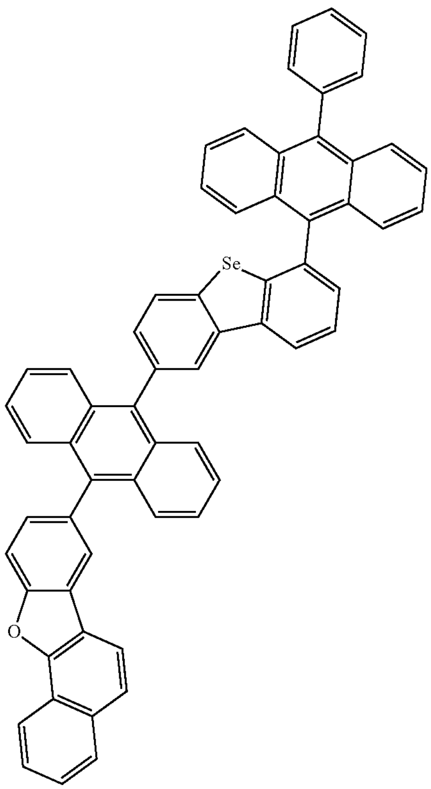
1772
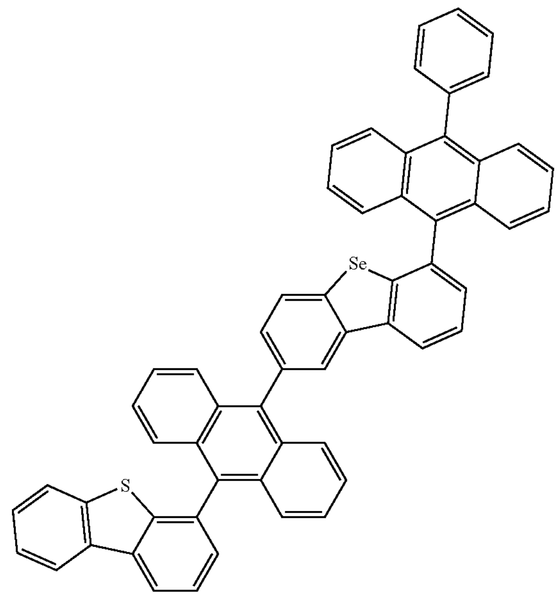
1773
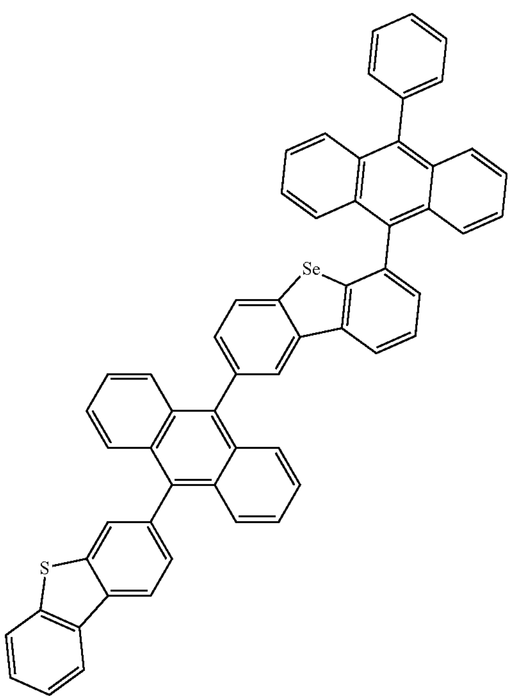
1774
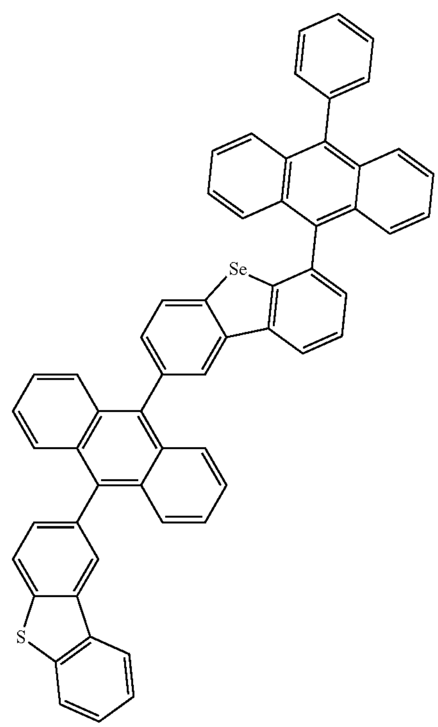

-continued
1775
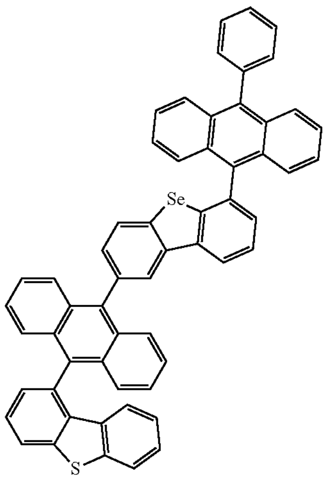
1776
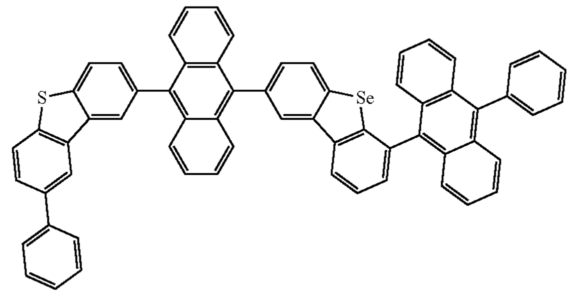
1777
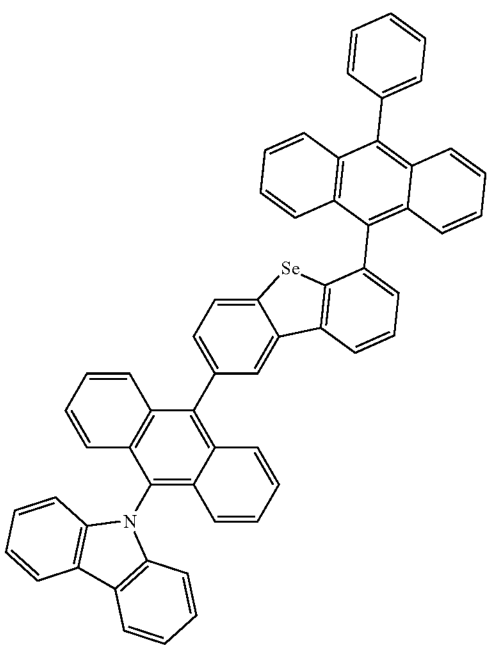
1778
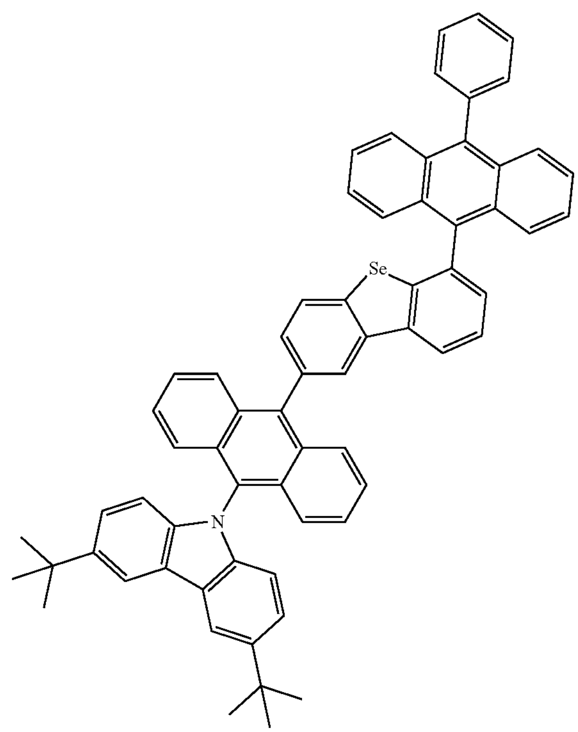
1779
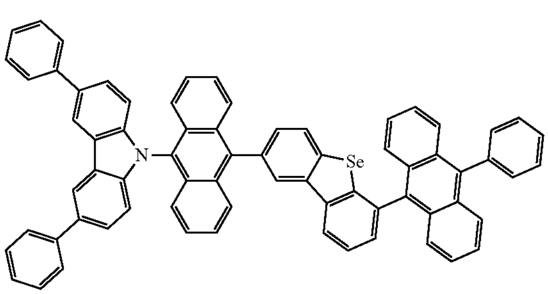
1780
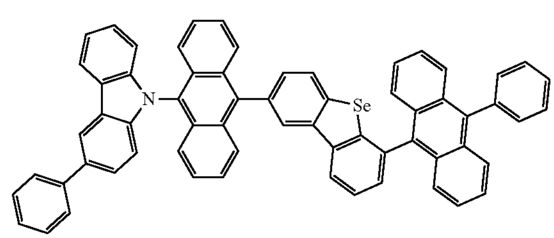

-continued
1781
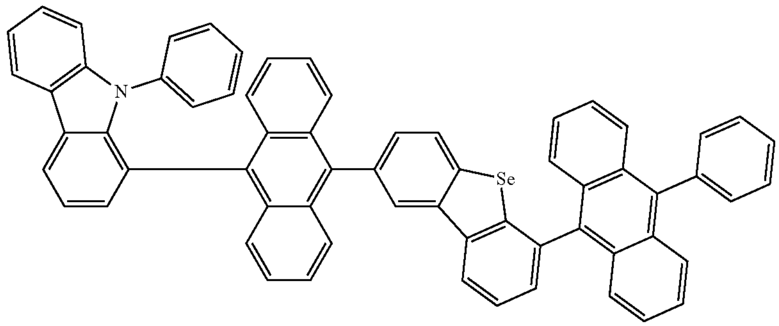
1782
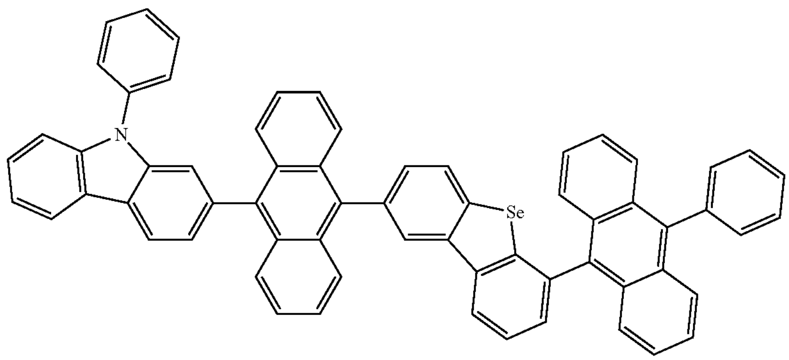
1783
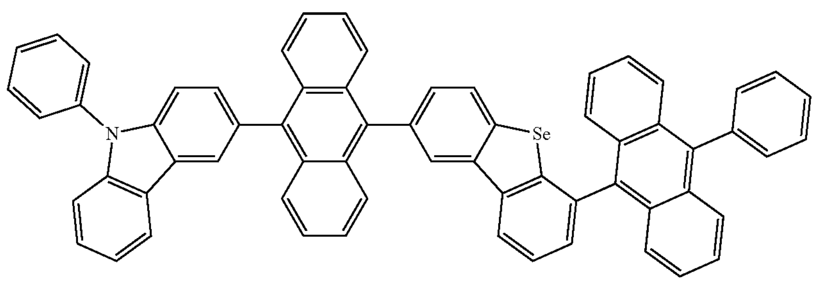
1784
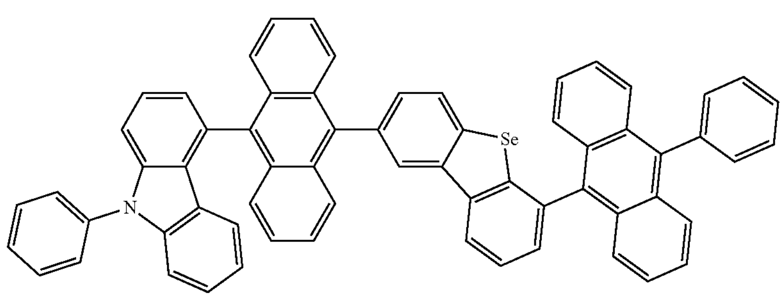

-continued
1785
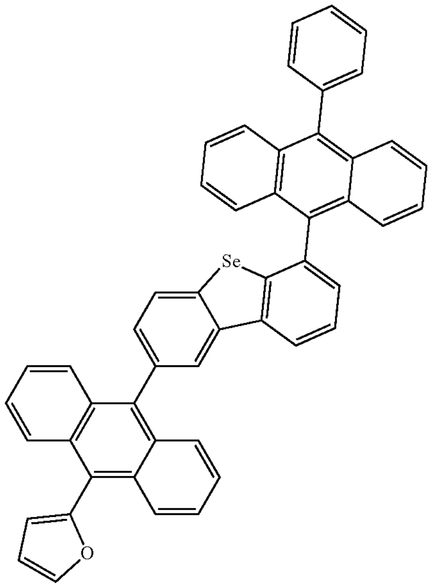
1786
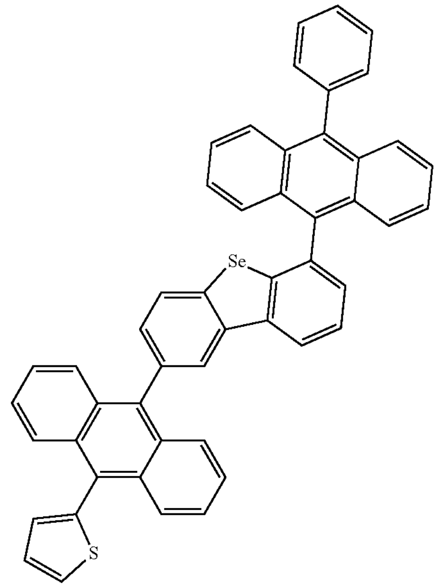
1787
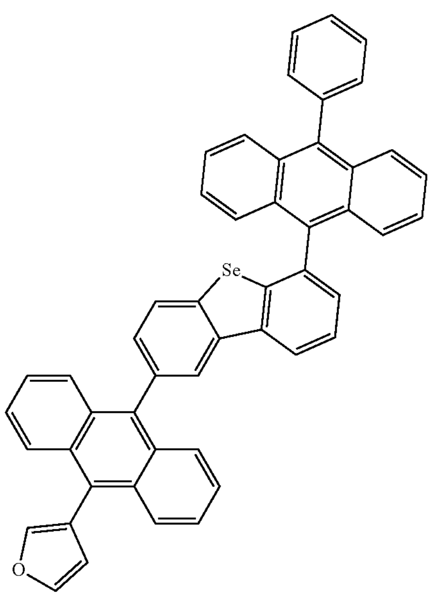
1788
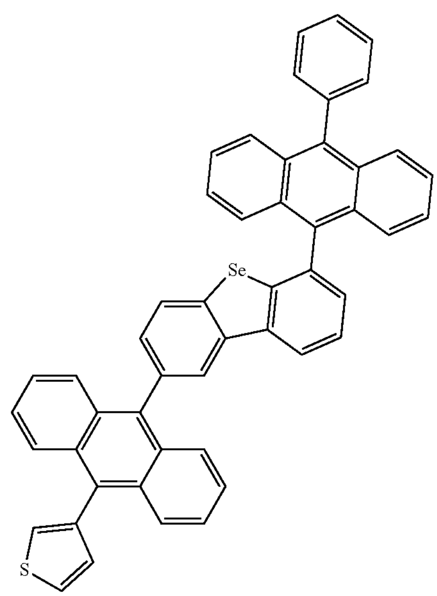

-continued
1789
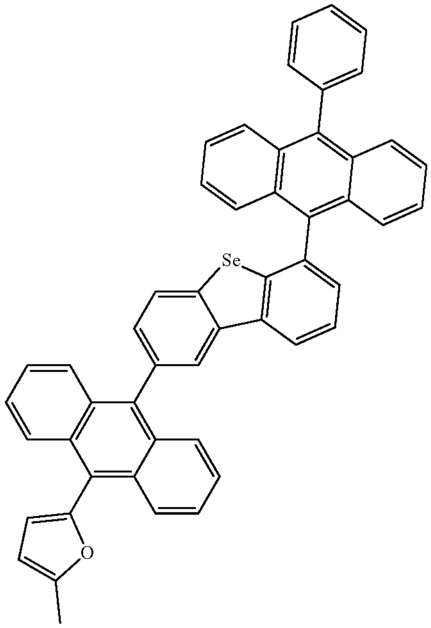
1790
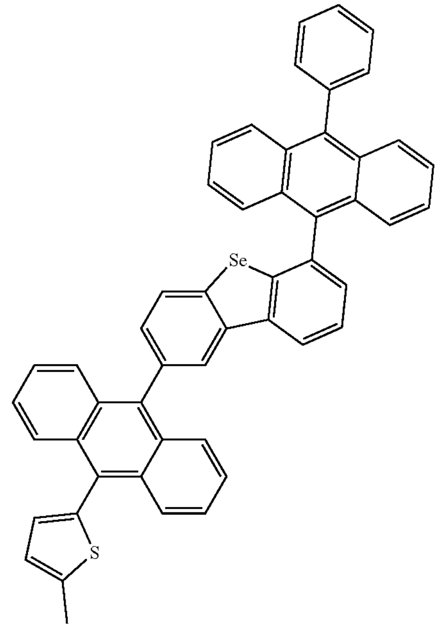
1791
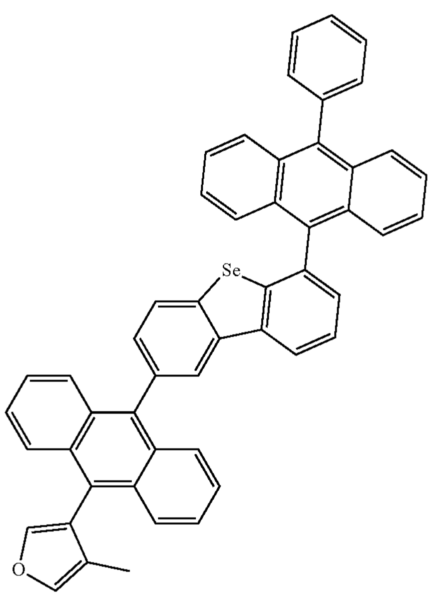
1792
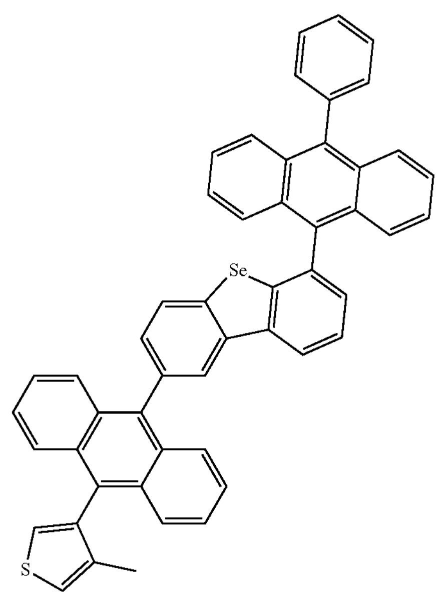

-continued
1793
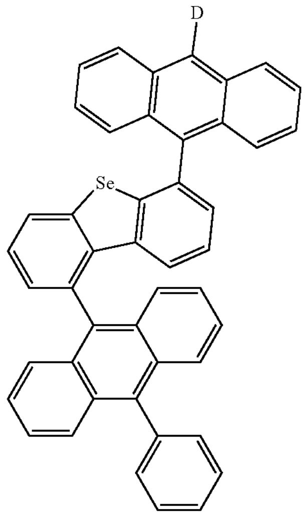
1794
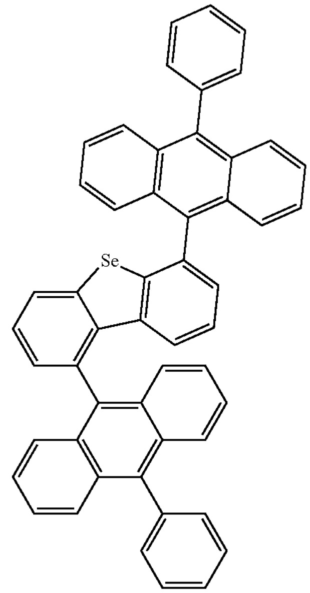
1795
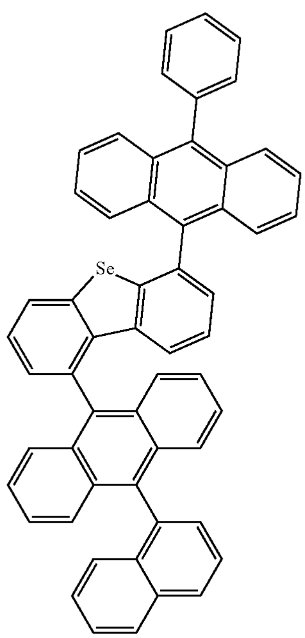
1796
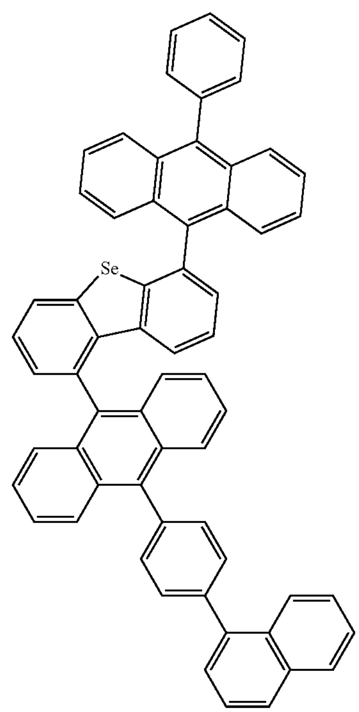

-continued
1797
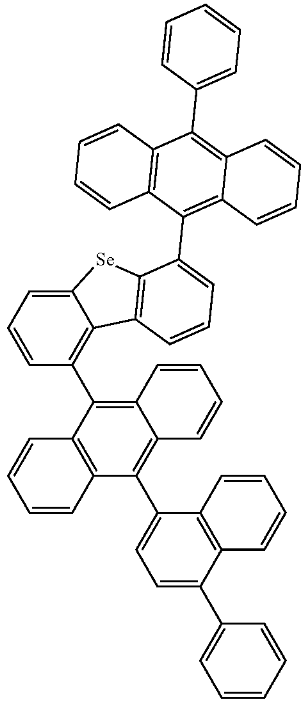
1798
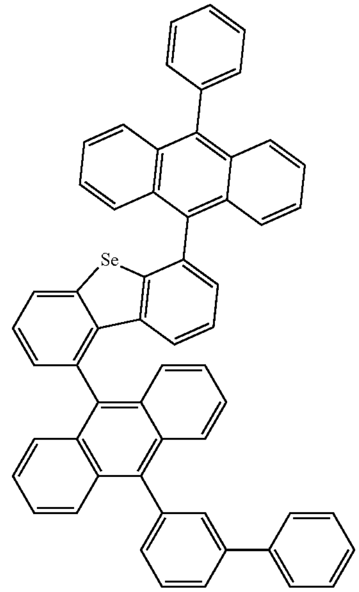
1799
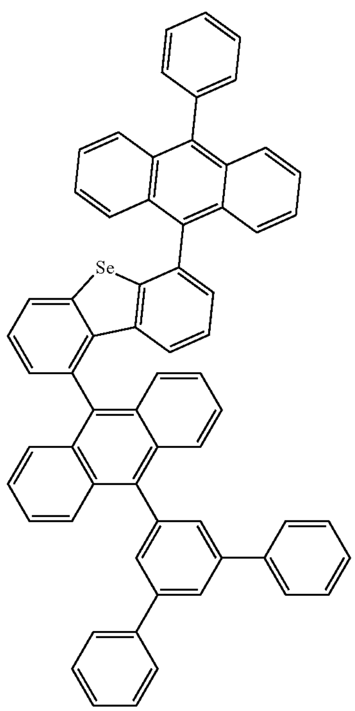
1800
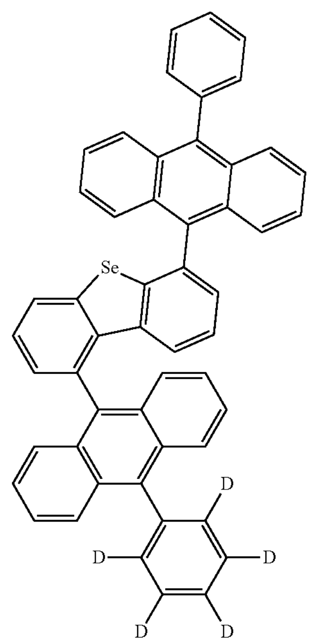

1801
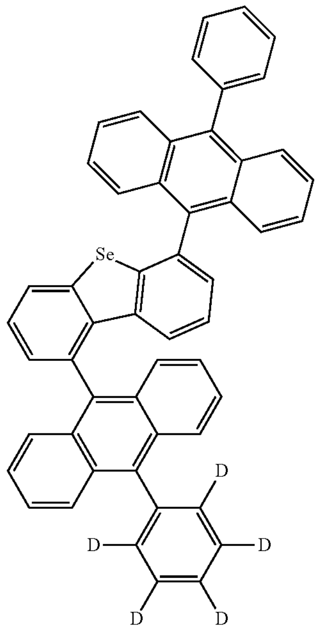
1802
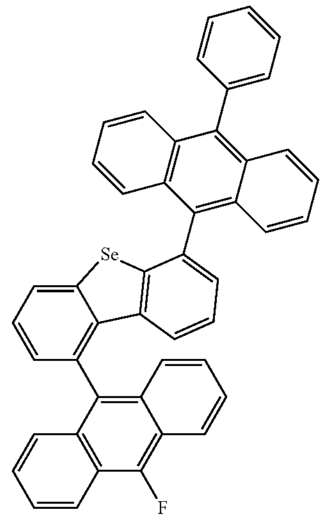
1803
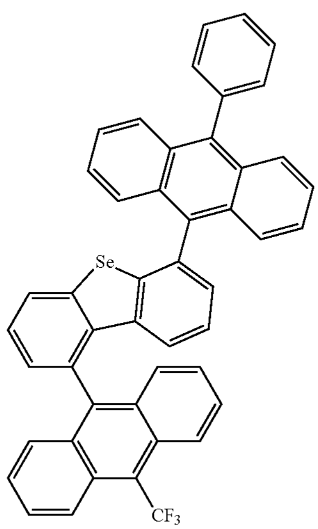
1804
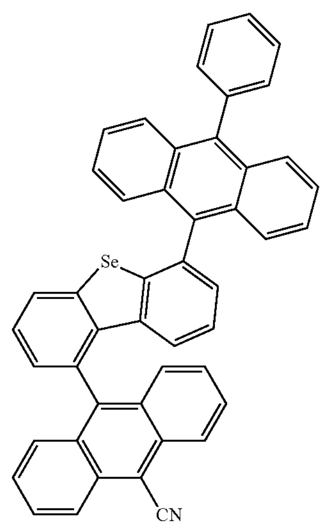

-continued
1805
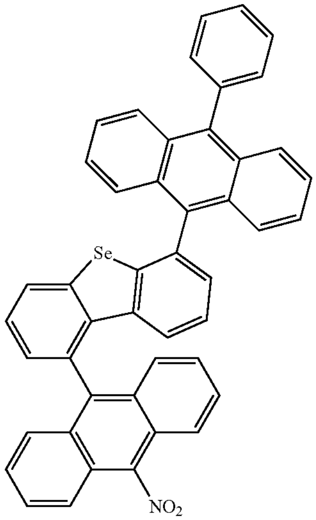
1806
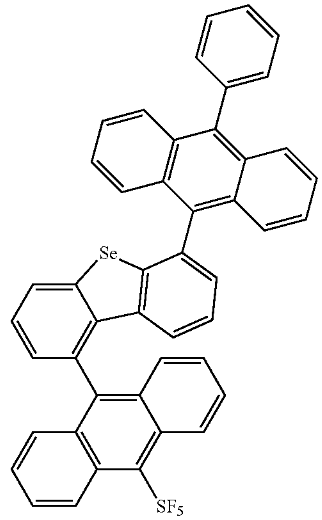
1807
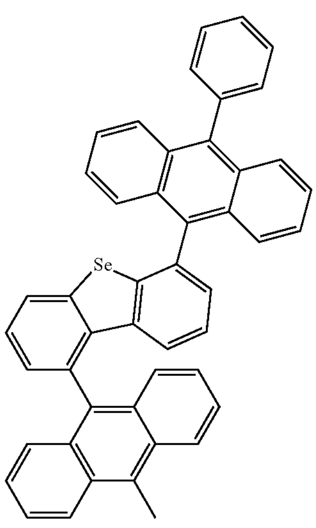
1808
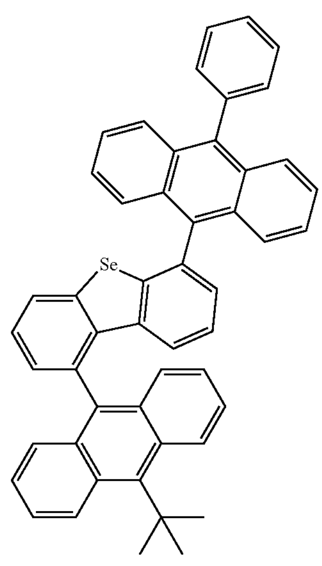

-continued
1809
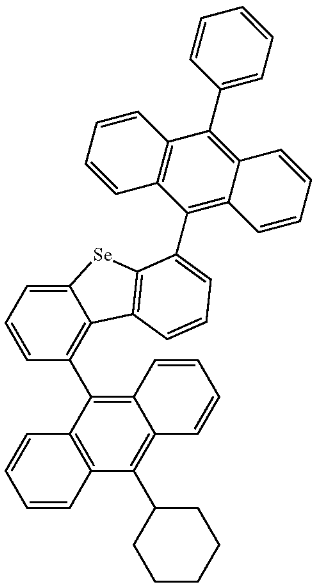
1810
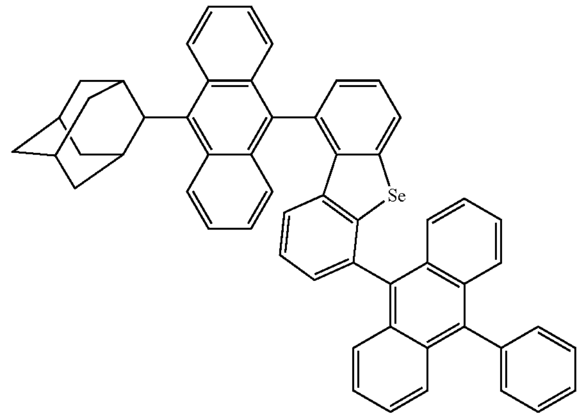
1811
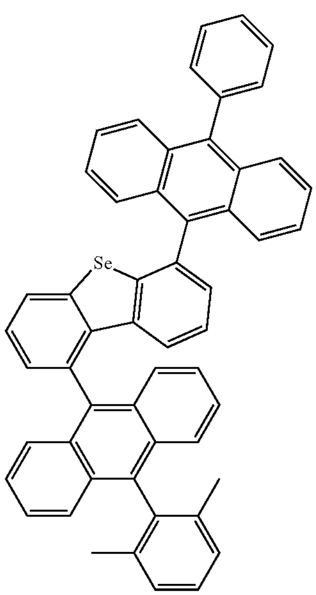
1812
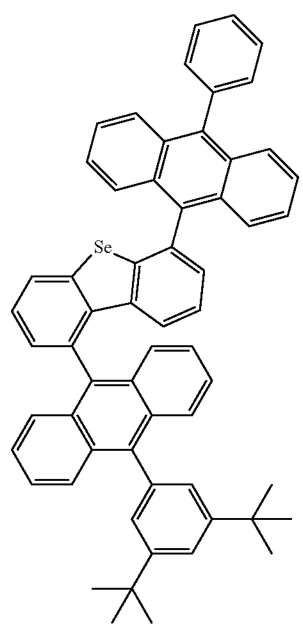

-continued
1813
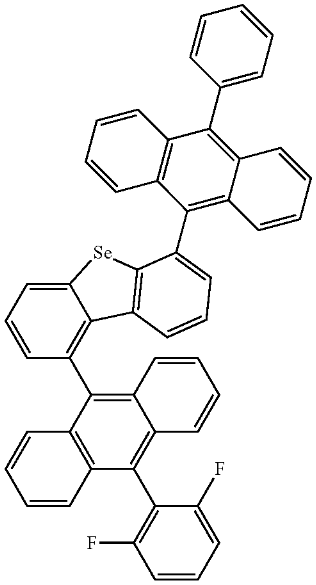
1814
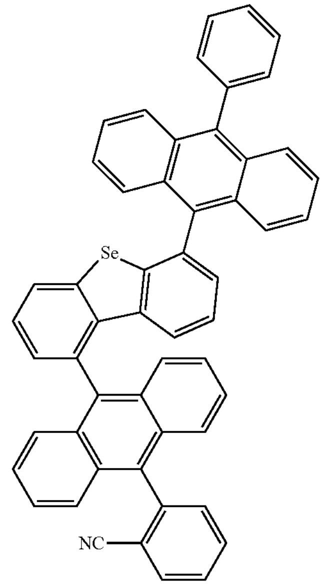
1815
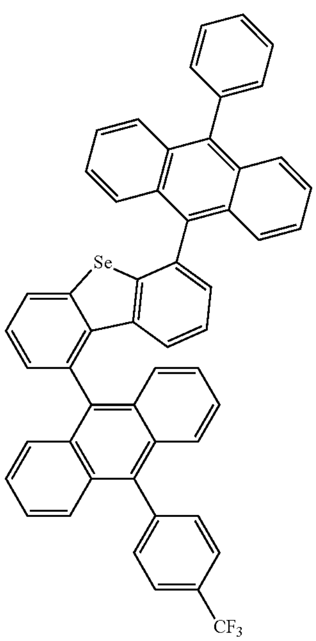
1816
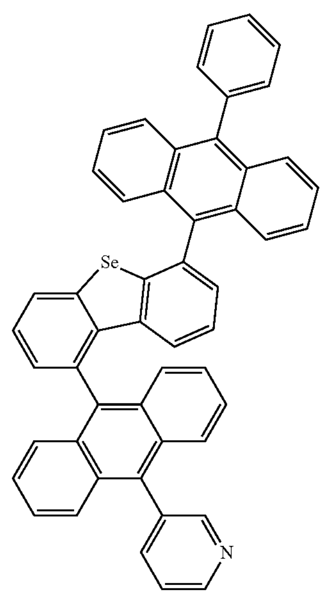

-continued
1817
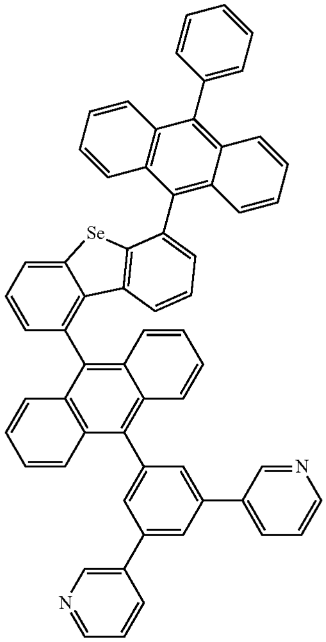
1818
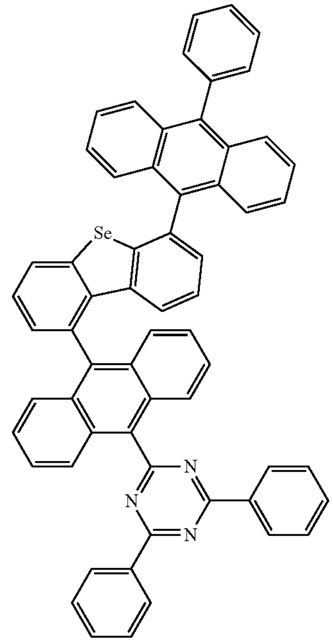
1819
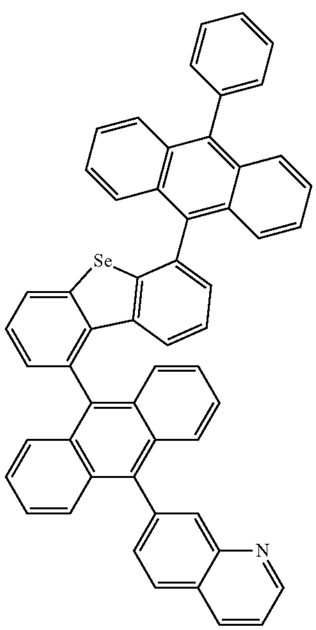
1820
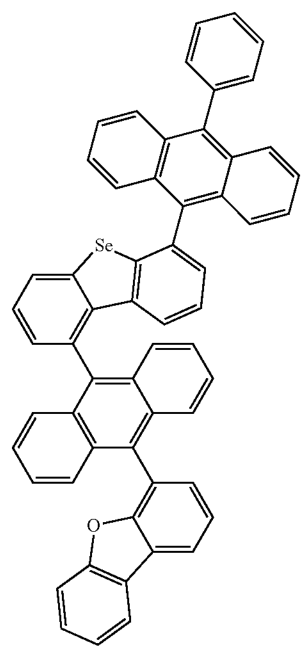

-continued
1821
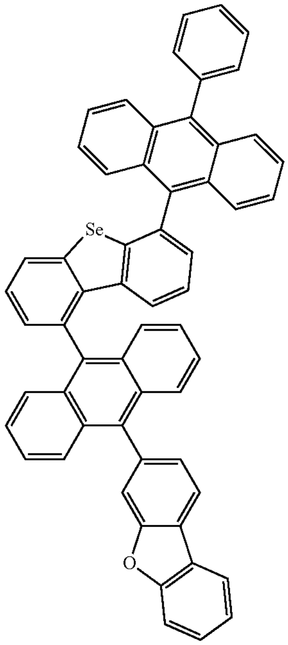
1822
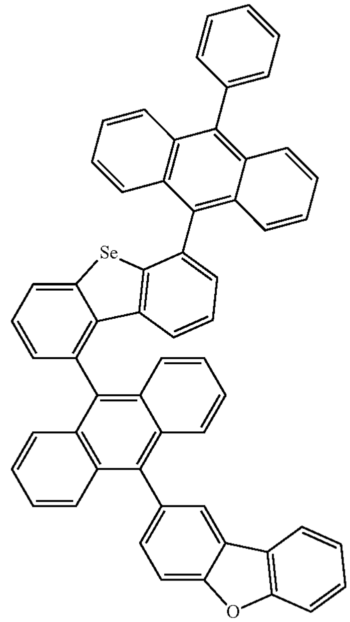
1823
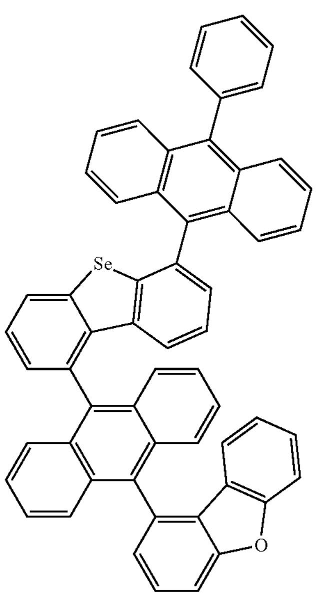
1824
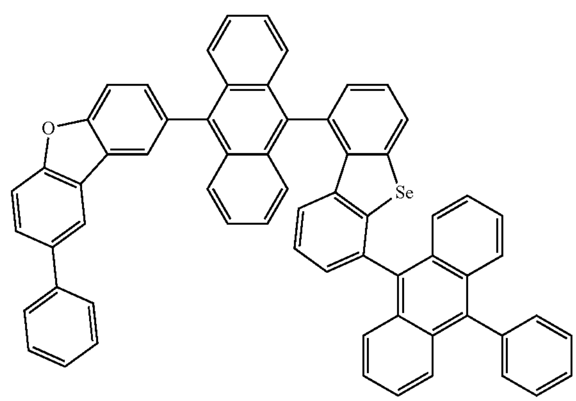

-continued
1825
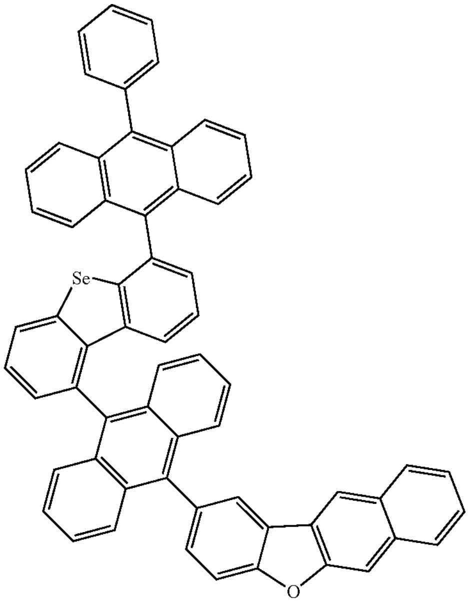
1826
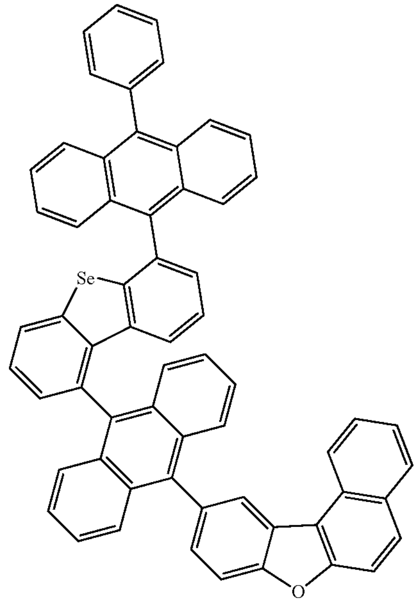
1827
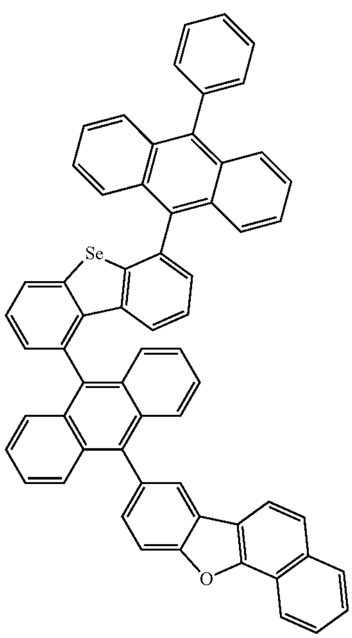
1828
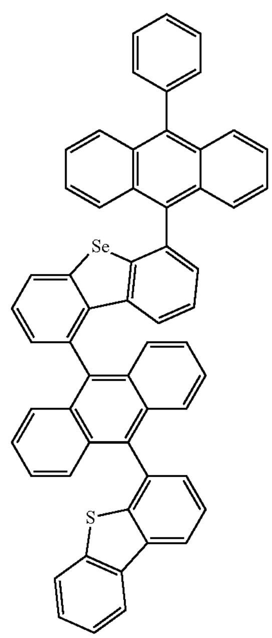

-continued
1829
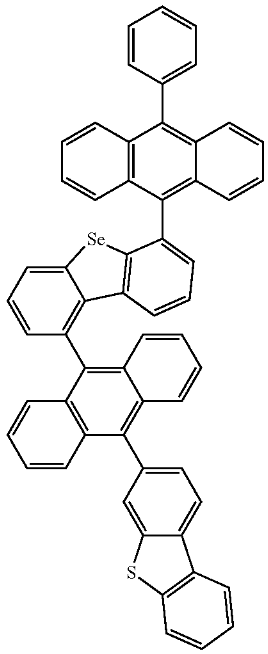
1830
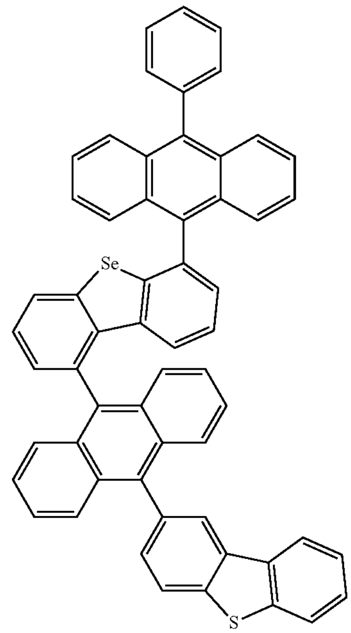
1831
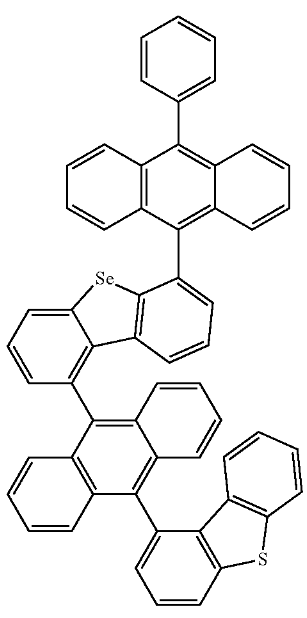
1832
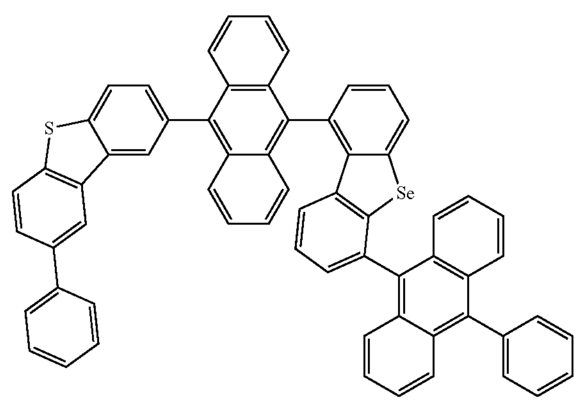

-continued
1833
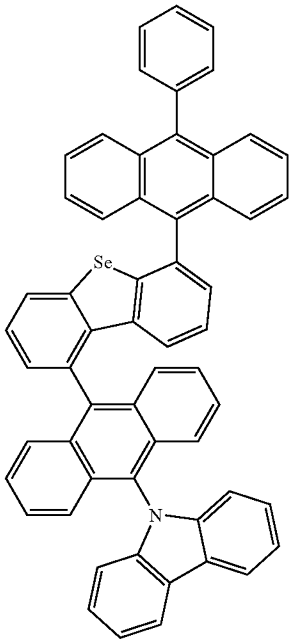
1834
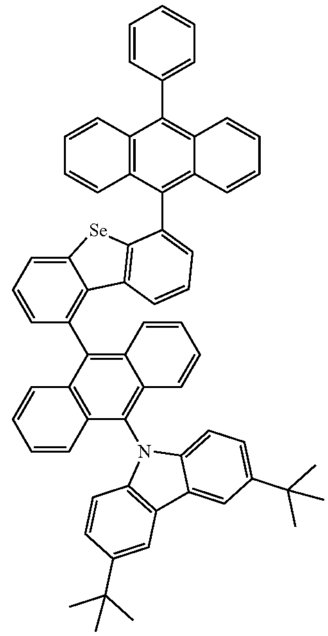
1835
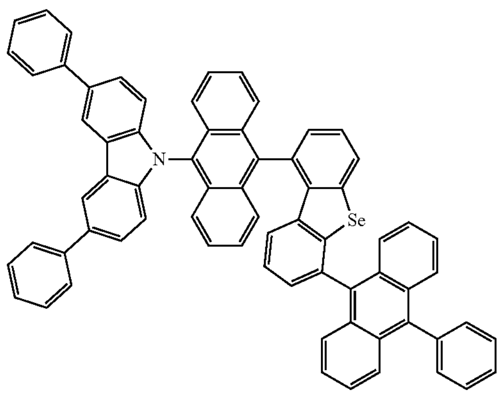
1836
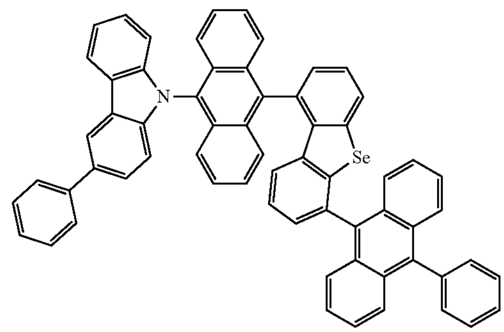
1837
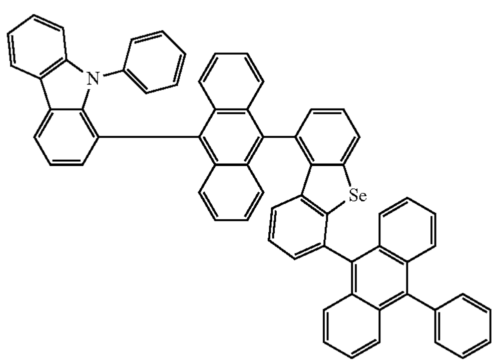
1838
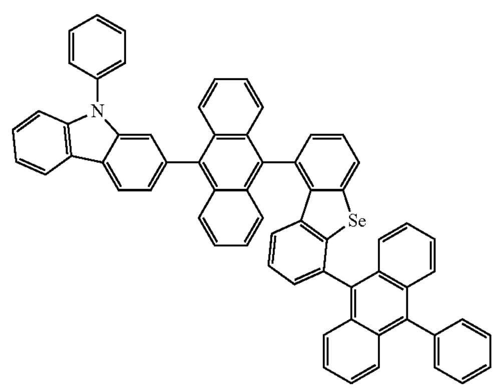

-continued
1839
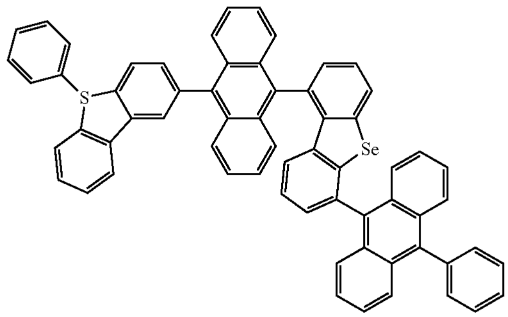
1840
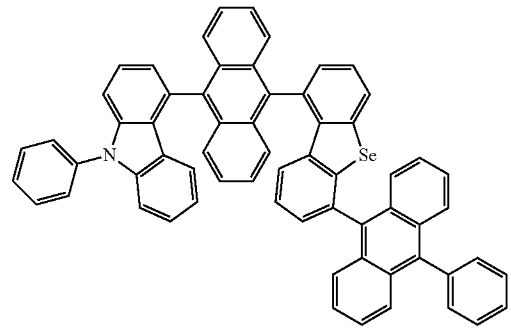
1841
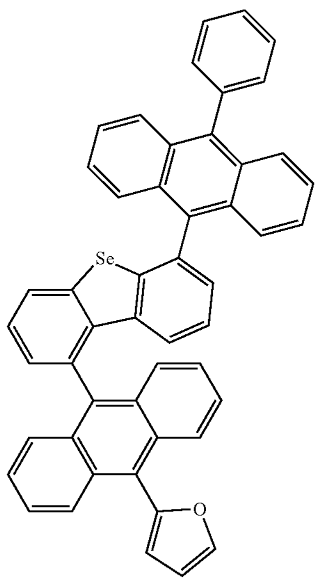
1842
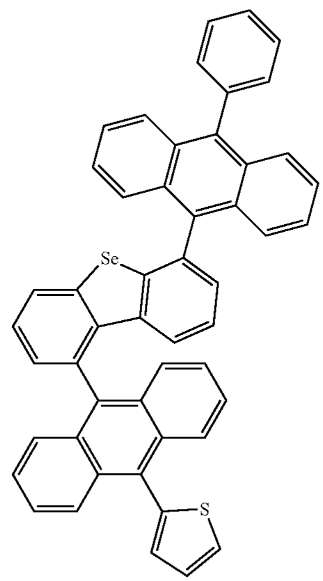
1843
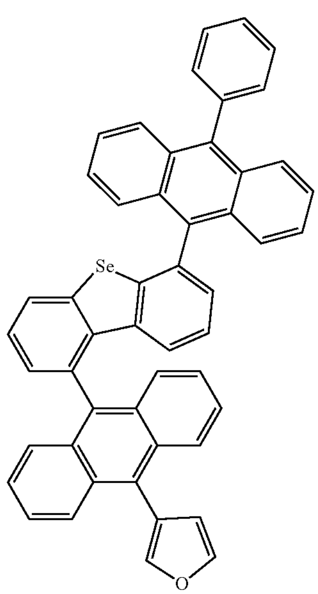
1844
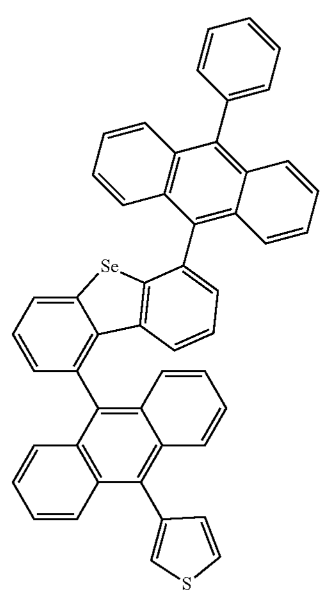

-continued
1845
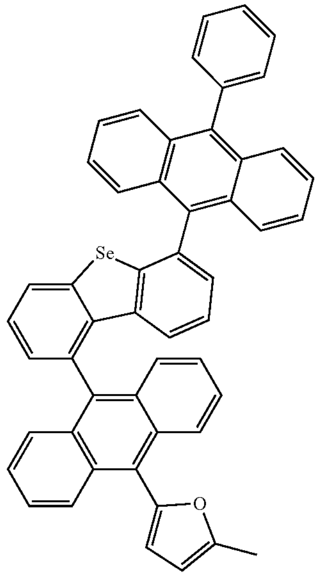
1846
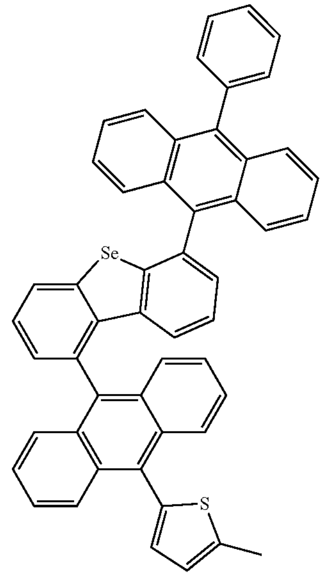
1847
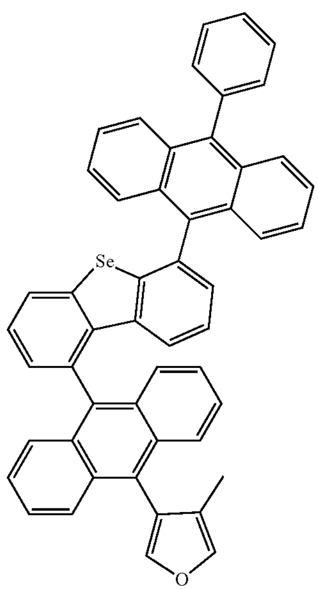
1848
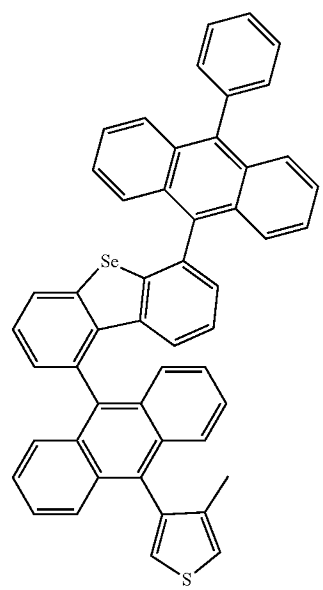
1849
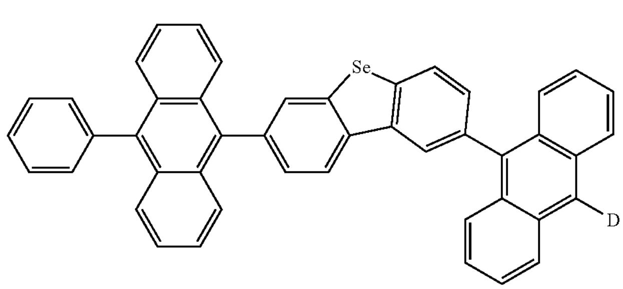

-continued
1850
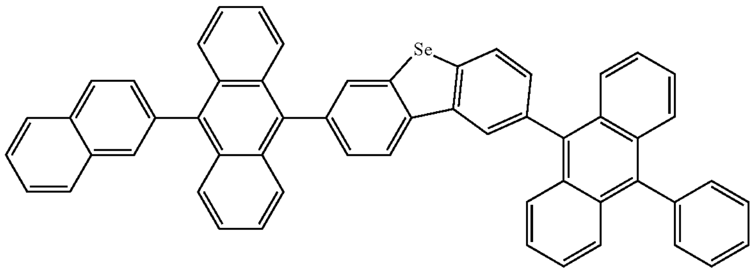
1851
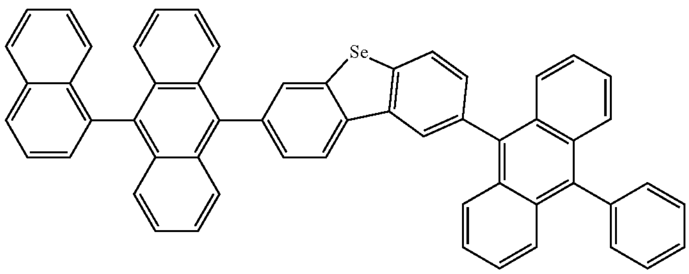
1852
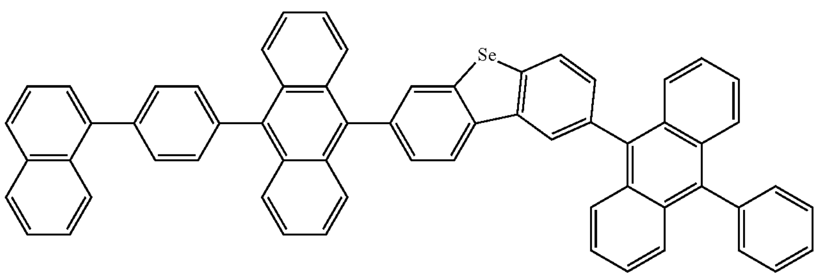
1853
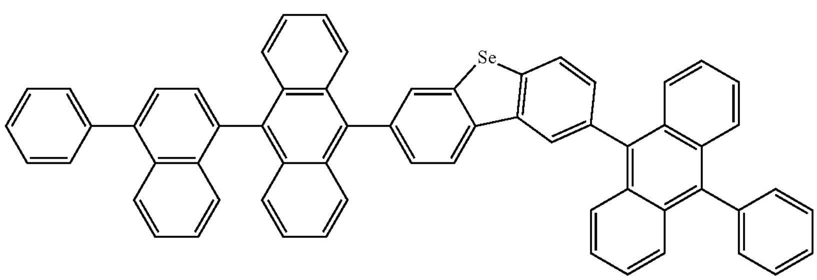
1854
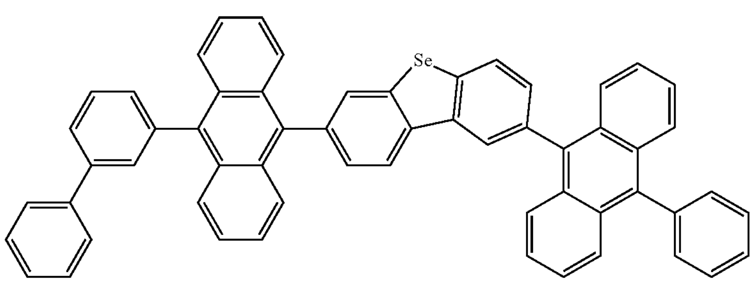

-continued
1855
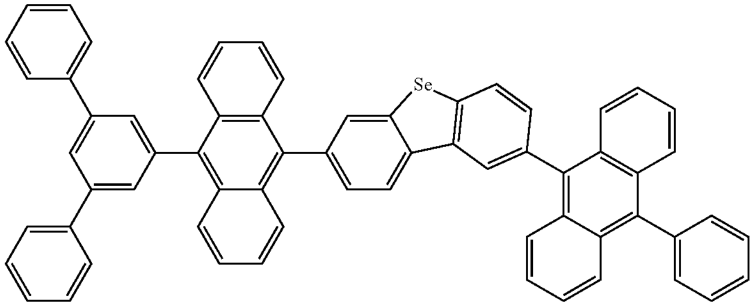
1856
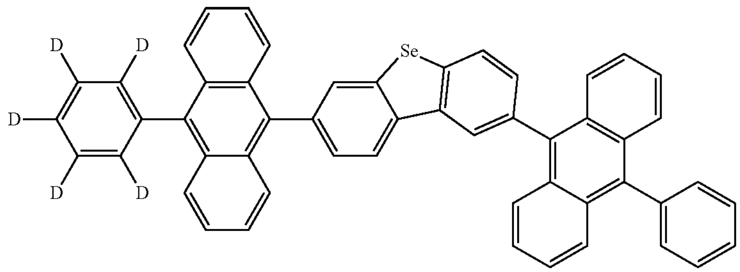
1857
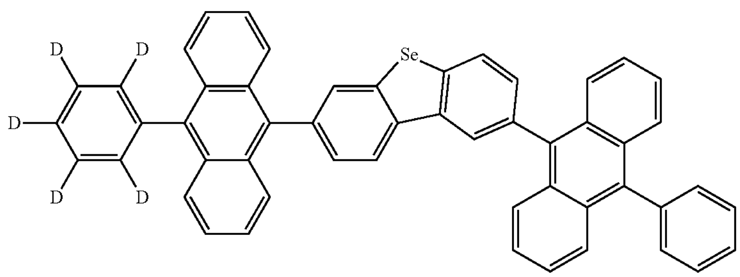
1858
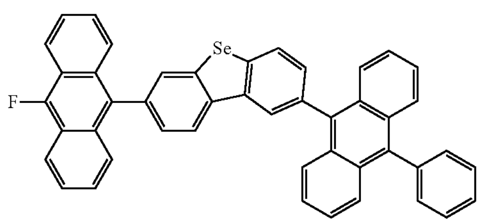
1859
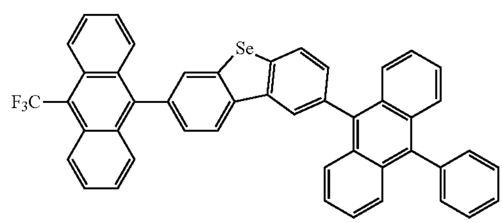
1860
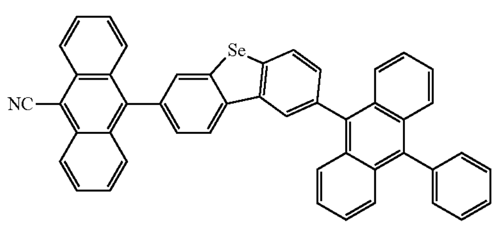
1861
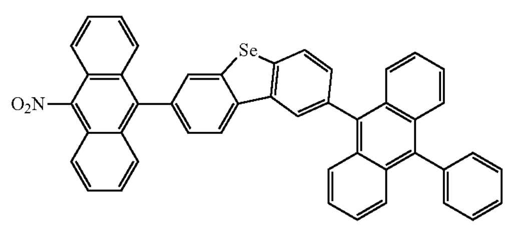
1862
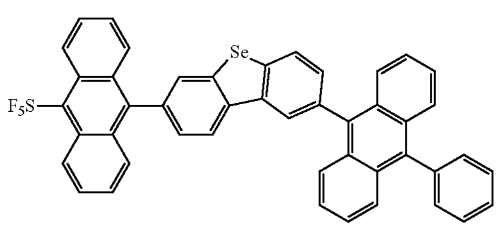
1863
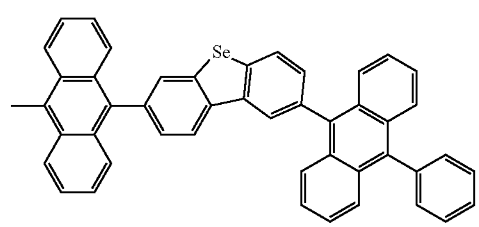

-continued
1864
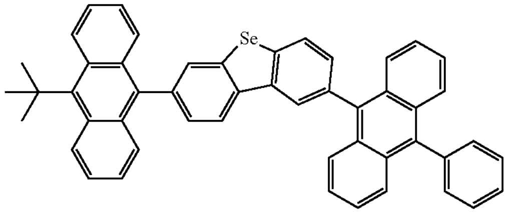
1865
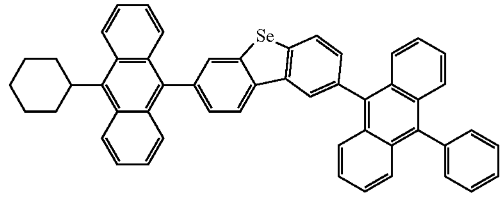
1866
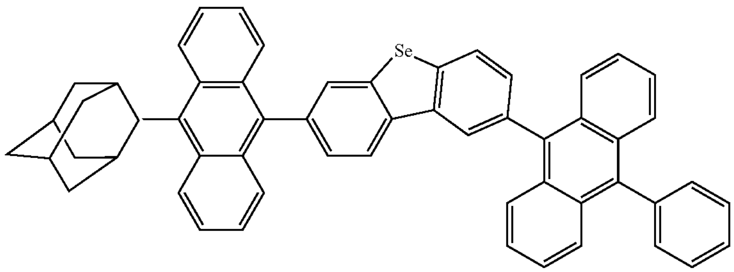
1867
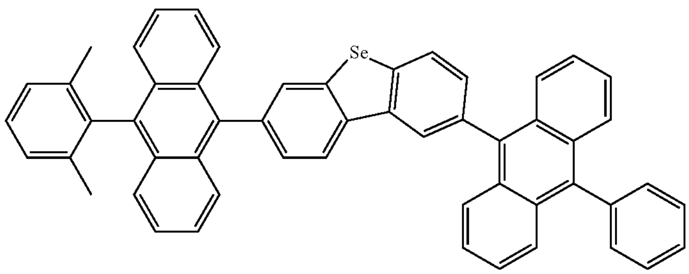
1868
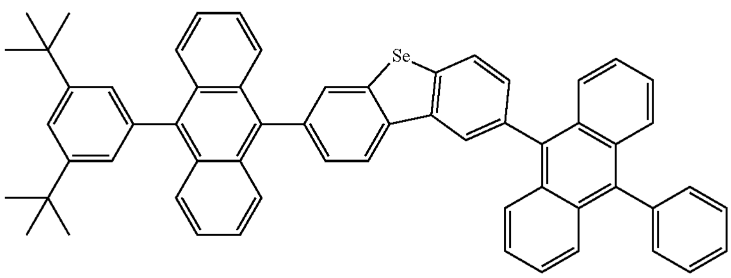
1869
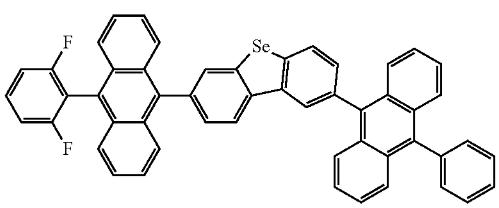
1870
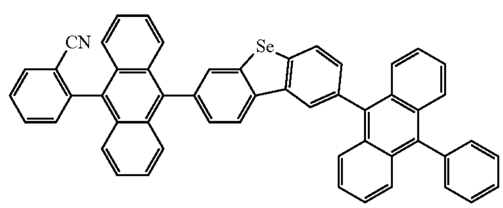
1871
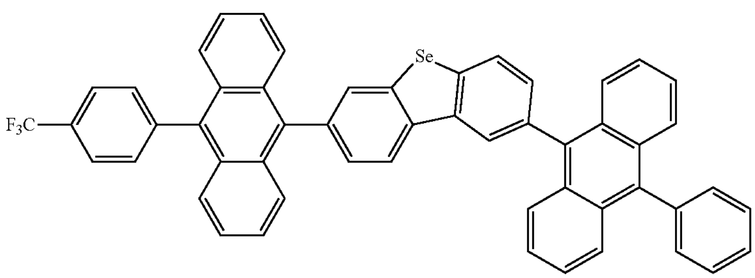

-continued
1872
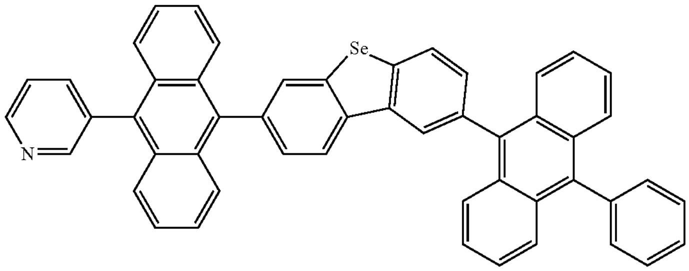
1873
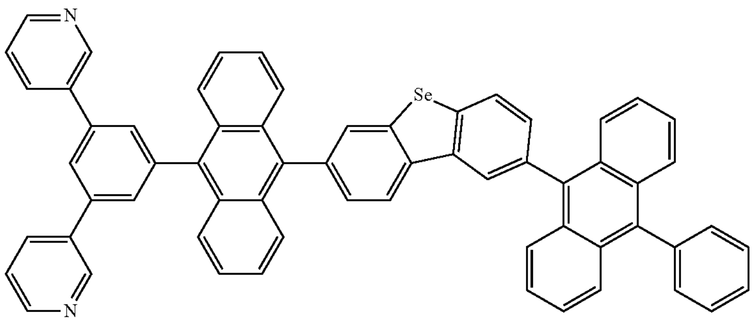
1874
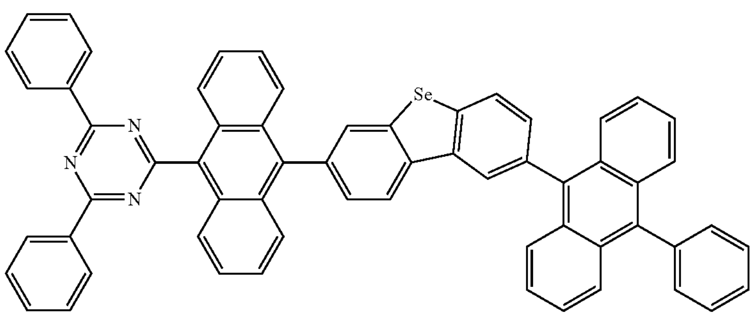
1875
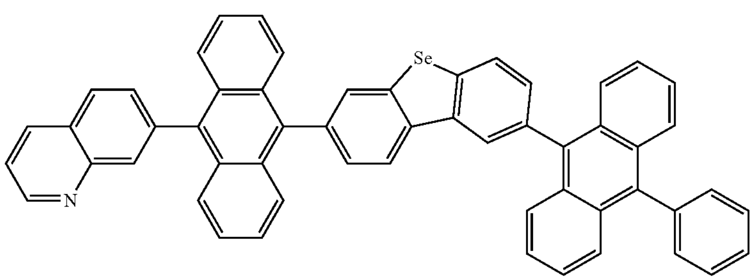
1876
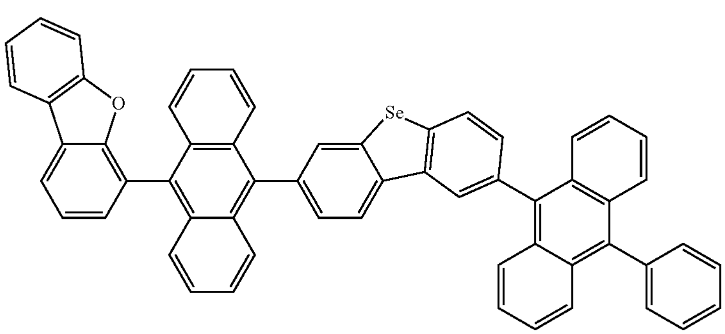

-continued
1877
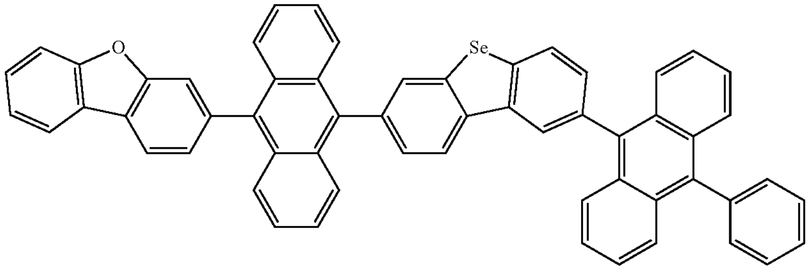
1878
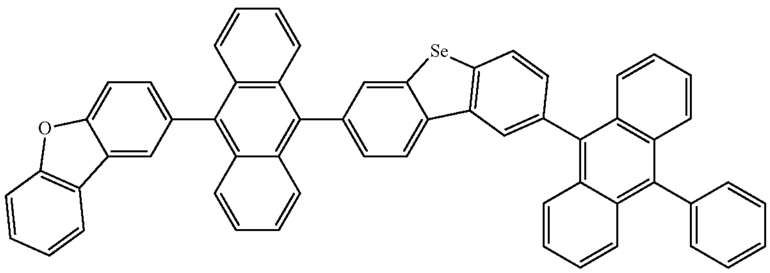
1879
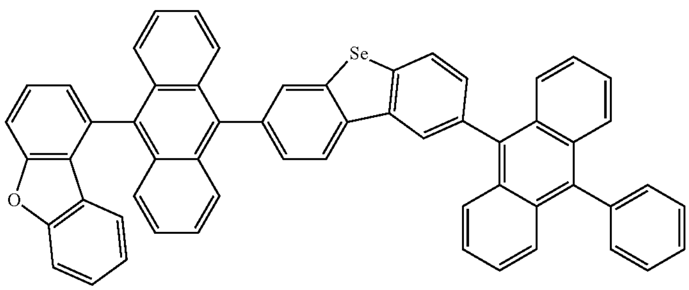
1880
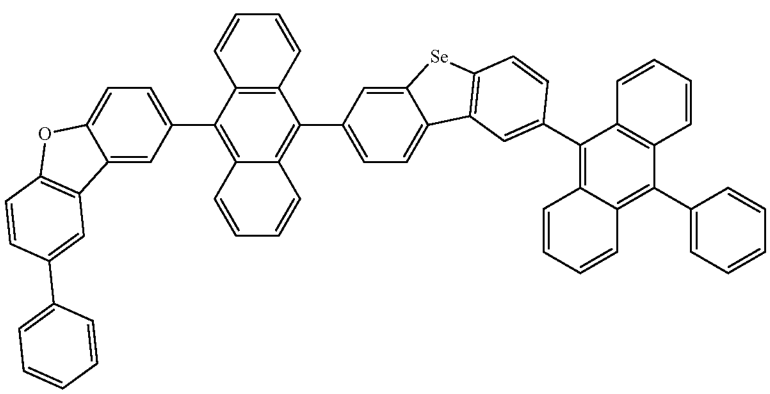
1881
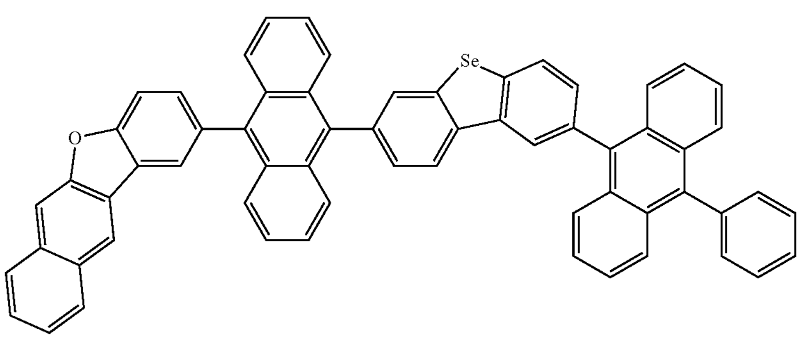

-continued
1882
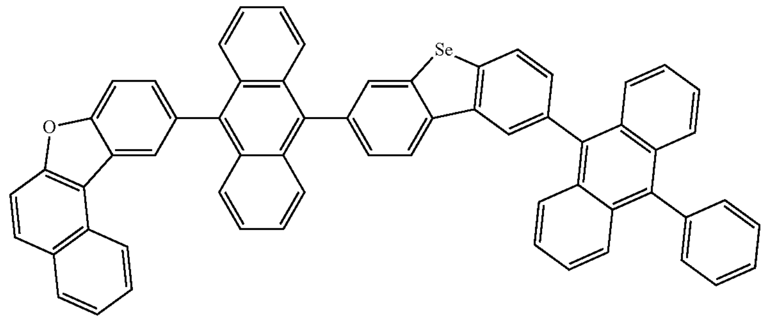
1883
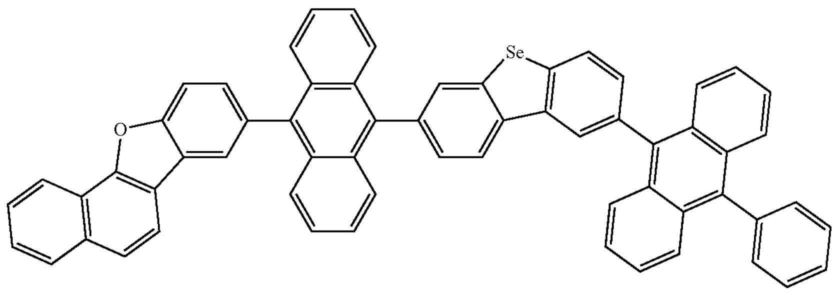
1884
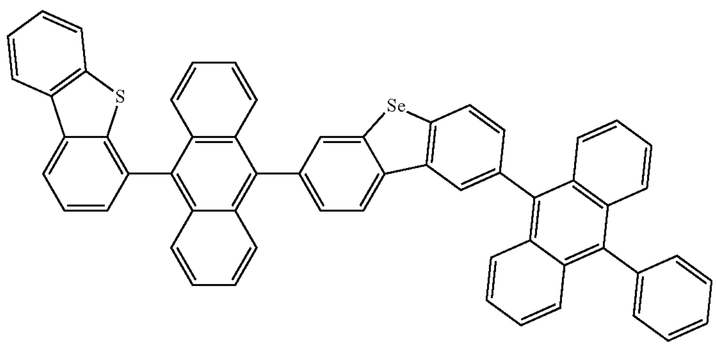
1885
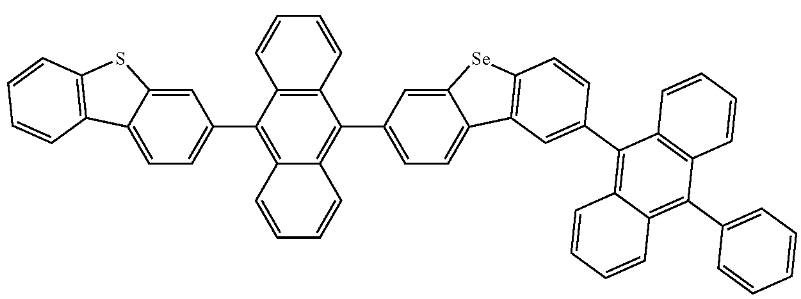
1886
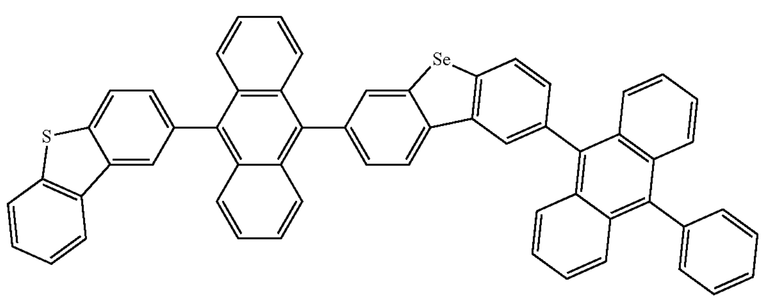

-continued
1887
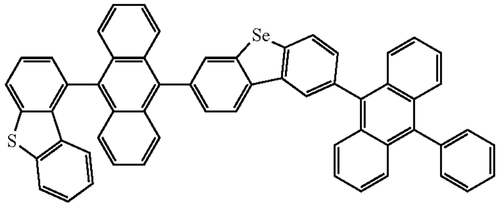
1888
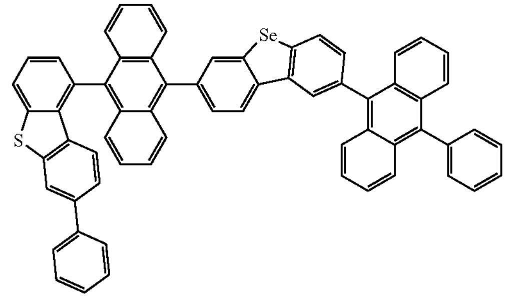
1889
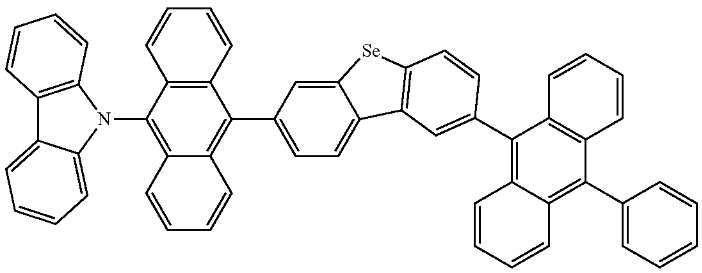
1890
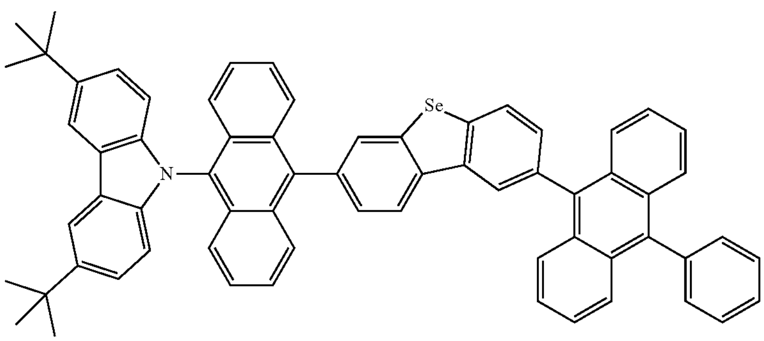
1891
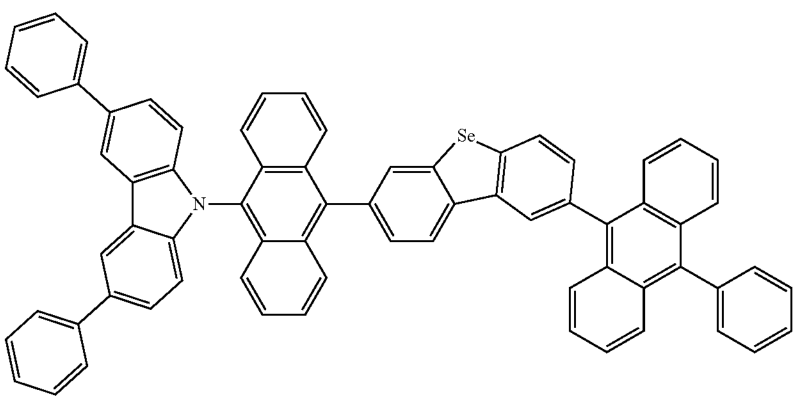
1892
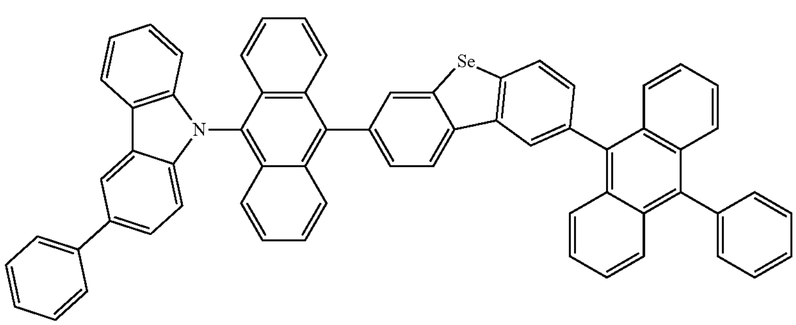

-continued
1893
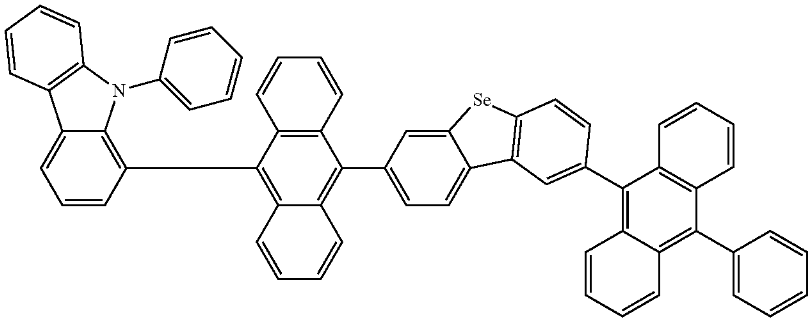
1894
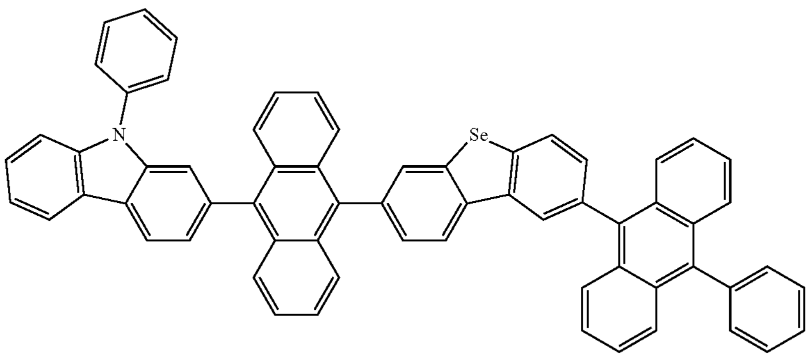
1895
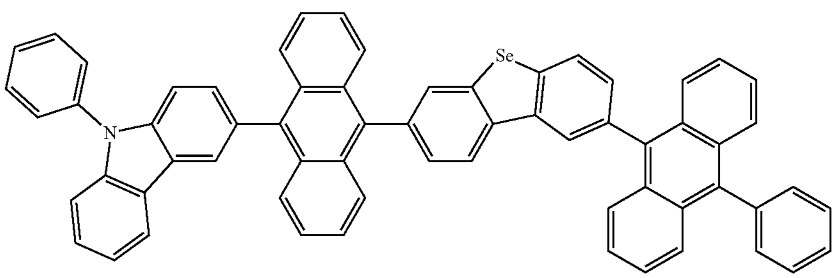
1896
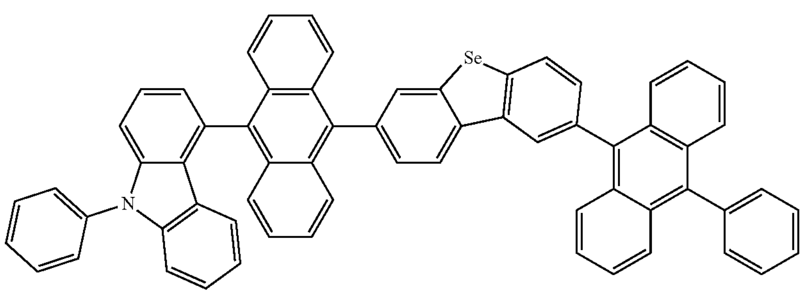
1897
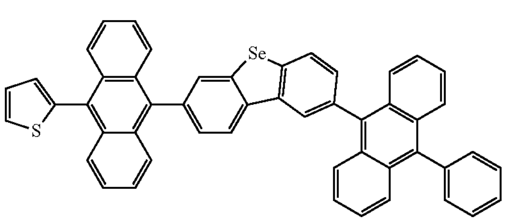
1898
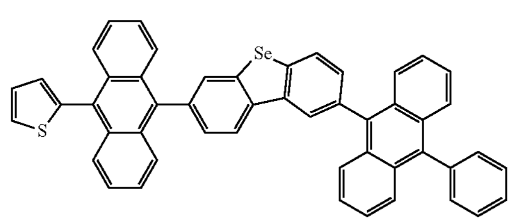

-continued
1899
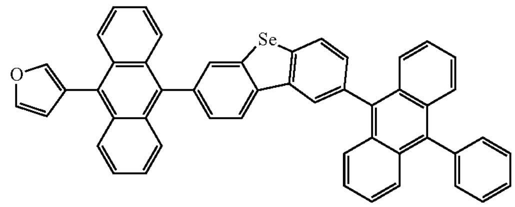
1900
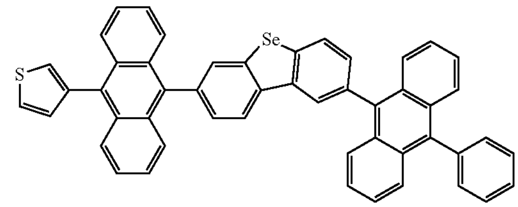
1901
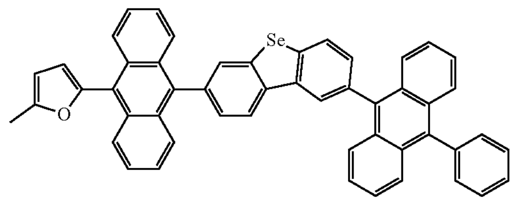
1902
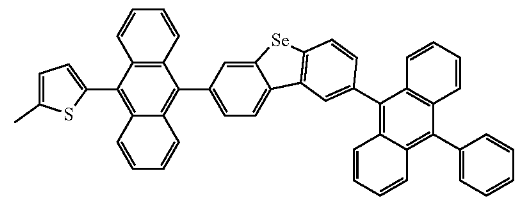
1903
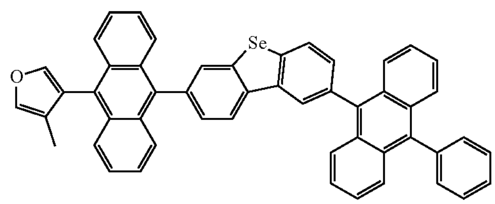
1904
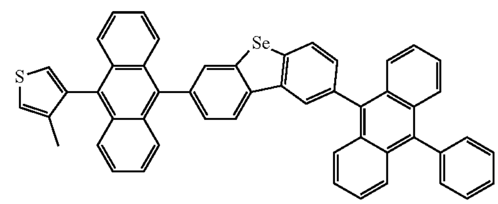
1905
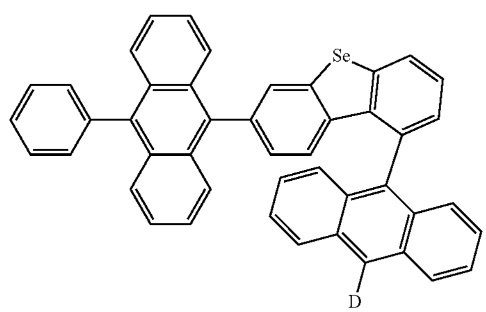
1906
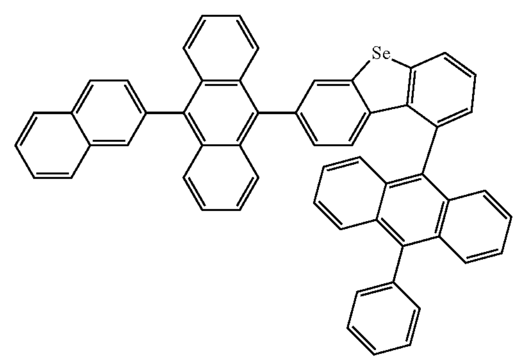
1907
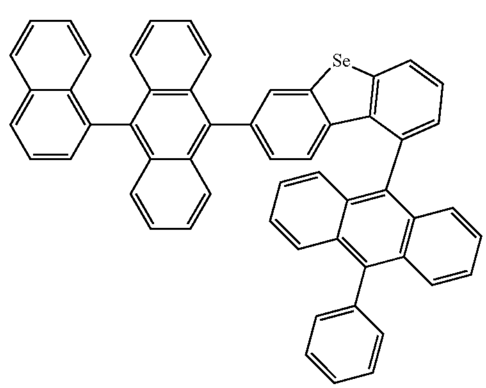
1908
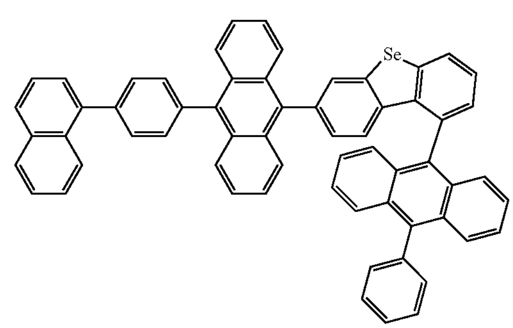

-continued
1909
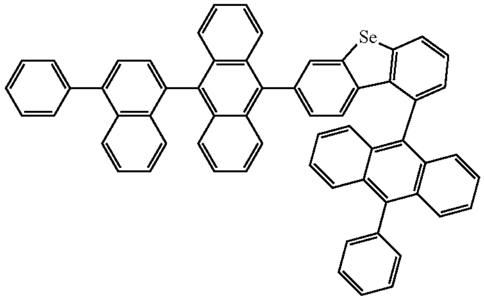
1910
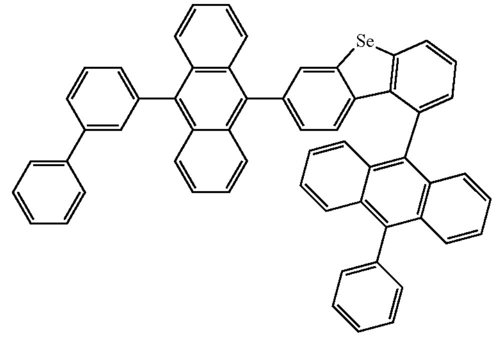
1911
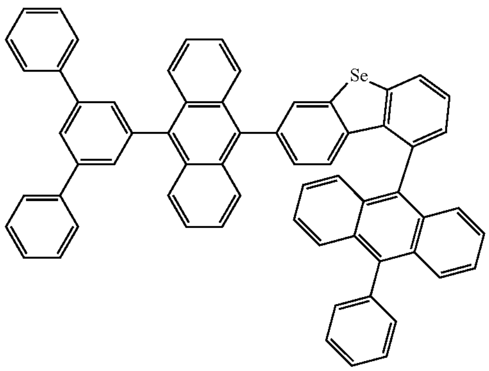
1912
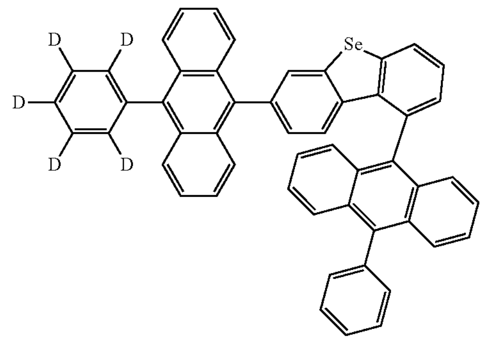
1913
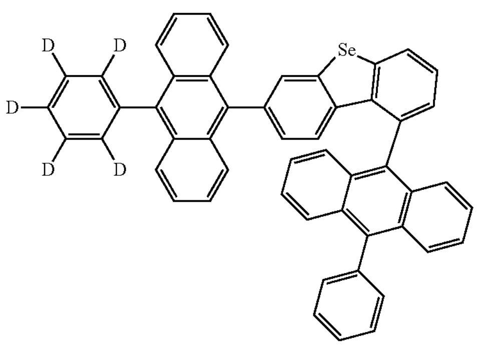
1914
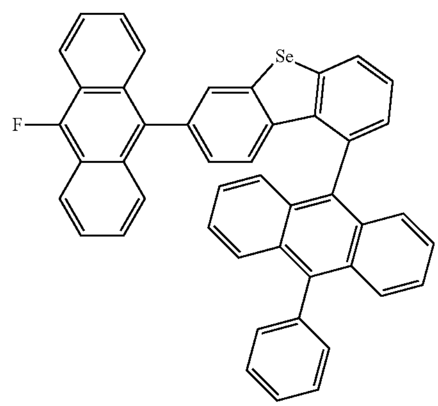
1915
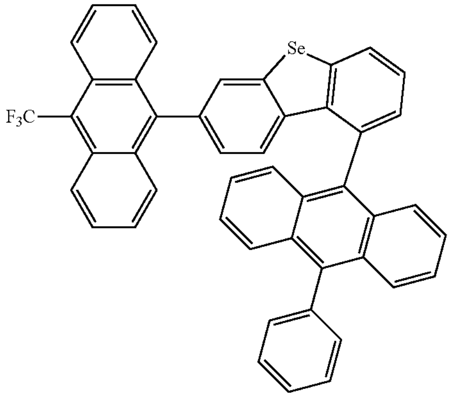
1916
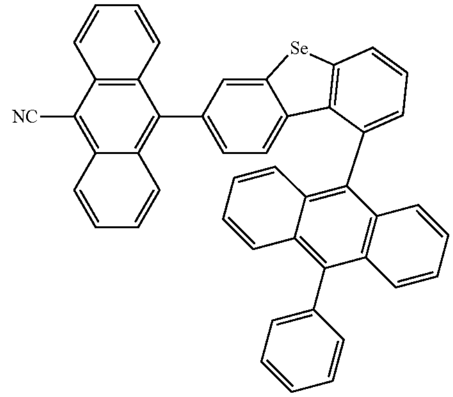

-continued
1917
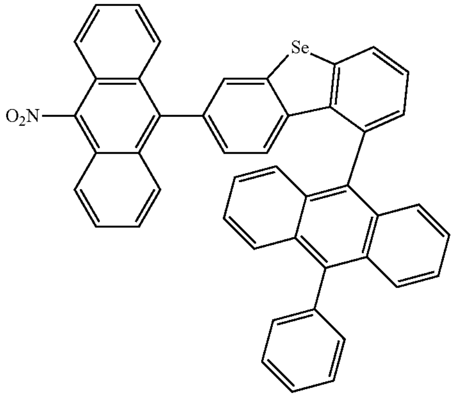
1918
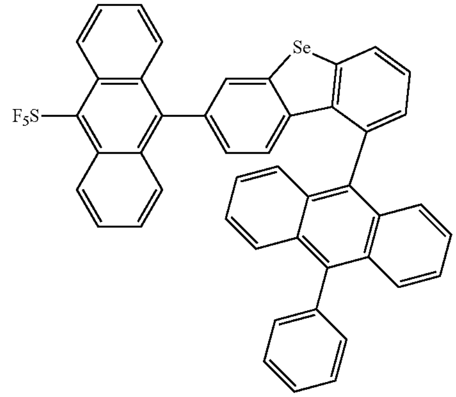
1919
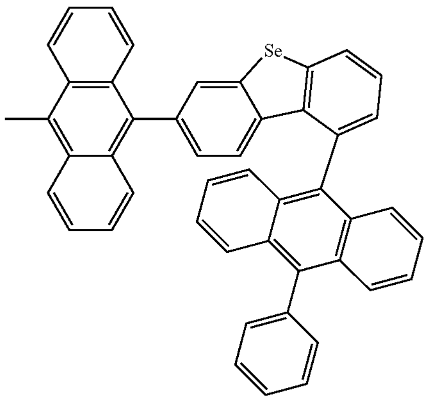
1920
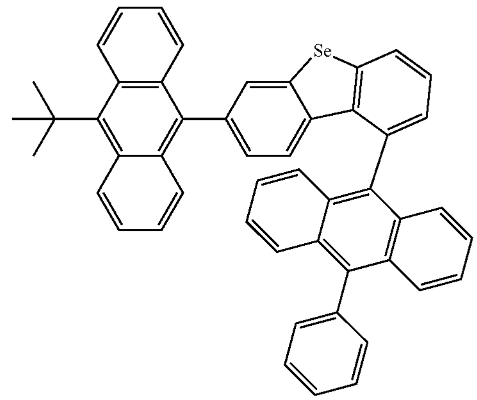
1921
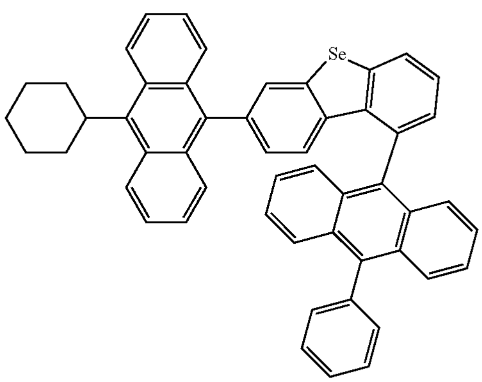
1922
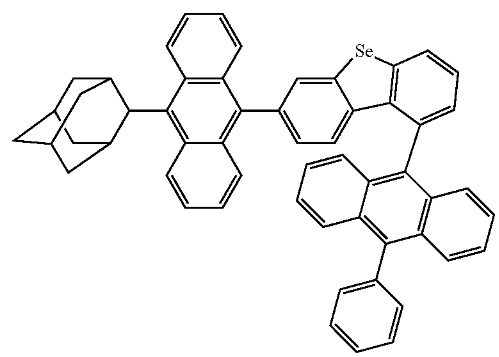
1923
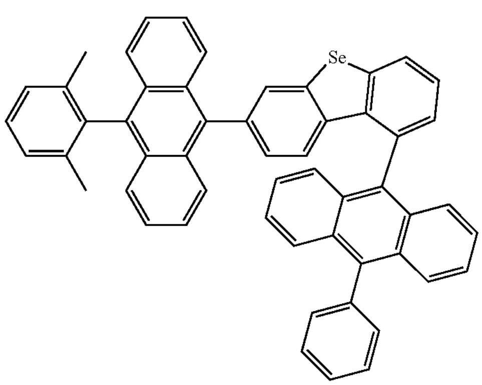
1924
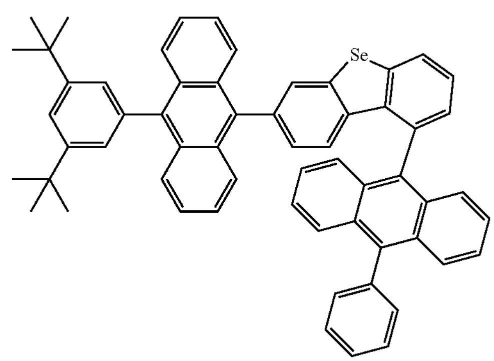

-continued
1925
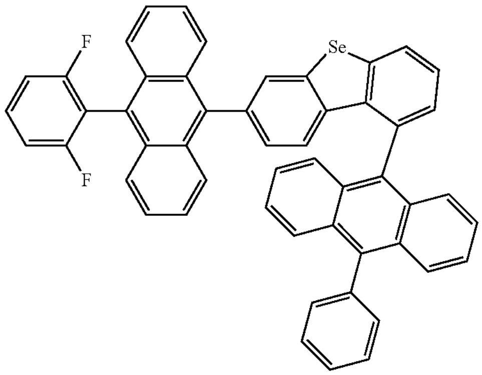
1926
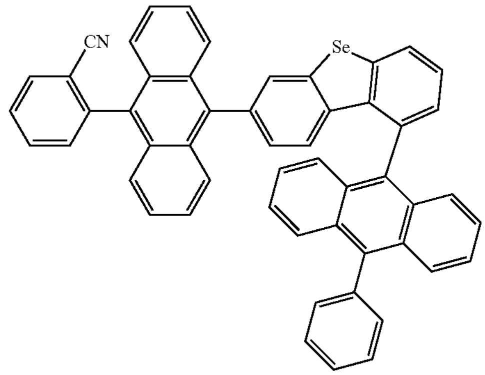
1927
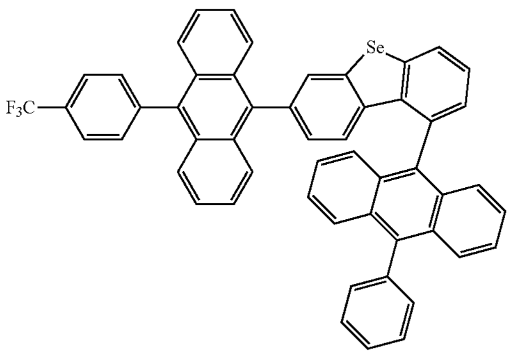
1928
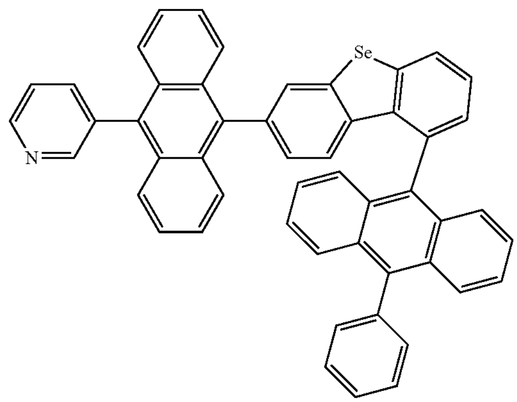
1929
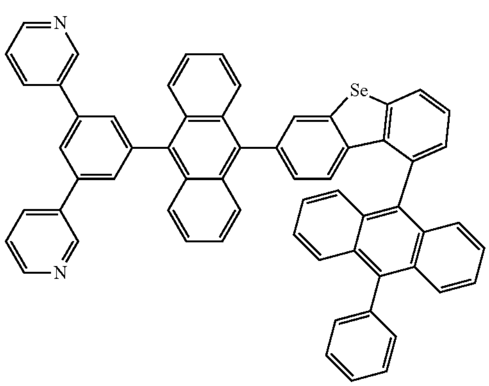
1930
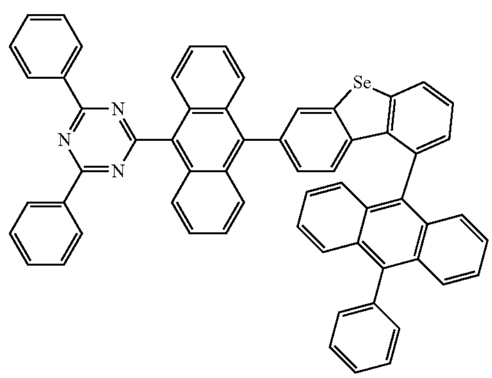
1931
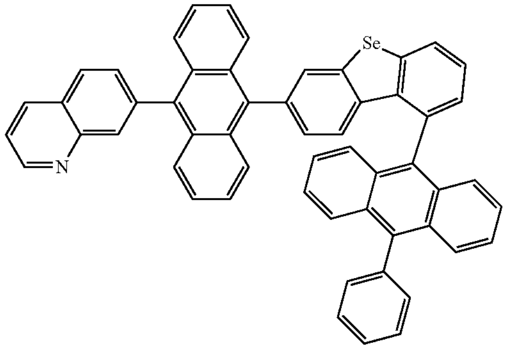
1932
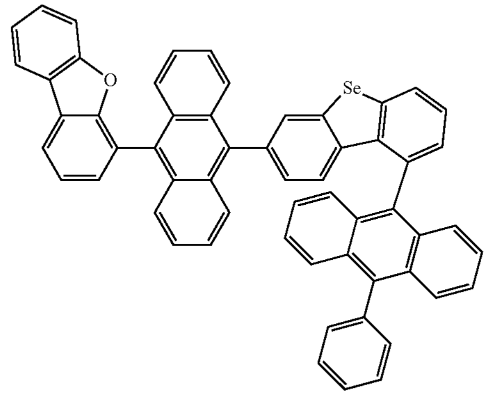

-continued
1933
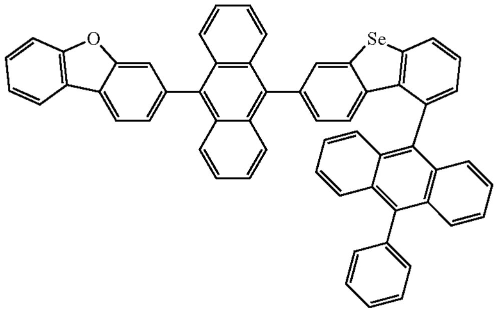
1934
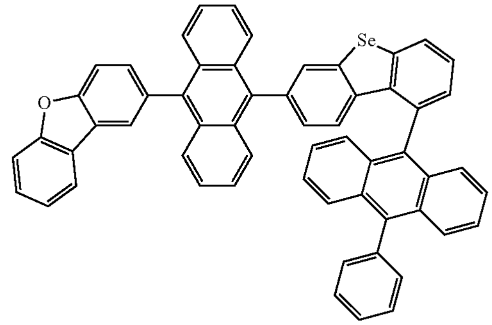
1935
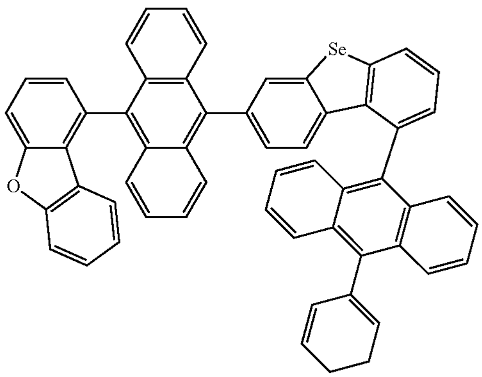
1936
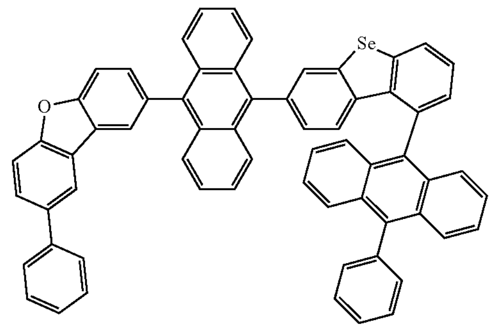
1937
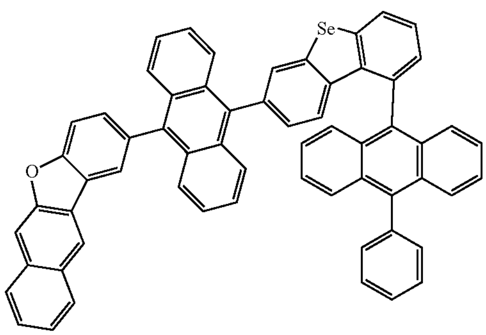
1938
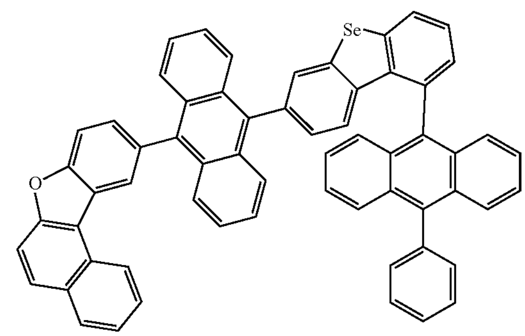
1939
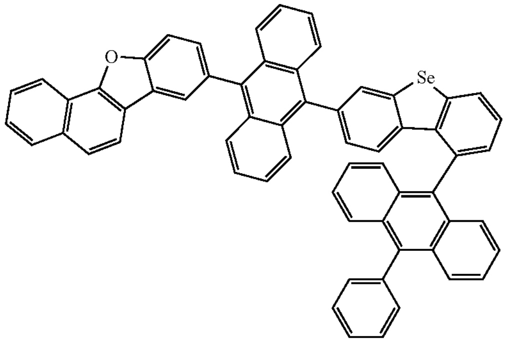
1940
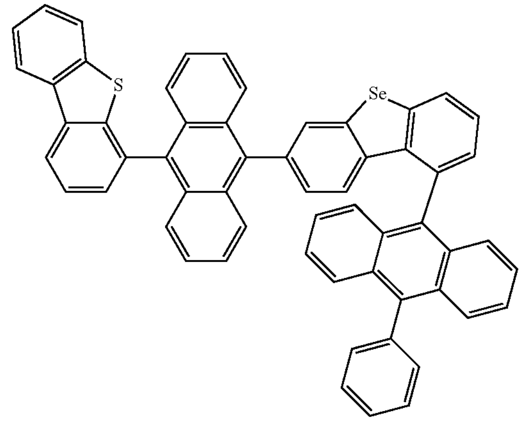

-continued
1941
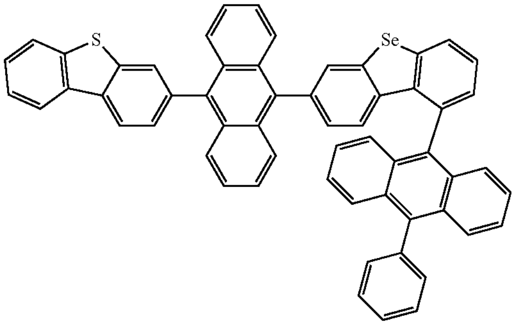
1942
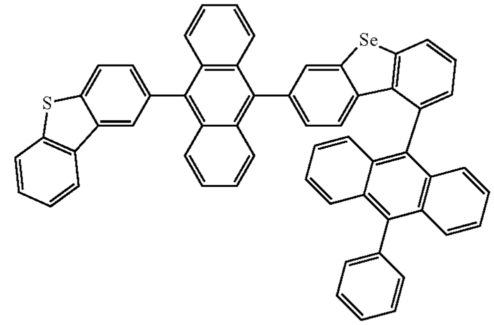
1943
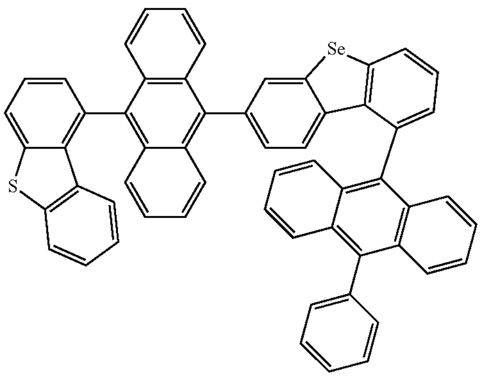
1944
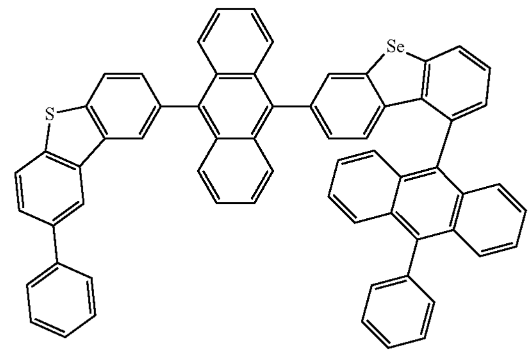
1945
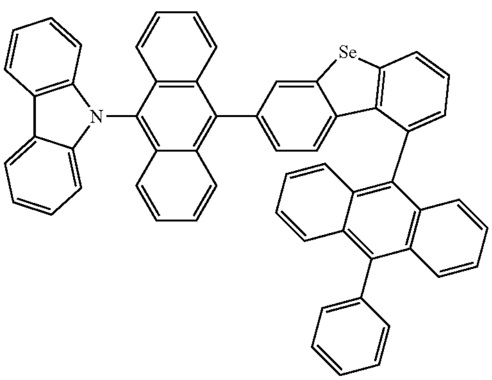
1946
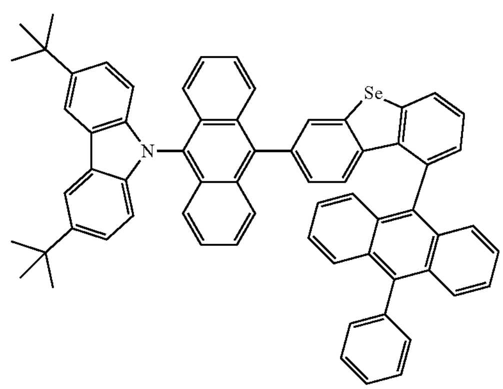
1947
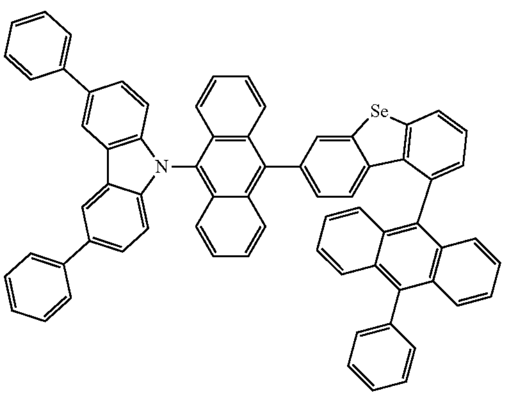
1948
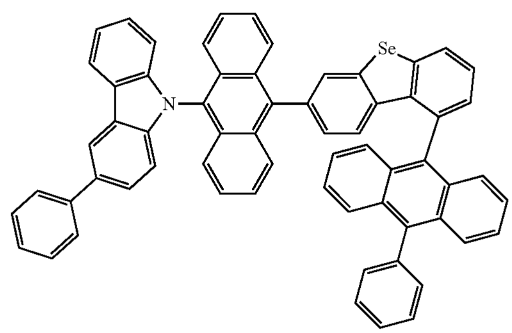

-continued
1949
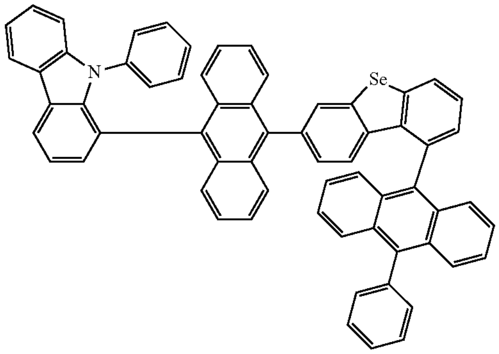
1950
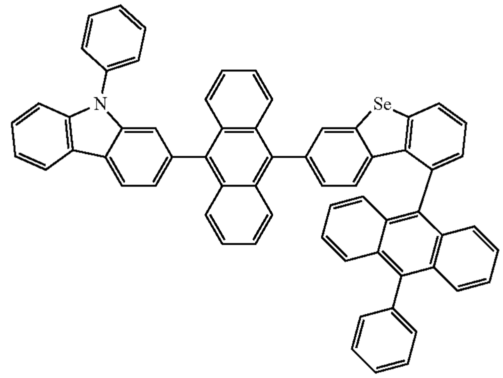
1951
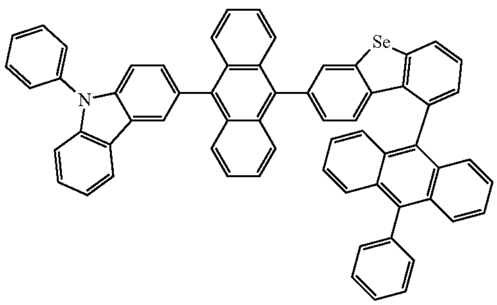
1952
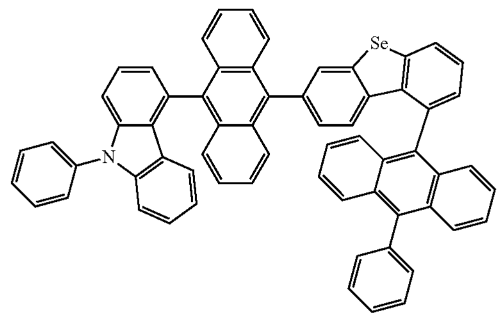
1953
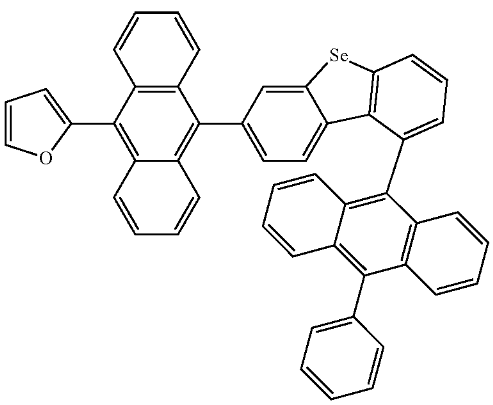
1954
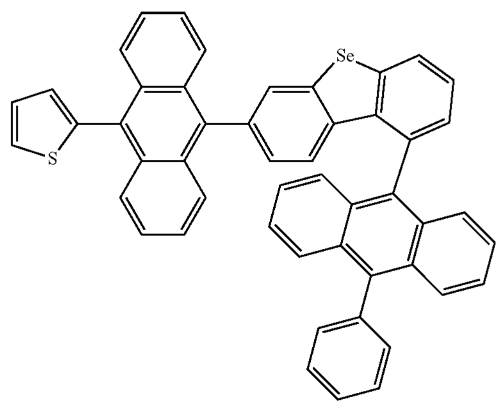
1955
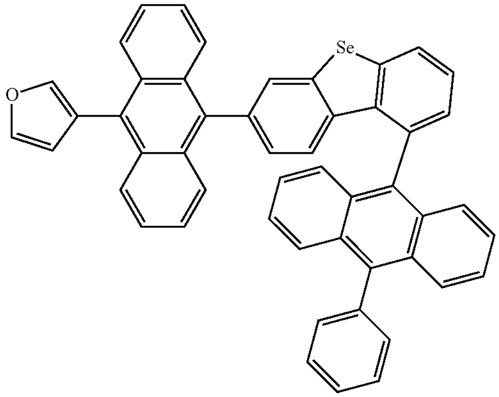
1956
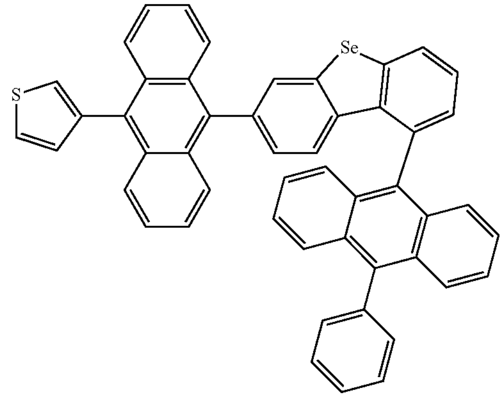

-continued
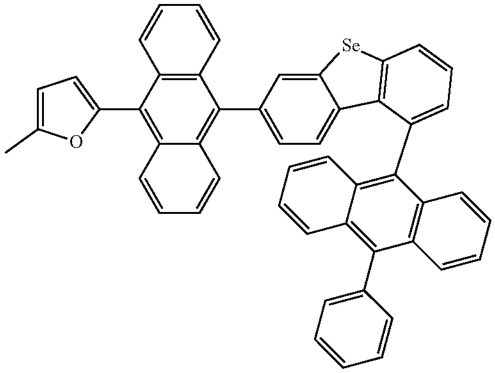
1957
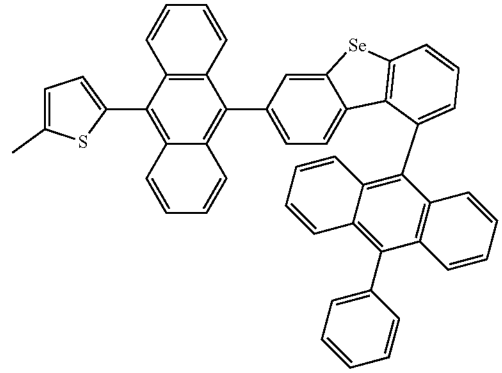
1958
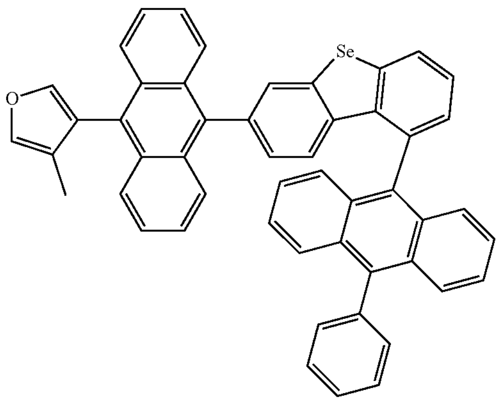
1959
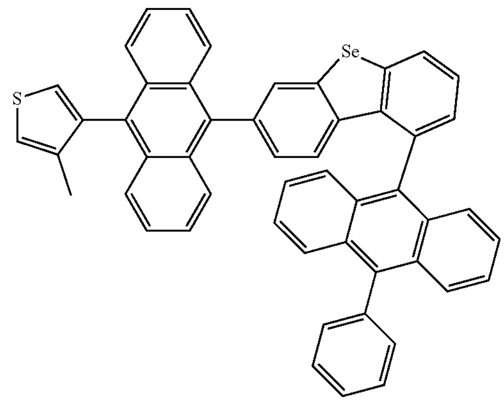
1960
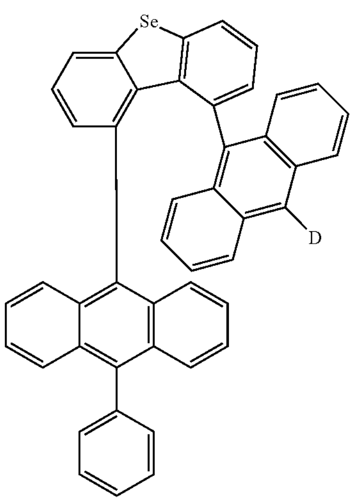
1961
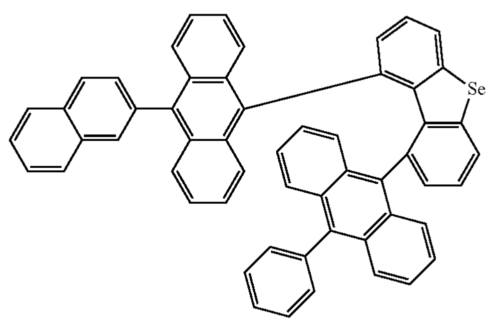
1962
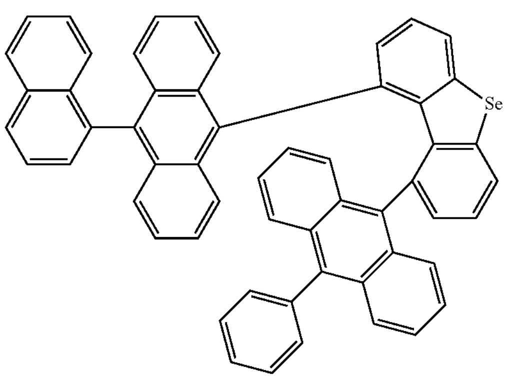
1963
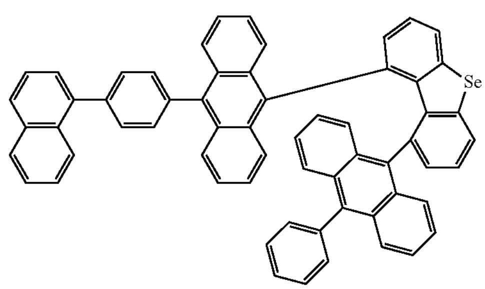
1964

-continued
1965
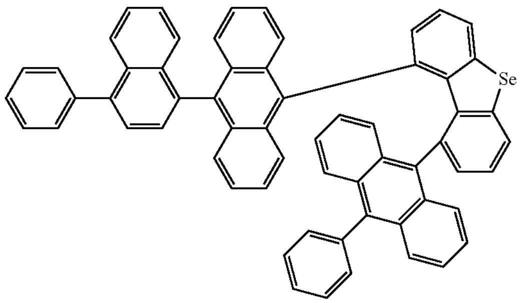
1966
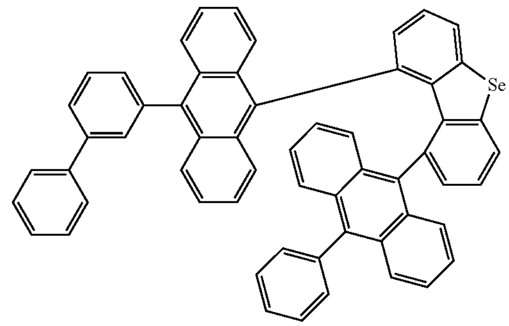
1967
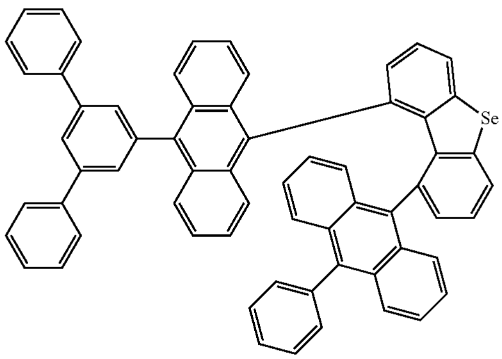
1968
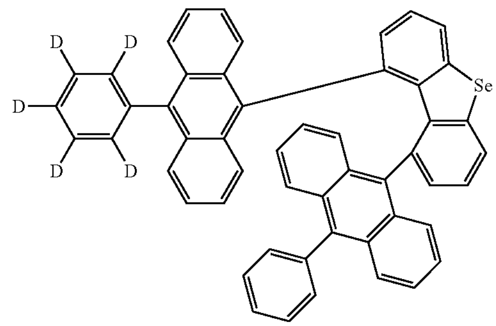
1969
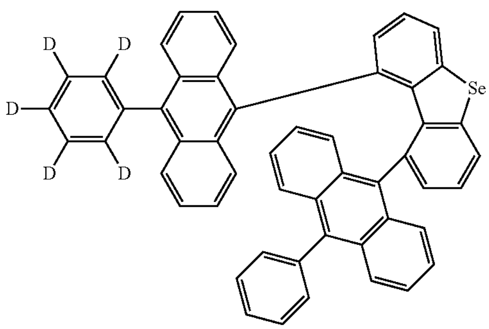
1970
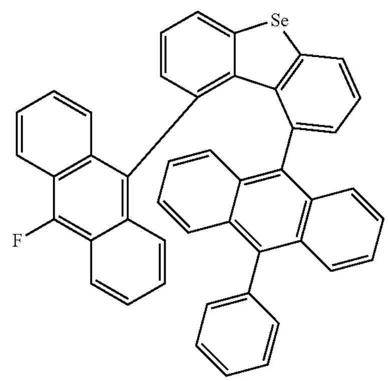
1971
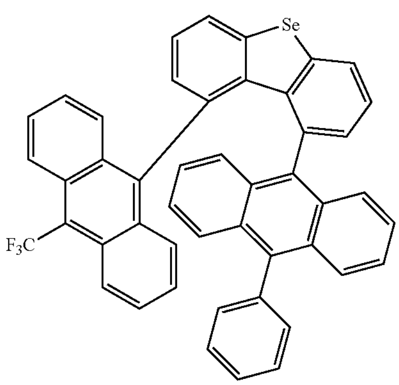
1972
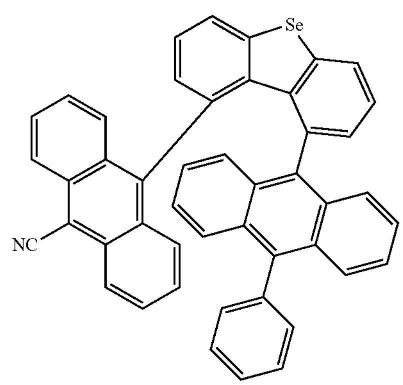

-continued
1973
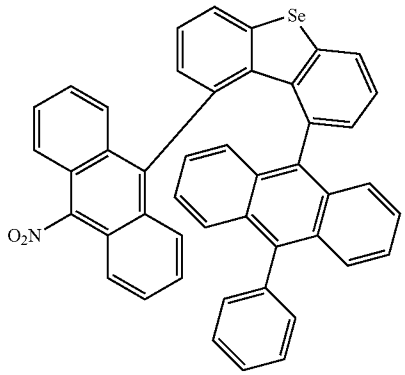
1974
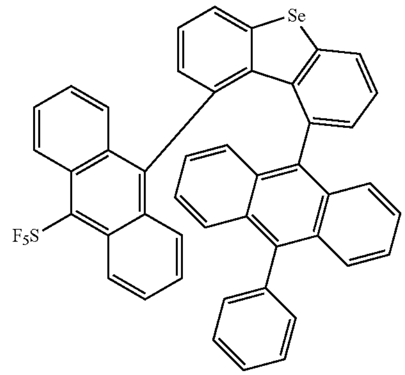
1975
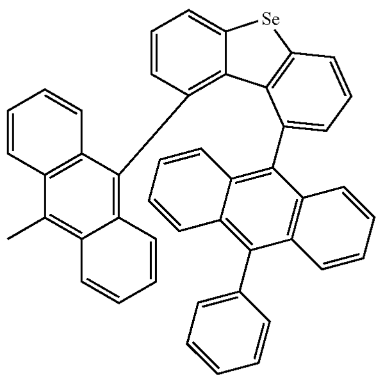
1976
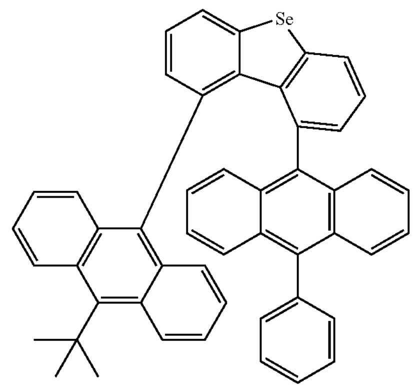
1977
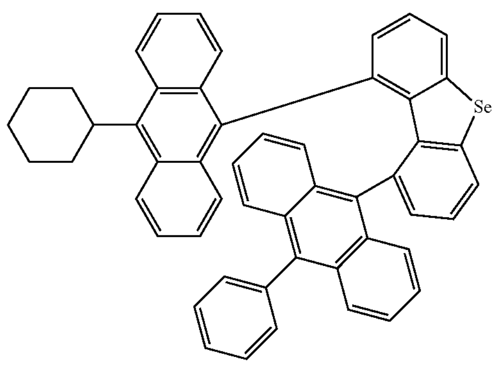
1978
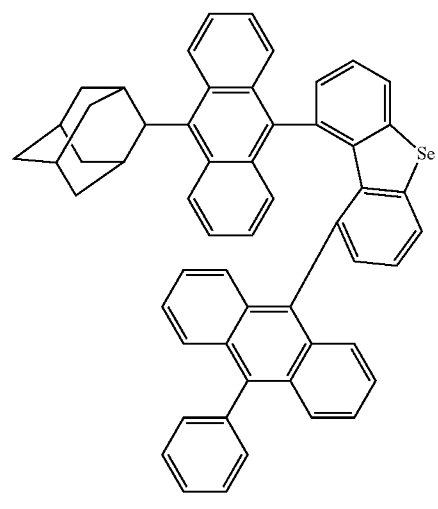
1979
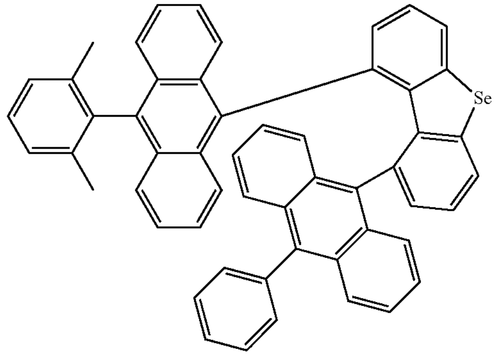
1980
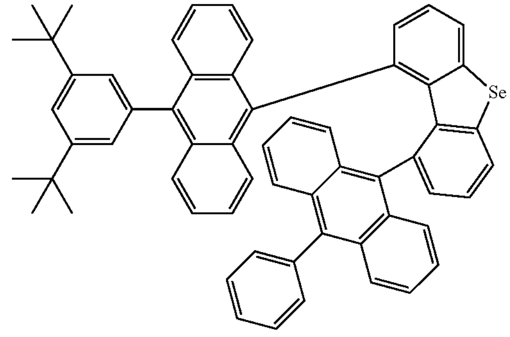

-continued
1981
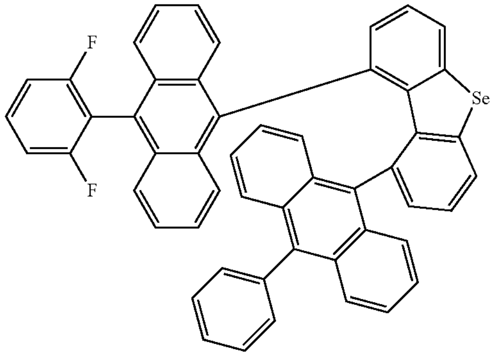
1982
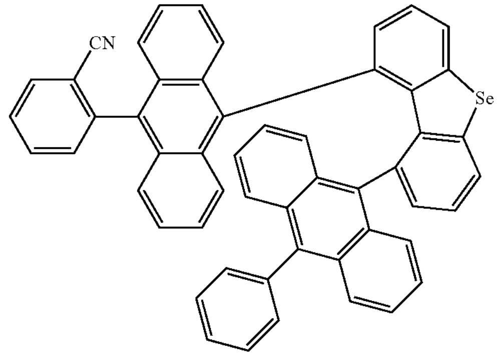
1983
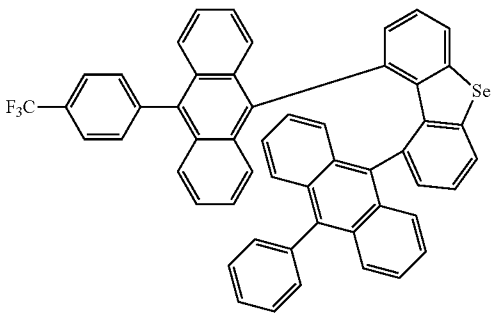
1984
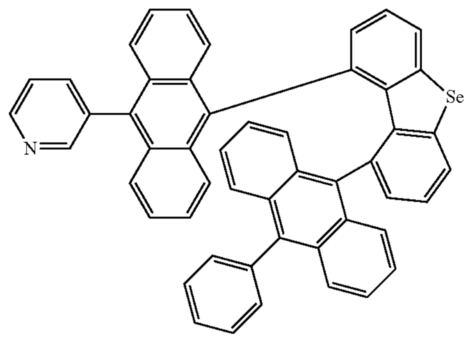
1985
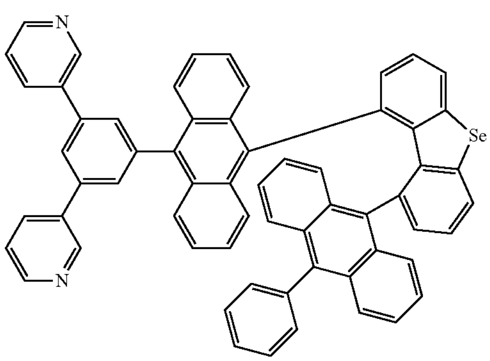
1986
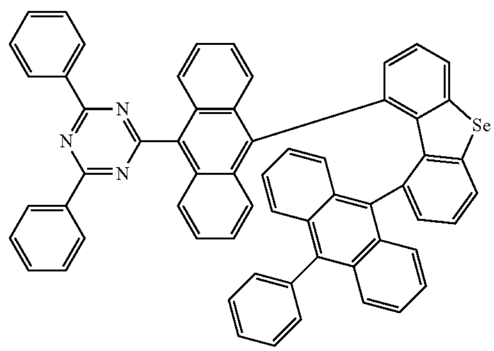
1987
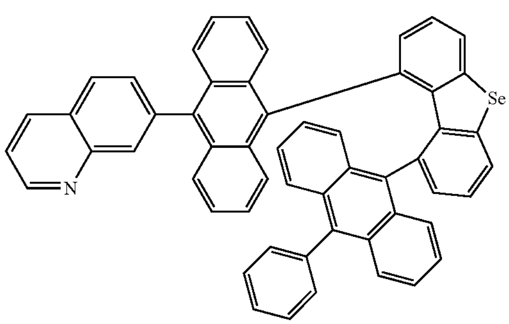
1988
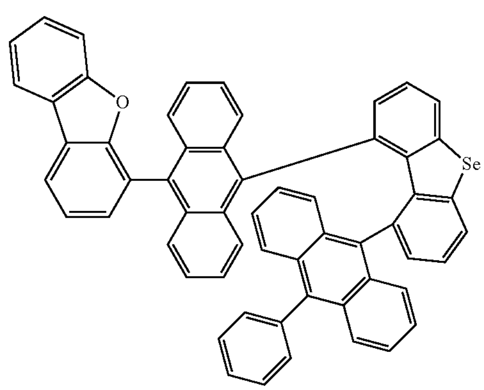

-continued
1989
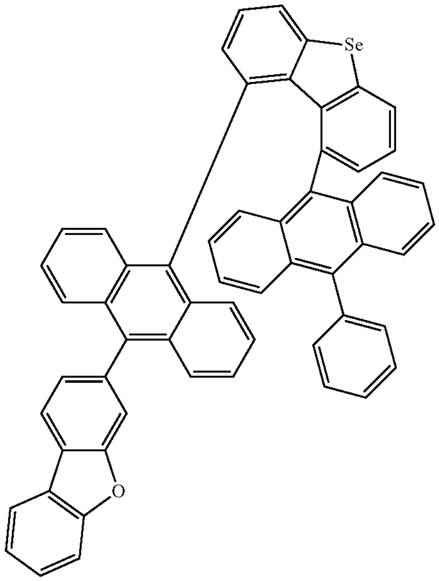
1990
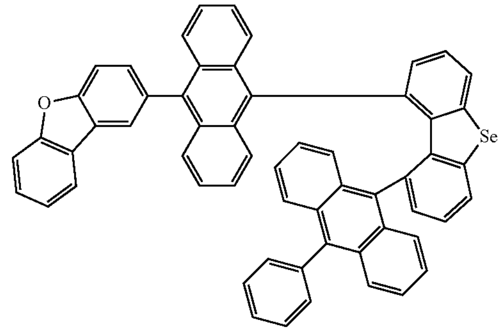
1991
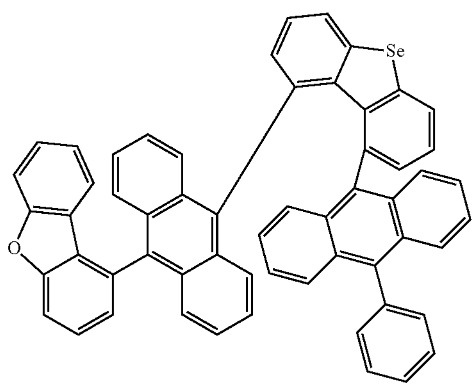
1992
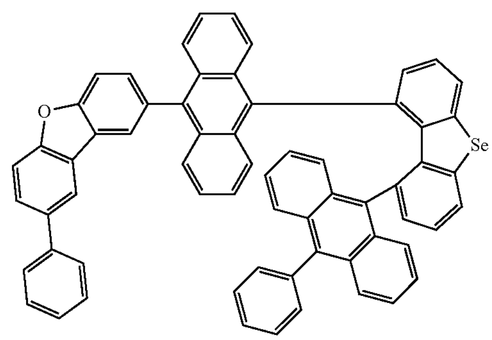
1993
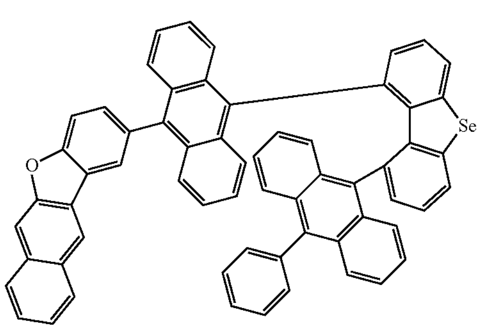
1994
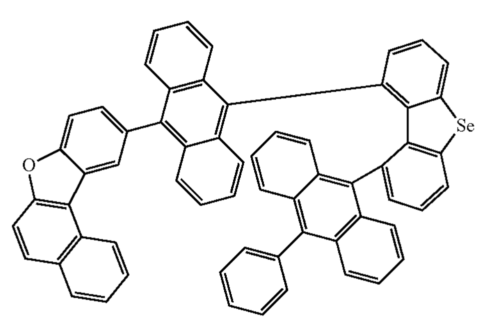

-continued
1995
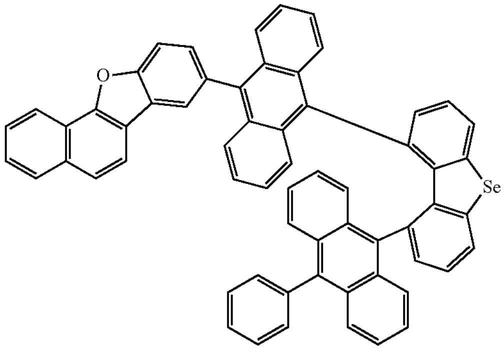
1996
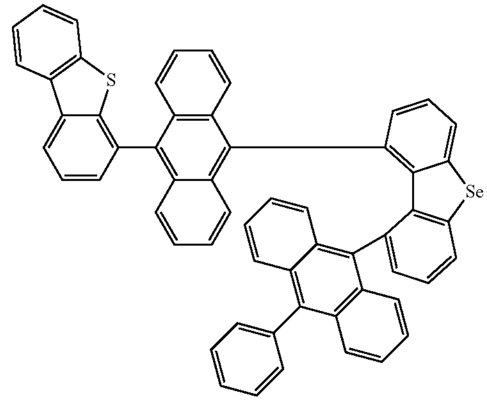
1997
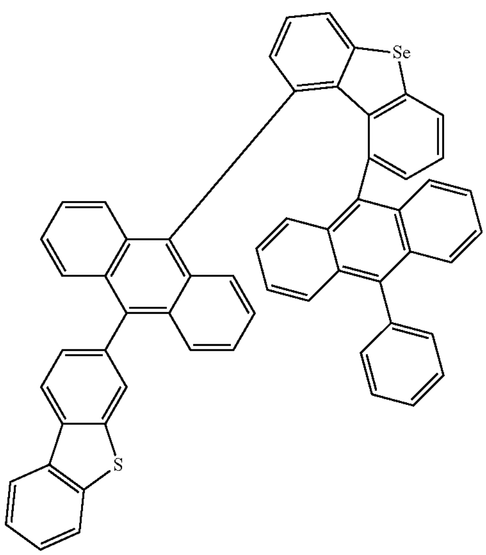
1998
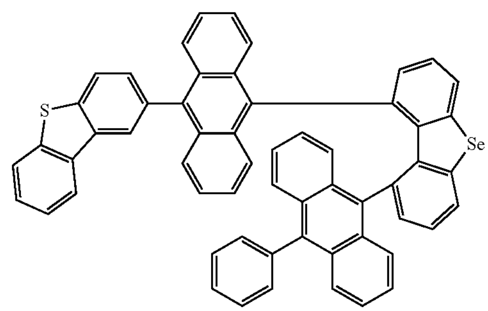
1999
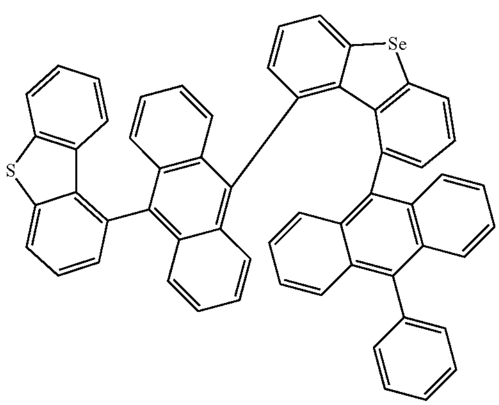
2000
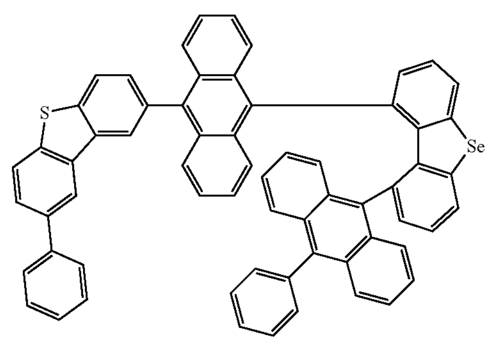

-continued
2001
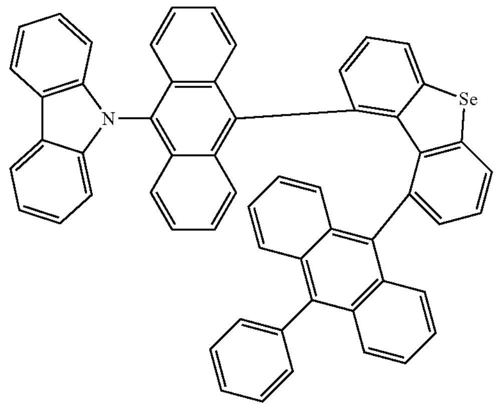
2002
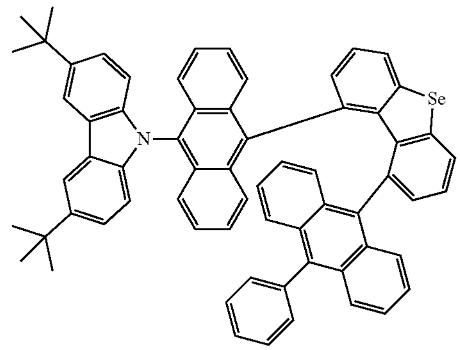
2003
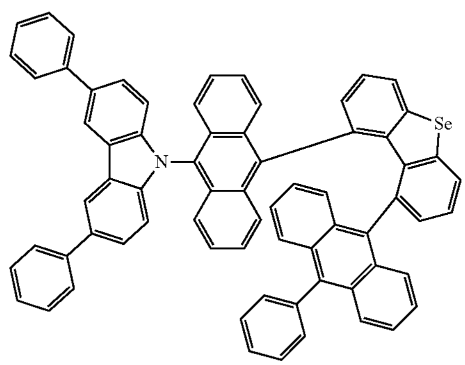
2004
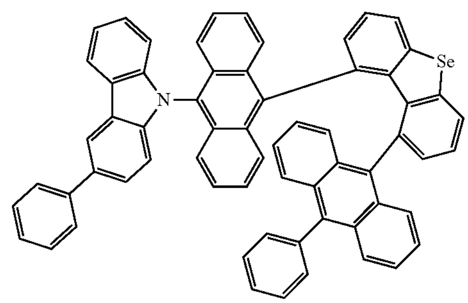
2005
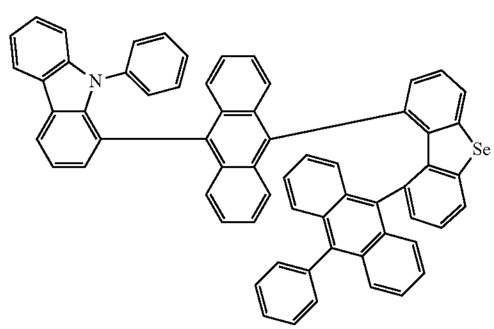
2006
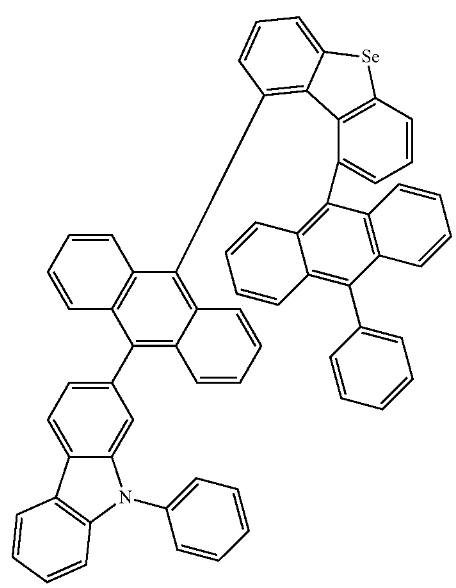

-continued
2007
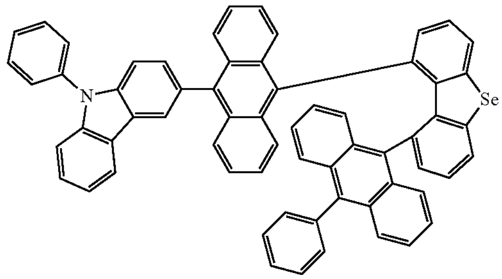
2008
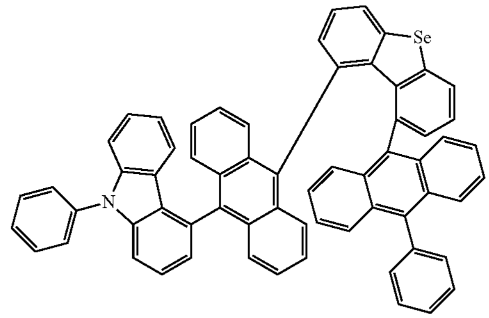
2009
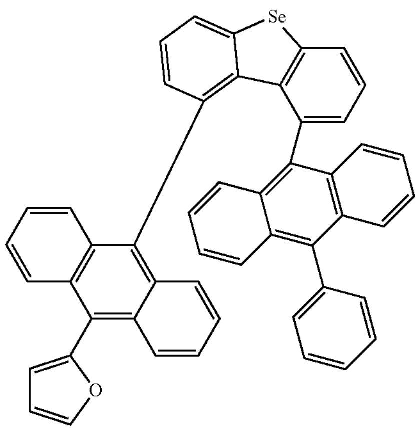
2010
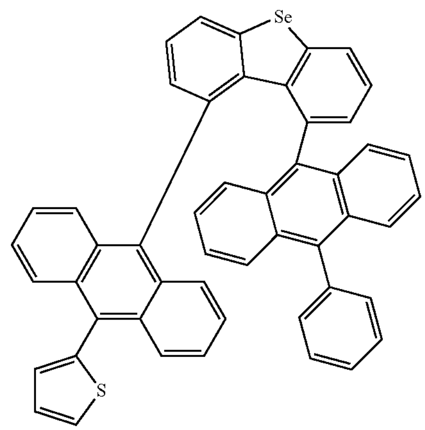
2011
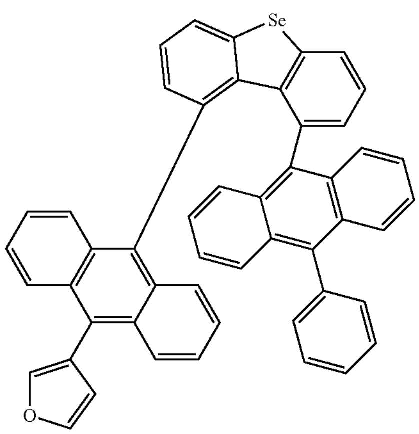
2012
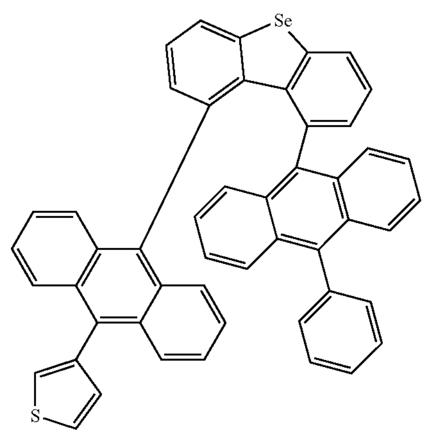
2013
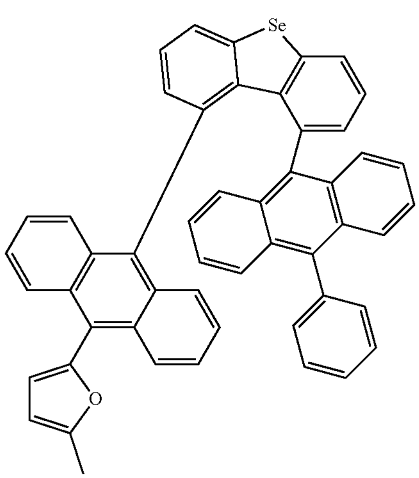
2014
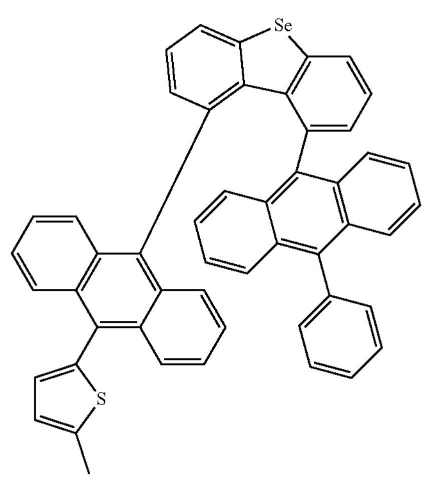

-continued
2015
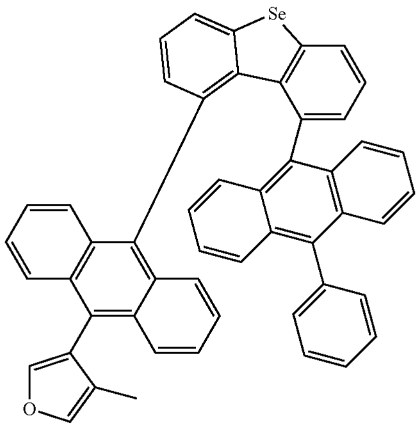
2016
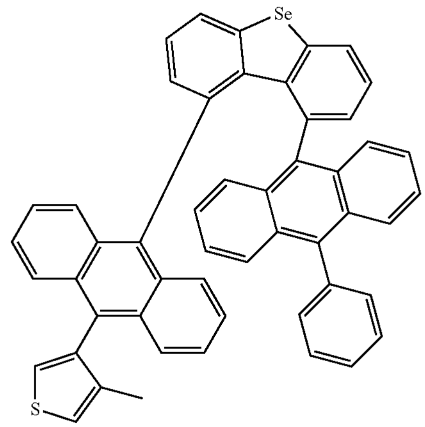
2017
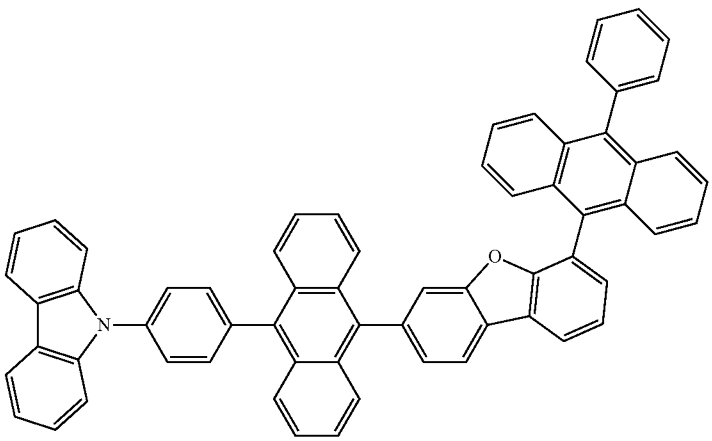
2018
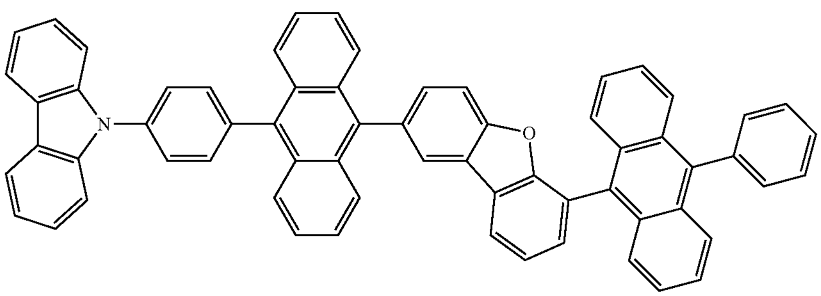
2019
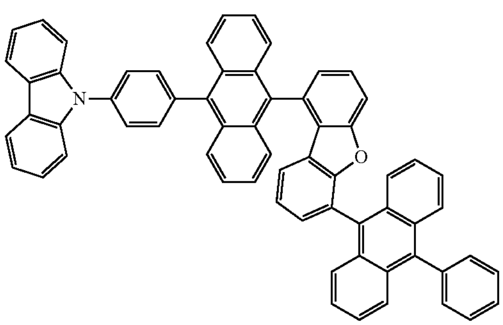
2020
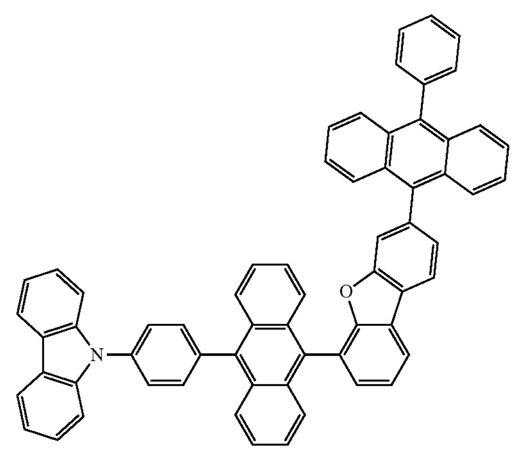

-continued
2021
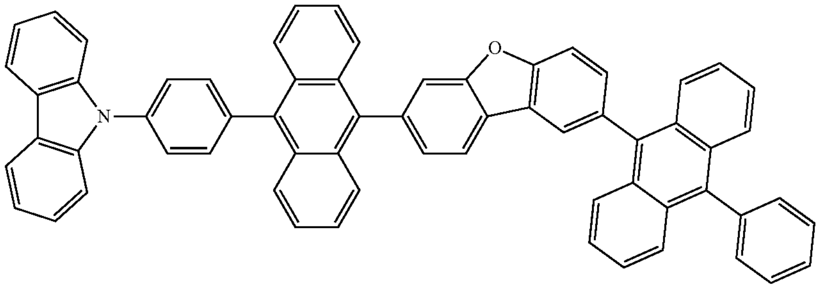
2022
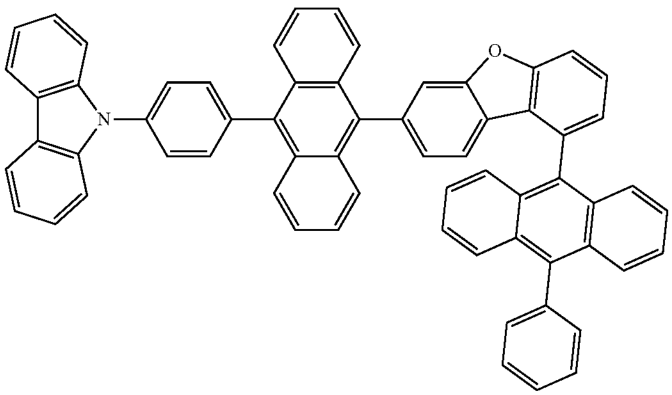
2023
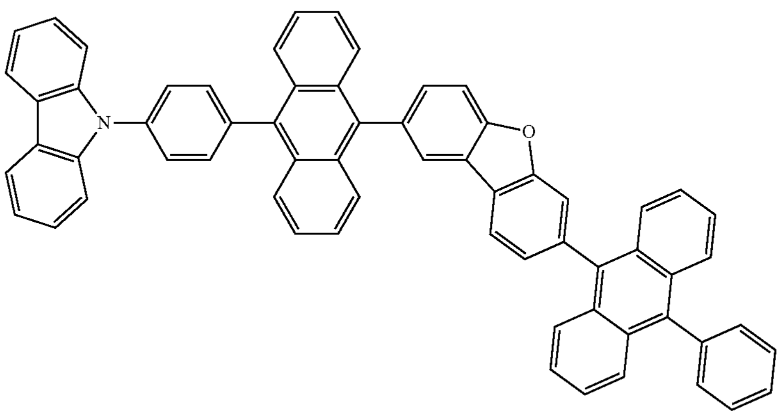
2024
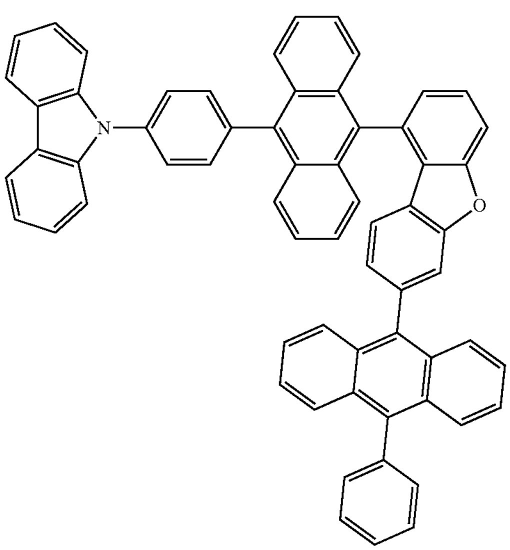

-continued
2025
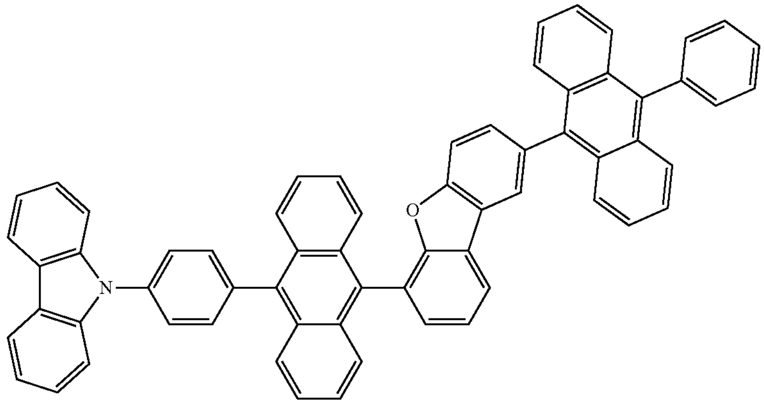
2026
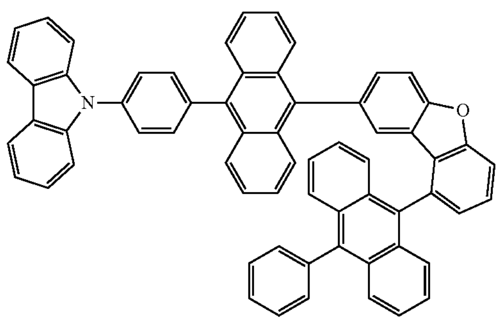
2027
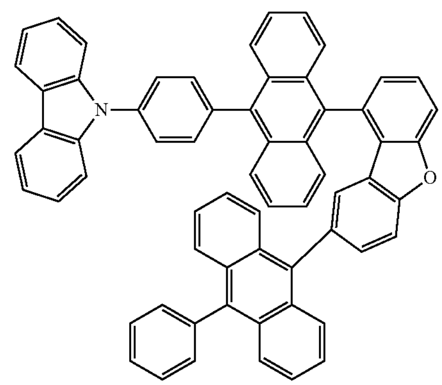
2028
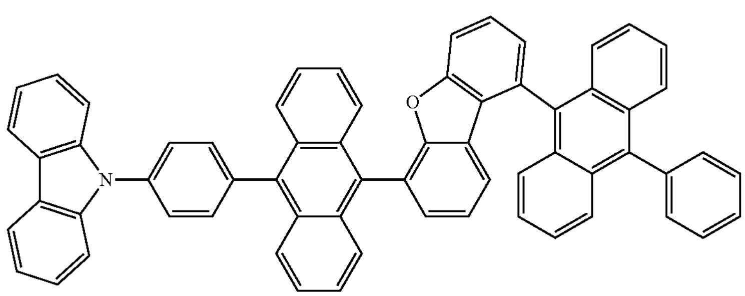

-continued
2029
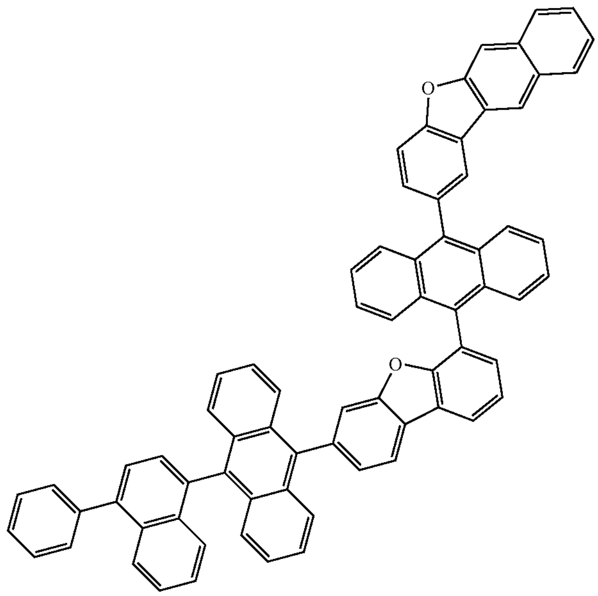
2030
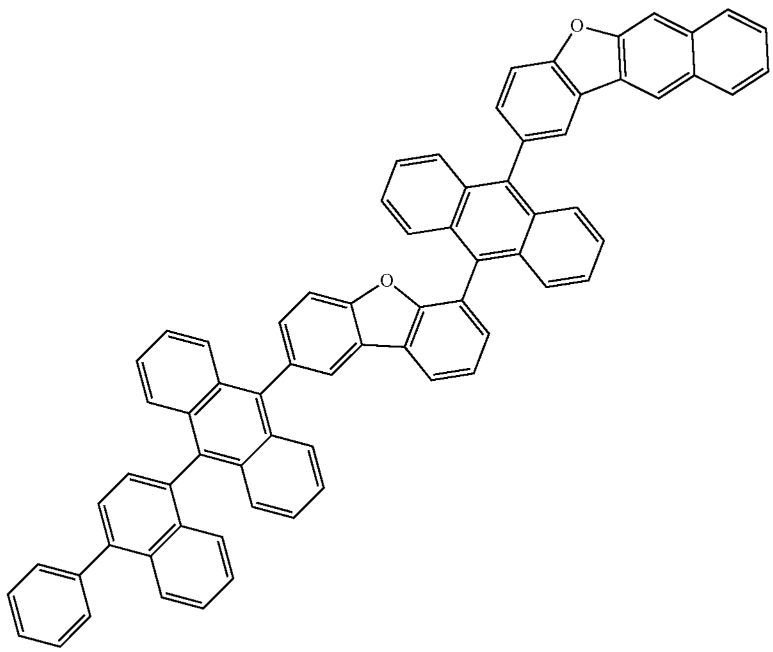

-continued
2031
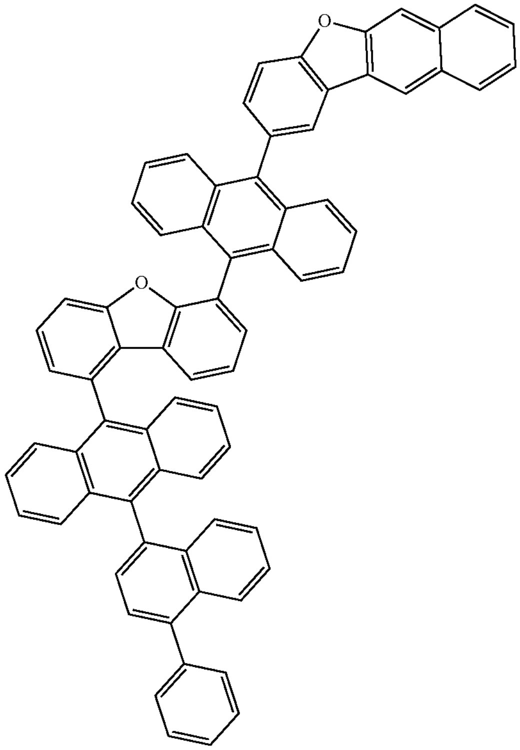
2032
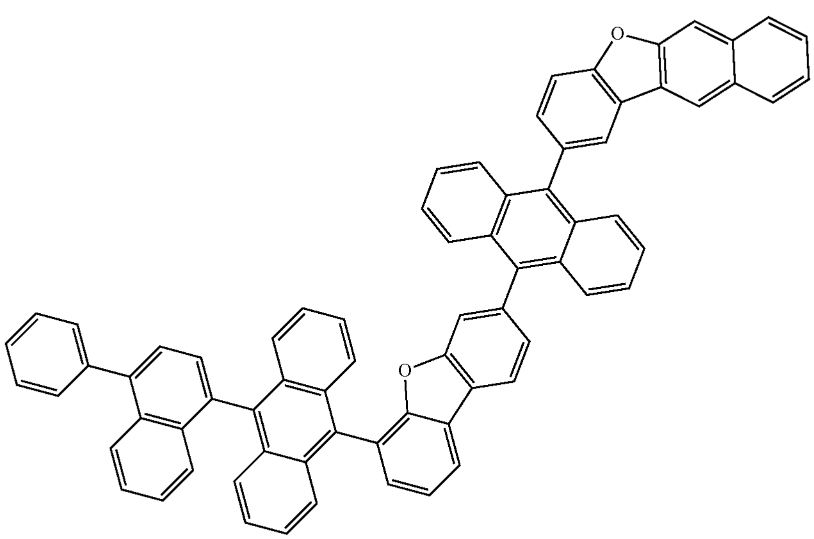

-continued
2033
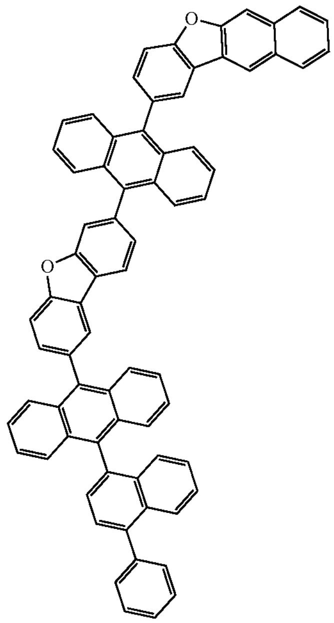
2034
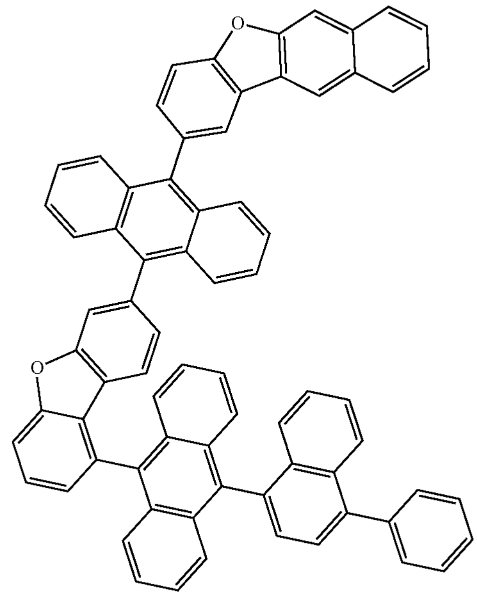
2035
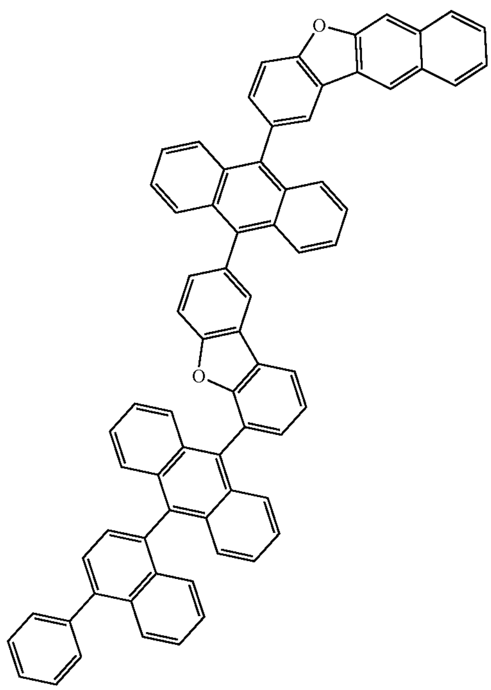
2036
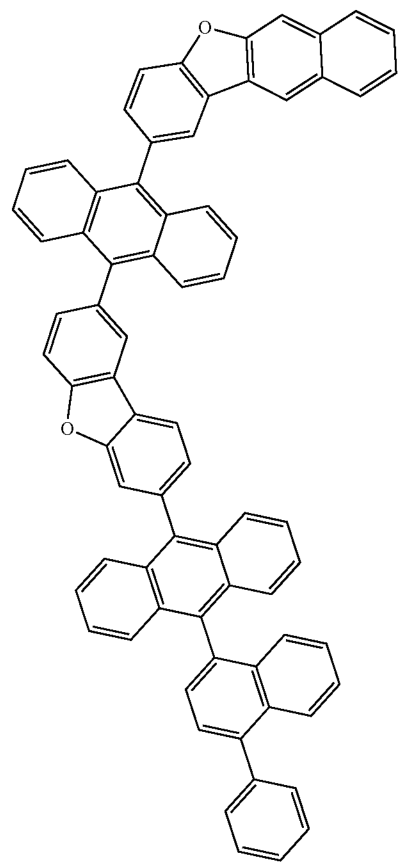

-continued
2037
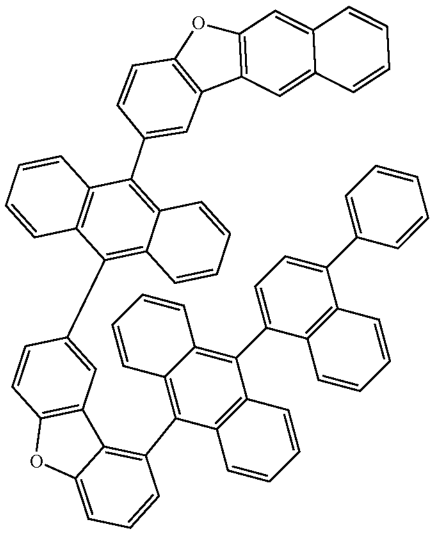
2038
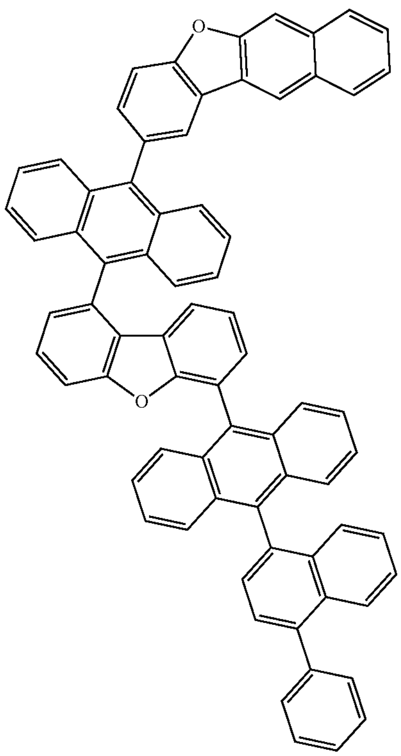
2039
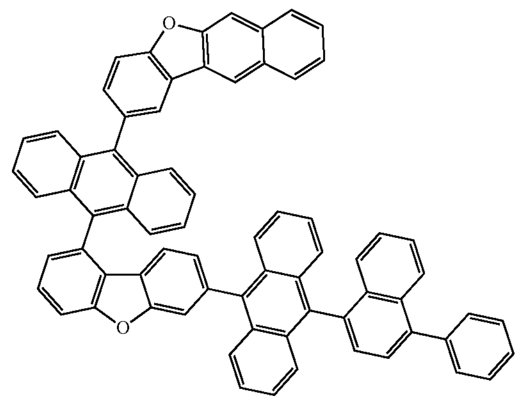

-continued
2040
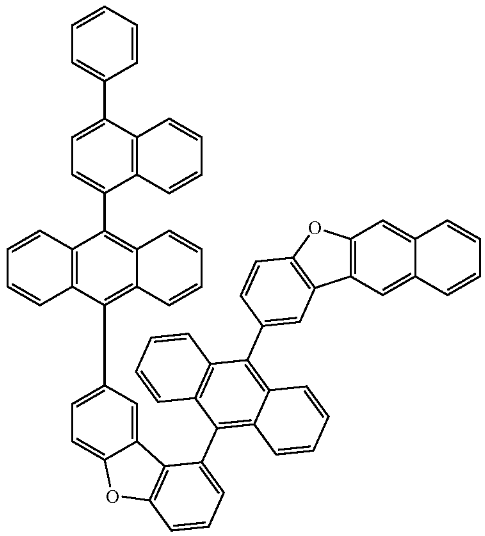
2041
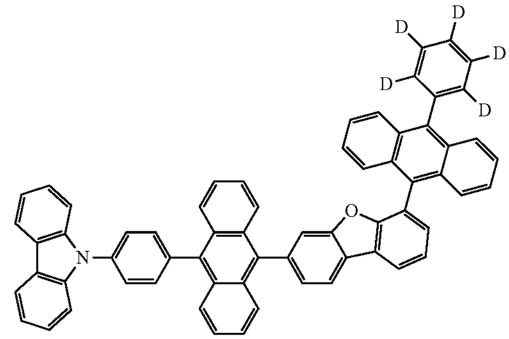
2042
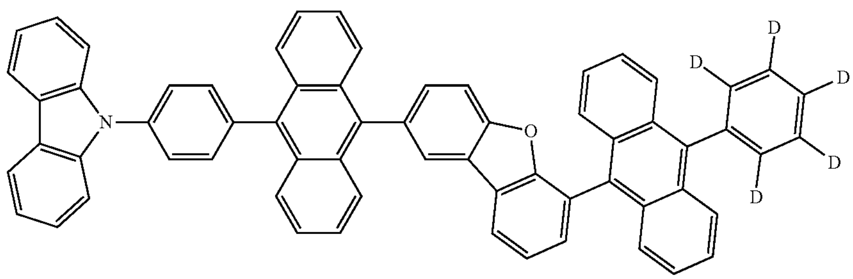
2043
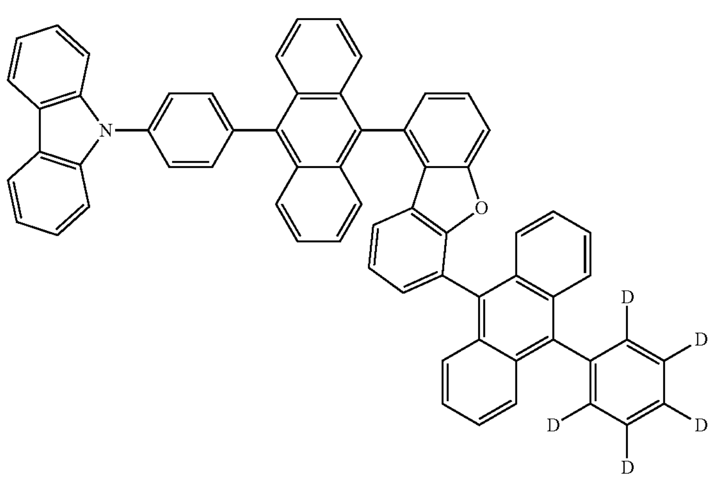

-continued
2044
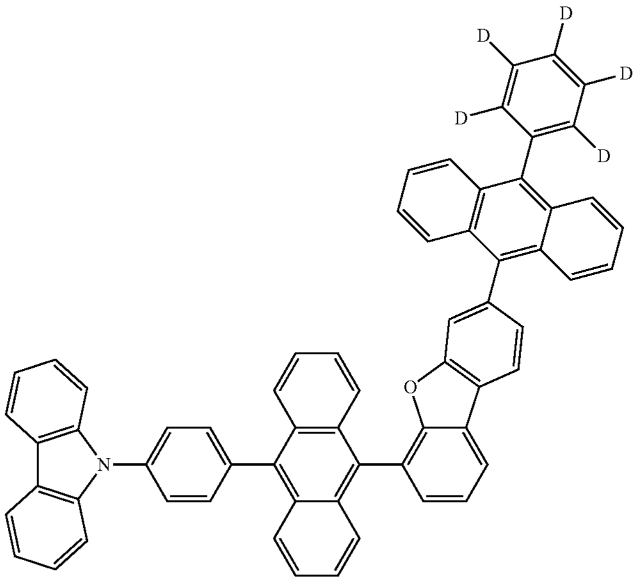
2045
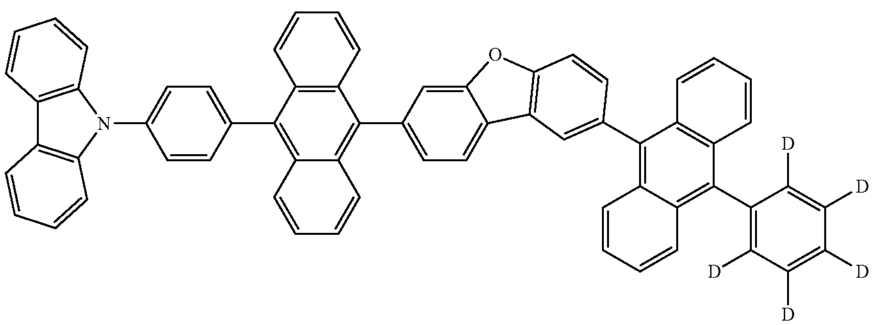
2046
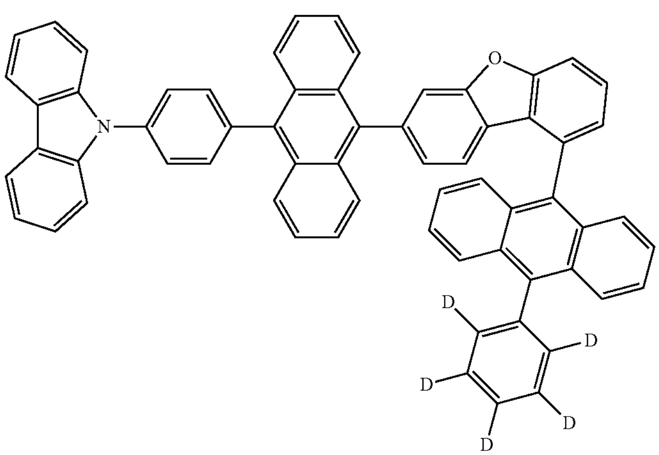

-continued
2047
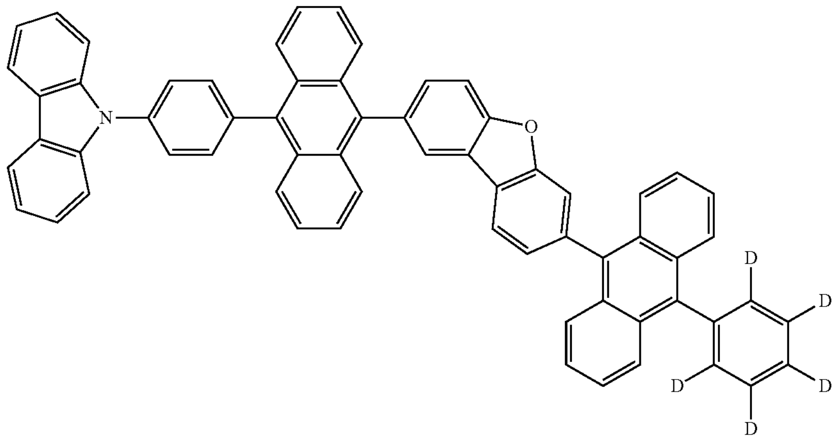
2048
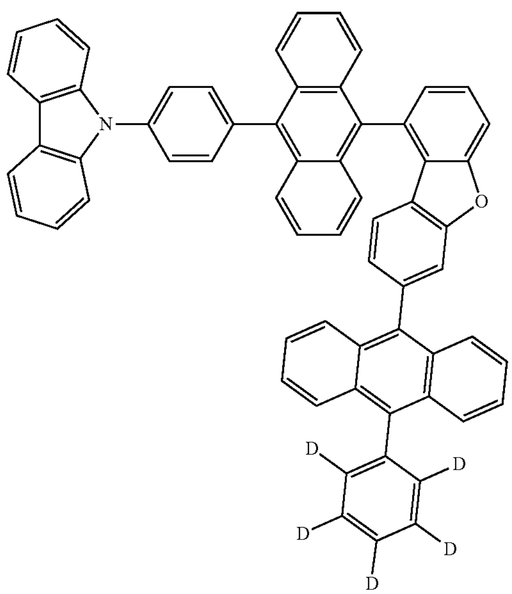
2049
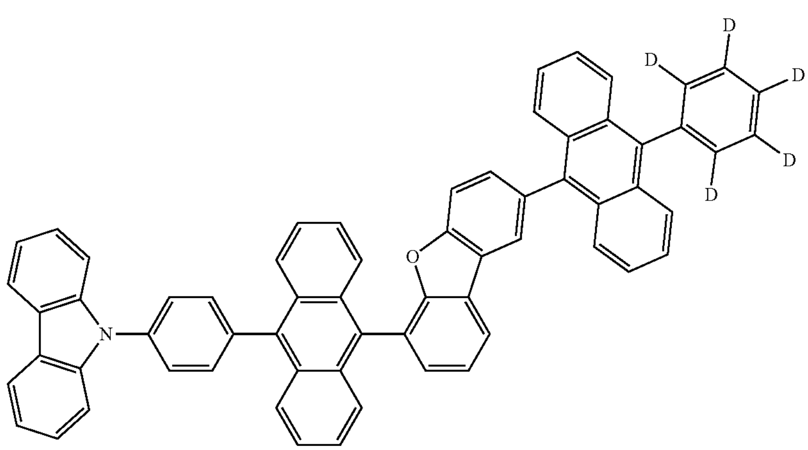

-continued
2050
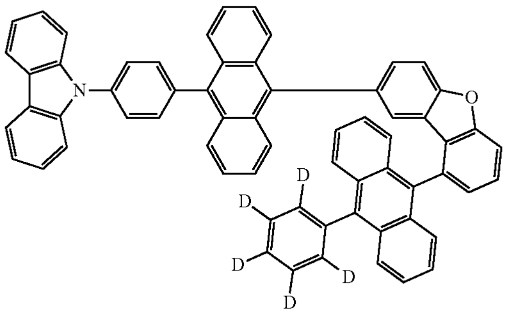
2051
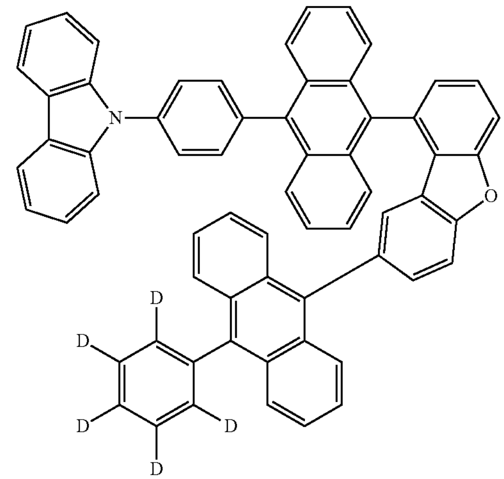
2052
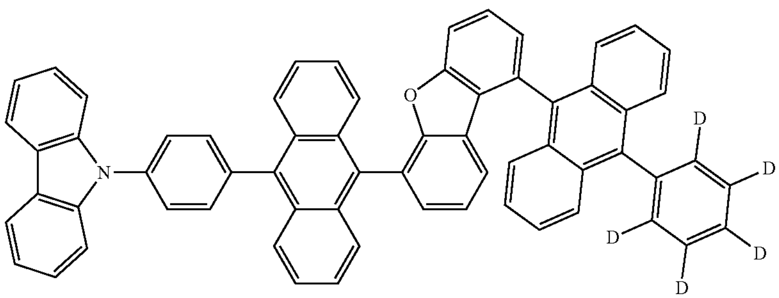
2053
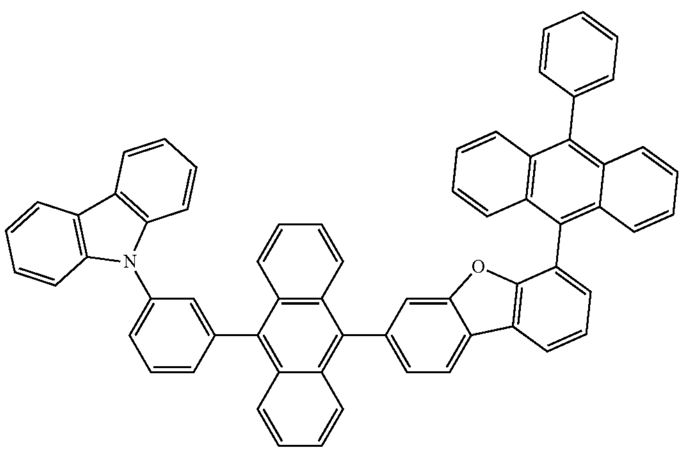
2054
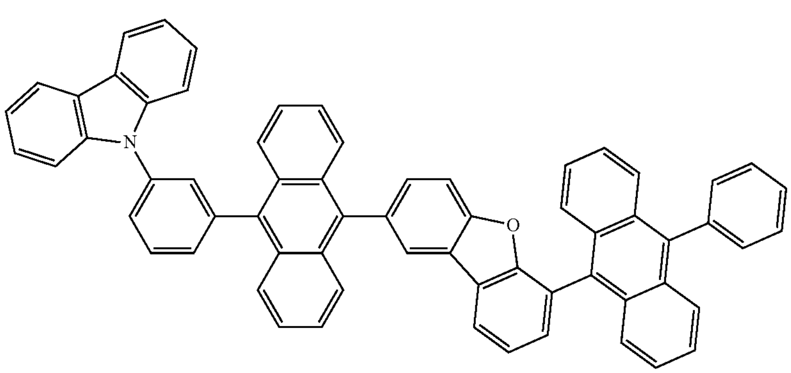

-continued
2055
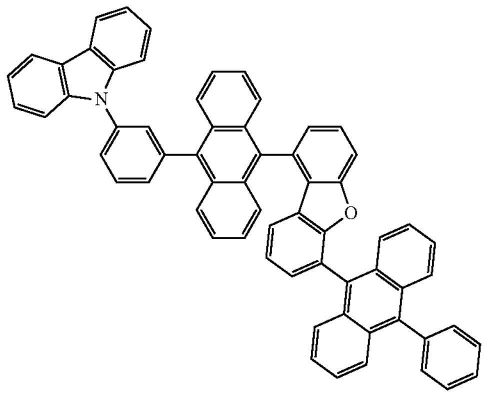
2056
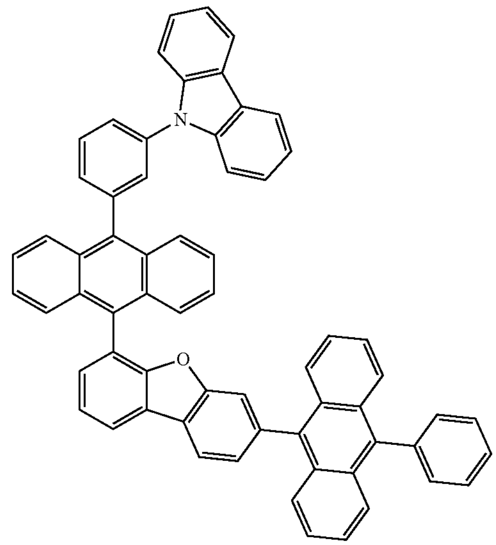
2057
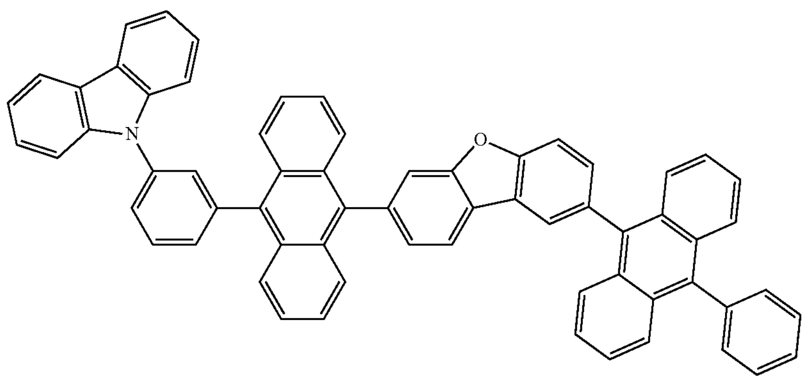
2058
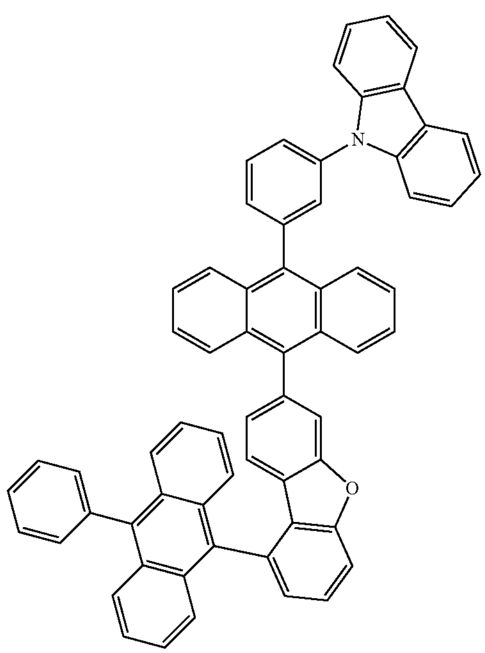

-continued
2059
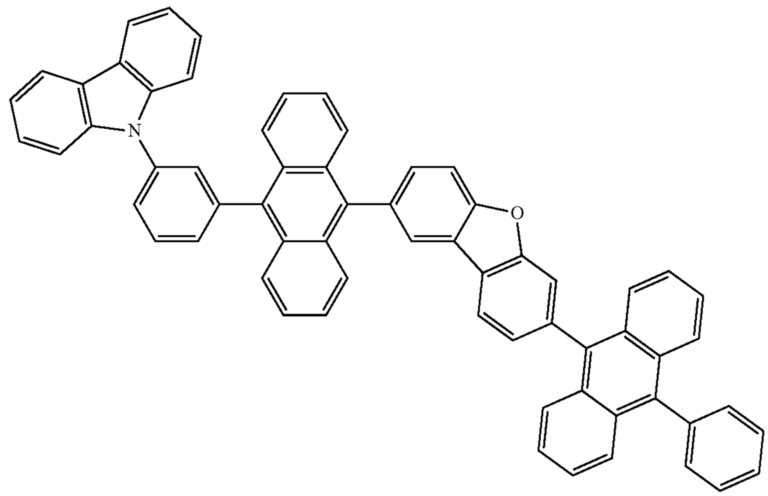
2060
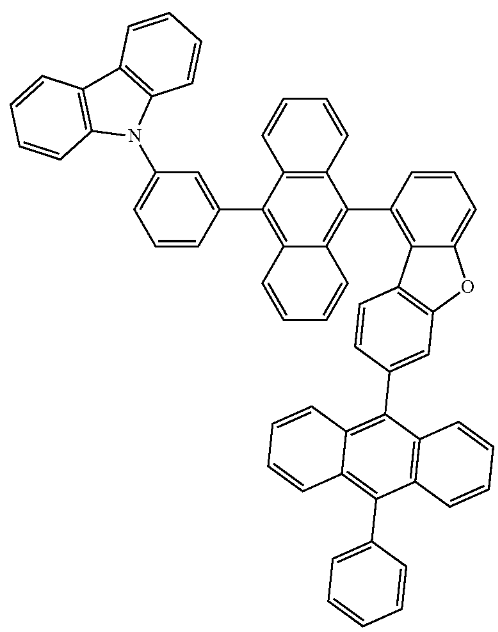
2061
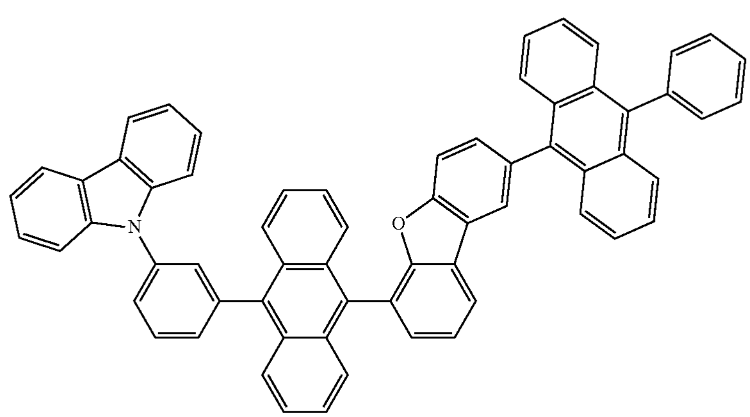

-continued
2062
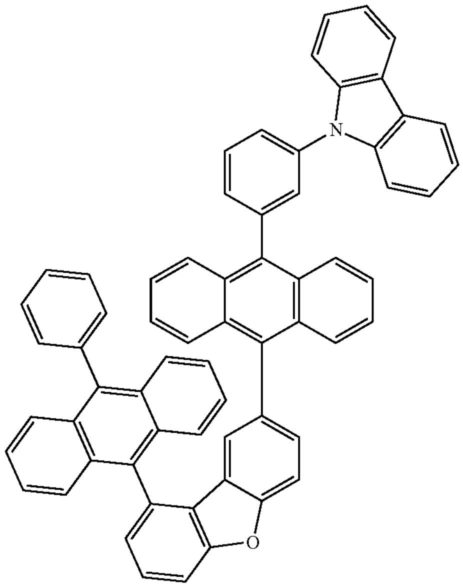
2063
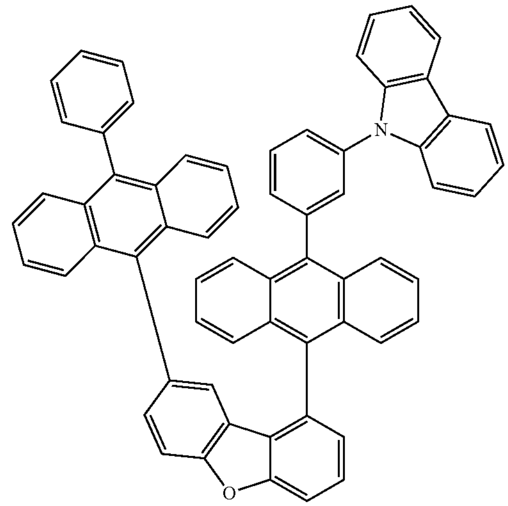
2064
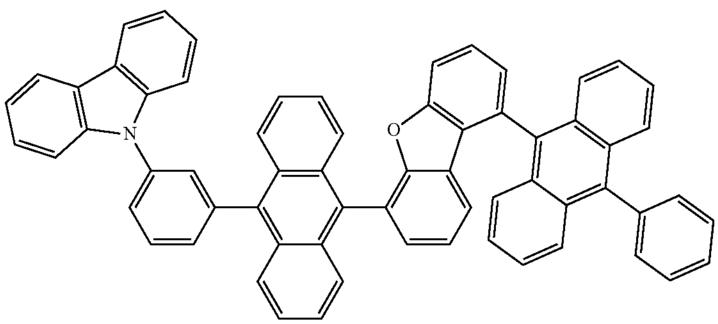
2065
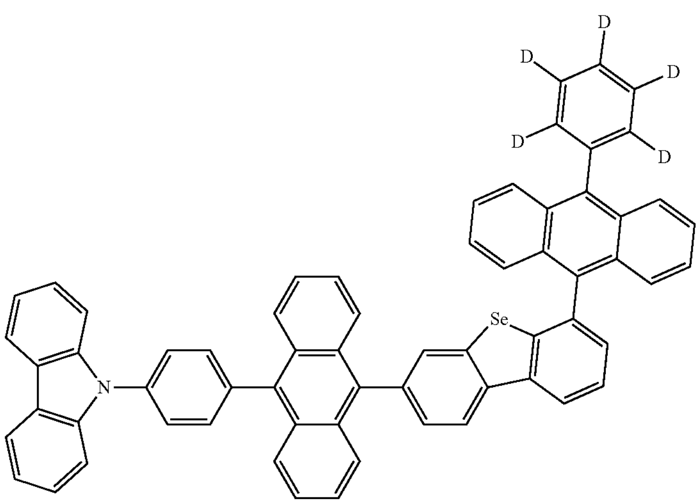

-continued
2066
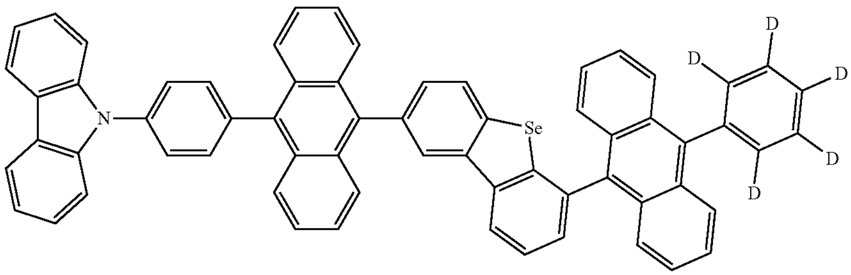
2067
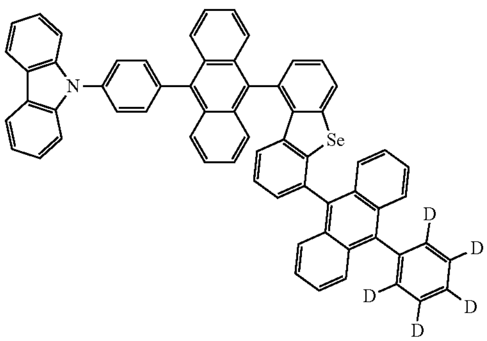
2068
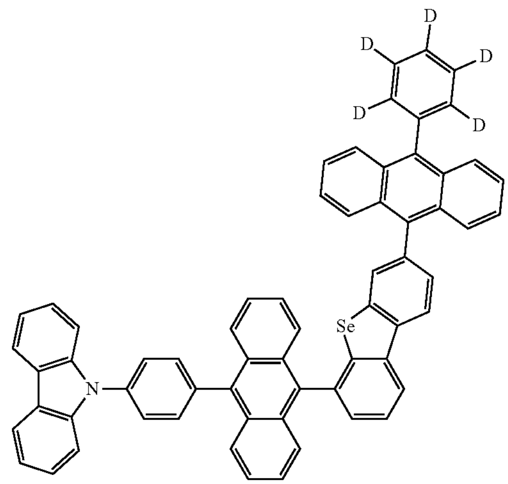
2069
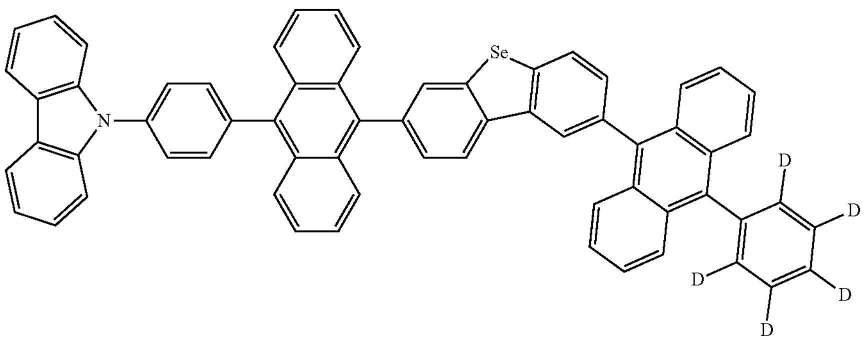
2070
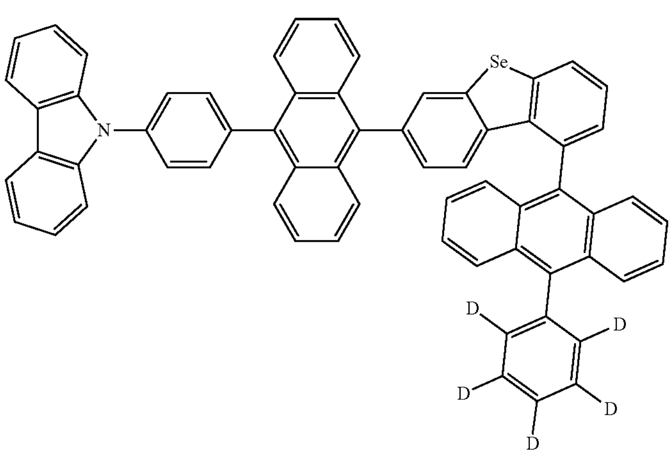

-continued
2071
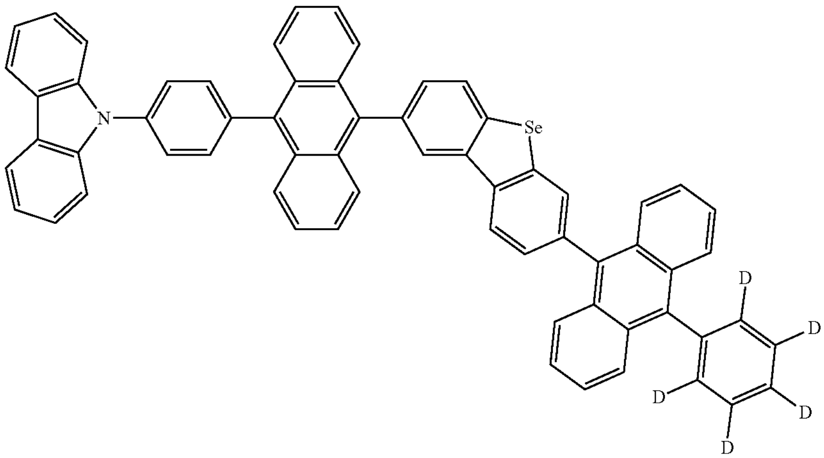
2072
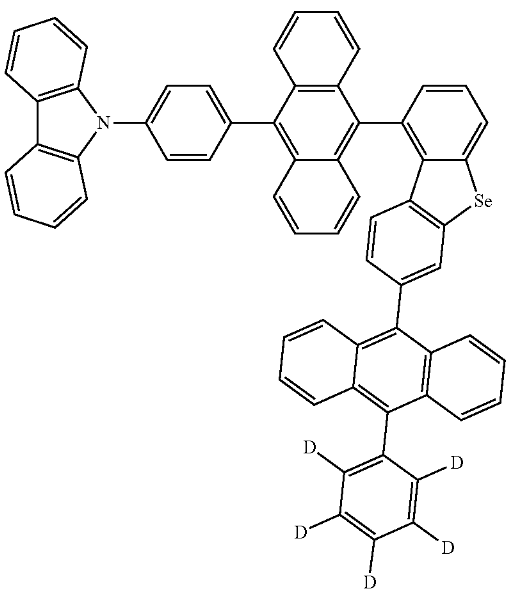
2073
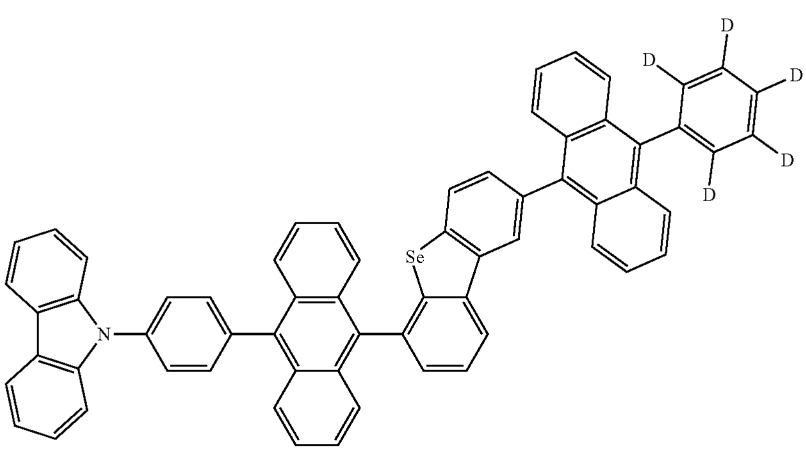

-continued
2074
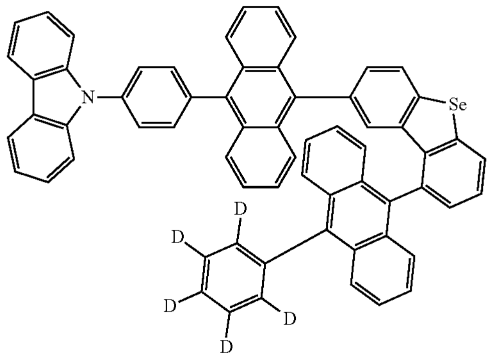
2075
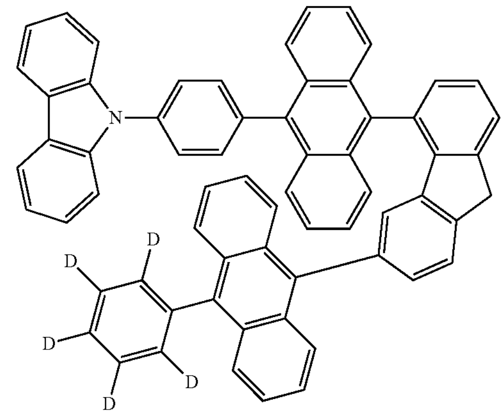
2076
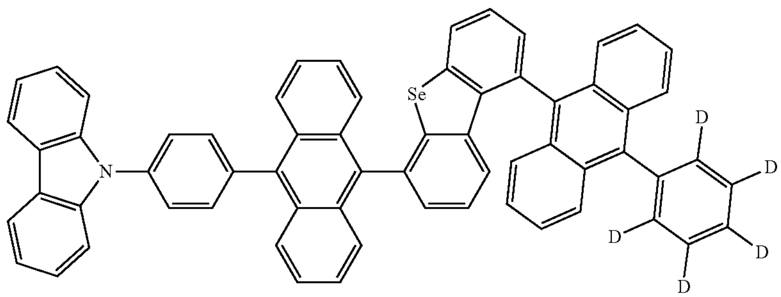
2077
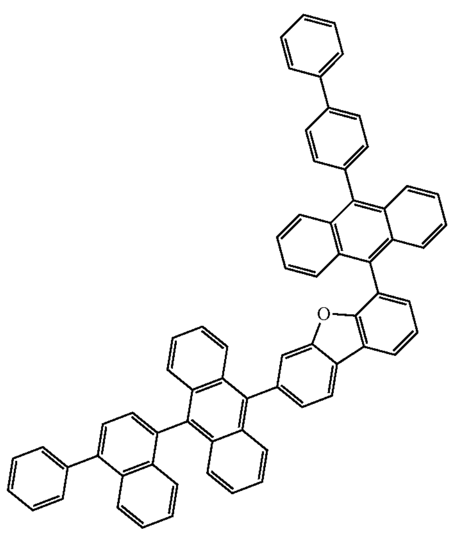
2078
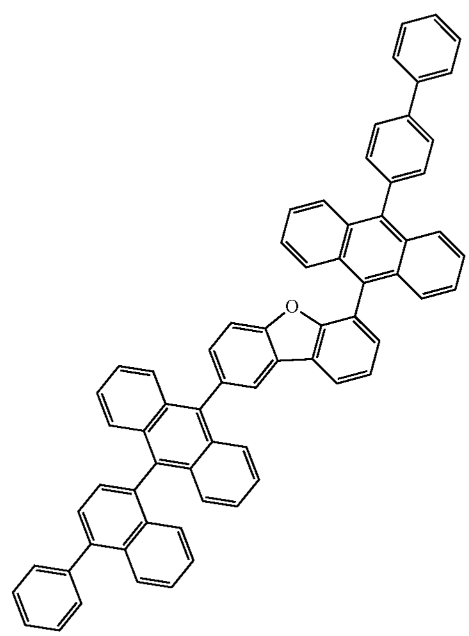

-continued
2079
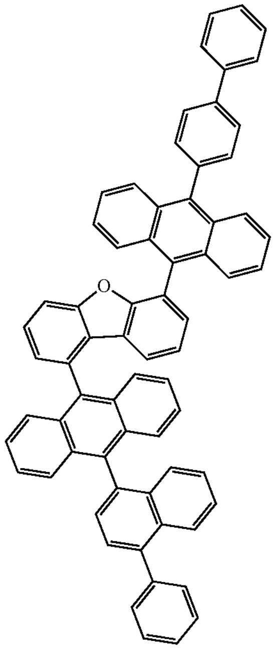
2080
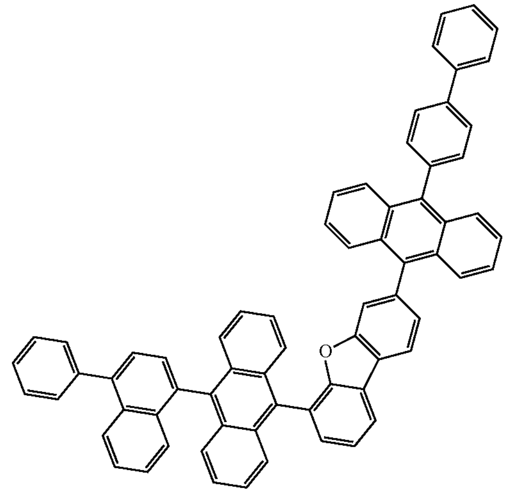
2081
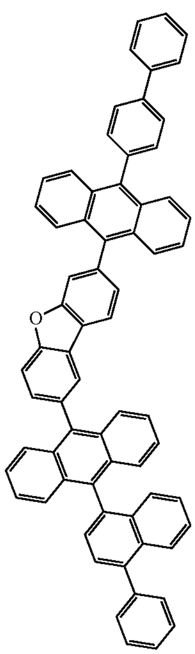
2082
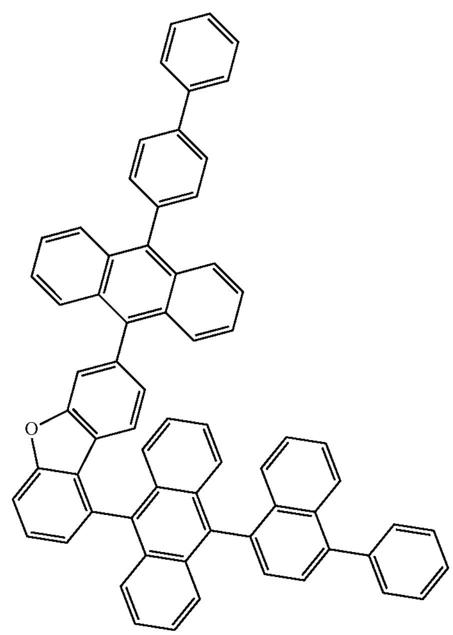

-continued
2083
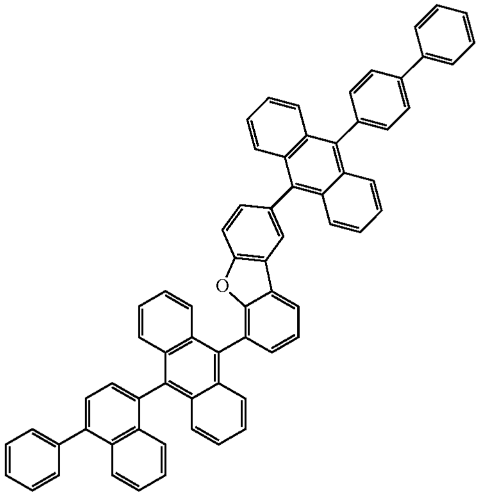
2084
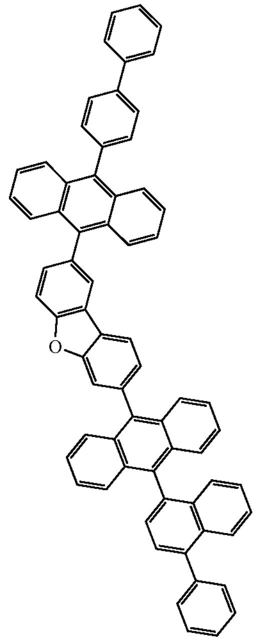
2085
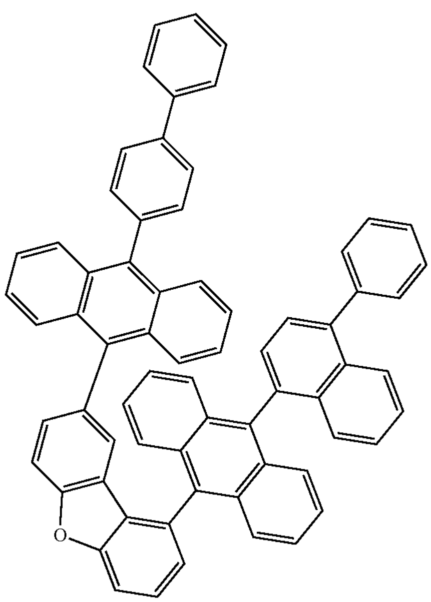

-continued
2086
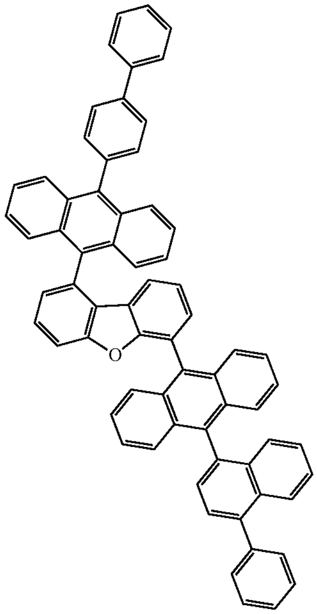
2087
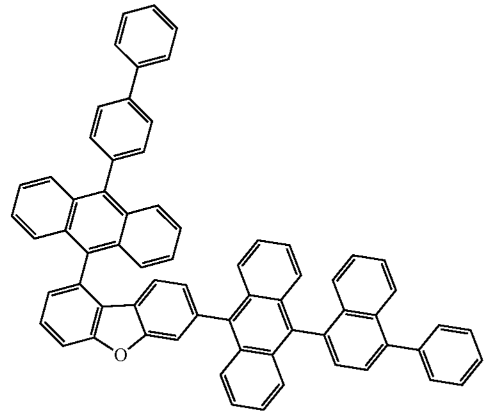
2088
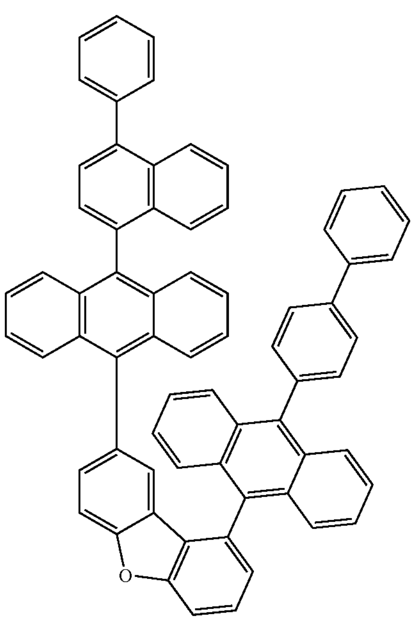
2089
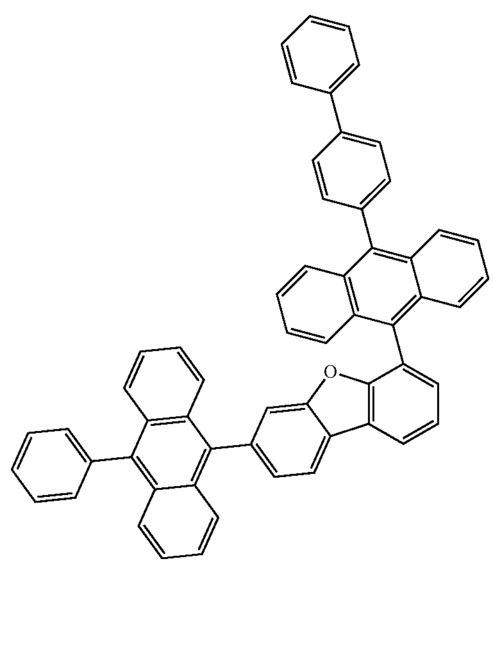

-continued
2090
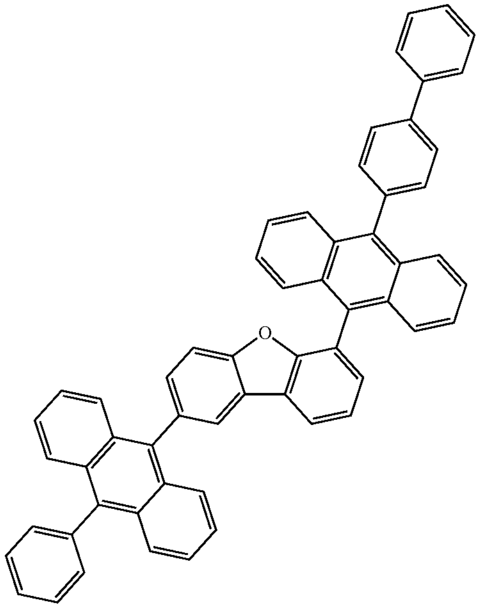
2091
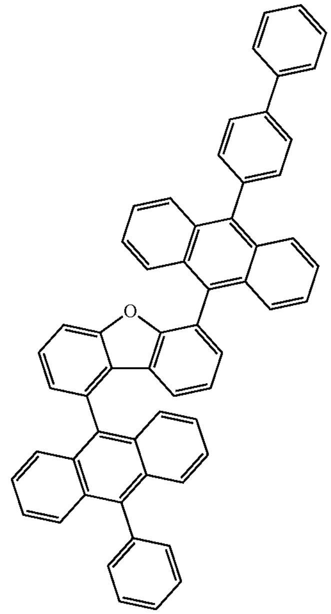
2092
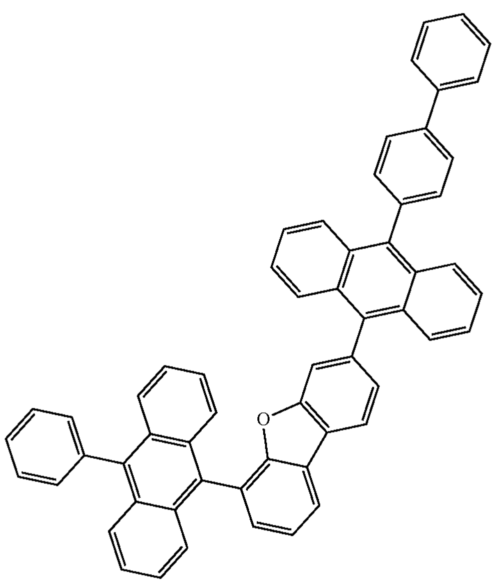
2093
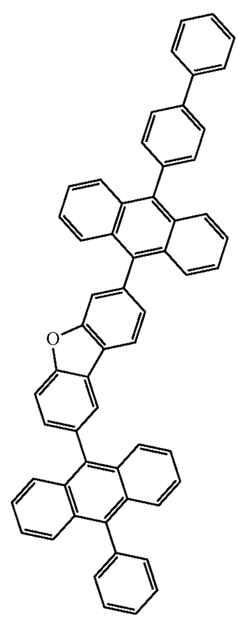

-continued
2094
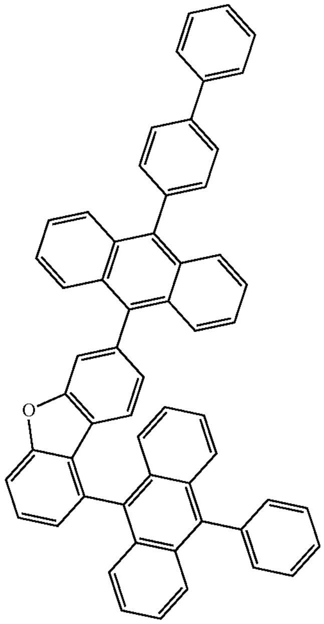
2095
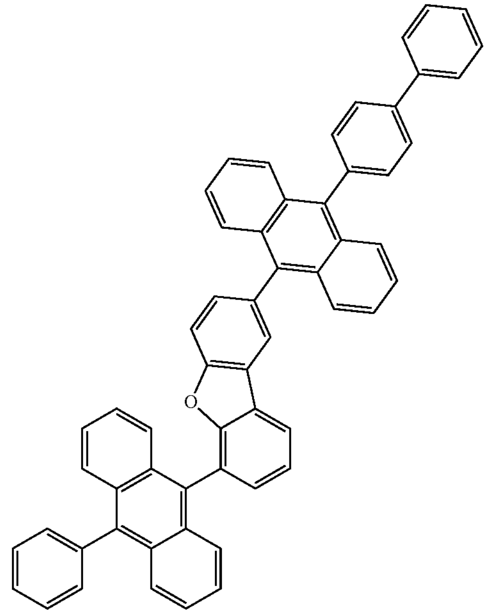
2096
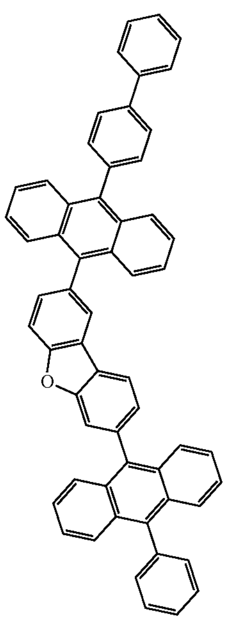
2097
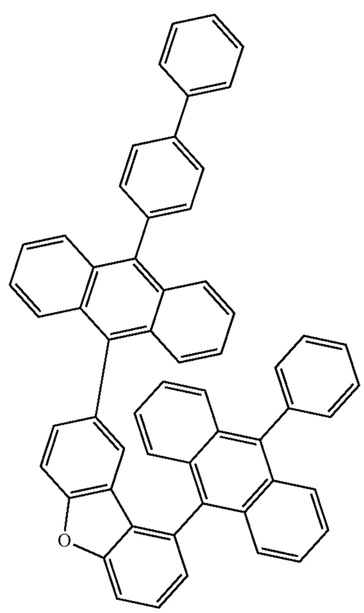

-continued
2098
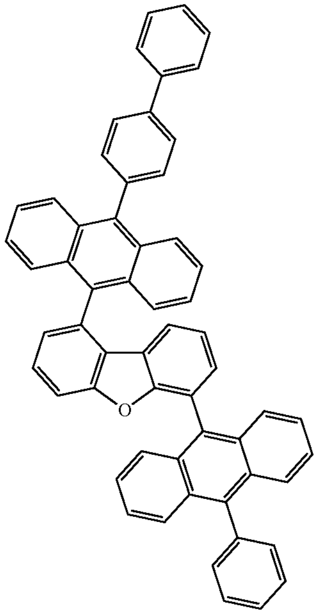
2099
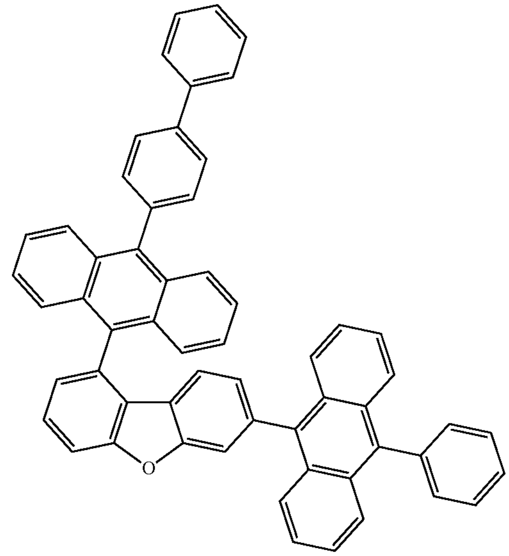
2100
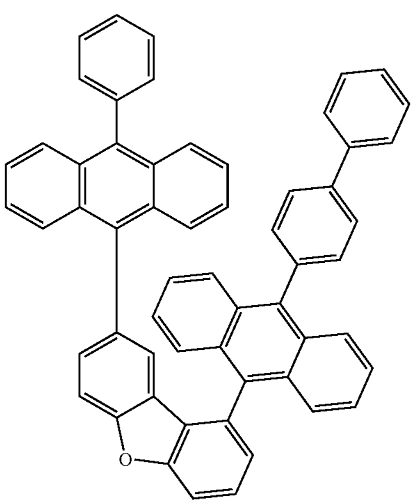

-continued
2101
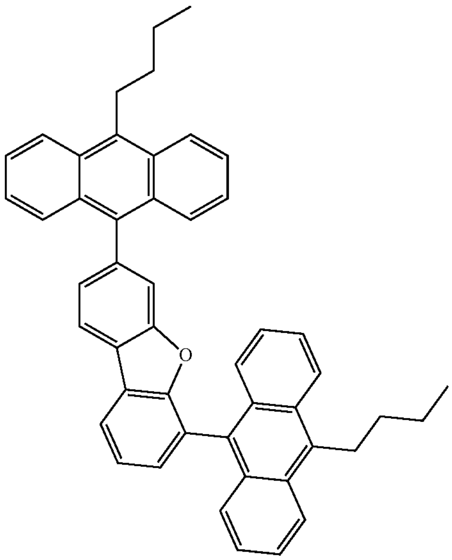
2102
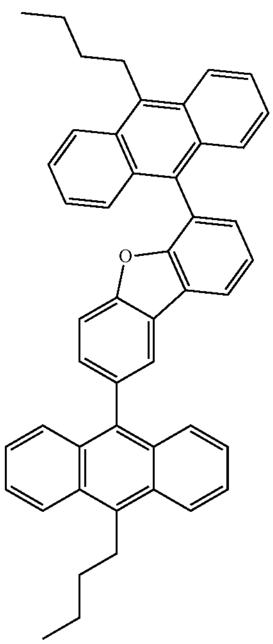
2103
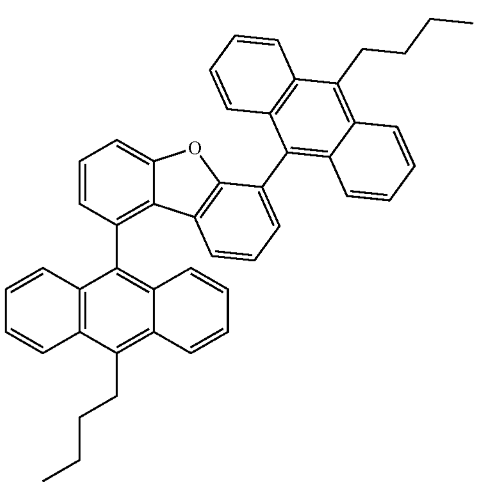
2104
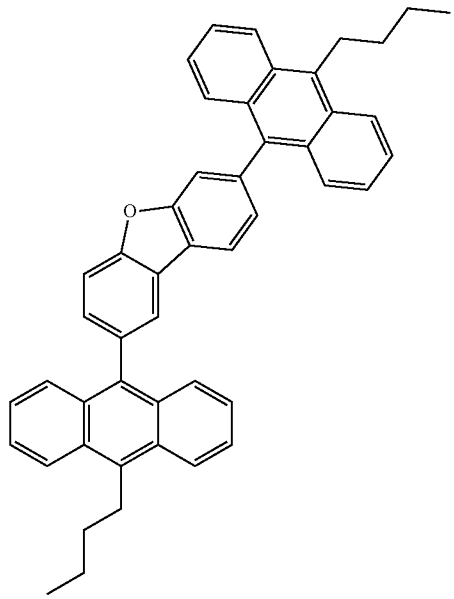
2105
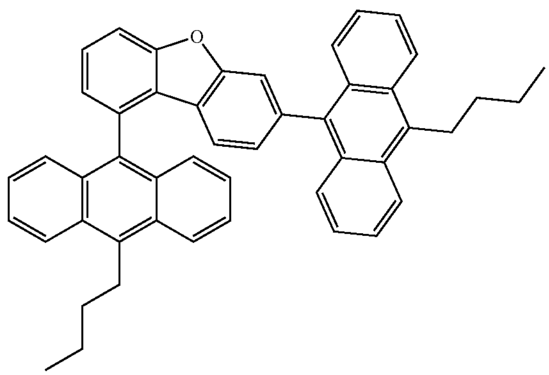
2106
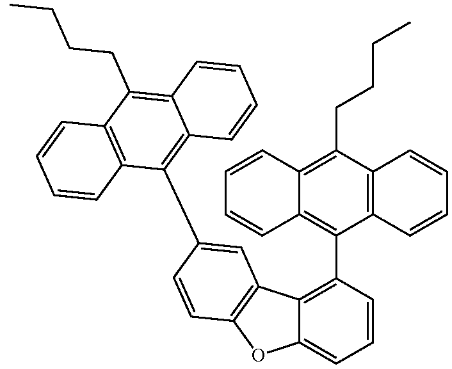

-continued
2107
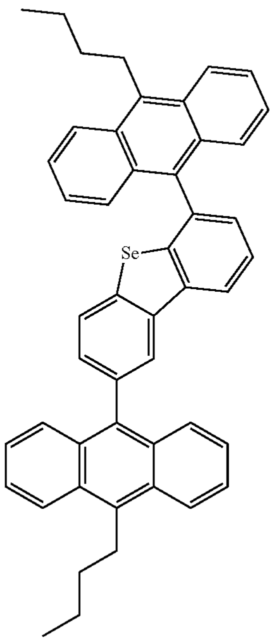
2108
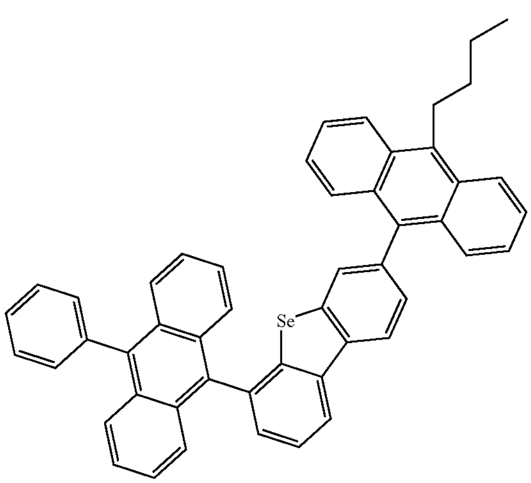
-continued
2109
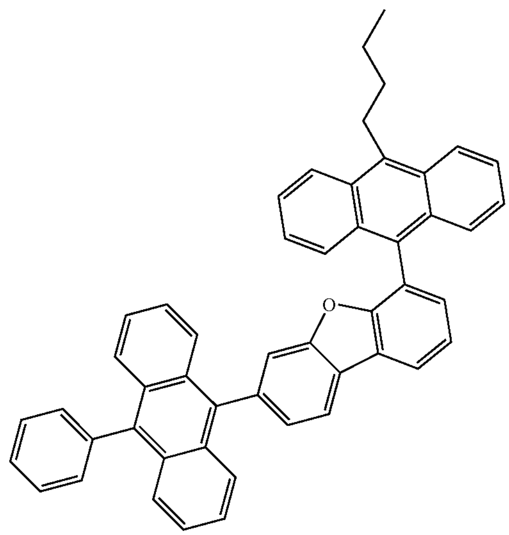
2110
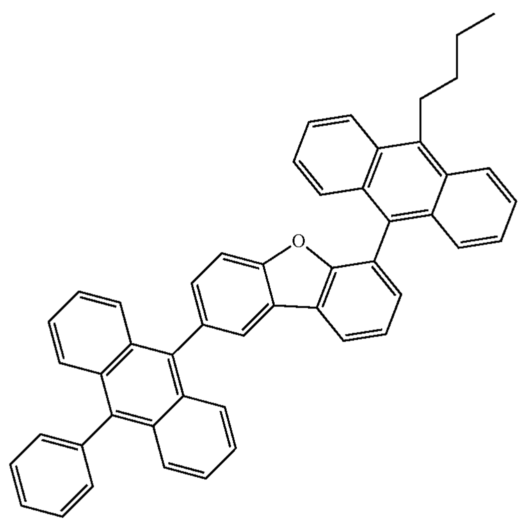
2111
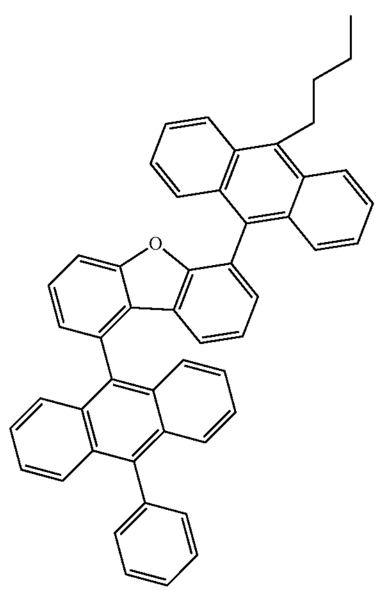

-continued
2112
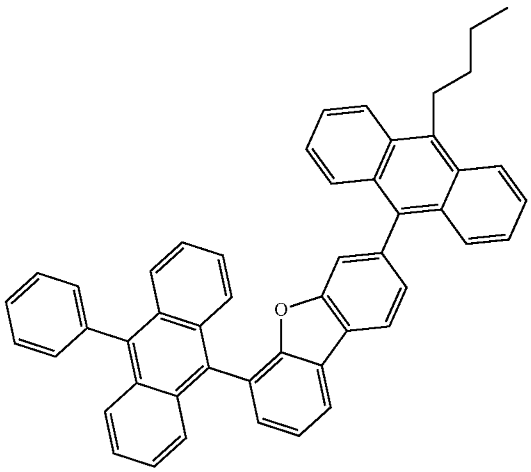
2113
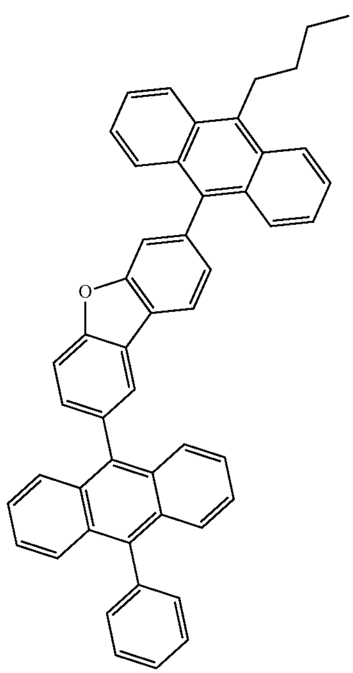
-continued
2114
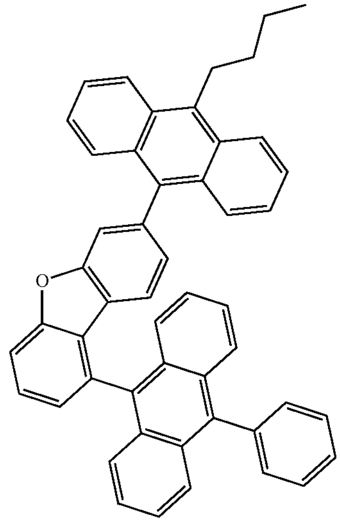
2115
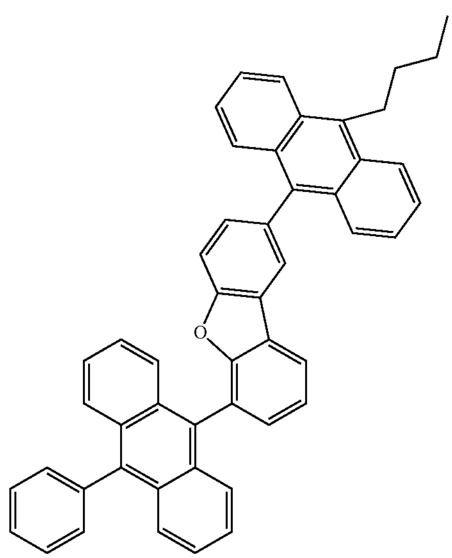

-continued
2116
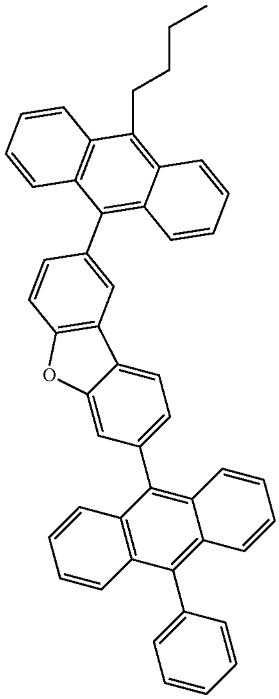
2117
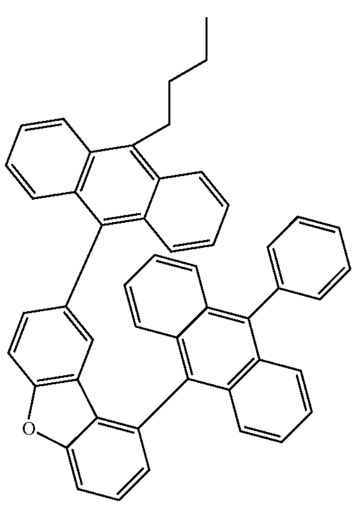
-continued
2118
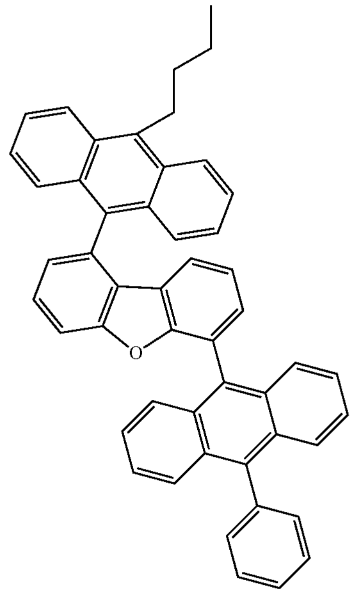
2119
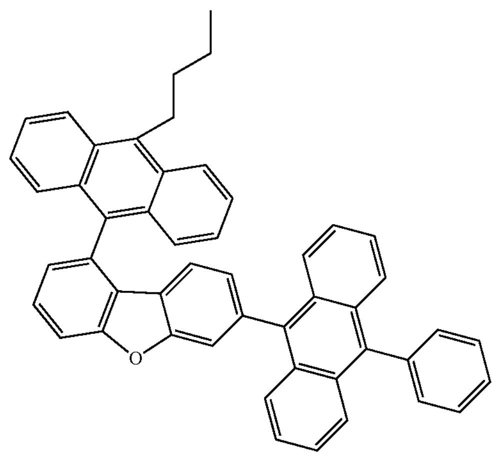
2120
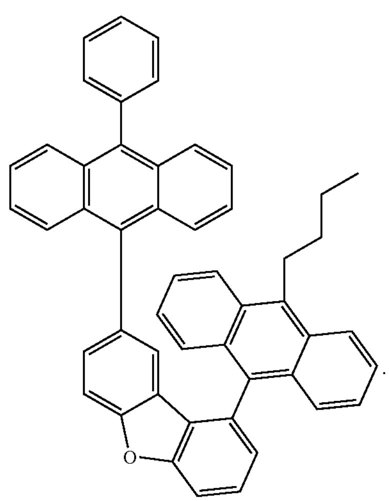
In an embodiment, the fluorescent dopant in the emission layer may be a prompt fluorescent dopant.
In one or more embodiments, a maximum emission wavelength of the fluorescent dopant in the emission layer may be in a range of about 420 nm to about 480 nm. In some embodiments, the fluorescent dopant may emit blue light.

In one or more embodiments, the first compound, the second compound, and the fluorescent dopant in the emission layer may satisfy at least one of Equations 6 to 11:

$$S1(H2)>S1(\mathrm{FD}) \quad \text{Equation 6}$$

$$T1(H2)>T1(\mathrm{FD}) \quad \text{Equation 7}$$

$$|\mathrm{HOMO}(H2)|>|\mathrm{HOMO}(\mathrm{FD})| \quad \text{Equation 8}$$

$$|\mathrm{LUMO}(H2)|>|\mathrm{LUMO}(\mathrm{FD})| \quad \text{Equation 9}$$

$$|\mathrm{HOMO}(H1)|>|\mathrm{HOMO}(\mathrm{FD})| \quad \text{Equation 10}$$

$$|\mathrm{LUMO}(H1)|<|\mathrm{LUMO}(\mathrm{FD})| \quad \text{Equation 11}$$

wherein, in Equations 6 to 11,

S1(H2) represents an S1 singlet energy level (eV) of the second compound,

S1(FD) represents an S1 singlet energy level (eV) of the fluorescent dopant,

T1(H2) represents a T1 triplet energy level (eV) of the second compound,

T1(FD) represents a T1 triplet energy level (eV) of the fluorescent dopant,

|HOMO(H1)| represents an absolute value of the HOMO energy level (eV) of the first compound,

|HOMO(H2)| represents an absolute value of the HOMO energy level (eV) of the second compound,

|HOMO(FD)| represents an absolute value of the HOMO energy level (eV) of the fluorescent dopant,

|LUMO(H1)| represents an absolute value of the LUMO energy level (eV) of the first compound,

|LUMO(H2)| represents an absolute value of the LUMO energy level (eV) of the second compound,

|LUMO(FD)| represents an absolute value of the LUMO energy level (eV) of the fluorescent dopant, and S1(H2), S1(FD), T1(H2), T1(FD), HOMO(H1), HOMO(H2), HOMO(FD), LUMO(H1), LUMO(H2), and LUMO(FD) may each be obtained using DFT.

In some embodiments, S1(H2) may be in a range of about 2.7 eV to about 3.3 eV or about 2.8 eV to about 3.2 eV.

For example, S1(FD) may be in a range of about 2.5 eV to about 3.0 eV or about 2.6 eV to about 2.9 eV.

For example, T1(FD) may be in a range of about 1.4 eV to about 2.0 eV or about 1.5 eV to about 1.8 eV.

For example, HOMO(FD) may be in a range of about −5.0 eV to about −4.4 eV or about −4.8 eV to about −4.5 eV.

For example, LUMO(FD) may be in a range of about −1.7 eV to about −1.2 eV or about −1.6 eV to about −1.3 eV.

When the first compound, the second compound, and the fluorescent dopant in the emission layer satisfy at least one of Equations 6 to 11, charge balance between holes and electrons in the emission layer may be improved to thereby facilitate TTF effects in the emission layer. Thus, a luminescence efficiency of the organic light-emitting device may be further improved.

In one or more embodiments, the emission layer may not include a transition metal.

In one or more embodiments, the emission layer may substantially not emit phosphorescence.

In some embodiments, the fluorescent dopant may be a fluorescence-emitting material not including a cyano group (—CN) and a fluoro group (—F).

In some embodiments, a fluorescent dopant may be a condensed ring-containing compound, an amino group-containing compound, a styryl group-containing compound, or a boron group-containing compound.

In an embodiment, the fluorescent dopant may include a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group (a tetracene group), a picene group, a perylene group, a pentaphene group, an indenoanthracene group, a group represented by one of Formulae 501-1 to 501-21, or any combination thereof:

501-1

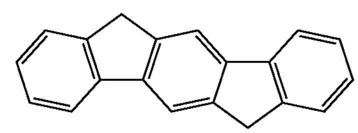

501-2

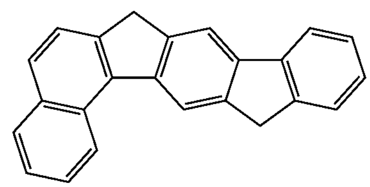

501-3

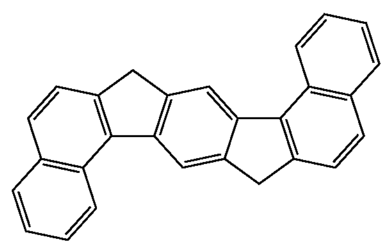

501-4

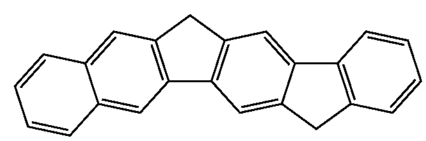

501-5

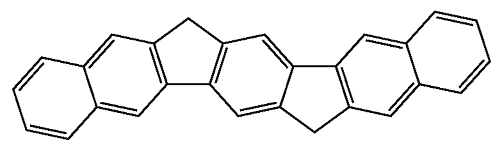

501-6

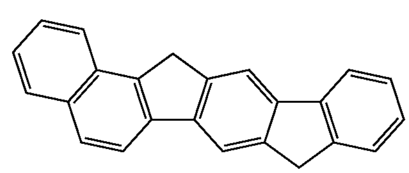

501-7

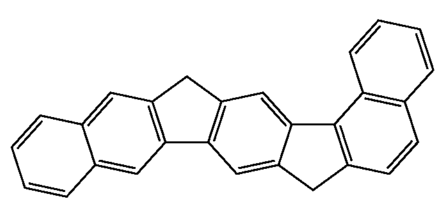

-continued
501-8
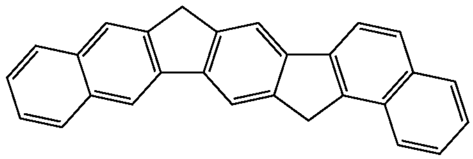
501-9
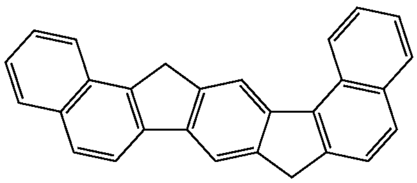
501-10
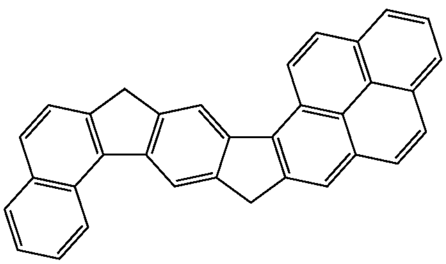
501-11
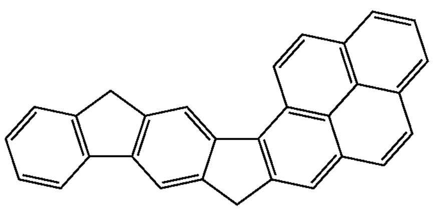
501-12
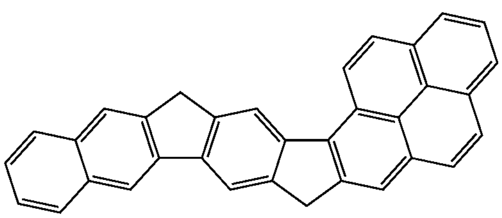
501-13
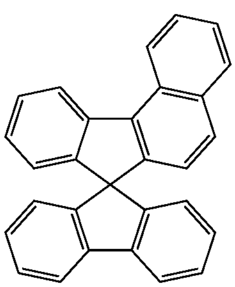
501-14
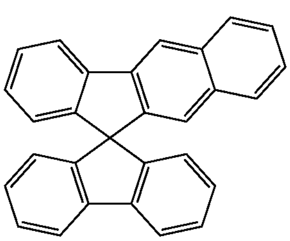
-continued
501-15
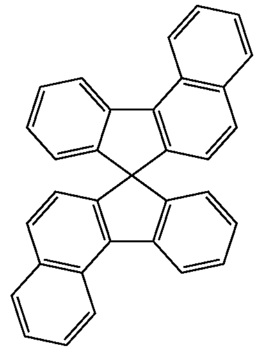
501-16
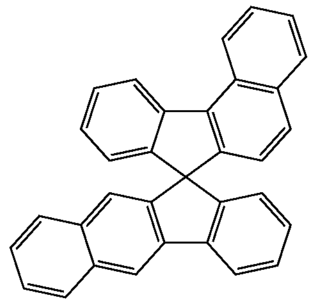
501-17
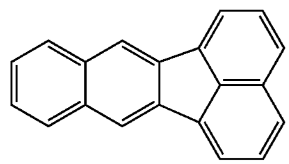
501-18
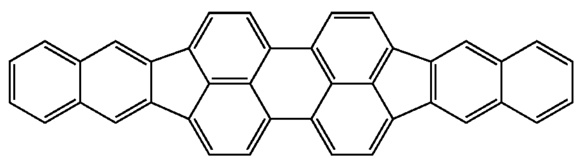
501-19
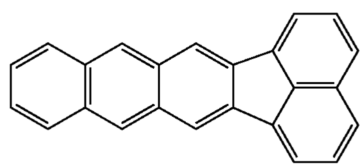
501-20
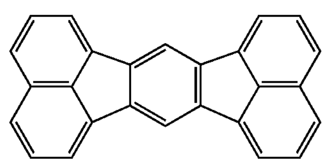
501-21
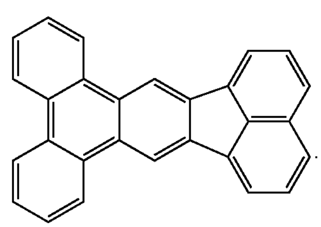
In one or more embodiments, the fluorescent dopant may include a compound represented by Formula 501A or 501B:

501A

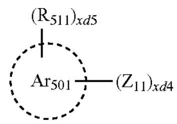

501B

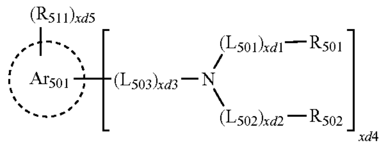

wherein, in Formulae 501A and 501B, $Ar_{501}$ may be a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group, a picene group, a perylene group, a pentaphene group, an indenoanthracene group, a tetracene group, a bisanthracene group, or a group represented by one of Formulae 501-1 to 501-21, $R_{511}$ may be hydrogen, deuterium, —F, —Cl, —Br, —I, a hydroxyl group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or —Si($Q_{501}$)($Q_{502}$)($Q_{503}$), xd5 may be an integer from 0 to 10, $L_{501}$ to $L_{503}$ may each independently be:

a single bond; or a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, or a divalent non-aromatic condensed heteropolycyclic group, each unsubstituted or substituted with at least one deuterium, —F, —Cl, —Br, —I, a hydroxyl group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{501}$)($Q_{502}$)($Q_{503}$), or any combination thereof, xd1 to xd3 may each independently be 1, 2, or 3, $R_{501}$ and $R_{502}$ may each independently be a phenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazole group, a triazinyl group, a dibenzofuranyl group, a dibenzothiophenyl group, or a dibenzosilolyl group, each unsubstituted or substituted with at least one deuterium, —F, —Cl, —Br, —I, a hydroxyl group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{501}$)($Q_{502}$)($Q_{503}$), or any combination thereof, $Z_{11}$ may be a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with at least one deuterium, —F, —Cl, —Br, —I, a hydroxyl group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{501}$)($Q_{502}$)($Q_{503}$), or any combination thereof, and xd4 may be 1, 2, 3, 4, 5, or 6, wherein $Q_{501}$ to $Q_{503}$ may each independently be hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, or a monovalent non-aromatic condensed heteropolycyclic group.

In one or more embodiments, the fluorescent dopant may include a compound represented by Formula 501A or 501B, xd4 in Formula 501A may be 1, 2, 3, 4, 5, or 6, and xd4 in Formula 501B may be 2, 3, or 4.

In one or more embodiments, the fluorescent dopant may include one of Compounds FD(1) to FD(16), one of Compounds FD1 to FD15, or any combination thereof:

FD(1)
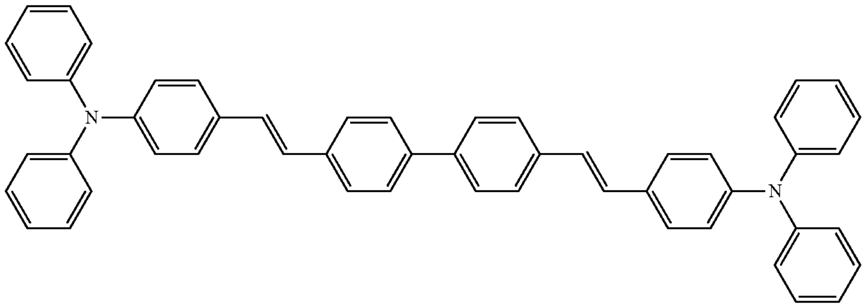
FD(2)
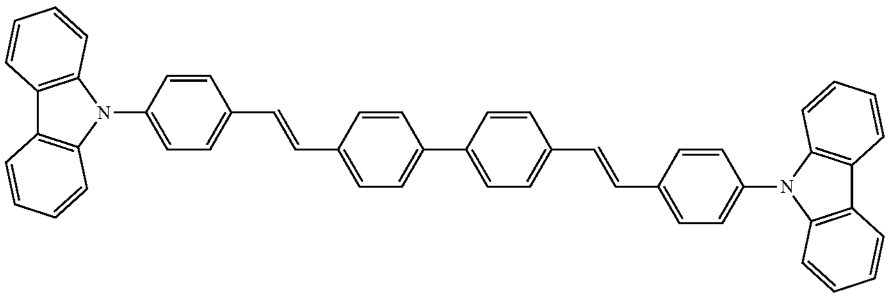
FD(3)
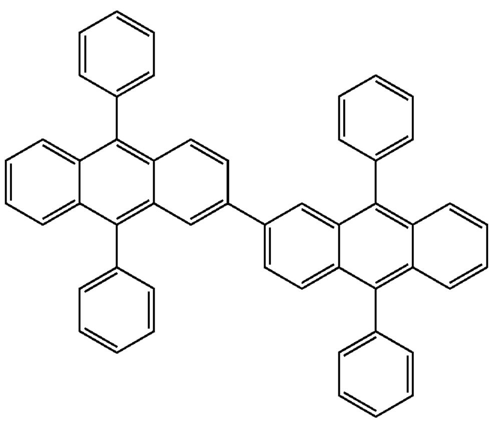
FD(4)
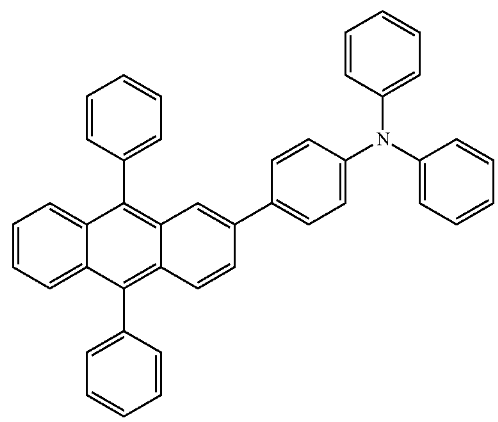
FD(5)
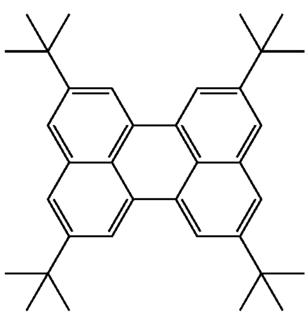
FD(6)
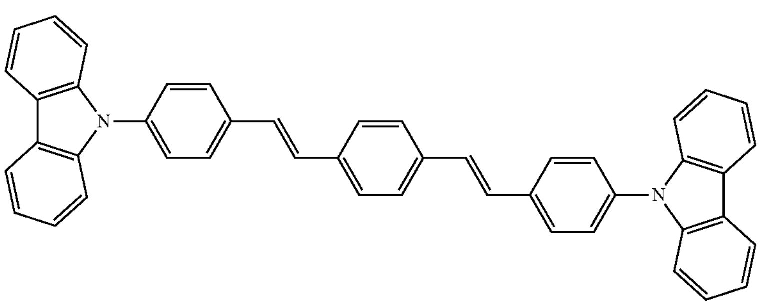

-continued
FD(7)
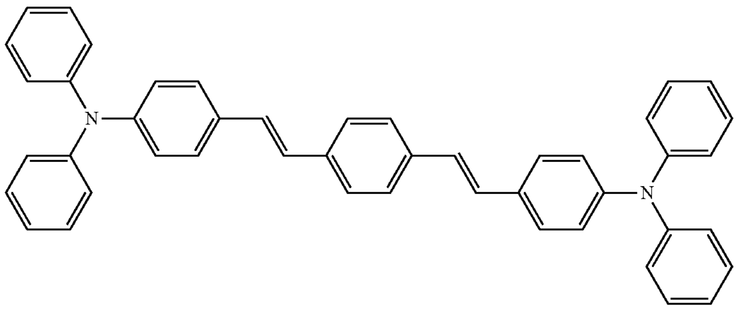
FD(8)
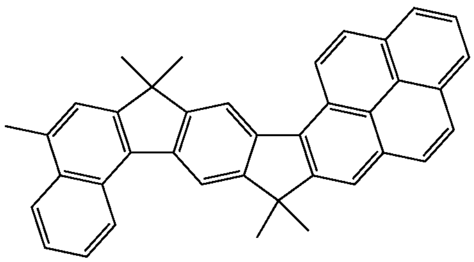
FD(9)
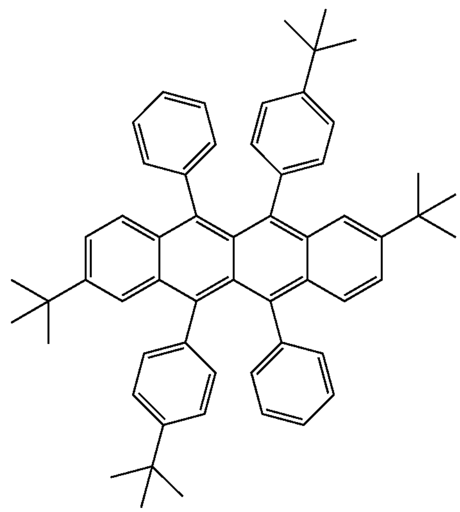
FD(10)
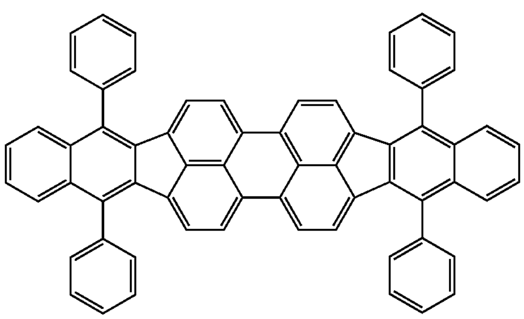
FD(11)
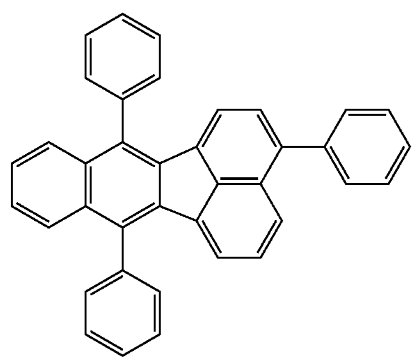
FD(12)
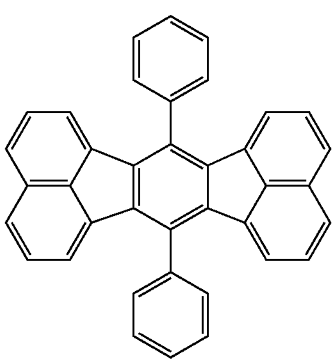
FD(13)
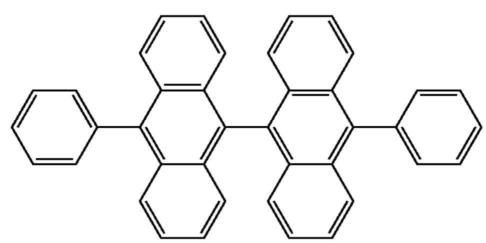

-continued
FD(14)
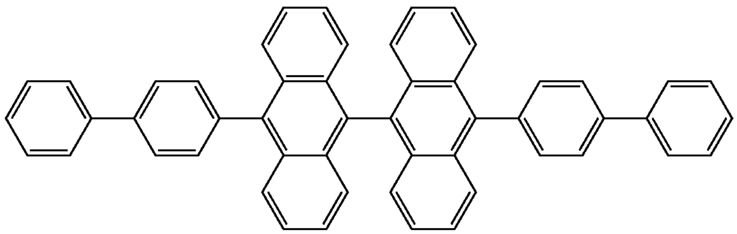
FD(15)
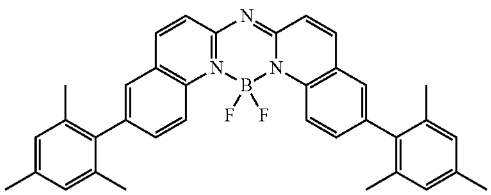
FD(16)
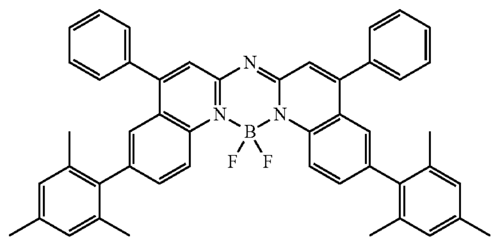
FD1
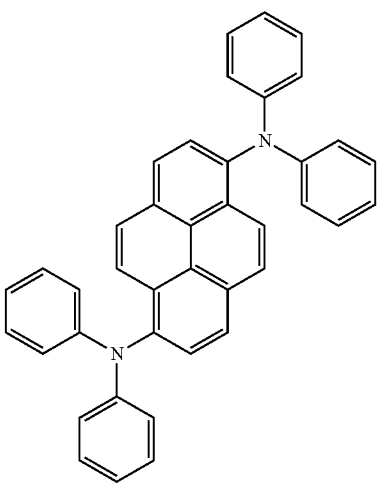
FD2
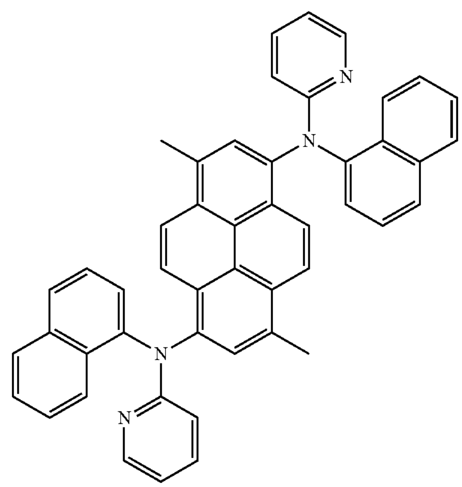
FD3
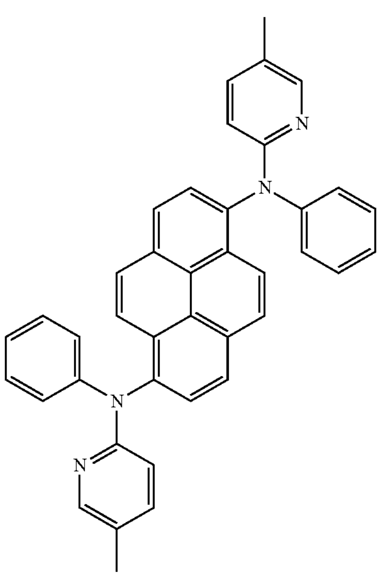
FD4
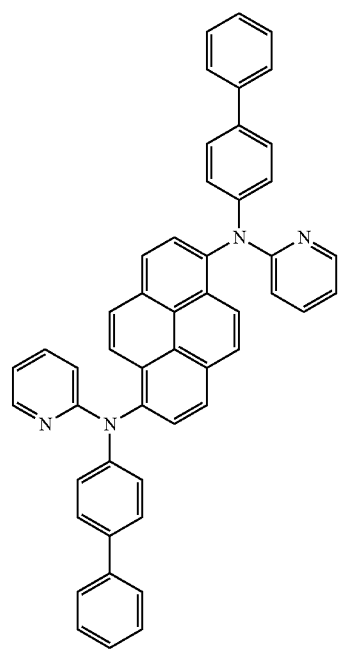

-continued
FD5
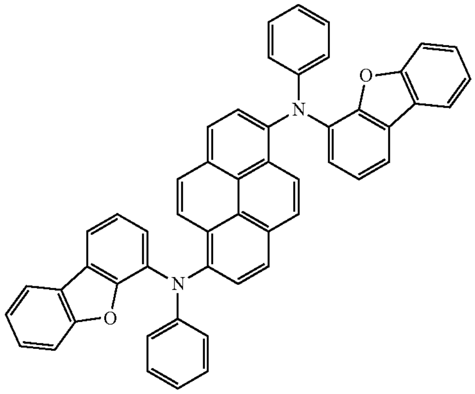
FD6
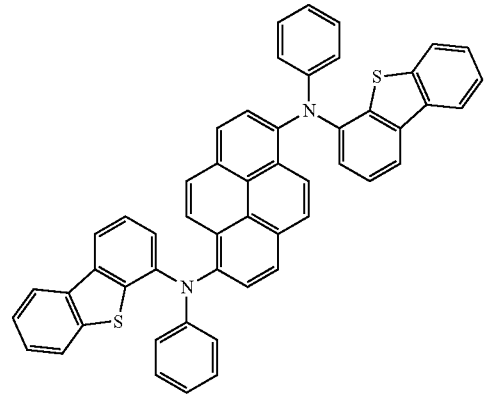
FD7
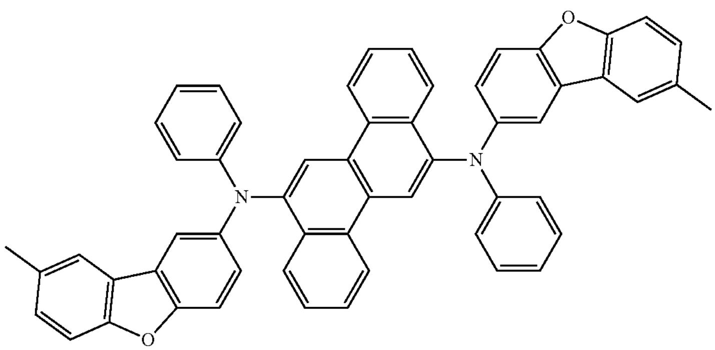
FD8
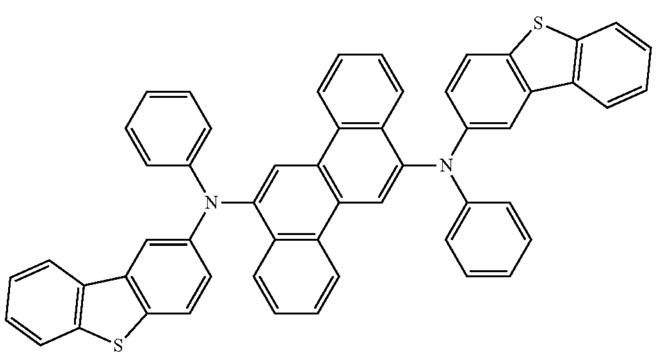
FD9
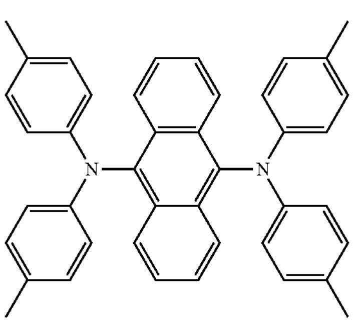
FD10
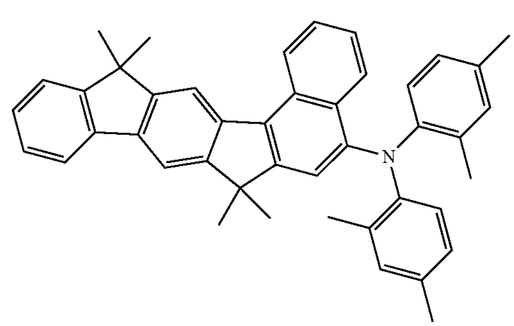

-continued

FD11

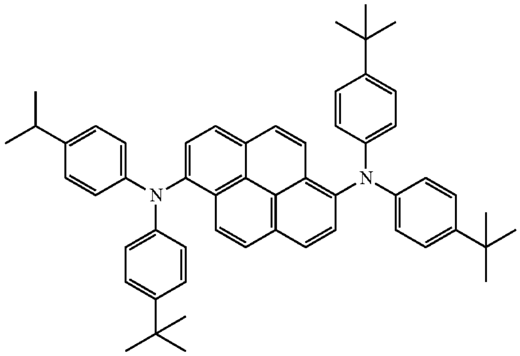

FD12

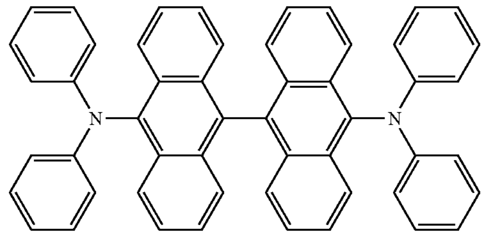

FD13

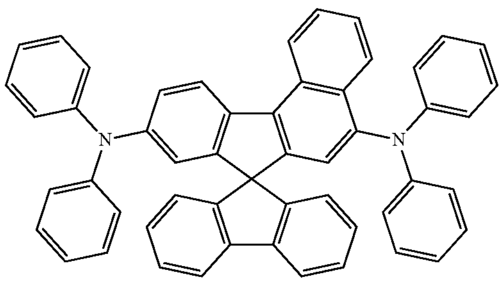

FD14

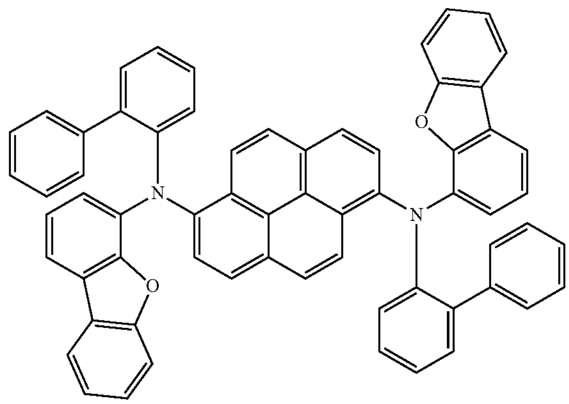

FD15

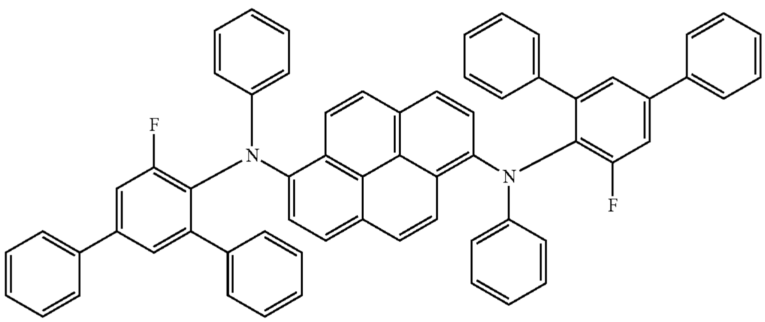

A ratio of fluorescent emission components emitted from the fluorescent dopant may be about 50% or greater, for example, 60% or greater, for example, 70% or greater, for example, 80% or greater, or for example, 90% or greater of the whole emission components emitted from the emission layer. That is, major fluorescent emission components from the emission layer may be fluorescent emission components emitted from the fluorescent dopant.

A weight ratio between the first compound to the second compound in the emission layer may be in a range of about 1:9 to about 9:1, about 2:8 to about 8:2, about 7:3 to about 3:7, or about 6:4 to about 4:6. Alternatively, a volume ratio between the first compound to the second compound in the emission layer may be in a range of about 1:9 to about 9:1, about 2:8 to about 8:2, about 7:3 to about 3:7, or about 6:4 to about 4:6. When the weight ratio of the volume ratio between the first compound and the second compound is within any of these ranges, balance between holes and electrons in the emission layer may be effectively obtained.

A weight ratio of the total weight of the first compound and the second compound in the emission layer to the weight of the fluorescent dopant may be in a range of about 99.5:0.5 to about 80:20, or for example, about 99:1 to about 90:10. Alternatively, a volume ratio of the total volume of the first compound and the second compound in the emission layer to the volume of the fluorescent dopant may be in a range of about 99.5:0.5 to about 80:20, or for example, about 99:1 to about 90:10. When the weight ratio or the volume ratio is within any of these ranges, exciton quenching may be substantially prevented, thereby allowing the manufacture of an organic light-emitting device having an excellent luminescence efficiency.

FIG. 1 illustrates a schematic cross-sectional view of an organic light-emitting device 10 according to an exemplary embodiment. Hereinafter, a structure of an organic light-emitting device according to one or more embodiments and a method of manufacturing the organic light-emitting device will be described with reference to FIG. 1. The organic light-emitting device 10 may include a first electrode 11, an organic layer 15, and a second electrode 19, which may be sequentially layered in this stated order.

A substrate may be additionally disposed under the first electrode 11 or on the second electrode 19. The substrate may be a conventional substrate used in organic light-emitting devices, e.g., a glass substrate or a transparent plastic substrate, each having excellent mechanical strength, thermal stability, transparency, surface smoothness, ease of handling, and water repellency.

The first electrode 11 may be formed by depositing or sputtering, onto the substrate, a material for forming the first electrode 11. The first electrode 11 may be an anode. The material for forming the first electrode 11 may include a material with a high work function for easy hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), or zinc oxide (ZnO). In some embodiments, the material for forming the first electrode 11 may be a metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including a plurality of layers. In some embodiments, the first electrode 11 may have a triple-layered structure of ITO/Ag/ITO, but embodiments are not limited thereto.

The organic layer 15 may be on the first electrode 11.

The organic layer 15 may include a hole transport region, an emission layer, and an electron transport region.

The hole transport region may be between the first electrode 11 and the emission layer.

The hole transport region may include a hole injection layer, a hole transport layer, an electron blocking layer, a buffer layer, or any combination thereof.

The hole transport region may include a hole injection layer only or a hole transport layer only. In some embodiments, the hole transport region may include a hole injection layer and a hole transport layer which are sequentially stacked on the first electrode 11. In some embodiments, the hole transport region may include a hole injection layer, a hole transport layer, and an electron blocking layer, which are sequentially stacked on the first electrode 11.

When the hole transport region includes a hole injection layer, the hole injection layer may be formed on the first electrode 11 by using one or more suitable methods, such as vacuum deposition, spin coating, casting, or Langmuir-Blodgett (LB) deposition.

When a hole injection layer is formed by vacuum-deposition, for example, the vacuum deposition may be performed at a temperature in a range of about 100° C. to about 500° C., at a vacuum pressure in a range of about $10^{-8}$ torr to about $10^{-3}$ torr, and at a rate in a range of about 0.01 Angstroms per second (Å/sec) to about 100 Å/sec, though the conditions may vary depending on a compound used as a hole injection material and a structure and thermal properties of a desired hole injection layer, but embodiments are not limited thereto.

When a hole injection layer is formed by spin coating, the spin coating may be performed at a rate in a range of about 2,000 revolutions per minute (rpm) to about 5,000 rpm and at a temperature in a range of about 80° C. to 200° C. to facilitate removal of a solvent after the spin coating, though the conditions may vary depending on a compound used as a hole injection material and a structure and thermal properties of a desired hole injection layer, but embodiments are not limited thereto.

The conditions for forming a hole transport layer and an electron blocking layer may be inferred from the conditions for forming the hole injection layer.

The hole transport region may include m-MTDATA, TDATA, 2-TNATA, NPB, β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor-sulfonic acid (PANI/CSA), polyaniline/poly(4-styrene sulfonate) (PANI/PSS), a compound represented by Formula 201, a compound represented by Formula 202, or any combination thereof:

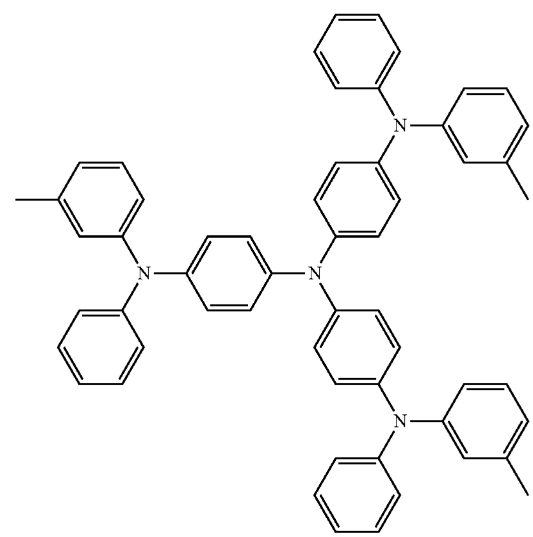

m-MTDATA

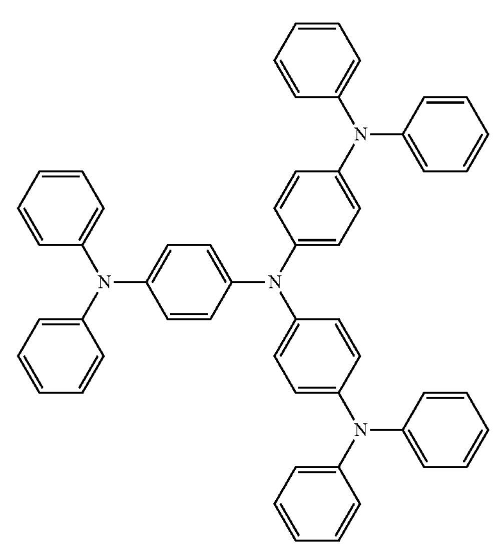

TDATA

-continued
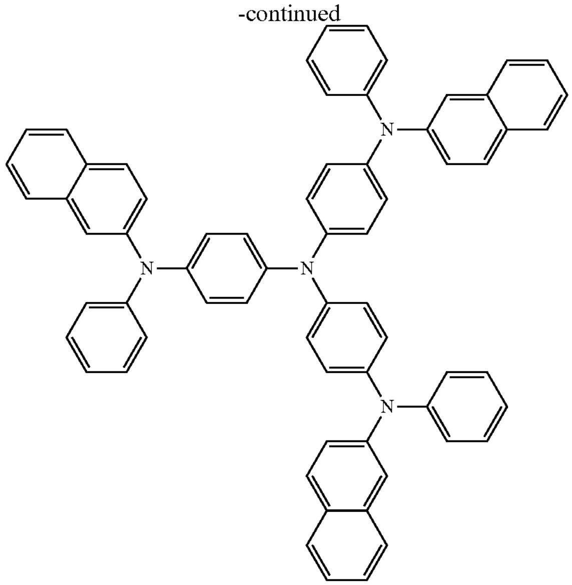
2-TNATA
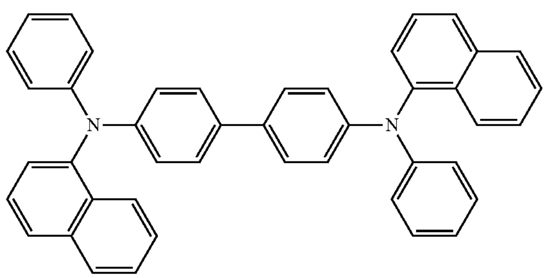
NPB
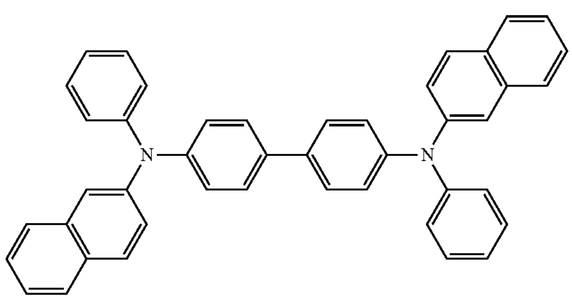
β-NPB
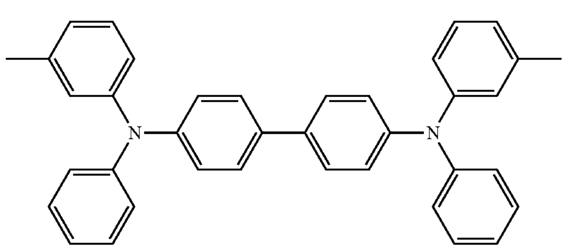
TPD
-continued
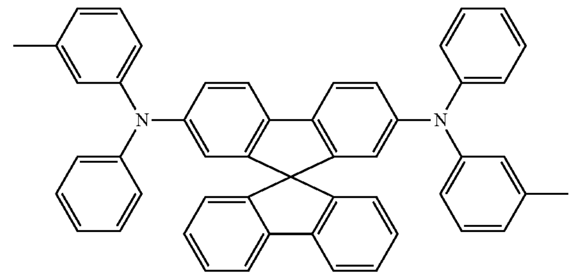
Spiro-TPD
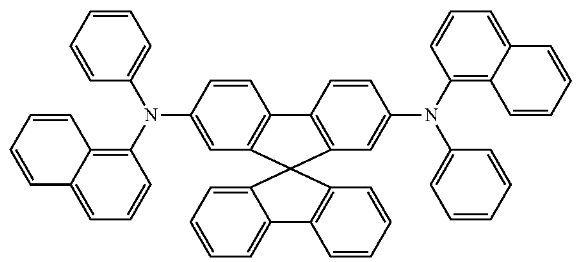
Spiro-NPB
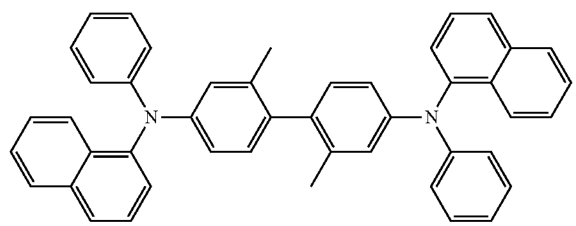
methylated NPB
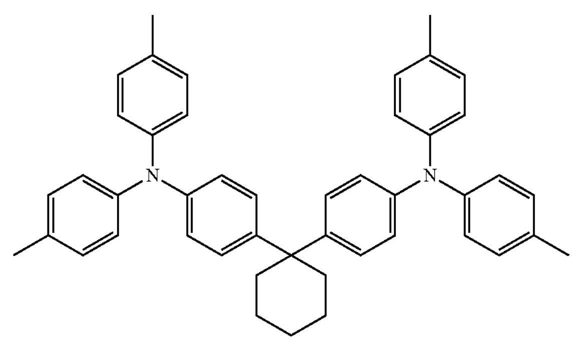
TAPC
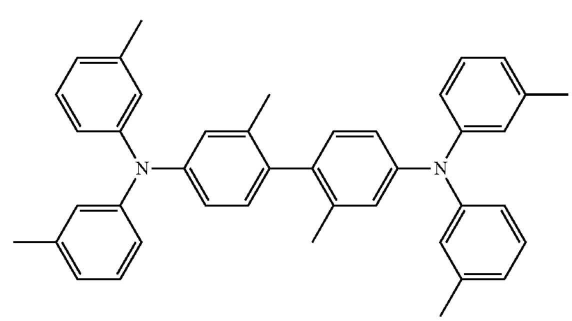
HMTPD -continued Formula 201

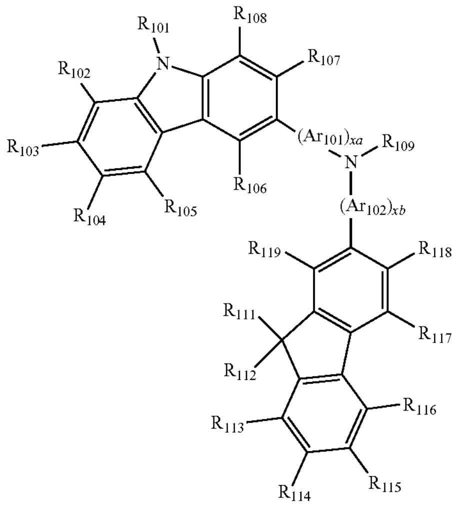

Formula 202

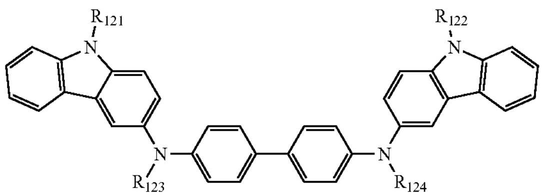

wherein, in Formula 201, $Ar_{101}$ and $Ar_{102}$ may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, or a pentacenylene group, each unsubstituted or substituted with at least one deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

In Formula 201, xa and xb may each independently be an integer from 0 to 5. In some embodiments, xa and xb may each independently be an integer from 0 to 2. In some embodiments, xa may be 1, and xb may be 0, but embodiments are not limited thereto.

In Formulae 201 and 202, $R_{101}$ to $R_{108}$, $R_{111}$ to $R_{119}$, and $R_{121}$ to $R_{124}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (e.g., a methyl group, an ethyl group, a propyl group, a butyl group, pentyl group, or a hexyl group), or a $C_1$-$C_{10}$ alkoxy group (e.g., a methoxy group, an ethoxy group, a propoxy group, a butoxy group, or a pentoxy group);

a $C_1$-$C_{10}$ alkyl group or a $C_1$-$C_{10}$ alkoxy group, each unsubstituted or substituted with at least one deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or any combination thereof; or a phenyl group, a naphthyl group, an anthracenyl group, a fluorenyl group, or a pyrenyl group, each unsubstituted or substituted with at least one deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, or any combination thereof.

In Formula 201, $R_{109}$ may be a phenyl group, a naphthyl group, an anthracenyl group, or a pyridinyl group, each unsubstituted or substituted with at least one deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyridinyl group, or any combination thereof.

In some embodiments, the compound represented by Formula 201 may be represented by Formula 201A, but embodiments are not limited thereto:

Formula 201A

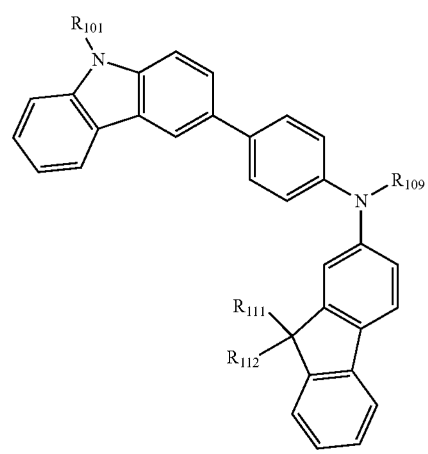

wherein, in Formula 201A, $R_{101}$, $R_{111}$, $R_{112}$, and $R_{109}$ may respectively be understood by referring to the descriptions of $R_{101}$, $R_{111}$, $R_{112}$, and $R_{109}$ provided herein.

In some embodiments, the compounds represented by Formulae 201 and 202 may include Compounds HT1 to HT20, but embodiments are not limited thereto:

-continued
HT1
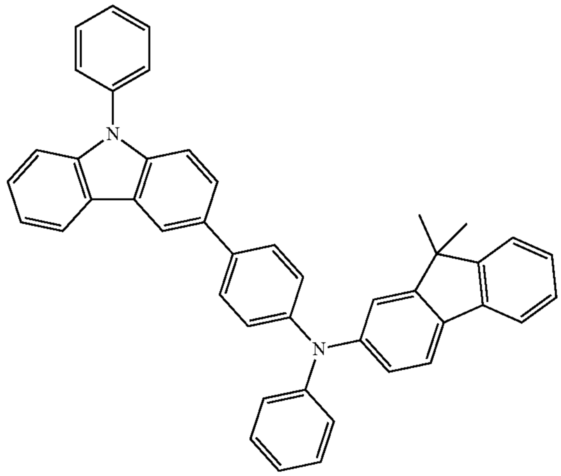
HT2
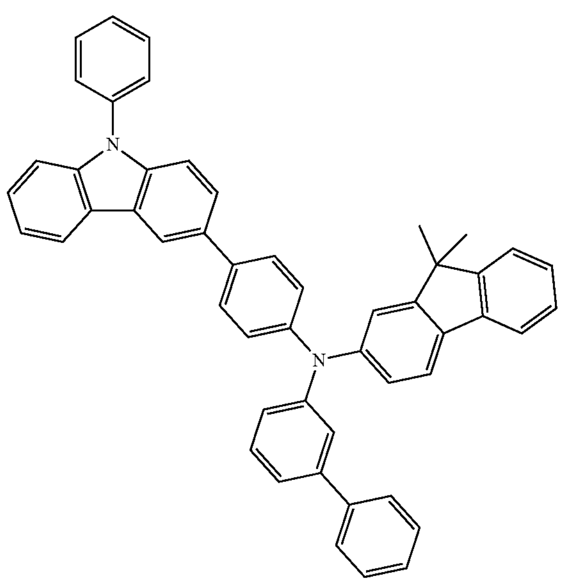
HT3
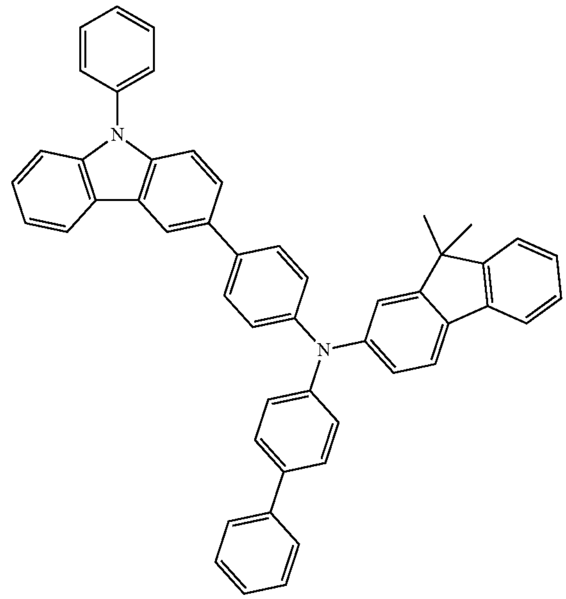
HT4
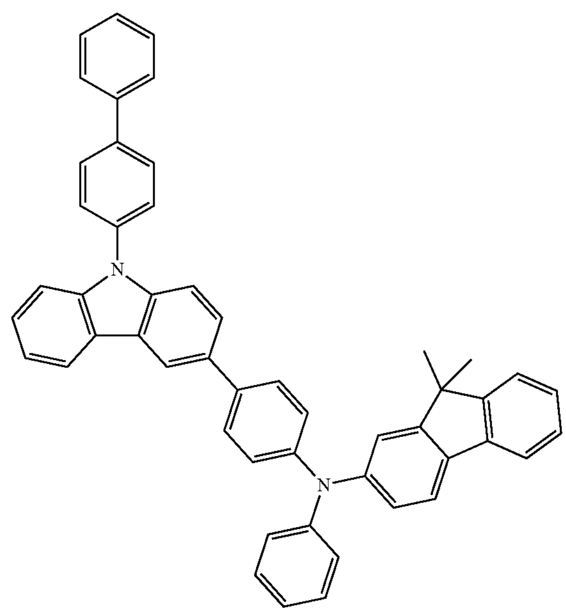

-continued
HT5
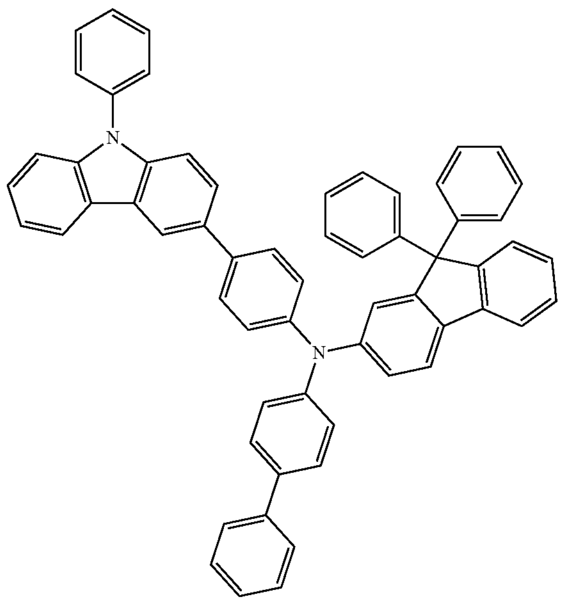
HT6
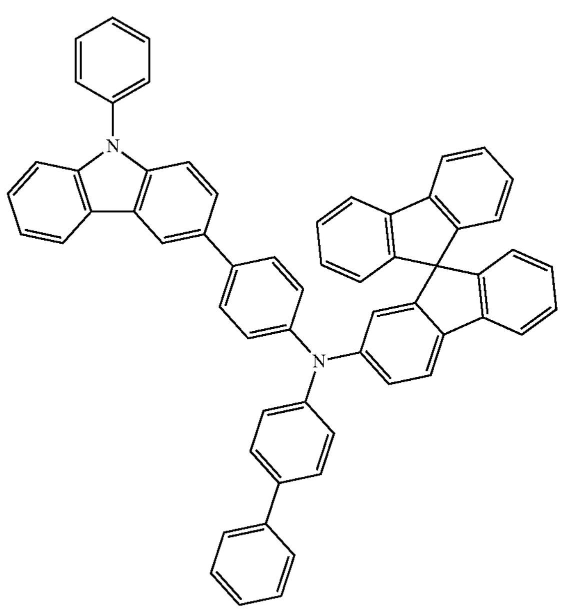
-continued
HT7
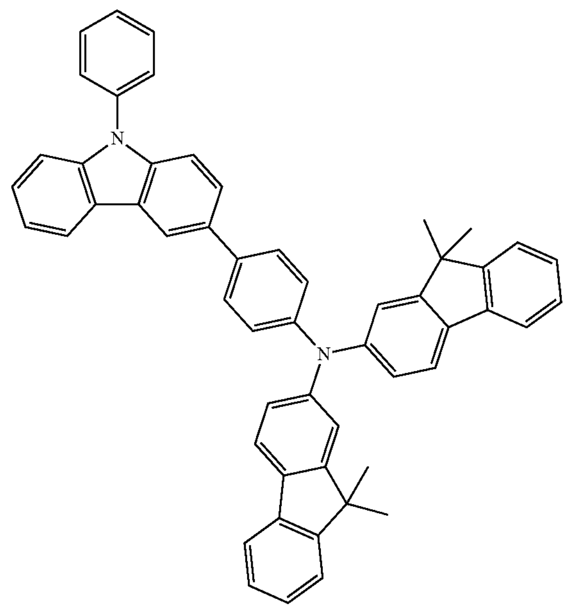
HT8
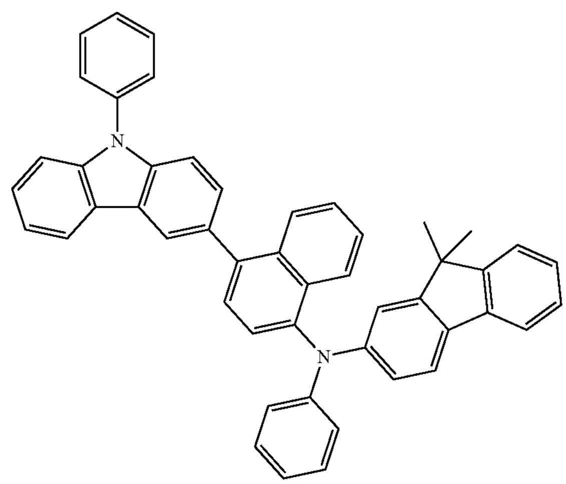
HT9
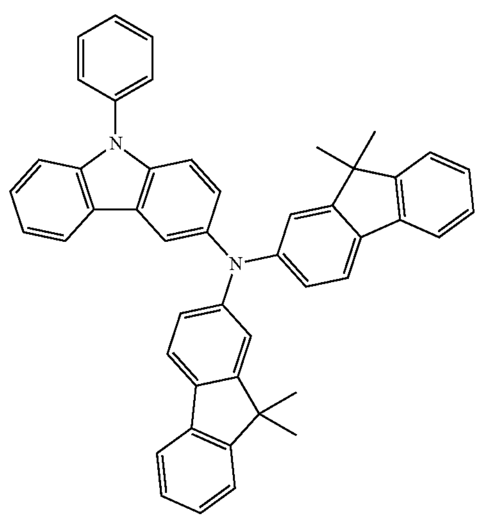

-continued
HT10
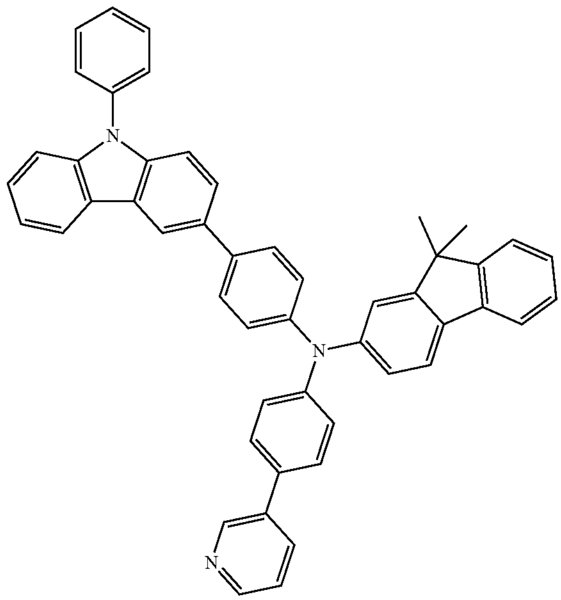
HT11
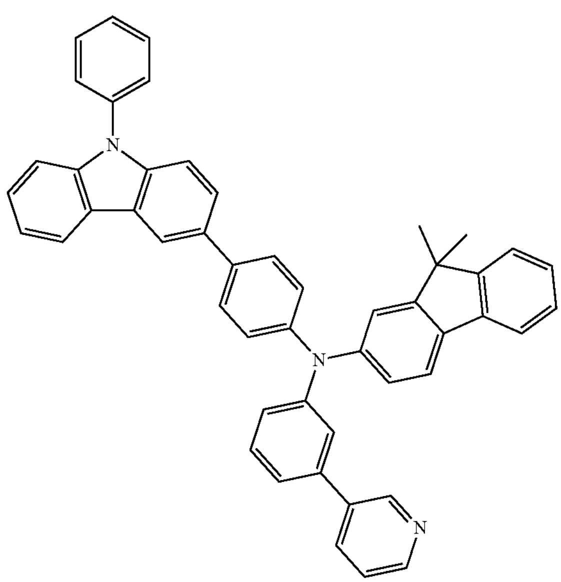
-continued
HT12
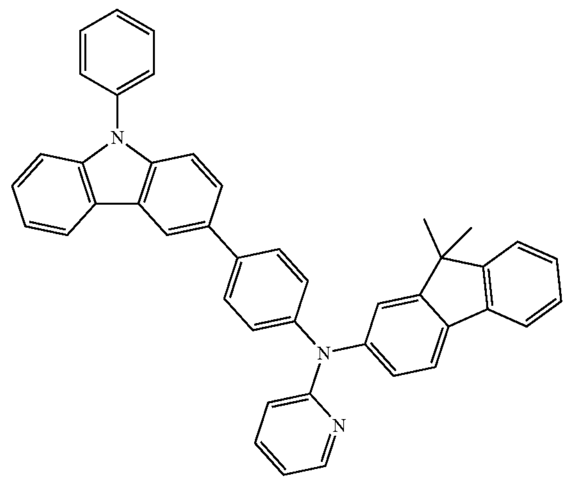
HT13
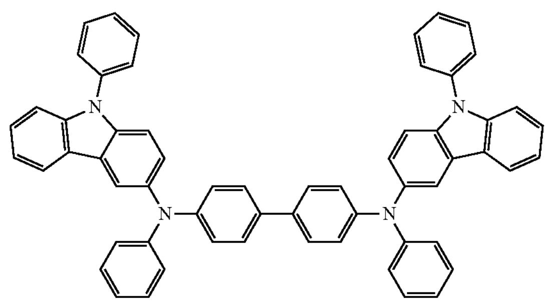
HT14
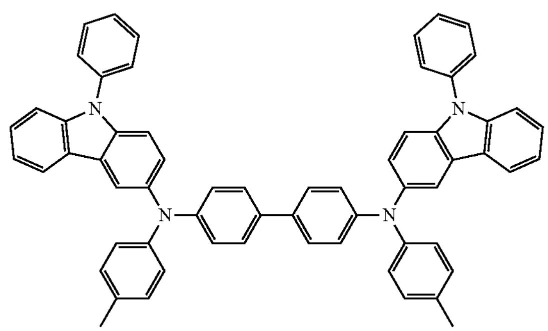
HT15
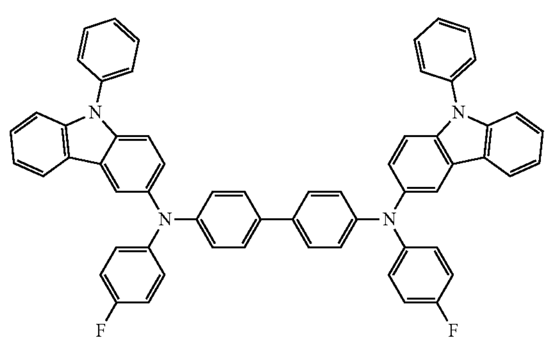

-continued

HT16

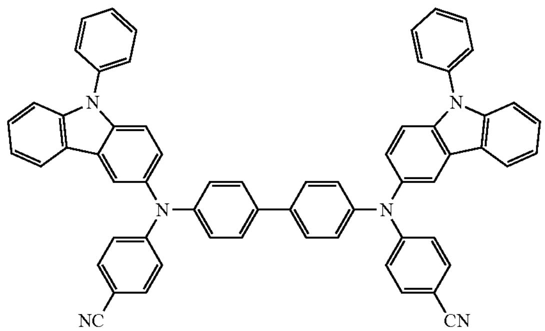

HT17

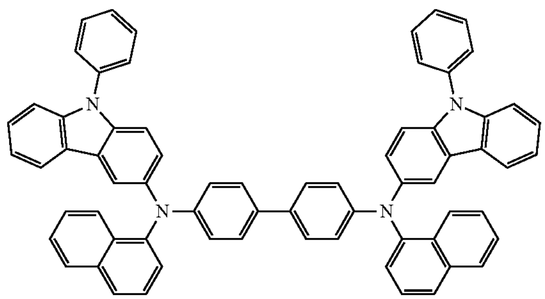

HT18

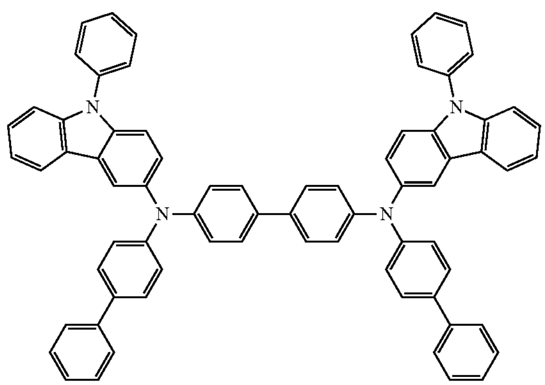

HT19

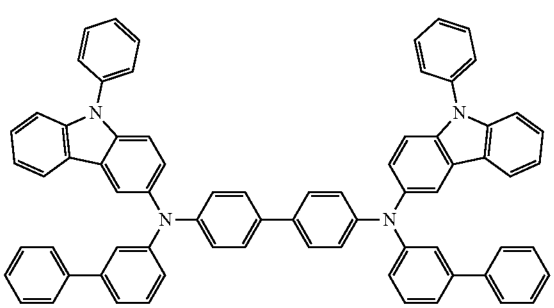

-continued

HT20

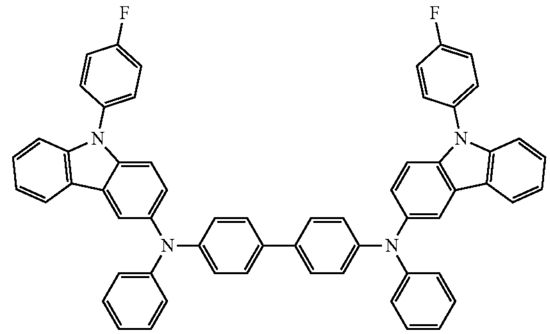

The thickness of the hole transport region may be in a range of about 100 Angstroms (Å) to about 10,000 Å, for example, about 100 Å to about 1,000 Å. When the hole transport region includes a hole injection layer, a hole transport layer, an electron blocking layer, or any combination thereof, the thickness of the hole injection layer may be in a range of about 50 Å to about 10,000 Å, for example, about 100 Å to about 1,000 Å, the thickness of the hole transport layer may be in a range of about 50 Å to about 2,000 Å, for example, about 100 Å to about 1,500 Å. When the thicknesses of the hole transport region, the hole injection layer, and the hole transport layer are within any of these ranges, excellent hole transport characteristics may be obtained without a substantial increase in driving voltage.

The hole transport region may include a charge generating material as well as the aforementioned materials, to improve conductive properties of the hole transport region. The charge generating material may be substantially homogeneously or non-homogeneously dispersed in the hole transport region.

The charge generating material may include, for example, a p-dopant. The p-dopant may include one of a quinone derivative, a metal oxide, and a compound containing a cyano group, but embodiments are not limited thereto. For example, non-limiting examples of the p-dopant include a quinone derivative, such as tetracyanoquinodimethane (TCNQ) or 2,3,5,6-tetrafluoro-tetracyano-1,4-benzoquinonedimethane (F4-TCNQ); a metal oxide, such as a tungsten oxide or a molybdenum oxide; and a compound containing a cyano group, such as Compound HT-D1 (HATCN) or Compound HT-D2, but embodiments are not limited thereto:

HT-D1

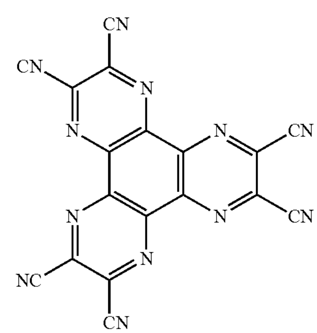

-continued

F4-TCNQ

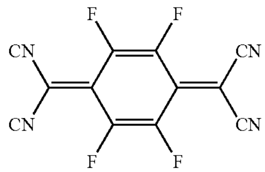

HT-D2

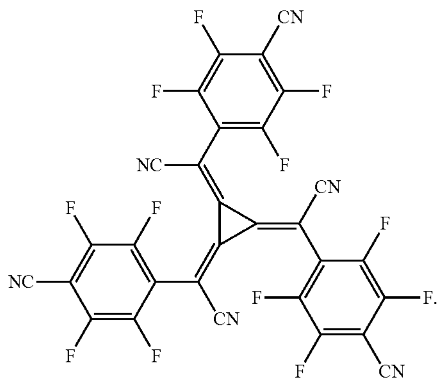

The hole transport region may further include a buffer layer.

The buffer layer may compensate for an optical resonance distance depending on a wavelength of light emitted from the emission layer to improve the efficiency of an organic light-emitting device.

When the hole transport region includes an electron blocking layer, a material for forming the electron blocking layer may include the material for forming a hole transport region, the host material described herein or any combination thereof. In some embodiments, when the hole transport region includes an electron blocking layer, mCP described herein may be used for forming the electron blocking layer.

An emission layer may be formed on the hole transport region by using one or more suitable methods, such as vacuum deposition, spin coating, casting, or LB deposition. When the emission layer is formed by vacuum deposition or spin coating, vacuum deposition and coating conditions for forming the emission layer may be generally similar to those conditions for forming a hole injection layer, though the conditions may vary depending on a compound that is used.

When the organic light-emitting device 10 is a full-color organic light-emitting device, the emission layer may be patterned into a red emission layer, a green emission layer, and/or a blue emission layer. In some embodiments, the emission layer may have a structure in which the red emission layer, the green emission layer, and/or the blue emission layer are layered to emit white light. In some embodiments, the structure of the emission layer may vary.

The emission layer may include the first compound, the second compound, and the fluorescent dopant described herein, and the first compound, the second compound, and the fluorescent dopant may be understood by referring to the descriptions of the first compound, the second compound, and the fluorescent dopant provided herein.

The thickness of the emission layer may be in a range of about 100 Å to about 1,000 Å, and in some embodiments, about 200 Å to about 600 Å. When the thickness of the emission layer is within any of these ranges, improved luminescence characteristics may be obtained without a substantial increase in driving voltage.

Next, an electron transport region may be formed on the emission layer.

The electron transport region may include a hole blocking layer, an electron transport layer, an electron injection layer, or any combination thereof.

In some embodiments, the electron transport region may have a hole blocking layer/an electron transport layer/an electron injection layer structure or an electron transport layer/an electron injection layer structure, but embodiments are not limited thereto. The electron transport layer may have a single-layered structure or a multi-layered structure including two or more different materials.

The conditions for forming a hole blocking layer, an electron transport layer, and an electron injection layer may be inferred based on the conditions for forming the hole injection layer.

When the electron transport region includes a hole blocking layer, the hole blocking layer may include, for example, at least one of BCP, Bphen, and BAlq:

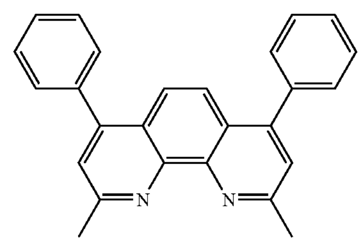

BCP

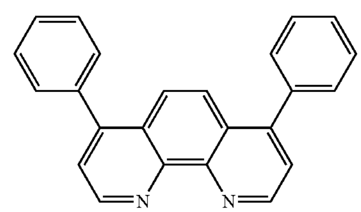

Bphen

In some embodiments, the hole blocking layer may include the host, the material for forming an electron transport layer described herein, the material for forming an electron injection layer described herein, or any combination thereof.

The thickness of the hole blocking layer may be in a range of about 20 Å to about 1,000 Å, for example, about 30 Å to about 600 Å. When the thickness of the hole blocking layer is within any of these ranges, excellent hole blocking characteristics may be obtained without a substantial increase in driving voltage.

The electron transport layer may include BCP, Bphen, TPBi, $Alq_3$, BAlq, TAZ, NTAZ, DPEPO, or any combination thereof:

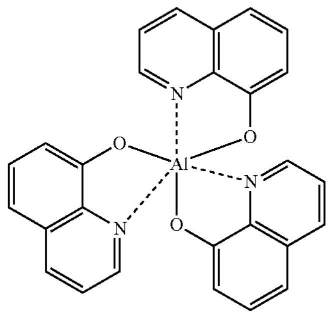
Alq3
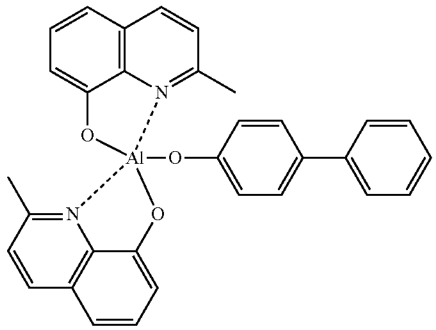
BAlq
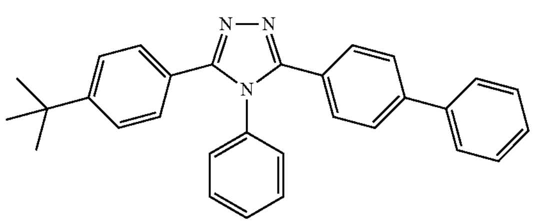
TAZ
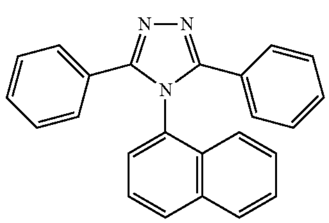
NTAZ
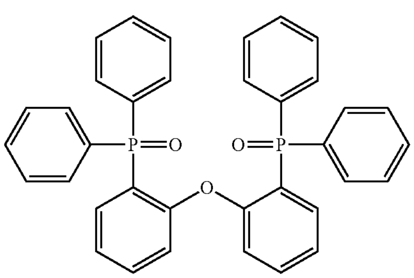
DPEPO
-continued
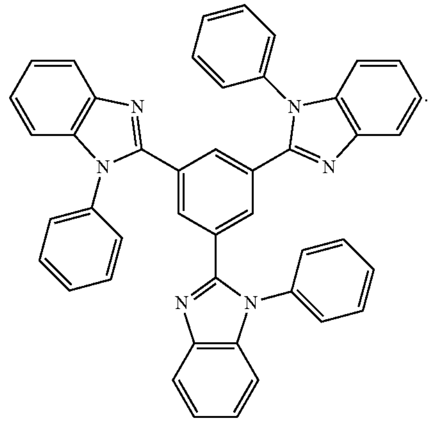
TPBi
In some embodiments, the electron transport layer may include at least one of Compounds ET1 to ET25, but embodiments are not limited thereto:
ET1
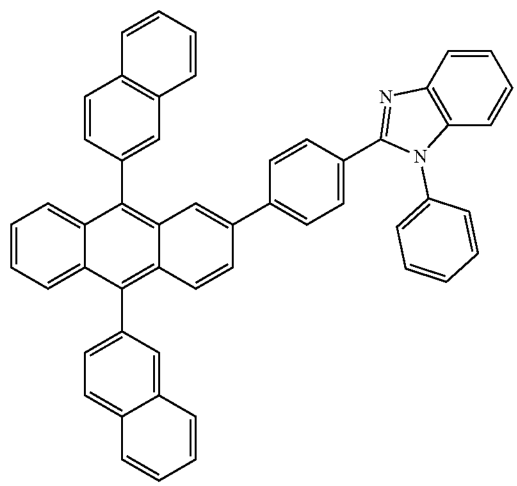
ET2
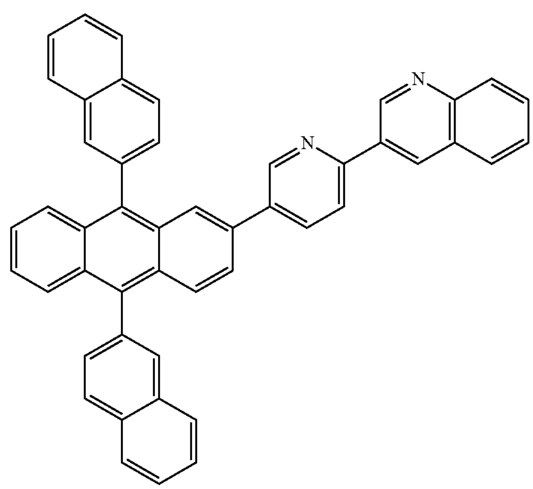

-continued
ET3
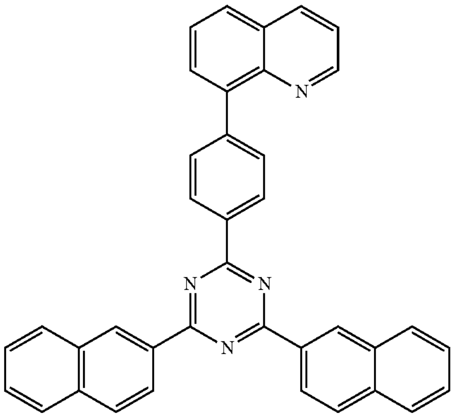
ET4
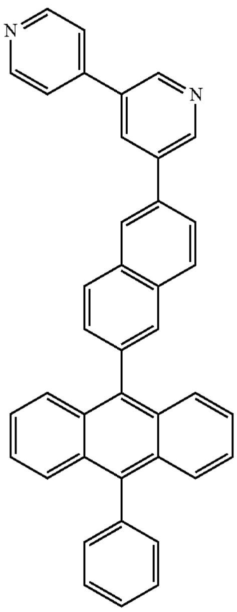
ET5
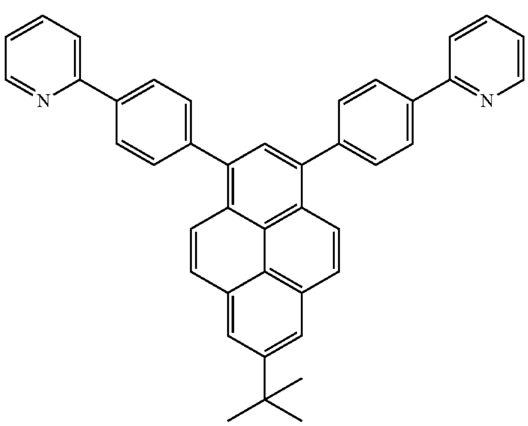
-continued
ET6
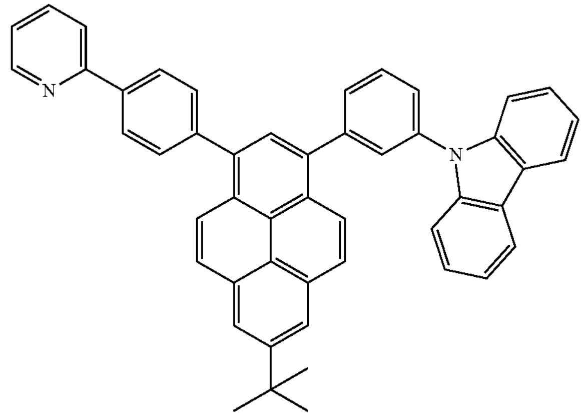
ET7
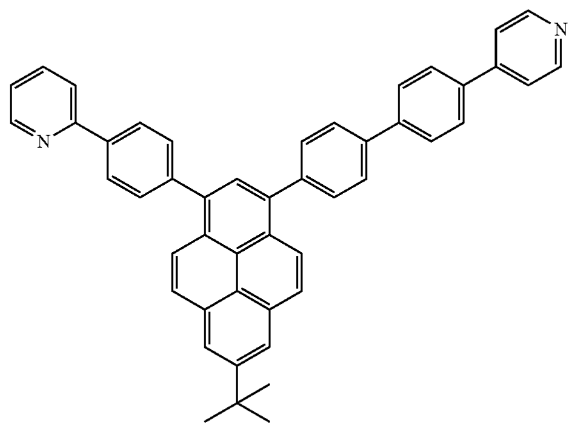
ET8
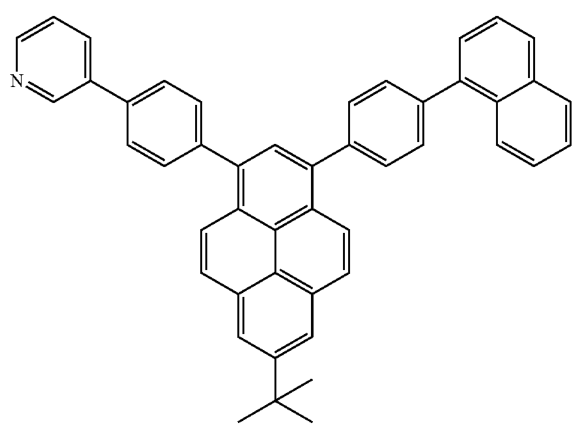

-continued
ET9
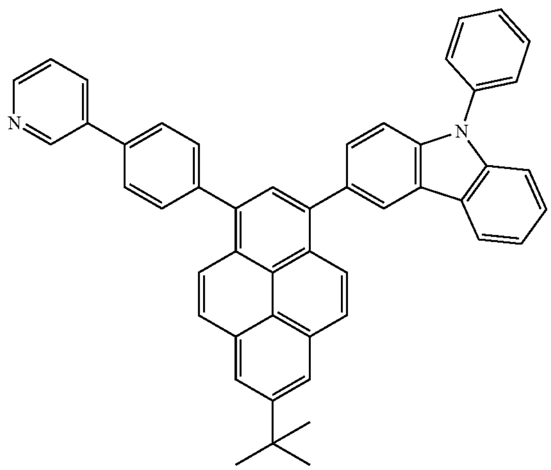
ET10
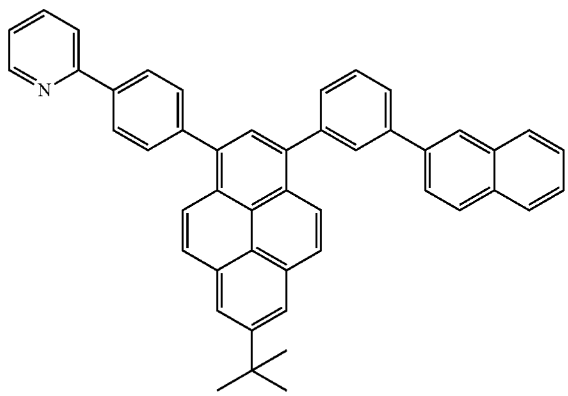
ET11
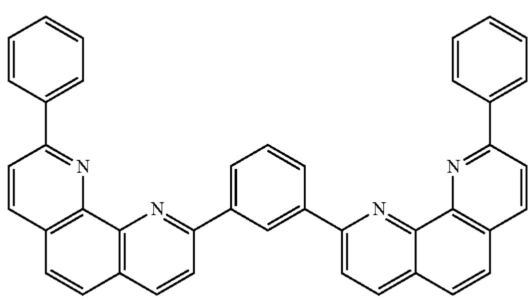
ET12
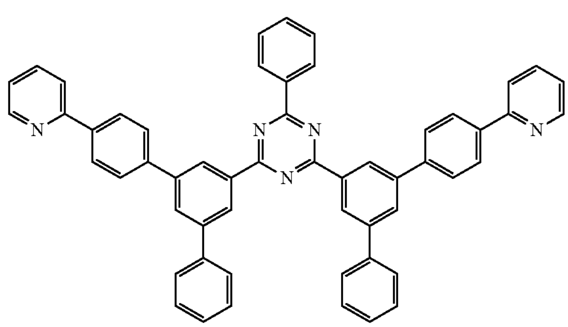
-continued
ET13
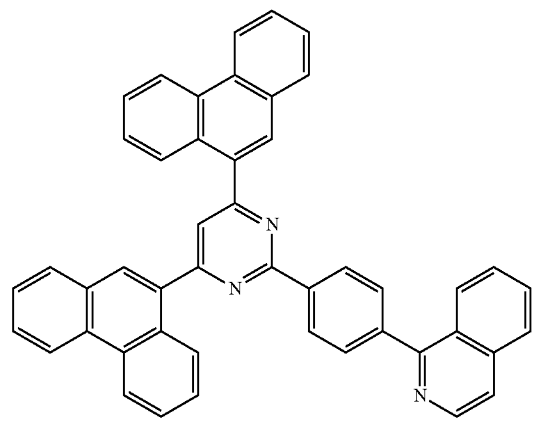
ET14
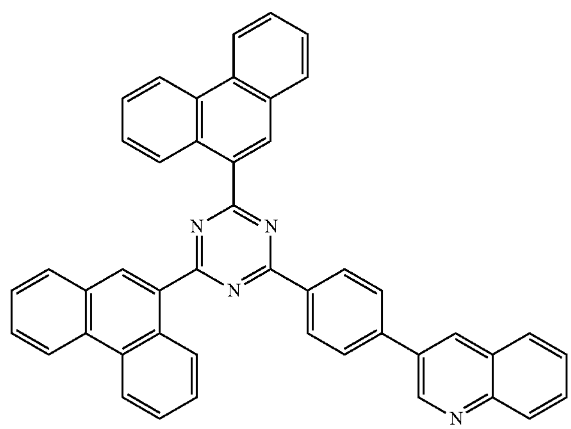
ET15
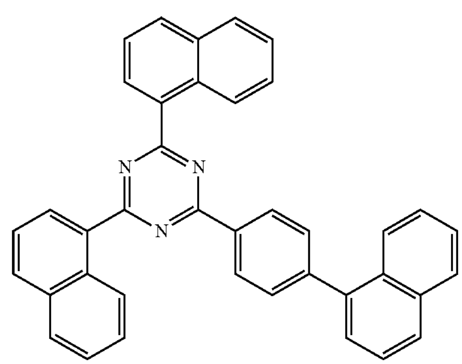

-continued
ET16
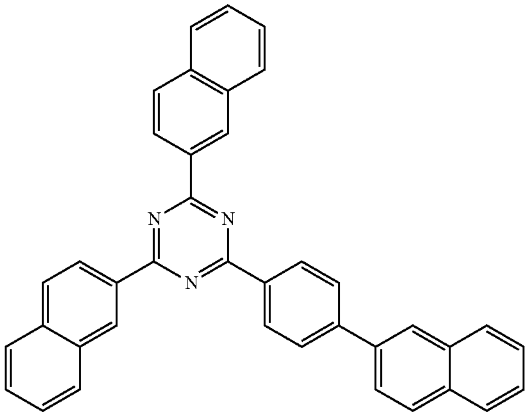
ET17
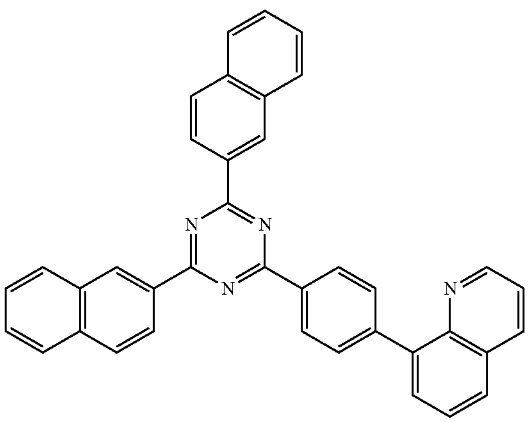
ET18
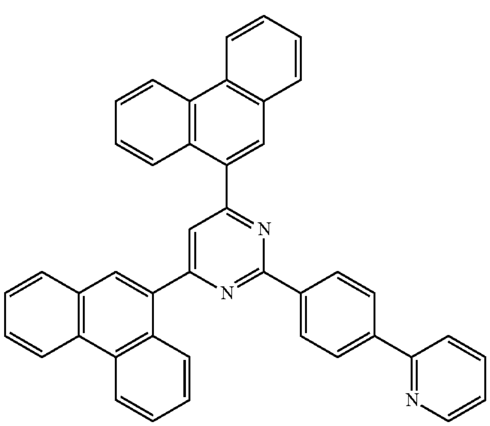
-continued
ET19
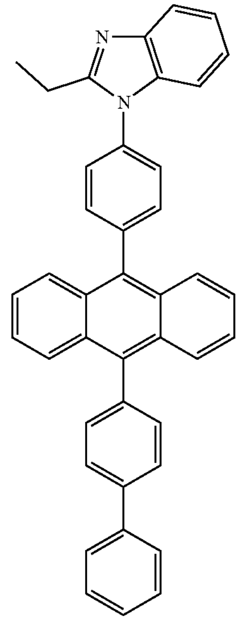
ET20
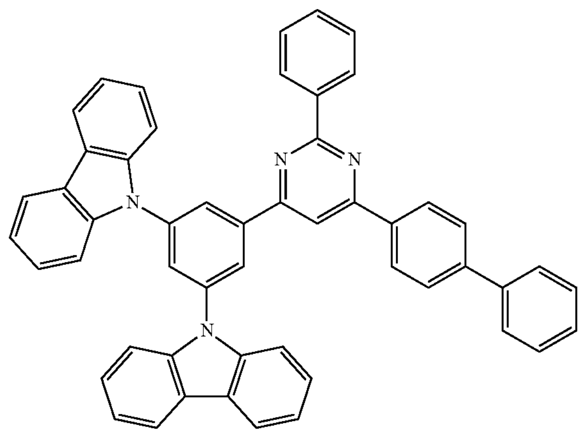
ET21
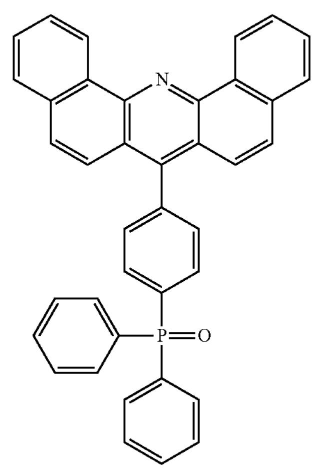

-continued

ET22

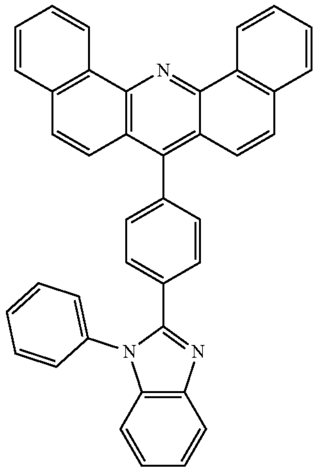

ET23

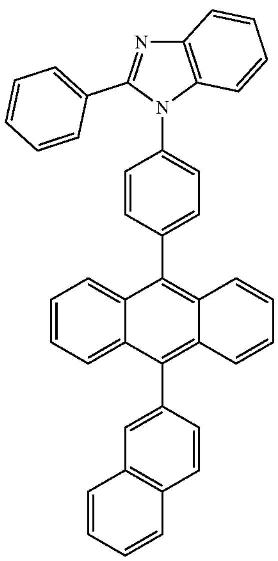

ET24

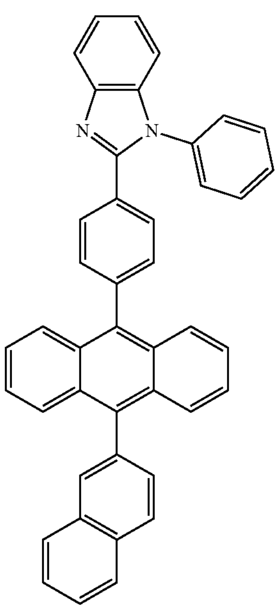

-continued

ET25

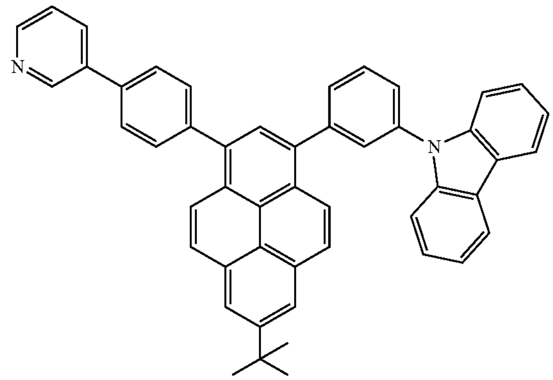

The thickness of the electron transport layer may be in a range of about 100 Å to about 1,000 Å, and in some embodiments, about 150 Å to about 500 Å. When the thickness of the electron transport layer is within any of these ranges, excellent electron transport characteristics may be obtained without a substantial increase in driving voltage.

The electron transport layer may further include a material containing metal, in addition to the materials described above.

The material containing metal may include a Li complex. The Li complex may include, e.g., Compound ET-D1 (LiQ) or Compound ET-D2:

ET-D1

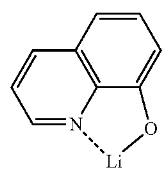

ET-D2

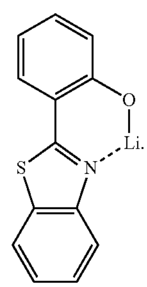

The electron transport region may include an electron injection layer that facilitates electron injection from the second electrode 19.

The electron injection layer may include ET-D1 (LiQ), LiF, NaCl, CsF, $Li_2O$, BaO, or any combination thereof.

The thickness of the electron injection layer may be in a range of about 1 Å to about 100 Å, and in some embodiments, about 3 Å to about 90 Å. When the thickness of the electron injection layer is within any of these ranges, excellent electron injection characteristics may be obtained without a substantial increase in driving voltage.

The second electrode 19 may be on the organic layer 15. The second electrode 19 may be a cathode. A material for forming the second electrode 19 may be a material with a relatively low work function, such as a metal, an alloy, an electrically conductive compound, or any combination thereof. Examples of the material for forming the second electrode 19 may include lithium (Li), magnesium (Mg), aluminum (Al), aluminum-lithium (Al—Li), calcium (Ca), magnesium-indium (Mg—In), and magnesium-silver (Mg—Ag). In some embodiments, ITO or IZO may be used to form a transmissive second electrode 19 to manufacture a top emission light-emitting device. In some embodiments, the material for forming the second electrode 19 may vary.

Hereinbefore the organic light-emitting device 10 has been described with reference to FIG. 1, but embodiments are not limited thereto.

The term "$C_1$-$C_{60}$ alkyl group" as used herein refers to a linear or branched saturated aliphatic hydrocarbon monovalent group having 1 to 60 carbon atoms. The term "$C_1$-$C_{60}$ alkylene group" as used herein refers to a divalent group having the same structure as the $C_1$-$C_{60}$ alkyl group.

Examples of the $C_1$-$C_{60}$ alkyl group, the $C_1$-$C_{20}$ alkyl group, and/or the $C_1$-$C_{10}$ alkyl group as used herein may include a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group or a tert-decyl group, each unsubstituted or substituted with a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, or any combination thereof.

The term "$C_1$-$C_{60}$ alkoxy group" as used herein refers to a monovalent group represented by —$OA_{101}$ (wherein $A_{101}$ is a $C_1$-$C_{60}$ alkyl group).

Examples of the $C_1$-$C_{60}$ alkoxy group, the $C_1$-$C_{20}$ alkoxy group, or the $C_1$-$C_{10}$ alkoxy group as used herein may include a methoxy group, an ethoxy group, a propoxy group, a butoxy group, or a pentoxy group.

The term "$C_1$-$C_{60}$ alkylthio group" as used herein refers to a monovalent group represented by —$SA_{101}$ (wherein $A_{101}$ is a $C_1$-$C_{60}$ alkyl group).

The term "$C_2$-$C_{60}$ alkenyl group" as used herein refers to a group formed by placing at least one carbon-carbon double bond in the middle or at the terminus of the $C_2$-$C_{60}$ alkyl group. Examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a group formed by placing at least one carbon-carbon triple bond in the middle or at the terminus of the $C_2$-$C_{60}$ alkyl group. Examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent cyclic saturated hydrocarbon group including 3 to 10 carbon atoms. The term "$C_3$-$C_{10}$ cycloalkylene group" as used herein refers to a divalent group having the same structure as the $C_3$-$C_{10}$ cycloalkyl group.

Examples of the $C_3$-$C_{10}$ cycloalkyl group as used herein may include a cyclopropyl group, a cyclobutyl group, a cyclopentyl group, a cyclohexyl group, a cycloheptyl group, a cyclooctyl group, an adamantanyl group, a norbornanyl (bicyclo[2.2.1]heptyl), a bicyclo[1.1.1]pentyl group, a bicyclo[2.1.1]hexyl group, or a bicyclo[2.2.2]octyl group.

The term "$C_1$-$C_{10}$ heterocycloalkyl group" as used herein refers to a monovalent monocyclic group including at least one heteroatom of N, O, P, Si, S, Ge, B and Se as a ring-forming atom and 1 to 10 carbon atoms. The term "$C_1$-$C_{10}$ heterocycloalkylene group" as used herein refers to a divalent group having the same structure as the $C_1$-$C_{10}$ heterocycloalkyl group.

Examples of the $C_1$-$C_{10}$ heterocycloalkyl group as used herein may include a silolanyl group, a silinanyl group, a tetrahydrofuranyl group, a tetrahydro-2H-pyranyl group, or a tetrahydrothiophenyl group.

The term "$C_3$-$C_{10}$ cycloalkenyl group" as used herein refers to a monovalent monocyclic group that has 3 to 10 carbon atoms and at least one carbon-carbon double bond in its ring, wherein the molecular structure as a whole is non-aromatic. Examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group including at least one heteroatom of N, O, P, Si, S, Ge, B and Se as a ring-forming atom, 1 to 10 carbon atoms, and at least one double bond in its ring. Examples of the $C_1$-$C_{10}$ heterocycloalkenyl group include a 2,3-dihydrofuranyl group and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms. The term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include a plurality of rings, the plurality of rings may be fused to each other.

The term "$C_7$-$C_{60}$ alkyl aryl group" as used herein refers to a $C_6$-$C_{59}$ aryl group substituted with at least one $C_1$-$C_{59}$ alkyl group.

The term "$C_1$-$C_{60}$ heteroaryl group" as used herein refers to a monovalent group having a heterocyclic aromatic system having at least one heteroatom of N, O, P, Si, S, Ge, B and Se as a ring-forming atom and 1 to 60 carbon atoms. The term "$C_1$-$C_{60}$ heteroarylene group" as used herein refers to a divalent group having a heterocyclic aromatic system having at least one heteroatom of N, O, P, Si, S, Ge, B and Se as a ring-forming atom and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include a plurality of rings, the plurality of rings may be fused to each other.

The term "$C_2$-$C_{60}$ alkyl heteroaryl group" as used herein refers to a $C_1$-$C_{59}$ heteroaryl group substituted with at least one $C_1$-$C_{59}$ alkyl group.

The term "$C_6$-$C_{60}$ aryloxy group" as used herein is represented by —$OA_{102}$ (wherein $A_{102}$ is the $C_6$-$C_{60}$ aryl group). The term "$C_6$-$C_{60}$ arylthio group" as used herein is represented by —$SA_{103}$ (wherein $A_{103}$ is the $C_6$-$C_{60}$ aryl group).

The term "monovalent non-aromatic condensed polycyclic group" as used herein refers to a monovalent group that has two or more condensed rings and only carbon atoms (e.g., the number of carbon atoms may be in a range of 8 to 60) as ring-forming atoms, wherein the molecular structure as a whole is non-aromatic. Examples of the monovalent non-aromatic condensed polycyclic group include a fluorenyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group that has two or more condensed rings and a heteroatom selected from N, O, P, Si, S, Ge, B and Se and carbon atoms (e.g., the number of carbon atoms may be in a range of 1 to 60) as ring-forming atoms, wherein the molecular structure as a whole is non-aromatic. Examples of the monovalent non-aromatic condensed heteropolycyclic group include a carbazolyl group. The term "divalent non-aromatic condensed heteropolycyclic group" as used herein refers to a divalent group having substantially the same structure as the monovalent non-aromatic condensed heteropolycyclic group.

The term "$C_5$-$C_{30}$ carbocyclic group" as used herein refers to a saturated or unsaturated cyclic group including 5 to 30 carbon atoms only as ring-forming atoms. The $C_5$-$C_{30}$ carbocyclic group may be a monocyclic group or a polycyclic group. Examples of the "$C_5$-$C_{30}$ carbocyclic group (unsubstituted or substituted with at least one $R_{10a}$)" may include an adamantane group, a norbornene group, a bicyclo[1.1.1]pentane group, a bicyclo[2.1.1]hexane group, a bicyclo[2.2.1]heptane group (a norbornane group), a bicyclo[2.2.2]octane group, a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, a silole group, or a fluorene group, each (unsubstituted or substituted with at least one $R_{10a}$).

The term "$C_1$-$C_{30}$ heterocyclic group" as used herein refers to saturated or unsaturated cyclic group including 1 to 30 carbon atoms and at least one heteroatom selected from N, O, P, Si, S, Ge, B and Se as ring-forming atoms. The $C_1$-$C_{30}$ heterocyclic group may be a monocyclic group or a polycyclic group. Examples of the "$C_1$-$C_{30}$ heterocyclic group (unsubstituted or substituted with at least one $R_{10a}$)" may include a thiophene group, a furan group, a pyrrole group, a silole group, a borole group, a phosphole group, a selenophene group, a germole group, a benzothiophene group, a benzofuran group, an indole group, an indene group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, a 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group, each unsubstituted or substituted with at least one $R_{10a}$).

The "fluorinated $C_1$-$C_{60}$ alkyl group (or fluorinated $C_1$-$C_{20}$ alkyl group or the like)", "fluorinated $C_3$-$C_{10}$ cycloalkyl group", "fluorinated $C_1$-$C_{10}$ heterocycloalkyl group", and "fluorinated phenyl group" as used herein may respectively be a $C_1$-$C_{60}$ alkyl group (or $C_1$-$C_{20}$ alkyl group or the like), $C_3$-$C_{10}$ cycloalkyl group, a $C_1$-$C_{10}$ heterocycloalkyl group, and a phenyl group, each substituted with at least one fluoro group (—F). Examples of the "fluorinated $C_1$ alkyl group (i.e., a fluorinated methyl group)" may include —$CF_3$, —$CF_2H$, and —$CFH_2$. The "fluorinated $C_1$-$C_{60}$ alkyl group (or fluorinated $C_{20}$ alkyl group or the like)", "fluorinated $C_3$-$C_{10}$ cycloalkyl group", or "fluorinated $C_1$-$C_{10}$ heterocycloalkyl group" may respectively be: i) a fully fluorinated $C_1$-$C_{60}$ alkyl group (or fully fluorinated $C_1$-$C_{20}$ alkyl group or the like), fully fluorinated $C_3$-$C_{10}$ cycloalkyl group, or fully fluorinated $C_1$-$C_{10}$ heterocycloalkyl group, in which all hydrogen atoms are substituted with fluoro groups; or ii) a partially fluorinated $C_1$-$C_{60}$ alkyl group (or partially fluorinated $C_1$-$C_{20}$ alkyl group or the like), partially fluorinated $C_3$-$C_{10}$ cycloalkyl group, or partially fluorinated $C_1$-$C_{10}$ heterocycloalkyl group, in which some of hydrogen atoms are substituted with fluoro groups.

The "deuterated $C_1$-$C_{60}$ alkyl group (or deuterated $C_1$-$C_{20}$ alkyl group or the like)", "deuterated $C_3$-$C_{10}$ cycloalkyl group", "deuterated heterocycloalkyl group", and "deuterated phenyl group" as used herein may respectively be a $C_1$-$C_{60}$ alkyl group (or $C_1$-$C_{20}$ alkyl group or the like), $C_3$-$C_{10}$ cycloalkyl group, a $C_1$-$C_{10}$ heterocycloalkyl group, and a phenyl group, each substituted with at least one deuterium. Examples of the "deuterated $C_1$ alkyl group (i.e., a deuterated methyl group)" may include —$CD_3$, —$CD_2H$, and —$CDH_2$. The "deuterated $C_1$-$C_{60}$ alkyl group (or deuterated $C_1$-$C_{20}$ alkyl group or the like)", "deuterated $C_3$-$C_{10}$ cycloalkyl group", or "deuterated heterocycloalkyl group" may respectively be: i) a fully deuterated $C_1$-$C_{60}$ alkyl group (or fully deuterated $C_1$-$C_{20}$ alkyl group or the like), fully deuterated $C_3$-$C_{10}$ cycloalkyl group, or fully deuterated heterocycloalkyl group, in which all hydrogen atoms are substituted with deuterium atoms; or ii) a partially deuterated $C_1$-$C_{60}$ alkyl group (or partially deuterated $C_1$-$C_{20}$ alkyl group or the like), partially deuterated $C_3$-$C_{10}$ cycloalkyl group, or partially deuterated heterocycloalkyl group, in which some of hydrogen atoms are substituted with deuterium atoms.

The "($C_1$-$C_{20}$ alkyl)'X' group" refers to a 'X' group substituted with at least one $C_1$-$C_{20}$ alkyl group. For example, The "($C_1$-$C_{20}$ alkyl)$C_3$-$C_{10}$ cycloalkyl group" as used herein refers to a $C_3$-$C_{10}$ cycloalkyl group substituted with at least one $C_1$-$C_{20}$ alkyl group, and the "($C_1$-$C_{20}$ alkyl)phenyl group" as used herein refers to a phenyl group substituted with at least one $C_1$-$C_{20}$ alkyl group. Examples of the ($C_1$ alkyl)phenyl group may include a toluyl group.

In the present specification, "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, and an azadibenzothiophene 5,5-dioxide group" each refer to a hetero ring group in which at least one ring-forming carbon atom is substituted with nitrogen atom and respectively having an identical backbone as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, and a dibenzothiophene 5,5-dioxide group".

In the present specification, substituents of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted monovalent non-aromatic condensed polycyclic group, and the substituted monovalent non-aromatic condensed heteropolycyclic group may each independently be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, —$P(=O)(Q_{18})(Q_{19})$, —$P(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, or a monovalent non-aromatic condensed heteropolycyclic group, each unsubstituted or substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, —$P(=O)(Q_{28})(Q_{29})$, —$P(Q_{28})(Q_{29})$, or any combination thereof;

—$N(Q_{31})(Q_{32})$, —$Si(Q_{33})(Q_{34})(Q_{35})$, —$B(Q_{36})(Q_{37})$, —$P(=O)(Q_{38})(Q_{39})$, or —$P(Q_{38})(Q_{39})$, or any combination thereof.

In the present specification, $Q_1$ to $Q_9$, $Q_{11}$ to $Q_{19}$, $Q_{21}$ to $Q_{29}$, and $Q_{31}$ to $Q_{39}$ may each independently be: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

For example, $Q_1$ to $Q_9$, $Q_{11}$ to $Q_{19}$, $Q_{21}$ to $Q_{29}$, and $Q_{31}$ to $Q_{39}$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or any combination thereof.

Hereinafter, a compound and an organic light-emitting device according to an embodiment will be described in detail with reference to Synthesis Examples and Examples, however, the present disclosure is not limited thereto. The wording "B was used instead of A" used in describing Synthesis Examples means that an amount of B used was identical to an amount of A used based on molar equivalence.

The term "room temperature" as used herein refers to a temperature of about 25° C.

EXAMPLES

Synthesis Example 1 (Compound H2-2)

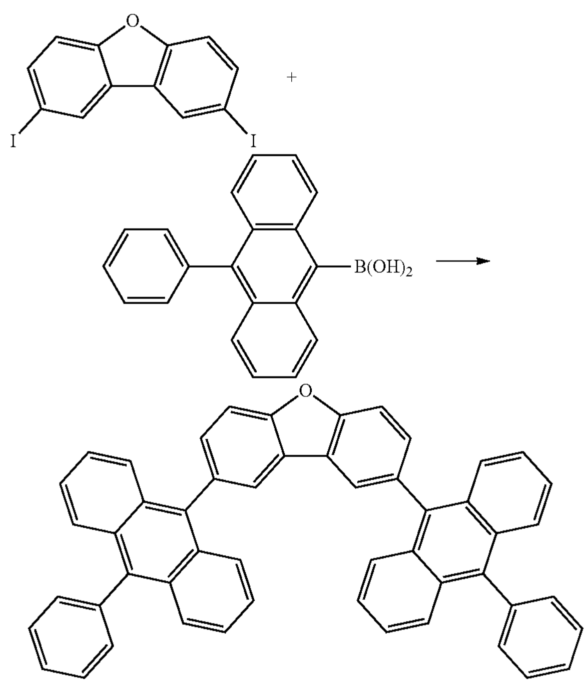

H2-2

5 grams (g) (11.9 mmol) of 2,7-diiododibenzofuran, 7.8 g (26.2 mmol) of (10-phenylanthracen-9-yl)boronic acid, 2.8 g (2.4 mmol) of tetrakistriphenylphosphine palladium (Pd $(PPh_3)_4$), and 15.2 g (71.4 mmol) of potassium phosphate tribasic ($K_3PO_4$) were added to a mixture of 50 milliliters (mL) of toluene, 12 mL of ethanol, and 12 mL of distilled water, followed by heating under reflux. Once the reaction was complete, the temperature was lowered to room temperature, and an organic layer was extracted using toluene, dried using anhydrous sodium sulfate ($Na_2SO_4$), and filtered with a silica filter. The resultant was concentrated and recrystallized using toluene and ethyl acetate to thereby produce Compound H2-2. (3.8 g, 5.6 mmol, yield: 47%)

LCMS (calculated value: 672.25, measured value (M+1): 673.245 m/z)

Evaluation Example 1

The HOMO, LUMO, S1, T1, and/or T2 energy levels of each compound in Table 1 were evaluated using Gaussian 09 program by the quantum chemistry computational method based on the 6-311+G(d,p) basis set according to a DFT. The results thereof are shown in Table 1.

TABLE 1

| | Compound No | HOMO (eV) | LUMO (eV) | S1 (eV) | T1 (eV) | T2 (eV) |
|---|---|---|---|---|---|---|
| First | H1-1 | −5.063 | −1.106 | 3.544 | 3.005 | — |
| compound | H1-2 | −5.124 | −1.087 | 3.581 | 2.990 | — |
| Second | H2-1 | −5.130 | −1.640 | 3.020 | 1.760 | 2.310 |
| compound | H2-2 | −5.140 | −1.650 | 3.020 | 1.740 | 2.300 |
| Fluorescent | FD14 | −4.690 | −1.465 | 2.704 | 1.715 | — |
| dopant | FD15 | −4.764 | −1.543 | 2.695 | 1.719 | — |

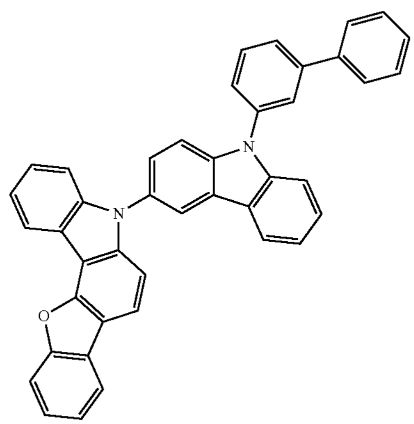

H1-1

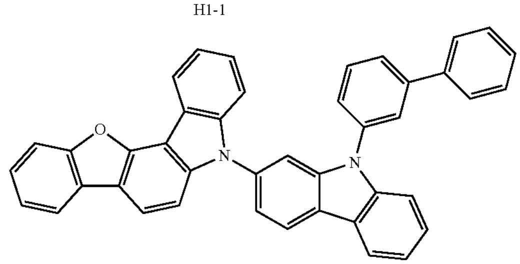

H1-2

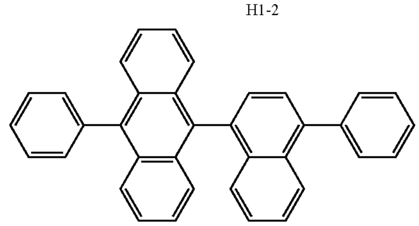

H2-1

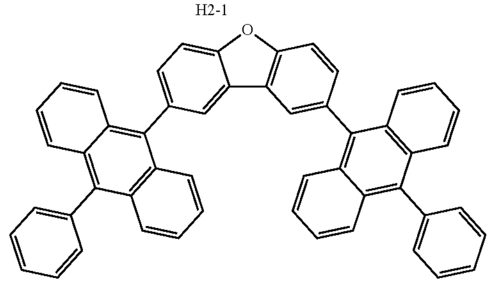

H2-2

TABLE 1-continued

| Compound No | HOMO (eV) | LUMO (eV) | S1 (eV) | T1 (eV) | T2 (eV) |
|---|---|---|---|---|---|

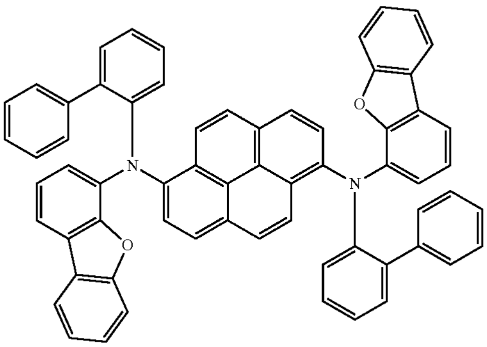

FD14

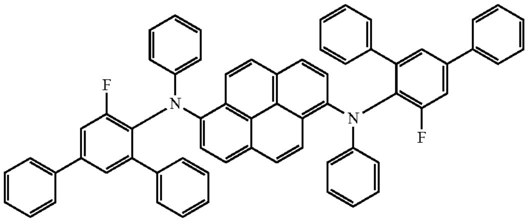

FD15

Referring to the results of Table 1, Compounds H1-1, H1-2, H2-1, H2-2, FD14, and FD15 were found to satisfy at least one of Equations 1 to 11 (e.g., all of Equations 1 to 11).

Example 1

A glass substrate on which a patterned ITO electrode was formed (50 millimeters (mm)×50 mm×0.7 mm) was sonicated in acetone, isopropyl alcohol, and distilled water for 20 minutes each, and heat treated for 10 minutes at 250° C.

Subsequently, HATCN was deposited on the ITO electrode (anode) of the glass substrate at a deposition rate of 1 Å/sec to form a hole injection layer having a thickness of 100 Å, NPB was deposited on the hole injection layer at a deposition rate of 1 Å/sec to form hole transport layer having a thickness of 800 Å, and mCP was deposited on the hole transport layer at a deposition rate of 1 Å/sec to form an electron blocking layer having a thickness of 50 Å, thereby forming a hole transport region.

Compound H1-1 (as the first compound), Compound H2-1 (as the second compound), and Compound FD14 (as the fluorescent dopant) were co-deposited on the hole transport region at a volume ratio shown in Table 2, thereby forming an emission layer having a thickness of 300 Å.

DPEPO and Liq were co-deposited on the emission layer at a volume ratio of 1:1 (at a deposition rate of 0.5 Å/sec) to form an electron transport layer having a thickness of 300 Å, and Liq was deposited on the electron transport layer at a deposition rate of 0.5 Å/sec to form an electron injection layer having a thickness of 10 Å, and Al was vacuum-deposited on the electron injection layer to form a second electrode (cathode) having a thickness of 1,000 Å, thereby completing the manufacture of an organic light-emitting device having a structure of ITO/HATCN (100 Å)/NPB (800 Å)/mCP (50 Å)/H1-1:H2-1:FD14 (300 Å)/DPEPO:Liq (300 Å)/LiQ (10 Å)/Al (1,000 Å).

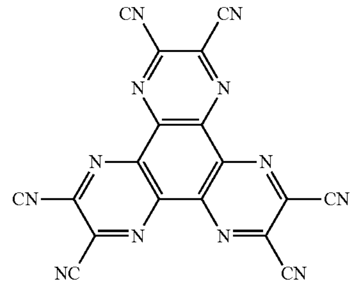

HT-D1(HATCN)

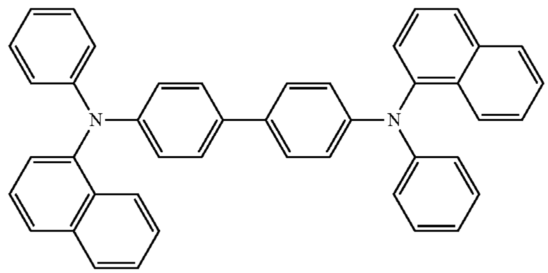

NPB

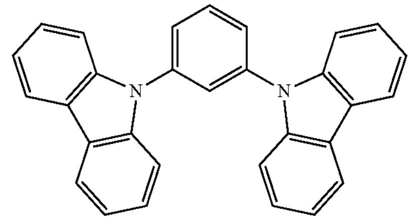

mCP

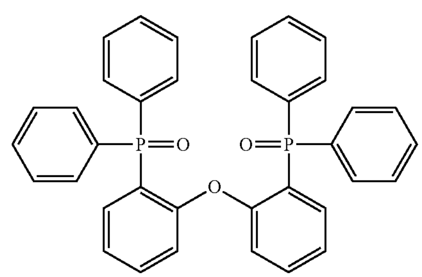

DPEPO

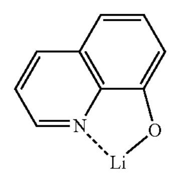

ET-D1(Liq)

Examples 2 and 3 and Comparative Examples A and B

Organic light-emitting devices were manufactured in substantially the same manner as in Example 1, except that compounds shown in Table 2 were used instead of Compounds H1-1, H2-1, and FD14, as the first compound, the second compound, and the fluorescent dopant, respectively, and these compounds were co-deposited at volume ratios shown in Table 2 in the formation of the emission layer.

Evaluation Example 2

Figure 2:
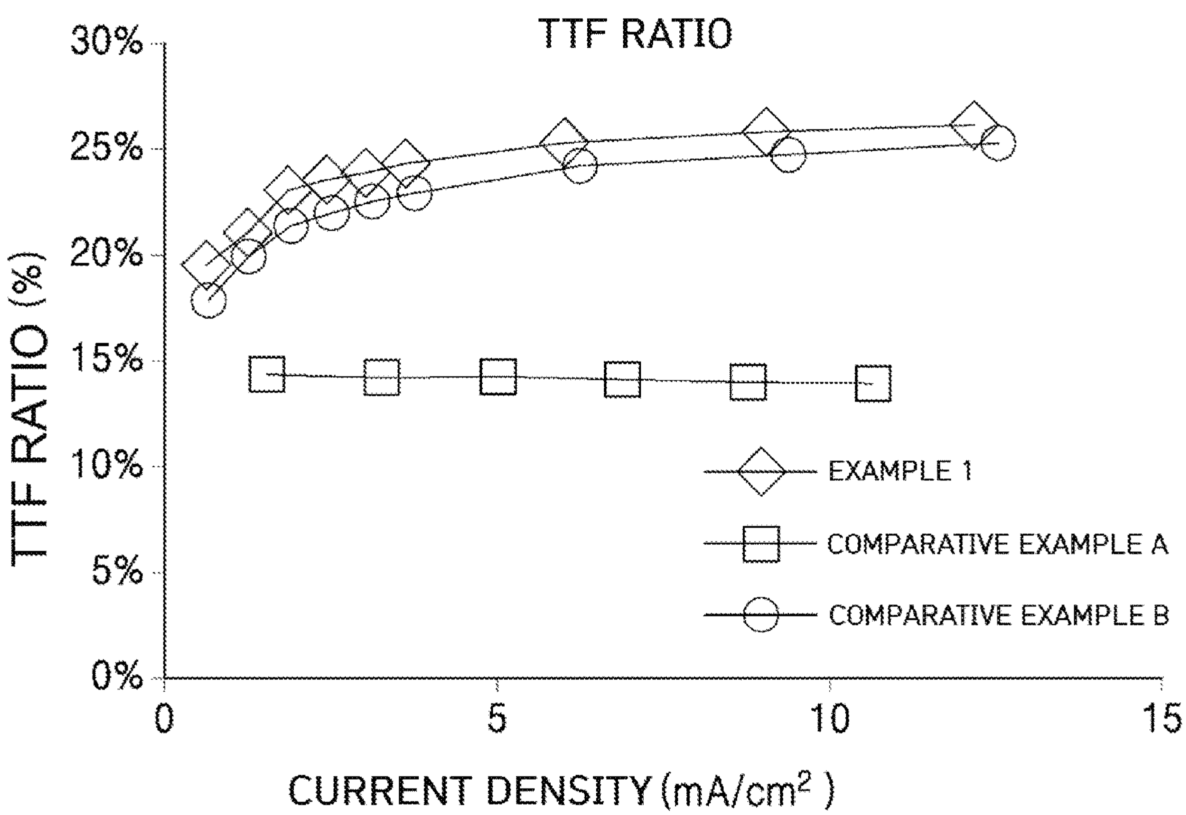
FIG. 2 is a graph of current density (milliamperes per square centimeter, $mA/cm^2$) versus triplet-triplet fusion (TTF) ratio (percent, %) of Example 1 and Comparative Examples A and B.
Figure 3:
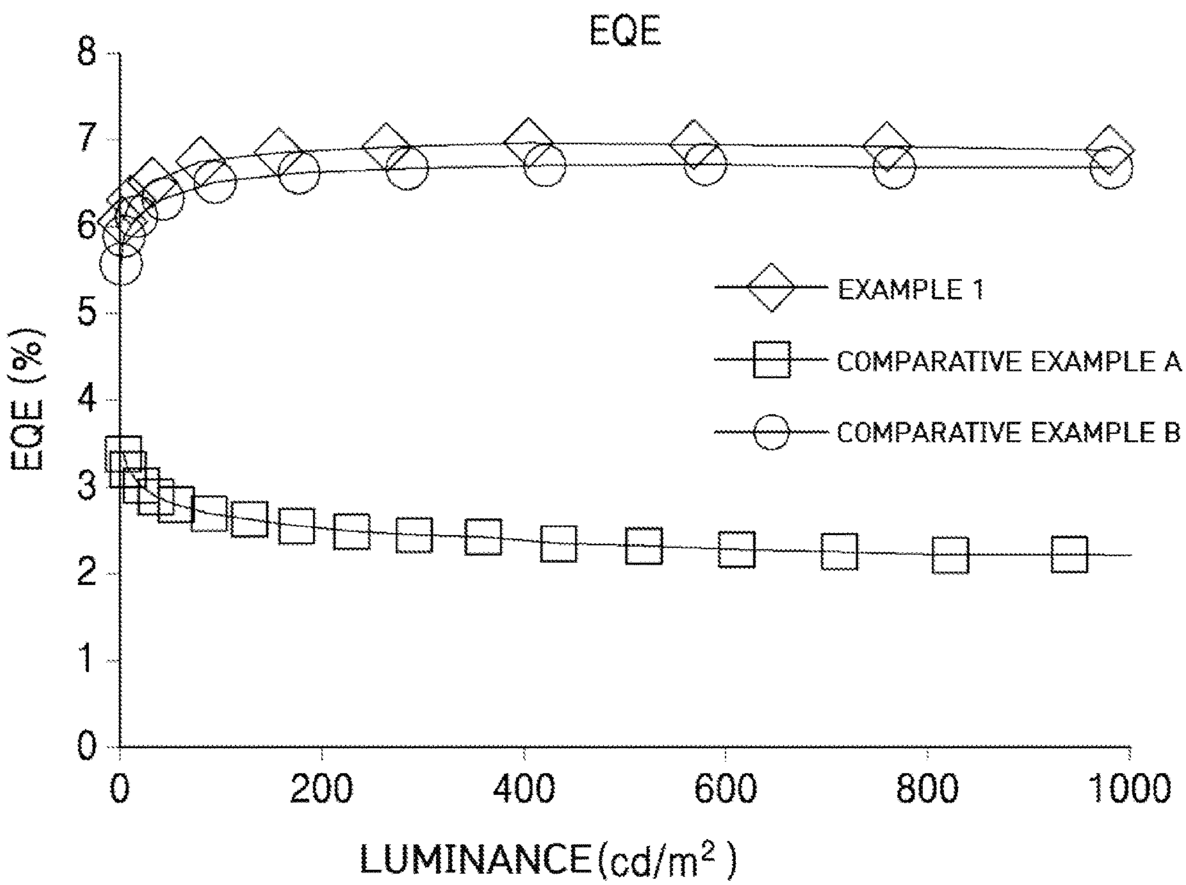
FIG. 3 is a graph of luminance (candela per square meter, $cd/cm^2$) versus external quantum efficiency (EQE, %) of Example 1 and Comparative Examples A and B.

The driving voltage (V), the maximum external quantum efficiency (max EQE, %), and/or lifespan ($L_{95}$, hours) of the organic light-emitting devices manufactured in Examples 1 to 3 and Comparative Examples A and B were measured by using a current-voltmeter (Keithley 2400) and a luminance meter (Minolta Cs-1000A). The results thereof are shown in Table 3. The lifespan ($LT_{95}$, at 6,000 nit) indicates a time (hour) for the luminance of each organic light-emitting device to decline to 95% of its initial luminance. The TTF ratio (the fluorescence emission amount due to TTF mechanism, %) of each organic light-emitting device of Examples 1 to 3 and Comparative Examples A and B was measured by measuring the decay of the transient electroluminescence (TrEL) of each organic light-emitting device and evaluating the squared reciprocal of the y-intercept in a graph of "1/(square root of the TrEL Intensity from 500 nanoseconds (ns) to 4,000 ns) (1/sqrt (TrEL))"–"time" obtained by measuring the decay of the transient electroluminescence (TrEL) of each organic light-emitting device. A graph of current density vs. TTF ratio of each of Example 1, Comparative Example A, and Comparative Example B are shown in FIG. 2, and a graph of luminance vs. external quantum efficiency of each of Example 1, Comparative Example A, and Comparative Example B are shown in FIG. 3.

TABLE 2

| | First compound | Second compound | Fluorescent dopant | Volume ratio |
|---|---|---|---|---|
| Example 1 | H1-1 | H2-1 | FD14 | 19:78:3 |
| Example 2 | H1-1 | H2-2 | FD15 | 19:78:3 |
| Example 3 | H1-2 | H2-2 | FD15 | 19:78:3 |
| Comparative Example A | H1-1 | — | FD14 | 97:3 |
| Comparative Example B | H1-A | H2-1 | FD14 | 19:78:3 |

TABLE 3

| | Driving voltage (at 10 mA/cm$^2$) (V) | TTF ratio (%) | Max EQE (%) | Lifespan ($LT_{95}$) (relative value, %) |
|---|---|---|---|---|
| Example 1 | 4.0 | 26.2 | 7.0 | 138 |
| Example 2 | 3.4 | 23.7 | 6.4 | Not measured |
| Example 3 | 3.4 | 22.5 | 6.2 | Not measured |
| Comparative Example A | 4.5 | 12.3 | 3.4 | 0.3 |
| Comparative Example B | 4.0 | 25.2 | 6.9 | 100 |

H1-1

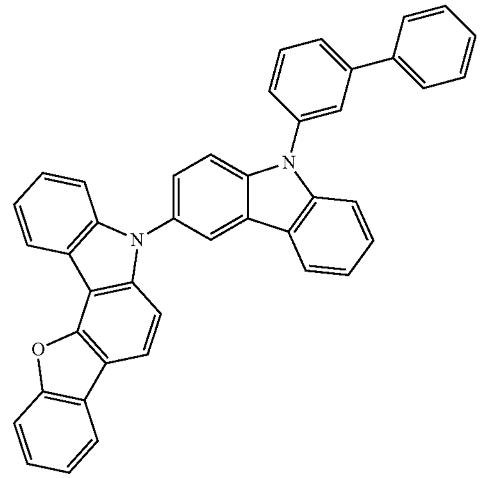

H1-2

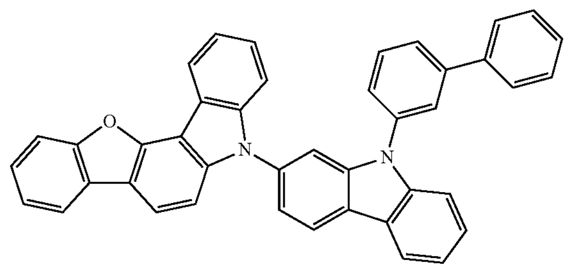

H1-A

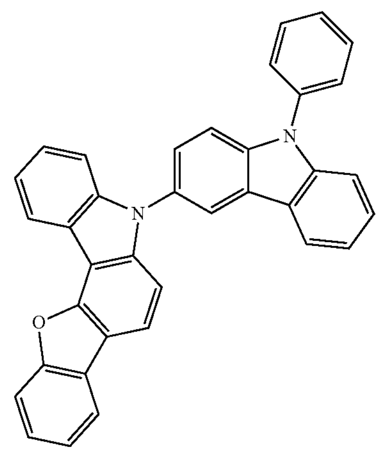

H2-1

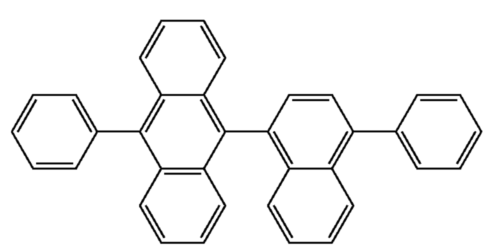

-continued

H2-2

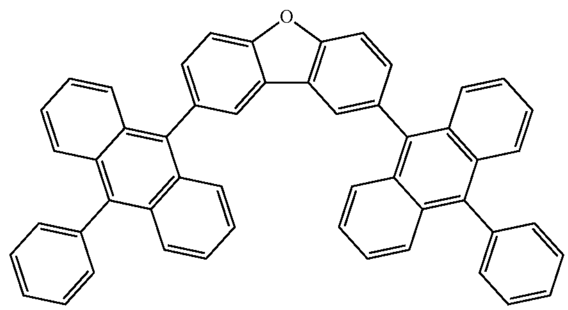

FD14

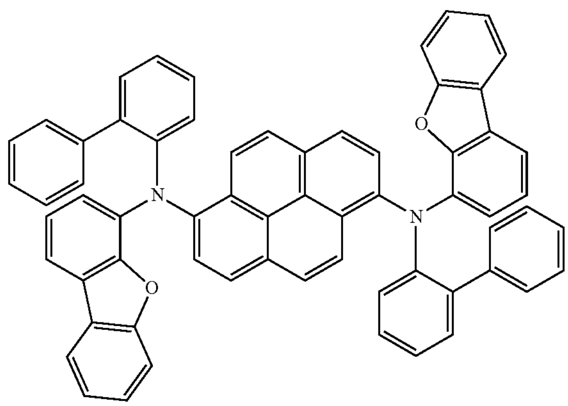

FD15

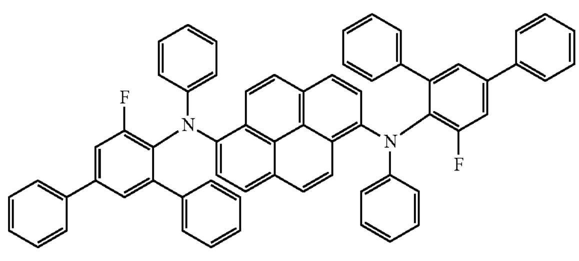

Referring to the results of Table 3, it was found that the organic light-emitting device of Example 1 had improved driving voltage, improved TTF ratio, improved maximum external quantum efficiency, and improved lifespan, as compared with the organic light-emitting devices of Comparative Examples A and B, and the organic light-emitting device of Examples 2 and 3 had excellent driving voltage, TTF ratio, and maximum external quantum efficiency.

As apparent from the foregoing description, the organic light-emitting device may emit fluorescence and have a high efficiency and a long lifespan.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An organic light-emitting device comprising:

a first electrode; a second electrode facing the first electrode; and an organic layer between the first electrode and the second electrode, wherein the organic layer comprises an emission layer, the emission layer comprises a first compound, a second compound, and a fluorescent dopant, the first compound, the second compound, and the fluorescent dopant are different from one another, a total weight of the first compound and the second compound is greater than a weight of the fluorescent dopant, wherein the first compound and the second compound satisfy at least one of Equation 1 to Equation 5, or the first compound, the second compound, and the fluorescent dopant satisfy at least one of Equation 6 to 11:

$$|S1(H1)-2\times T1(H2)|\leq 0.15\text{ eV} \quad \text{Equation 1}$$

$$T1(H1)>T1(H2) \quad \text{Equation 2}$$

$$T1(H1)>T2(H2) \quad \text{Equation 3}$$

$$|\mathrm{HOMO}(H1)|<|\mathrm{HOMO}(H2)| \quad \text{Equation 4}$$

$$|\mathrm{LUMO}(H1)|<|\mathrm{LUMO}(H2)| \quad \text{Equation 5}$$

$$S1(H2)>S1(\mathrm{FD}) \quad \text{Equation 6}$$

$$T1(H2)>T1(\mathrm{FD}) \quad \text{Equation 7}$$

$$|\mathrm{HOMO}(H2)|>|\mathrm{HOMO}(\mathrm{FD})| \quad \text{Equation 8}$$

$$|\mathrm{LUMO}(H2)|>|\mathrm{LUMO}(\mathrm{FD})| \quad \text{Equation 9}$$

$$|\mathrm{HOMO}(H1)|>|\mathrm{HOMO}(\mathrm{FD})| \quad \text{Equation 10}$$

$$|\mathrm{LUMO}(H1)|<|\mathrm{LUMO}(\mathrm{FD})| \quad \text{Equation 11}$$

wherein, in Equations 1 to 11,

S1(H1) represents an S1 singlet energy level (electron volts, eV) of the first compound, S1(H2) represents an S1 singlet energy level (eV) of the second compound, S1(FD) represents an S1 singlet energy level (eV) of the fluorescent dopant, T1(H1) represents a T1 triplet energy level (eV) of the first compound, T1(H2) represents a T1 triplet energy level (eV) of the second compound, T1(FD) represents a T1 triplet energy level (eV) of the fluorescent dopant, T2(H2) represents a T2 triplet energy level (eV) of the second compound, and

|HOMO(H1)| represents an absolute value of the highest occupied molecular orbital (HOMO) energy level (eV) of the first compound,

|HOMO(H2)| represents an absolute value of the HOMO energy level (eV) of the second compound,

|HOMO(FD)| represents an absolute value of the HOMO energy level (eV) of the fluorescent dopant,

|LUMO(H1)| represents an absolute value of the lowest unoccupied molecular orbital (LUMO) energy level (eV) of the first compound,

|LUMO(H2)| represents an absolute value of the LUMO energy level (eV) of the second compound,

|LUMO(FD)| represents an absolute value of the LUMO energy level (eV) of the fluorescent dopant, and S1(H1), S1(H2), S1(FD), T1(H1), T1(H2), T1(FD), T2(H2), HOMO(H1), HOMO(H2), HOMO(FD), LUMO(H1), LUMO(H2) and LUMO(FD) are each be obtained using a density functional theory (DFT) that is a quantum chemistry computational method based on the 6-311+G(d,p) basis set, and the first compound may be a compound represented by Formula 1:

1

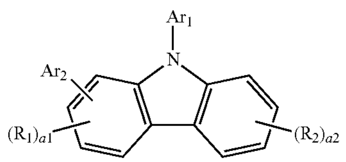

2A

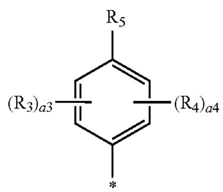

2B

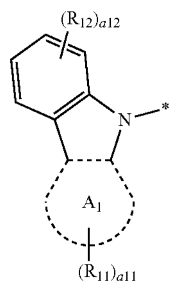

wherein, in Formula 1, $Ar_1$ is a group represented by Formula 2A, in Formula 1, $Ar_2$ is a group represented by Formula 2B, in Formula 2B, ring $A_1$ is a dibenzofuran group or a dibenzothiophene group, in Formulae 1, 2A, and 2B, $R_1$ to $R_3$, $R_{11}$, and $R_{12}$ are each independently:

hydrogen, deuterium, a $C_1$-$C_{20}$ alkyl group, a $C_1$-$C_{20}$ alkoxy group, a phenyl group, a biphenyl group, a terphenyl group, a carbazolyl group, a pyridinyl group, a dibenzofuranyl group, a dibenzothiophenyl group, or a dibenzosilolyl group;

a $C_1$-$C_{20}$ alkyl group or a $C_1$-$C_{20}$ alkoxy group, each substituted with at least one deuterium; or a phenyl group, a biphenyl group, a terphenyl group, a carbazolyl group, a pyridinyl group, a dibenzofuranyl group, a dibenzothiophenyl group, or a dibenzosilolyl group, each substituted with at least one deuterium, a $C_1$-$C_{20}$ alkyl group, a $C_1$-$C_{20}$ alkoxy group, a phenyl group, a biphenyl group, a terphenyl group, a carbazolyl group, a pyridinyl group, a dibenzofuranyl group, a dibenzothiophenyl group, a dibenzosilolyl group, or any combination thereof, in Formulae 1 and 2A, a1 and a3 are each independently an integer from 0 to 3, when a1 is 2 or greater, at least two $R_1$(s) are identical to or different from each other, and when a3 is 2 or greater, at least two $R_3$(s) are identical to or different from each other, in Formulae 1 and 2B, a2 and a12 are each independently an integer from 0 to 4, when a2 is 2 or greater, at least two $R_2$(s) are identical to or different from each other, and when a12 is 2 or greater, at least two $R_{12}$(s) are identical to or different from each other, in Formula 2B, a11 is an integer from 0 to 6, and when a11 is 2 or greater, at least two $R_{11}$(s) are identical to or different from each other, in Formula 2A, $R_4$ is:

a phenyl group, a biphenyl group, or a terphenyl group;

a phenyl group, a biphenyl group, or a terphenyl group, each substituted with deuterium, a $C_1$-$C_{20}$ alkyl group, a $C_1$-$C_{20}$ alkoxy group, or any combination thereof, in Formula 2A, a4 is an integer from 1 to 4, and when a4 is 2 or greater, at least two $R_4$(s) are identical to or different from each other, and in Formula 2A, $R_5$ is:

hydrogen, deuterium, a $C_1$-$C_{20}$ alkyl group, or a $C_1$-$C_{20}$ alkoxy group; or a $C_1$-$C_{20}$ alkyl group or a $C_1$-$C_{20}$ alkoxy group, each substituted with at least one deuterium, wherein, in Formulae 2A and 2B, * indicates a binding site to an adjacent atom.

2. The organic light-emitting device of claim 1, wherein, in Formula 1, $Ar_1$ is a group represented by one of Formulae 2A-1 to 2A-5:

2A-1

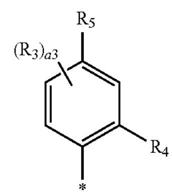

2A-2

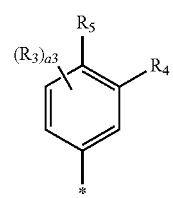

2A-3

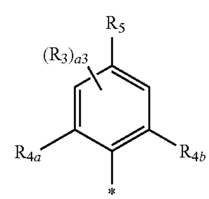

2A-4

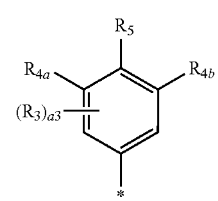

-continued 2A-5

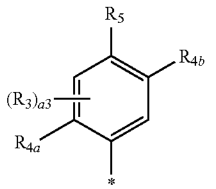

wherein, in Formulae 2A-1 to 2A-5, $R_3$ to $R_5$ are respectively understood by referring to the descriptions of $R_3$ to $R_5$ in claim 1, a3 is an integer from 0 to 2, $R_{4a}$ and $R_{4b}$ are each understood by referring to the description of $R_4$ in claim 1, and

* indicates a binding site to an adjacent atom.

3. The organic light-emitting device of claim 1, wherein, in Formula 1, $Ar_2$ is a group represented by one of Formulae 2B-1 to 2B-6:

2B-1

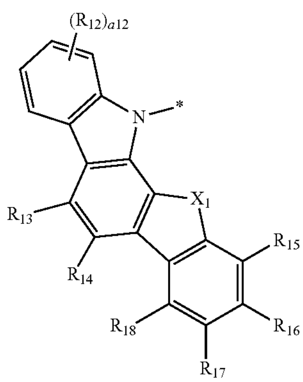

2B-2

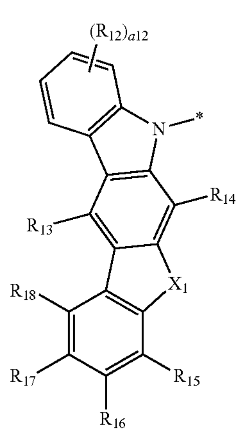

-continued 2B-3

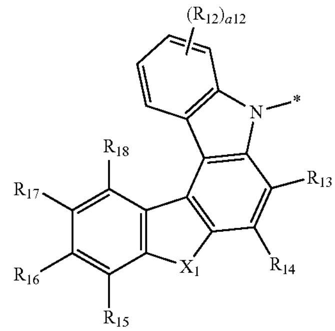

2B-4

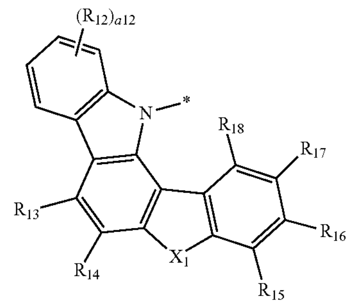

2B-5

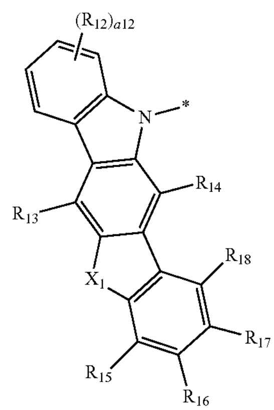

2B-6

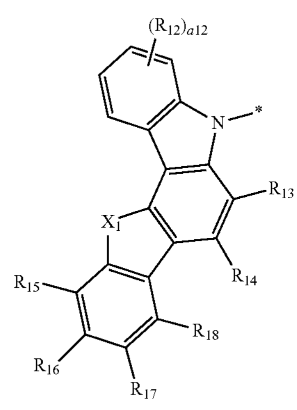

wherein, in Formulae 2B-1 to 2B-6, $X_1$ is O or S, $R_{12}$ and a12 are respectively understood by referring to the descriptions of $R_{12}$ and a12 in claim 1, $R_{13}$ to $R_{18}$ are each understood by referring to the description of $R_{11}$ in claim 1, and

* indicates a binding site to an adjacent atom.

4. The organic light-emitting device of claim 1, wherein $R_1$ to $R_3$, $R_{11}$, and $R_{12}$ are each independently:

hydrogen, deuterium, a $C_1$-$C_{10}$ alkyl group, a $C_1$-$C_{10}$ alkoxy group, a phenyl group, a biphenyl group, or a terphenyl group;

a $C_1$-$C_{10}$ alkyl group or a $C_1$-$C_{10}$ alkoxy group, each substituted with at least one deuterium; or a phenyl group, a biphenyl group, or a terphenyl group, each substituted with at least one deuterium, a $C_1$-$C_{20}$ alkyl group, a $C_1$-$C_{20}$ alkoxy group, a phenyl group, a biphenyl group, a terphenyl group, or any combination thereof.

5. The organic light-emitting device of claim 1, wherein, in Formula 2A, $R_4$ is a group represented by one of Formulae 3-1 to 3-7:

3-1

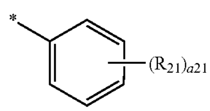

3-2

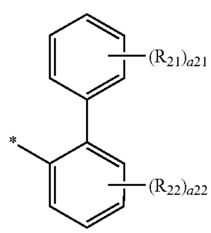

3-3

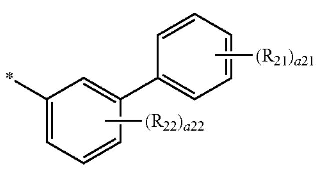

3-4

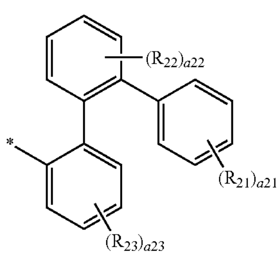

3-5

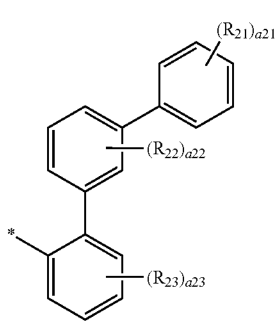

-continued 3-6

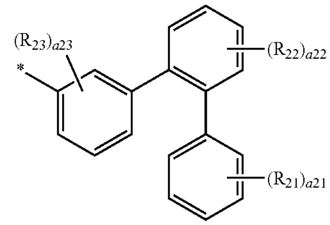

3-7

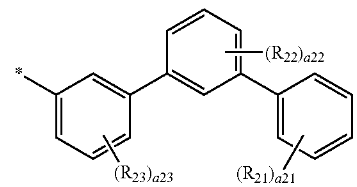

wherein, in Formulae 3-1 to 3-7, $R_{21}$ to $R_{23}$ are each independently hydrogen, deuterium, a $C_1$-$C_{10}$ alkyl group, or a $C_1$-$C_{10}$ alkoxy group, a21 is an integer from 0 to 5, a22 and a23 are each independently an integer from 0 to 4, and

* indicates a binding site to an adjacent atom.

6. The organic light-emitting device of claim 1, wherein the first compound is a compound represented by one of Formulae 1-1 to 1-4:

1-1

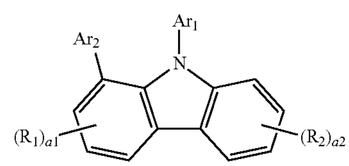

1-2

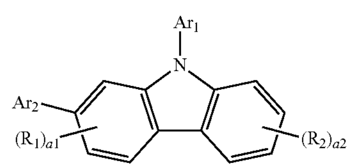

1-3

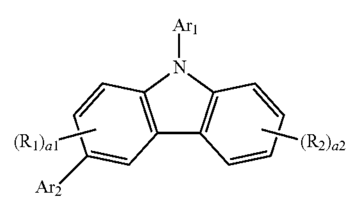

1-4

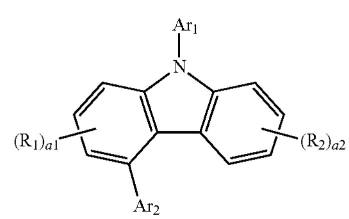

wherein, in Formulae 1-1 to 1-4, $Ar_1$, $Ar_2$, $R_1$, $R_2$, a1, and a2 are respectively understood by referring to the descriptions of $Ar_1$, $Ar_2$, $R_1$, $R_2$, a1, and a2 in claim 1.

7. The organic light-emitting device of claim 1, wherein the first compound and the second compound satisfy Equation 1.

8. The organic light-emitting device of claim 1, wherein the first compound and the second compound satisfy Equation 2.

9. The organic light-emitting device of claim 1, wherein the first compound and the second compound satisfy Equation 3.

10. The organic light-emitting device of claim 1, wherein the first compound and the second compound satisfy Equation 4.

11. The organic light-emitting device of claim 1, wherein the first compound and the second compound satisfy Equation 5.

12. The organic light-emitting device of claim 1, wherein the first compound and the second compound do not form an exciplex with each other.

13. The organic light-emitting device of claim 1, wherein the second compound comprises a first condensed cyclic group and a second condensed cyclic group, the first condensed cyclic group comprises a benzene group condensed with at least two third rings, the second condensed cyclic group comprises a benzene group condensed with at least one third ring, each occurrence of the third ring is independently a benzene group, a cyclopentadiene group, a furan group, a thiophene group, or a selenophene group, the third rings are identical to or different from each other, and the first and second condensed cyclic groups are identical to or different from each other.

14. The organic light-emitting device of claim 1, wherein the second compound comprises at least two anthracene groups.

15. The organic light-emitting device of claim 1, wherein the second compound is represented by Formula 40:

$Ar_{41}$-$(L_{403})_{a403}$-$Ar_{42}$ wherein, in Formula 40, $Ar_{41}$ is represented by Formula 41, and $Ar_{42}$ is represented by Formula 42:

Formula 41

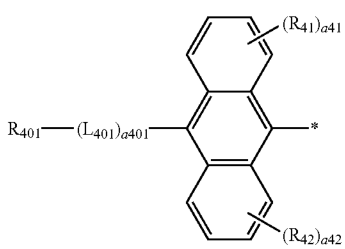

Formula 42

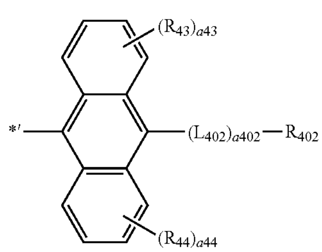

wherein, in Formulae 41 and 42, * and *' each indicate a binding site to $L_{403}$ in Formula 40, wherein, in Formulae 40, 41, and 42, $L_{401}$ to $L_{403}$ are each independently a single bond, a $C_5$-$C_{30}$ carbocyclic group unsubstituted or substituted with at least one $R_{40}$ or a $C_1$-$C_{30}$ heterocyclic group unsubstituted or substituted with at least one $R_{40}$, a401 to a403 are each independently an integer from 0 to 10, when a401 is 2 or greater, at least two $L_{401}$(s) are identical to or different from each other, when a402 is 2 or greater, at least two $L_{402}$(s) are identical to or different from each other, and when a403 is 2 or greater, at least two $L_{403}$(s) are identical to or different from each other, $R_{40}$ to $R_{44}$, $R_{401}$, and $R_{402}$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, a41 to a44 are each independently an integer from 0 to 4, when a41 is 2 or greater, at least two $R_{41}$(s) are identical to or different from each other, when a42 is 2 or greater, at least two $R_{42}$(s) are identical to or different from each other, when a43 is 2 or greater, at least two $R_{43}$(s) are identical to or different from each other, and when a44 is 2 or greater, at least two $R_{44}$(s) are identical to or different from each other, a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group are:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, $—Ge(Q_{13})(Q_{14})(Q_{15})$, $—B(Q_{16})(Q_{17})$, $—P(=O)(Q_{18})(Q_{19})$, $—P(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with at least one deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—Ge(Q_{23})(Q_{24})(Q_{25})$, $—B(Q_{26})(Q_{27})$, $—P(=O)(Q_{28})(Q_{29})$, $P(Q_{28})(Q_{29})$, or any combination thereof;

$—N(Q_{31})(Q_{32})$, $—Ge(Q_{33})(Q_{34})(Q_{35})$, $—B(Q_{36})(Q_{37})$, $—P(=O)(Q_{38})(Q_{39})$, or $—P(Q_{38})(Q_{39})$; or any combination thereof, wherein $Q_1$ to $Q_9$, $Q_{11}$ to $Q_{19}$, $Q_{21}$ to $Q_{29}$, and $Q_{31}$ to $Q_{39}$ are each independently: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

16. The organic light-emitting device of claim 15, wherein the second compound is a compound represented by one of Formulae 40-1 to 40-17:

40-1

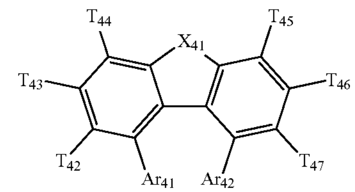

40-2

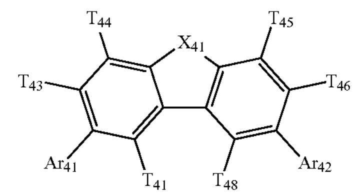

40-3

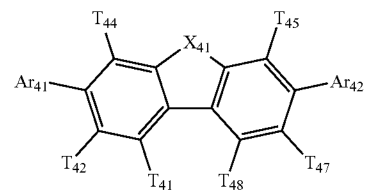

40-4

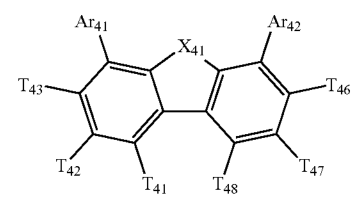

40-5

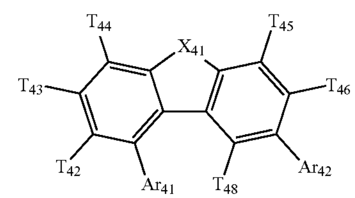

40-6

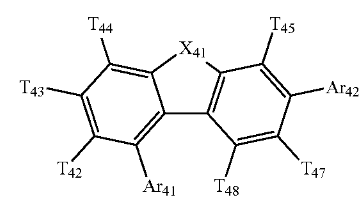

40-7

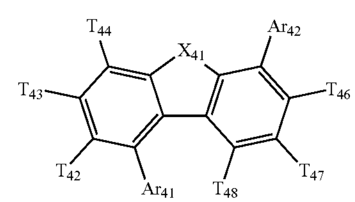

-continued 40-8

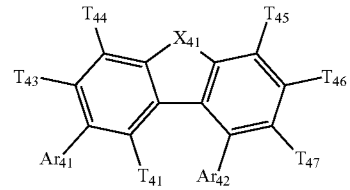

40-9

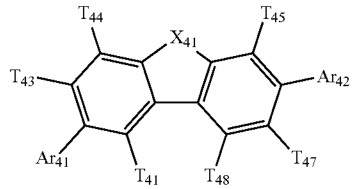

40-10

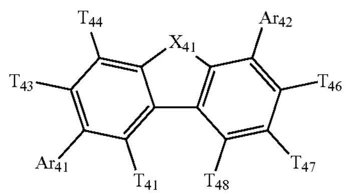

40-11

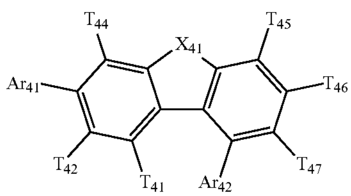

40-12

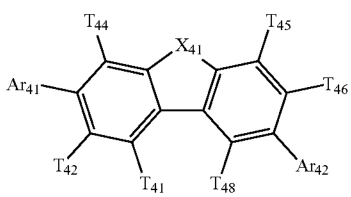

40-13

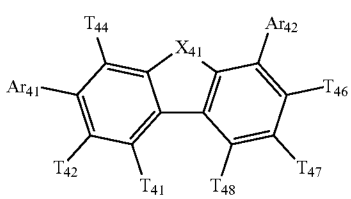

-continued 40-14

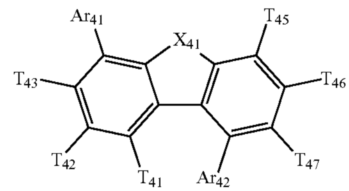

40-15

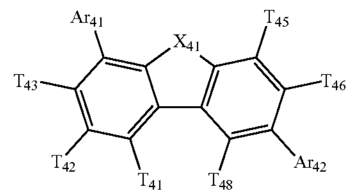

40-16

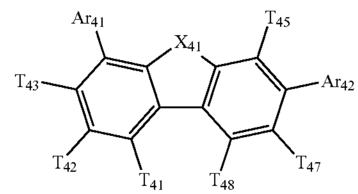

40-17

$Ar_{41}—Ar_{42}$ wherein, in Formulae 40-1 to 40-17, $X_{41}$ is O, S, or Se, $Ar_{41}$ and $Ar_{42}$ are respectively understood by referring to the descriptions of $Ar_{41}$ and $Ar_{42}$ in claim 15, and $T_{41}$ to $T_{48}$ are each understood by referring to the description of $R_{40}$ in claim 15.

17. The organic light-emitting device of claim 1, wherein the fluorescent dopant is a prompt fluorescence dopant.

18. The organic light-emitting device of claim 1, wherein a maximum emission wavelength of the fluorescent dopant is in a range of about 420 nanometers (nm) to about 480 nm.

19. The organic light-emitting device of claim 1, wherein the first compound, the second compound, and the fluorescent dopant satisfy at least one of Equations 6 to 11.

20. The organic light-emitting device of claim 1, wherein the emission layer does not comprise a transition metal.

* * * * *